US010101391B2

(12) United States Patent
Swoboda

(10) Patent No.: US 10,101,391 B2
(45) Date of Patent: Oct. 16, 2018

(54) ADAPTER CIRCUITRY WITH LINK AND SYSTEM INTERFACES TO CORE CIRCUITRY

(71) Applicant: TEXAS INSTRUMENTS INCORPORATED, Dallas, TX (US)

(72) Inventor: Gary L. Swoboda, Sugar Land, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 15/903,848

(22) Filed: Feb. 23, 2018

(65) Prior Publication Data

US 2018/0180673 A1 Jun. 28, 2018

Related U.S. Application Data

(60) Division of application No. 15/409,855, filed on Jan. 19, 2017, now Pat. No. 9,952,285, which is a division (Continued)

(51) Int. Cl.

*G01R 31/28* (2006.01)
*G01R 31/3177* (2006.01)
*G01R 31/317* (2006.01)

(52) U.S. Cl.

CPC ... *G01R 31/3177* (2013.01); *G01R 31/31705* (2013.01); *G01R 31/31723* (2013.01); *G01R 31/31724* (2013.01); *G01R 31/31727* (2013.01)

(58) Field of Classification Search

CPC .......... G01R 31/31723; G01R 31/3177; G01R 31/31705; G01R 31/31724;

(Continued)

(56) References Cited

U.S. PATENT DOCUMENTS

| | | | |
|---|---|---|---|
| 5,056,093 | A | 10/1991 | Whetsel |
| 5,103,450 | A | 4/1992 | Whetsel |

(Continued)

FOREIGN PATENT DOCUMENTS

| | | | |
|---|---|---|---|
| EP | 1 496 444 | A2 | 1/2005 |
| JP | 2002 318783 | A | 10/2002 |
| WO | 01/28060 | A1 | 4/2001 |

OTHER PUBLICATIONS

Swoboda, Gary L., Compact JTAG (cJTAG), Revision 0.9, Nov. 20, 2005.

*Primary Examiner* — Christine T. Tu

(74) *Attorney, Agent, or Firm* — Lawrence J. Bassuk; Charles A. Brill; Frank D. Cimino

(57) ABSTRACT

A system and method for sharing a communications link between multiple protocols is described. A system includes a communications interface configured to exchange information with other systems using at least one of a plurality of protocols; a protocol select register that stores a value that selects a protocol from among the plurality of protocols to become an active protocol; and a state machine accessible to the communications interface, the state machine used to control the exchange of information through the communications interface according to the active protocol. The active protocol is used by the communications interface to exchange information while the remaining protocols of the plurality of protocols remain inactive. The state machine sequences through a series of states that cause the communications interface to operate according to the active protocol, and that are designated as inert sequences under the remaining protocols.

16 Claims, 182 Drawing Sheets

Related U.S. Application Data of application No. 15/210,487, filed on Jul. 14, 2016, now abandoned, which is a division of application No. 14/948,612, filed on Nov. 23, 2015, now Pat. No. 9,423,458, which is a division of application No. 14/679,315, filed on Apr. 6, 2015, now Pat. No. 9,222,980, which is a division of application No. 14/475,894, filed on Sep. 3, 2014, now Pat. No. 9,032,265, which is a division of application No. 14/189,387, filed on Feb. 25, 2014, now Pat. No. 8,874,982, which is a division of application No. 14/053,118, filed on Oct. 14, 2013, now Pat. No. 8,707,118, which is a division of application No. 13/693,535, filed on Dec. 4, 2012, now Pat. No. 8,589,746, which is a division of application No. 13/362,883, filed on Jan. 31, 2012, now Pat. No. 8,352,816, which is a division of application No. 12/776,579, filed on May 10, 2010, now Pat. No. 8,136,003, which is a division of application No. 12/464,468, filed on May 12, 2009, now Pat. No. 7,984,347, which is a division of application No. 11/351,443, filed on Feb. 9, 2006, now Pat. No. 7,552,360, which is a continuation-in-part of application No. 11/293,067, filed on Dec. 2, 2005, now Pat. No. 7,761,762, and a continuation-in-part of application No. 11/292,598, filed on Dec. 2, 2005, now Pat. No. 7,793,152, and a continuation-in-part of application No. 11/293,599, filed on Dec. 2, 2005, now Pat. No. 7,809,987, and a continuation-in-part of application No. 11/292,597, filed on Dec. 2, 2005, now Pat. No. 7,571,366, and a continuation-in-part of application No. 11/292,703, filed on Dec. 2, 2005, now Pat. No. 7,779,321.

(60) Provisional application No. 60/663,827, filed on Mar. 21, 2005, provisional application No. 60/676,603, filed on Apr. 29, 2005, provisional application No. 60/689,381, filed on Jun. 10, 2005.

(58) Field of Classification Search
CPC ...... G01R 31/31727; G01R 31/318572; G01R 31/318555; G01R 31/318583
See application file for complete search history.

(56) References Cited

U.S. PATENT DOCUMENTS 5,155,733 A 10/1992 Blecha, Jr.
5,228,039 A 7/1993 Knoke et al.
5,329,471 A 7/1994 Swoboda et al.
5,432,747 A 7/1995 Fuller et al.
5,485,454 A * 1/1996 Gass ...................... H04Q 3/002 370/359
5,485,466 A 1/1996 Lyon et al.
5,513,186 A 4/1996 Levitt
5,604,867 A 2/1997 Harwood et al.
5,627,842 A 5/1997 Brown et al.
5,706,297 A 1/1998 Jeppesen et al.
5,708,773 A 1/1998 Jeppesen, III et al.
5,787,012 A 7/1998 Levitt
5,844,803 A 12/1998 Beffa
6,067,417 A 5/2000 Wise et al.
6,163,864 A 12/2000 Bhavsar et al.
6,175,914 B1 1/2001 Mann
6,259,271 B1 7/2001 Couts-Martin et al.
6,321,329 B1 11/2001 Jaggar et al.
6,374,380 B1 4/2002 Sim
6,430,727 B1 8/2002 Warren
6,446,221 B1 9/2002 Jaggar et al.
6,466,048 B1 10/2002 Goodman
6,581,190 B1 6/2003 Dixon et al.
6,665,816 B1 12/2003 Edwards et al.
6,675,284 B1 1/2004 Warren
6,681,359 B1 1/2004 Au et al.
6,760,874 B2 7/2004 Cote et al.
6,779,146 B1 8/2004 Jones et al.
6,792,365 B2 9/2004 Raitter
7,075,331 B2 7/2006 Pail et al.
7,079,555 B2 7/2006 Baydar et al.
7,185,251 B2 2/2007 Moyer
7,197,680 B2 3/2007 Kimelman et al.
7,284,170 B2 10/2007 Whetsel
7,395,471 B2 7/2008 Whetsel
7,398,440 B2 7/2008 Warren
7,412,633 B2 * 8/2008 Kimelman .......... G06F 13/4282 714/724
7,447,962 B2 11/2008 Horie
7,516,378 B2 4/2009 Whetsel
7,525,305 B2 4/2009 Whetsel
7,698,612 B2 4/2010 Whetsel
8,352,816 B2 1/2013 Swoboda
8,522,097 B2 8/2013 Kim et al.
8,707,118 B2 4/2014 Swoboda
8,867,680 B2 10/2014 Melzer et al.
8,874,982 B2 10/2014 Swoboda
9,032,265 B2 5/2015 Swoboda
2001/0037480 A1 11/2001 Whetsel
2002/0133795 A1 9/2002 Yamada
2002/0188782 A1 12/2002 Fay
2003/0023913 A1 1/2003 Matsuo
2003/0090939 A1 5/2003 Perroni
2003/0198185 A1 10/2003 Stancil
2004/0093534 A1 5/2004 Whetsel, Jr.
2005/0055607 A1 * 3/2005 Czajkowski .......... G06F 9/3861 714/25
2005/0160337 A1 7/2005 Whetsel
2005/0235088 A1 10/2005 Kang
2005/0268193 A1 12/2005 Waayers
2007/0011516 A1 1/2007 Mack et al.
2015/0067424 A1 3/2015 Waltermann et al.

* cited by examiner

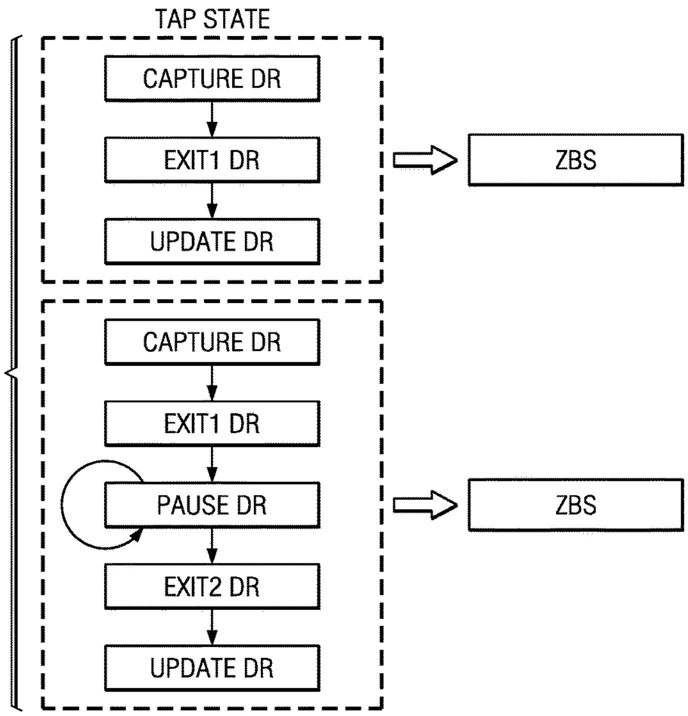

*FIG. 6C*

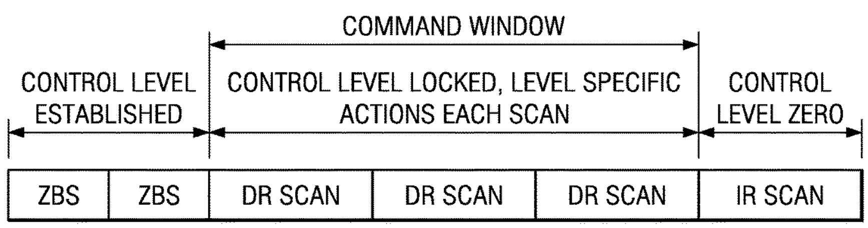

*FIG. 7*

| LEVEL | TYPE | DESCRIPTION |
|---|---|---|
| 0 | PUBLIC | COMMAND WINDOW IS CLOSED, DR SCANS OPERATE NORMALLY |
| 1 | PUBLIC | CDX TRANSFERS USE THE Shift_DR STATE IF CDX IS ENABLED, ELSE DR SCANS OPERATE NORMALLY |
| 2 | PUBLIC | cJTAG CONTROL REGISTERS MAY BE CHANGED BY COMMAND SEQUENCES. DATA TRANSFERS TO THE DTS FUNCTION NORMALLY IN STANDARD AND ADVANCED MODES. |
| 3 | PUBLIC | cJTAG CONTROL REGISTERS MAY BE CHANGED BY COMMAND SEQUENCES. TDO REMAINS IN A HI-z STATE IN STANDARD MODE. READ DATA IS ALWAYS A ONE IN ADVANCED MODE |
| 4-5 | PUBLIC | RESERVED |
| 6 AND ABOVE | PRIVATE | USER DEFINED |

*FIG. 8A*

| SCAN COUNT | MNEMONIC | DESCRIPTION |
|---|---|---|
| 0 | SCA | STORE CONTROL ACTION |
| 1 | MSS | MAKE SCAN SELECTION |
| 2 | MTS | MAKE TRANSPORT SELECTION |
| 3 | SLID | STORE LINK ID |
| 4 | ILID | INVALIDATE LINK ID |
| 5 | STF | STORE TRANSPORT FORMAT |
| 6 | SSF | STORE SCAN FORMAT |
| 7 | SRS | STATUS READ/SERIAL SELECT |
| 8 | XPE | TRANSPORT ENABLE |
| 9 | rsv0 | RESERVED FOR cJTAG EXTENSIONS |
| 10 | LECP | LOAD EXTENDED COMMAND PAGE |
| 11 | RECP | READ EXTENDED COMMAND PAGE |
| 12 | EXC0 | EXTENDED COMMAND 0 (USER DEFINED) |
| 13 | EXC1 | EXTENDED COMMAND 1 (USER DEFINED) |
| 14 | EXC2 | EXTENDED COMMAND 2 (USER DEFINED) |
| 15 | EXC3 | EXTENDED COMMAND 3 (USER DEFINED) |
| 16-31 | LTR | LOAD TEMP REGISTER |

*FIG. 8B*

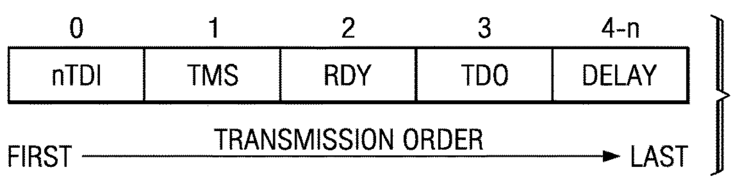

*FIG. 11*

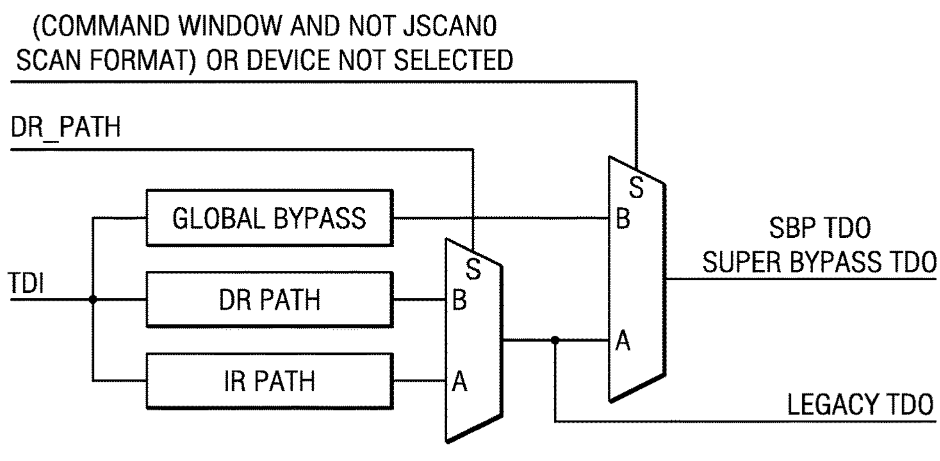

*FIG. 18*

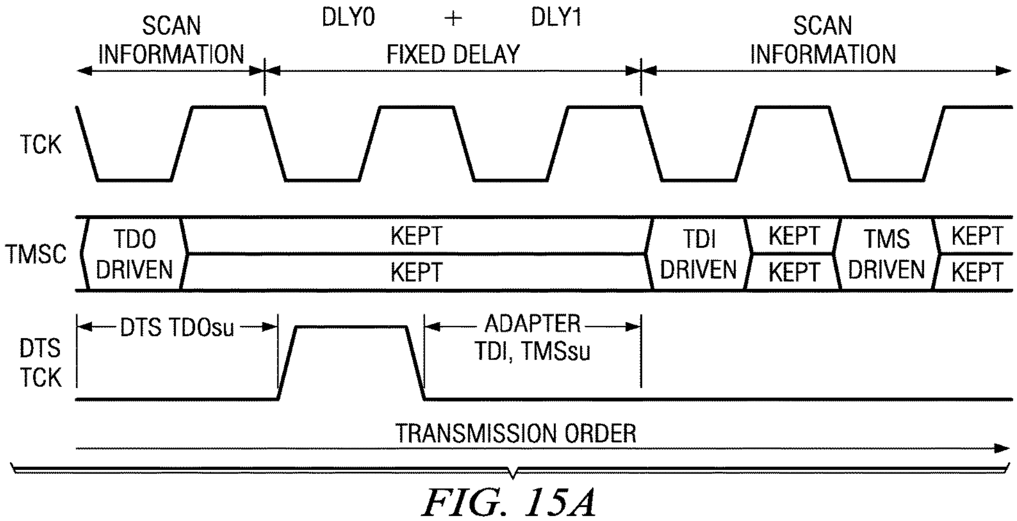
FIG. 15A
| DL[1:0] | BIT 1 | BIT 0 |
|---|---|---|
| ▷ | DLY1 | DLY0 |
| 00 | NOT INCLUDED | NOT INCLUDED |
| 01 | NOT INCLUDED | ✓ |
| 10 | ✓ | ✓ |
FIG. 15B
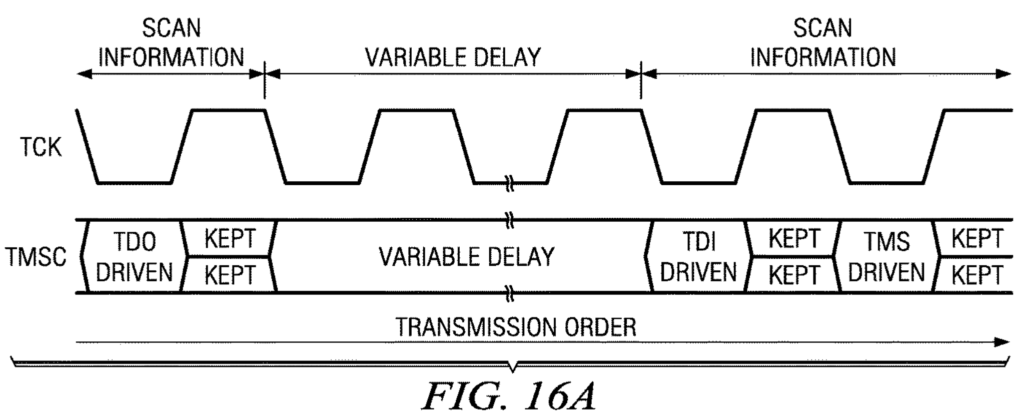
FIG. 16A Although TCK is shown as bi-directional, it is actually sourced by the system or debug and test equipment

| Signal | Interface | Description |
| --- | --- | --- |
| CLKIN | JTAG | Clock Input to DTS adapter logic |
| TCK | JTAG | Test Clock supplied to DTS control logic |
| TCK_RET | Link | TCK Return - Link clock supplied to DTS when TS supplies Link TCK |
| TCK_SRC | Link | TCK Source - Link clock source when the DTS sources the Link clock |
| TDI | JTAG | Test Data Input generated by DTS control logic |
| | Link | Test Data Input generated by DTS control logic and passed to the TS through the adapter when the Link is operating with standard protocols |
| TDO | JTAG | Test Data Out supplied to the DTS control logic |
| | Link | Test Data Output supplied by the TS and passed to the DTS through the adapter, when the link is operating in standard protocol |
| TMS | JTAG | Test Mode Select generated by DTS control logic |
| TMSC | Link | Test Mode Select Compact - The TMS function with standard protocols and bi-directional control, and data transfers with advanced protocols |
| BCE | Link | Boundary Compliance Enable - Resets the adapter and TS TAPS when low, default low |
| nTRST | Link | Not Test Reset - Resets the adapter and TS TAPS when low, default high |
| RTCK | Link | Return Test Clock - Link clock when the link operates in a modified JTAG interface mode |

*FIG. 39*

| Signal | Interface | Description |
|---|---|---|
| BCE | Link | Boundary compliance enable - resets the adapter and TS TAPS when low, default low |
| nTRST | Link | Not test reset - resets the adapter and TS TAPS when low, default high |
| TCK | Link | Test clock supplied to the TS adapter |
| | System | Test clock supplied to the TS TAPs |
| TDI | System | Test data Input supplied to TS TAPs |
| | Link | Test data Input generated by DTS if used. Tied off if not used |
| TDO | System | Test data out supplied to the adapter by TS TAPs |
| | Link | Test data output sent to the DTS if this signal is used |
| TDO_OE | System | Test data output enable generated by the TS TAPs |
| TLR | System | |
| | | |
| TMS | System | Test mode select sent to the TS TAPs |
| TMSC | Link | Test mode select compact - the TMS function with standard protocols and bi-directional control and data transfers with advanced protocols |
| nTRST | Link | Not test reset - resets the adapter and TS TAPS when low, default high |
| RDY | System | Ready to accept a new TCK for the next TAP state |
| RTCK | Link | Return Test Clock - Link clock when the link operates in a modified JTAG interface mode |
| | System | Return Test Clock - supplied by TCK adapter |

*FIG. 42*

| TAP State | Encoding | TAP State | Encoding |
|---|---|---|---|
| Test-Logic Reset | 0000 | Run-Test/Idle | 1000 |
| Select-DR-Scan | 0001 | Select-IR-Scan | 1001 |
| Capture-DR | 0010 | Capture-IR | 1010 |
| Shift-DR | 0011 | Shift-IR | 1011 |
| Exit1-DR | 0100 | Exit1-IR | 1100 |
| Pause-DR | 0101 | Pause-IR | 1101 |
| Exit2-DR | 0110 | Exit2-IR | 1110 |
| Update-DR | 0111 | Update-IR | 1111 |

| State | Control Level Counter Value | Capture Last FF |
|---|---|---|
| CW | 0 | 0 |
| PW | 0 | 1 |
| DW | Non-zero | 1 |
| AW | Non-zero | 0 |

Pseudo Code

```
cl_set < = '1' when
      tap_state = CAPTURE_DR and
      control_level = 0
             else '0';

cl_clr < = '1' when
      tap_state = SHIFT_DR or
      tap_state = SELECT_IR or
      tap_state = TLR or
      sw_close_seq = '1'
             else '0';

open_level < = '1' when
      tap_state = UPDATE_DR and
      capture_last = '1'
             else '0';

close_levels < = '1' when
      tap_state = SELECT_IR or
      tap_state = TLR or
      sw_close_seq = '1' or
      hard_reset = '1' or
      soft_reset = '1'
             else '0';

if (open_level = '1') then
       if (control_level_counter /= maximum) then
             if (open_level = '1') then
                  control_level_counter =
                       control_level_counter + 1:
             else if (close_levels = '1')
                    control_level_counter = 0;

sw_close_seq = '1' when a STTR command is not
               preceded by a LDTR command
```

CSEQ State Machine

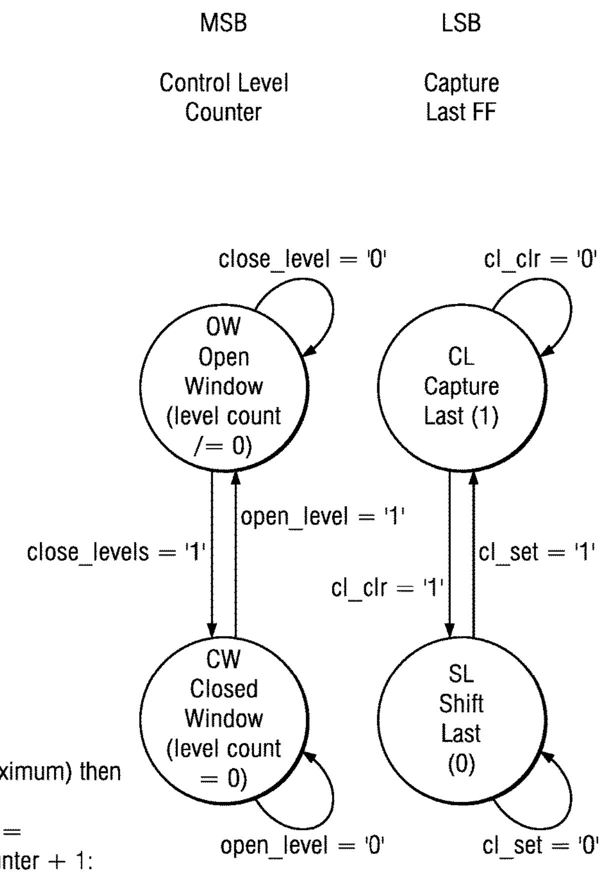

*FIG. 47*

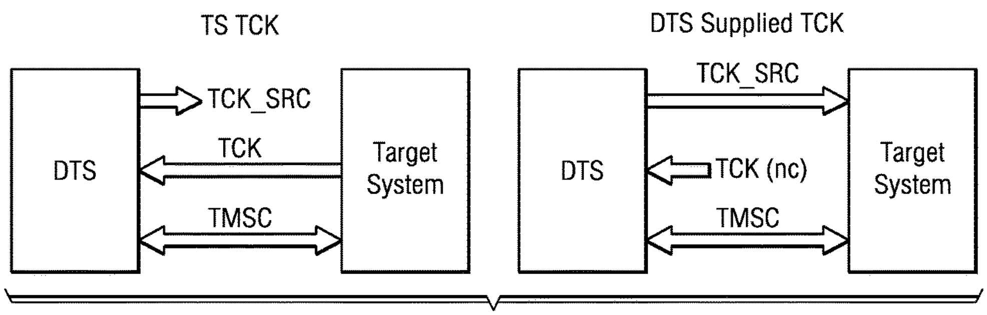

*FIG. 50*

| Cases | TCK Source | Chip Pins | TCK | TS Interface Attributes |
|---|---|---|---|---|
| a | DTS | 2 | Dedicated | BW as much as 50% larger than b and c configurations |
| b | TS | 2 | Dedicated | Test only TCK pin |
| c | TS | 2** | Shared | TCK function shared with another chip clock pin |

** This pin is not counted as a pin dedicated to debug. The debug interface requires one extra pin.

*FIG. 51*

| Signal | Characteristics |
|---|---|
| TCK | TS adapter input in standard and advanced modes |
| TMSC | An input in standard mode and bi-directional in advanced mode |

*FIG. 52*

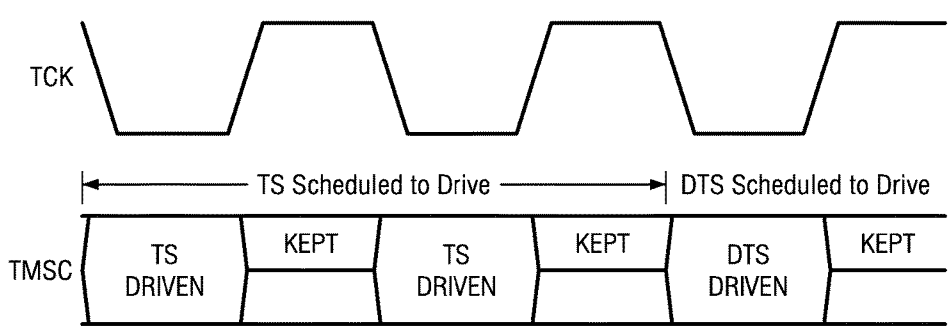

*FIG. 53*

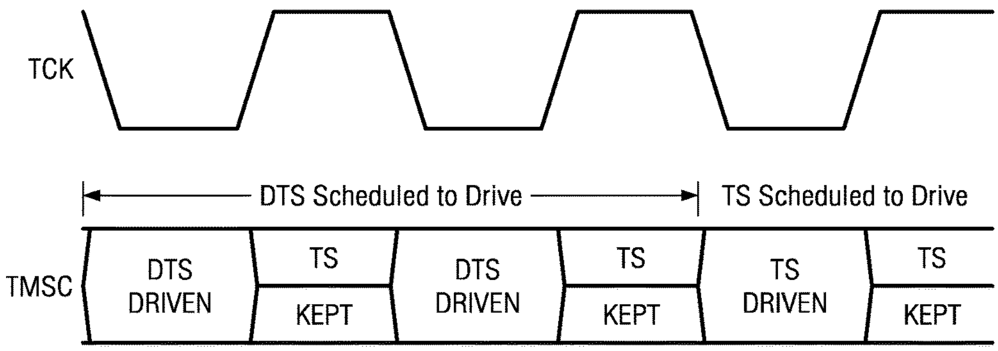
*FIG. 54*
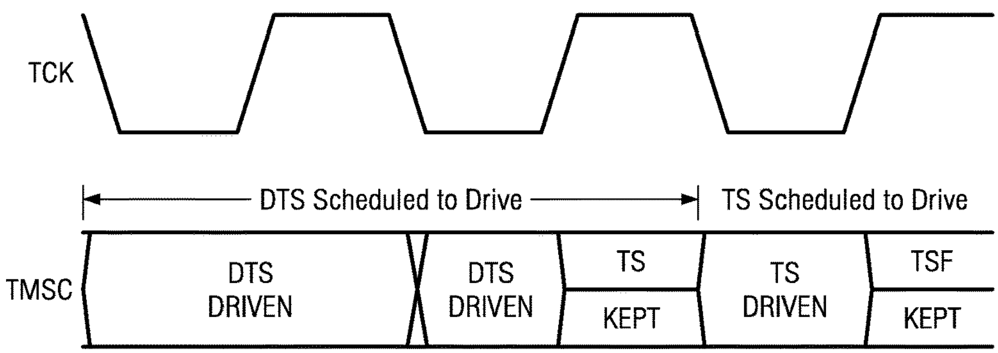
*FIG. 55*
| Value | Description |
|---|---|
| $T_{HP}$ | Half period |
| $T_{MP}$ | Minimum period |
| $T_{DTS\_D}$ | TCK falling to DTS drive active |
| $T_{DTS\_Z}$ | TCK rising to DTS drive high impedance |
| $T_{DTS\_su}$ | DTS data setup to TCK falling |
| $T_{TS\_D}$ | TCK falling to TS drive active |
| $T_{TS\_Z}$ | TCK rising to TS drive high impedance |
| $T_{TS\_SU}$ | TS data setup to TCK falling |
*FIG. 56*

| | Mode 0<br>PD Not Permitted | Mode 1<br>PD Permitted if A | Mode 2<br>PD Permitted if A and B | Mode 3<br>PD Permitted if B |
|---|---|---|---|---|
| Option 1 | X | -- | -- | -- |
| Option 2 | X | X | -- | -- |
| Option 3 | X | -- | X | X |
| Option 4 | X | X | X | X |

*FIG. 66*

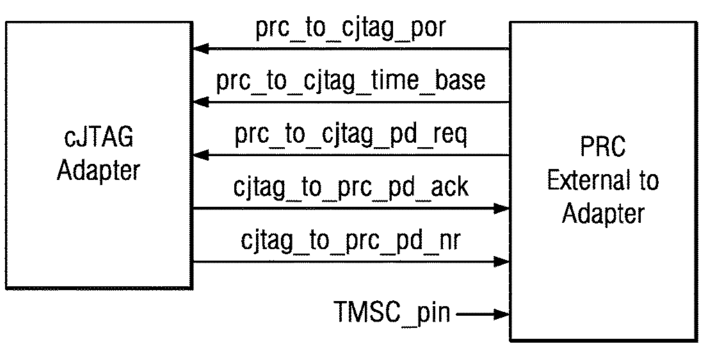

*FIG. 67*

| Sequence | Edges | Description |
|---|---|---|
| End of Transfer | 2 or 3 | Terminate TAP shift state or Terminate scan Segment |
| Soft Reset | 4 or 5 | Reset the mode to compliant JTAG, close command window, de-select all adapters |
| Hard Reset | 6 or more | Reset the adapter as if nTRST or BCE had been asserted |

*FIG. 68*

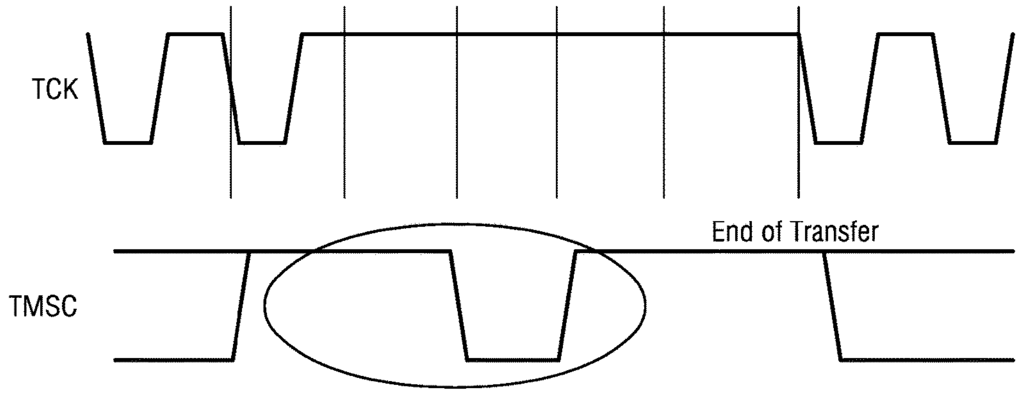
*FIG. 69*
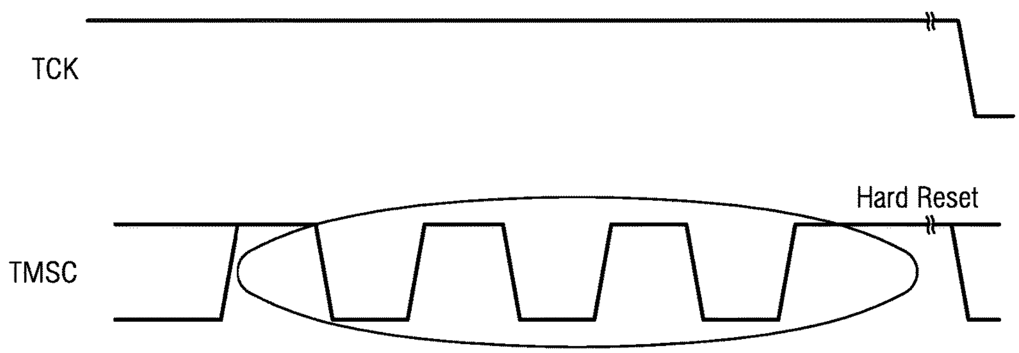
*FIG. 70*
| Register Name | Width | Description |
|---|---|---|
| LINK_CNTL | 11 | General Link Control, Link ID |
| SCAN_CNTL | 14 | Scan Control and Status |
| XPORT_CNTL | 08 | Transport Control |
*FIG. 71*

*FIG. 72*

| Commands | | |
|---|---|---|
| Count | Commands | Description |
| 00000 | Store Control Action (SCA) [00000 TO 01111 are STR commands] | If TEMP == 11xx then DL[1:0] = TEMP[1:0];<br>If TEMP == 10xx then PC[1:0] = TEMP[1:0];<br>If TEMP == 01xx then CC[1:0] = TEMP[1:0];<br>If TEMP == 001x then PS[1] = 0;<br>If TEMP == 00x1 then TS = 0;<br>If TEMP == 0000 then no operation |
| 00001 | Make Scan Selection (MSS) | If (PSCS == 1 OR PSCS == 2) PSCS++;<br>Else PSCS = PSCS;<br>If (LID == TEMP)<br>(PS[1] = 1); Scan Pre-select Enabled*/<br>Else<br>(PS[1] = PS[1]);<br>/*Scan Pre-select Unchanged*/ |
| 00010 | Make Transport Selection (MTS) | IF (LID == TEMP)<br>(BS == TRUE); /*BDX Selected*/;<br>Else<br>(BS = FALSE); /* BDX De-selected*/; |
| 00011 | Store Link ID (SLID) | If (winner of ID assignment process),<br>LID[3:0] = TEMP; LID[4] = 0;<br>Else<br>LID = LID; |
| 00100 | Invalidate Link ID (ILID) | If (LID ==TEMP or PSCS[1:0]<br>(LID = Invalid); |
| 00101 | Store Transport Format (STF) | XP_TF[3:0] = TEMP[3:0] |
| 00110 | Store Scan Format (SSF) | SC_SF[3:0] = TEMP[3:0] |
| 00111 | Read Status or Serial Selection (SRS) | If (not standard mode)<br>If(LID == TEMP) Status is output next DR_Scan;<br>Else<br>Enable load of serial select information next Update_DR |
| 01000 | Store Transport Enables (STE) | BE = TEMP[0]; CE = TEMP[1] |
| 01001 | Rsvd(0) | Reserved |
| 01010 | Load Extended Cmd Page (LECP) | Load extended command page |
| 01011 | Read Extended Cmd Page (RECP) | Read extended command page |
| 01100 | Extended Command 0 (EXC0) | User defined (extended page specific)<br>If (LID == TEMP)<br>(activate command);<br>Else (no operation); |
| 01101 | Extended Command 1 (EXC1) | |
| 01110 | Extended Command 2 (EXC2) | |
| 01111 | Extended Command 3 (EXC3) | |
| 1dcba | Load Temp Reg (LTR) | TEMP = dcba; |

*FIG. 73*

| Link Control Register Format | | | | | | | |
|---|---|---|---|---|---|---|---|
| Bit Position | Rsvd | 14 | 13 | 12:11 | 10:9 | 8:4 | 3:0 |
| Field Name | | FLAT | JTRST | PC[1:0] | CC[1:0] | LID[4:0] | ECP[3:0] |
| Reset Value | | 0 | 0 | 00 | 00 | 00000 | 0000 |
| Optional | | D | C | B | M | A | -- |
| | | | | Power Cntrl | Clock Cntrl | Line ID | |

*FIG. 74*

| Scan Control Register | | | | | | | | |
|---|---|---|---|---|---|---|---|---|
| Bit Position | Rsvd | 13:12 | 11:10 | 9 | 8:7 | 6:5 | 4 | 3:0 |
| Field Name | | SCS[1:0] | PSCS[1:0] | SS | PS[1:0] | DL[1:0] | SOA | SF[3:0] |
| Reset Value | -- | 00 | 00 | not JScan0 | not JScan0 | 00 | 0 | JScan0 or JScan1 |
| Optional | -- | M | M | M | M | A | M | M |
| | | | | | Pre-Select | Delay | | Scan format |

M - Mandatory
A - The function behind this field may not be supported. In this case, a non-zero value written to this field places the adapter offline

*FIG. 75*

| Transport Control Register Format | | | | | |
|---|---|---|---|---|---|
| Bit Position | Rsvd | 7 | 6 | 5 | 3:0 |
| Field Name | -- | BS | CE | BE | TF[3:0] |
| Reset Value | -- | 0 | 0 | 0 | 0000 |
| Optional | -- | A, B | A, C | A, B | A |
| | | BDX Sel | CDX Enab | BDX Enab | Transport Format |

*FIG. 76*

| Field | Link Control Register | | |
|---|---|---|---|
| ECP[3:0] | ECP - Extended Command Page | | |
| | 0 | Reserved for cJTAG usage | |
| | 1 | Test Commands | |
| | 2 | Test Registers | |
| | 3-11 | User defined | |
| | 12-15 | Reserved for DTS use | |
| LID[4:0] | Link ID - Link Identification Number | | |
| | 0dbca | Valid ID between 0 and 15 | |
| | 1xxx0 | Invalid ID and Not Isolated | |
| | 1xxx1 | Invalid ID and Isolated | |
| CC[1:0] | Clock Control - Informs chip of clock source and edge of clock used to sample data | | |
| | x0 | TS supplies TCK | |
| | x1 | DTS supplies TCK | |
| | 0x | Sample inputs on Falling TCK edge | |
| | 1x | Sample inputs on Rising TCK edge | |
| PC[1:0] | Power Control - Defines interface power-down behavior | | |
| | 00 | Allow power down in TLR state | The chip power-down controller may power down the DTI interface if the:<br>- Operating mode (Mode 1) is standard<br>- TMSC pin is high<br>- Power/Reset Controller (PRC) has requested the DTI to power down<br>- TAP has reached the TLR state |
| | 01 | No interface power down | PRC is not allowed to turn off interface power |
| | 10 | Allow power down in TLR if no TCK for 1 msec | The chip power-down controller is allowed to power down the DTI interface if the:<br>- TMSC pin is a high<br>- Power/Reset Controller (PRC) has requested the DTI to power down<br>- TAP has reached the TLR state<br>- PRC has observed TCK high for a minimum of 1 msec after reaching TLR state |
| | 11 | Loss of TCK Power Down | The power and reset controller is allowed to power down the DTI interface if the:<br>- PRC has observed TCK high for a minimum of 1 msec<br>This is a failsafe mode that will allow an interface to power down, if the connection between the DTS and TS is broken and the DTS is supplying TCK |
| JTRST | JTAG TRST - Asserts TRST to the JTAG interface | | |
| | 0 | JTAG Interface TRST inactive | |
| | 1 | JTAG Interface TRST active | |
| FLAT | Flatten Scan Path - Connect all system TAPs in the adapter scan path | | |
| | 0 | Scan path assumes normal configuration | |
| | 1 | Create a series scan path of all chip TAPs with chip level TAP closest to TDI | |

FIG. 77

| Field | Scan Control Register | | |
|---|---|---|---|
| SF[3:0] | Scan Format - Defines the scan format | | |
| | 0000 | JScan0 | Standard - JTAG Compliant |
| | 0001 | JScan1 | Standard - JTAG Firewalled |
| | 0010 | JScan2 | Standard - JTAG Star selection |
| | 0011 | JScan3 | Standard - JTAG Series selection |
| | 0100 | SScan0 | Advanced - Scan Segments/min stalls/DTS clk only |
| | 0101 | SScan1 | Advanced - Scan Segments/max stalls/DTS clk only |
| | 0110 | SScan2 | Advanced - Scan Segments/min stalls/DTS or TS clk |
| | 0111 | SScan3 | Advanced - Scan Segments/max stalls/DTS or TS clk |
| | 1000 | OScan0 | Advanced - TMS no-shift; TDI shift - 1 bit |
| | 1001 | OScan1 | Advanced - OScan0 +TDO shift - 1-bit cntl pkt/2-bit data pkt |
| | 1010 | OScan2 | Advanced - OScan0 +TDO - 2-bit cntl pkt/22-bit data pkt |
| | 1011 | OScan3 | Advanced - OScan0 + RDY +TDO - 3-bit cntl pkt/3-bit data pkt |
| | 1100 | OScan4 | Advanced - TMS + TDI in shift - 1-bit cntl packet/2-bit data pkt |
| | 1101 | OScan5 | Advanced - OScan4 + TDO in shift) - 1-bit cntl bit/3-bit data pkt |
| | 1110 | OScan6 | Advanced - TMS + TDO + TDI in shift) - 2-bit cntl bit/3-bit data bit |
| | 1111 | OScan7 | Advanced - TDI + TMS + RDY + TDO) - 4-bit cntl pkt/4-bit data pkt |
| SOA | Link ID - Link Identification Number | | |
| | 0 | TDO Output Normal | |
| | 1 | Standard - Selection data next DR_scan<br>Advanced - Status of selected is chosen | |
| DL [1:0] | Delay Length - Defines the delay length | | |
| | 00 | No delay | |
| | 01 | One clock delay | |
| | 10 | Two clock delay | |
| | 11 | Three or more clock delay, DTS determines delay link | |
| PS [1:0] | Pre-Select - Preliminarily scan selects | | |
| | X0 | Parallel | Not Pre-Selected |
| | X1 | Parallel | Pre-Selected |
| | 0x | Series | Not Pre-Selected |
| | 1x | Series | Pre-Selected |
| SS | Scan Selection - This device is selected for scan transactions. PS is copied to SS when the IDLE state is entered or PS changed while TAP state is IDLE. | | |
| | 0 | No System JTAG TAP states may be advanced | |
| | 1 | System JTAG TAP states may be advanced | |
| PSCS [1:0] | Preliminary Scan Status - Based on the number or selections | | |
| | 00 | Link ID assignment has not occurred | |
| | 01 | No scan selection | |
| | 10 | Only one scan selection has been made | |
| | 11 | More than one scan selection has been made | |
| SCS [1:0] | Scan Status - PSCS is copied to SCS when the IDLE state is entered or PSCS[1:0] changed while the TAP state is IDLE | | |
| | Encoding same as PSCS | | |

| Field | Transport Control Register |
|---|---|
| TF[3:0] | Transfer Format - Defines the Background Data Transport (BDX) format 00 - 8bit, 01 - 16-bit, 10 - 32-bit, 11 - 64-bit<br>000x - Compressed Bi-directional (Bi-DI) 01xx - Uncompressed n-bit burst (Bi_Di)<br>0010 - Compressed DTS to TS (D_2_T) 10xx - Uncompressed n-bit burst (D_2_T)<br>0011 - Compressed DTS to TS (T_2_D) 11xx - Uncompressed 08-bit burst (T_2_D) |
| BE | BDX Enable - The adapter is selected for BDX transactions<br>0 - BDX is not enabled<br>1 - BDX enabled |
| CE | CDX Enable - The adapter is selected for CDX transactions<br>0 - CDX is not enabled<br>1 - CDX enabled |
| BS | BDX Selection - The adapter is selected for BDX transactions<br>0 - Not permitted to BDX (SCA cmd clears)<br>1 - Permitted to BDX (MTS cmd sets) |

*FIG. 78*

| Page | Description |
|---|---|
| 0000 | Reserved for cJTAG usage |
| 0001 | Test Commands |
| 0010 | Test Registers |
| 0011-1011 | User defined |
| 1100-1111 | Reserved for cJTAG Controllers |

*FIG. 79*

| Link ID | Description |
|---|---|
| 0xxxx | Valid ID |
| 1xxx0 | Invalid ID, not chosen for Link ID assignment |
| 1xxx1 | Invalid ID, chosen for Link ID assignment |

- Lowest number format is usable only if TCK is sourced by DTS
- Highest numbered format is usable if TCK is sourced by either TS or DTS

| Format | Link/TAP Clock Ratio | Focus A | Focus B | Focus C | Key Attribute | Use Case |
|---|---|---|---|---|---|---|
| JScan0 | 1/1 | - | ✓ | - | Compliance | IEEE 1149.1 Compliant |
| JScan1 | 1/1 | ✓ | ✓ | - | Robustness for physical connect and disconnect | Firewalled:<br>- Compatible - Series or Star configuration<br>- No connect or disconnect corruption with a running system |
| JScan2 | 1/1 | ✓ | ✓ | - | Series Performance | Series select:<br>- Compatible Series configuration<br>- Less test time, maximum JTAG series BW<br>- IR path goes to 1-bit is de-selected |
| JScan3 | 1/1 | ✓ | - | - | Star Performance | Parallel select:<br>- Compatible Star configuration<br>- Lower cost, no glue logic (built in selector)<br>- Less test time, maximum JTAG BW |
| MScan | 6/1 | ✓ | ✓ | - | Multi-adapter | Command Broadcast<br>Link ID assignment |
| OScan0<br>OScan4 | 1/1 | ✓ | ✓ | ✓ | Download Performance New Equipment | Scan Transfer rate- Unidirectional to TS<br>- 99.5% efficiency possible |
| OScan1<br>OScan5 | 1/1 | ✓ | ✓ | ✓ | Scan Performance New Equipment | Scan Transfer rate- Bi-directional to TS |
| OScan2<br>OScan6 | 2/1 | ✓ | ✓ | - | Max performance/ Current equipment compatible | Double Link clock rated vs. TAP clock rate for performance of older SI designs and DTS equipment |
| OScan3<br>OScan7 | 4/1 | ✓ | ✓ | - | Scan Stalls/ Maximum compatibility, Current Equipment | Scan rate limited devices (those with modified JTAG) |
| SScan0<br>SScan2 | 1/1 | ✓ | - | ✓ | Scan Rate Constrained Performance, New Equipment | Buffered TS scan input<br>Segmented scans to reduce volume of information transferred |
| SScan1<br>SScan3 | 1/1 | ✓ | - | ✓ | Memory Access Performance, New Equipment | Memory read and write/block transfers |

A = Capability
B = Compatibility
C = Extensibility

*FIG. 83*

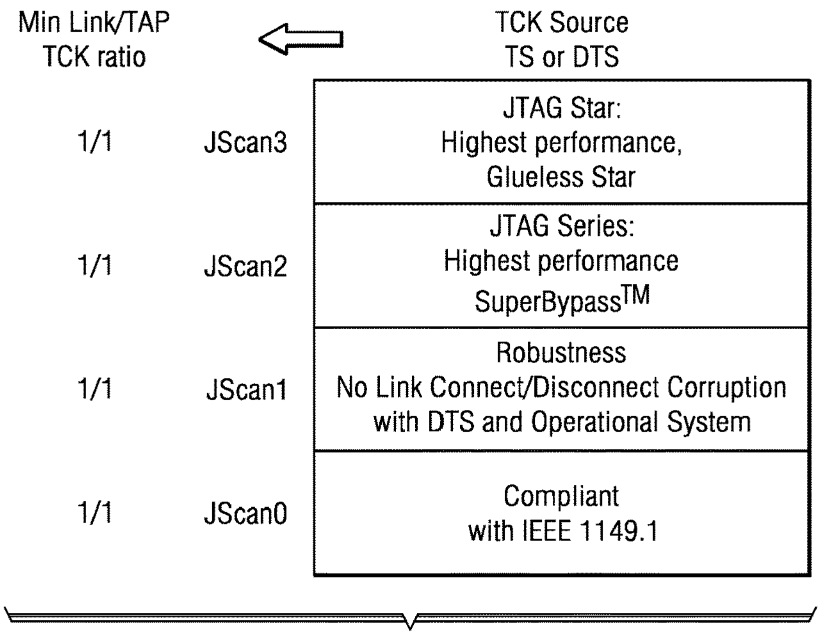
*FIG. 84*
| Format | JTAG Class | Protocol | Select Info |
|---|---|---|---|
| JScan3 | Compatible | JTAG | Series select |
| JScan2 | Compatible | JTAG | Star select |
| JScan1 | Compatible | JTAG | Firewalled |
| JScan0 | Compliant | JTAG | Device selected |
*FIG. 85*
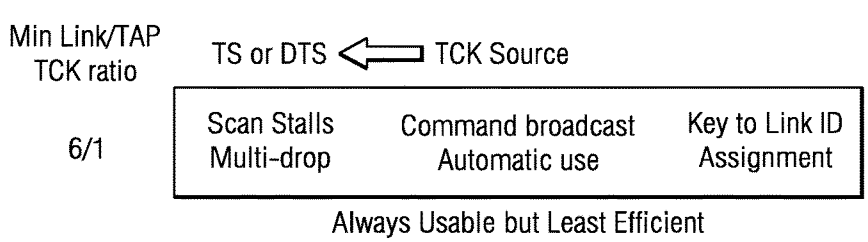
*FIG. 87*

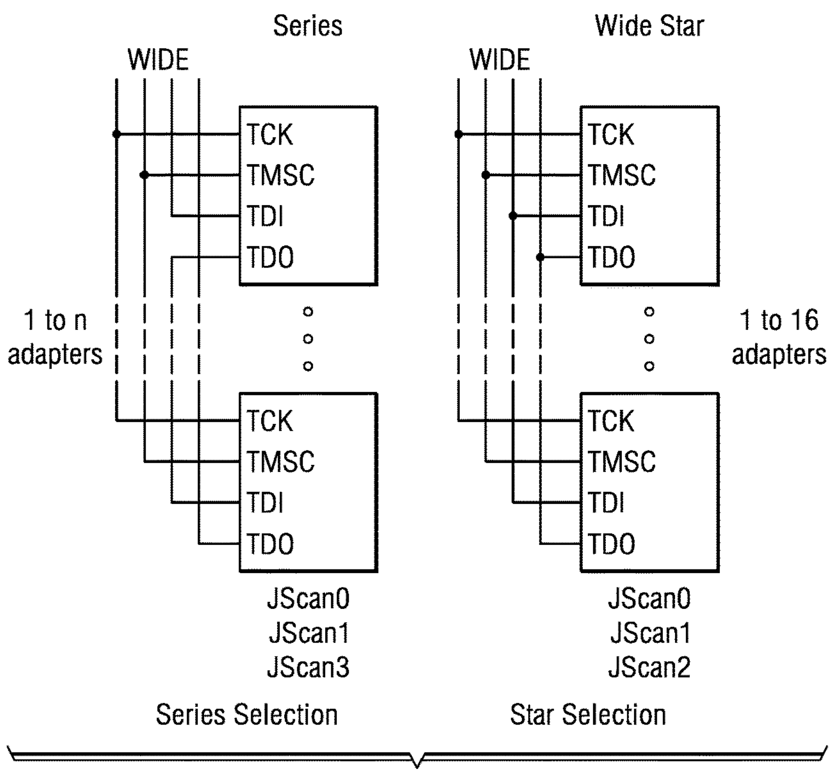
*FIG. 86*
| RDY1 | Description |
|---|---|
| 0 | TCK period n + 2 will deliver another RDY bit |
| 1 | TCK period n + 2 will deliver the TDO bit |
*FIG. 88*
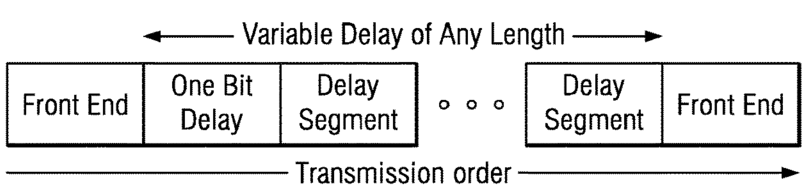
*FIG. 89*

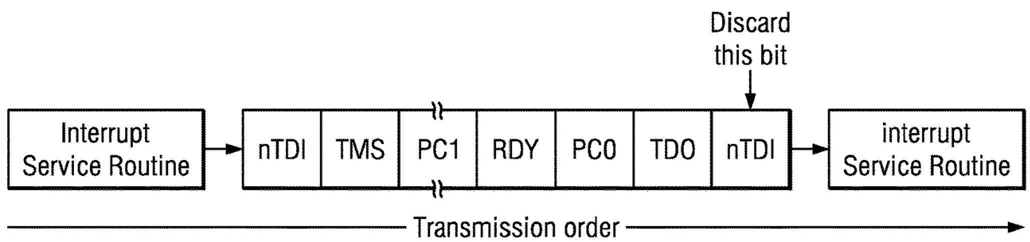
*FIG. 95*
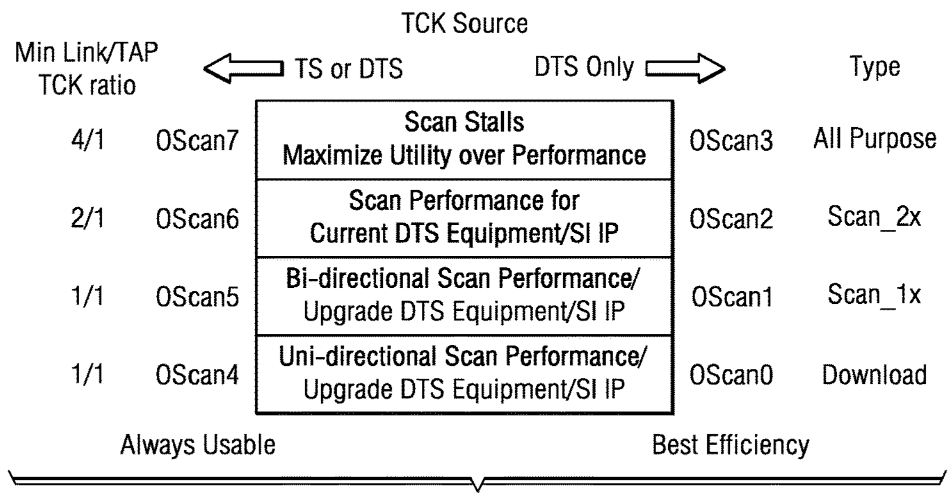
*FIG. 96*
| RDY | Description |
|---|---|
| 0 | The next TCK period will deliver another RDY bit |
| 1 | The next TCK period will deliver a valid TDO bit |
*FIG. 97*
| Type | Minimum Bits/Packet | TDI Availability | TDO Availability |
|---|---|---|---|
| All Purpose | 4 or 3 | All TAP states | All TAP states |
| Scan_2X | 2 | Shift TAP states | All TAP states |
| Scan_1X | 1 | Shift TAP states | Shift TAP states |
| Download | 1 | Shift TAP states | None |
*FIG. 98*

| Format | Optimization | | | | |
|---|---|---|---|---|---|
| | No Stall (S) | Data Input (I) | Data Output (O) | Control (C) | Uni-Directional (U) |
| OScan7 | | | | | |
| OScan6 | ✓ | ✓ | | | |
| OScan5 | ✓ | ✓ | ✓ | | |
| OScan4 | ✓ | ✓ | ✓ | | ✓ |
| OScan3 | | ✓ | | ✓ | |
| OScan2 | ✓ | ✓ | | ✓ | |
| OScan1 | ✓ | ✓ | ✓ | ✓ | |
| OScan0 | ✓ | ✓ | ✓ | ✓ | ✓ |

*FIG. 99*

| OScan | Data Packet Payloads | | | | Control Packet Payloads | | | | Transaction Type |
|---|---|---|---|---|---|---|---|---|---|
| | Shift States | | | | Non shift States | | | | |
| OScan7 | TDI | TMS | RDY | TDO | TDI | TMS | RDY | TDO | All Purpose |
| OScan6 | TDI | TMS | TDO | | TMS | TDO | | | Scan 2X |
| OScan5 | TDI | TMS | TDO | | TMS | | | | Scan 1X |
| OScan4 | TDI | TMS | | | TMS | | | | Download |
| OScan3 | TDI | RDY | TDO | | TMS | RDY | TDO | | All Purpose |
| OScan2 | TDI | TDO | | | TMS | TDO | | | Scan 2X |
| OScan1 | TDI | TDO | | | TMS | | | | Scan 1X |
| OScan0 | TDI | | | | TMS | | | | Download |

[bold box] These formats require the DTS be the TCK source

[shaded box] This packet varies based on the shift length as shown in

*FIG. 100*

| Format | Packet | | Format | Packet | |
|---|---|---|---|---|---|
| | Shift | Non-Shift | | Shift | Non-Shift |
| OScan7 | 4:1 | 4:1 | OScan3 | 3:1 | 3:1 |
| OScan6 | 3:1 | 2:1 | OScan2 | 2:1 | 2:1 |
| OScan5 | 3:1 | 1:1 | OScan1 | 2:1 | 1:1 |
| OScan4 | 2:1 | 1:1 | OScan0 | 1:1 | 1:1 |

| SScan | Clks/Pkt | | 1st Seg | 1st Pkt | HDR[2:0] | Packet Type | Packet Payloads | | | |
|---|---|---|---|---|---|---|---|---|---|---|
| | 0 | 2 | | | | | IO_0 | IO_0 | RDY | TDO |
| SScan2, SScan0 | 2 | 3 | - | no | 000 | Data | TDI | END | - | TDO |
| | 1 | 2 | | | 001 | Data | - | END | - | TDO |
| | 1 | 2 | | | 010 | Data | TDI | END | - | - |
| | 1 | 1 | | | 011 | Cntl | TMS | - | - | - |
| | 3 | 4 | | | 100 | Data | TDI | END | RDY | TDO |
| | 2 | 3 | | | 101 | Data | - | END | RDY | TDO |
| | 1 | 2 | | | 110 | Data | TDI | END | - | - |
| | 1 | 1 | | | 111 | Cntl | TMS | - | - | - |
| SScan0 | 3 | 3 | no | yes | 00x | Data | TDI | TDI | - | TDO |
| SScan2 | 3 | 3 | | | | | | END | | |
| SScan2, SScan0 | 1 | 2 | | | 010 | Data | TDI | END | - | - |
| | 1 | 1 | | | 011 | Cntl | TMS | - | - | - |
| | 3 | 4 | | | 100 | Data | TDI | END | RDY | TDO |
| | 3 | 4 | | | 101 | Data | TDI | END | RDY | TDO |
| | 3 | 4 | | | 110 | Data | TDI | END | RDY | TDO |
| | 3 | 3 | | | 111 | Cntl | TMS | - | RDY | TDO |
| | 2 | 3 | yes | yes | 000 | Data | TDI | END | - | TDO |
| | 1 | 2 | | | 001 | Data | - | END | - | TDO |
| | 1 | 2 | | | 010 | Data | TDI | END | - | - |
| | 1 | 2 | | | 011 | Data | TDI | END | - | - |
| | 3 | 4 | | | 1xx | Data | TDI | END | RDY | TDO |

The END bits are included in the packet payload for the SScan2 format only

*FIG. 117*

| 0 | 1 | 2 | 3 | 4 through n |
|---|---|---|---|---|
| nTDI or TMS | END | RDY | TDO | DLYn |

First ——— Transmission order ——→ Last

*FIG. 118*

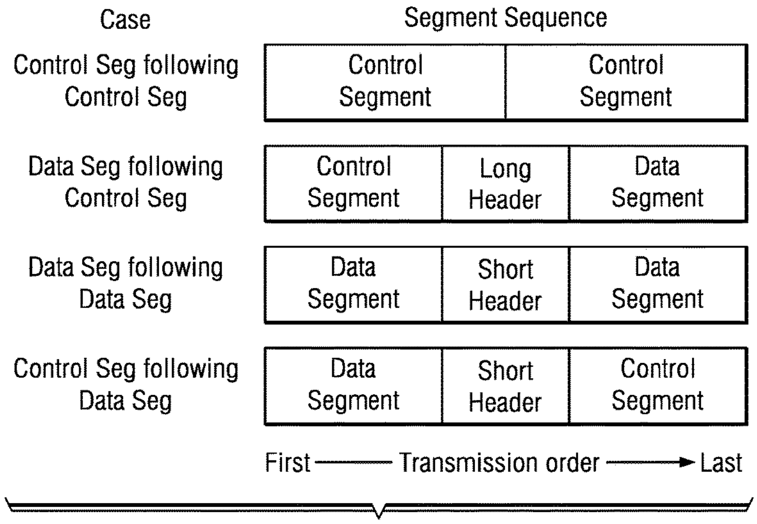

*FIG. 119*

| HDR[2:0] | After Data Segment | Payload | Transaction Type | Description |
|---|---|---|---|---|
| 000 | - | I/O | A | Input and output segment |
| 001 | - | Out Only | A | Output only segment |
| 010 | - | In Only | A | Input only segment |
| 011 | No | In Only | A | Input only segment, allow CDX |
| 011 | Yes | Control | - | Control segment, exit the shift state |
| 100 | - | I/O | B | Input and output segment |
| 101 | - | Out Only | B | Output only segment |
| 110 | - | In Only | B | Input only segment |
| 111 | No | In Only | B | Input only segment, allow CDX |
| 111 | Yes | Control | - | Control segment, exit TAP shift state |

*FIG. 120*

| Transaction Type | Description |
|---|---|
| A | HDR(2) = 0 |
| B | HDR(2) = 1 |

| Type | Optimization Type | Supplemental HW Required | | |
|---|---|---|---|---|
| | | Segment Ready | Buffered Scan Input | Output Ready |
| Type 0 | NS (No stalls) | - | - | - |
| Type 1 | P | Yes | - | - |
| Type 2 | P B | Yes | Yes | - |
| Type 3 | P B A | Yes | Yes | Yes |

*FIG. 125*

| Format | Type 0 | Type 1 | Type 2 | Type 3 | Clock |
|---|---|---|---|---|---|
| SScan3 | - | | A | B | Both DTS and TS supplied clock |
| SScan2 | A | B | - | | |
| SScan1 | - | - | A | B | DTS supplied clock only |
| SScan0 | A | B | - | - | |

A HDR(2) = 0
B HDR(2) = 1

*FIG. 126*

| Clks/Pkt | | 1st Seg | 1st Pkt | HDR[2:0] | Packet Type | Packet Payloads | | | |
|---|---|---|---|---|---|---|---|---|---|
| SScan1 | SScan3 | | | | | IO_0 | IO_0 | RDY | TDO |
| 2 | 3 | - | no | 000 | Data | TDI | END | - | TDO |
| 1 | 2 | | | 001 | Data | - | END | - | TDO |
| 1 | 2 | | | 010 | Data | TDI | END | - | - |
| 1 | 2 | | | 011 | Cntl | TMS | END | - | - |
| 3 | 4 | | | 100 | Data | TDI | END | RDY | TDO |
| 2 | 3 | | | 101 | Data | - | END | RDY | TDO |
| 1 | 2 | | | 110 | Data | TDI | END | - | - |
| 1 | 2 | | | 111 | Cntl | TMS | END | - | - |
| 3 | 4 | no | yes | x0x | Data | TDI | END | RDY | TDO |
| 3 | 4 | | | Xx0 | Data | TDI | END | RDY | TDO |
| 3 | 4 | | | x11 | Cntl | TMS | END | RDY | TDO |
| 3 | 4 | yes | yes | xxx | Data | TDI | END | RDY | TDO |

☐ The END bits are included in the packet payload for the SScan3 format only

*FIG. 127*

| Format | Type 0 | Type 1 | Type 2 | Type 3 |
|---|---|---|---|---|
| SScan3 | - | - | HDR[2] = 0 | HDR[2] = 1 |
| SScan2 | HDR[2] = 0 | HDR[2] = 1 | - | - |
| SScan1 | - | - | HDR[2] = 0 | HDR[2] = 1 |
| SScan0 | HDR[2] = 0 | HDR[2] = 1 | - | - |

*FIG. 131*

<table>
<tr><th colspan="2">Clks/Pkt</th><th rowspan="2">1st Seg</th><th rowspan="2">1st Pkt</th><th rowspan="2">HDR[2:0]</th><th rowspan="2">Packet Type</th><th colspan="4">Packet Payloads</th></tr>
<tr><th>SScan0</th><th>SScan2</th><th>IO_0</th><th>IO_0</th><th>RDY</th><th>TDO</th></tr>
<tr><td>2</td><td>3</td><td rowspan="8">-</td><td rowspan="8">no</td><td>000</td><td>Data</td><td>TDI</td><td>END</td><td>-</td><td>TDO</td></tr>
<tr><td>1</td><td>2</td><td>001</td><td>Data</td><td>-</td><td>END</td><td>-</td><td>TDO</td></tr>
<tr><td>1</td><td>2</td><td>010</td><td>Data</td><td>TDI</td><td>END</td><td>-</td><td>-</td></tr>
<tr><td>1</td><td>1</td><td>011</td><td>Cntl</td><td>TMS</td><td>-</td><td>-</td><td>-</td></tr>
<tr><td>3</td><td>4</td><td>100</td><td>Data</td><td>TDI</td><td>END</td><td>RDY</td><td>TDO</td></tr>
<tr><td>2</td><td>3</td><td>101</td><td>Data</td><td>-</td><td>END</td><td>RDY</td><td>TDO</td></tr>
<tr><td>1</td><td>2</td><td>110</td><td>Data</td><td>TDI</td><td>END</td><td>-</td><td>-</td></tr>
<tr><td>1</td><td>1</td><td>111</td><td>Cntl</td><td>TMS</td><td>-</td><td>-</td><td>-</td></tr>
<tr><td>3</td><td>3</td><td rowspan="8">no</td><td rowspan="8">yes</td><td rowspan="2">00x</td><td rowspan="2">Data</td><td rowspan="2">TDI</td><td>TDI</td><td rowspan="2">-</td><td rowspan="2">TDO</td></tr>
<tr><td>3</td><td>3</td><td>END</td></tr>
<tr><td>1</td><td>2</td><td>010</td><td>Data</td><td>TDI</td><td>END</td><td>-</td><td>-</td></tr>
<tr><td>1</td><td>1</td><td>011</td><td>Cntl</td><td>TMS</td><td>-</td><td>-</td><td>-</td></tr>
<tr><td>3</td><td>4</td><td>100</td><td>Data</td><td>TDI</td><td>END</td><td>RDY</td><td>TDO</td></tr>
<tr><td>3</td><td>4</td><td>101</td><td>Data</td><td>TDI</td><td>END</td><td>RDY</td><td>TDO</td></tr>
<tr><td>3</td><td>4</td><td>110</td><td>Data</td><td>TDI</td><td>END</td><td>RDY</td><td>TDO</td></tr>
<tr><td>3</td><td>3</td><td>111</td><td>Cntl</td><td>TMS</td><td>-</td><td>RDY</td><td>TDO</td></tr>
<tr><td>2</td><td>3</td><td rowspan="5">yes</td><td rowspan="5">yes</td><td>000</td><td>Data</td><td>TDI</td><td>END</td><td>-</td><td>TDO</td></tr>
<tr><td>1</td><td>2</td><td>001</td><td>Data</td><td>-</td><td>END</td><td>-</td><td>TDO</td></tr>
<tr><td>1</td><td>2</td><td>010</td><td>Data</td><td>TDI</td><td>END</td><td>-</td><td>-</td></tr>
<tr><td>1</td><td>2</td><td>011</td><td>Data</td><td>TDI</td><td>END</td><td>-</td><td>-</td></tr>
<tr><td>3</td><td>4</td><td>1xx</td><td>Data</td><td>TDI</td><td>END</td><td>RDY</td><td>TDO</td></tr>
</table>

The END bits are included in the packet payload for the SScan2 format only

*FIG. 128*

| Format | Packet | |
|---|---|---|
| | Shift | Non-Shift |
| SScan3 | 2:1 | 2:1 |
| SScan2 | 2:1 | 2:1 |
| SScan1 | 1:1 | 1:1 |
| SScan0 | 1:1 | 1:1 |

| Segment | I/O | I | O | C |
|---|---|---|---|---|
| SScan0 | 6 | 6 | 7 | 2 |
| SScan1 | 6 + r | 6 + r | 7 + r | 2 + r |
| SScan2 | n + 6 + r | n + 6 + r | n + 6 + r | 2 + r |
| SScan3 | n + 6 + r + n(s) | n + 6 + r + n(s) | n + 6 + r + n(s) | n + 2 + r + n(s) |

| Segment | I/O | I | O | C |
|---|---|---|---|---|
| SScan0 | 2n + 6 | n + 6 | n + 7 | n + 2 |
| SScan1 | 3n + 6 + r | n + 6 + r | 2n + 8 + r | n + 2 + r |
| SScan2 | 3n + 6 + r | 2n + 6 + r | 2n + 8 + r | n + 2 + r |
| SScan3 | 3n + 6 + r + n(s) | 2n + 6 + r + n(s) | 2n + 7 + r + n(s) | 2n + 2 + r |

| CC[0] | TF[3:0] | Transfer Direction | Transfer Type | Packet Length |
|---|---|---|---|---|
| 1 | 000x | Bi-Di | Continuous | 02 |
| 1 | 0010 | D_2_T | Continuous | 02 |
| 1 | 0011 | T_2_D | Continuous | 02 |
| 0 | 000x | Bi-Di | Burst | HDR + 64 |
| 0 | 0010 | D_2_T | Burst | HDR + 64 |
| 0 | 0011 | T_2_D | Burst | HDR + 64 |
| x | 0100 | Bi-Di | Burst | HDR + 08 |
| x | 0101 | Bi-Di | Burst | HDR + 16 |
| x | 0110 | Bi-Di | Burst | HDR + 32 |
| x | 0111 | Bi-Di | Burst | HDR + 64 |
| x | 1000 | D_2_T | Burst | HDR + 08 |
| x | 1001 | D_2_T | Burst | HDR + 16 |
| x | 1010 | D_2_T | Burst | HDR + 32 |
| x | 1011 | D_2_T | Burst | HDR + 64 |
| x | 1100 | T_2_D | Burst | HDR + 08 |
| x | 1101 | T_2_D | Burst | HDR + 16 |
| x | 1110 | T_2_D | Burst | HDR + 32 |
| x | 1111 | T_2_D | Burst | HDR + 64 |

*FIG. 163*

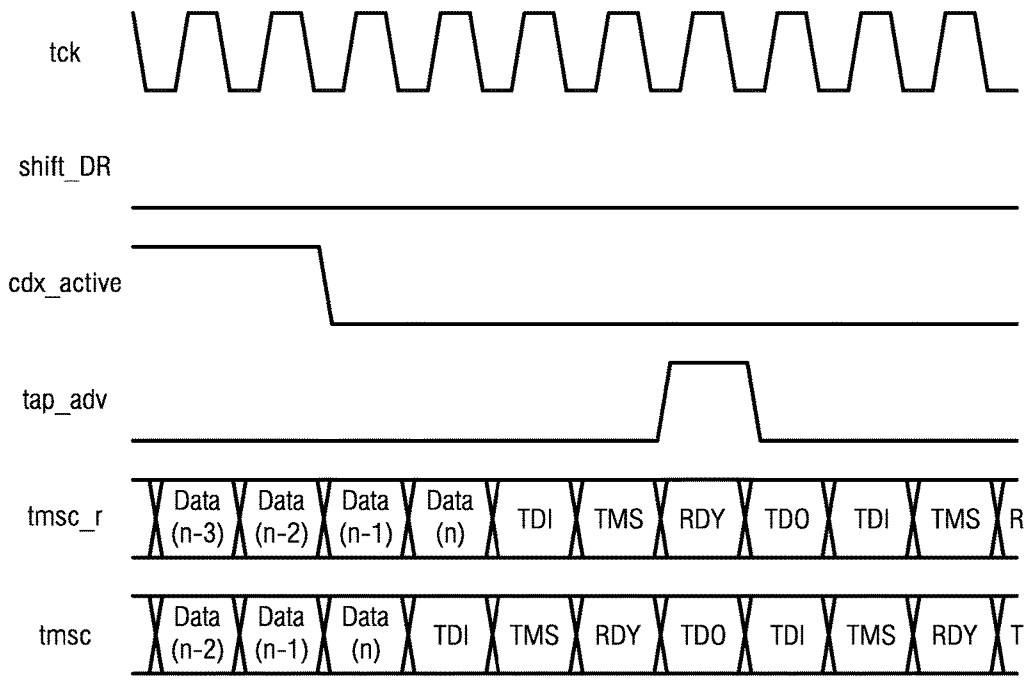
FIG. 195
FIG. 196
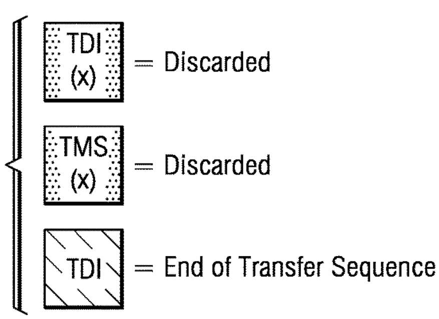

| Configuration Change Event | New SF[3:0] | Current SF[3:0] |
|---|---|---|
| SSF Command | x1xx | xxxx |
| | 1xxx | xxxx |
| Any STR Command | xxxx | x1xx |
| | xxxx | 1xxx |

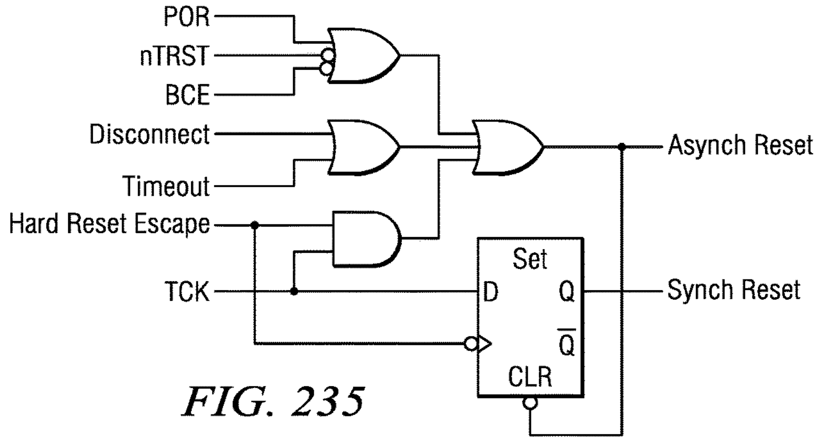

FIG. 235

| Out[15:0] | Definition | Description |
|---|---|---|
| 00 | 0 | Zero (0) |
| 01 | SS | Scan Select |
| 03:02 | SCS[1:0] | Scan Control Status |
| 07:04 | Rev[3:0] | Revision number starting with 0 |
| 08 | Multi-drop | 1 = Supported, 0 = Not Supported |
| 09 | OScan5 and OScan4 | 1 = Supported, 0 = Not Supported |
| 10 | OScan3 and OScan2 | 1 = Supported, 0 = Not Supported |
| 11 | OScan1 and OScan0 | 1 = Supported, 0 = Not Supported |
| 12 | SScan3 and SScan2 | 1 = Supported, 0 = Not Supported |
| 13 | SScan1 and SScan0 | 1 = Supported, 0 = Not Supported |
| 14 | BDX | 1 = Supported, 0 = Not Supported |
| 15 | CDX | 1 = Supported, 0 = Not Supported |

FIG. 236

<table>
<tr><th>Port</th><th>TCK</th><th>TMSC/TMS</th><th>TDI</th><th>TDO</th></tr>
<tr><td>Narrow Star</td><td rowspan="3">All TCK pins connected in parallel</td><td rowspan="2">All TMSC pins connected in parallel, no TMS pins included</td><td>Not Needed</td><td>Not Needed</td></tr>
<tr><td>Wide Star</td><td>All TDI pins connected in parallel</td><td>All TDO pins connected in parallel</td></tr>
<tr><td>Series</td><td>All TMSC and TMS pins connected in parallel</td><td colspan="2">TDO of device (a) connected to TDI of device (b)</td></tr>
</table>

FIG. 237

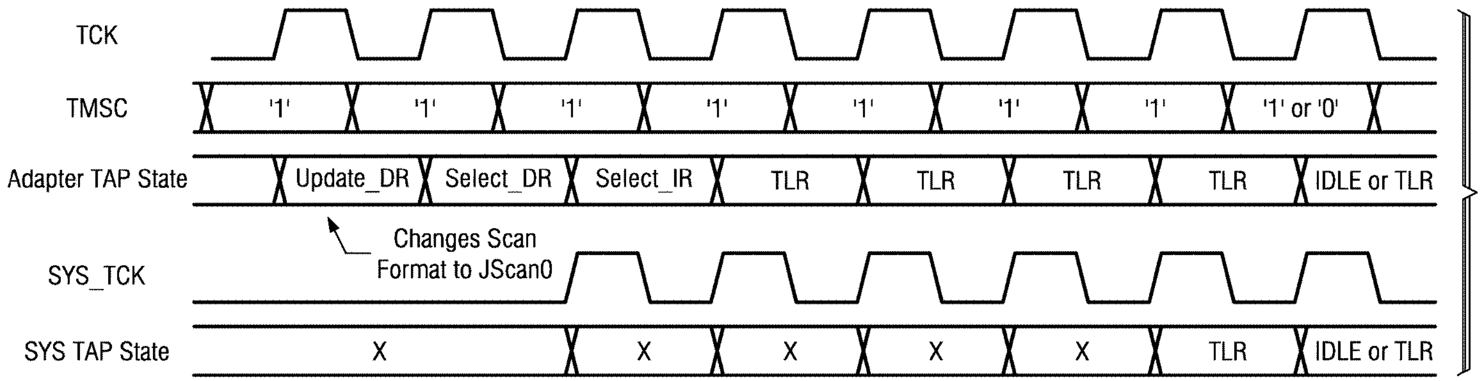
FIG. 248
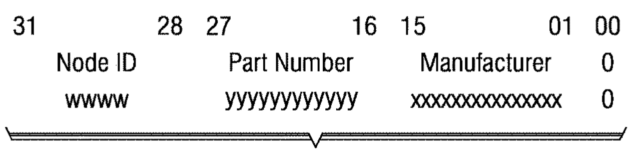
FIG. 249
| TAP ST | Action |
|---|---|
| Capture_DR | If (Link ID is Invalid) {Link_ID = "Invalid and Isolated"} |
| Shift_DR | if (data out /= data in) {Link_ID = "Invalid and Not Isolated"} |
| Update_DR | Load Link ID if adapter is isolated |
FIG. 250

| STR | LTR | From | To |
|---|---|---|---|
| SCA | 1001x | PS[1] = 1 | PS[1] = 0 |
| SCA | 1001x | PS[1] = 0 | PS[1] = 0 |
| SCA | 1000x | PS[1] = 1 | PS[1] = 1 |
| SCA | 1000x | PS[1] = 0 | PS[1] = 1 |
| MSS | yyyy != Link ID | PS[1] = 0 | PS[1] = 0 |
| MSS | yyyy = Link ID | PS[1] = 0 | PS[1] = 1 |
| MSS | yyyy != Link ID | PS[1] = 1 | PS[1] = 1 |
| MSS | yyyy = Link ID | PS[1] = 1 | PS[1] = 1 |
| ILID | xxxx | PS[1] = 0 | PS[1] = 0 |
| ILID | xxxx | PS[1] = 1 | PS[1] = 0 |

*FIG. 258*

| STR | LTR | From | To |
|---|---|---|---|
| SCA | 1001x | PSCS[1:0] = 00 | PSCS[1:0] = 00 |
| SCA | 1001x | PSCS[1:0] = 01 | PSCS[1:0] = 01 |
| SCA | 1001x | PSCS[1:0] = 10 | PSCS[1:0] = 01 |
| SCA | 1001x | PSCS[1:0] = 11 | PSCS[1:0] = 01 |
| SCA | 1000x | PSCS[1:0] = ab | PSCS[1:0] = ab |
| MSS | yyyy != Link ID | PSCS[1:0] = 00 | PSCS[1:0] = 00 |
| MSS | yyyy = Link ID | PSCS[1:0] = 00 | PSCS[1:0] = 00 |
| MSS | yyyy != Link ID | PSCS[1:0] = 01 | PSCS[1:0] = 01 |
| MSS | yyyy = Link ID | PSCS[1:0] = 01 | PSCS[1:0] = 10 |
| MSS | yyyy != Link ID | PSCS[1:0] = 10 | PSCS[1:0] = 10 |
| MSS | yyyy = Link ID | PSCS[1:0] = 10 | PSCS[1:0] = 11 |
| MSS | yyyy != Link ID | PSCS[1:0] = 11 | PSCS[1:0] = 11 |
| MSS | yyyy = Link ID | PSCS[1:0] = 11 | PSCS[1:0] = 11 |
| ILID | xxxx | PSCS[1:0] = 00 | PSCS[1:0] = 01 |
| ILID | xxxx | PSCS[1:0] = 01 | PSCS[1:0] = 01 |
| ILID | xxxx | PSCS[1:0] = 10 | PSCS[1:0] = 01 |
| ILID | xxxx | PSCS[1:0] = 11 | PSCS[1:0] = 01 |

*FIG. 259*

| DTS Interface | Device Interface | | |
|---|---|---|---|
| | 1149.1 | Wide cJTAG | Narrow cJTAG |
| JTAG (legacy equipment) | ✓ | ✓ | - |
| cJTAG | ✓ | ✓ | ✓ |

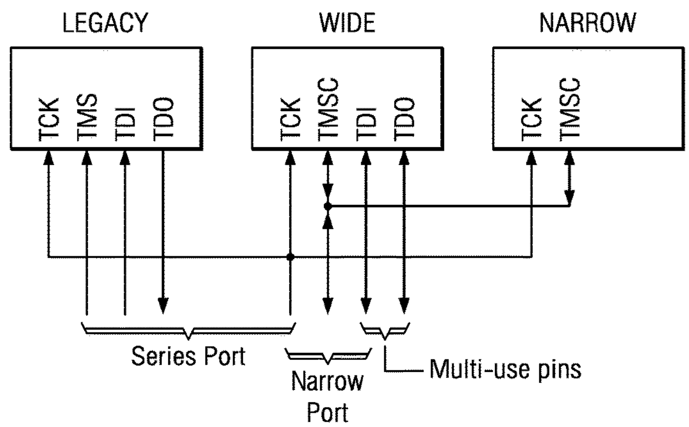

*FIG. 286*

| | |
|---|---|
| Interface Power Down | Interface power-up, power-down and do not power-down modes are supported. The TMSC pin held low is sufficient to power up the interface |
| Setup | While in the standard mode, the advanced mode operating characteristics may be fully specified before switching from the standard mode to the advanced mode |
| Data Sampling | The sampling point for data sampling is programmable to be on either the rising or the falling edge of TCK |
| TCK Source Consistency | Transfer protocols are forced to be compatible with the TCK clock source as specified by the DTS |
| Disconnect Detection | The advanced mode protocols incorporate failsafe characteristics that restart Link operation when abnormal conditions are detected |

*FIG. 287*

ADAPTER CIRCUITRY WITH LINK AND SYSTEM INTERFACES TO CORE CIRCUITRY

This application is a divisional of application Ser. No. 15/409,855, filed Jan. 17, 2017, now U.S. Pat. No. 9,952, 285, issued Apr. 24, 2018;

Which was a divisional of application Ser. No. 15/210, 487, filed Jul. 14, 2016, now abandoned;

Which was a divisional of application Ser. No. 14/948, 612, filed Nov. 23, 2015, now U.S. Pat. No. 9,423,458, issued Aug. 23, 2016;

Which was a divisional of application Ser. No. 14/679, 315, filed Apr. 6, 2015, now U.S. Pat. No. 9,222,980, issued Dec. 29, 2015;

Which was a divisional of application Ser. No. 14/475, 894, filed Sep. 3, 2014, now U.S. Pat. No. 9,032,265, issued May 12, 2015;

Which was a divisional of application Ser. No. 14/189, 387, filed Feb. 25, 2014, now U.S. Pat. No. 8,874,982, issued Oct. 28, 2014;

Which was a divisional of application Ser. No. 14/053, 118, filed Oct. 14, 2013, now U.S. Pat. No. 8,707,118, issued Apr. 22, 2014;

Which was a divisional of application Ser. No. 13/693, 535, filed Dec. 4, 2012, now U.S. Pat. No. 8,589,746, issued Nov. 19, 2013;

Which was a divisional of application Ser. No. 13/362, 883, filed Jan. 31, 2012, now U.S. Pat. No. 8,352,816, issued Jan. 8, 2013;

Which was a divisional of application Ser. No. 12/776, 579, filed May 10, 2010, now U.S. Pat. No. 8,136,003, issued Mar. 13, 2012;

Which was a divisional of application Ser. No. 12/464, 468, filed May 12, 2009, now U.S. Pat. No. 7,984,347, issued Jul. 19, 2011;

which was a divisional of application Ser. No. 11/351,443, filed Feb. 9, 2006, now U.S. Pat. No. 7,552,360, issued Jun. 23, 2009, which was a continuation-in-part of:

application Ser. No. 11/293,067, filed on Dec. 2, 2005, now U.S. Pat. No. 7,761,762, issued Jul. 20, 2010;

application Ser. No. 11/292,598, filed on Dec. 2, 2005, now U.S. Pat. No. 7,793,152, issued Sep. 7, 2010;

application Ser. No. 11/293,599, filed on Dec. 2, 2005, now U.S. Pat. No. 7,809,987, issued Oct. 5, 2010;

application Ser. No. 11/292,597, filed on Dec. 2, 2005, now U.S. Pat. No. 7,571,366, issued Aug. 4, 2009; and application Ser. No. 11/292,703, filed on Dec. 2, 2005, now U.S. Pat. No. 7,779,321, issued Aug. 17, 2010; and which claimed the benefit of:

Provisional Application No. 60/663,827, filed on Mar. 21, 2005;

Provisional Application No. 60/676,603, filed on Apr. 29, 2005; and

Provisional Application No. 60/689,381, filed on Jun. 10, 2005.

BACKGROUND

As electronic circuits and devices have become more complex, testing of these devices has become increasingly difficult. Test standards have been developed to address at least some of these testing difficulties. One such standard, written by the Joint Test Action Group ("JTAG"), is IEEE standard number 1149.1, which describes the Standard Test Access Port and Boundary-Scan Architecture. Boundary scan is a methodology that allows controllability and observability of the boundary pins in a JTAG compatible device via software control. This capability allows testing of circuit boards that otherwise might not be practical or possible given the trace pitch and multi-layering of printed circuit boards today. Testing is accomplished through a series of registers, accessible through a serial bus, which allow the pins of JTAG compatible devices to be temporarily isolated from their respective devices. The pin on one isolated JTAG compatible device may be set to a known test state while the pin on another isolated JTAG compatible device is monitored to confirm that it is in the same known state. In this way individual traces on a printed circuit board may be tested. This type of testing has generally represented the limits of the testing capabilities of the JTAG architecture.

SUMMARY

The present disclosure describes an adapter system and method for sharing a communications link between multiple communications protocols, such as debug and test.

BRIEF DESCRIPTION OF THE DRAWINGS

For a detailed description of the preferred embodiments of the invention, reference will now be made to the accompanying drawings in which:

FIG. 6C illustrates a simplified version of FIGS. 6A and 6B in accordance with at least some preferred embodiments;

FIG. 7 illustrates the format of an advanced mode command window in accordance with at least some preferred embodiments;

FIG. 8A illustrates an example of an assignment of various functions to specific command levels in accordance with at least some preferred embodiments;

FIG. 8B illustrates an example of specific scan counts associated with specific advanced mode commands in accordance with at least some preferred embodiments;

FIG. 11 illustrates the format for an optimized scan message in accordance with at least some preferred embodiments;

FIG. 15A illustrates the timing diagram of a fixed delay between scan messages in accordance with at least some preferred embodiments;

FIG. 15B illustrates an example of delay control register bit settings in accordance with at least some preferred embodiments;

FIG. 16A illustrates the timing diagram for a variable delay between scan messages in accordance with at least some preferred embodiments;

FIG. 18 illustrates a cJTAG target system implementing a global bypass bit in accordance with at least some preferred embodiments;

FIG. 39 is a TS Adapter block diagram;

FIG. 42 is a diagram of CSM, IO SM, and XSM TMSC Control Sharing;

FIG. 47 is a diagram of state encoding;

FIG. 50 is a block diagram of TCK Sources;

FIG. 51 is a table of DTS vs. TS TCK Source Comparison;

FIG. 52 is a table of Drive Characteristics;

FIG. 53 is a timing diagram of TS TMSC Drive;

FIG. 54 is a timing diagram of DTS TMSC Drive Only When TCK Low;

FIG. 55 is a timing diagram of DTS TMSC Drive over Multiple Bit Periods;

FIG. 56 is a table of Timing Parameters;

FIG. 66 is a table of Power-Down Options;

FIG. 67 is a block diagram of Power Control Interface;

FIG. 68 is a table of Escape Sequences;

FIG. 69 is a timing diagram of End-of-Transfer Escape Sequence Imposed on TS Output;
FIG. 70 is a timing diagram of Hard-Reset Escape Sequence While TCK is High;
FIG. 71 is a table of Registers;
FIG. 72 is a table of Commands and Options;
FIG. 73 is a table of Link Control (LINK_CNTL) Register Format;
FIG. 74 is a table of Scan Control (SCAN_CNTL) Register Format;
FIG. 75 is a table of Transport Control (XPORT_CNTL) Register Format;
FIG. 76 is a table of Link Control Register Field Definitions;
FIG. 77 is a table of Scan Control Register Field Definitions;
FIG. 78 is a table of Transport Control Register Field Definitions;
FIG. 79 is a table of Extended Command Page;
FIG. 80 is a table of Link ID Encoding;
FIG. 83 is a table of Scan Formats Summary;
FIG. 84 is a diagram of JScan Capabilities;
FIG. 85 is a table of JScan Formats;
FIG. 86 is a diagram of Standard 4-pin Scan Topographies;
FIG. 87 is a diagram of MScan Capabilities;
FIG. 88 is a table of MScan Packet RDY Definition;
FIG. 89 is a diagram of Variable Delay Construction;
FIG. 95 is a diagram of Interrupt Interaction with an MScan Packet Sequence;
FIG. 96 is a diagram of OScan Capabilities;
FIG. 97 is a table of OScan RDY Definition;
FIG. 98 is a table of OScan Transaction Type Characteristics;
FIG. 99 is a table of OScan Packet Optimizations;
FIG. 100 is a table of OScan Packet Payloads;
FIG. 117 is a table of SScan2 and SScan0 Packet Payloads;
FIG. 118 is a diagram of SScan Packet Template;
FIG. 119 is a diagram of Header Insertion;
FIG. 120 is a table of Header Decode;
FIG. 125 is a table of Supporting Hardware for the Use of Stalls;
FIG. 126 is a table of Transaction Types by Format;
FIG. 127 is a table of SScan3 and SScan1 Packet Payloads;
FIG. 128 is a table of SScan2 and SScan0 Packet Payloads;
FIG. 131 is a table of HDR[2] Stall Influence.

FIG. 163 is a diagram of Transfer Characteristics;

FIG. 195 is a timing diagram of Deactivating CDX with the OScan7 Format;

FIG. 196 is a diagram of Key to Special Treatment of States;

FIG. 197 is a timing diagram of CDX Burst Transfer with OScan7;

FIG. 198 is a timing diagram of CDX Burst Transfer with OScan2 or OScan6;

FIG. 199 is a timing diagram of CDX Burst Transfer with OScan0, 1, 4, 5;

FIG. 200 is a timing diagram of CDX Burst Transfer with OScan3;

FIG. 201 is a timing diagram of CDX Burst Transfer with SScan3;

FIG. 202 is a timing diagram of CDX Burst Transfer with SScan2;

FIG. 203 is a timing diagram of CDX Burst Transfer with SScan1 and SScan0;

FIG. 204 is a timing diagram of Continuous Transfer with OScan3;

FIG. 205 is a timing diagram of Continuous Transfer with OScan2;

FIG. 206 is a timing diagram of Continuous Transfer with OScan0, 1;

FIG. 207 is a timing diagram of CDX Continuous Transfer with SScan1 and SScan0;

Figure 208:
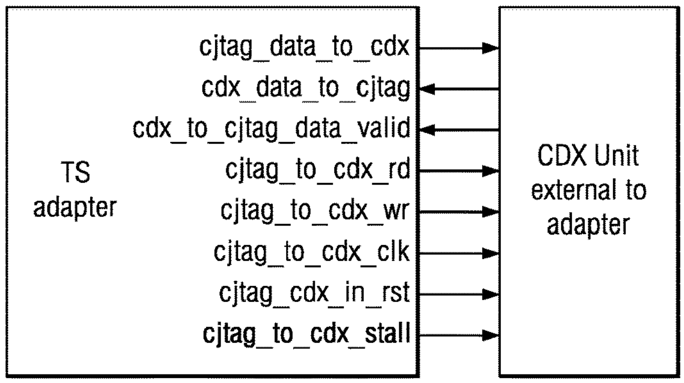
Figure 209:
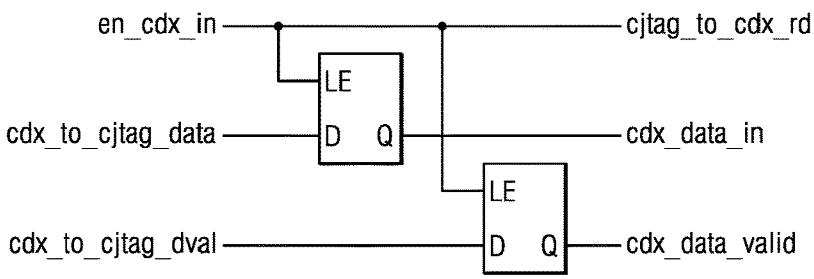
Figure 210:
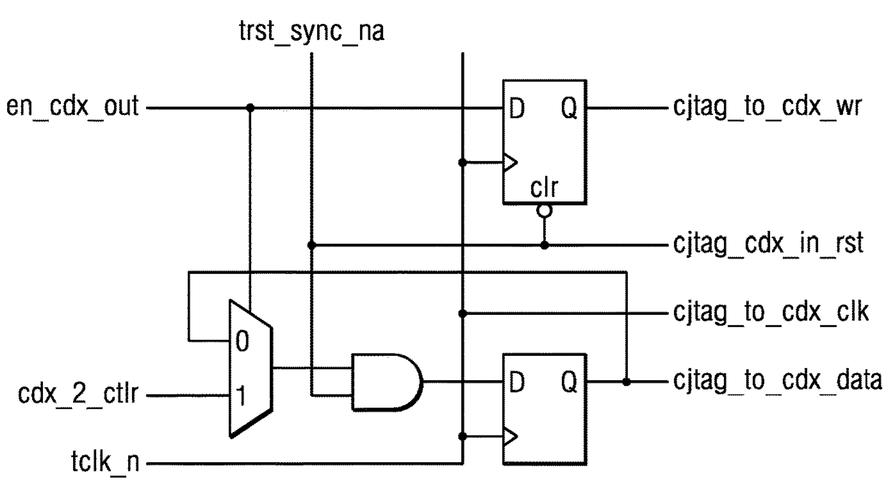
Figure 211:
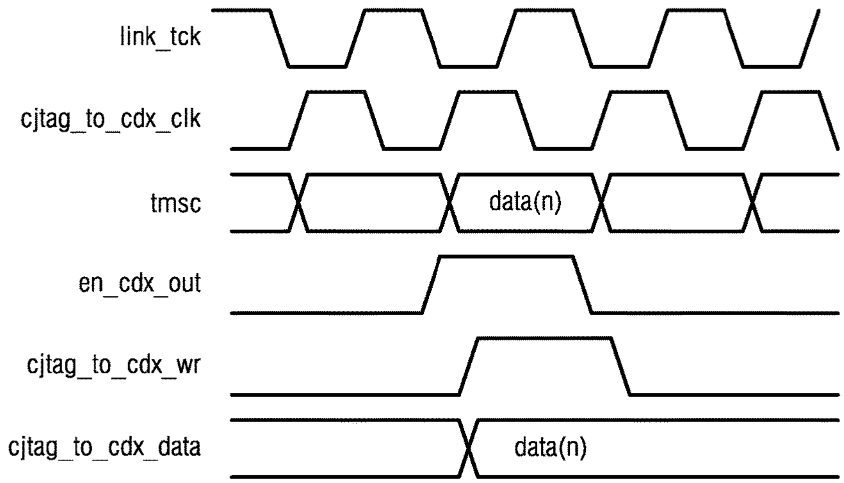
Figure 212:
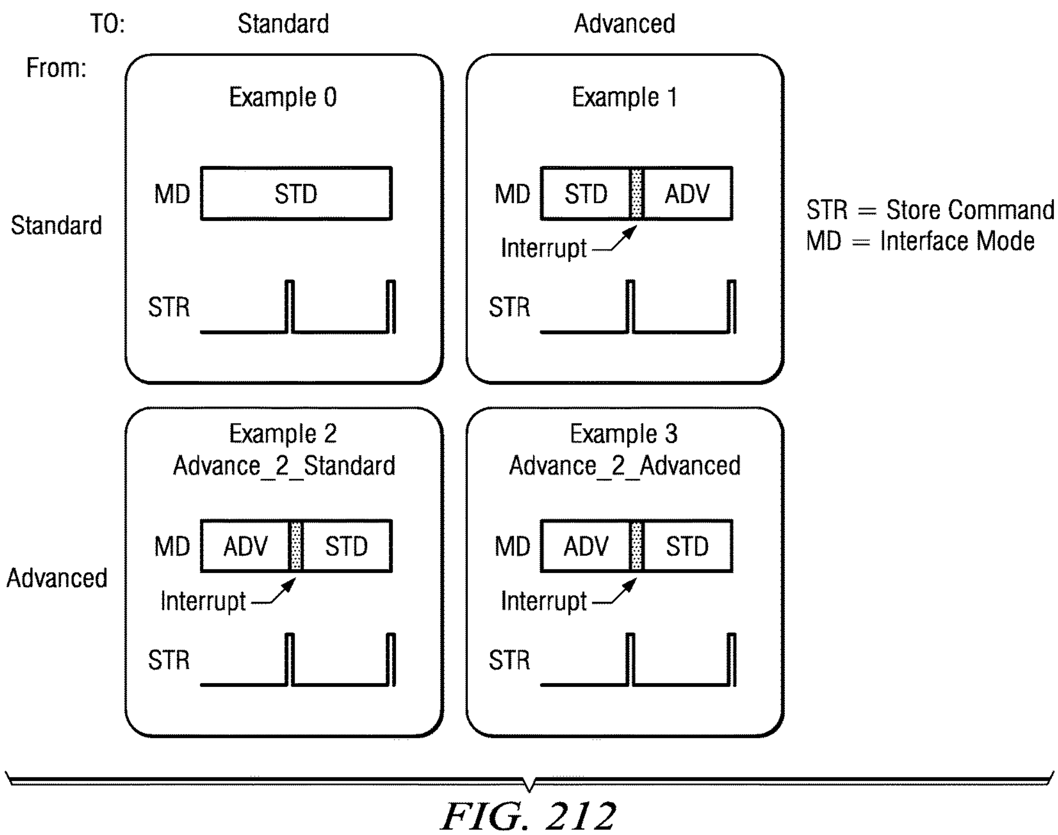
Figure 213:
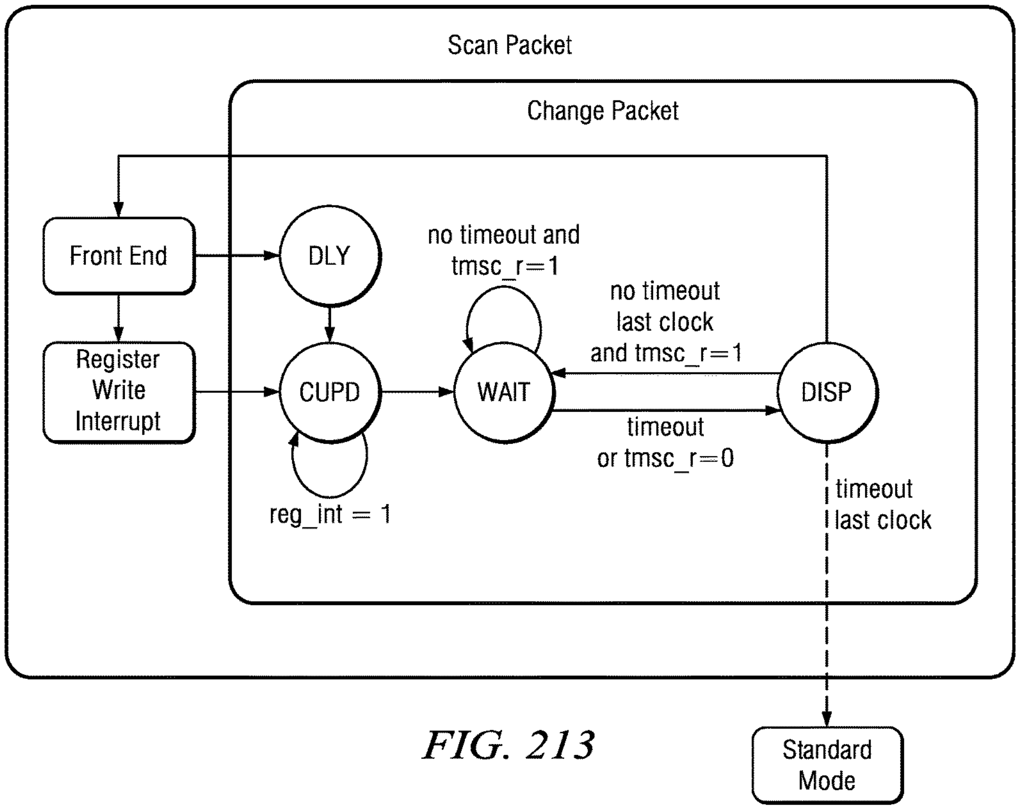
Figure 214:
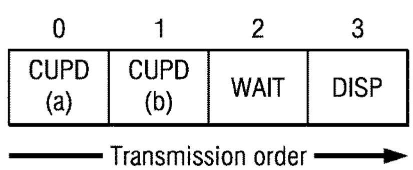
Figures 215, 216:
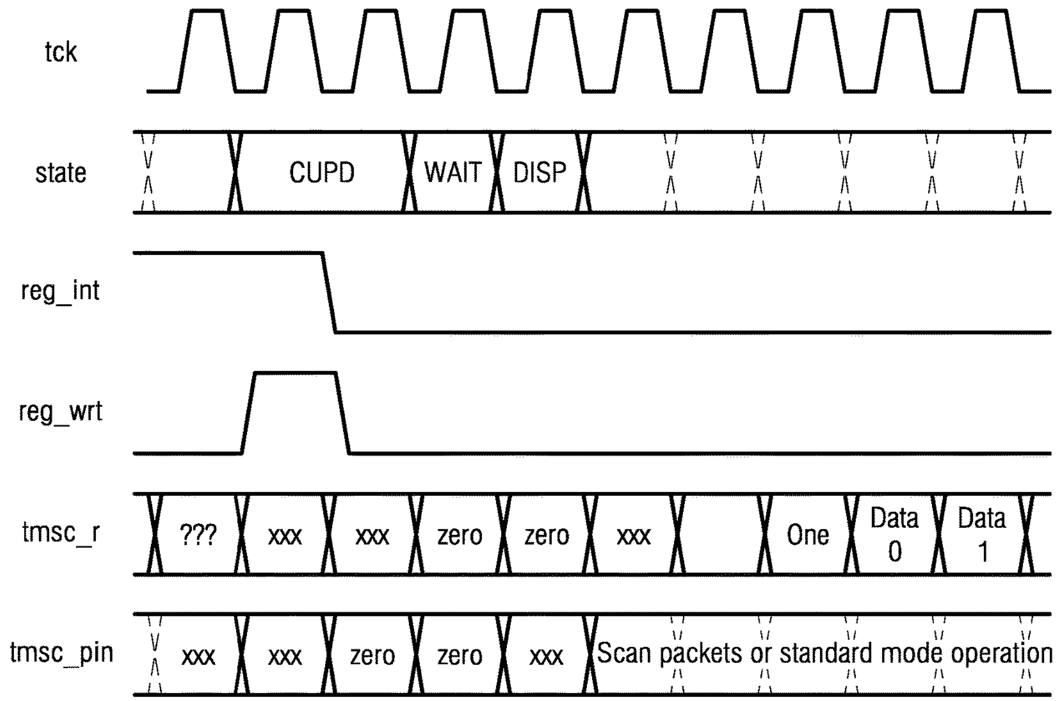
Figure 217:
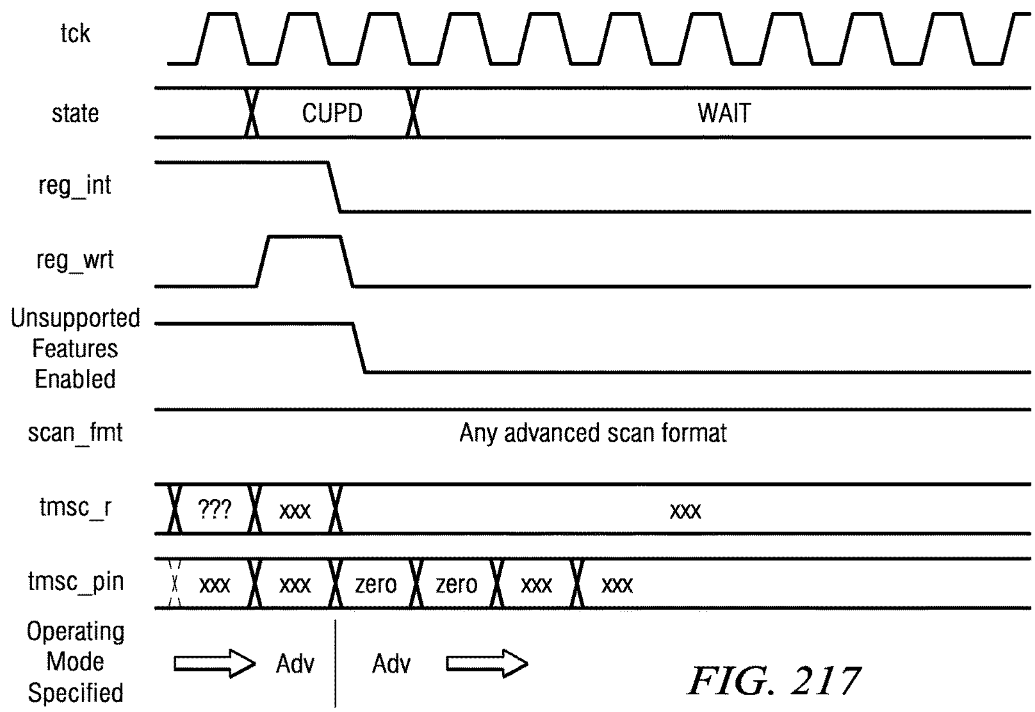
Figure 218:
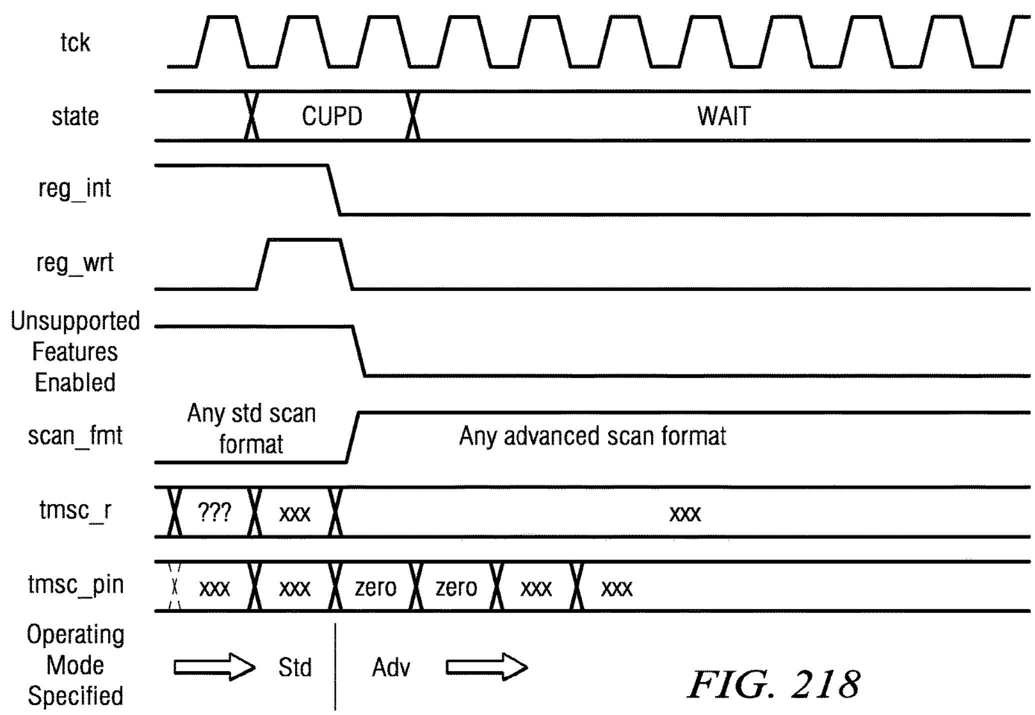
Figure 219:
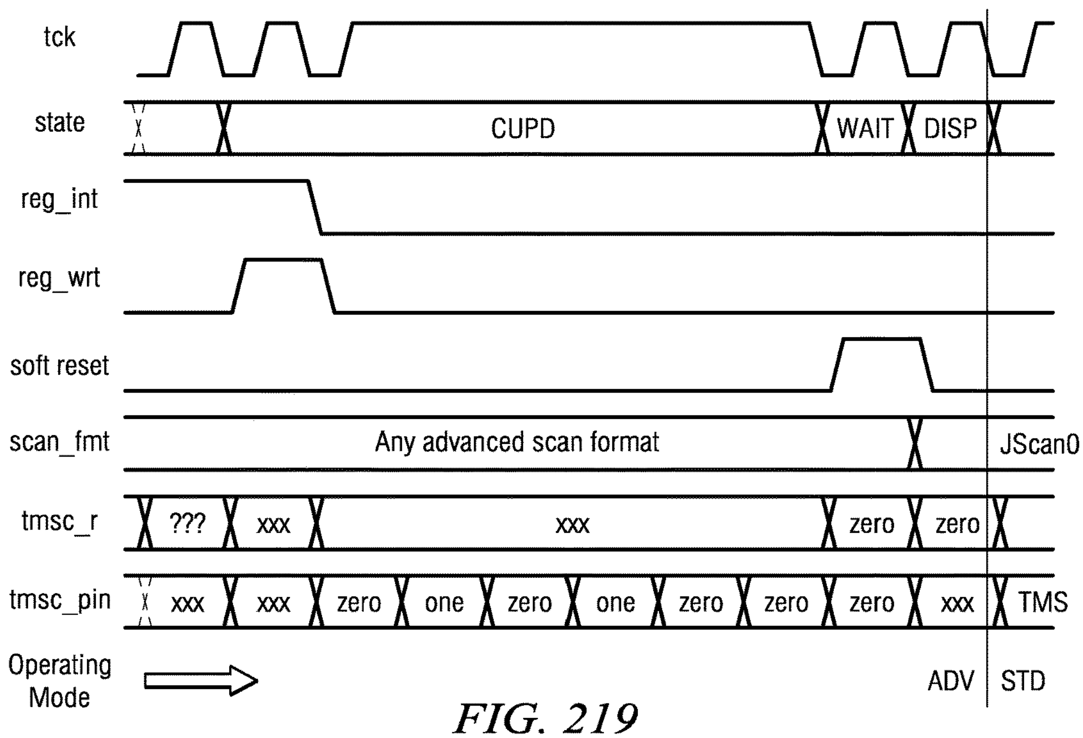
Figure 220:
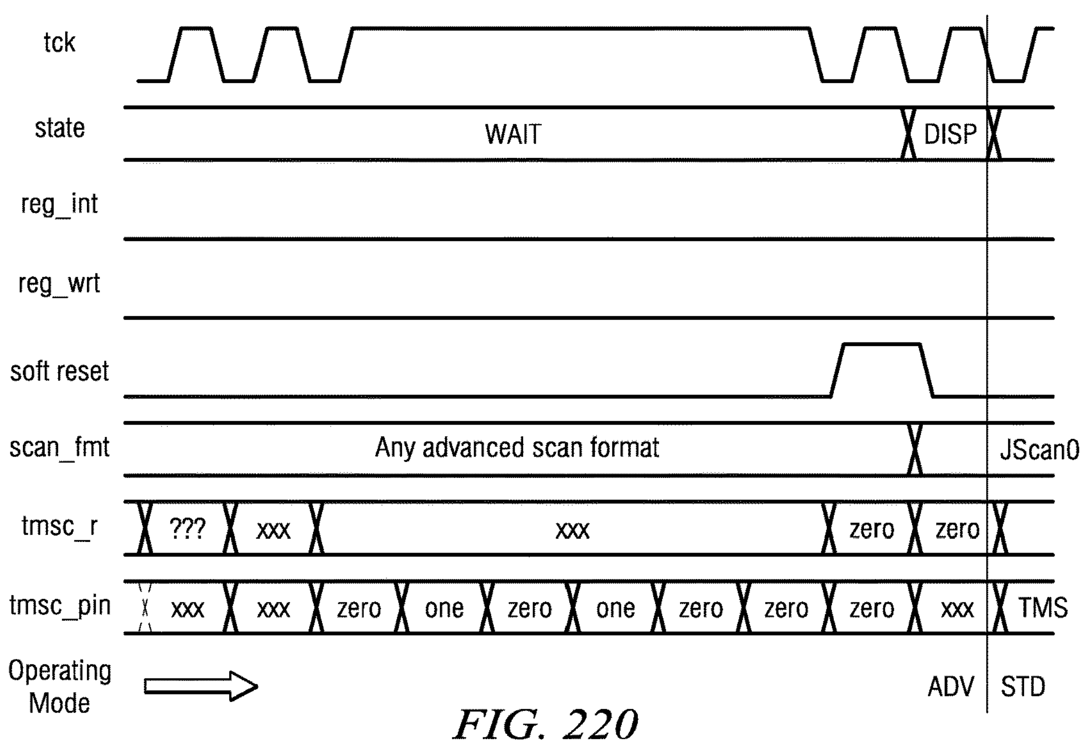
Figure 221:
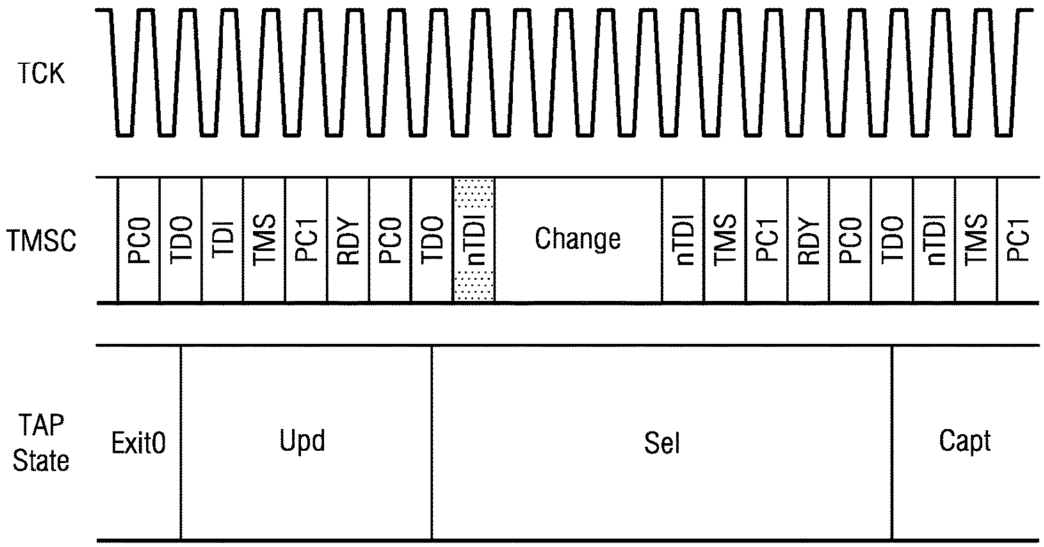
Figure 222:
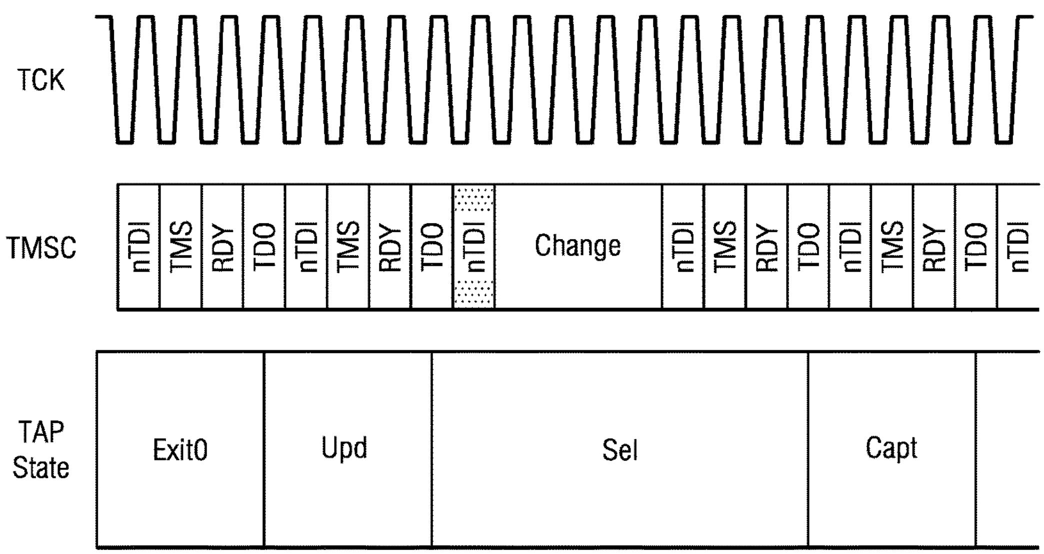
Figure 223:
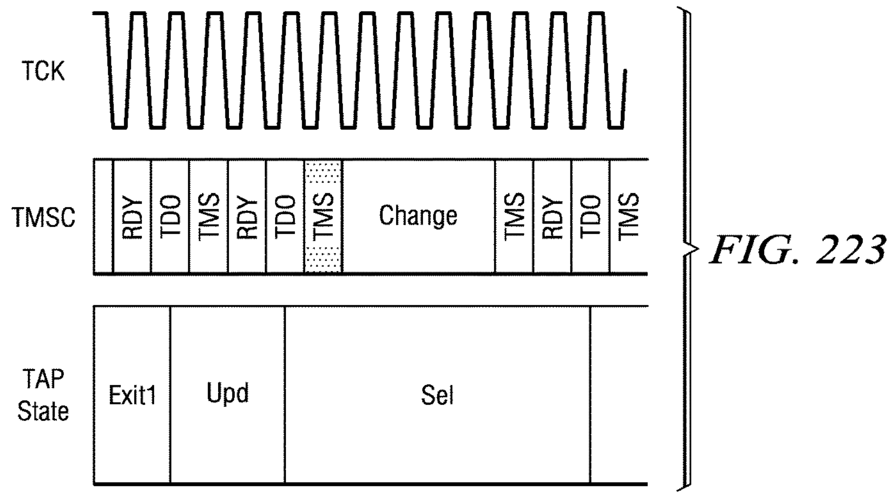
Figure 224:
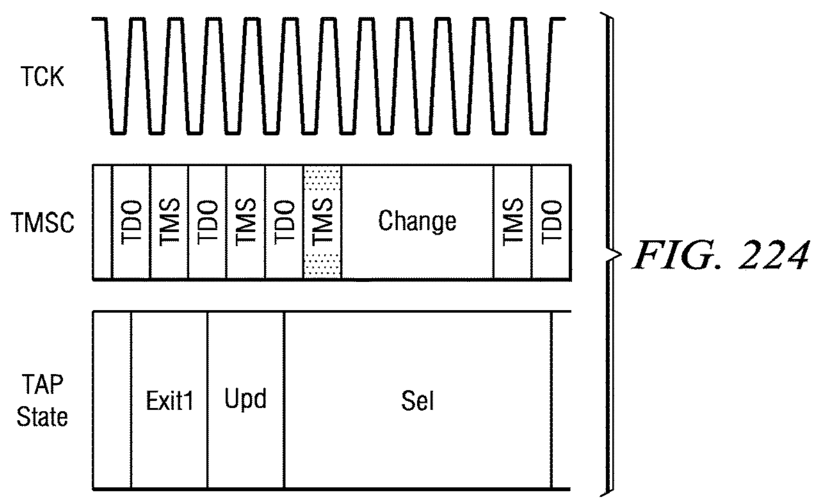
Figure 225:
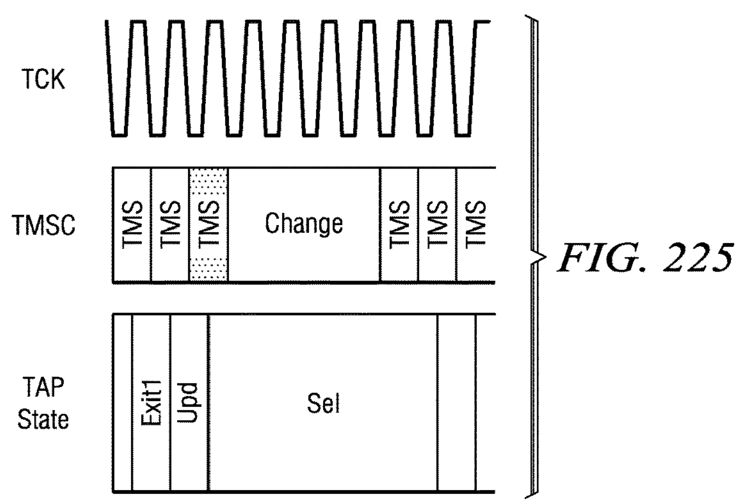
Figure 226:
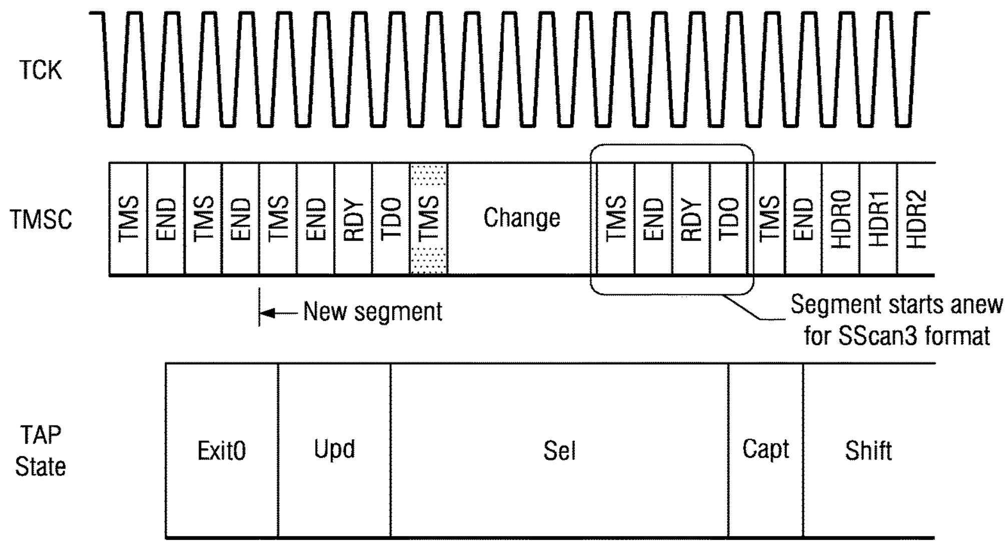
Figure 227:
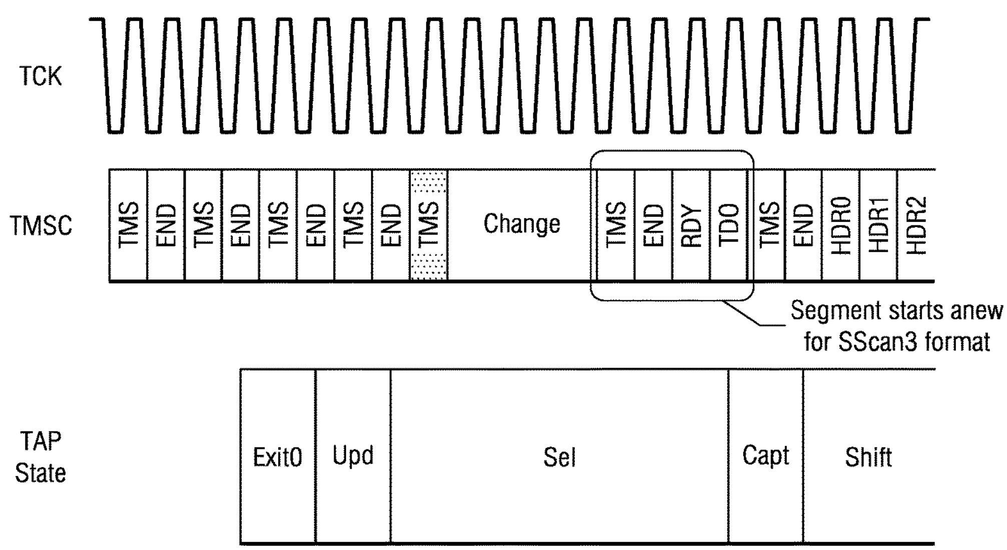
Figure 228:
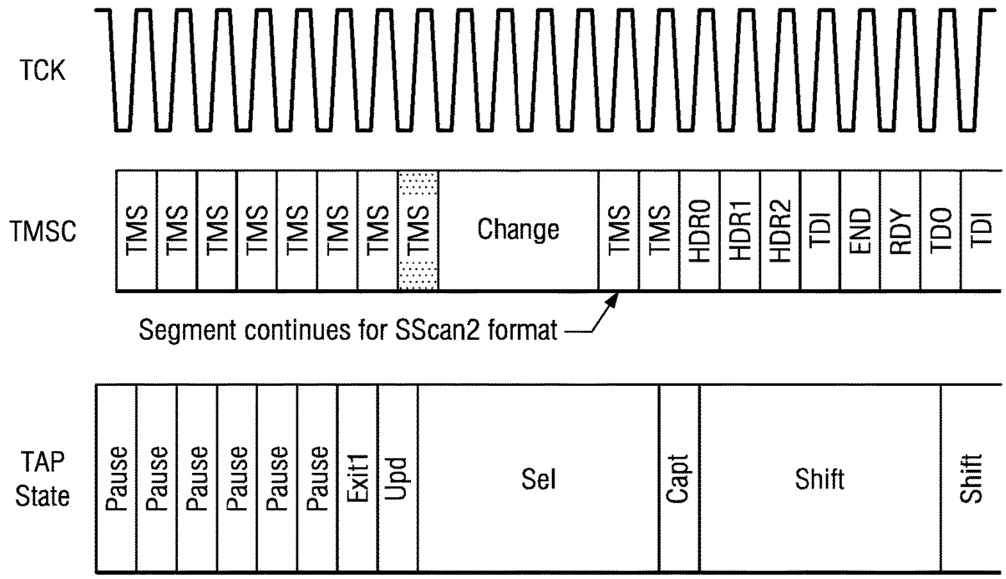
Figure 229:
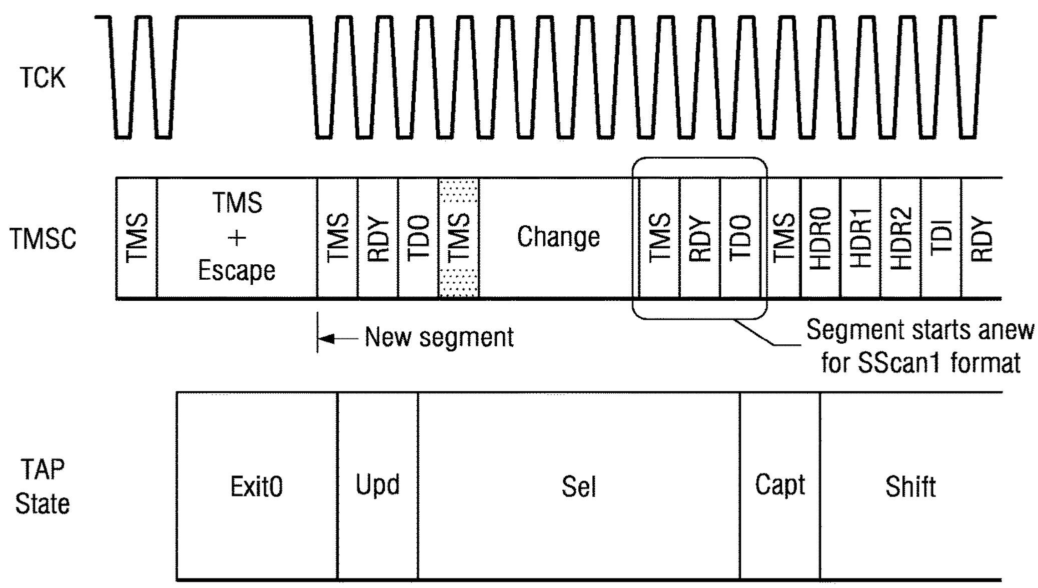
Figure 230:
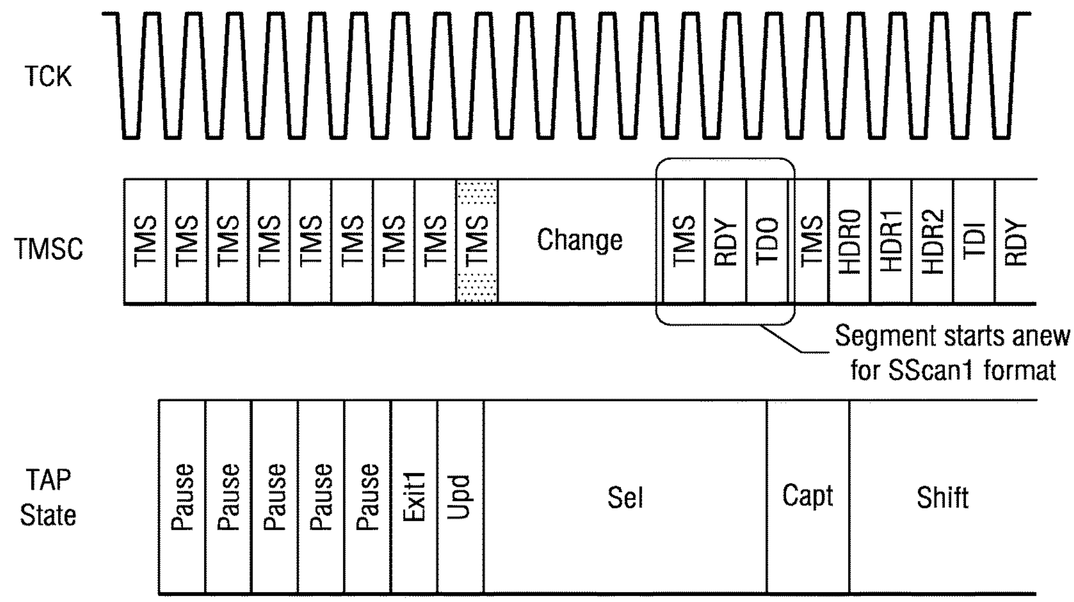
Figure 231:
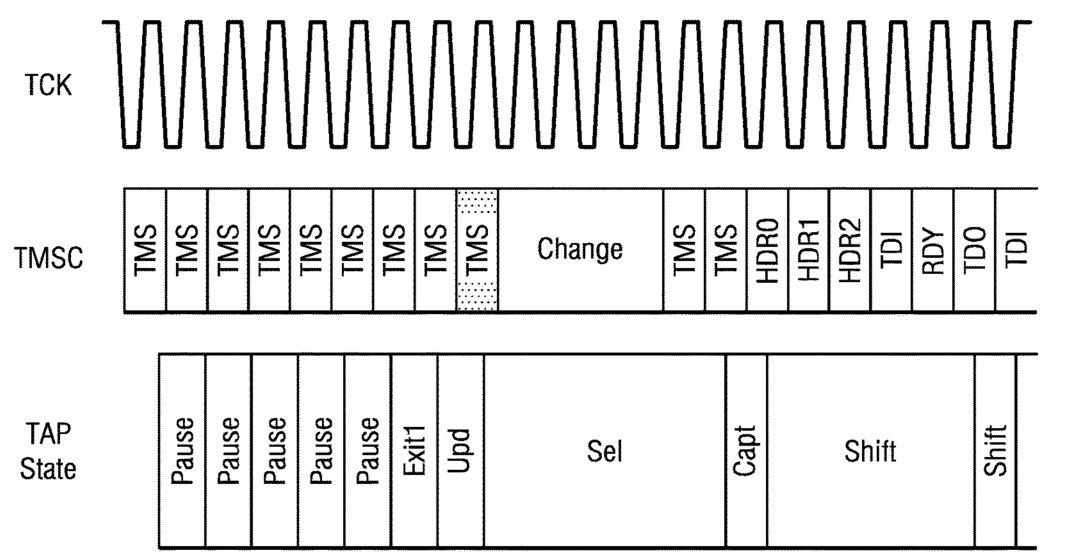
Figure 232:
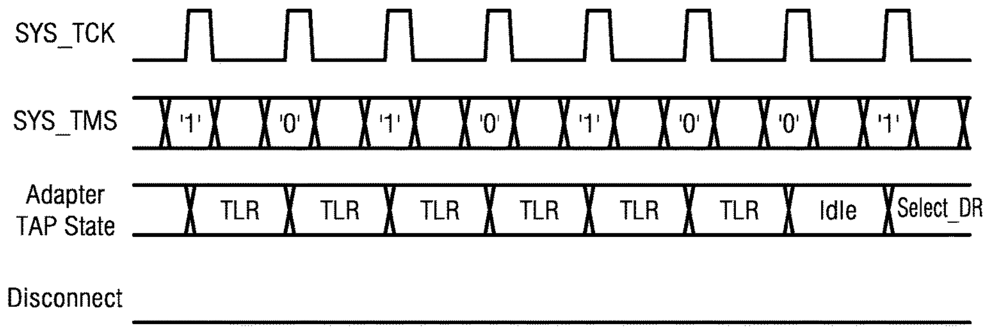
Figure 233:
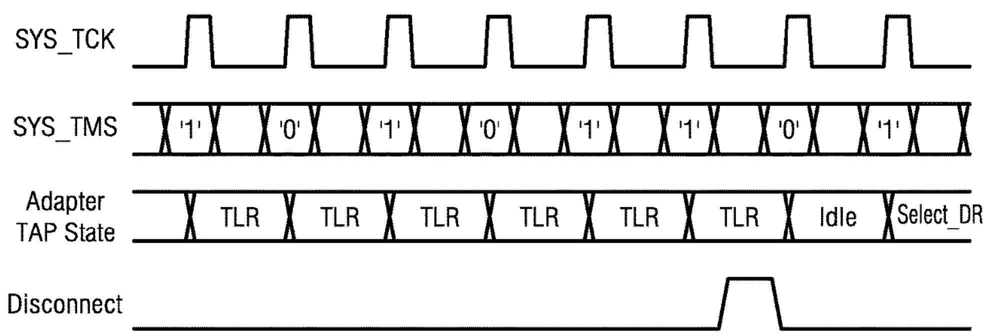
Figure 234:
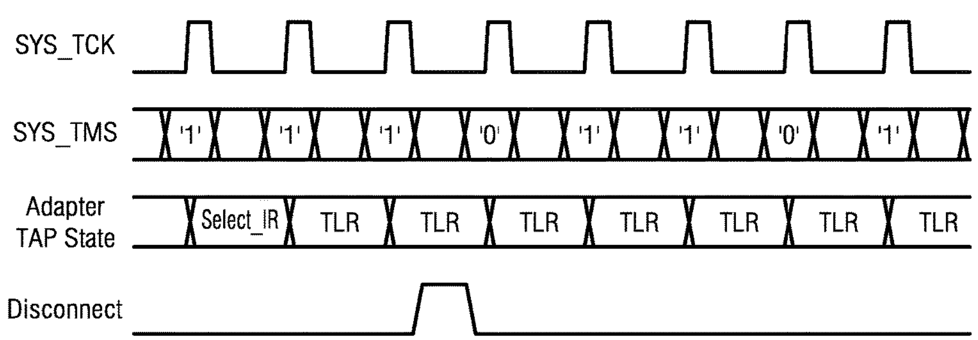
Figure 238:
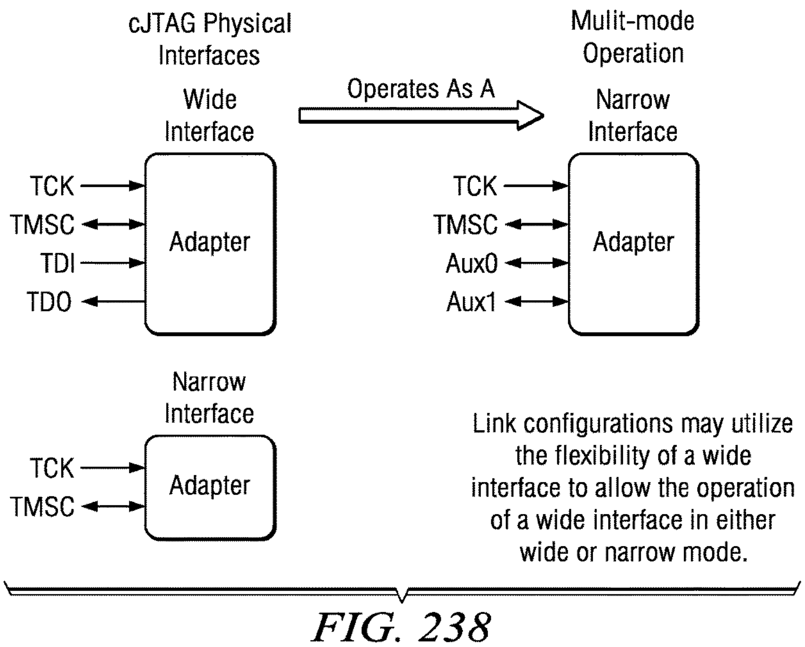
Figure 239:
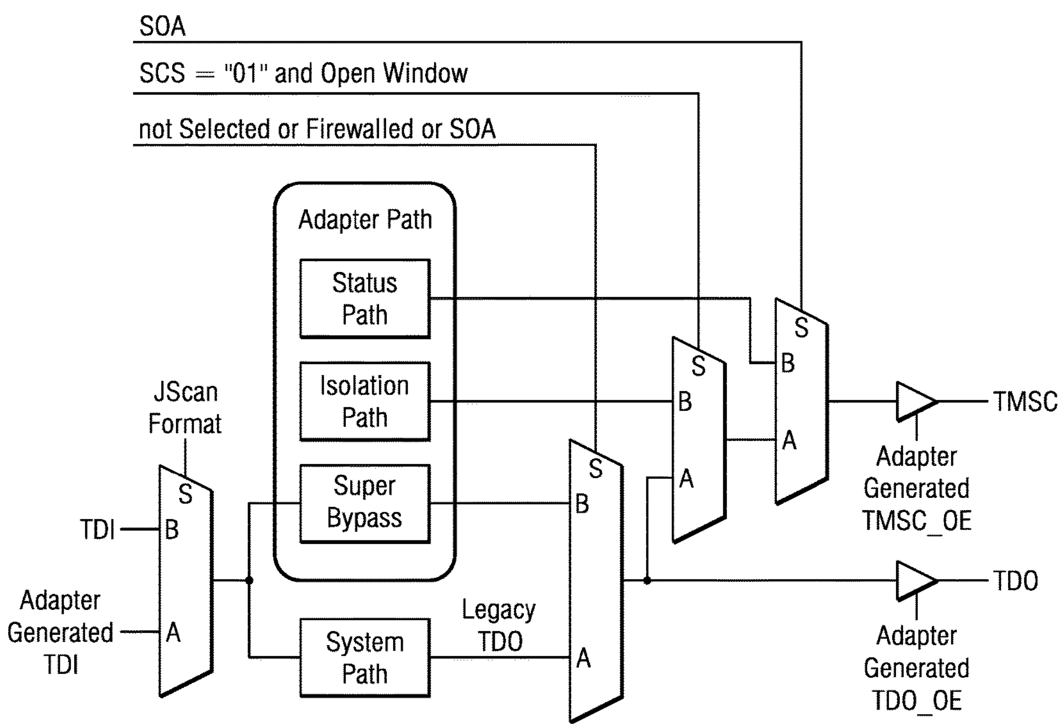
Figure 240:
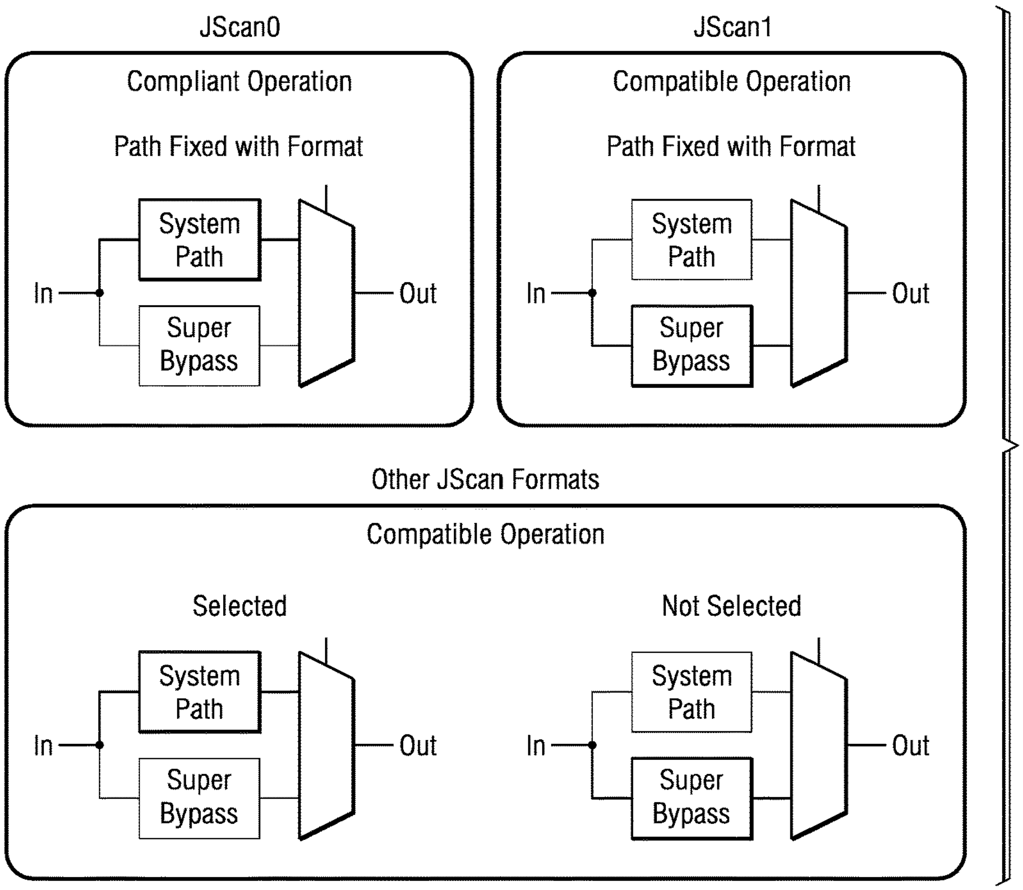
Figure 241:
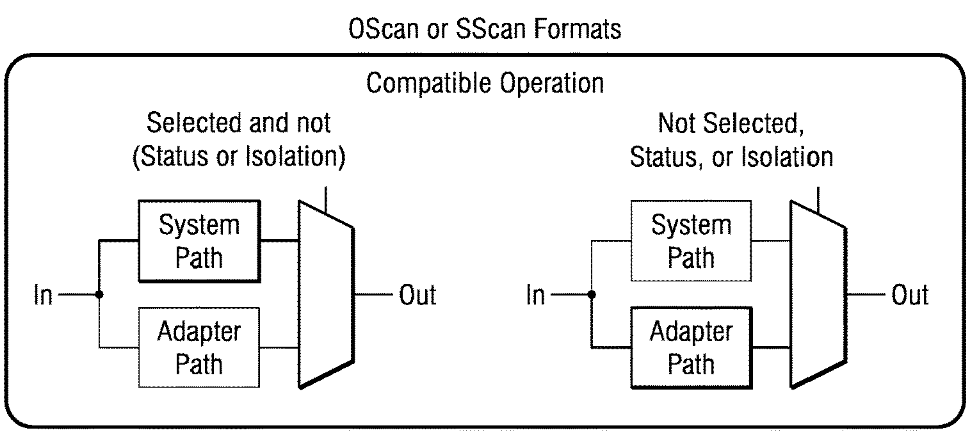
Figure 242:
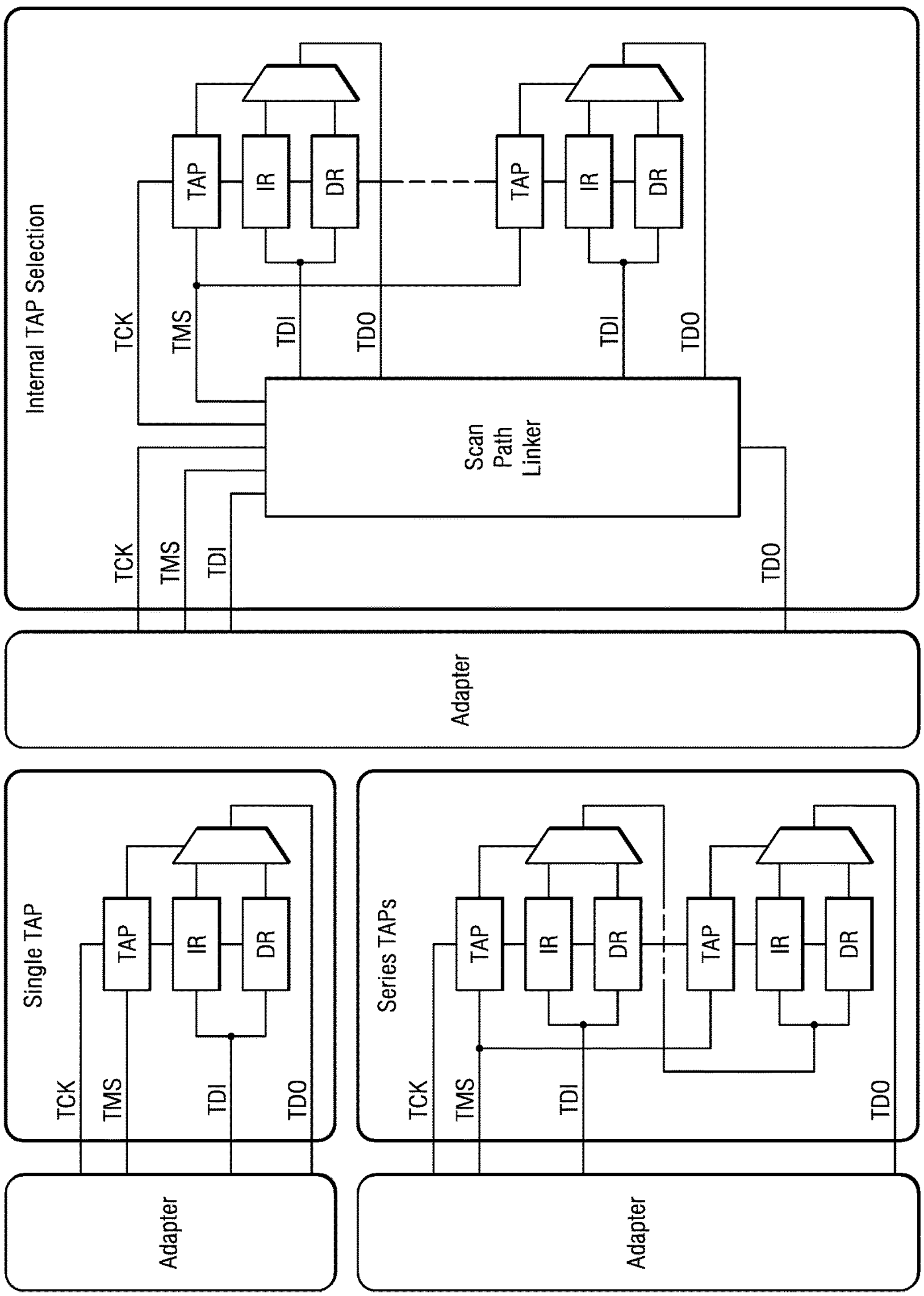
Figure 243:
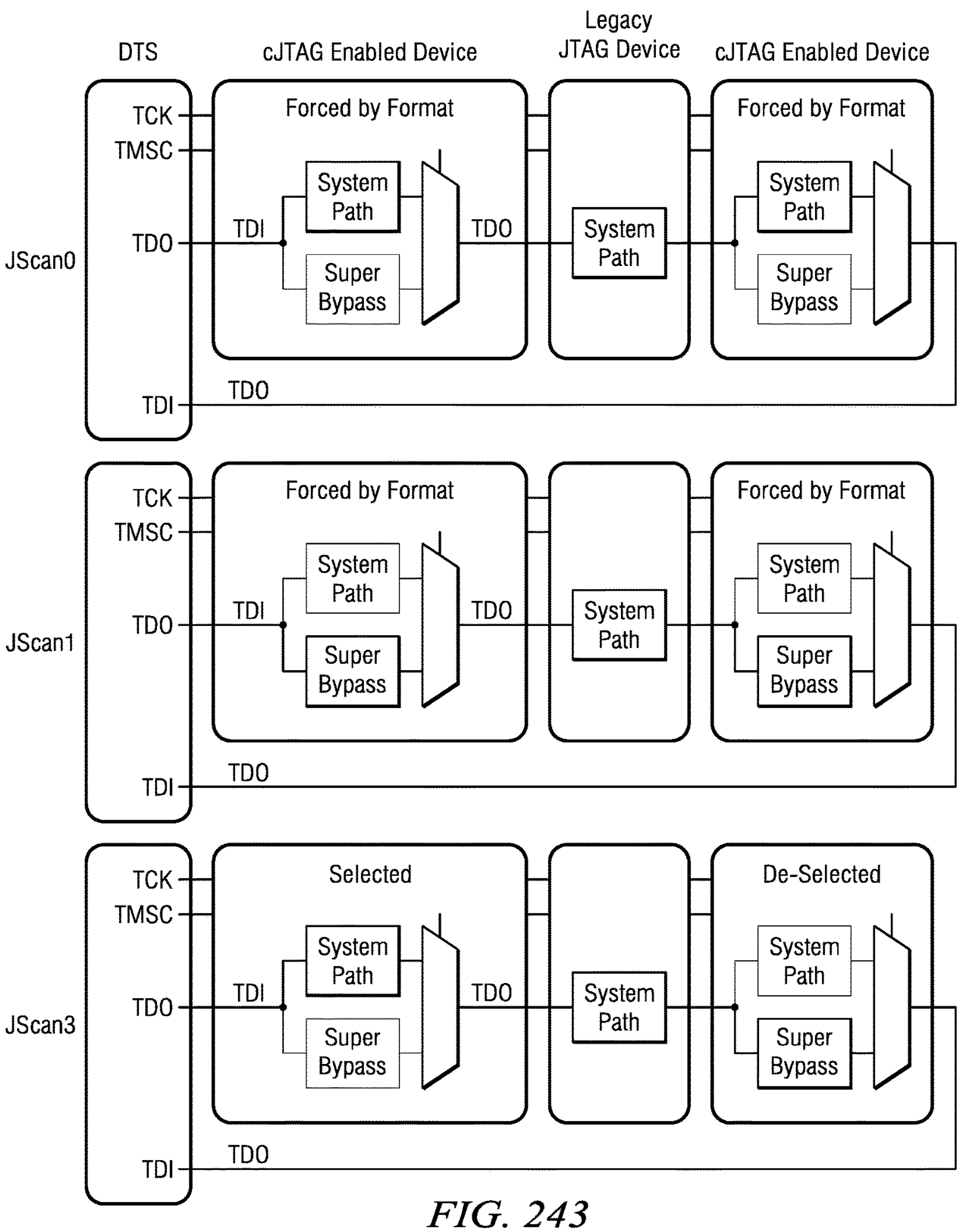
Figure 244:
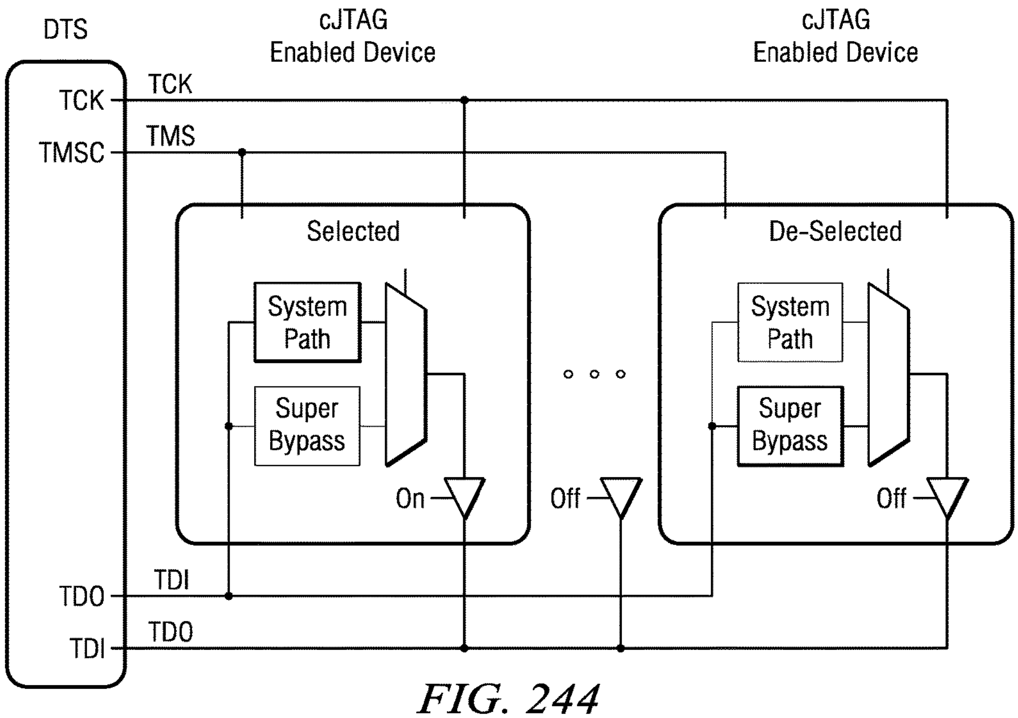
Figure 245:
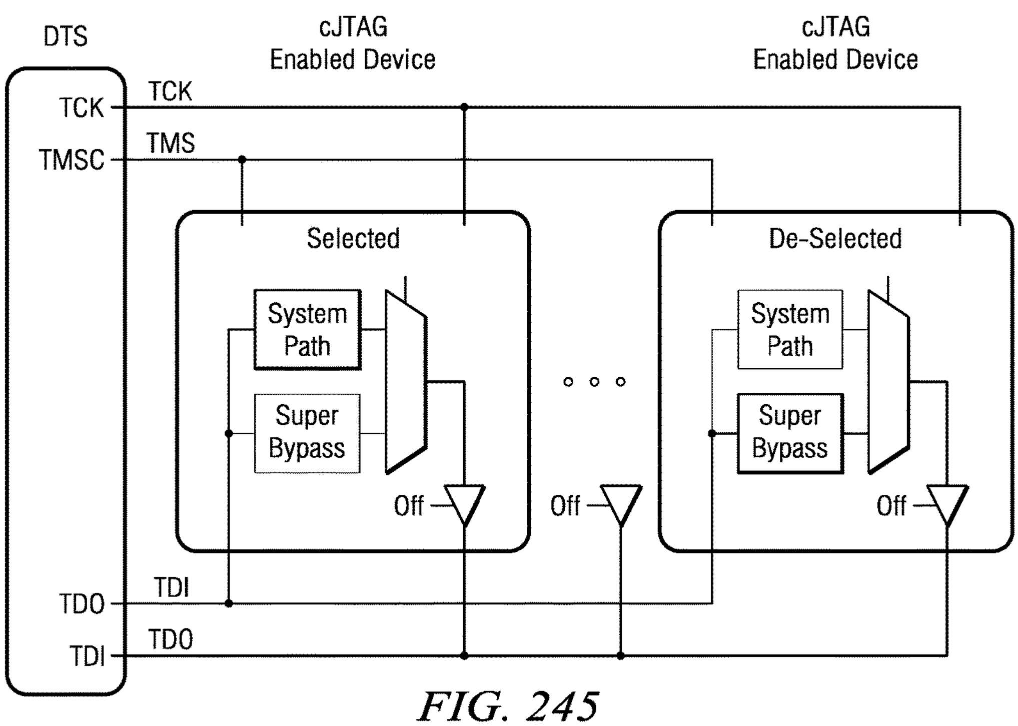

FIG. 208 is a block diagram of CDX Interface;

FIG. 209 is a diagram of Conceptual Adapter CDX Input Section;

FIG. 210 is a diagram of Conceptual Adapter CDX Output Section;

FIG. 211 is a timing diagram of Adapter CDX Output Timing;

FIG. 212 is a diagram of Register Writes and Interrupts;

FIG. 213 is a flowchart of Change Packet Operation;

FIG. 214 is a diagram of Change Packet Template;

FIG. 215 is a timing diagram of Minimum Length Change Packet;

FIG. 216 is a table of Switch Packet Initiation;

FIG. 217 is a timing diagram of Adapter Goes Offline in Advanced Mode;

FIG. 218 is a timing diagram of Adapter Goes Offline in Standard to Advanced Mode Change;

FIG. 219 is a timing diagram of Soft Reset and an Online Adapter;

FIG. 220 is a timing diagram of Soft Reset and an Offline Adapter;

FIG. 221 is a timing diagram of MScan Transaction with a Reg. Write Interrupt;

FIG. 222 is a timing diagram of Register-Write Interrupt with OScan7 Transactions;

FIG. 223 is a timing diagram of Register-Write Interrupt with OScan3 Transactions;

FIG. 224 is a timing diagram of Register-Write Interrupt with OScan6 or OScan2 Transaction;

FIG. 225 is a timing diagram of OScan5, OScan4, OScan1, OScan0 Transactions;

FIG. 226 is a timing diagram of Register-Write Interrupt with SScan3, New Segment;

FIG. 227 is a timing diagram of Register-Write Interrupt with SScan3, Mid Segment;

FIG. 228 is a timing diagram of Register-Write Interrupt with SScan2;

FIG. 229 is a timing diagram of Register-Write Interrupt with SScan1, New Segment;

FIG. 230 is a timing diagram of Register-Write Interrupt with SScan1, Mid Segment;

FIG. 231 is a timing diagram of Register-Write Interrupt with SScan0;

FIG. 232 is a timing diagram of TLR Followed By IDLE, No Disconnect, OScan6;

FIG. 233 is a timing diagram of TLR Followed By Disconnect, OScan6;

FIG. 234 is a timing diagram of Immediate Disconnect, OScan6;

FIG. 235 is a diagram of Conceptual Reset Logic;

FIG. 236 is a table of Read Status Format;

FIG. 237 is a table of Port Connectivity;

FIG. 238 is a diagram of Adapter Flexibility;

FIG. 239 is a diagram of View of cJTAG Scan Paths;

FIG. 240 is a diagram of Scan Paths for JScan0, JScan1, and Other JScan Formats;

FIG. 241 is a diagram of Scan Paths for OScan or SScan Formats;

FIG. 242 is a diagram of System Scan Path Examples;

FIG. 243 is a diagram of Series Port Scan Paths;

FIG. 244 is a diagram of Wide-Star Port Scan Path, One Adapter Selected;

FIG. 245 is a diagram of Wide-Star Port Scan Path, More than One Adapter

Figure 246:
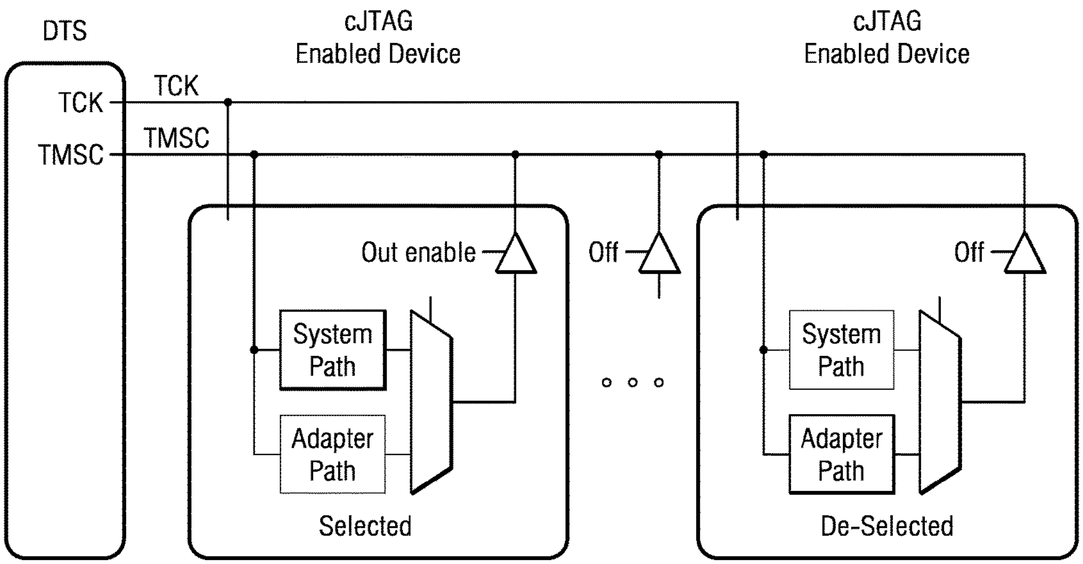
Figure 247:
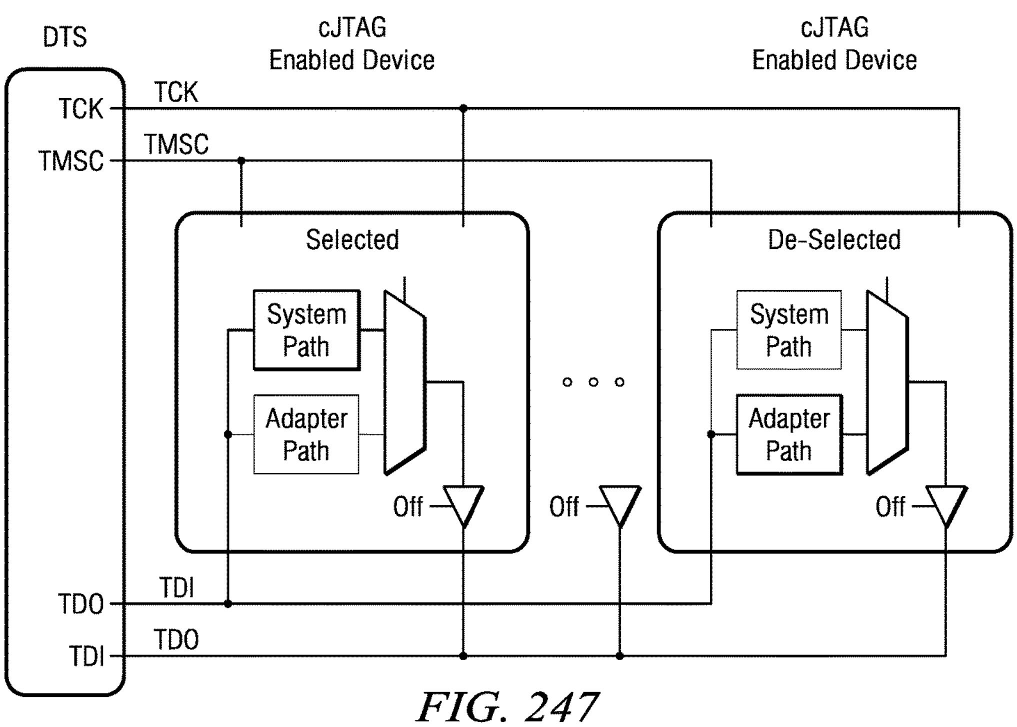
Figure 251:
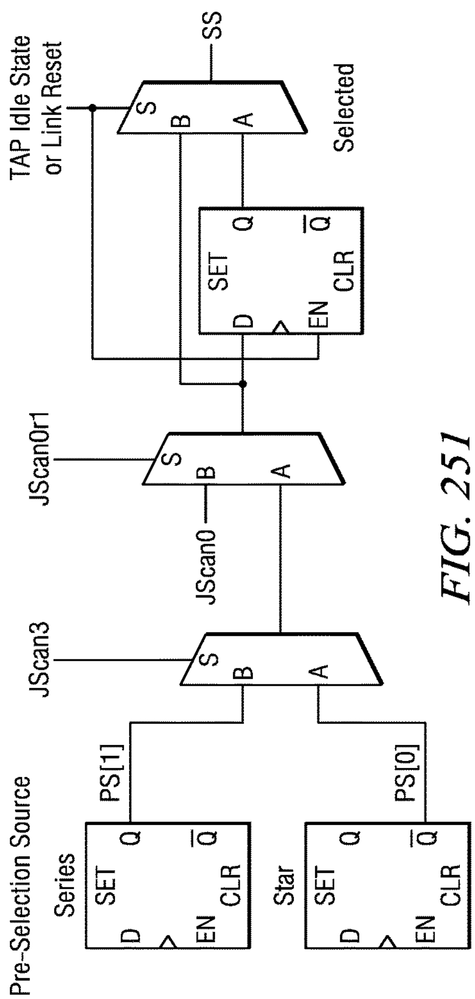
Figure 252:
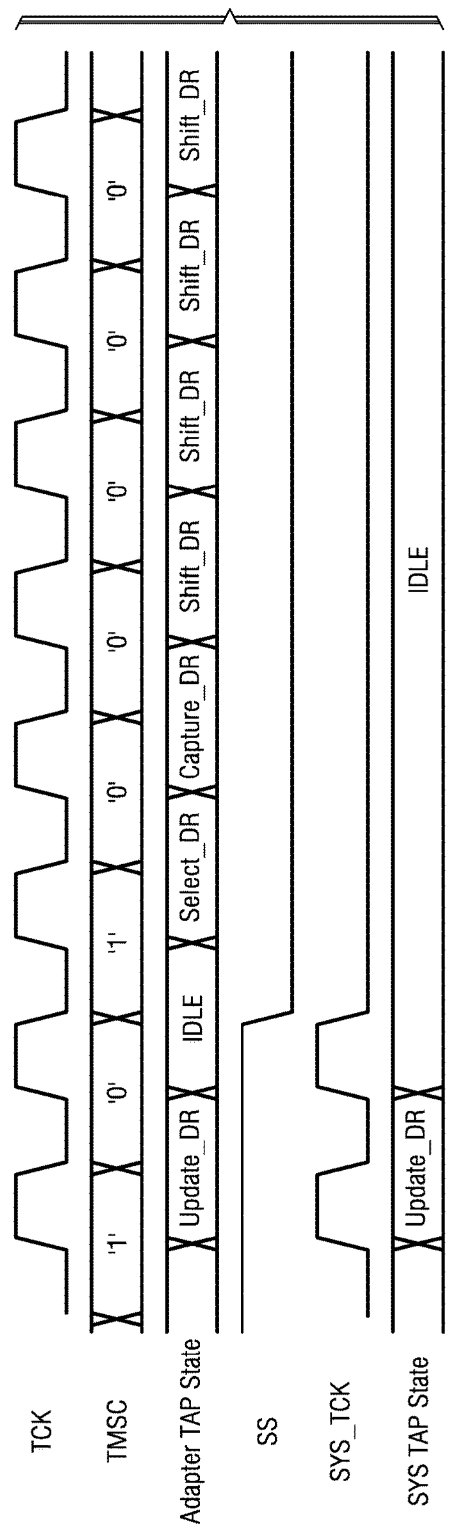
Figure 253:
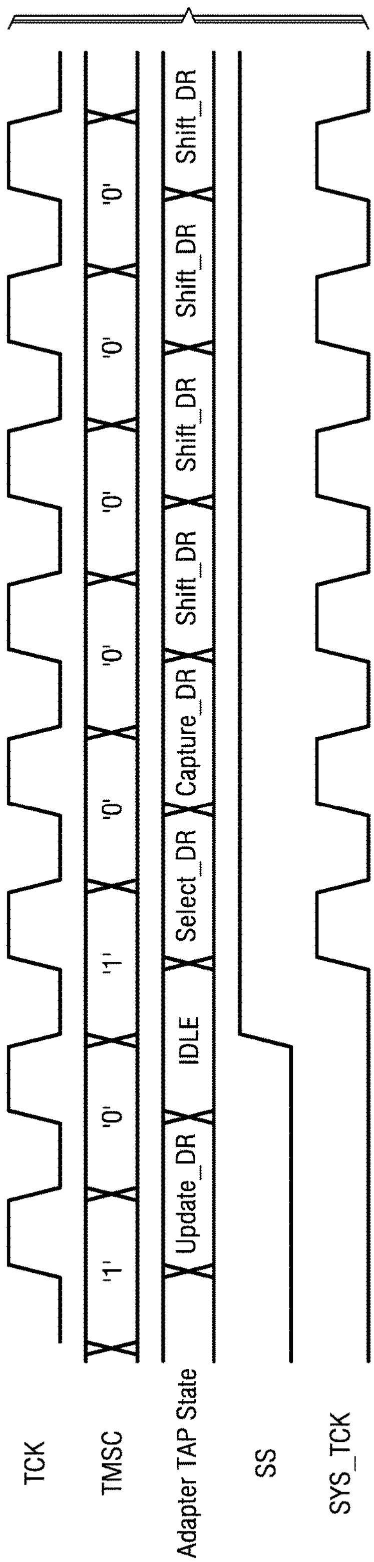
Figure 254:
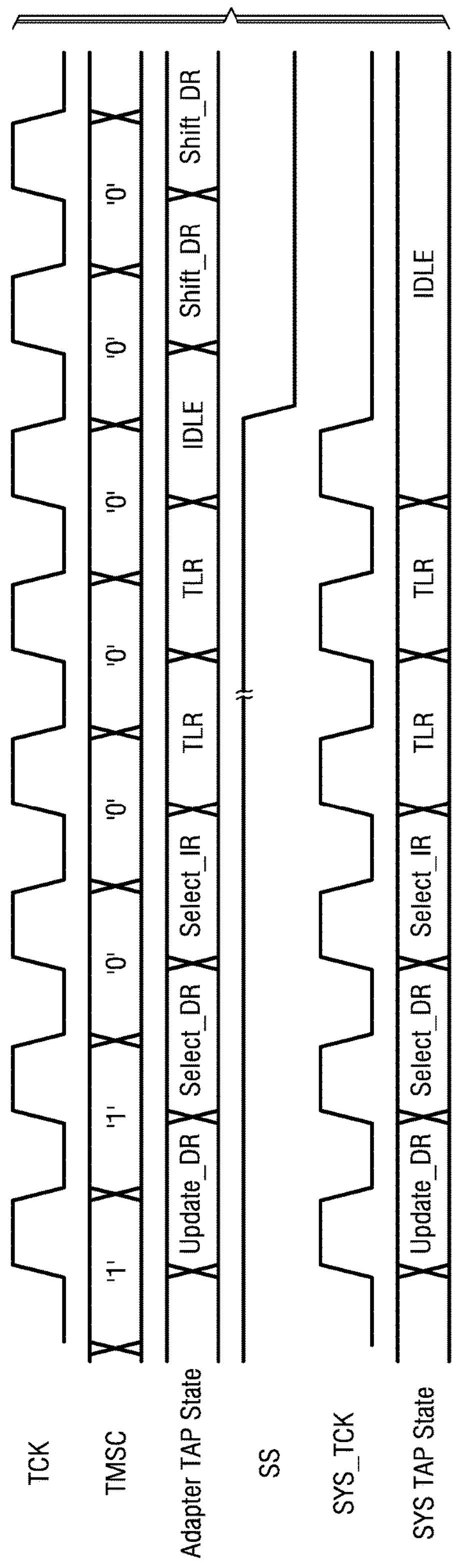
Figure 255:
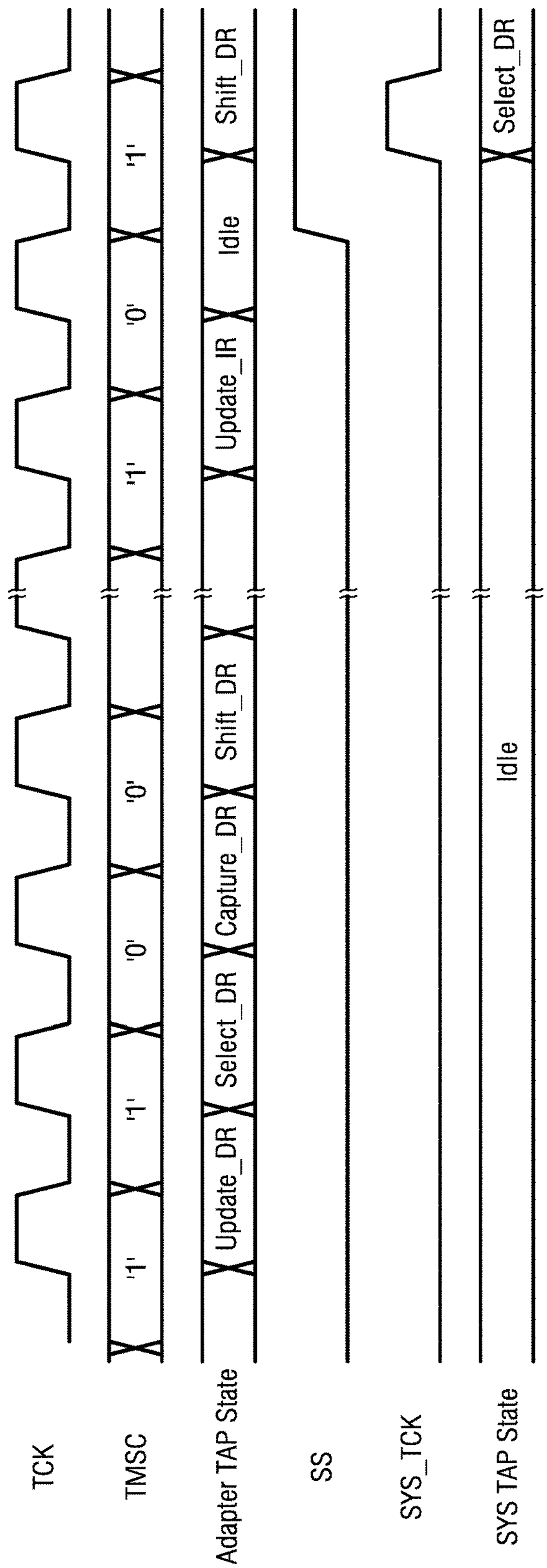
Figure 256:
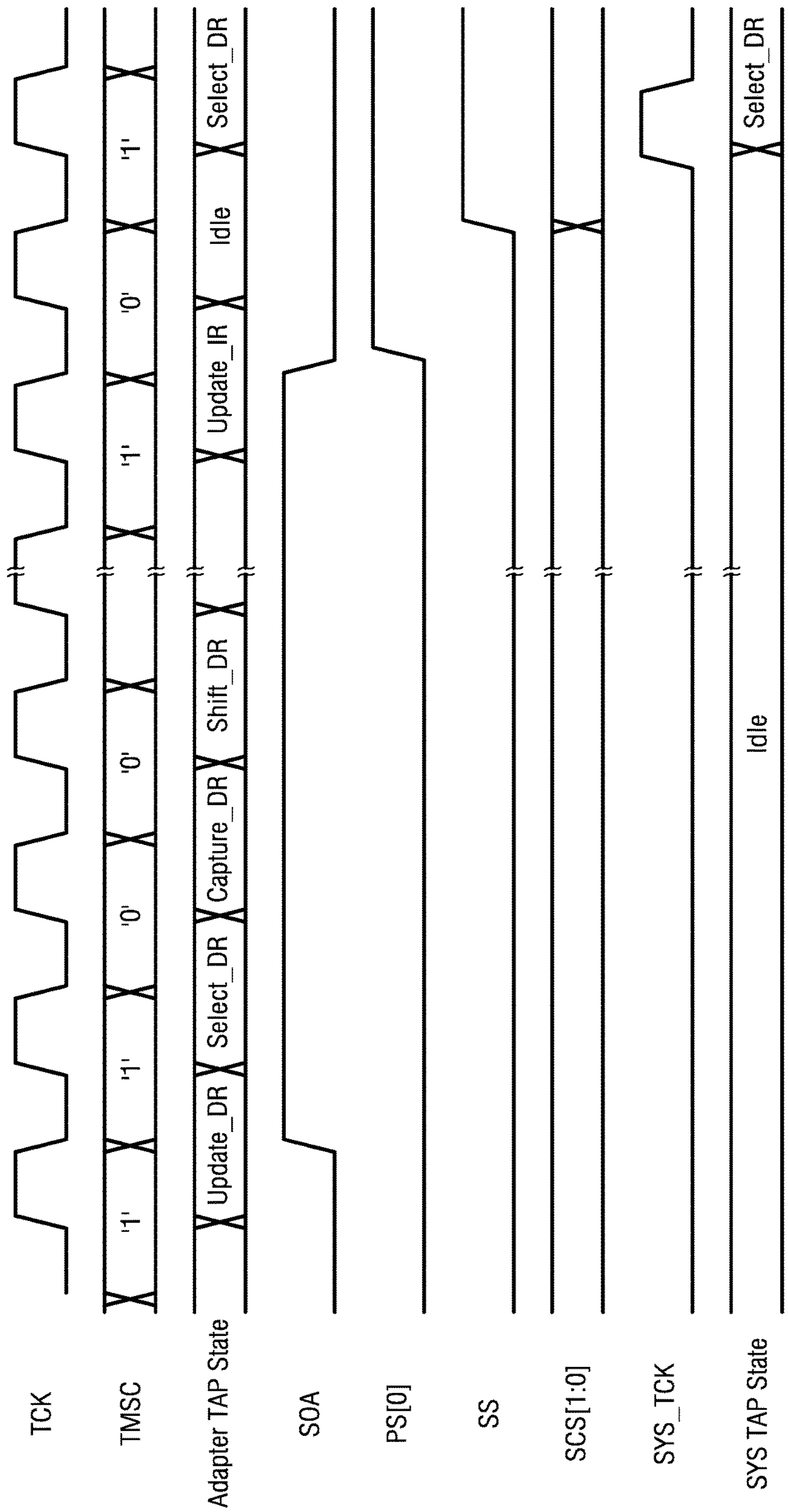
Figure 257:
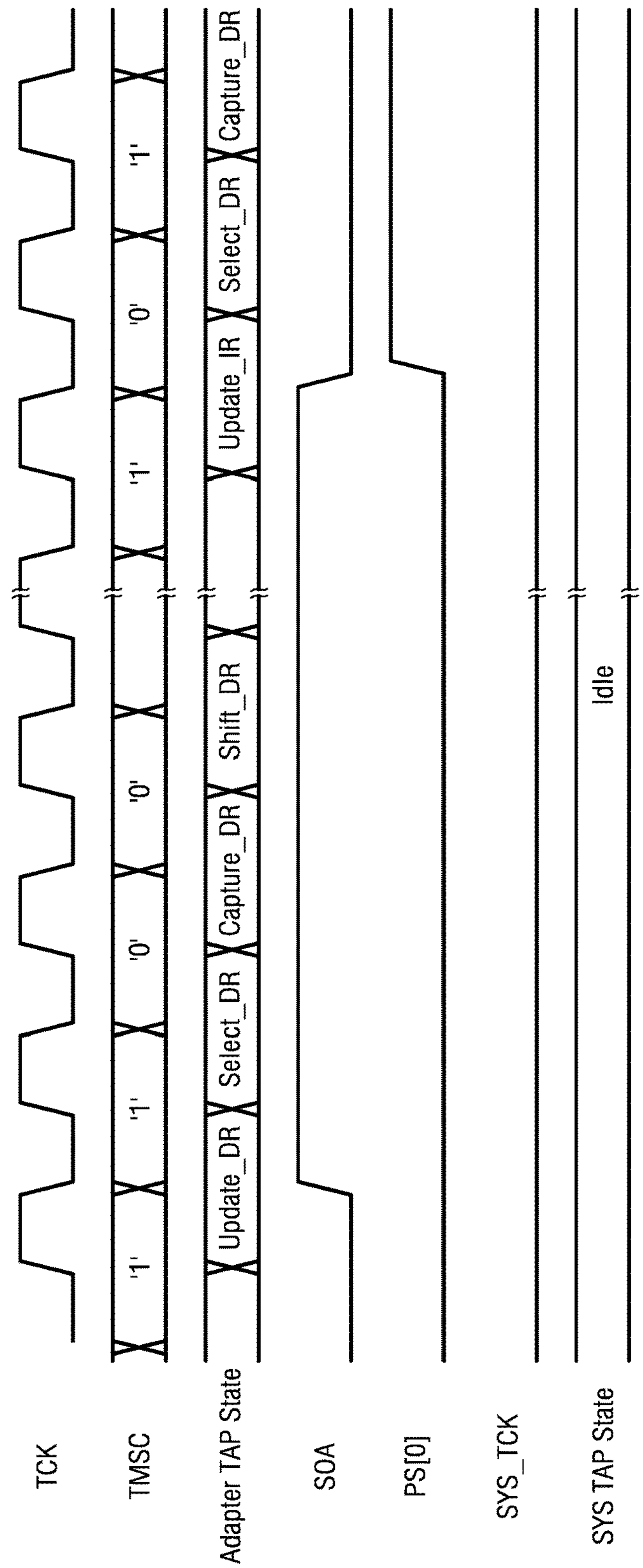
Figure 260:
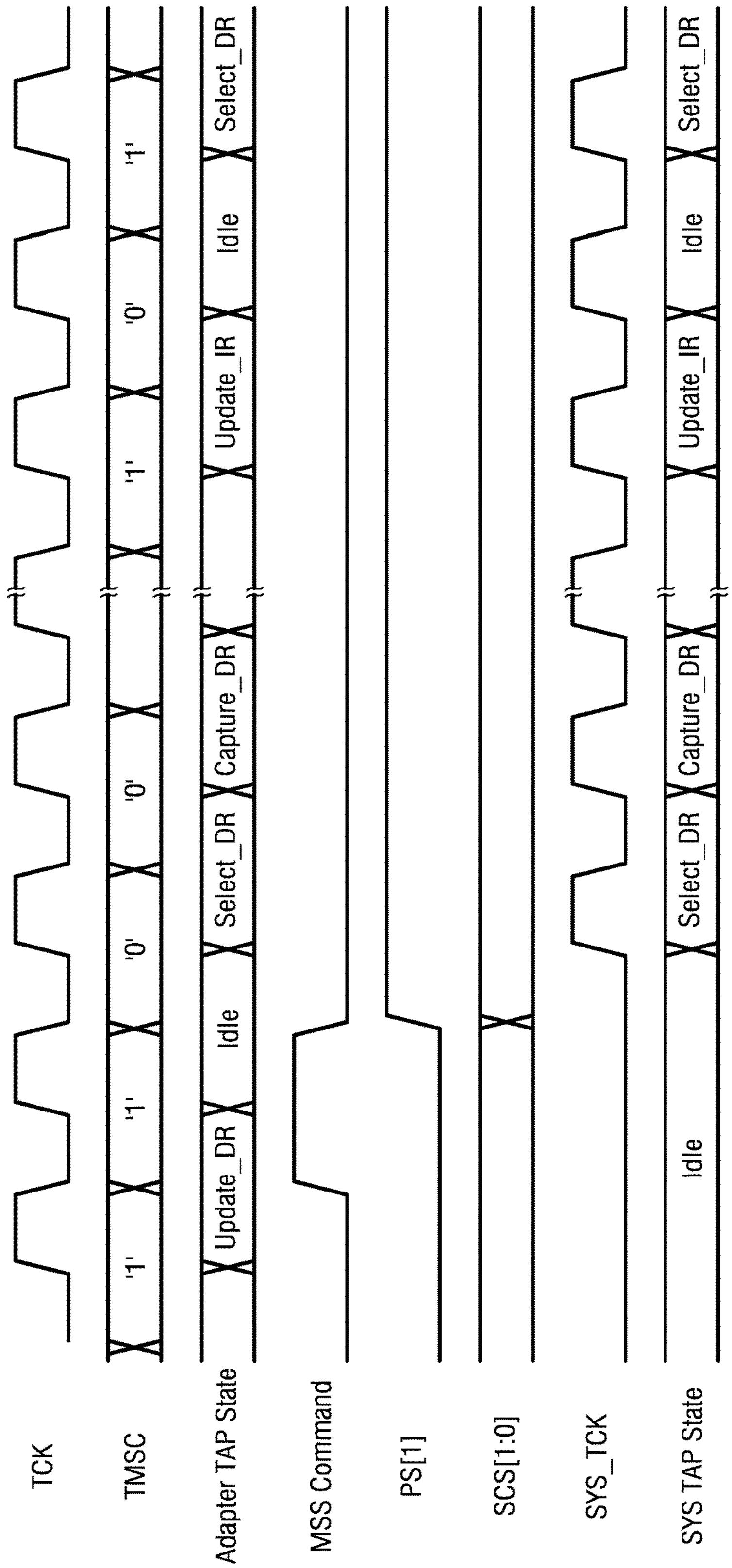
Figure 261:
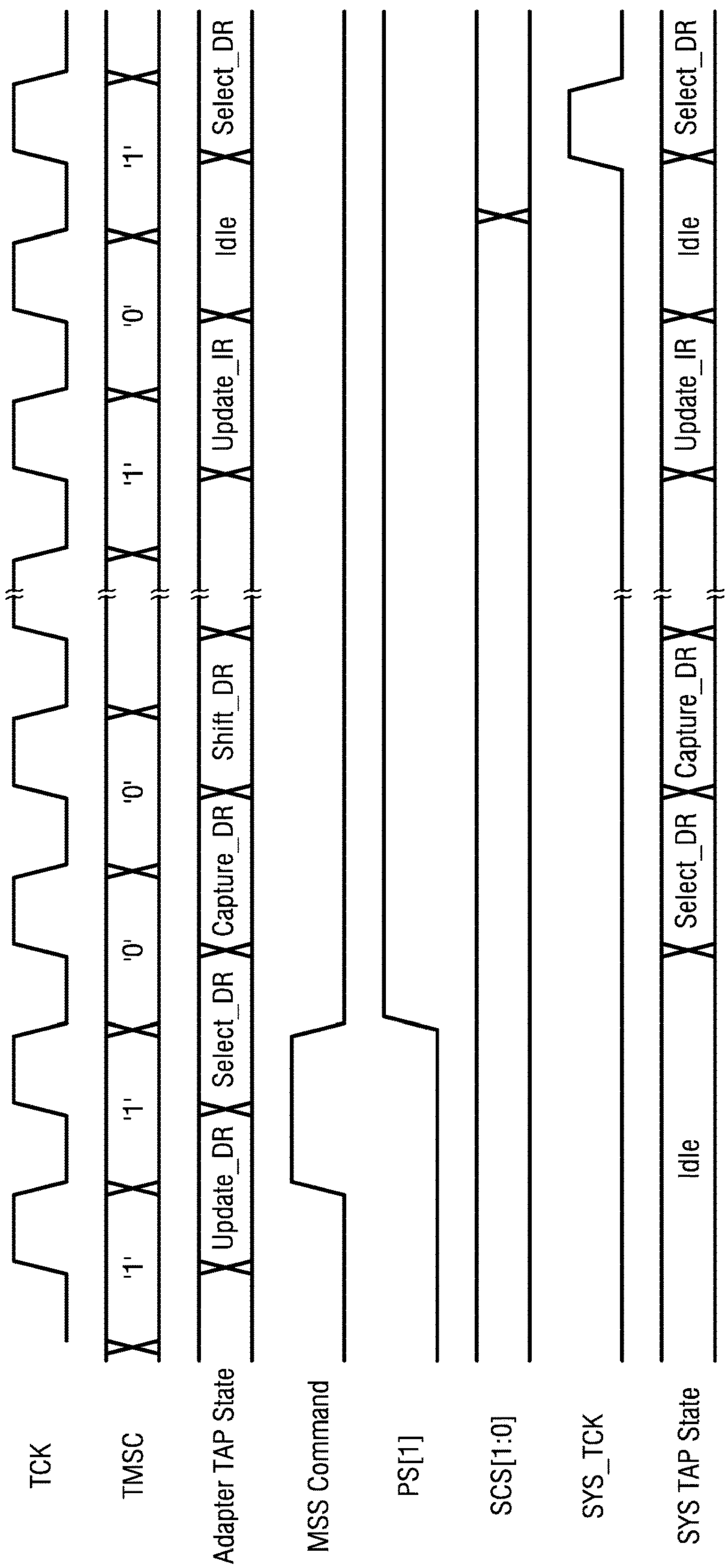
Figure 262:
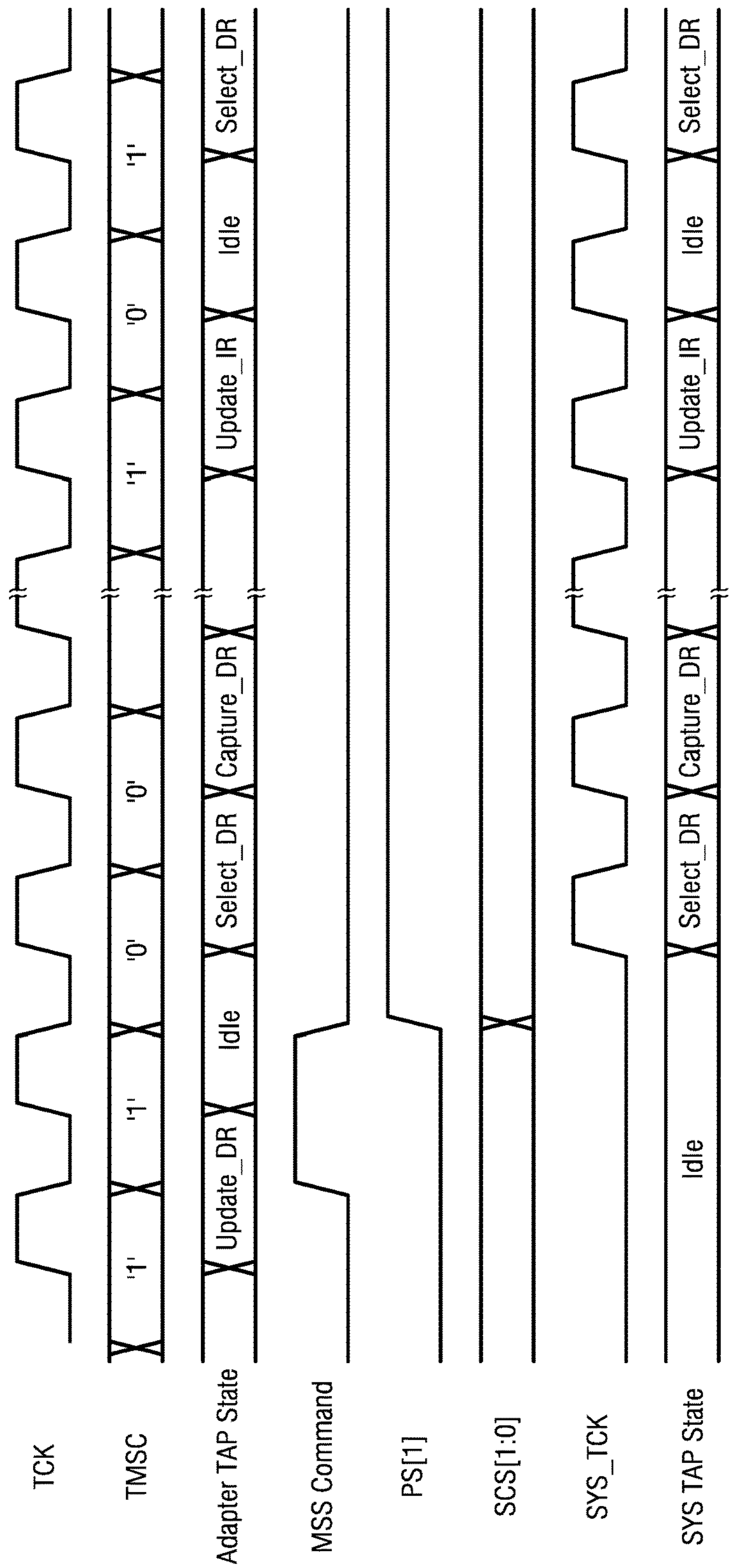
Figure 263:
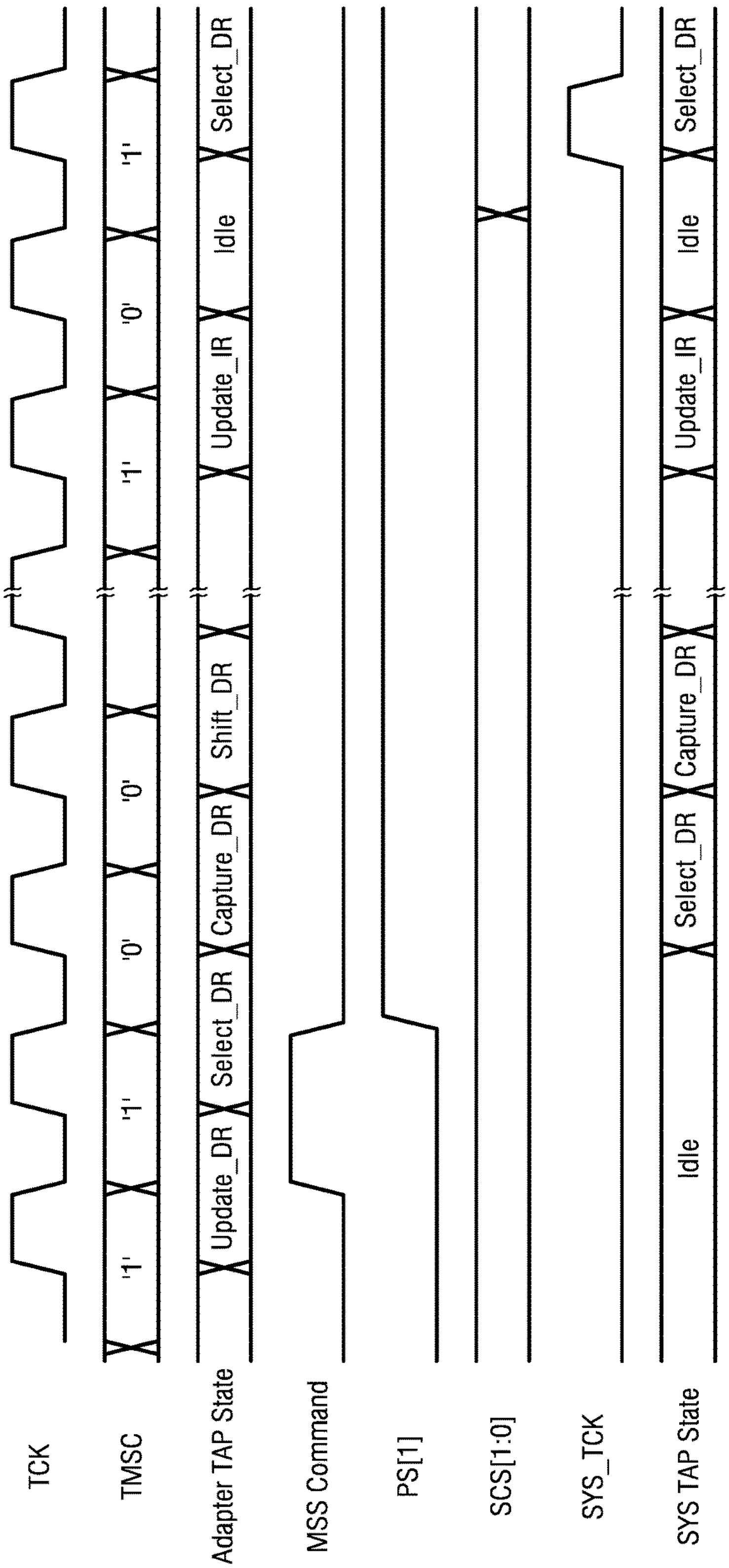
Figure 264:
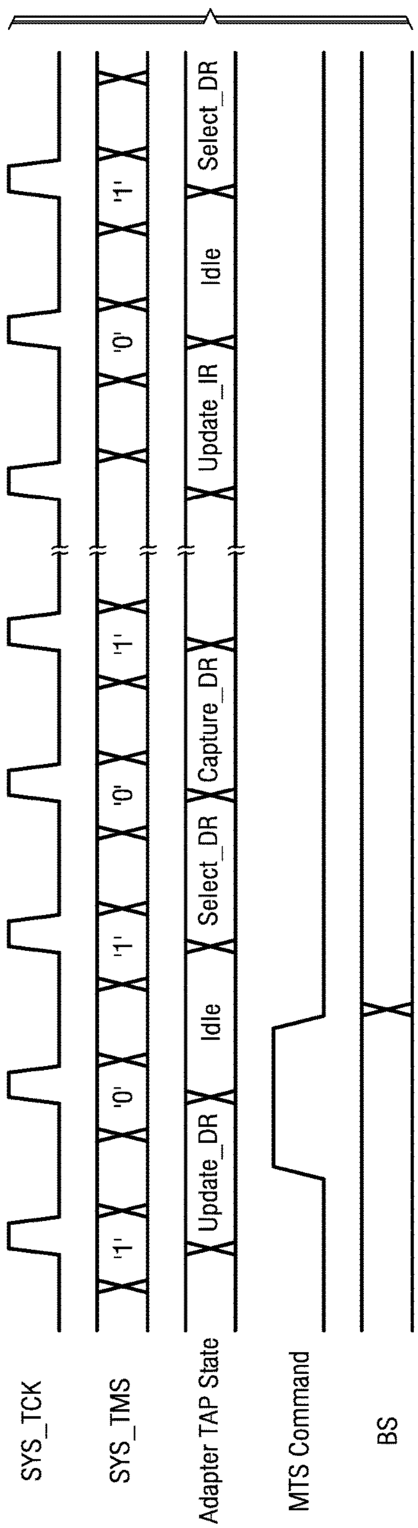
Figure 265:
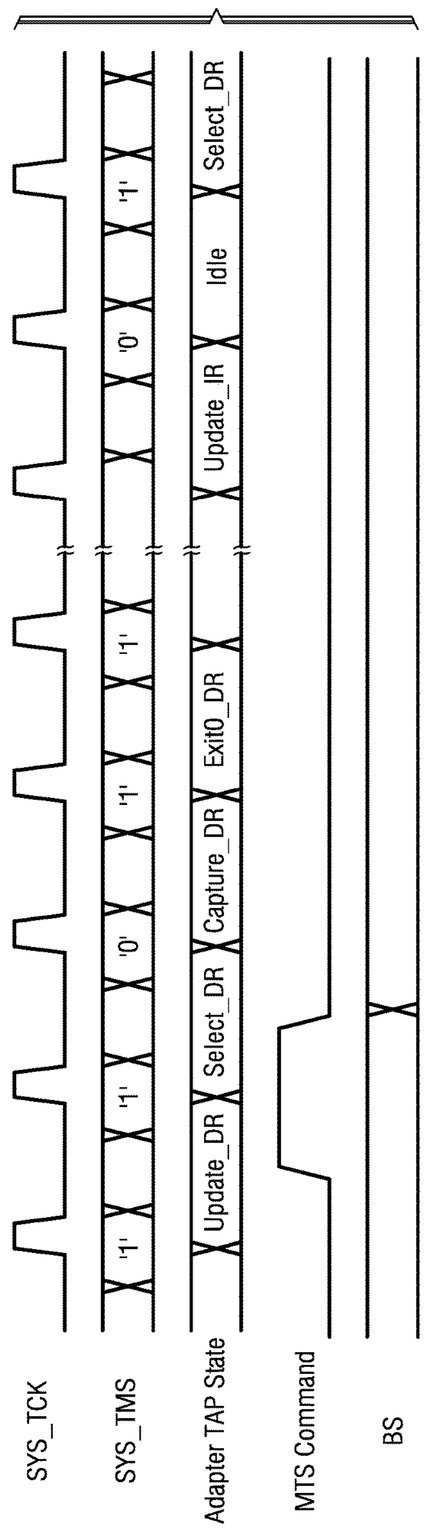
Figure 266:
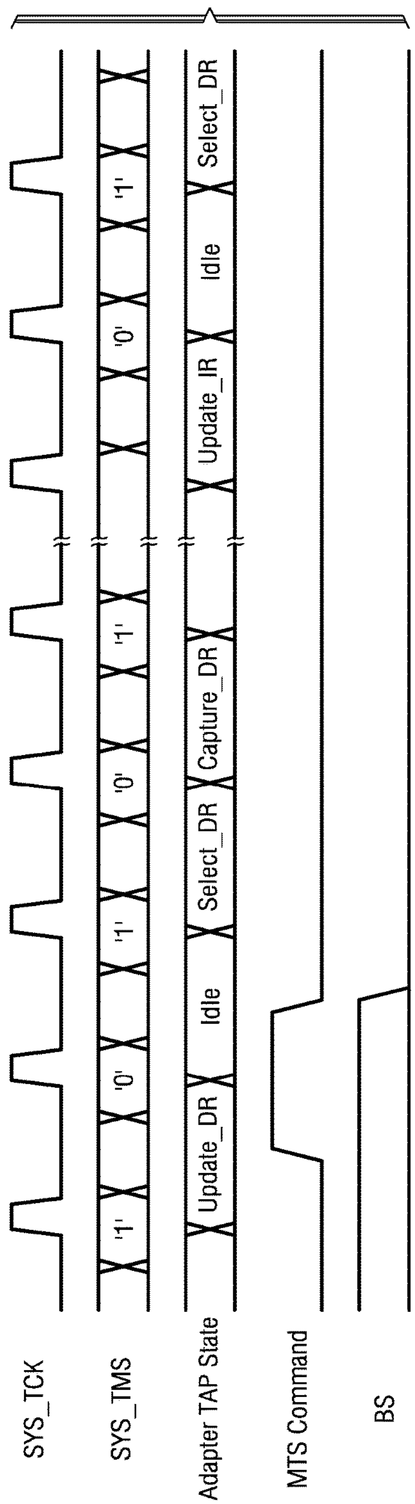
Figure 267:
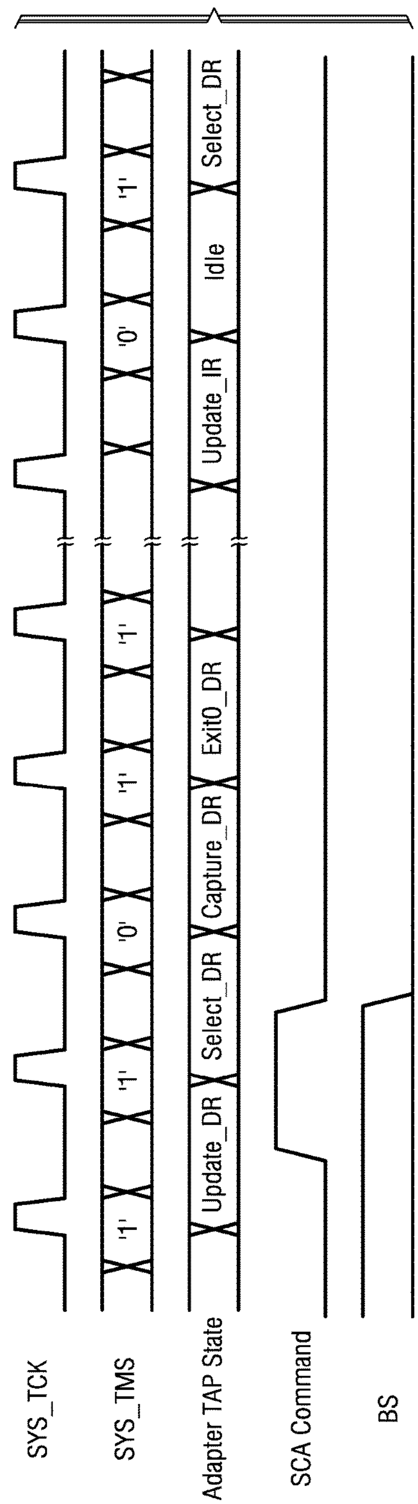
Figure 268:
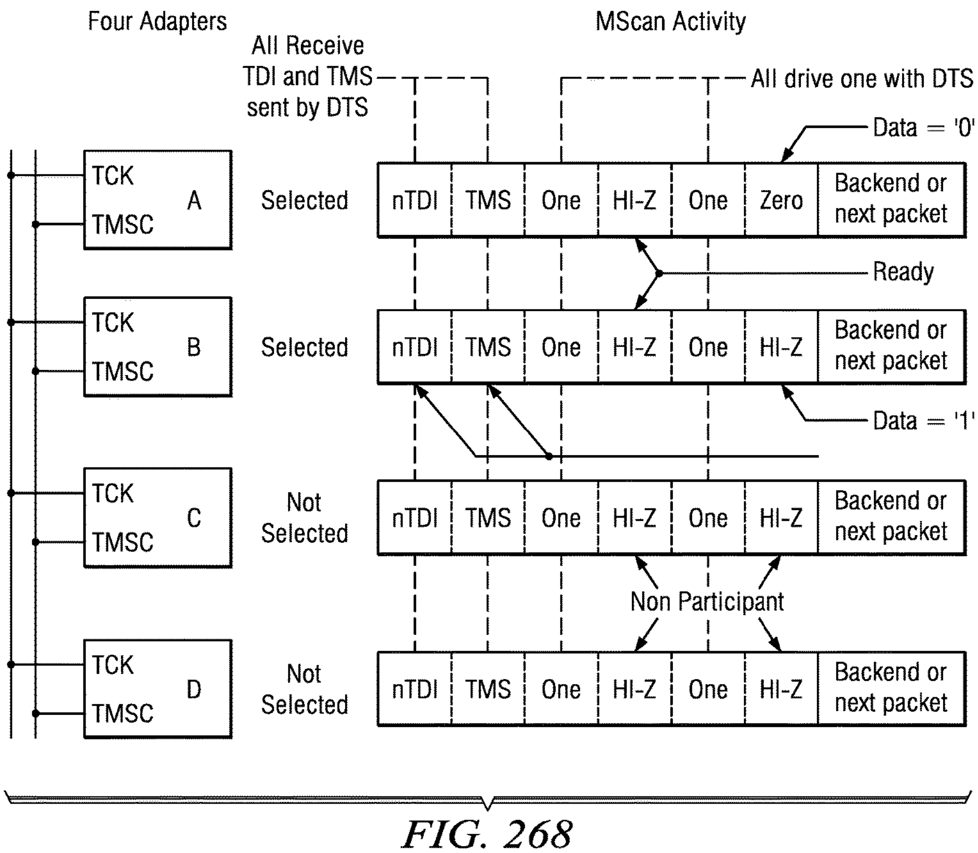
Figure 269:
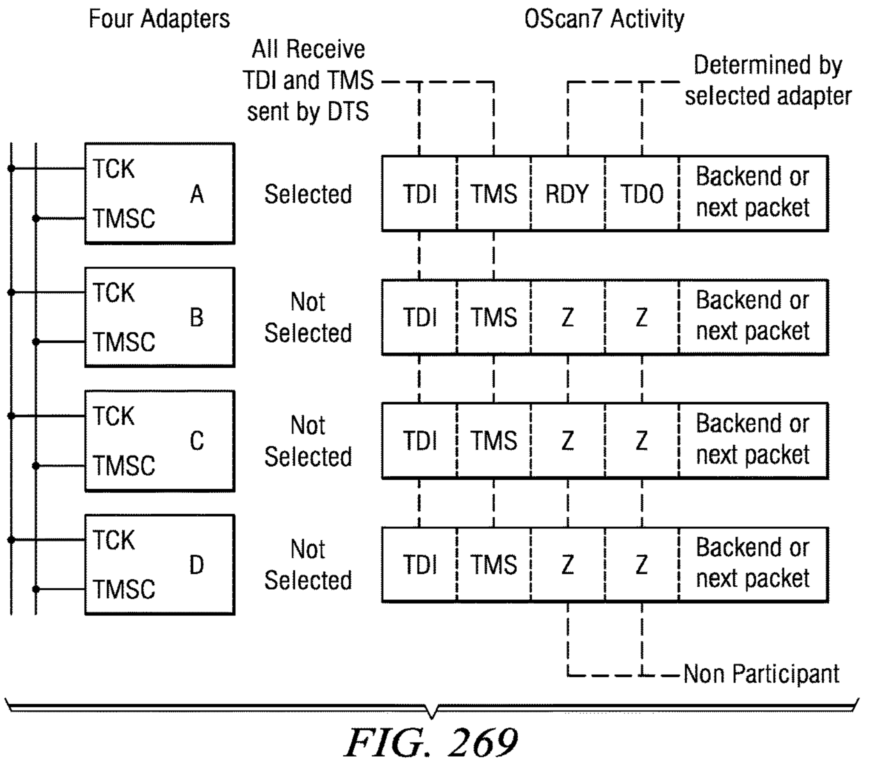
Figure 270:
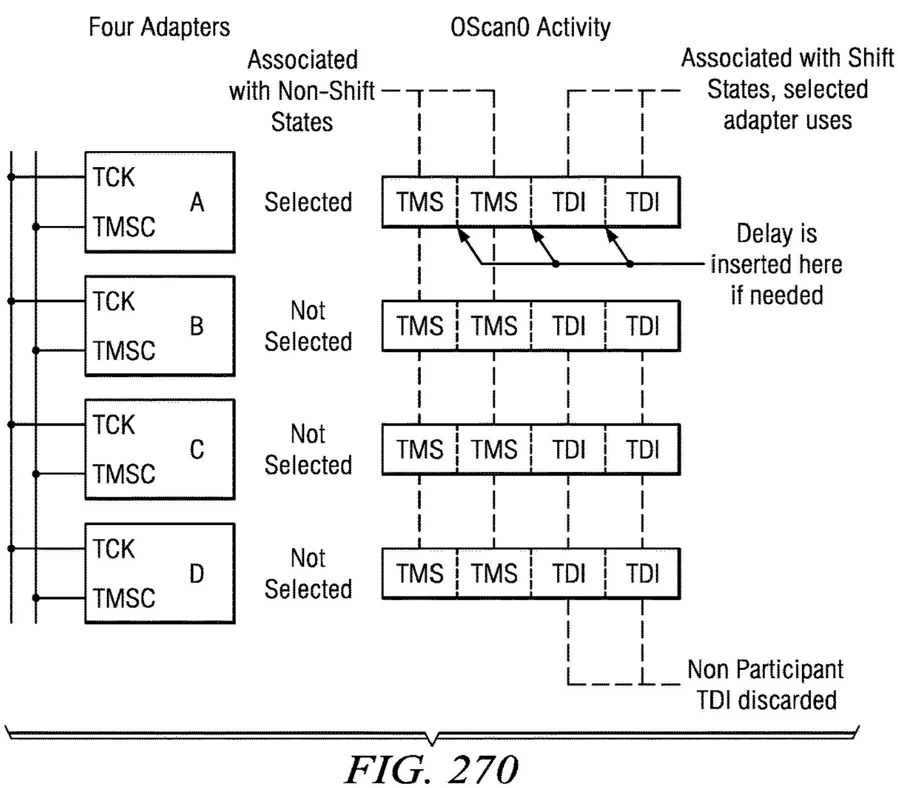
Figure 271:
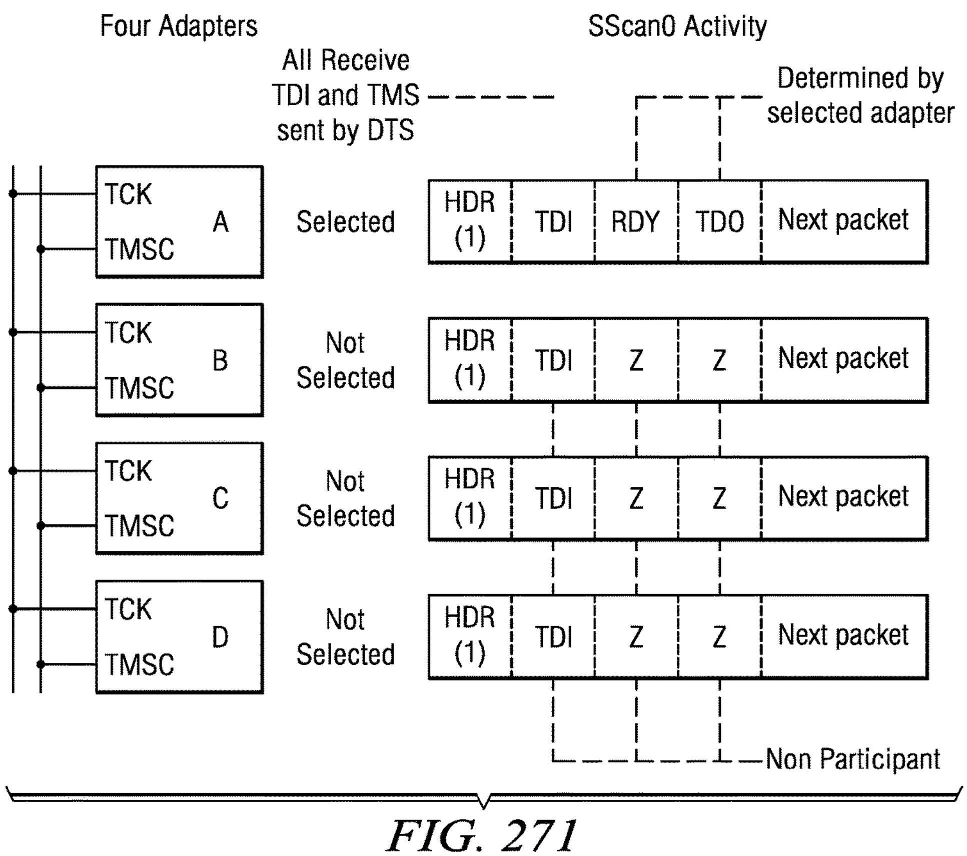
Figures 272, 273:
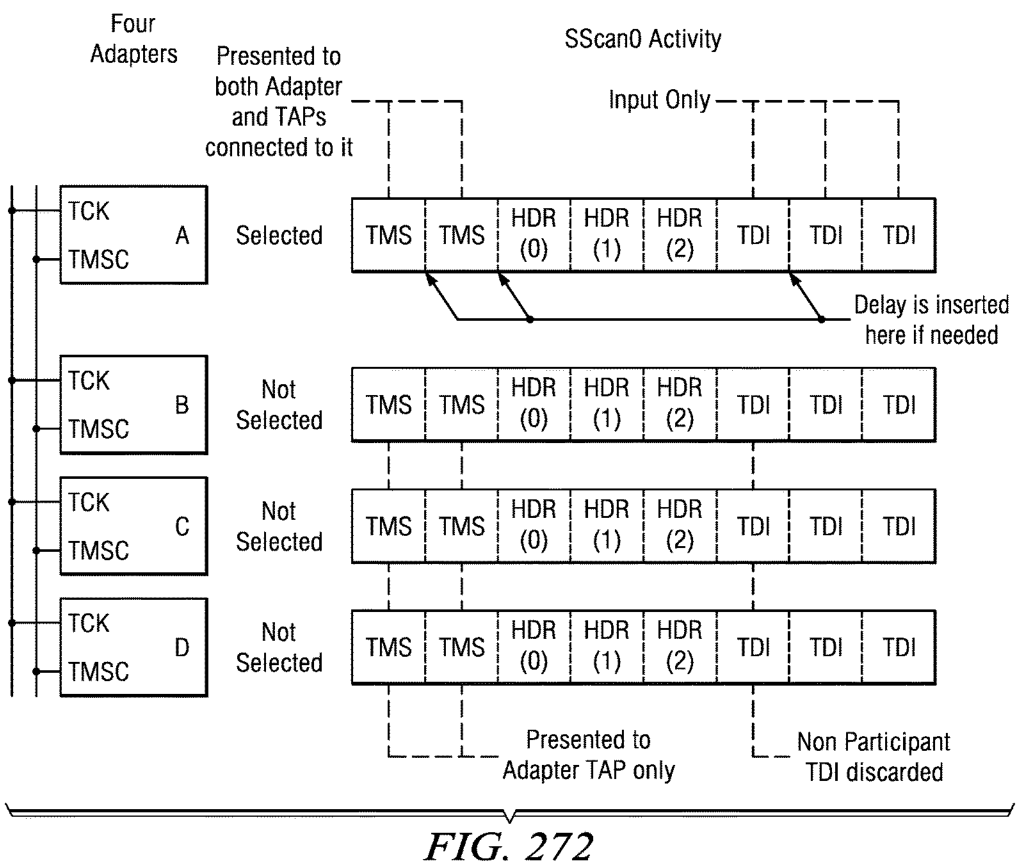
Figure 274:
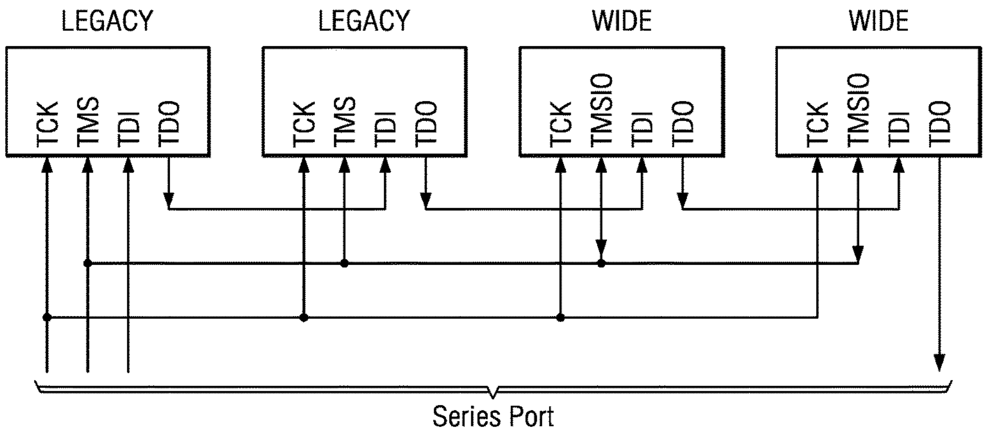
Figure 275:
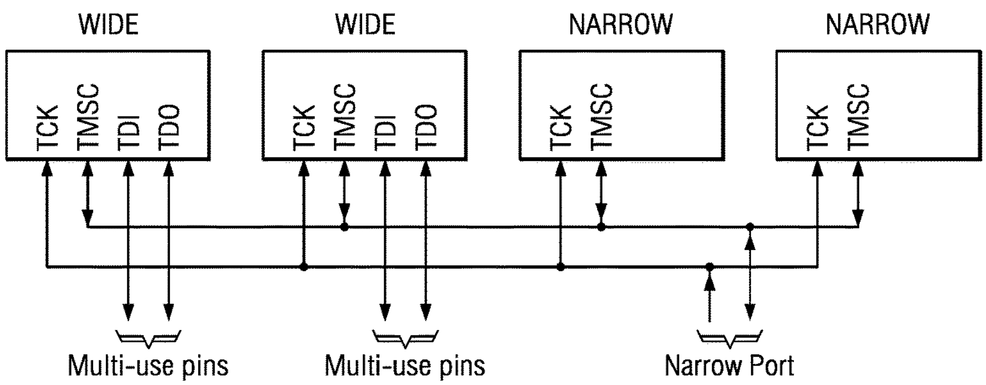
Figure 276:
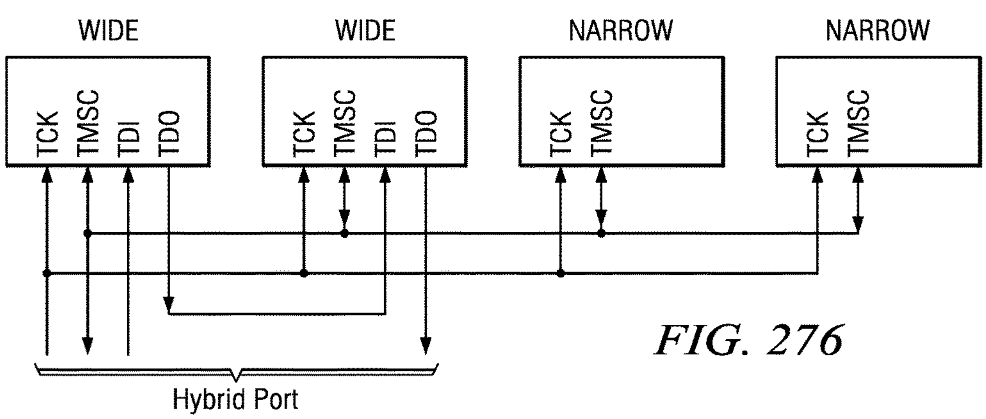
Figure 277:
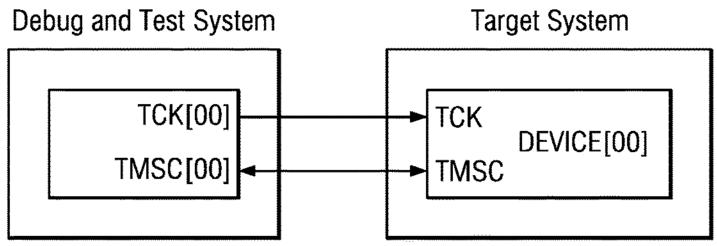
Figure 278:
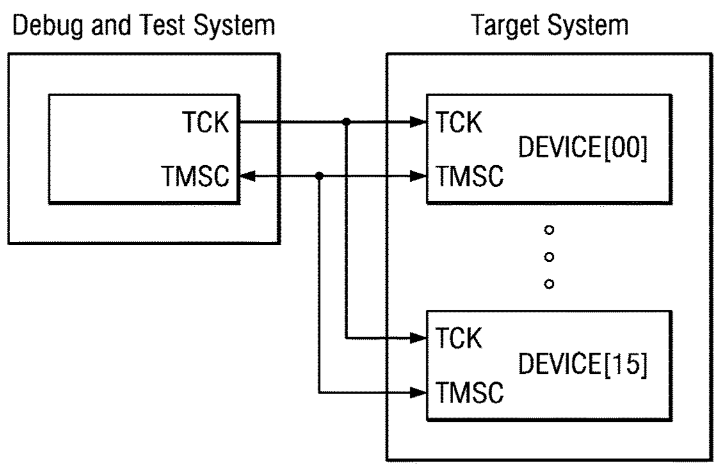
Figure 279:
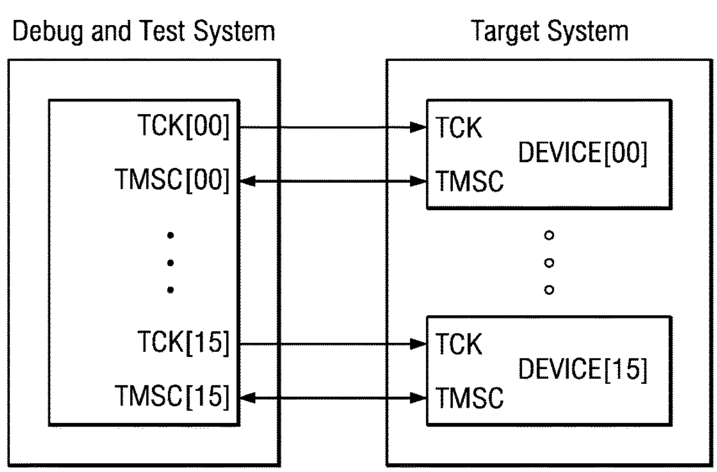
Figure 280:
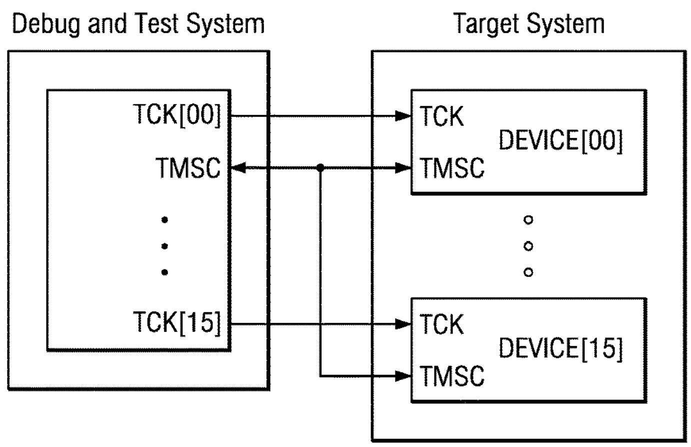
Figure 281:
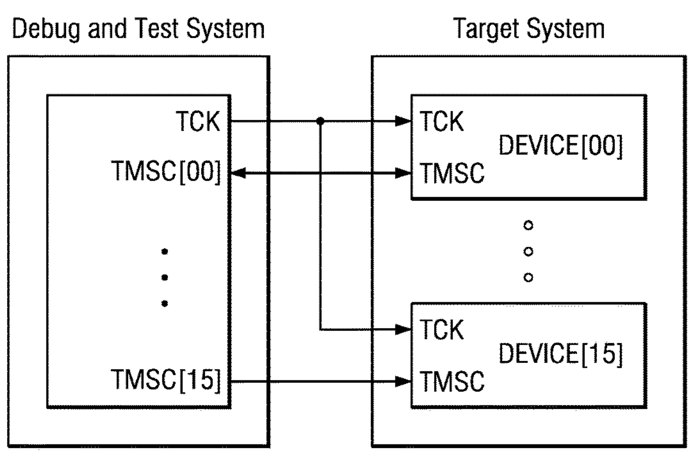
Figure 282:
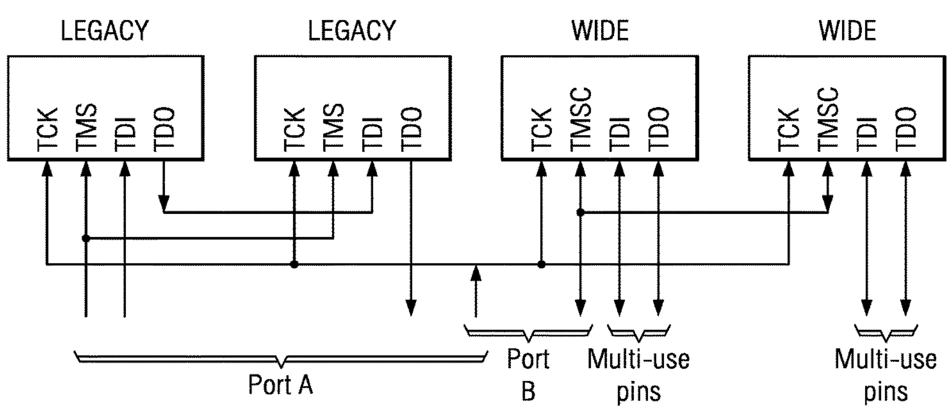
Figure 283:
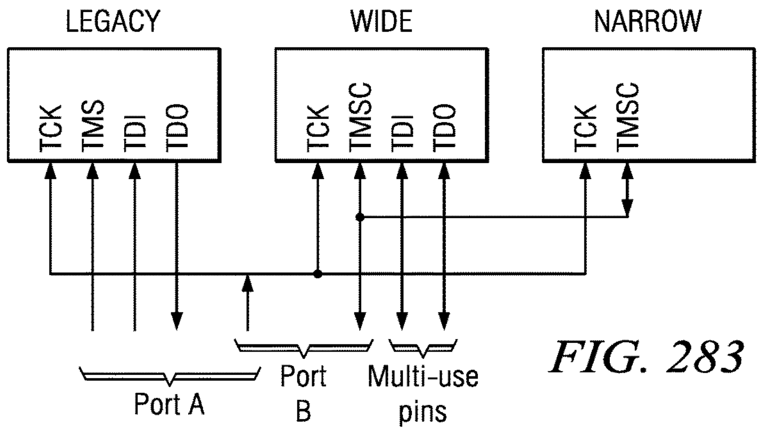
Figure 284:
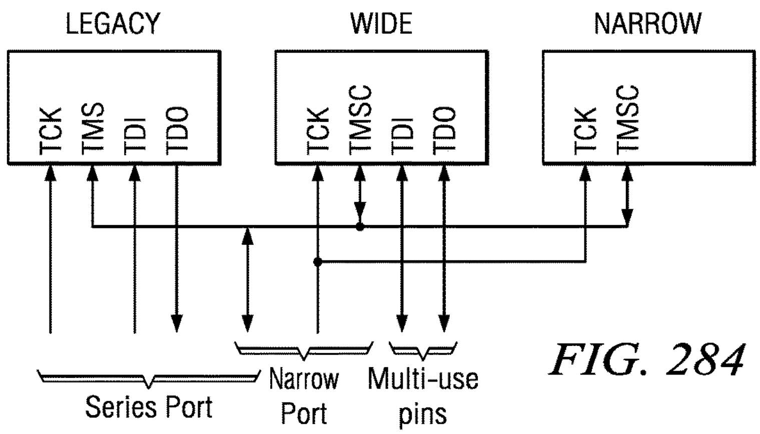
Figure 285:
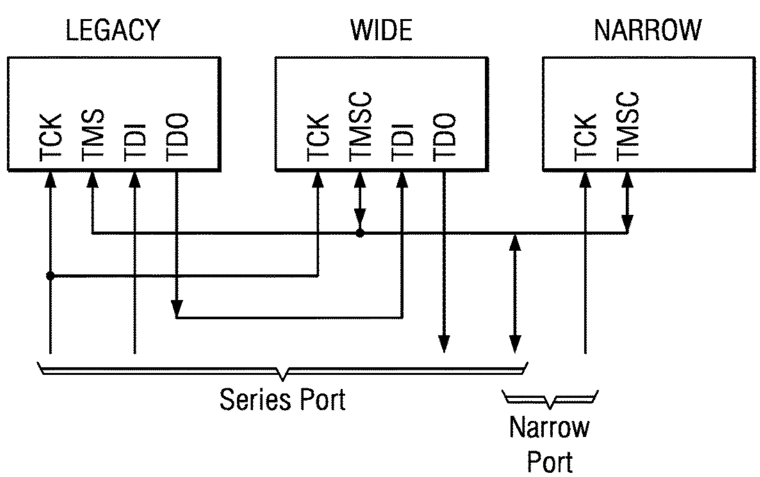

Selected;

FIG. 246 is a diagram of Narrow-Star Port Scan Path, One Adapter Selected;

FIG. 247 is a diagram of Wide-Star Port Scan Path, Other than One Adapter Selected;

FIG. 248 is a timing diagram of Adapter and System TAP State Synchronization;

FIG. 249 is a table of Isolation Pattern;

FIG. 250 is a table of Link ID Assignment Action Summary;

FIG. 251 is a diagram of Star vs. Serial Scan Selection Conceptual View;

FIG. 252 is a timing diagram of Another JScan0 to JScan1 Format Change, Idle After Register-Write;

FIG. 253 is a timing diagram of JScan1 to Another JScan0 Format Change, Idle After Reg. Write;

FIG. 254 is a timing diagram of Another JScan0 to JScan1 Format Change, Delayed Idle State;

FIG. 255 is a timing diagram of JScan1 to Another JScan0 Format Change, Delayed Idle State;

FIG. 256 is a timing diagram of Series Selection Change, Immediate Use;

FIG. 257 is a timing diagram of Series Selection Change, Delayed Use;

FIG. 258 is a table of Pre-Selection and Commands;

FIG. 259 is a table of Pre Scan Status and Commands;

FIG. 260 is a timing diagram of Star Pre-Selection Change, Immediate Use;

FIG. 261 is a timing diagram of Star Pre-Selection, Delayed Use;

FIG. 262 is a timing diagram of Star De-Selection, Immediate Use;

FIG. 263 is a timing diagram of Star De-Selection, Delayed Use;

FIG. 264 is a timing diagram of MTS Command, Update Followed by Idle;

FIG. 265 is a timing diagram of MTS Command, Update Followed by Select_DR;

FIG. 266 is a timing diagram of SCA Command, Update Followed by Idle;

FIG. 267 is a timing diagram of SCA Command, Update Followed by Select_DR;

FIG. 268 is a block diagram of Four Adapters with Two Selected;

FIG. 269 is a block diagram of Four Adapters with One Selected, OScan7 Format;

FIG. 270 is a block diagram of Four Adapters with One Selected, OScan0 Format;

FIG. 271 is a block diagram of Four Adapters with One Selected, Paced Transaction;

FIG. 272 is a block diagram of Four Adapters with One Selected, Non Paced Transaction;

FIG. 273 is a table of DTS/TS Compatibility;

FIG. 274 is a block diagram of Series Port—Mixing Wide and Narrow Interfaces;

FIG. 275 is a block diagram of A Narrow Port—Mixing Wide and Narrow Interfaces;

FIG. 276 is a block diagram of A Hybrid Port with cJTAG Devices;

FIG. 277 is a block diagram of Narrow Port—Single Device;

FIG. 278 is a block diagram of Narrow Port—Multi-device;

FIG. 279 is a block diagram of Multiple Narrow Ports, No Shared Signaling;

FIG. 280 is a block diagram of Multiple Narrow Ports, Separate TCK and Shared TMS;

FIG. 281 is a block diagram of Multiple Narrow Ports, Shared TCK and Separate TMSC;

FIG. 282 is a block diagram of Series and Narrow Ports with a Shared TCK (A);

FIG. 283 is a block diagram of Series and Narrow Ports with a Shared TCK (B);

FIG. 284 is a block diagram of Series and Narrow Ports with Separate TCK (A);

FIG. 285 is a block diagram of Series and Narrow Ports with Separate TCK (B);

FIG. 286 is a block diagram of Series and Narrow Ports with Separate TMSCs; and FIG. 287 is a table of Robustness and Usability Features.

NOTATION AND NOMENCLATURE

Certain terms are used throughout the following discussion and claims to refer to particular system components. This document does not intend to distinguish between components that differ in name but not function. In the following discussion and in the claims, the terms "including" and "comprising" are used in an open-ended fashion, and thus should be interpreted to mean "including but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections. Additionally, the term "system" refers to a collection of two or more parts and may be used to refer to a computer system or a portion of a computer system. Further, the term "software" includes any executable code capable of running on a processor, regardless of the media used to store the software. Thus, code stored in non-volatile memory, and sometimes referred to as "embedded firmware," is included within the definition of software.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims, unless otherwise specified. The discussion of any embodiment is meant only to be illustrative of that embodiment, and not intended to intimate that the scope of the disclosure, including the claims, is limited to that embodiment. "Compact JTAG (cJTAG)", revision 0.9, dated Nov. 20, 2005 is incorporated herein by reference. Similarly, "Compact JTAG (cJTAG)", revision 0.9, which provides a detailed specification for the compact JTAG ("cJTAG") architecture, is also meant to describe an illustrative embodiment and is not intended to limit the present disclosure to the cJTAG architecture described.

The IEEE 1149.1 standard (also known as the JTAG architecture) was originally developed for board-level interconnect testing (sometimes referred to as "boundary testing"). Standard JTAG implementations do not permit debug and testing of the individual JTAG compatible components that are mounted on a printed circuit board. Such component test and debug can be accomplished, however, through extensions and variations of the JTAG architecture, in accordance with at least some preferred embodiments, while still keeping the debug and test system ("DTS") that controls the test sequence, as well as the target system ("TS") comprising the components that are being tested, compatible with the underlying JTAG architecture and communication protocol.

Figure 1:
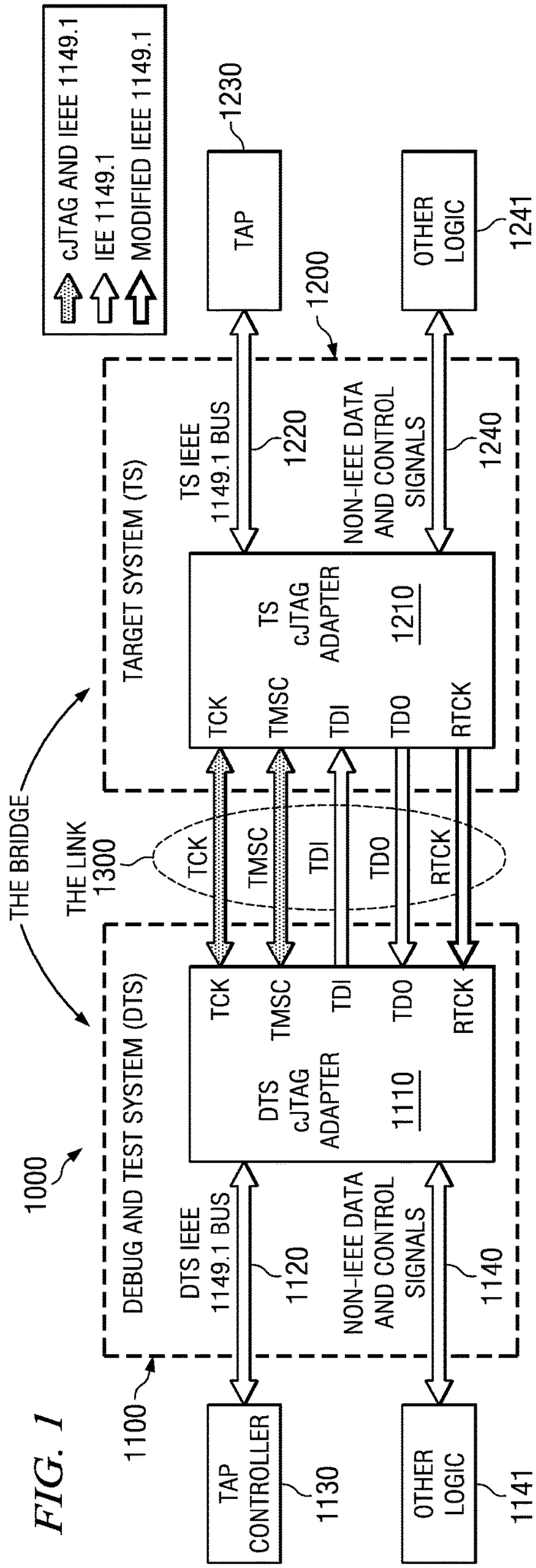
FIG. 1 illustrates the signals of a link between a debug test system and a target system of a cJTAG capable system in accordance with at least some preferred embodiments.

FIG. 1 illustrates a system 1000 constructed in accordance with at least some preferred embodiments, comprising a debug test system ("DTS") 1100 and a target system ("TS") 1200, coupled to each other by link 1300. The debug test system 1100 may comprise a DTS cJTAG adapter 1110, a DTS IEEE 1149.1 bus ("DTS bus") 1120, and non-IEEE data and control signals 1140. The term "cJTAG" refers to "compact JTAG," which is an extension of the JTAG standard that uses fewer communications signals, as will be described below. The DTS cJTAG adapter 1110 provides the logic necessary to convert the standard JTAG signals present on DTS bus 1120 into the signals and message formats defined for cJTAG operation. The DTS bus 1120 couples to a DTS test access port ("TAP") controller 1130, which provides the standard JTAG functionality of the debug test system 1100. The non-IEEE data and control signals 1140 couple to other logic 1141 within the debug test system that provides extended functionality beyond that provided by the DTS TAP controller.

Similarly, the target system ("TS") 1200 may comprise a TS cJTAG adapter 1210, a TS IEEE 1149.1 bus ("TS bus") 1220, and non-IEEE data and control signals 1240. The TS cJTAG adapter provides the logic necessary to convert the standard JTAG signals present on TS bus 1220 into the signals and message formats defined for cJTAG operation. The TS bus 1220 couples to a TS test access port ("TAP") 1230, which provides the standard JTAG functionality of the target system 1200. The non-IEEE data and control signals 1240 couple to other logic 1241 within the target system that provides extended functionality beyond that provided by the TS TAP.

Debug test system 1100 is capable of sending test and debug sequences via link 1300 to target system 1200. These sequences allow debug test system 1100 to configure target system 1200 for a test, execute the test, and read back the results of the test. The debug test system 1100 may be configured to couple to the target system 1120 using a four or five wire implementation of link 1300 as defined under the JTAG architecture. The link 1300 includes signals TCK (clock), TMSC (mode select), TDI (data in), TDO (data out), and optionally RTCK (return clock). As shown, at least the TCK, TMSC, TDI and TDO signals can be used when the debug test system 1100 communicates with the target system 1210 according to the JTAG protocol. In this mode of operation, the signals from the DTS IEEE 1149.1 bus 1120 and the TS IEEE 1149.1 bus ("TS bus") 1220 are passed by DTS cJTAG adapter 1110 and TS cJTAG adapter 1210 without modification across link 1300.

The system 1000 also incorporates a variation of the JTAG architecture that provides an alternative physical interface that is designed to reduce the pin count of the interface between the debug test system 1100 and the target system 1200. This alternative configuration of the link 1300 allows the debug test system 1110 to communicate with the target system 1210 using only the TCK and TMSC signals of link 1300. In this mode of operation the TDI and TDO data are serialized together with the TMSC data and sent across the TMSC signal of link 1300 as a multi-bit serial message packet. Each packet may be either a control packet that is used to configure a component within the system 1000, or a data packet used to transfer data from one component to another. Although the TMSC signal is used for transferring the serial packet data in the preferred embodiment of FIG. 1, other signals (e.g., TDI and TDO) may be used and the present disclosure is intended to encompass all such embodiments.

Figure 2A:
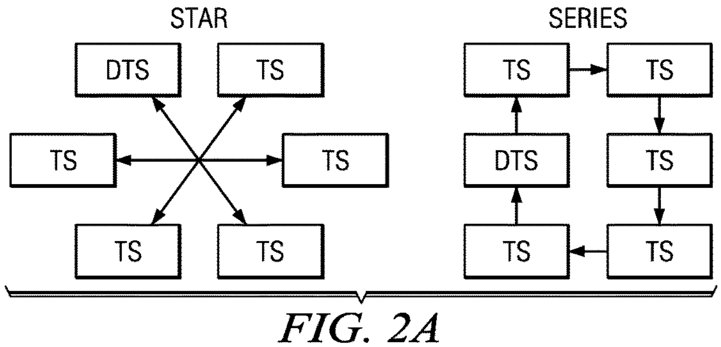
FIG. 2A illustrates star and series configurations that are possible within a cJTAG capable system in accordance with at least some preferred embodiments.
Figure 2B:
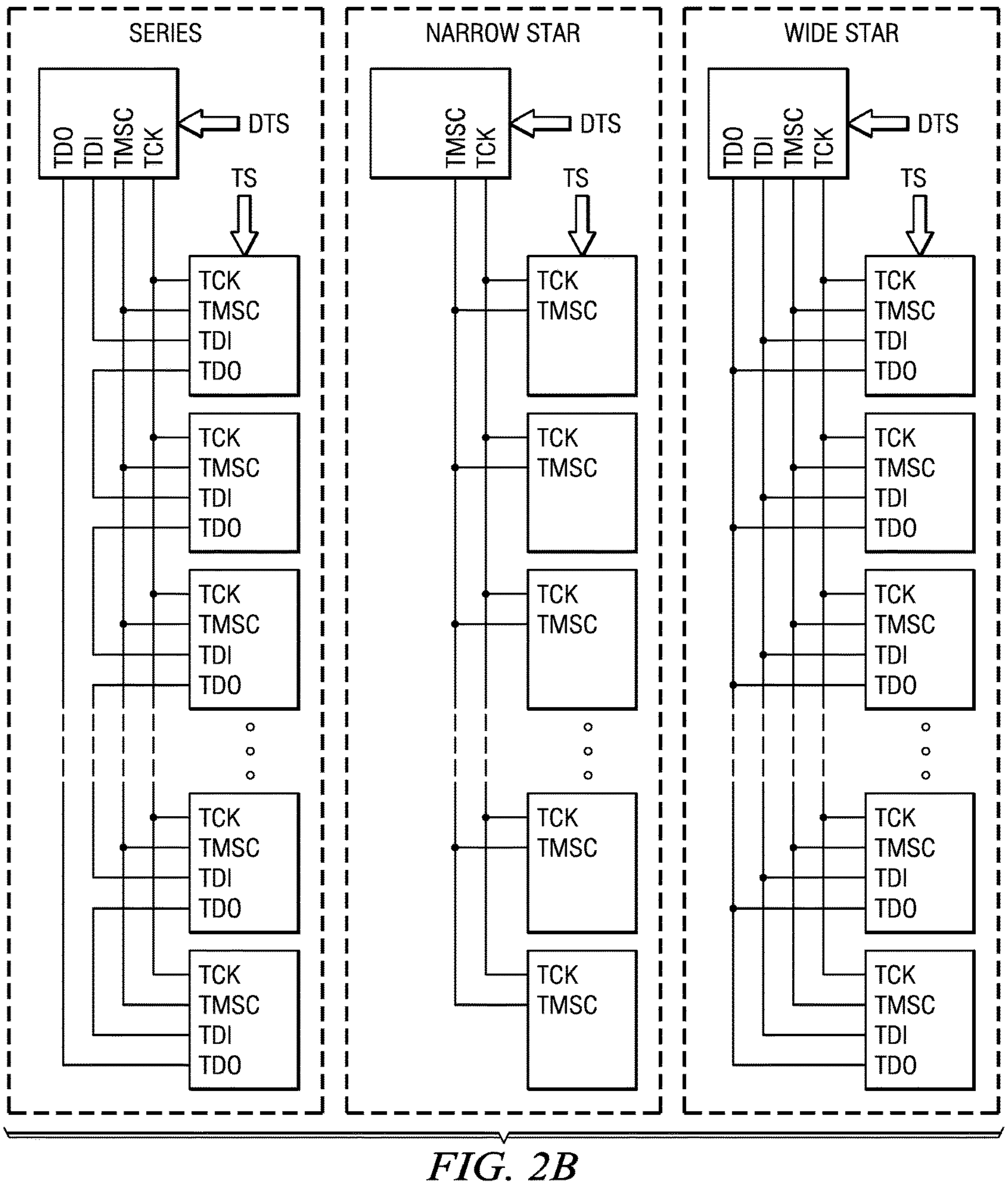
FIG. 2B illustrates series, narrow star and wide star configurations that are possible within a cJTAG capable system in accordance with at least some preferred embodiments.
Figure 2C:
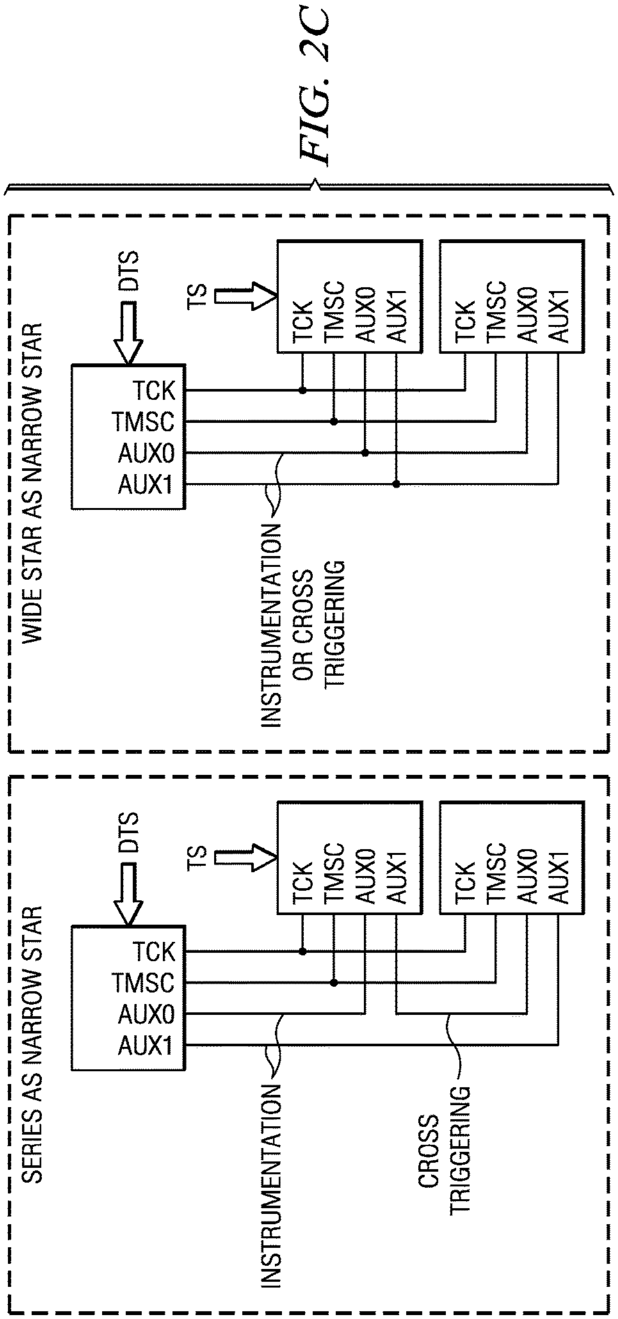
FIG. 2C illustrates a series and a wide star cJTAG capable system configured, both configured to operate as narrow star configurations in accordance with at least some preferred embodiments.

FIG. 2A illustrates the two basic interconnect configurations for both JTAG and cJTAG systems. In the Star configuration, each target system may be accessed directly by the debug test system, while in the Series configuration the debug test system can only send data to, or receive data from, a target system through any and all intervening target systems. FIG. 2B illustrates how each of the two physical interfaces described above may used to couple a debug test system to one or more target systems. The Series configuration is allowed under both the JTAG architecture and permits mixing JTAG and cJTAG target systems. The Narrow Star and Wide Star configurations are only valid within the cJTAG architecture. The Narrow Star configuration includes the use, in at least one preferred embodiment, of only the TCK and TMSC signals. Both signals are shared by all of the target systems. cJTAG target systems that have a wide physical interface, and which are coupled to each other in either a Series or Wide Star configuration, may optionally operate as if configured to operate in a Narrow Star mode, as shown in FIG. 2C.

It should be noted that throughout this disclosure a distinction is made between the TMS bit that is defined in the IEEE standard and the TMSC signal of the link 1300. When operating the system according to the standard JTAG protocol, the TMS bit is the only bit transmitted using the TMSC signal. But when the system is operating according to the cJTAG protocol, the TMS bit is just one of several bits that may be transferred across the link 1300 using the TMSC signal. Thus, to differentiate between the two, the bit is referred to as the TMS bit, while the signal of the link is referred to as the TMSC signal.

Referring again to FIG. 1, both DTS cJTAG adapter 1110 and TS cJTAG adapter 1210 appear to continue to operate according to the standard four or five wire JTAG protocol when viewed from either the DTS bus 1120 or the TS bus 1220. The cJTAG adapters 1110 and 1210, together with link 1300, thus provide an abstraction layer or bridge that hides the underlying 2-wire cJTAG physical interface. This bridge can operate according to the JTAG protocol. ("IEEE mode"), or can alternatively operate according to the cJTAG protocol ("advanced mode") in a manner that is transparent to DTS bus 1120, TS bus 1220 and other portions of the debug test system and target systems that operate exclusively in IEEE mode. When operating in advanced mode, data and control information may be exchanged with the DTS cJTAG adapter 1110 via either DTS bus 1120 or non-IEEE data and control signals 1140. Likewise, data and control information may be exchanged with TS cJTAG adapter 1210 via either TS bus 1220 or non-IEEE data and control signals 1240 when operating in advanced mode.

Figure 1A:
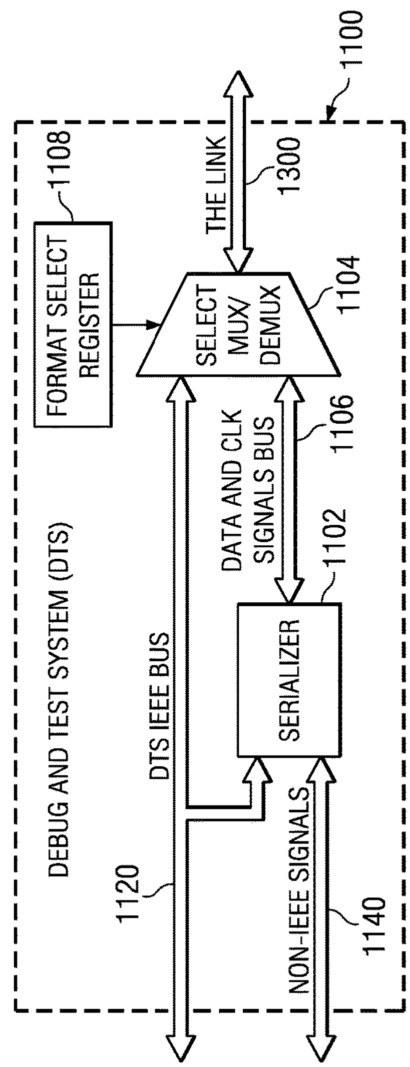
FIG. 1A illustrates a detailed block diagram of the debug and test system of FIG. 1 in accordance with at least some preferred embodiments.

The ability to select between multiple modes of operation is illustrated by the preferred embodiment of FIG. 1A, which shows a more detailed view of debug and test system 1100. DTS IEEE bus 1120 couples to both select multiplexer/demultiplexer (Select Mux/Demux) 1104 and serializer 1102. When the debug and test system 1100 is configured to operate in IEEE mode, select multiplexer/demultiplexer 1104 selects IEEE bus 1120, and the signals from IEEE bus 1120 drive the corresponding signals on the link 1300. The selection is controlled by the state of format select register 1108, which couples to the selection control input of multiplexer/demultiplexer 1104. If the debug and test system 1100 is configured to operate in a mode other than IEEE mode (e.g., advanced mode), then the output of serializer 1102, which couples to select multiplexer/demultiplexer 1104 via data and clock signal bus 1106, is selected via a corresponding state of format select register 1108, and the TMS and TCK signals from IEEE bus 1120 drive the TMSC and TCK signals, respectively, of the link 1300.

The TDI and TDO signals of the link 1300 may also be driven by signals originating from a source other than the IEEE bus 1120 or serializer 1102. Serializer 1102 may serially encode the signals from IEEE bus 1120 (e.g., TDI, TDO and TMS), as well other IEEE bus signals and non-IEEE signals, depending upon the configuration of serializer 1102. Further, these same signals may also be routed unserialized through the serialized 1102 and the select multiplexer/demultiplexer 1104 to either the TDI or TDO signals (or both) of the link 1300. Other modes beyond IEEE and advanced mode, as well as other combinations of serialized and non-serialized signals, may become apparent to those skilled in the art, and all such modes and combinations of signals are intended to be within the scope of the present disclosure.

Throughout the present disclosure, the preferred embodiments described include one or more protocols (e.g., cJTAG) in addition to the JTAG protocol, wherein the JTAG protocol is the default protocol at power-on/reset (POR). However, other embodiments are possible in which a protocol other than the JTAG protocol operates by default after a power-on/reset, and in yet other embodiments the protocol that operates by default after a power-on/reset may be programmable. All such embodiments are intended to be within the scope of the present disclosure. Further, although one protocol is designated the default protocol, each protocol operates independent of the other protocol. When one protocol is operating, all of the other protocols are in an inactive state. Each of the other protocols are maintained in an inactive state by designing each protocol such that operations by one protocol are seen as no-operations (No-Ops) or "inert" operations by the other protocols. In the preferred embodiments described in the present application, this is accomplished by designing all of the protocols around the JTAG TAP state machine (shown in FIG. 4), and selecting states, groups of states, state transitions, and/or state sequences that define operations within one protocol, but that are seen as inert operations by the other protocols.

As already noted, each protocol of the preferred embodiments described operates independent of the other, functioning in a peer-level configuration rather than a parent-child configuration. Each protocol transmits and receives messages through the physical interface coupling the debug and test systems 1100 of FIG. 1 to one or more target systems, such as target system 1200. Messages are exchanged under one protocol without intervention by the other protocols (e.g., without encapsulation of one protocol by another). The physical interface is thus time-shared by the protocols, with each protocol being separately selected for operation by the debug and test system 1100 as needed. Protocol selection is performed without giving any single protocol or group of protocols preferential access to the physical interface (i.e., link 1300).

Transitions between protocols may be triggered either by a power-on/reset, or by a software controlled selection sequence that is recognized by all protocols. Further, transitions by the system 1000 from one protocol to another are done without requiring that the system 1000 first return or transition through a reference or top-level protocol (a prioritized configuration), without requiring that the system 1000 return to a protocol previously selected after completing operations under a currently selected protocol (a nested configuration), and without an intervening hardware or software generated reset. It should be noted that although prioritized protocol configurations, nested protocol configurations, and resets are not required for operation of the preferred embodiments disclosed, embodiments that incorporate such protocol configurations and resets are not precluded, and are thus also within the scope of the present disclosure.

As will be described below, a number of different message formats are possible within each protocol. These message formats are defined by the bits that are included within the message, and the TAP state machine states (FIG. 4) used to transmit and/or receive a message so formatted. It is noted that the present disclosure, while describing certain specific formats, is not intended to be limited to such formats. Also, selection of a format in at least some of the preferred embodiments may be performed dynamically without the need to reset the test and debug system 1100, the target system 1200, or the link 1300. Message formats may also be selected based on the characteristics of a specific target system, and may be changed dynamically as different target systems are each selected.

Figure 3:
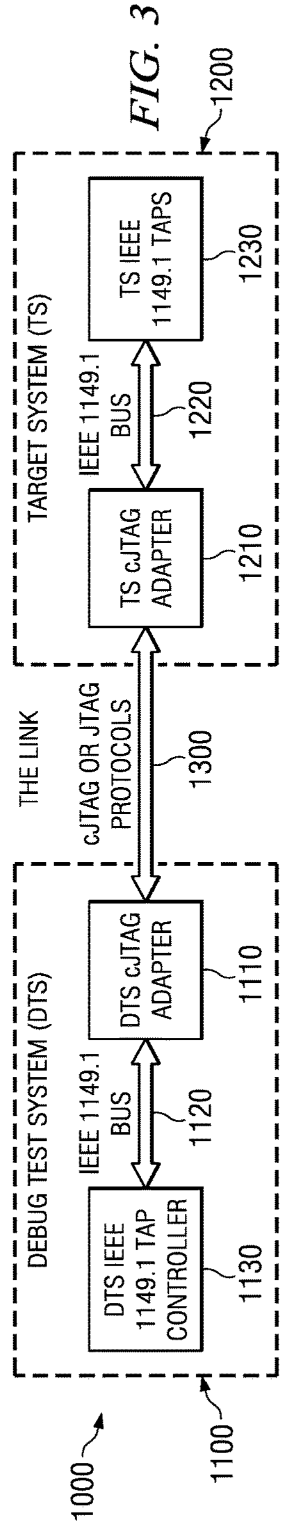
FIG. 3 illustrates a block diagram overview of a cJTAG capable system in accordance with at least some preferred embodiments.

FIG. 3 provides an alternative illustration of the system 1000 that includes DTS IEEE 1149.1 TAP controller ("DTS TAP controller") 1130 and TS IEEE 1149.1 TAP ("TS TAP") 1230. DTS TAP controller 1130 couples to DTS cJTAG adapter 1110 via DTS bus 1120, and TS TAP 1230 couples to TS cJTAG adapter 1210 via TS bus 1220. The system 1000 of FIG. 3 can select between IEEE mode and advanced mode in one of at least two ways. First, the operational mode of the system 1000 can be selected when the system is first powered up. Upon initial power-up, the system 1000 asserts a power-on-reset signal that sets all components within the system to a known default state. The cJTAG adapters 1110 and 1210 both initially default to IEEE mode. In the preferred embodiment of FIG. 1, the TMS bit is held at a zero state while the TDO bit is sequenced through a pattern that causes the cJTAG adapters, which monitor the TDO bit, to transition into advanced mode. In at least some of the preferred embodiments, this is the same pattern that would cause a transition into advanced mode if presented on the TMS bit during normal operation of the system 1000.

Figure 4:
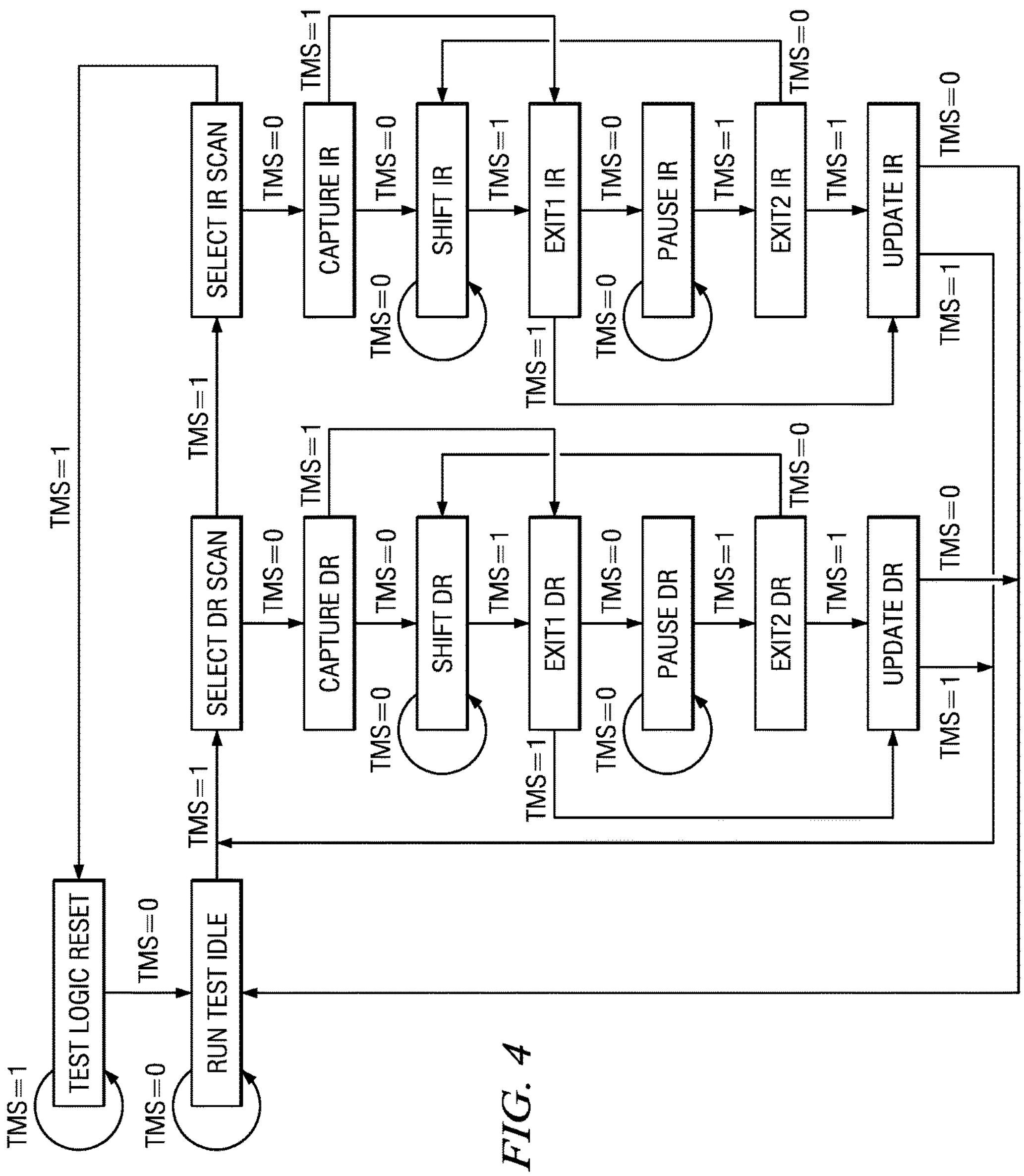
FIG. 4 illustrates the state transition diagram for a TAP state machine within a cJTAG capable system in accordance with at least some preferred embodiments.

FIG. 4 shows the state transition diagram implemented by the state machine of TS TAP 1230 in accordance with IEEE standard number 1149.1. Sixteen states are shown and transitions from one state to another are effectuated by transitions of the TMS bit. When the TAP 1230 first reaches the Test-Logic-Reset state, the instruction register is loaded with either an IDCODE or BYPASS opcode. As can be seen in FIG. 4, holding the TMS bit to a binary zero causes the TS TAP 1230 to transition from the Test-Logic-Reset state to the Run-Test/Idle state, where it stays as long as the TMS bit is held to a logical zero. To transition the system 1000 to the advanced mode of operation upon a power-on reset, the TDO bit is sequenced through a predetermined sequence of bit patterns while the TMS bit continues to be held at a zero state. When the TS cJTAG adapter 1210 detects this sequence, the TS cJTAG adapter 1210 begins operating in the advanced mode. This pattern for the TDO bit will cause the state machine of the TS TAP 1230 to transition through the states of the state machine without passing through either the shift_DR or shift_IR states. By avoiding these states, data is not moved in or out of any of the standard JTAG data or instruction registers, which freezes the JTAG configuration of the target system 1200. Thus, activating advance mode operation of the TS cJTAG adapter 1210 has no effect on the TS TAP 1230.

Figure 5:
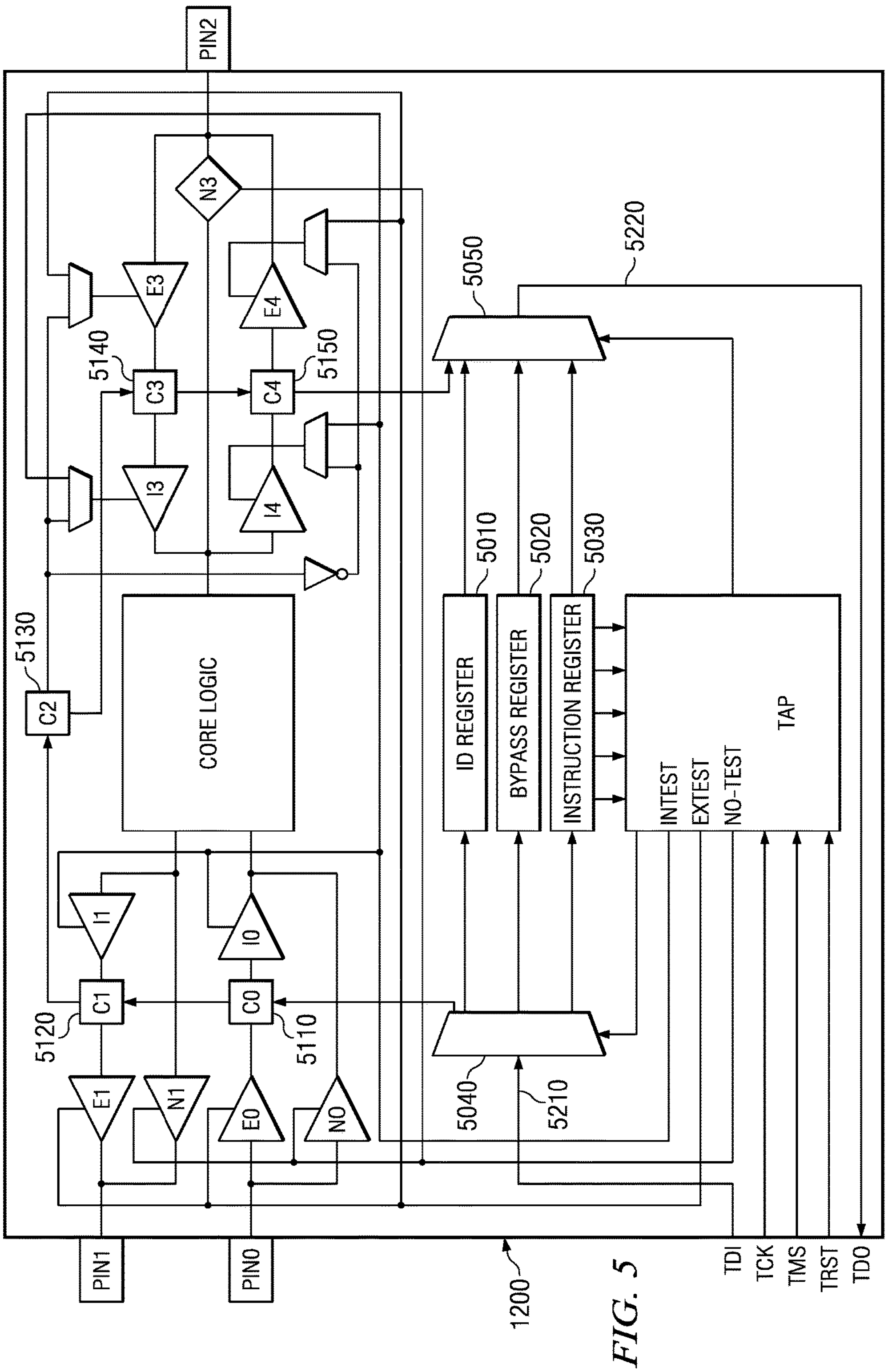
FIG. 5 illustrates a high-level schematic of a JTAG target system in accordance with at least some preferred embodiments.

The second way in which the system 1000 of FIG. 3 can select between IEEE mode and advanced mode is through the use of "inert" JTAG data scan sequences after the system is past power-on reset and is operational. Inert data scans are JTAG data scan sequences that do not do anything useful and thus are not normally used. Normally a JTAG data scan sequence includes a fixed series of operations designed to accomplish a useful function, such as reading or loading a JTAG data register within the target system 1200. FIG. 5 illustrates at least some of the data registers within the target system 1200 that are accessible by the TS TAP 1230, in accordance with at least some preferred embodiments. These include the ID register 5010, the bypass register 5020, and a collection of input cell, output cell and enable cell registers 5110 through 5150. To load a register, for example, the register type (data or instruction) is first selected, and the current contents of the destination register (e.g., the bypass register) are then moved to the output shift register of register output multiplexer 5050 though a capture operation. Next, a series of shift operations are performed wherein new data is shifted into the input shift register of register input demultiplexer 5040 from the TDI input 5210 and old data is simultaneously shifted out the TDO output 5220. Finally, an update operation is performed to transfer the new data from the input shift register of register input demultiplexer 5040 to the actual register to which the data is destined.

Figure 6A:
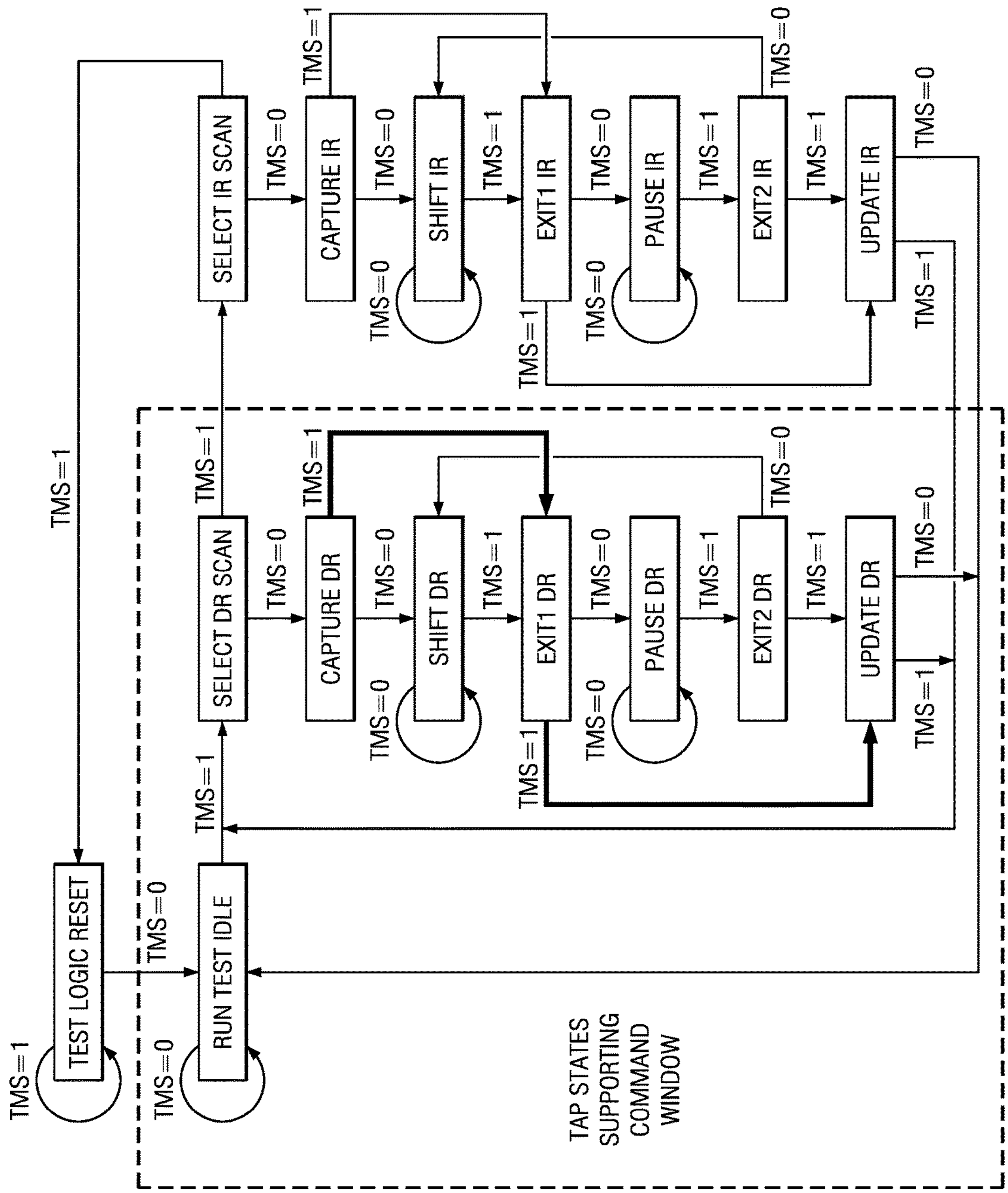
FIG. 6A illustrates a first example of an inert JTAG data scan sequence usable to enter into an advanced mode of operation in accordance with at least some preferred embodiments.
Figure 6B:
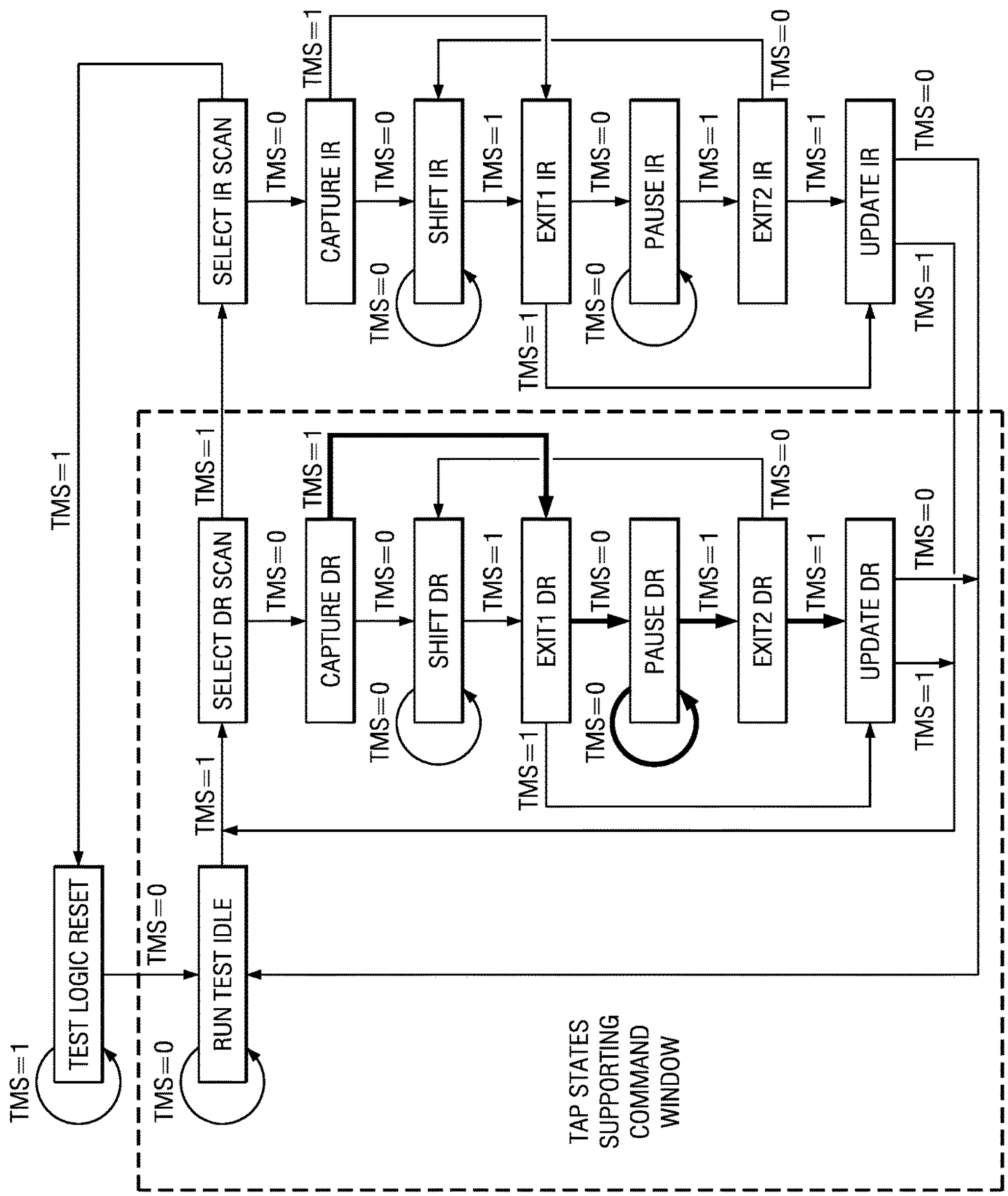
FIG. 6B illustrates a second example of an inert JTAG data scan sequence usable to enter into an advanced mode of operation in accordance with at least some preferred embodiments.

FIGS. 6A and 6B illustrate how inert JTAG data scan sequences may be used to transition through the TAP state transition diagram without actually loading a value. As can be seen, all of the operations that would normally take place in, for example, a JTAG data scan sequence to load a register take place, except for the sequence of shift operations. In FIG. 6A, the sequence of states (shown shaded) includes the Capture_DR state, the Exit1_DR state, and the Update_DR state. Similarly, in FIG. 6B the sequence of states include the Capture_DR state, the Exit1_DR state, the Pause_DR state, the Exit2_DR state, and the Update_DR state.

In each of the sequences of FIGS. 6A and 6B, the capture operation causes the current value of the destination register to be transferred to the output shift register of register output multiplexer 5050, and the update operation causes the value in the input shift register of register input demultiplexer 5040 to be loaded into the destination register. But without intervening shifts, all of the registers can end up containing the same value in at least some situations, which is the value that was already in the input shift register of register input demultiplexer 5040 and the destination register. As a result, no data is transferred in or out of the target system 1200, and the contents of the destination register remain unaltered in at least some cases. Because no data bits are shifted in or out of the target system 1200, the inert JTAG data scan sequences are referred to as "zero-bit" scans ("ZBS"). When a zero-bit scan is preceded by some action that loads a BYPASS instruction or a read-only instruction (e.g., the IDCODE instruction), the operation performed has no consequences since the register bit changed is either the bypass bit or a bit that is not writeable (e.g., the read-only identification bits). FIG. 6C summarizes the relevant TAP states that together each define an example of a zero-bit scan. Although two examples are shown, many others are possible and all such sequences of states that define a zero-bit scan are intended to be within the scope of this disclosure. Because zero-bit scans do not corrupt the contents of JTAG registers other than that specified by the inert instruction (e.g., bypass), these scans, either independently or in conjunction with other scan activity following the zero-bit scan, can be used to change the behavior of the DTS and TS cJTAG adapters without other consequences.

Because a zero-bit scan is essentially a no operation (no-op) to the DTS TAP controller 1130 and the TS TAP 1230, any number of zero-bit scans may be executed one after the other. The ability to send any number of consecutive zero-bit scans allows multiple tiers of capabilities or "control levels" to be defined. Each control level corresponds to the number of consecutive zero-bit scans, and each control level enables a different set of capabilities. A control level is thus synonymous with a command window, wherein opening a command window represents entry into a new control level. FIG. 7 illustrates an example of a command window in which two, zero-bit scan sequences open the command window. The two zero-bit scans that are used to open the window are also used to designate the control level as control level 2. FIG. 8A shows an example, in accordance with at least some preferred embodiments, of different capabilities being allocated to each control level. The example shows that control levels 1-5 are allocated to the cJTAG protocol (with control levels 4 and 5 being reserved). Control level 0 represents IEEE mode (JTAG protocol), and control levels 6 and above are user defined levels available for extended capabilities beyond those defined for the cJTAG protocol of the preferred embodiments described herein. Other extended capabilities and control levels, defined through the use of zero-bit scans as a control event, will become apparent to those skilled in the art, and the present disclosure is intended to encompass all such capabilities and control levels.

Referring again to FIG. 4, in at least some preferred embodiments a control level is established when a Shift_DR TAP state is entered by the TAP state machine following one or more zero-bit scans, but without an intervening Select_IR or test logic reset (TLR) state. Such scans (referred to as DR-Scans) may each be associated with a specific control level thus established. The zero-bit scans define control levels above level 0 and do not require the use of the TDI and TDO signals, since data is not transferred using these signals during a zero-bit scan. Such operation thus allows the use of configurations such as the two-wire narrow star configuration previously described. Other mechanisms not requiring the TDI and TDO signals, and other TAP states (e.g., the Pause_DR state) may be used to implement at least some of the preferred embodiments, and all such mechanisms and states are intended to be within the scope of the present disclosure.

In control levels above level 0 (i.e., within a command window), the number of TAP states (i.e., the number of clock cycles that advance the TAP state machine) spent in the Shift_DR state are counted (though as already noted, states other than the Shift_DR state could also be used for this purpose). The count is saved as data in a temporary register if the count is greater than 16. A count of less than 16 is interpreted as a command and is combined with the previously saved count to specify the particular command desired. One such command, for example, may be to change to a protocol other than the protocol being used to communicate over the TMSC signal. FIG. 8B illustrates an example of counts used to define advanced mode commands in this manner. Although the example shown in FIG. 8B uses a 5-bit data width, any number of bits may be encoded in this manner and the present disclosure is intended to encompass all bit widths. Further, data may be specified using techniques other than counts (e.g., by the order of the transitions through states within the TAP state machine), or in combination with counts, and all such techniques and combinations of techniques are also intended to be within the scope of the present disclosure.

In at least some preferred embodiments, control levels above 0 may be used to set a state that remains defined outside of the command window through the use of an extended command register (not shown) within both the debug and test system and the target system of FIG. 1. Bits within this register can be set or cleared using the zero-bit scan count as described above, or using a combination of zero-bit scans and other TAP state activity following the zero-bit scans. In this manner, the register bit settings are retained after the command window has closed, allowing the system to operate according to a protocol defined for a particular control level outside of the command window, or to define any other function controllable by the bits that survive the closing of a command window. The effects of such bits may begin when the bits initially change state within the command window, or after the command window is closed. Similar zero-bit scan sequences may subsequently be used to clear the register bits to exit the selected control level. Other variations to the use of zero-bit scan sequences, counts, and TAP state sequence as a means to define values that survive the closing of a command window may become apparent to those skilled in the art, and all such variations are intended to be within the scope of the present disclosure.

In at least some preferred embodiments, a command window is closed when an instruction register select operation is performed, or when the test logic reset TAP state is entered. Other TAP state sequences may be defined that cause a command window to close, and all such sequences are intended to be within the scope of the present application. Once a command window is closed, the actions enabled by the open command window cease to be available.

The command windows of the preferred embodiments provide the capability of altering the behavior of the link 1300 of FIG. 3. Switching to advanced mode is an example of such a use of a command window. Once in the advanced mode of operation, the debug test controller 1100 of FIG. 3 no longer bypasses the DTS cJTAG adapter 1110, instead communicating through the DTS cJTAG adapter 1110 with the DTS TAP controller 1130. Similarly, cJTAG sequences received by the target system 1200 are passed through the TS cJTAG adapter 1210, which would be bypassed if the target system 1200 were operating in IEEE mode. Operation of the DTS and TS cJTAG adapters 1110 and 1210 in advanced mode continues until an event that terminates the current sequence of operations and transitions the DTS and TS cJTAG adapters 1110 and 1210 back to IEEE mode. In the preferred embodiment of FIG. 3, termination of advanced mode is accomplished by a zero-bit scan sequence that opens a command window, within which bits are set that indicate that IEEE mode operation is desired.

Command windows are thus managed using clear entry and exit sequences. A cJTAG command window is defined that starts with, for example, one or more zero-bit scans, followed by cJTAG sequences (data register scans are used in the preferred embodiment of FIG. 3), and ending, for example, with an instruction register scan. The structure of such a scan cJTAG sequence and the resulting command window are illustrated in FIG. 7. Such sequences may be used within the preferred embodiments described in the present disclosure to manage a variety of functions, including those that enable and disable advanced mode.

It should be noted that although command windows are used to transition between modes of operation, these modes do not depend upon whether a command window is open or closed, and whether the command window remains open or closed does not depend upon the mode of operation of the system. Command windows may be opened or closed at any time through appropriately executed state sequences, and are thus dependent upon the state of the TAP state machine, not the mode of operation of the system. Likewise, the mode of operation depends upon the setting of the format select register (FIG. 1A), and does not depend upon the state of the TAP state machine.

Command windows as described above may be used to access and modify a variety of control registers within both the debug and test system and the target system. Some of the registers may perform functions common to both systems, and indeed may be set to common values. In at least some of the preferred embodiments, a single write to a common or "shared" control register within the debug and test system will automatically result in the same value being written to the corresponding register of a target system adapter. In some preferred embodiments, a single write to the register within the target system will result in a write of the same value to the corresponding register in only those target systems that are selected to respond to the write.

Figure 9:
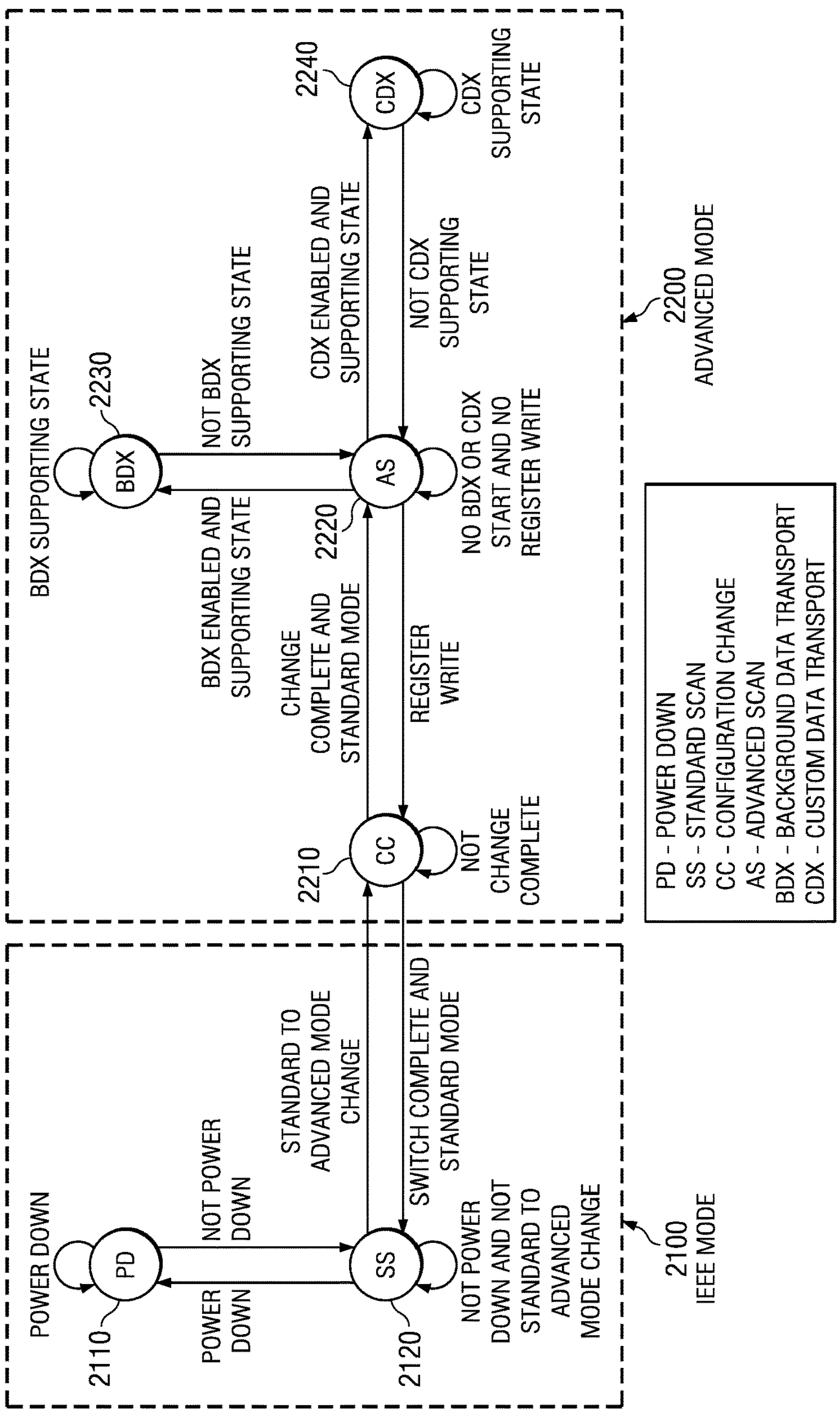
FIG. 9 illustrates a simplified state transition diagram showing the transitions between IEEE mode and standard mode in accordance with at least some preferred embodiments.

As already noted, the preferred embodiment of FIG. 3 is capable of multiple modes of operation. Each mode defines what protocol is used to communicate across the link 1300, and the overall behavior of the interface at the message packet level. FIG. 9 illustrates a simplified scan state diagram 2000 that shows the modes of operation of the state machine implemented within the DTS and TS cJTAG adapters 1110 and 1210 of the system 1000 (FIG. 3), in accordance with at least some preferred embodiments. Two modes are defined: standard (IEEE) mode 2100 and advanced mode 2200. The system starts up with the state machines of the cJTAG adapters in the power down ("PD") state 2110 and after powering up in IEEE mode is capable of performing standard (IEEE) JTAG operations within standard scan ("SS") state 2120. The cJTAG adapters change modes by transitioning to the configuration change ("CC") state 2210 whenever the format select register (FIG. 1A) is updated while in standard mode 2100 and a non-IEEE mode is selected. After entering the advanced mode 2200, basic cJTAG operations may be performed within advanced scan ("AS") state 2220.

Once in advanced mode 2200, any write to a register will trigger a transition to configuration change state 2210. If the write is to the format select register and results in a selection of IEEE mode, a transition back to the standard scan state takes place. Otherwise a transition back to advance scan state 2120 takes place. Other extended operations may be added to the basic cJTAG operations, and two such extended operational states are shown (background data transfer or "BDX" state 2230, and custom data transfer or "CDX" state 2240). The cJTAG adapters may be powered down after the state machines transition through the configuration state 2210 and the standard scan state 2120 and back to the power down state 2110. Further, additional modes beyond the standard and advanced modes of the preferred embodiment described may be defined, with transitions to and from these additional modes through change state 2210 implemented as described, and embodiments incorporating such additional modes are intended to be within the scope of this disclosure.

The configuration change state 2210 of FIG. 9 provides the hardware with extra time for the change in configuration necessary to support a new mode of operation to propagate and take effect. The configuration change state 2210 also provides a single, known transition point between the various modes. Although represented in FIG. 9 as single states, the states shown in FIG. 9 each represents specific transitions through multiple states of the TAP state diagram of FIG. 4. The states of FIG. 9 thus represent the overall system state, while the states of FIG. 4 represent the state of an individual TAP state machine.

The configuration change state 2210, however, is distinct from the other states of FIG. 9 in that the TAP state machine state sequences used to define configuration change state 2210 are the same regardless of the mode of operation of the system (e.g., standard mode and advanced mode). All other state transitions sequences are interpreted to indicate particular system states other than the configuration change state 2210 based not only upon the sequence through the state diagram of FIG. 4 (and thus of the TAP state machine), but based also on the mode of operation selected. Thus, a data scan that takes place in advanced mode (defined by specific state transitions of the TAP state machine as shown in FIG. 4) will result in transitions through one particular set of states within FIG. 9, but that same data scan (defined by the same specific state transitions of the TAP state machine) will result in transitions through a different set of state within FIG. 9.

Figure 10A:
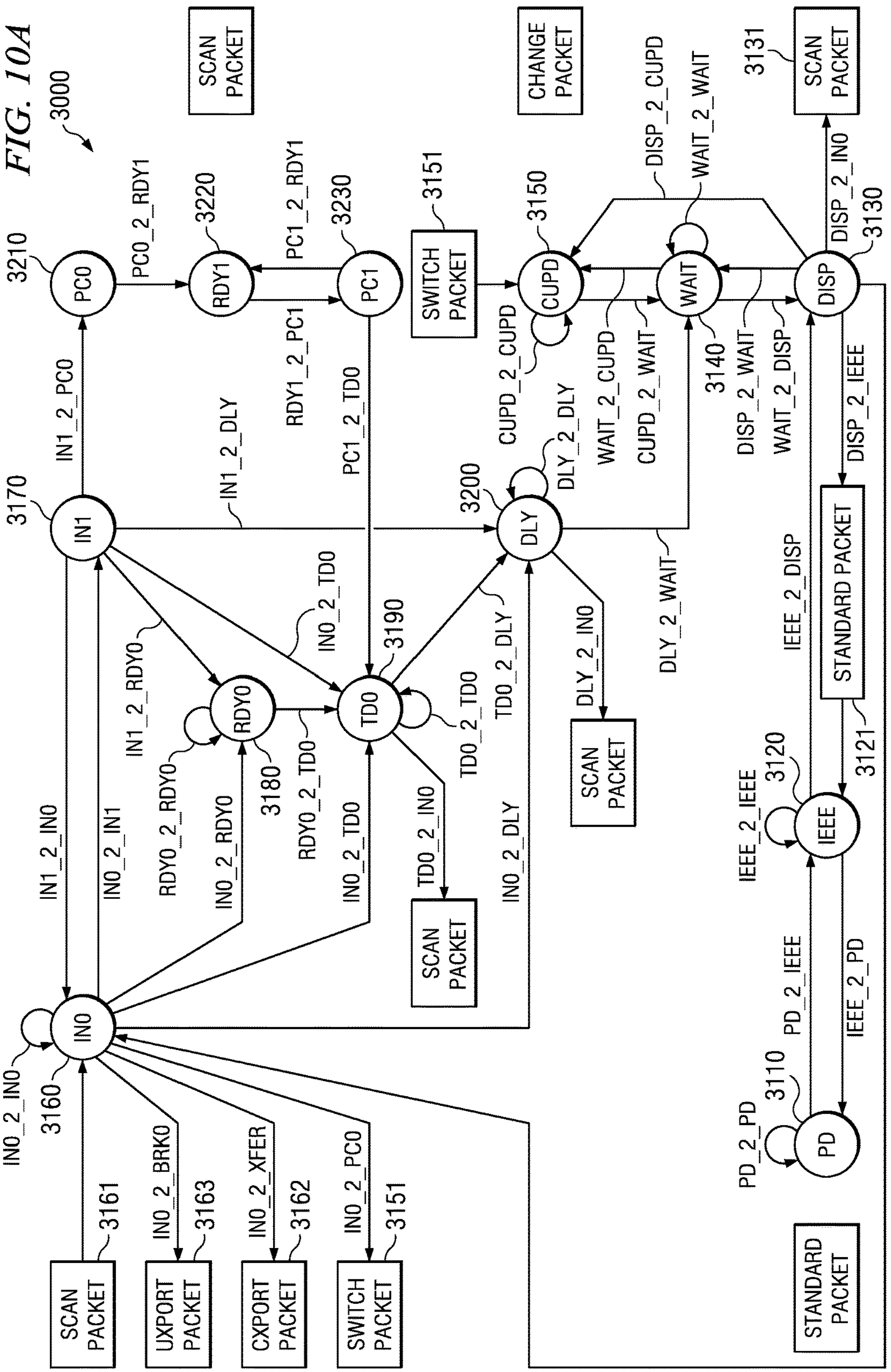
FIGS. 10A and 10B illustrate a state transition diagram for a cJTAG adapter in accordance with at least some preferred embodiments.
Figure 10B:
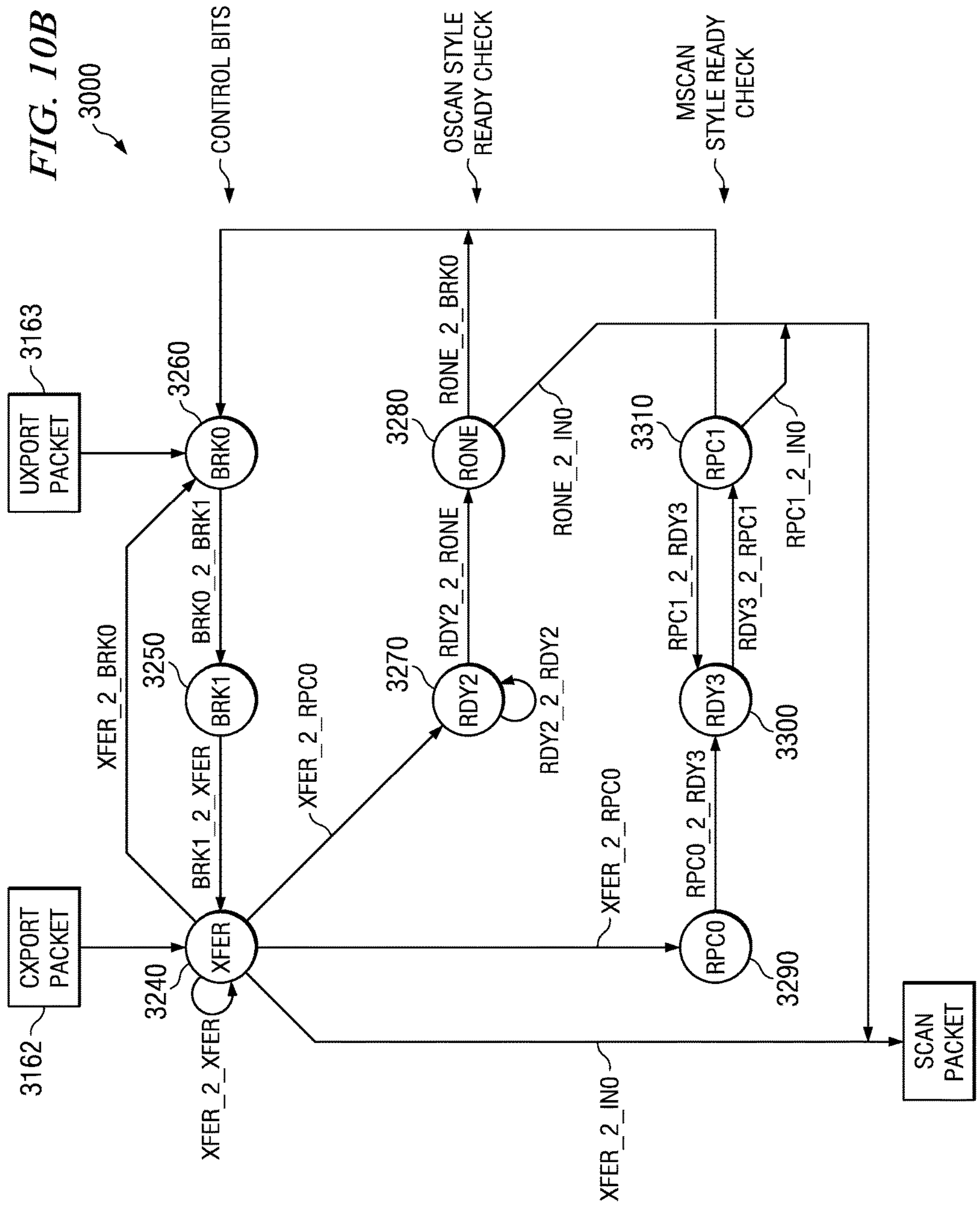

FIGS. 10A and 10B illustrate a more detailed cJTAG adapter scan state diagram 3000, in accordance with at least some preferred embodiments. Referring to FIG. 10A, the state machines of the TS cJTAG adapter 1220, for example, starts up in the power down ("PD") state 3110, transitioning to the standard mode idle ("IEEE") state 3120 after completing a power-on reset. When the TS cJTAG adapter 1220 receives a packet 3121 while in standard mode, the packet 3131 (i.e., information exchanged during one TAP state while in IEEE state) is forwarded to the TS TAP 1230 without modification by the TS cJTAG adapter 1220, and the state machine remains in IEEE state 3120. The zero-bit scans that open a command window are performed while in IEEE state 3120. Scan operations within the command window are also performed while in IEEE state 3120. If an operation specifies a change from IEEE mode to advanced mode, the interface operation must change. The packet initiating a change in interface operation from IEEE mode to advanced mode causes a transition from IEEE state 3120 to DISP state 3130, transitioning through change update ("CUPD") state 3150, wait state 3140 and dispatch state 3130, and into the advanced mode idle ("IN0") state 3160, where advance mode processing begins. This transition does not close the command window, instead only changing the operating mode. The command window is closed by TAP state activity that results from the processing of advanced mode packets.

While in advanced mode, the packet content that is expected is determined by operations performed within the command window. When a cJTAG adapter receives an advanced mode packet 3161, the state machine may transition to one of a variety of states depending on the type of packet expected, and on the TAP state associated with the expected packet. The state machine transitions through at least some of states 3170-3230 in a manner that depends on the advanced scan format specified in combination, in some cases, with the TAP state. In at least some of the preferred embodiments, the same packet format is used for all TAP states, while in at least some other preferred embodiments the packet content changes based upon the TAP state (e.g., less information is required to describe non-shift state activity, as compared to shift state activity). These scan types and their relationships to the state diagram are described in more detail below. If the packet is either a compressed export (CXPORT) packet 3162 or an uncompressed export (UXPORT) packet 3163, the state machine transitions through at least some of states 3240-3310 (FIG. 10B). These data export operations and their relationships to the state diagram are described in more detail below. If the packet is a change packet 3151 (e.g., the end of a command window indicating a change from advanced mode back to IEEE mode), the change packet is processed, transitioning again through change update state 3150, wait state 3140 and dispatch state 3130, and back to the IEEE mode idle state 3120.

As already noted, the 2-wire physical interface provided under the cJTAG architecture requires that the data transferred across 4 or more wires be sent across the interface in the form of a serialized message packet. Data that would be sent across these wires under the JTAG architecture is instead sent as individual data bits within a cJTAG message packet. An example of such a serialized message packet is shown in FIG. 11. The packet shown includes bits representing the TDI, TDO and TMS signals of the JTAG interface, as well as additional bits used to implement additional features such as interlocked communications and delays. Not all operations require all of the bits shown in FIG. 11. To avoid sending bits that are not needed for a particular operation, at least some of the preferred embodiments define a plurality of scan types, each with different packet contents depending on what bits are to be used. By varying the bits included in the packet, different levels of optimization are possible.

Figure 12A:
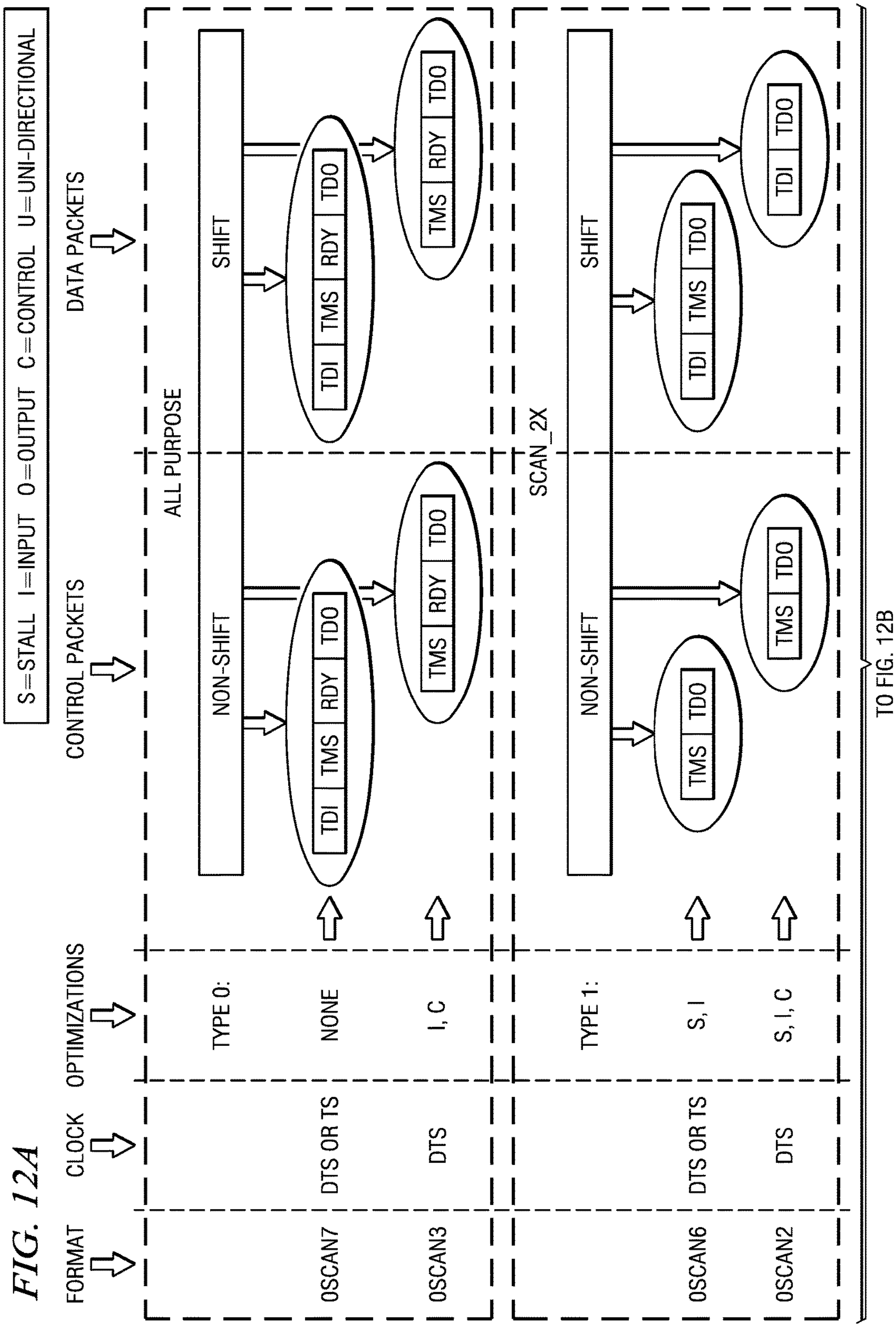
FIGS. 12A and 12B illustrate examples of several different optimized scan message formats in accordance with at least some preferred embodiments.
Figure 12B:
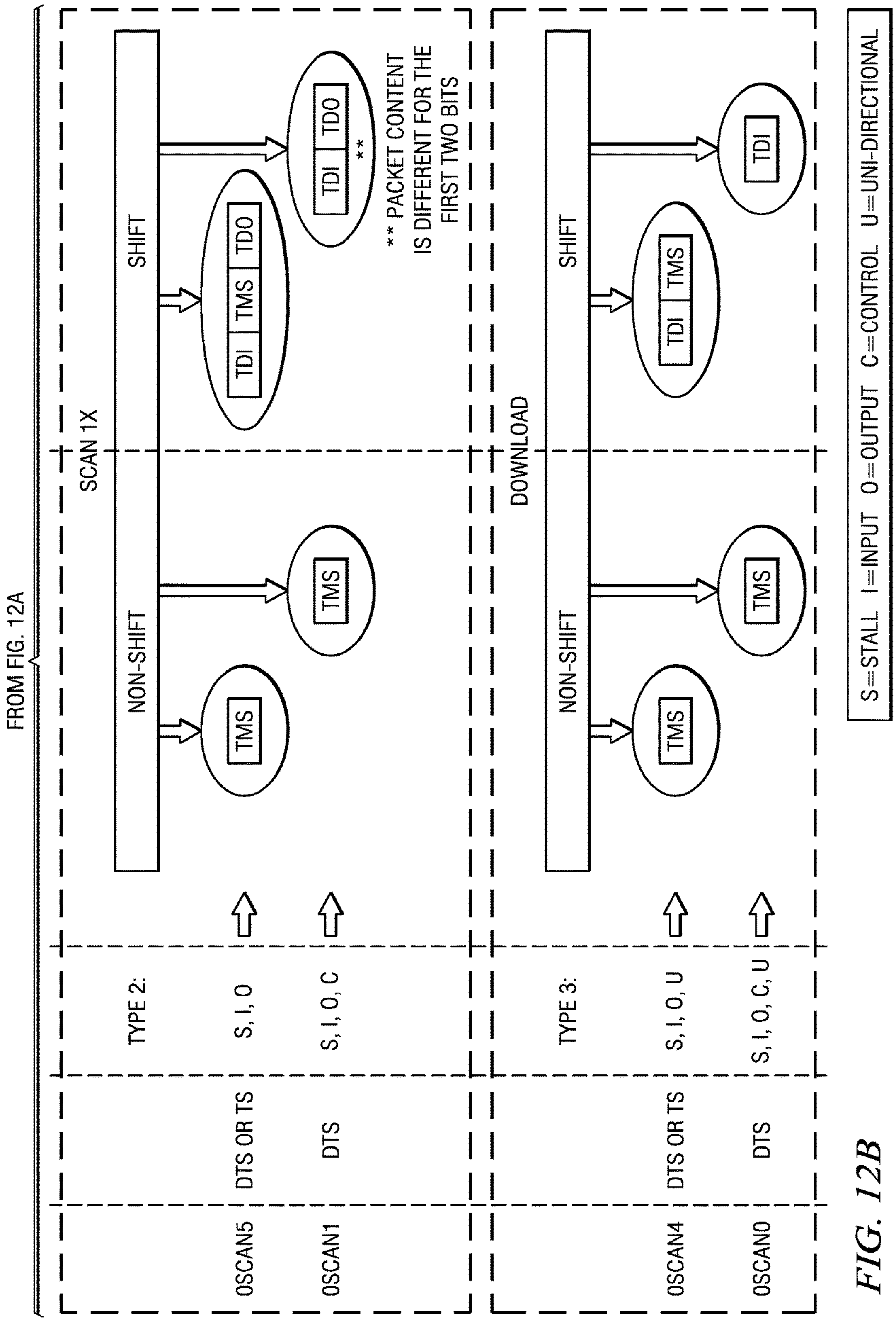

FIGS. 12A and 12B illustrate several examples of optimized scans ("OScans"), in accordance with at least some preferred embodiments. Each of the OScans shown provides different combinations of bits, and thus different levels of optimization. For each Oscan, the chart indicates whether the clock is sourced by the debug test system or the target system, which bits are eliminated when not needed, and what the resulting control and data packets look like as a result of the optimization. The decision of when to omit a bit and utilize a particular OScan is based upon the JTAG standard, which specifies which bits are needed for particular operations defined by the TAG state diagram (FIG. 4). Thus, the states through which the TAP state machine transitions for a given OScan type will depend upon the data content defined for that OScan type.

OScan7 preferably provides no optimization and includes bits representing all of the signals of the JTAG architecture, plus a "ready" bit and one or more optional delay bits. This accounts for JTAG implementations that may not have followed the JTAG architecture as defined within the IEEE standard by, for example, transferring data on TDO or TDI during operations when the standard specifies that these signals are not used. Thus, OScan7 is provided for compatibility purposes, and not to result in any actual optimization.

Each of the remaining OScans results in a reduction in the number of bits transferred. In each case a given bit can be omitted because it is not needed for a given type of transaction. If, for example, data only needs to be transferred from a target system to the debug test system, there is no need to include the TDI bit which is used to transfer data from the debug test system to the target system. Similarly, the TDO bit is not needed for transfers from the debug test system to a target system. Ready bits (described below) are not needed if the target system is fast enough to keep up with the debug test system at the full TCK clock rate. TMS is not needed for long data transfers where an end of transfer escape sequence can be used (described below).

Referring again to FIGS. 12A and 12B, Oscan6 omits the TDI and ready bits from control packets and the ready bit from data packets. OScan5 omits all but the TMS bit from control packets and the ready bit from data packets. OScan4 omits all but the TMS bit from control packets and omits the TDO and ready bits from data packets. OScan3 omits the TDI bit from control packets and the TMS bit from data packets. OScan2 omits the TDI and ready bits from control packets and the TMS and ready bits from data packets. Oscan1 omits all but the TMS bit from control packets and omits the TMS and ready bits from the data packets. OScan0 omits all but the TMS bit from control packets and all but the TDI bit from data packets. The delay bits are optional for all of these packets. Although some of the formats described may be capable of one bit per data packet, two bits per data packet is a preferred configuration, as it permits maintaining a 2-to-1 ratio between cJTAG link clock and the JTAG clock on the IEEE busses (see FIG. 1). This permits the link to continue to operate at relatively high clock rates even when the debug test system, the target system, or both are slower, legacy systems.

Figure 13:
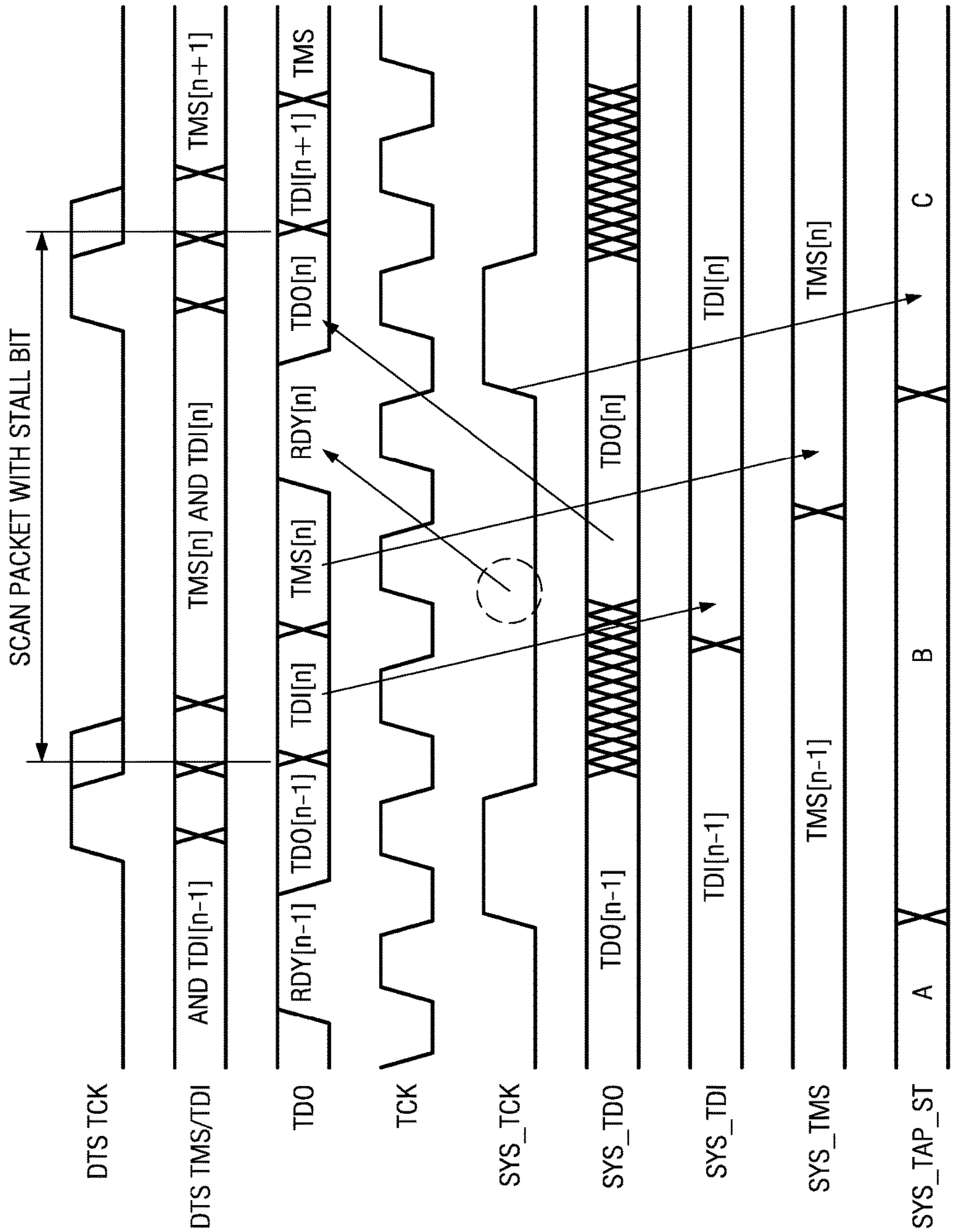
FIG. 13 illustrates the timing diagram for an example of an optimized scan without a scan stall in accordance with at least some preferred embodiments.
Figure 14:
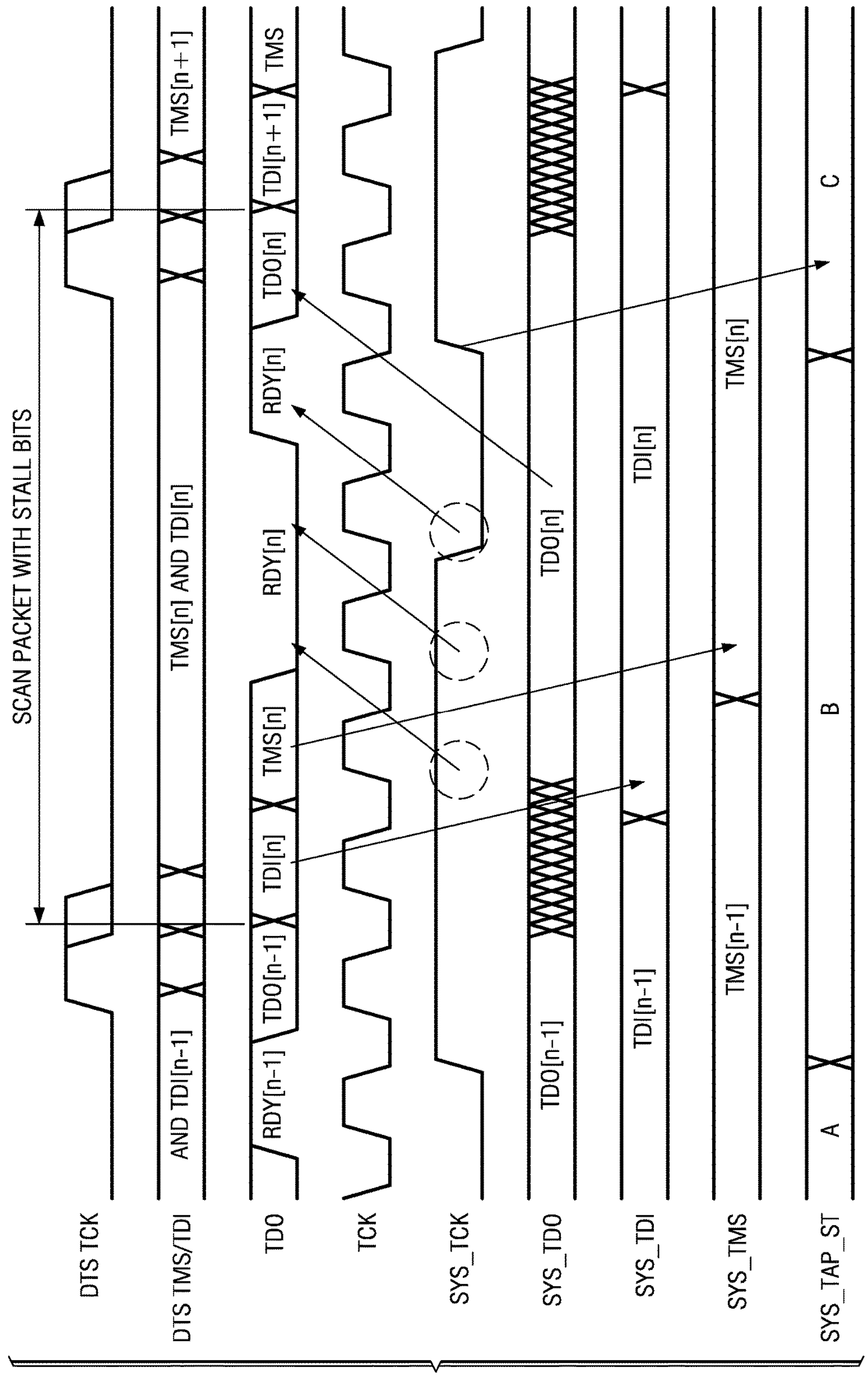
FIG. 14 illustrates the timing diagram for an example of an optimized scan with a scan stall in accordance with at least some preferred embodiments.

The OScans of the preferred embodiments also provide additional capabilities beyond the base JTAG architecture through the use of a ready bit. Because the data transferred between the debug test system and the target system in the cJTAG architecture is a serialized version of the signals defined in the JTAG architecture, it may be desirable to clock the serialized data at a higher clock rate to offset the effect of the serialization. But some target systems may not be fast enough to keep up with the higher clocking rates of the cJTAG architecture or may have limitations because of other factors, even when the interface is operated in a modified IEEE mode with a return TCK (RTCK) added to the four-wire IEEE interface. The ready bit provides a means for the target system to hold off the debug and test system and keeping it from sampling the TDO bit until the target system is ready and the TDO bit from the target system is valid. As shown in FIG. 13, if the ready bit is set, the next bit sent is the TDO bit from the target system. FIG. 14 illustrates the case where the target still stalls the debug test system. The ready bit indicates the packet may proceed, and the next bit sent is a repeat of the ready bit rather than the TDO bit. The ready bit continues to be repeatedly sent until the ready bit is cleared, at which point the TDO bit is sent from the target system to the debug test system.

In at least some preferred embodiments, the ready bit may be implemented in at least two different configurations. In the first configuration, two or more target systems may assert the ready bit. In this configuration, the TMSC signal is pre-charged by the debug and test system during the bit cycle preceding the bit cycle assigned to the ready bit. If any one of the target systems is not ready to output its TDO, that target system pulls the TMSC signal low during the ready bit time period, indicating that a stall is needed (ready not asserted). This operation of the ready bit is shown in the scan state transition diagram of the preferred embodiment of FIG. 10A. When a scan packet that includes a ready bit is received in advanced mode the state machine of a cJTAG adapter receiving the packet transitions from advanced mode idle state ("IN0") 3160, where it process the first packet bit, to the first MScan pre-charge state (PC0) 3210. The state machine then transitions to MScan ready state (RDY1) 3220, and subsequently to the second MScan pre-charge state (PC1) 3230. If the TMSC signal has been pulled low during the ready bit time period (ready not asserted), the debug and test system again pre-charges the TMSC signal and the state machine returns to MScan ready state 3220. This process repeats until the ready bit is asserted by a target system (not pulled low), causing the state machine to transition to the TDO processing state 3190, where the TDO bit is sampled and received by the debug and test system.

In the second configuration, only a single selected device is involved in the data exchange, precluding the need for a pre-charge/discharge configuration. Instead, the targets system simply drives the ready bit to the desired state. Referring again to the preferred embodiment of FIG. 10A, when a scan packet 3161 that includes a ready bit is received in advanced mode the state machine of a cJTAG adapter receiving the packet can transition from advanced mode idle state ("MO") 3160, where it process the first packet bit, to either input/output processing state ("IN1") 3170, where it would process the second packet bit if included, or to OScan ready state ("RDY0") 3180. If there is no second packet bit prior to the ready bit, the state machine can transition directly from the advanced mode idle state 3160 to the OScan ready state 3180. If the ready bit is not set, the state machine-will hold in the OScan ready state 3180. Once the ready bit is set, the state machine then transitions to the TDO processing state ("TDO") 3190, where the TDO bit is sampled and received by the debug and test system. It should be noted that because each target system of the preferred embodiments controls its own ready bit, the duration of the stall for each target system is determined by that target system, and thus each target system may stall the debug and test system for a duration of time specific to that target system (or no stall at all) without regard to the stall requirements of any other target system coupled to the debug and test system.

The OScans of the preferred embodiments may also provide for additional transmission delays through the use of delays between packets. Either a fixed or variable number of delay cycles may be introduced between the end of one packet and the beginning of another packet. FIG. 15A illustrates the transmission of a fixed delay. In the example shown, a fixed delay of two clock cycles (TCK cycles) is introduced between two scan packets. In at least some of the preferred embodiments, the duration of the clock cycles is determined by programming two bits within a cJTAG delay control register within the cJTAG adapter of the debug test system. A delay of 0, 1, and 2 clock cycles may be selected by setting the delay control bits, for example, to the binary values 00, 01, and 10 respectively, as shown in the table of FIG. 15B. Each value corresponds to the addition of 0, 1, or 2 clock cycles of delay. Thus, in the example show in FIG. 15A, the delay control register was set to a binary value of 10 (decimal 2), resulting in the two additional delay periods shown.

Figure 16B:
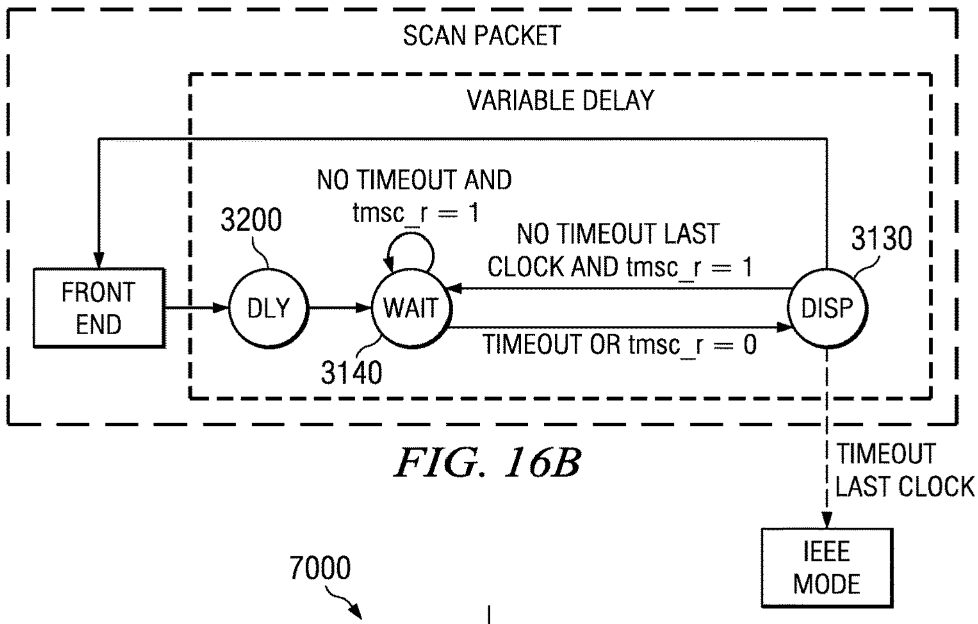
FIG. 16B illustrates the state transition diagram for extending a delay between scan messages in accordance with at least some preferred embodiments.

FIG. 16A illustrates how delays between packets that are of variable length may also be provided. In at least some of the preferred embodiments, loading a binary value of 11 into the a cJTAG register control registers enables variable delays and configures the delays between packets to be controlled by the state of the TMS bit. The sequence of events is shown in FIG. 16B, which is a simplified partial state transition diagram derived from the scan state transition diagram of FIG. 10. After the initial delay state ("DLY") 3200 is reached, the state machine of the cJTAG adapter transitions to wait state ("WAIT") 3140. As long as the TMS bit is set, the state machine will remain in wait state 3140. When the TMS bit is cleared, the state machine will transition to the dispatch state 3130 and the cJTAG adapter will then resume processing advanced mode scan packets if the TMS bit remains cleared.

In the preferred embodiments illustrated in FIGS. 15A and 16A, the data driven on the TMSC signal is the data last driven during the previous scan cycle. During the delay (fixed or variable) this data is treated as "don't care" data. In at least some preferred embodiments this data may instead be affirmatively driven by either the debug and test system or the target system with other useful information. Additional JTAG signals such as, for example, the boundary check enable (BCE) signal and the test reset (TRST) signal may be driven by the debug and test system. Other data that can be driven onto the TMSC signal during delay periods may become apparent to those skilled in the art, and all such data is intended to be within the scope of the present disclosure.

In at least some of the preferred embodiments a timeout mechanism is included that forces the state machine of FIG. 16B to reset all cJTAG control registers to their power-on reset values and return the cJTAG state machine to IEEE mode. The criteria for triggering this timeout is based on a predetermined number of consecutive clock cycles (e.g., 64 clock cycles) during which the TMS bit remains a one. If the TMS bit stops transitioning at least one of the cJTAG adapters is presumed to have stopped operating properly, warranting a reset of the cJTAG interface. As described above, variable delays are achieved by holding the TMS bit to a one. The timeout mechanism thus limits a variable delay cycle to less than the timeout clock count.

To extend the delay times that are possible, at least some of the preferred embodiments implement a delay extension mechanism, which is also shown in FIG. 16B. Assuming, for example, a timeout above 64 consecutive clock cycles, if the TMS bit is held high for no more than 64 clock cycles, thus transitioning the state machine from the wait state 3140 to the dispatch state 3130 on the 65.sup.th clock cycle, the TMS cycle may be set to a one again, sending the state machine back to wait state 3140. No timeout will occur and the delay has now been extended for up to another 64 clock cycles. This extension sequence may be repeated as many times as necessary. In at least some preferred embodiments, the timeout is set to expire above 2 clock cycles, and the TMS bit alternates between a one and a zero. Referring to the state machine of FIG. 16B, this causes successive transitions between wait state 3140 and dispatch state 3130. But because the timeout is set to expire above 2 clock cycles, a timeout will occur within one clock cycle of a failure by the TMS to transition. This allows for relatively long, and even indefinite, delay periods, while also providing a relatively quick timeout response. Other configurations may become apparent to those skilled in the art, and all such configurations are intended to be within the scope of the present disclosure.

As already noted, the purpose of the OScans is to provide a way for transmitting only that data that is needed and omitting bits of data that are not needed for a particular transaction. For bits like TDI and TDO this means not including the information within the packet. But unlike the TDI and TDO bits, the TMS bit is used to determine the state transitions that occur in both the TAP and cJTAG state machines. For OScans packets that move data (i.e., packets associated with shift states), and that include the TMS bit, the TMS bit is low in each packet until the end of the transfer, and then set high within the last packet. For OScans where the TMS bit is excluded, at least some of the preferred embodiments use an alternative mechanism that signals the end of the transfer without using the TMS bit.

Figure 17:
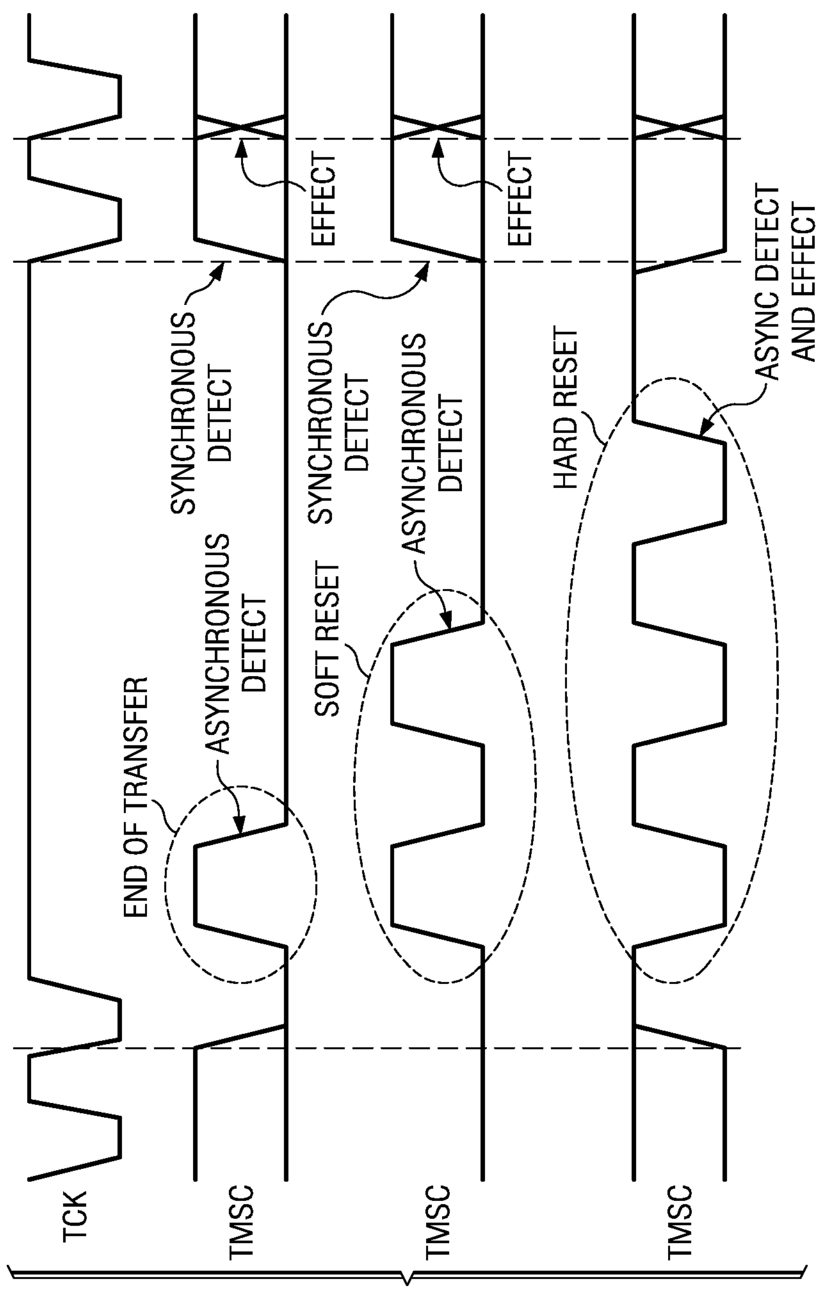
FIG. 17 illustrates the timing diagram for several escape sequences in accordance with at least some preferred embodiments.

FIG. 17 illustrates how the TCK and TMS signals are used to create an end-of-transfer escape sequence that is detectable by a cJTAG adapter but has no effect on a JTAG TAP state machine. In the preferred embodiment of FIG. 17, serialized data is transferred between the debug test system and the target system using the TMS signal and clocked between the systems using the TCK signal. At the end of an OScan that omits the TMS bit within the packet transferred, the TCK signal is held high by the DTS cJTAG adapter, which keeps any TPA state machine that is coupled to the TMS and TCK signals from transitioning states. The TMS signal is then subsequently set to the inverse of its last state by the DTS cJTAG adapter, and then pulsed while the TCK signal continues to be held high. A TS cJTAG adapter coupled to the TMS and TCK signals counts the pulses. After the pulsing completes, the TMS signal is returned to its initial value at the start of the escape sequence and the clock is restarted. One clock cycle later, the escape sequence takes effect. Although the escape sequence of the preferred embodiment described uses the TMS signal for transferring data, any other non-TCK signal may be used, as well as any other combination of signals other than TMS and TCK, and the present disclosure is intended to encompass all such embodiments.

As illustrated in FIG. 17, the escape sequences of the preferred embodiments can be used for purposes other than just an end-of-transfer indication. Both a soft reset and a hard reset are shown. Each uses a different number of pulses to indicate which function is desired. Further, the hard reset sequence does not require that the clock resume, allowing a full reset of the cJTAG link even after a failure of the clock to resume. Many other functions can be added by adding additional pulse counts, and the present disclosure is intended to encompass all such functions. Within at least some of the preferred embodiments, any additional functions would be implemented with a lower pulse count than soft and hard reset. In this way hard reset always requires the highest pulse count and would be triggered without having to restart the clock and also would be triggered if the TMS signal gets stuck in a continuous toggle.

As described above, both soft and hard reset escape sequences are implemented in at least some of the preferred embodiments. A soft reset escape sequence is used to place an offline cJTAG adapter back online. The soft reset escape sequence is ignored unless the cJTAG adapter is operating in advanced mode and is in a state that allows a soft reset. A soft reset escape sequence is allowed immediately after a register write while in advanced mode, and anytime if the cJTAG adapter has been placed offline by enabling an unsupported feature. The soft reset places the cJTAG adapter into IEEE mode, deselects the cJTAG adapter, and closes any open command windows, but does all this without re-initializing any other part of the cJTAG adapter. A hard reset escape sequence provides the same functionality as a JTAG test reset or a JTAG boundary compliance enable. A hard reset asynchronously changes the system state in either IEEE mode or advanced mode. A hard reset may be generated independent of the cJTAG adapter state. In at least some preferred embodiments, a hard reset is never ignored.

As illustrated in FIGS. 12A and 12B, different OScans are used depending on the source of the clock signal used for the cJTAG link. OScans 0-3, for example, are not allowed if the target system sources the clock. This is due to the fact that the data packets for these OScans do not include the TMS bit, and thus require the use of an end of transfer escape sequence. In order for the debug test system to signal the end of transfer, the debug test system must control the clock. In at least some of the preferred embodiments the DTS cJTAG adapter can check a register within the cJTAG adapter to determine the currently configured clock source. The contents of this register are determined upon initial power up of the system. Upon power-on reset, the debug and test system initially maintains the TCK and TMSC signals tri-stated. Thus, until these signal are enabled, any activity on the part of the debug and test system does not affect any target systems to which the debug and test system is coupled. This allows the debug and test system to sequence through any states required for to determine its own configuration and to properly initialize itself. Once properly initialized, the debug and test system can selectively enable the TCK and/or TMSC signals to determine if there are target systems driving the clock signal, thus allowing the debug and test system to store in the register the clock source configuration. If an OScan is requested that requires that the debug test system source the clock, but the target system is configured to source the clock (based on the detected and saved configuration), a compatible OScan will be used instead (i.e., one of OScans 4-7), regardless of the OScan that is requested. It should be noted that although the above preferred embodiments are described from the perspective of the data and test system, the target system of at least some preferred embodiments is also capable of making such a determination of the clock configuration and of adjusting the OScan format used according to the source of the clock.

The debug and test system of at least some preferred embodiments may also selectively enable other signals, such as TDI and TDO, and based upon the response of one or more target systems, as detected by the debug and test system, the topography of the system (e.g., series, wide star, or narrow star) can be determined. For example, if the debug and test system leaves TDI tri-stated, but detects that it is at a logical 0 level (pulled low) then system is in a two-wire configuration which means that there are not JTAG devices (i.e., two-wire narrow star configuration). A variety of bit sequences may be output by the debug and test system on the various signals of the link 1300 coupling the debug and test system 1100 and one or more target system (e.g., target system 1200) of the preferred embodiment of FIG. 1. The response by the target systems, as detected by the debug and test system eventually allow a determination of the topology of the system. Sequences may be selected such that a response corresponding to each configuration is expected. If an expected response is not received to a bit sequence corresponding to one configuration, another sequence corresponding to another configuration is attempted. This process is repeated until the configuration is identified. If no matching configuration is identified, the interface is declared inoperative. Many different bit sequences and signal selections are possible to this end, and all such sequences and selections are intended to be within the scope of the present disclosure.

Another extension to the JTAG architecture added by the cJTAG architecture of at least some of the preferred embodiments is the ability to select and de-select cJTAG systems without affecting JTAG target systems that are also present in the system. A cJTAG target system can be de-selected by placing the target system in global bypass mode. In global bypass mode the cJTAG adapter halts the clock provided to the target system TAP, which prevents the TAP state machine from changing state until re-selected. The cJTAG global bypass mode is similar to the JTAG bypass mode in that all data is routed through the 1-bit global bypass register, as show in FIG. 18, until it is again selected. But unlike the JTAG bypass mode, global bypass mode also results in all instructions being routed through the 1-bit global bypass register as well.

Selection of a cJTAG target system is a two-step process that includes a pre-selection of the desired cJTAG target systems, followed by activation of the pre-selections 1 clock cycle after entry by the target system TAP into the run-test/idle state (see FIG. 6A). As previously noted, de-selection of a target system blocks the clock signal to the target system TAP. The TAP, which is left in the run-test/idle state after de-selection, does not sequence any further after de-selection because it is no longer receiving a clock signal. By splitting the selection into a pre-selection that blocks the clock, followed by activation of the pre-selections which re-enable the clock, multiple target systems may be pre-selected in sequence, followed by a single activation that triggers all the pre-selects together. The pre-selects will all go into effect 1 clock cycle after the activation. The effect is to create a global selection of multiple target systems coupled to a single port of the test data system. Although the above description is in the context of a global selection, this same process may be used to implement a variety of global commands, and all such global commands are intended to be within the scope of the present disclosure.

Global selection of multiple target system can be expanded to operate across multiple ports. In at least some preferred embodiments, the debug test system may have multiple cJTAG ports that each couple to multiple target systems. In such preferred embodiments, the ports may be enabled and disabled through a single control register within the debug test system. After the target systems of a port are de-selected, the port itself is disabled. Each port is then enabled in sequence, and while enabled the above described pre-select sequences are performed on one or more target systems. After pre-selects of the desired target systems have been performed on one port, but before activation, the port is disabled as a second port is enabled. The pre-selection process is then repeated for target systems coupled to the second port, and then again for each successive port. Once all ports have been processed and all the desired target systems on all ports are pre-selected, the ports are all enabled together and all of the target systems are activated at once. The effect is to create a global selection of multiple target systems coupled to multiple ports of the debug test system. As before, although the above description is in the context of a global selection, this same process may be used to implement a variety of global commands, and all such global commands are intended to be within the scope of the present disclosure.

In at least some of the preferred embodiments, as previously noted, a debug test system may be coupled to one or more target systems in either a serial or star configuration. In the series configuration shown in FIG. 2B, both JTAG and cJTAG target systems may be present. The commands used to select a cJTAG target system (pre-selection and activation) in a series configuration are advanced mode commands that are ignored by JTAG target systems as no-ops. Advanced mode commands may also be used to perform a global select of the cJTAG target systems. This is accomplished by designating one of the advanced mode commands for this purpose, which when received by a cJTAG target system causes it to treat the next advanced mode command as selection information, even if the cJTAG target system is in a bypass or global bypass mode. The information thus provided determines with cJTAG target systems are selected, and which are not selected.

Figure 19:
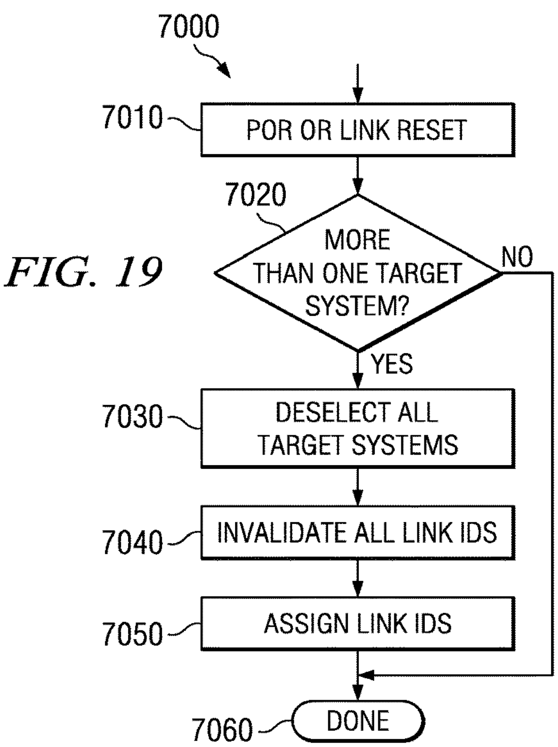
FIG. 19 illustrates a method for assigning link IDs within a cJTAG enabled system in accordance with at least some preferred embodiments.

In the star configurations shown in FIG. 2B, all of the target systems must be cJTAG target systems. In order to address cJTAG target systems in a star configuration, each cJTAG target system must have a unique adapter ID that allows it to be accessed exclusively at a given point in time. To accomplish this, at least some of the preferred embodiments utilize a 4-bit link identifier which is dynamically assigned by the debug test system to each target system. FIG. 19 illustrates how an ID is assigned to each cJTAG target system. The assignment method 7000 begins with either a power-on reset or a reset of the link coupling the debug test system and target systems to each other (see Wide Star configuration, FIG. 2B), as shown in block 7010. In this state each target system defaults to a link ID of 0, blocks link ID assignment by setting its individual scan status to zero, forces the use of Multi-device Scans ("MScans"), and becomes de-selected. If there is only one target system coupled to the debug test system (block 7020), no ID assignment is necessary and the ID assignment method 7000 is done (block 7060). Operation may begin by selecting the target system with ID zero, and by using MScans (described below) to access the target system.

If there is more than one target system (block 7020) then all of the target systems are de-selected (block 7020) and the link IDs of all of the target systems are invalidated by setting the scan status of each target system to one (block 7030). In at least some of the preferred embodiments the de-selection and invalidation blocks are implemented with advanced mode command sequences that use commands such as those listed in FIG. 8B. Referring again to FIG. 19A, once de-selection and invalidation are complete, ID assignment can proceed (block 7050), completing the method 7000 (block 7060).

Figure 20:
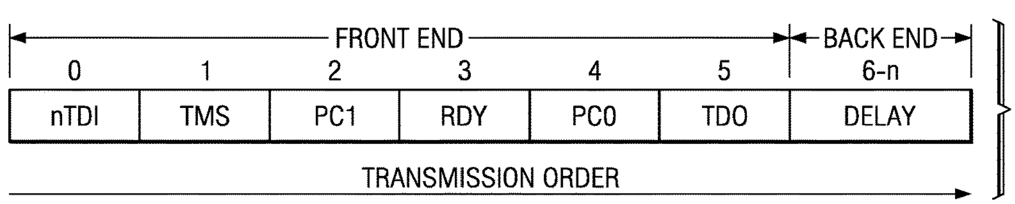
FIG. 20 illustrates an example of a multi-device scan message format in accordance with at least some preferred embodiments.

As already noted the target systems initially are forced to use MScans. FIG. 20 illustrates the basic data format for an MScan message. Though very similar to the previously described OScan7 message format, the MScan has two additional bits, pre-charge bits 0 and 1 ("PC0" and "PC1"). The ready and TDO bits of at least some of the preferred embodiments are driven by the target systems. But in the star configuration, with multiple target systems coupled to a single debug test system, it is possible for multiple target systems to sometimes attempt to output the ready ("RDY") or TDO bits at the same time, creating a signal conflict on the TMS signal line. To prevent this conflict, the target systems drive the TMS signal line with the ready and TDO bit information using a pre-charge/discharge signal drive configuration, together with bus-keeper latches, when using MScans.

Figure 21:
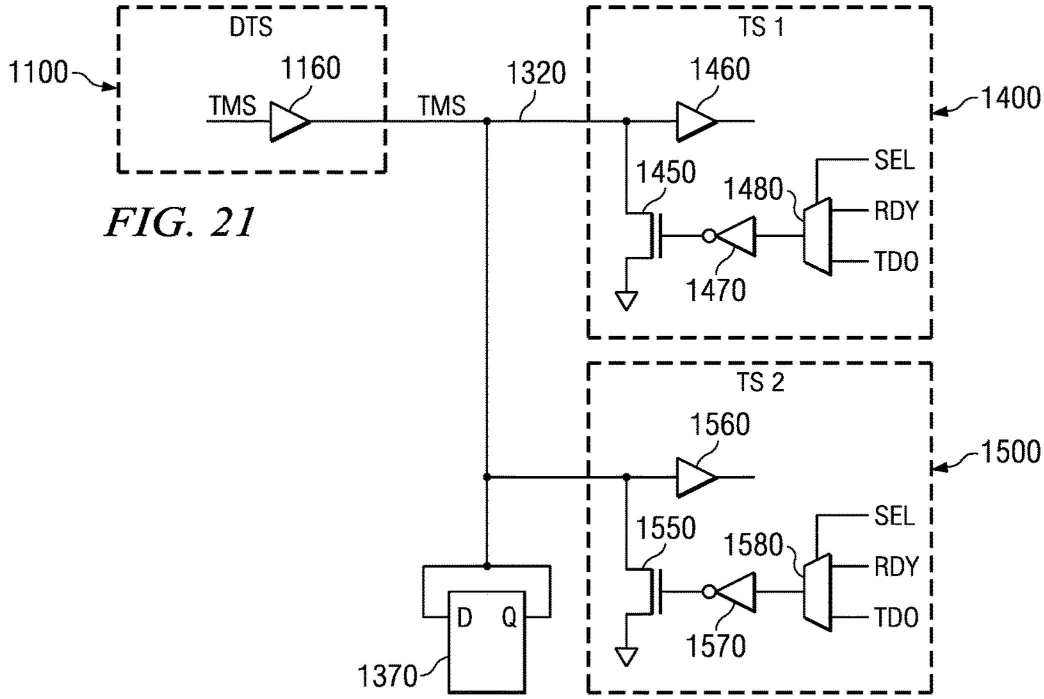
FIG. 21 illustrates a circuit used to allow target system isolation for later link ID assignment in accordance with at least some preferred embodiments.

FIG. 21 illustrates the hardware configuration used to prevent bus conflicts on the TMS signal line 1320 together with the MScan format. Referring to both FIGS. 20 and 21, the pre-charge one ("PC1") bit, which is always a binary one, is output by the DTS TMS driver 1160 and loaded into keeper latch 1370. A keeper latch is a latch with an output driver that is significantly weaker than other output drivers coupled to the same signal as the input and output of the keeper latch 1370. When DTS TMS driver 1160 outputs a signal, it will overcome the drive of the keeper latch 1370, if they are driving opposite states, and keeper latch 1370 will change state accordingly. In the absence of any drive on the TMS signal line 1320 output driver 1160, keeper latch 1370 will maintain or "keep" the latched bit driven on the signal line. During the TDO bit cycle time, if either target system 1 ("TS 1") or target system 2 ("TS 2") outputs a TDO value of zero, the corresponding pull-down gate (1450 or 1550) will drive the TMS signal line 1320 low, causing keeper latch 1370 to also change to a zero. If neither target system drives TMS signal 1320 to a zero, it will remain in the kept state, which is the logical one driven onto TMS signal 1320 during the PC1 bit cycle. This same mechanism is also used with the ready bit, in combination with the pre-charge zero ("PC0") bit.

Figure 23:
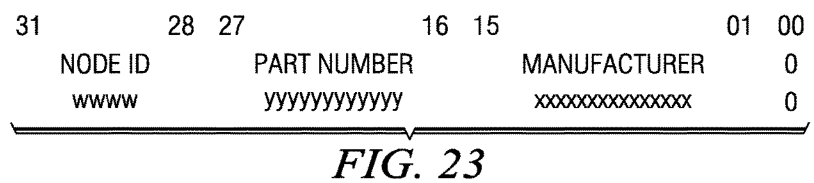
FIG. 23 illustrates an example of a format for a unique cJTAG isolation pattern in accordance with at least some preferred embodiments.
Figure 22A:
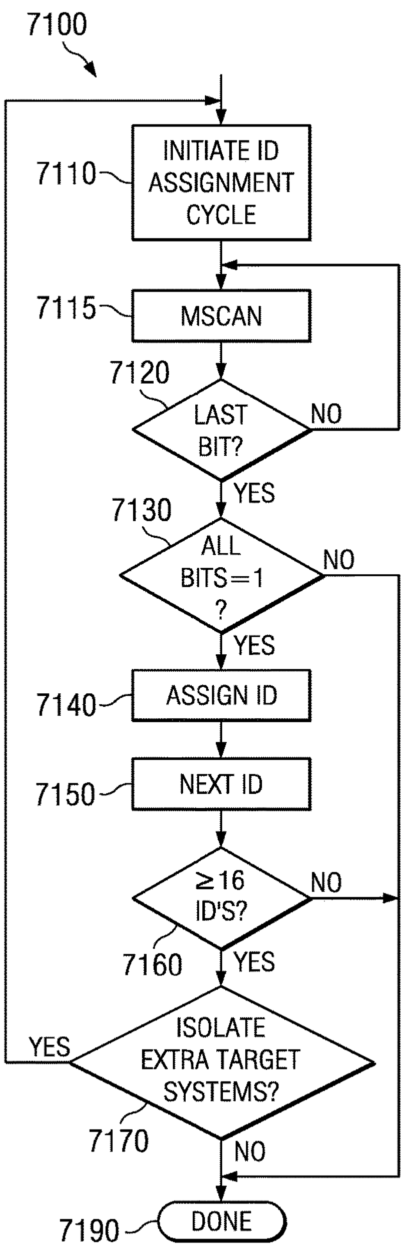
FIG. 22A illustrates a method implemented in a debug test system for assigning link IDs in accordance with at least some preferred embodiments.

By taking advantage of the "wire-OR" configuration of TMS signal 1320 and the MScan format, individual target systems may be isolated and subsequently assigned a unique link ID. FIG. 22A illustrates a debug test system ID assignment method 7100, in accordance with at least some preferred embodiments. After sending an advanced mode command sequence to all coupled target systems to initiate an assignment cycle (block 7110), the debug test system begins initiating a series of MScans (block 7115) in which one or more of the target systems output bits from a unique isolation pattern. An isolation pattern is a unique identification number associated with each target system. FIG. 23 illustrates an example of an isolation pattern, in accordance with at least some preferred embodiments, comprising a node ID, a part number, a manufacturer's ID, and a zero for the last bit. The part number combined with the manufacturer's ID and the last bit (set to zero) is a 28-bit identifier that is sometimes referred to as the JTAG ID. The 4-bit node ID provides a means for identifying a target system when two target systems have the same JTAG ID. Other techniques for generating unique isolation patterns for each target system will become apparent to those skilled in the art, and the present disclosure is intended to encompass all such techniques.

The debug test system waits for the last MScan bit of the isolation pattern to complete (block 7120) and then checks to see if all bits including the last bit are a one (block 7130). If all bits are a one, the pre-charge has not been pulled down by any of the target systems, all have been assigned a link ID, and the assignment method 7100 has completed (block 7190). Otherwise a target system has pulled down the pre-charge of at least one bit, has been isolated, and the debug test systems assigns a link ID to the isolated target system (block 7140). The debug test system then increments the link ID (block 7150) and checks to see if the link ID equals or exceeds 16 (block 7160). If so, more than 16 link IDs have been assigned. The debug test system then checks to see if it is configured to continue to isolate the additional target systems coupled to the debug test system (block 7170). If more than 16 target systems are coupled to the debug test system, it may become necessary for at least some of the target systems to share link IDs. If the debug test system is configured to share IDs, the extra target systems may optionally be isolated as well so that additional processing may be performed later to share link IDs between two or more target systems (described below).

Figure 22B:
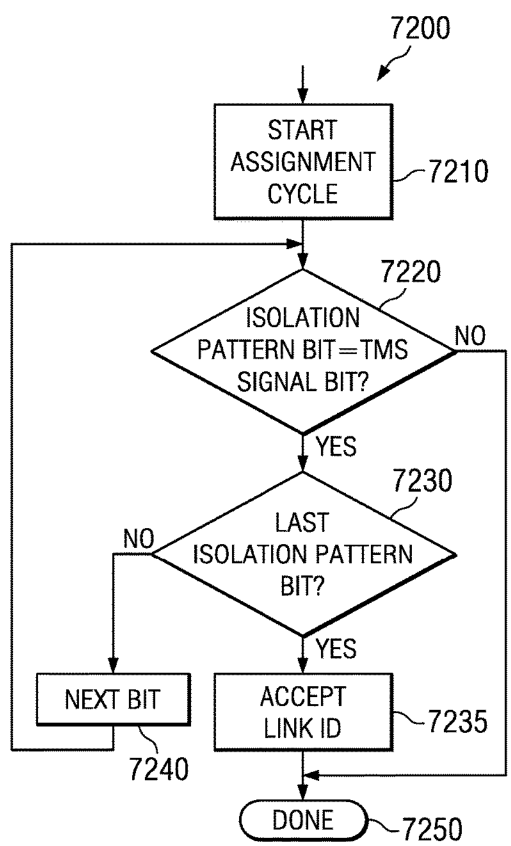
FIG. 22B illustrates a method implemented in a target system for assigning link IDs in accordance with at least some preferred embodiments.

FIG. 22B illustrates a target system ID assignment method 7200 corresponding to the debug test system assignment method 7100, and in accordance with at least some preferred embodiments. After an assignment cycle has been started (block 7210) and MScans are being generated, the target system begins outputting each bit of its assigned isolation pattern during the TDO bit period of each MScan. If the target system detects a discrepancy between the TDO bit value output by the target system and the binary value present on the TMS signal line (block 7120) for any given bit of the isolation pattern, the target system will exit (block 7250) and cease participating in the current ID assignment cycle. If the binary value present on the TMS signal line matches the TDO bit value output by the target system, the target system checks to see if the current bit is the last bit of the isolation pattern (block 7230). If the current bit is the last bit, then the target system has been isolated and is assigned a link ID (block 7135), and the current assignment cycle ends (block 7250). Otherwise the next bit is output (block 7240) and the process is repeated for each bit (e.g., 32 bits in at least some preferred embodiments).

As already noted, it is possible to have more target systems coupled to the debug test system in a star configuration than can be accommodated directly by the bit-width of the assigned link IDs. In at least some of the preferred embodiments, default link IDs may be assigned at power-on reset up to the maximum available, or may be assigned after power-on reset through a link ID assignment process that allows for sharing of link IDs. Sharing is accomplished by determining the number of target systems coupled to the debug test system, invalidating the link IDs of, and selectively de-selecting, some target systems while expressly assigning link IDs to the remaining target systems, such that the total number of assigned link IDs never exceeds the maximum number of available link IDs. To accomplish such an express ID assignment, a command level is defined for at least some of the preferred embodiments wherein the target systems are blocked from outputting the TDO bit (e.g., command levels 3, FIG. 8A). During an assignment cycle, the debug test system acts as a surrogate for the target system expressly being assigned a link ID, and outputs the isolation pattern of behalf of the target system. By outputting the target system's isolation pattern, the desired target system will be the system remaining at the end of the ID assignment cycle, expressly forcing the assignment of the link ID to the desired target system.

As already noted once all the available IDs have been assigned, the debug test system can detect that there are still additional target systems requiring a link ID. By going through additional assignment cycles, the debug test system can count the number of target systems in excess of the available link IDs. Further, the isolation patterns for the "extra" adapters may be saved for future use in resolving the link ID shortage (e.g., by using the sharing scheme described above). In at least some of the preferred embodiments, a single link ID is used over and over again upon initial assignment, and all of the adapters share that common ID until the debug and test systems changes or invalidates the ID.

The cJTAG adapters of at least some preferred embodiments are also capable of supporting non-scan data transfers between the debug test system and one or more target systems. These background data transfers (BDX) take advantage of the time that the target system TAPs spend in one of several BDX-supporting states such as, for example, the run-test/idle, pause_DR, and pause_IR states (see FIG. 4). The transfer substitutes BDX information in lieu of the scan packet normally associated with a target system TAP state. A background data transfer may be enabled by a control register write performed after the target system has been in the BDX-supporting state for at least one scan packet cycle associated with the supporting TAP state. Once a background data transfer has started, the target system TAP state is advanced by each background data transfer. The selected target system transfers data while unselected target systems transition through the same states as the target system transferring data, but without actually participating in the transfer. This keeps the TAP states of the target systems synchronized. The background data transfer is terminated upon exit from the supporting state. Data may be transferred exclusively in one direction (to the target system, or to the debug test system), or alternately in both directions (bidirectional transfer). The bandwidth allocation of a bidirectional transfer in at least some of the preferred embodiments is 50/50, but other allocations are possible and all such allocations are intended to be within the scope of the present disclosure.

Figure 24:
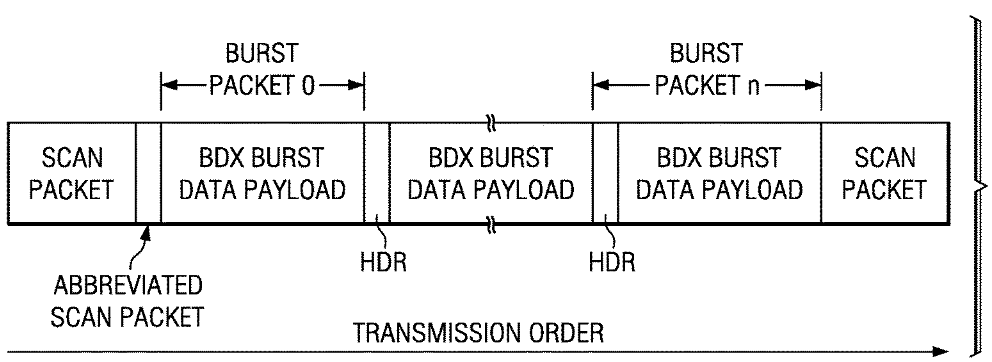
FIG. 24 illustrates an example of a burst background data transfer message format in accordance with at least some preferred embodiments.
Figure 25:
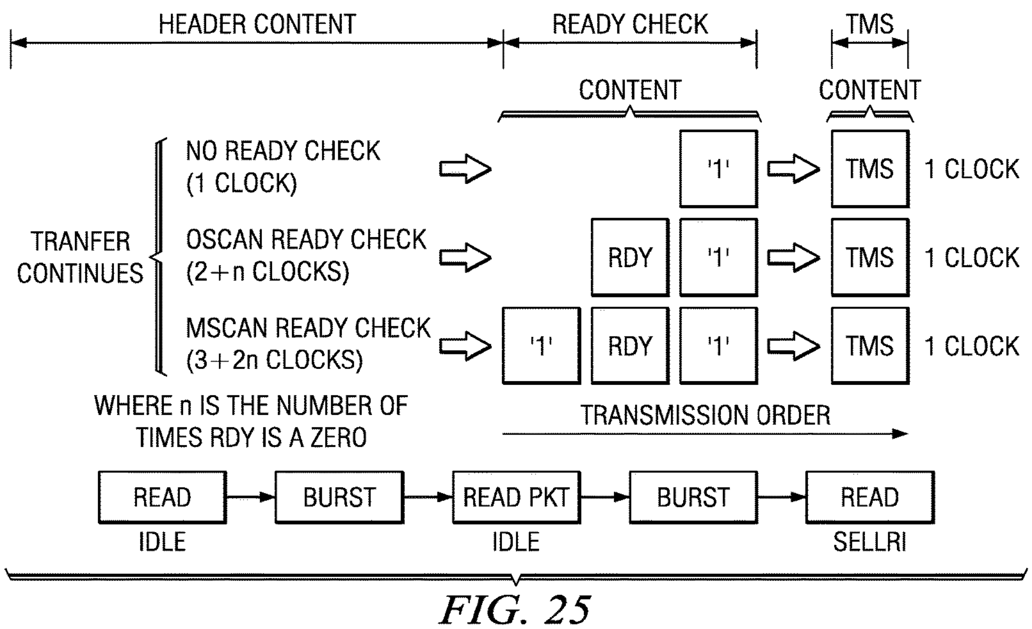
FIG. 25 illustrates an example of a burst background data transfer message header in accordance with at least some preferred embodiments.

Two types of background data transfers, burst and continuous, are defined for at least some of the preferred embodiments. FIG. 24 illustrates the format of a burst background data transfer. As shown, the first burst packet of a newly activated transfer skips the header and begins with an abbreviated scan packet followed by burst data packets. Subsequent packets include the header, which is formatted depending on the scan format in effect prior to activating the background data transfer. FIG. 25 illustrates several different header configurations, in accordance with at least some preferred embodiments, as well as the association between the header configurations and the cJTAG scan formats. When scan formats that support the use of scan stalls or delays are in use, the background data transfer will also support such stalls and delays using the same mechanisms as those defined for the scan format. Although the burst data packets of the preferred embodiments are of fixed bit sizes (e.g., 8, 16, 32, or 64 bits), other bit widths may be used and the present disclosure is intended to encompass burst packet sizes of all such bit widths. Other preferred embodiments may insert advanced mode packets (e.g., MScans and OScans) instead of the headers illustrated in FIGS. 24 and 25.

It should be noted that the TMS bit of the burst background data transfer header is driven by the debug test system, while the bits associated with the ready check, are driven by the target system participating in the transfer. This is done in order to protect against a disconnect of the TMS signal between the debug test system and the target systems. Referring to FIG. 21, if such a disconnect occurs, the logic "1" driven by the active target system at the end of the ready check sequence of the BDX header will be maintained by keeper latch 1370. As a result, when the debug test system fails to drive the TMS bit to a logic "0," TMS will be seen as a logical "1," the target system TAP state machines of all the target systems will exit the BDX-supporting state, and the background data transfer will end. Further, because a logical "1" continues to be present on the TMS signal 1320, the target system TAP state machine of all the target systems will eventually sequence back to the test-reset/idle state (see FIG. 4), which causes the target system's TAP to revert to a known, stable state, thus providing TAP synchronization in the event of a disconnect. This will only happen, however, if the target system is sourcing the clock, or if the debug test system is sourcing the clock and has not also been disconnected from the target systems.

Figure 26:
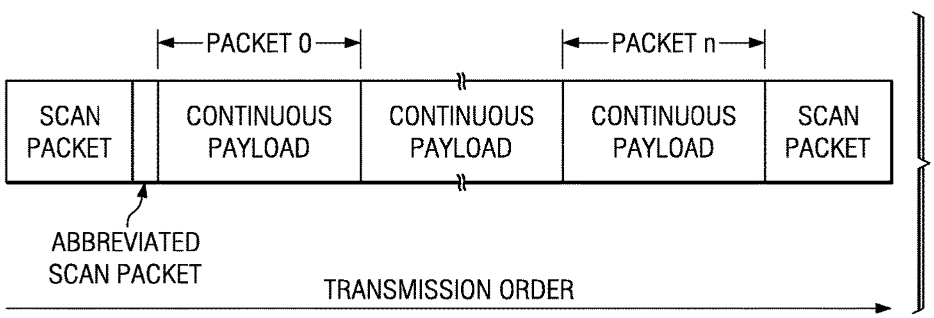
FIG. 26 illustrates an example of a continuous background data transfer message format in accordance with at least some preferred embodiments.

FIG. 26 illustrates the format of a continuous background data transfer. Unlike burst background data transfers, continuous background data transfers do not have any header information, and the data is simply a two-bit payload, although it is intended that the present disclosure encompass any size payload for continuous background data transfers. Continuous background data transfers are ended using the end of transfer escape sequence previously described. Because continuous background data transfers do not use headers, stalls and delays are not supported during these transfers. As a result, at least some of the preferred embodiments will force a selected continuous background data transfer to be executed as a burst background data transfer if the format in effect upon activation of the background data transfer requires scan stalls. Burst background data transfers will also be forced if the target system is the source of the clock, and also if the scan packets are configured with delays between packets.

Figure 28:
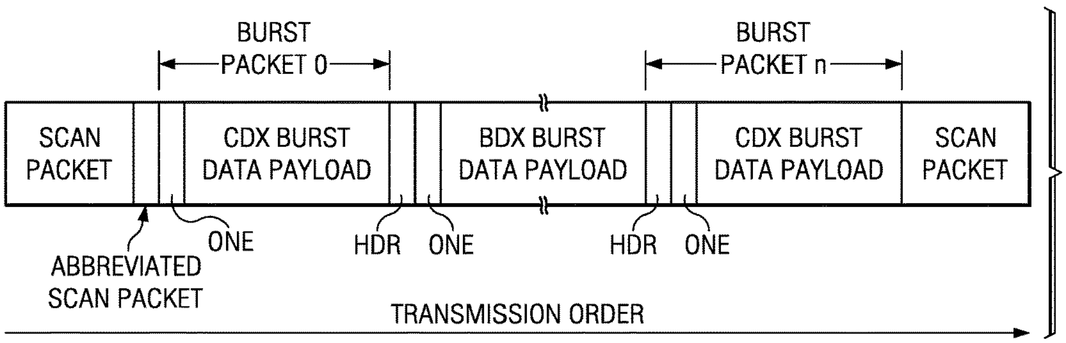
FIG. 28 illustrates an example of a burst custom data transfer message format in accordance with at least some preferred embodiments.
Figure 29:
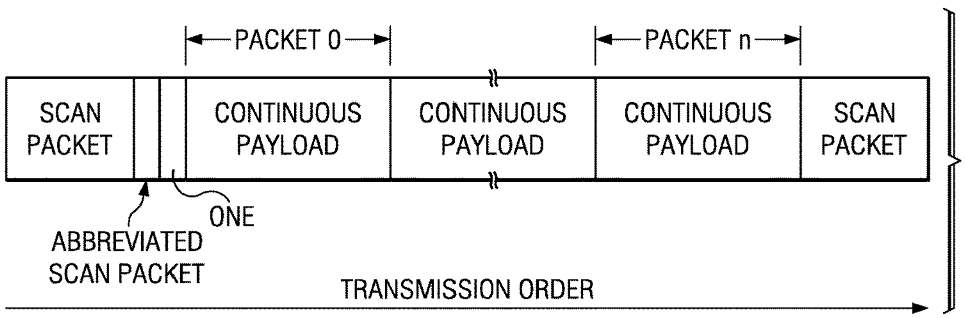
FIG. 29 illustrates an example of a continuous custom data transfer message format in accordance with at least some preferred embodiments.

The cJTAG adapters of at least some preferred embodiments are also capable of supporting non-scan data transfers between the debug test system and one or more target systems using non-cJTAG hardware and protocols incorporated into the cJTAG adapters. As shown in FIGS. 28 and 29, these custom data transfers (CDX) are similar to background data transfers, differing only by the inclusion of an extra bit preceding each of the burst payload packets and the first continuous payload packet. This extra bit is always a one and accounts for the case where neither the CDX hardware of the debug test system, nor of any the target systems, starts to transfer data after activation of the continuous data transfer. The system recovers in a manner similar to the TMS signal disconnect case described above for background data transfers. In all other respects continuous data transfers operate in the same manner as background data transfers. As with BDX transfers, other preferred embodiments of CDX transfers may use advanced mode packets (e.g., MScans and OScans) in place of the headers illustrated in FIG. 28.

Figure 30:
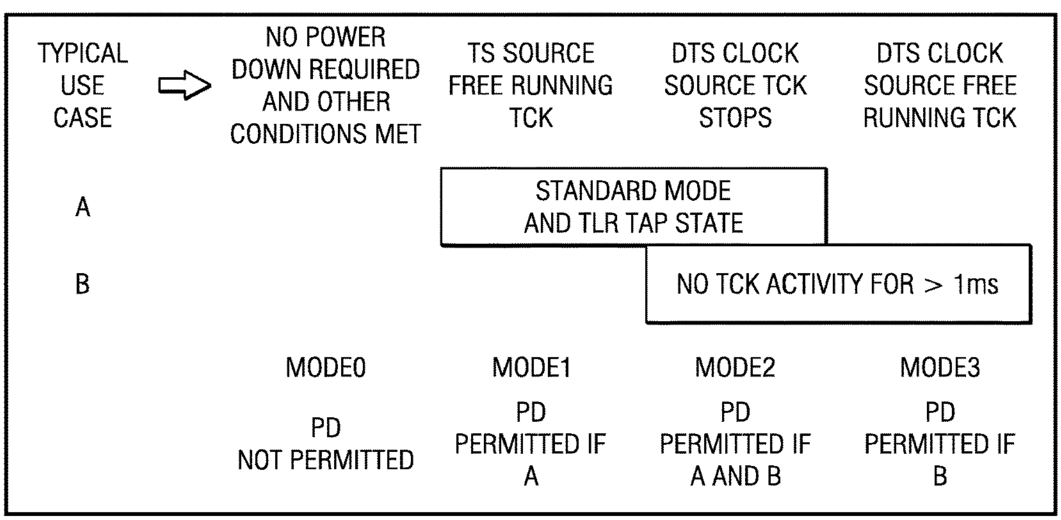
FIG. 30 illustrates an example of power down modes.

The cJTAG architecture has the added capability of configuring parts of the cJTAG interface of the target system to be powered-down under selected conditions. FIG. 30 illustrates some of the conditions under which such a power-down is allowed by at least some of the preferred embodiments. Four power-down modes are defined and the power-down mode is selected either at power-on reset or after power-on reset by reprogramming the adapter using a software command. The four modes include not permitting a power-down when requested (mode 0) regardless of mode, permitting a power-down when requested if the state machine of the target system cJTAG TAP is in the test logic reset ("TLR") state (mode 1) while in standard mode, permitting a power-down if the state machine of the target system cJTAG TAP is in the test logic reset state while in standard mode and there has been no link clock (TCK) activity for more than 1 millisecond (mode 2), and permitting a power-down based only on the lack of a link clock for more than 1 millisecond in both standard and advanced mode (mode 3). Although the preferred embodiment shown in FIG. 30 uses a 1 millisecond inactivity period, other inactivity periods are possible and are intended to be within the scope of the present disclosure.

Figure 31:
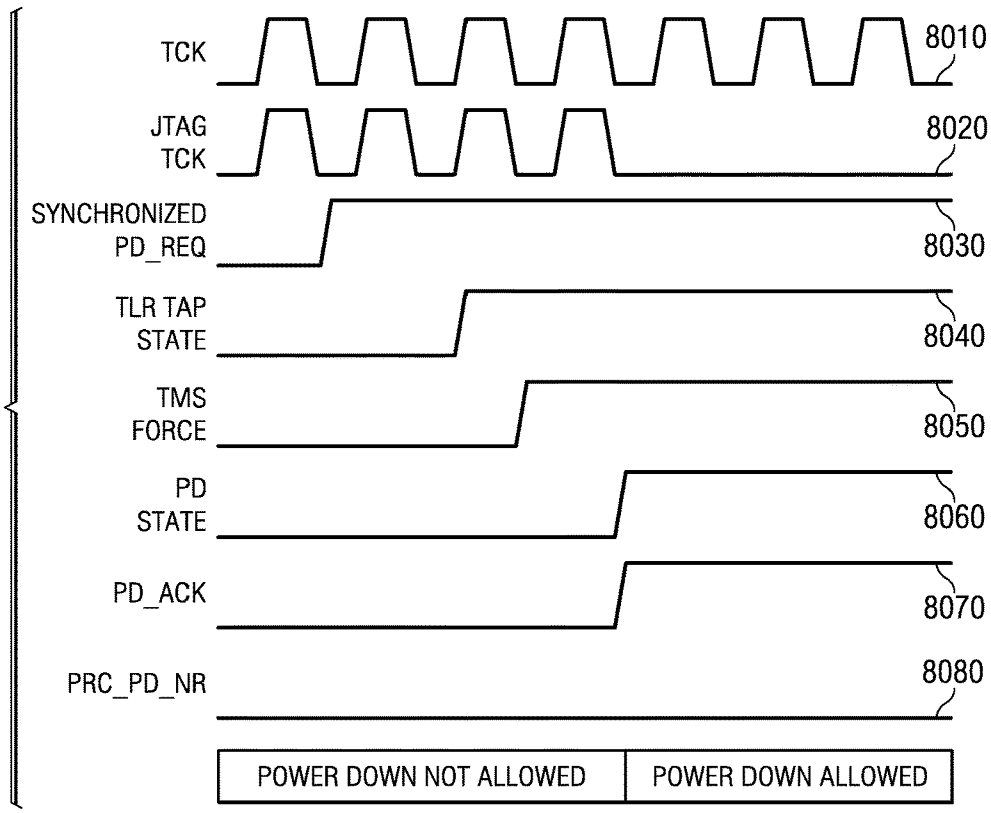
FIG. 31 is a timing diagram illustrating an affirmative response power down.

Mode 0 and mode 1 operate in an "affirmative response" ("AR") model. Both modes involve a requested operation while the link clock is up and running. The request originates from logic external to the TS cJTAG adapter and is referred to as the Power and Reset Controller ("PRC"). As shown in FIG. 31, the PRC asserts synchronized power-down request 8030 when the PRC is in mode 1 (power-down is not permitted in mode 0). After the TS TAP indicates that it has entered into the test logic reset state (TLR TAP state signal 8040 asserted) while in standard mode, and indicates that TMS has been asserted (TMS force 8050), the TS cJTAG adapter performs an orderly shutdown of the cJTAG interface (indicated by PD state 8060), halts the JTAG clock 8020, and acknowledges the power-down request (PD_ACK 8070).

Figure 32:
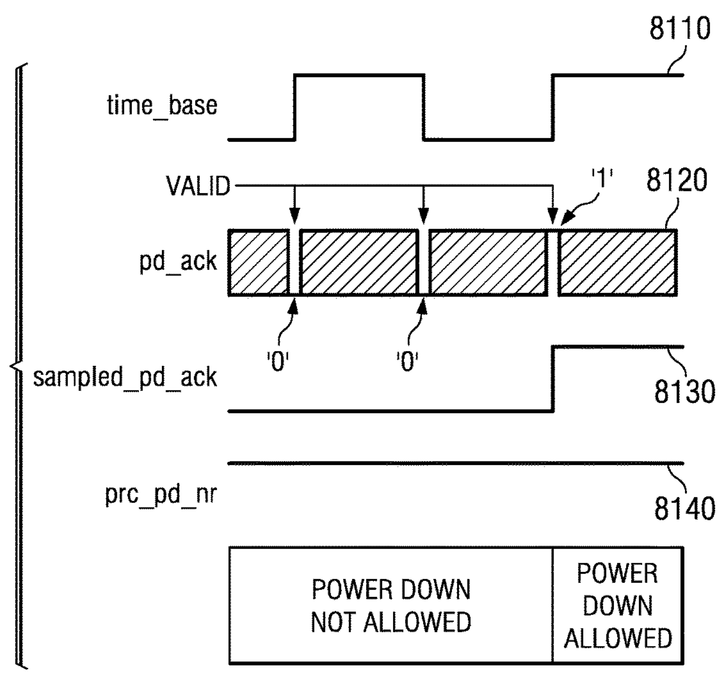
FIG. 32 illustrates an example of non-response power down.

Mode 2 and mode 3 operate in a "non-response" ("NR") model. As shown in FIG. 32, in these modes of operation the PRC generates an event that may generate a power-down acknowledge. If a power-down acknowledge is generated, the TS cJTAG adapter must negate the power-down acknowledge within the inactivity period. In the preferred embodiment of FIG. 32, the TS cJTAG adapter periodically toggles the power-down acknowledge 8120 at an interval that is half the duration of the time base 8110. The time base has a period that is equal to the inactivity period. Periodically toggling the power-down acknowledge 8120 acts as a "keep alive" heartbeat that prevents the PRC from powering down the TS cJTAG adapter. If the acknowledge does not negate the state of the power-down acknowledge within the inactivity period, the sampled power-down acknowledge 8130 will remain at the same state for a period of time exceeding the inactivity timeout, and the power down will be allowed at that point if Mode 3 is enabled. In Mode 2 the power down will not be allowed unless the TS TAP has entered the test logic reset state while in standard mode. Thus, only Mode 3 is available to allow a power down while in advanced mode, which will occur if the power-down acknowledge stops sequencing for a period of time longer than the inactivity period. This may happen, for example, if the target systems becomes disconnected from the debug and test system (if the clock is driven by the debug and test system), which results in a return to the test logic reset state, where the TAP remains due to the TMSC signal (and as a result the TMS bit) being pulled up and held to a logical one. Once the TAP has remained in the test logic reset state for more than the inactivity period, the power down is allowed.

In at least some preferred embodiments, a distinction is made when a TAP state machine is in the test logic reset state of FIG. 4 while in advanced mode, as opposed to IEEE mode. In such preferred embodiments, it is desirable to sometimes prevent a reset and a transition to IEEE mode from occurring while holding the TAP state machine in the test logic reset state in advanced mode, while at other times allowing the transition to IEEE mode whenever the TAP state machine is held in the test logic reset state in advanced mode. To make such a selection of behavior possible, at least some preferred embodiments are configured to change behavior in this manner based upon a pre-selected sequence of TMS bits.

After reaching the test logic reset state, if the TMS bit is low in two successive packets in advanced mode while in the test logic reset state, the TAP state machine transitions to the run test idle state, where it then remains, still in advanced mode, as long as the TMS bit is low. If the TMS bit is high in one packet of a two packet set, and low in the other packet of the two packet set, the TAP state machine will remain in the test logic reset state for each test logic reset state where this conditions is true, also remaining in advanced mode. But if the TMS bit is held high for two successive packets, the sequence is treated as a special or abnormal sequence, causing a hard reset to be generated and forcing the system 1000 to revert to IEEE mode after completion of the reset.

Although two successive logical "1" values of the TMS bit are used in the preferred embodiment described, other values, bits, and sequences may become apparent to those skilled in the art, and all such values, bits, and sequences are intended to be within the scope of the present disclosure. Further, although the present disclosure describes a preferred embodiment that returns to the IEEE mode by default upon reset, other modes may be selected as a default mode as previously described with regard to configuring the system 1000 upon power-on reset, and all such default mode configurations are also intended to be within the scope of the present disclosure.

It is possible that system operation may be changed or corrupted by a make or break in the connection of a debug test system and target system. In accordance with at least some preferred embodiments of the invention, a "firewall" is implemented to reduce the chance that system operation is changed or corrupted by a make or break in the connection of a debug test system and target system in a mix of powered and un-powered configurations. The term firewall, as used in the present disclosure, is intended to refer to a mechanism by which a clock that drives a TAP state machine is gated by a control signal, allowing the state machine to be disabled and thus protected from bit transitions on other signals caused by the make or break in the connection as described above. When either a debug and test system or a target system is firewalled, the TAP machine is frozen and cannot transition from state-to-state. Although the clock signal is gated in the preferred embodiments described, other signal may also be gated by a control signal as part of a firewall implementations, and all such implementations are intended to be within the scope of the present disclosure.

A firewall between the debug test system and target system interfaces may be created at power-on reset (POR) or under the direction of the debug test system. As already noted, the firewall blocks the TCK signal to the target system TAPs attached to the cJTAG interface which prevents the TAP from advancing. The firewall may be raised and lowered within a command window. The firewall may easily be removed by standard scan sequences after POR prior to any determination of the configuration or topography of the system 1000 of FIG. 1. The firewall may also be removed prior to performing any other action such as obtaining the device ID with the IDCODE instruction created by the TLR TAP state. Commands within a command window change register values controlling the firewall. Changes in the state of the firewall take effect when the system TAP state reaches the IDLE state in at least some preferred embodiments. Other states or state sequences may be implemented to allow changes in the state of the firewall, and all such implementations are intended to be within the scope of the present disclosure.

Devices that implement a firewall are entirely compatible with those that do not implement a firewall as the firewall enables the global bypass provided by the global bypass bit in addition to disabling the clock that advances the state of the of the TAP state machine connected to the cJTAG interface. This is accomplished using a command window sequence, which is ignored by both JTAG devices, as well as cJTAG devices that do not implement a firewall. JTAG devices treat the command window as an inert state sequence and are not affected or modified by the sequence. JTAG or cJTAG devices that do not implement a firewall do not include the firewall control register being modified while the command window is open, and thus will also not be affected by the sequence. cJTAG devices that implement a firewall but have the firewall lowered at power-on reset are likewise unaffected by the sequence. This makes both firewalled and non-firewalled operation entirely compatible with systems using the JTAG protocol.

At least some of the preferred embodiments of the invention provide for orderly behavior in the event of a break in the electrical connection between the debug and test system and the target system (e.g., if the cable is disconnected). This behavior creates device operation like that created by a power-on reset. Two connection breaks are possible: supervised or intentional breaks, and unsupervised or unintentional breaks. A supervised break is preceded by a command issued by a user of the debug and test system to prepare the system for a supervised break. Upon receipt of this command, the system will place the system in a state similar to the state that results from a power-on reset. Once in that state, the user is notified that the system is ready, allowing the user to then disconnect the debug and test system from the target system.

An unsupervised break is one not anticipated by the user (e.g., an accidental disconnect). In this case, the response depends on whether the target system or the debug and test system is supplying the TCK signal. In at least some preferred embodiments if, for example, the target system is supplying the TCK signal, the target system's TAP state machine transitions to the test logic reset state (FIG. 4) and the cJTAG adapter then powers down. If the debug and test signal supplies the TCK signal, in at least some of the preferred embodiments, the cJTAG adapter freezes (due to the lack of a clock signal) and if power down mode with no TCK is used, the PRC executed a power-on reset after no TCK time limit is exceeded. The BCE pin, which has a pull down connection, also goes low, which resets all test logic.

In at least some preferred embodiments where the TCK signal is provided by the target system, the negative of the TDI (nTDI) signal is used when the TDI bit is transmitted across the link. The use of nTDI assures a TDO value of "1" in shift states (i.e., the TMSC signal will have a value of "1"). The control states generate a TDO bit value of "1" in non-shift state (i.e., the TMSC signal will again have a value of "1"). As a result of the TMSC signal (and thus the TMS bit) begin held at a logical value of "1," the TAP state machine transitions to the test logic reset state. When at the test logic reset state, the cJTAG adapter detects two TMS bit values of "1" which, as previously described, then causes a reset. At this point, the cJTAG adapter is back in the IEEE mode with the TAP state machine state at test logic reset. The reset initializes the power down mode to the default power-on reset values for the cJTAG adapter and permits power down if the mode so allows.

System Architecture cJTAG provides a bi-modal link between the DTS TS IEEE 1149.1 interfaces as shown in FIGS. 1, 35, 36 and 37. The bi-modal operation of the link refers to the two protocols used (JTAG and cJTAG) to exchange information between the DTS (Debug and Test System) and TS (Target System). The link may be implemented in two widths (narrow and wide). The narrow width utilizes only two of the 5 JTAG pins while the wide width utilizes either the 4 or 5 pin JTAG configuration. Non-JTAG standard systems with a return test clock (RTCK) are also accommodated.

JTAG protocol may be used to manage link capabilities with either width and communicate with test access ports (TAPs) connected to the TS adapter when the width is wide (4, 5, or 6 pins). cJTAG protocol may be used to manage link capabilities with either width and communicate with TAPs connected to the TS adapter with either debug port width.

cJTAG is essentially a JTAG use case with some of the characteristics of a private instruction.

The adapter uses several aspects of JTAG state sequences to create a control hierarchy above that afforded by legacy JTAG. This control hierarchy is created using:

Inert JTAG instructions (BYPASS, IDCODE)

Zero bit DR Scans (ZBS)

cJTAG control data creation using the number of clocks spent in the Shift_DR TAP state Special relationships between TCK and TMSC Once an inert instruction is loaded into the JTAG instruction register, zero bit scans (Capture_DR then Update_DR without a Shift_DR TAP) are used to specify a control level. The control level is specified by the number of consecutive ZBSs without a Shift_DR TAP state. Once the control level is established, the cJTAG control registers are managed with DR Scans. The number of TAP states spent in the Shift_DR state is recorded with a 5-bit counter, with the counter value used as data when the Update_DR TAP state occurs. The 5-bit data value is used to create 4-bit data that is loaded into a temporary register and 4-bit commands that disposition this data. These simple capabilities are sufficient to manage the cJTAG interface and all the capabilities of the cJTAG adapter. Note that the TDI and TDO pins are not needed to implement the control mechanisms described above.

The link protocol includes:

Reset and Escape commands created with TCK high and multiple TMSC transitions

Standard JTAG

Packets of information in advanced modes

JTAG scan transactions are further serialized to create packets associated with a single TAP state. The information content of these packets is varied using optimizations that delete information that may be created in another way or is just not needed. This increases link efficiency. Verbose packets are provided to manage compatibility with all JTAG and modified JTAG (JTAG+RTCK). These packets move TMS, TDI and TDO between the DTS and TS, in addition to a RDY bit that allows stalling packet transmission. The RDY bit may be used to perform the stall function associated with RTCK. Other scan packet formats eliminate unnecessary information from the packet, increasing the packet efficiency. The packet optimizations used are changed depending on whether the TCK source is the DTS or TS. A TS TCK source prevents the use of the Reset and Escape link protocol described above, as the DTS cannot stop TCK when it does not source TCK.

Background Data Transfers (BDX) utilize unused Link bandwidth by assuming control of the Link when BDX is fully qualified, and an IDLE, Pause_DR, or Pause IR state is reached. A BDX packet is sent for each TAP state, following the first, spent in these states. Control of the Link is returned to scan and scan packets when the state supporting BDX is exited.

The cJTAG architecture provides for custom use of the Link. This type of Link use is called Custom Data Transfer (CDX). Control of the TMSC pin is passed to a unit external to the adapter when the CDX capability is fully qualified and the Shift_DR state is reached. This capability allows virtually any debug technology to share the cJTAG Link bandwidth, with cJTAG being the master of the link. The JTAG look and feel of the interface may be maintained while other capabilities share Link bandwidth.

Since the cJTAG capabilities are both manual and optional, the architecture provides for the coexistence of devices or adapters with different capability. When an unsupported capability is enabled, the adapter merely places itself offline until either a soft, hard escape sequence is detected, or adapter POR occurs.

The adapter literally connects and disconnects the TAPs connected to the adapter system interface when the adapter is selected and de-selected. Disconnecting the TAPs connected to the adapter merely turns off the TCK to these TAPs. The IDLE state is used to synchronize the application of selections made previously. Different selection mechanisms are provided for scan and BDX. Scan and CDX share a selection mechanism.

Part of the cJTAG command and register space is dedicated to uses other than those associated with the standard portfolio of cJTAG capabilities. This allows the addition of test and DTS capability, with these capabilities subject to the same programming constraints of normal cJTAG functions. A DTS designer may use the reserved commands as registers to control a multiple DTS port, determine the TCK source, manage its Link-interface mode, etc. Likewise, a chip developer may implement a control-collar around conventional chip terminals for testing or other control, using cJTAG commands and registers reserved for this or other custom purposes.

cJTAG extends the capabilities of the IEEE 1149.1 standard with a rich portfolio of capabilities as shown in. Simple uses such as programming a single component require simple solutions. Sophisticated systems such as debug of a system-on-a-chip (SOC) require more sophisticated solutions with an emphasis on debug performance.

These capabilities optimize target device pin count, link scan performance, and debug performance; three related yet different areas. Two data transport facilities are included; the first utilizing otherwise wasted link bandwidth for debug purposes and the second supporting custom debug extensions, each sharing link bandwidth with scan. The architecture is scalable, allowing implementation of varying degrees of capability. Each of these cJTAG capabilities is described in this specification.

The minimum link/TAP TCK ratio (Min. Link/TAP TCK ratio) represents the minimum number of Link TCKs needed before the TAP state is advanced. This ratio is 1/1 for JScan formats as they operate as JTAG does. With advanced scan formats, TMS, TDI, and TDO information is serialized over the TMSC pin making the number of Link TCKs needed for a TAP state change greater than one. This ratio represents the minimum number of TCKs a specific scan format needs to advance the TAP state. The number of Link TCKs may be greater than this ratio at times but never drops below this ratio. If the ratio is 2/1 for instance, a link TCK of 100 MHz will never cause the TAP state to advance faster than 50 MHz. If the ration is 3/1, a link TCK of 100 MHz will never cause the TAP state to advance faster than 33 MHz. When the maximum TAP state rate of legacy equipment is known, this ratio determines the maximum link TCK frequency for the format. The 6/1 ratio shown in FIG. 87 reveals TS equipment with a maximum TAP state rate of 10 MHz will allow a link TCK rate of 60 MHz.

Maintaining backwards compatibility with the IEEE 1149.1 standard is extremely important. Compatibility preserves the industry's investment in the test equipment, emulators, software, and silicon IP developed by those already using this standard. The cJTAG interface is specified to make the serial movement of control and data information across the adapter interface transparent to the DTS and TS components normally using JTAG. Relationships between modes/operations and TAP states must be enabled before they are used. No legacy hardware or software can create harmful situations.

This approach preserves: DTS Software—all existing JTAG drivers, DTS Hardware—debug and test equipment and using JTAG infrastructures, TS Silicon—all silicon intellectual property using JTAG, and DTS Software. Once an operating mode is selected (standard or advanced) and enabled, both the DTS and TS operate as though the interface between the two is IEEE 1149.1 compatible.

Other than the scan sequences needed for link setup and configuration management, the adapters are transparent to JTAG transactions between the DTS and TS. This allows: Deployment with existing JTAG software technology, Management of cJTAG protocol selection with normal JTAG sequences, and Easy addition of these sequences to existing infrastructure in a manner that does not require changes to functions already using the JTAG interface.

The DTS software's view of the TS interface appears as JTAG in both JTAG and cJTAG modes. DTS software drivers for TS components connected to a cJTAG interface are presented the appearance of a JTAG interface in both standard and advanced modes. This maintains the same view of the system from both the TS and DTS standpoint, preserving existing investments in both areas.

The software in the advanced mode is limited to Link setup and configuration management. Since the advanced mode serializes and then reconstructs JTAG transactions at each end of the Link, the DTS and TS equipment and software are virtually oblivious to its existence. The equipment and software exposure to the existence of the advanced mode is limited to Link setup and configuration management. Since these functions are generally relegated to Link start-up and topology management, drivers that are not affected by these attributes remain unchanged. Drivers may be made faster with modifications in cases where segmented scans offer a performance boost.

Deployment of the link leaves the existing JTAG infrastructure virtually undisturbed since: DTS adapters may be externally added to existing DTS equipment, DTS adapters may be incorporated into existing DTS equipment, and HW adapters convert JTAG protocols to advanced cJTAG protocols and back to JTAG protocols.

This means existing IEEE 1149.1-compliant DTS equipment may be upgraded by connecting a cJTAG adapter to an existing DTS JTAG interface. The adapter may be as simple as a dongle added to existing systems or it may be integrated into these systems to achieve better cost or performance. Without integration, the functionality of cJTAG is limited to a subset of JTAG features (e.g., no BDX or CDX). Software controlled interfaces may be reprogrammed.

The cJTAG adapter interfaces directly to a system TAP with no changes to its interface. From the device standpoint, the cJTAG architecture allows: addition of the cJTAG adapter in front of an existing IEEE 1149.1-compliant interface, transaction stalls allowing the TCK rate to exceed the transaction rate supported by certain on-chip components, components that do not support JTAG operation solely with TCK, and components that are made "not ready" by power-down, etc.

The cJTAG architecture is extensible on a number of fronts. It not only comprehends the use of custom debug protocols, it accommodates control register additions specific to cJTAG, Test, and DTS controllers. Public and private control register space is already allocated to these capabilities. The interface can also accommodate multi-port DTS operation and various system connection topologies.

A cJTAG interface is created by placing circuitry in series with DTS and TS JTAG interfaces. This circuitry (called the Bridge) provides DTS/TS communication using either standard (JTAG) or advanced (cJTAG) protocols. The DTS manages the Link with the same command sequences with both protocols using only the TCK and TMSC pins. Operating mode and/or signaling format changes are synchronized and occur concurrently in the DTS and TS. Transfers between the DTS and TS use either a TCK supplied by the TS or TCK supplied by the DTS. The TS supplied TCK may also be associated with other TS functionality and will be free-running, if this option is used.

Figure 37:
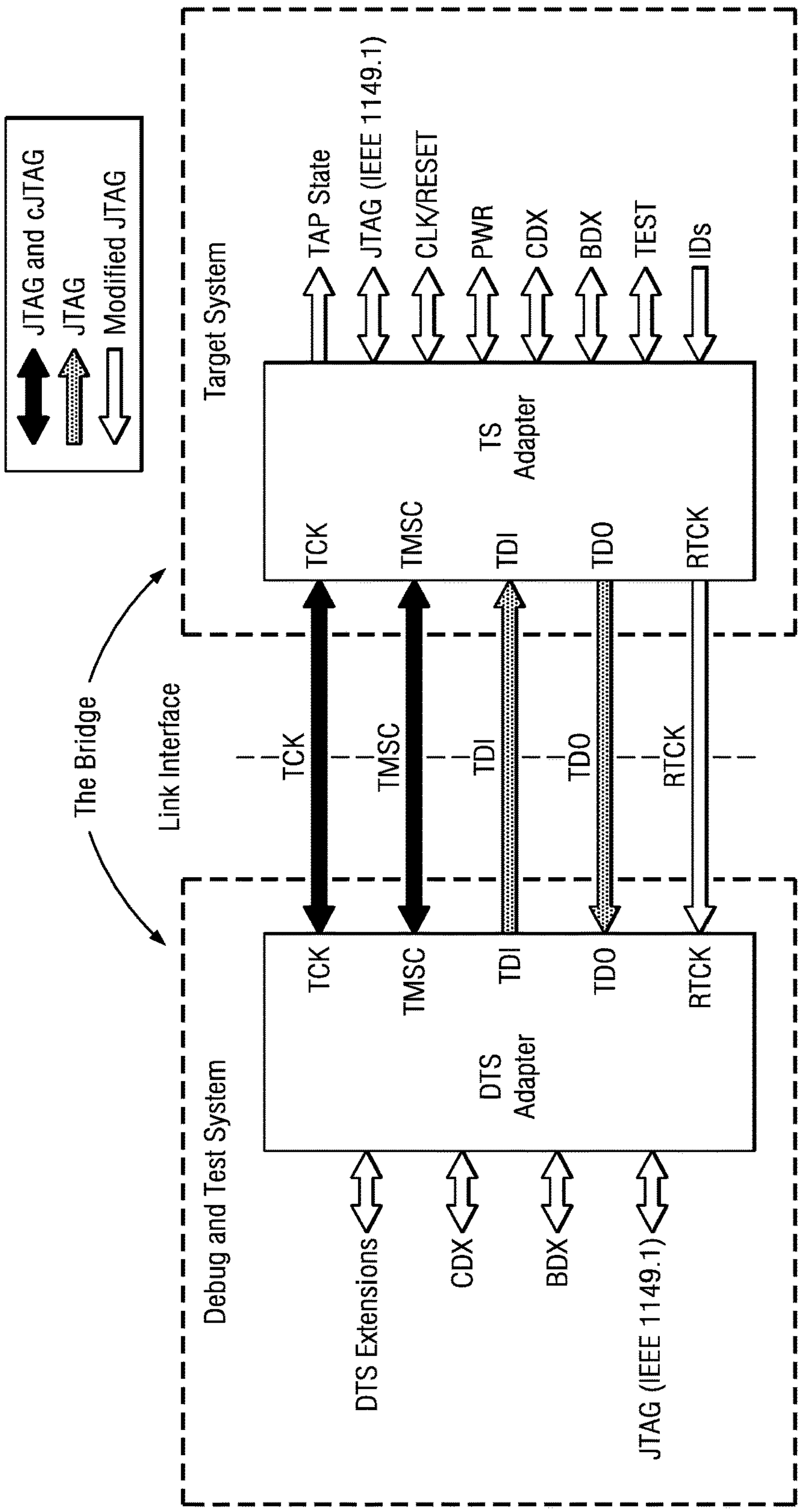
FIG. 37 is a table of DTS Adapter Signals.

A high-level block diagram of the Bridge circuitry is shown in FIG. 37. It highlights several views of DTS/TS connectivity. Mandatory cJTAG connectivity is shown in black (TCK and TMSC). Optional connectivity needed to fully support legacy JTAG is shown in gray (TDI and TDO). Additional optional connectivity, for some modified versions of legacy JTAG using the return TCK (RTCK), is shown in outline.

The DTS and TS JTAG interfaces are connected in a pass-through configuration when standard protocol is used. These interfaces are connected with serialization circuitry when advanced protocol is used. The advanced protocol serialization/de-serialization process converts standard protocol to advanced protocol and back to standard protocol. Serialization moves all TAP information between the DTS and TS using only the mandatory 2-pin TMSC and TCK interface.

The interface between the DTS and TS adapters is called the Link. The interface connecting TAPs to the TS Adapter is called the JTAG interface. Likewise, the interface connecting the DTS adapter to other equipment is also called the JTAG interface. If there is a need to describe interfaces with the same names on both sides of the bridge at the same time, or provide additional clarity, DTS and TS may be added as prefixes to the interface names. Both the TS and DTS JTAG interfaces are part of larger interfaces. This larger TS interface is called the System Interface (SI) throughout this document. The corresponding interface in the DTS is not referenced.

Up to 16 TS adapters may be connected in parallel to the DTS adapter, if Return Clock (RTCK) is not involved in the signaling. This creates, what is commonly called, the cJTAG Star configuration. This collection of interconnects is called a port.

Debug and Test System Adapter

Figure 38:
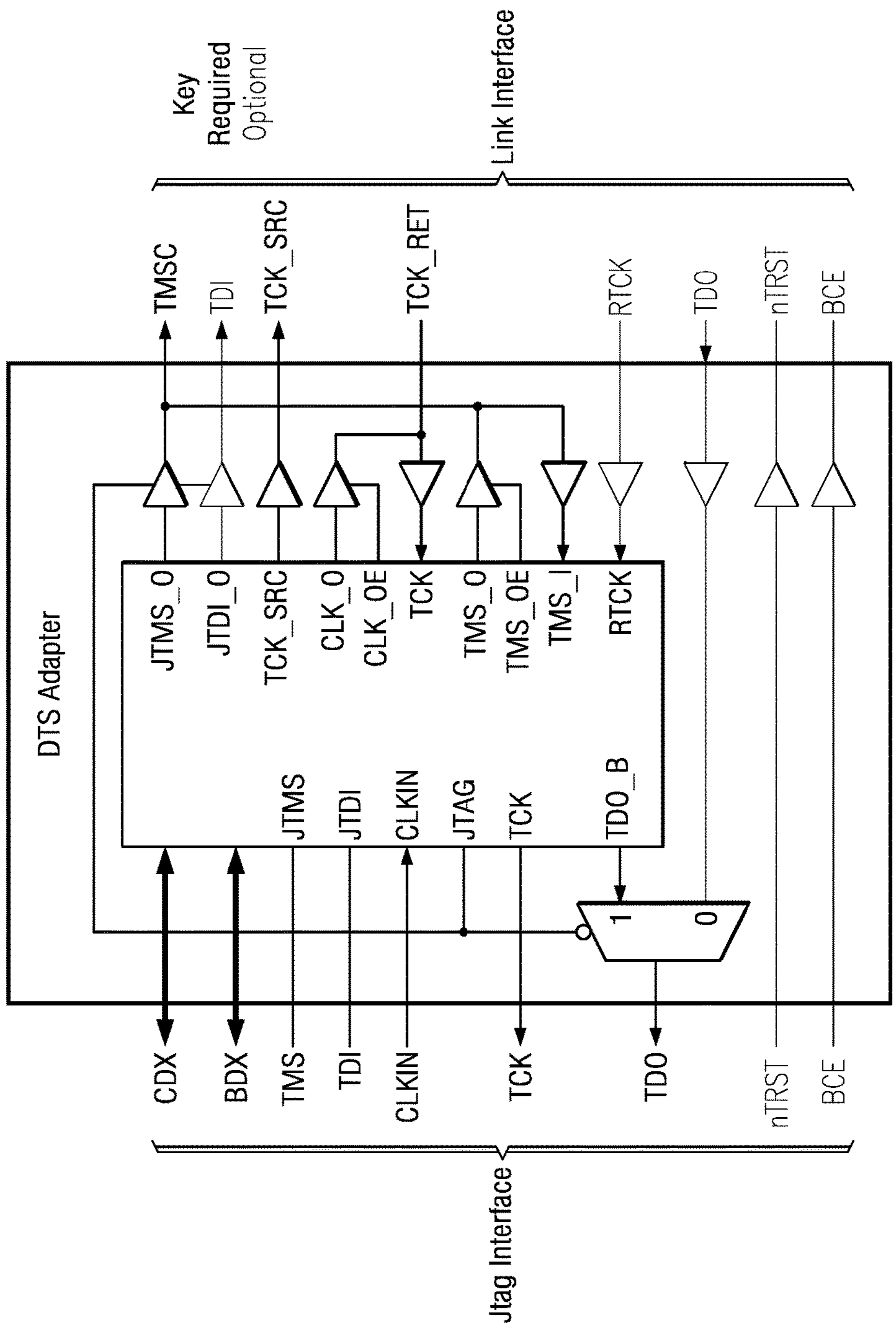
FIG. 38 is a Target System Adapter block diagram.

A conceptual high-level block diagram of the minimal DTS adapter is shown in FIG. 38 with interface signals shown in FIG. 39. The interfaces for optional capabilities are not included as they do not alter the Link interface. Only the basic functionality is shown in this figure; optional signals are shaded gray. Note that after system boot-up, all JTAG capabilities are transparent.

TCK_SRC is connected to the TCK input of the TS cJTAG adapter when the DTS supplies the TS TCK. In this configuration, the DTS does not use the TCK_RET input. This input is left as a "no connection" as the DTS supplies TCK to itself in this configuration. When the TS supplies the TS TCK, TCK_SRC is not used (no connection) and the TS supplies the TCK input to the DTS via TCK_RET. The DTS signals are defined in FIG. 39.

Target System Adapter

The target system (TS) adapter provides a range of capabilities that include JTAG Extensions, Basic Advanced Scan (2-pin), a variety of performance optimized advanced (2-pin) scan formats, a number of capabilities supporting applications debug, and customizable facilities for chip use, and DTS use.

The mandatory cJTAG capabilities include JTAG extensions and basic advanced scan. With this mandatory feature set, any Debug and Test System (DTS) implementing the mandatory feature set is interoperable with any chip with one or more adapters that also implement the mandatory feature set. A chip architect may choose to add capabilities to the mandatory capability.

Figure 40:
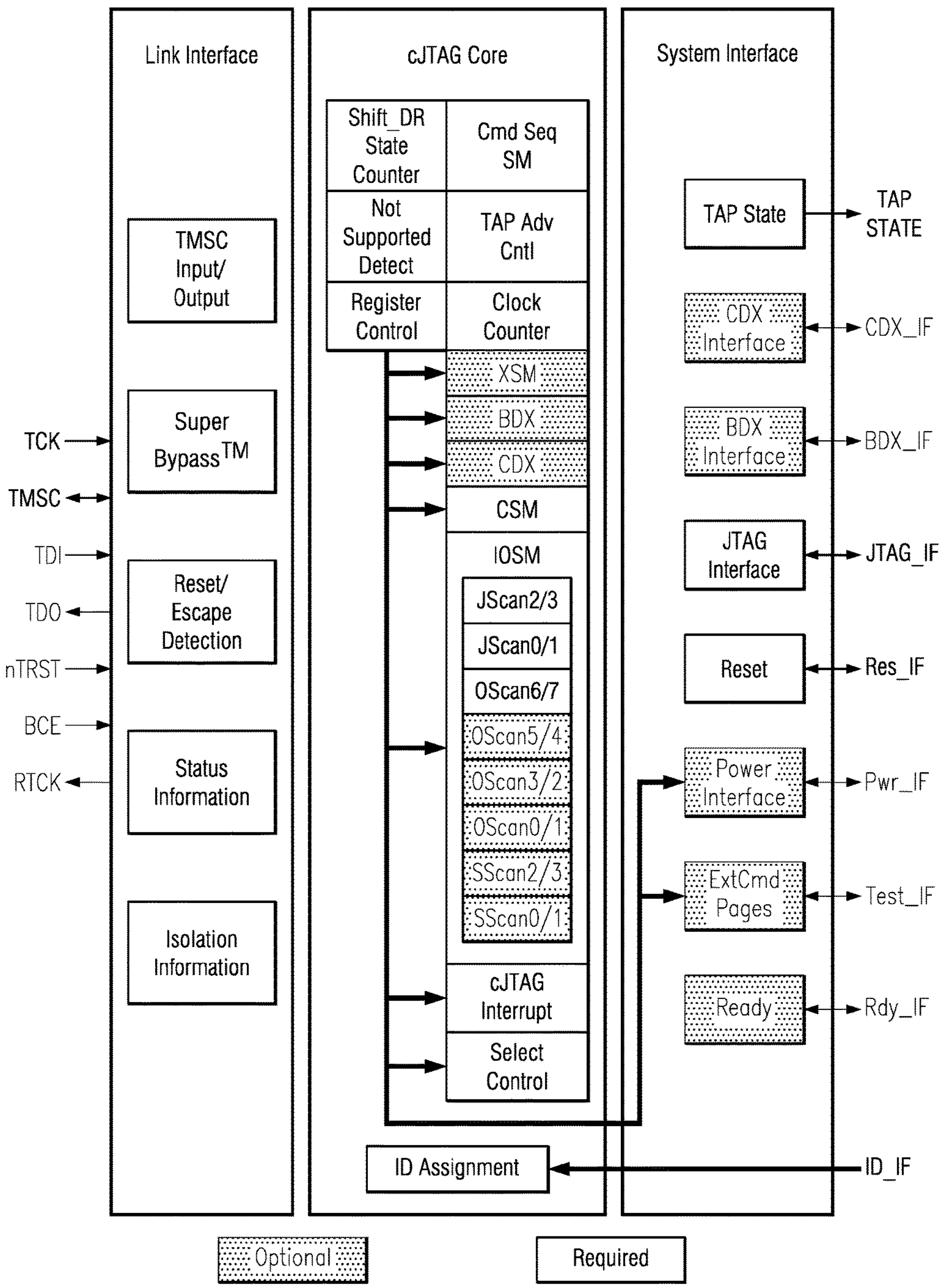
FIG. 40 is a table of TS Adapter Signals.

In FIG. 40, the adapter 1210 architecture partitions the functionality so that it may be specified through compilation switches. The partitioning corresponds roughly to the functionality discussed in this specification. Most, if not all, of the cJTAG Core is used in both the DTS and TS adapter as the state machines in both adapters track each other. The Link and System interfaces are different in the two adapters.

Figure 41:
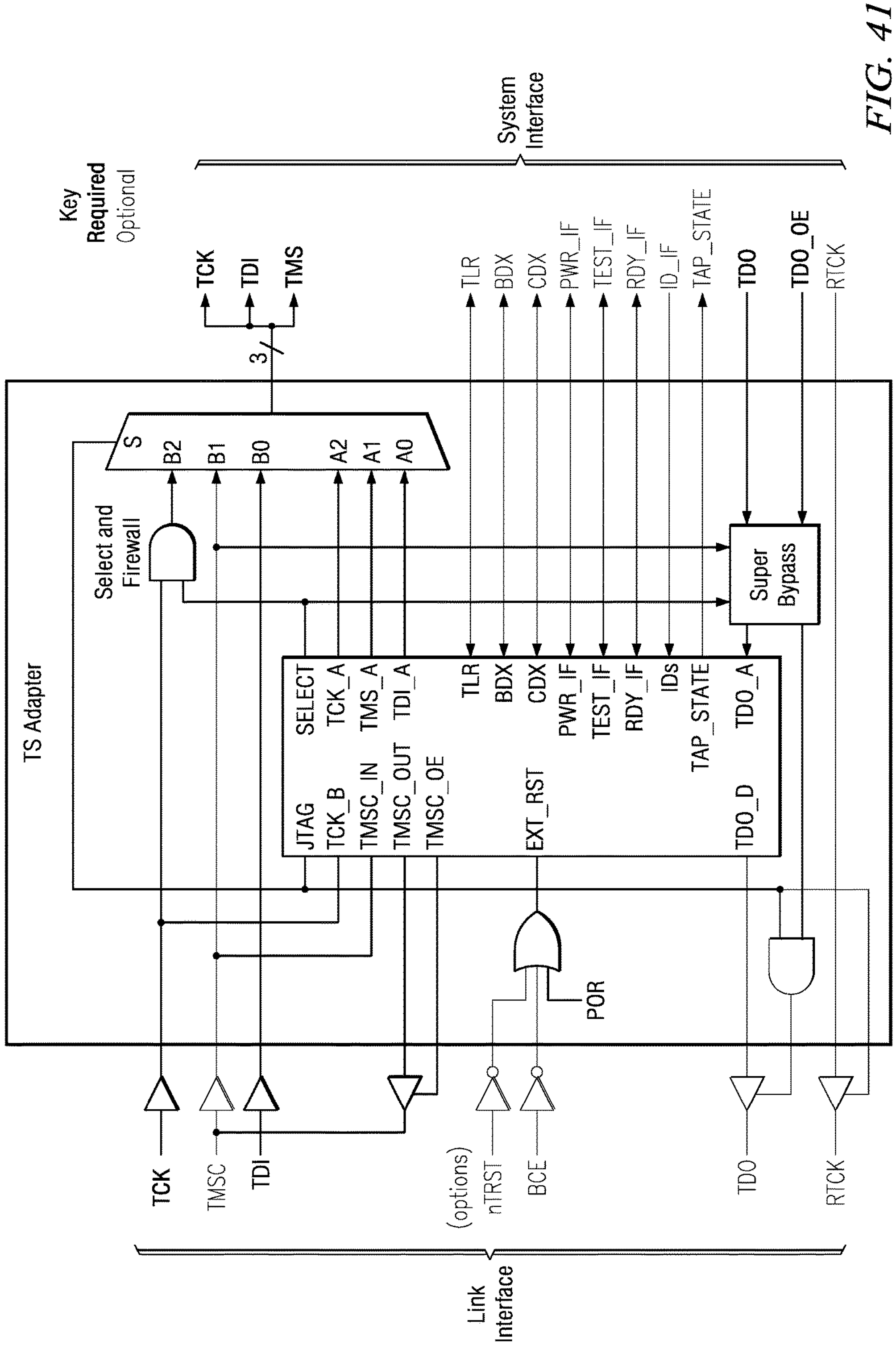
FIG. 41 is a table of TAP State Machine State Encoding.

A high-level block diagram of the TS Adapter is shown in FIG. 41. This diagram emphasizes the mandatory aspects of the interface. The signal descriptions for the mandatory and optional aspects of Link Interface and mandatory aspects of system interfaces can be found in FIG. 42. The standard operating mode provides a direct connection between the Link and JTAG or System interfaces. The advanced mode uses the Link-interface TCK and TMSC to create the JTAG or System interface TCK, TMS and TDI signals, and to export the JTAG interface TDO via the Link interface. The adapter is shown in its basic form. The interfaces for optional BDX, CDX interface power control and the like are not included as they and the JTAG interface are part of a wider system interface. Optional signals are shown in gray.

The Link interface supports two optional reset signals: nTRST and BCE. These signals are shown shaded in light gray in FIG. 412. Either none, one, or both of these signals may be included in the Link Interface. The JTAG interface supports a RDY and RTCK signal. The RTCK signal is needed only if the interface supports operation in a modified JTAG mode. The RDY signal is needed if a TAP within the system may not be able to accept transfers at advanced rates, or if the TS desires to stall memory or other types of block-oriented transfers with advanced protocols tailored to these types of transactions.

Two JTAG extensions are included in the cJTAG architecture: Firewall, and Global selection of devices (a selection mechanism and a Super Bypass™ bit). Both of these extensions affect the operation of the physical interfaces. These capabilities are implemented in a way so as to be transparent to the IEEE 1149.1 standard. These extensions are enabled and disabled with command sequences. In addition, the firewall may be either enabled or disabled by power-on reset (POR). Although these additions seem small, they provide a significant boost to the Link capability without compromising IEEE 1149.1 compliance. These extensions are shaded in gray in FIG. 41. The adapter itself is not affected by the firewall or the selection mechanism.

A cJTAG-enabled device may be built with one of two interface configurations: Wide Interface (4/5-pin), with:

TCK, TMSC, TDI, TDO and (optional RTCK)

Standard protocols (JTAG control and data)

Advanced protocols

Switchable between standard and advanced protocols

Narrow Interface (2-pin), with:

TCK and TMSC

Standard protocols (control only—sufficient for cJTAG command sequences)

Advanced protocols

Switchable between standard and advanced protocols

Both configurations begin operation using standard protocol with control sequences requiring only TCK and TMSC. This is sufficient to support all cJTAG command sequences and communicate with TS TAP transfer data using advanced protocols.

The Wide interface uses the TCK, TMSC, TDI and TDO pins. Provisions are made to accommodate RTCK, if it is present. Command sequences use TCK and TMSC, making cJTAG management the same for both narrow and wide interfaces. The wide interface supports dynamically switching between standard and advanced modes, with the 4-pin interface functions changed as follows in advanced modes. The TCK pin provides a clock controlling all transfers, and the TMS pin, now referred to as TMSC, becomes bi-directional and is used to transfer all standard TAP control and data information between the DTS and the TS. The TDI and TDO pins may be reassigned for other debug purposes when the wide interface operates in advanced mode.

The Narrow interface uses only the TCK and TMSC pins; hence, full JTAG operation is not supported in this mode. A device with a narrow interface is capable, however, of receiving commands with cJTAG control information conveyed solely via TMSC with the interface operating in either the standard or advanced mode. This is sufficient to specify interface operating characteristics and switch interface operating modes.

Since the TDI and TDO pins are not present with this interface, normal data transfers with standard protocol are not supported. It is recommended that TDI be tied off in a way that generates a one (1) during IR scans to deliver BYPASS instructions and a zero (0) during DR scans to generate zeroes (0s). Alternately TDO may be tied off to a one (1).

The Link Interface controls all pins associated with either a 2-pin or 4-pin interface. It allows the alternate use of the TDI and TDO pins with a 4-pin interface that is implemented but operated in 2-pin modes. It includes the super bypass bit used to create bypasses to instruction and scan data paths. The Link Interface function includes the following blocks: TMSC Input/Output, Super Bypass bit, Reset/Escape detection, Status generation, and Isolation logic used in assignment of Link IDs.

TMSC Input/Output is the control necessary to manage the JTAG and cJTAG use of the TMSC pin. The TMSC pin is used as an input in JTAG compatible modes but as an input and output in advanced mode. The Link interface uses directives generated by an JO state machine within the core to manage input and output.

The super bypass bit is a one-bit scan path that bypasses both the instruction and data scan paths when an adapter is not selected, and when the firewall is installed. The system TAPs are disconnected when the super bypass bit is the scan path.

The special relationships between TCK and TMSC creating Escapes, Soft Reset, and Hard Reset are detected by the Link interface. Escapes terminate Shift operations when TMS data has been deleted from shift state packets. Soft Reset allows an offline adapter to be placed online. Hard Reset initializes the Link, producing the same effects as adapter POR.

Status Information may be read when the link is operated in advanced mode. Status returns a byte amount of link state information followed by a byte identifying the adapter features supported, followed by custom information if desired.

Isolation information is used to identify the adapter that will be assigned a Link ID if Link ID assignment occurs. This information is output when no adapters are selected and the Link IDs assigned at adapter POR are invalidated by the debug software. The isolation process is the key to Link ID assignment. This process chooses a device for Link ID assignment using an approach similar to musical chairs. It uses a data register scan within the command window when no devices are selected to pick the winner of the isolation process. Initially the Capture_DR TAP state places all devices with an invalid Link ID in an "Invalid and Isolated" state, declaring all devices the winner of the contest for the Link ID. Each device is tasked with outputting a data pattern that is unique to it (isolation pattern). It does not matter what the data pattern is, it matters only that it be different than the pattern generated by other contestants.

The system interface is composed of: ID interface, A four-bit TAP State value, JTAG interface (TCK, TMS, TDI, TDO_D and TDO_OE), Reset Interface, Power Interface (optional), Ready Interface (optional), Test Interface (optional), BDX interface (optional), and CDX interface (optional).

The ID interface provides a means for the chip to inform the adapter of its JTAG device ID, less the revision number (27 bits) and a Node ID (4 bits). This information is used for Link ID assignment. The Node ID should be latched by chip POR from pin values and presented to the adapter.

Figures 43, 44, 46:
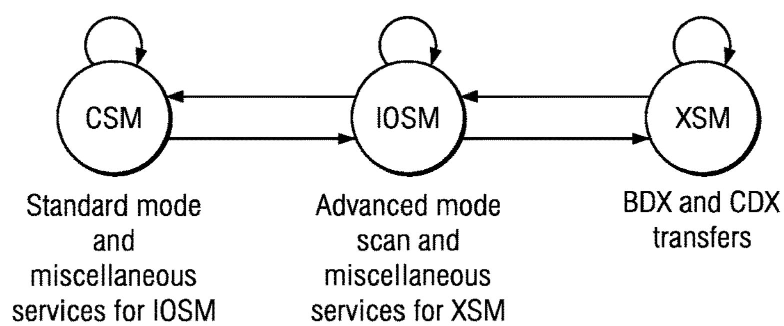
FIG. 43 is a diagram of Command Sequence State Machine.
FIG. 44 is a CSEQ State table.
FIG. 46 is a chart of state encoding.

The adapter exports a 4-bit TAP state of signals. The TAP state encoding is shown in FIG. 43.

The JTAG interface consists of TCK, TMS, TDI, TDO_D and TDO_OE. The adapter passes the pin values of TCK, TMSC, TDI, and TDO, if they exist, to the corresponding signals on the JTAG interface when the interface operates in standard mode. If TDI is not present on the Link interface, TDI is presented to the system as a one (1) during the Shift_IR TAP state and a zero at other times. The TDO_D and TDO_OE signals are either forwarded to the TDO pin if it exists or used to create TDO data embedded in advanced packets, depending on the interface operating mode. The TCK of the system interface occurs once for each Scan, BDX, or CDX packet. The TCK is held at a zero when an adapter is de-selected or a register write has caused a cJTAG interrupt upon entry, as a result of an interface mode change from standard to advanced or a register is being written while the interface mode is advanced.

The cJTAG adapter asserts the nTRST signal (not Test Logic Reset) to the system. This signal is connected to the nTRST signal of the system interface when nTRST is supported by the system interface.

The power interface allows a chip-level power and reset controller (PRC) to manage the adapter and Link Interface power requirements.

The ready interface provides a means for chip-level components to generate the stalls associated with advanced scan formats.

The test interface is provided to implement custom test capabilities using the extensibility provided by the adapter.

The Background Data Transfer (BDX) interface provides a connection to one or more BDX units external to the adapter.

The Custom Data Transfer (CDX) interface provides a connection to one or more CDX units external to the adapter.

The cJTAG core manages all aspects of the link. It is constructed from a number of state machines, counters, registers, register control, interrupt logic, and selection control. The major state machines within the adapter are: Command sequence state machine (CSEQ), Control state machine (CSM), Input/Output state machine (IOSM), and Transport state machine (XSM).

The command sequence state machine opens and closes command windows, detects Zero Bit Scan (ZBS) and determines the control level. This machine operates independent of the other machines, monitoring the TAP state to determine the control level. It awaits a ZBS when no control window is open. It then counts the number of ZBSs prior to a Shift_DR state to determine the control level. It closes the control window when the Select_IR or TLR state is encountered, or a certain command sequence occurs within the window. This machine provides control level information to the other three major machines.

The CSM, IOSM, and XSM jointly control the TMSC pin. They exchange control of the pin as the TMSC pin use changes. Only one machine controls the pin at any one point in time. Control is passed from machine to machine as shown in FIGS. 9 and 44. The CSM is an 8-state machine that manages: Power Down permissions, Operating mode, Interrupts generated by register writes, Online/Offline operation, and Delays between packets generated by the IOSM. The IOSM is a 32-state machine that manages: MScan formats, OScan formats, SScan formats, and Ready checks between transport packets needing ready checks The XSM is an 8-state machine that manages: BDX packets, and CDX packets.

The CSM is the same for all cJTAG variations as it implements mandatory functionality. The IOSM is scaled depending on the scan formats supported. States are deleted as scan formats are not supported. The XSM and a small amount of additional logic (BDX in the figure) support the BDX function. The XSM and a small amount of additional logic (CDX in the figure) support the CDX function. The XSM is deleted if the CDX and BDX functions are not supported. The CDX and BDX logic is deleted if their respective functions are not supported.

The register control implements the control needed to manage the three standard adapter control registers: Link control, Scan control, and Transport control. The register storage is distributed throughout the consuming block so register bits associated with unsupported functions are deleted.

The select control implements a selection mechanism that can be used to choose one or more adapters for scan operations.

The cJTAG core includes several support functions: Shift_DR state counter, Clock counter, Not supported detect, TAP advance control, cJTAG interrupt, ID Assignment, and Shift_DR TAP State Counter.

The 5-bit Shift_DR TAP state counter is used to develop cJTAG control information. This information is derived from the number of TAP states spent in the Shift_DR TAP state since a Capture_DR TAP state occurred. This counter value is interpreted as STR and LTR commands when the Update_DR TAP state is reached. The 6-bit clock counter is used to detect interface timeouts and determine the length of one type of transport packet used by the BDX and CDX functions.

Not Supported Detect. This logic collects unsupported inputs from other blocks or acts as a surrogate for other blocks when these blocks are not implemented. This information is used to place the adapter offline when an unimplemented function is enabled by a register write.

TAP Advance Control. This logic determines when the system TAPs are issued a TCK, advancing their TAP state. The TAP advance is generated based on the actions taken by the IOSM, CSM, and XSM, as each reaches a point where the system and adapter TAP must be advanced one additional state. (A TCK is issued or equivalent thereof).

cJTAG Interrupt. Certain register writes (all in advanced mode and those changing the interface mode to advanced mode when it is in standard mode) stop the progression of Transport and Scan packets with the generation of an interrupt. This interrupt transfers control of the Link Interface to the CSM to manage link for a short period of time while interrupt processing completes.

ID Assignment. This logic determines when the Adapter's Device ID and Node ID have won the arbitration process associated with Link ID assignment. A link ID may be assigned to an adapter winning this arbitration. Once an adapter is assigned a Link ID, it no longer participates in the arbitration process, with another adapter winning the arbitration process. When the assignment process is repeated, all adapters have the opportunity to win the arbitration and subsequently be assigned a Link ID.

Figure 45:
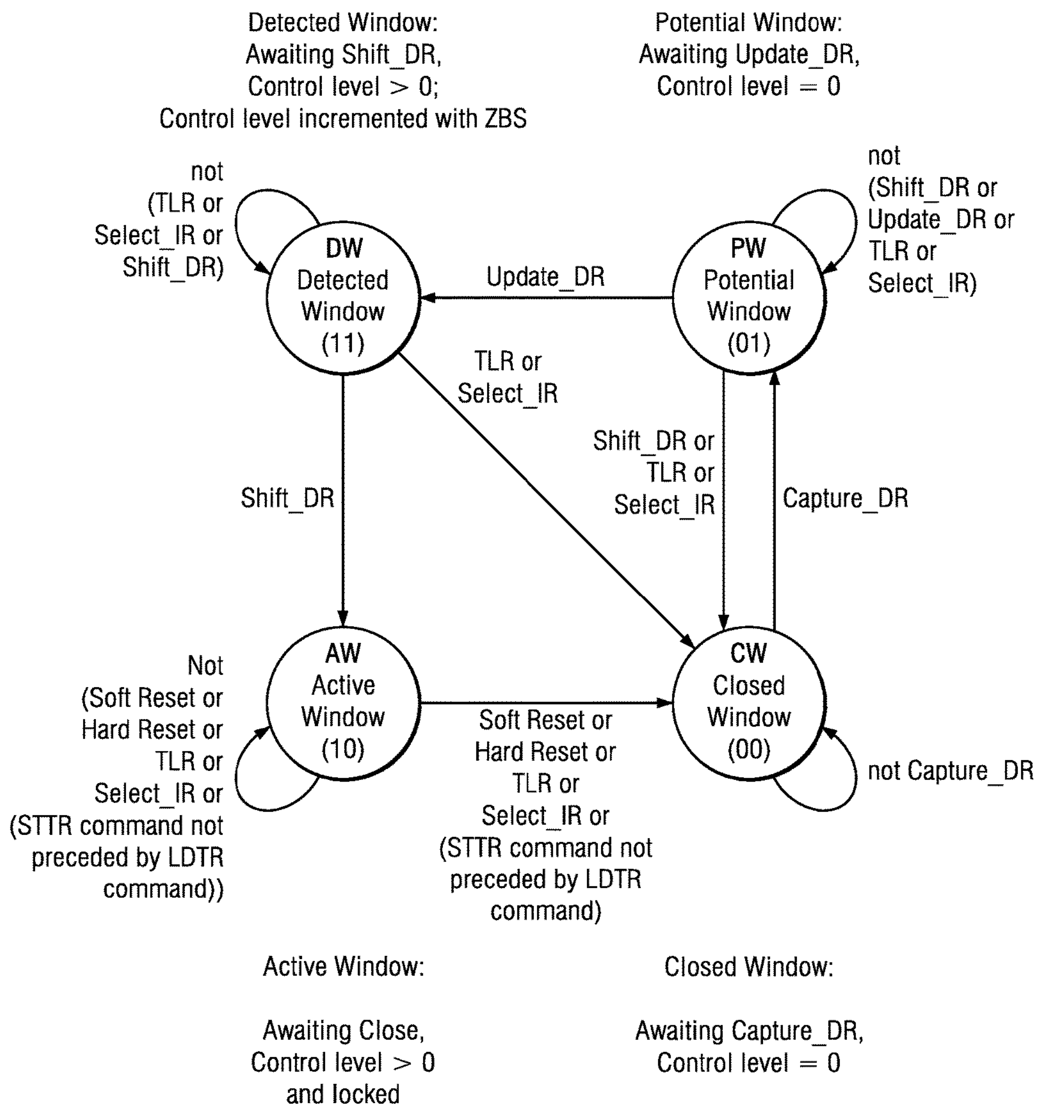
FIG. 45 is a diagram of Command Sequence State Machine Implementation.
Figure 48A:
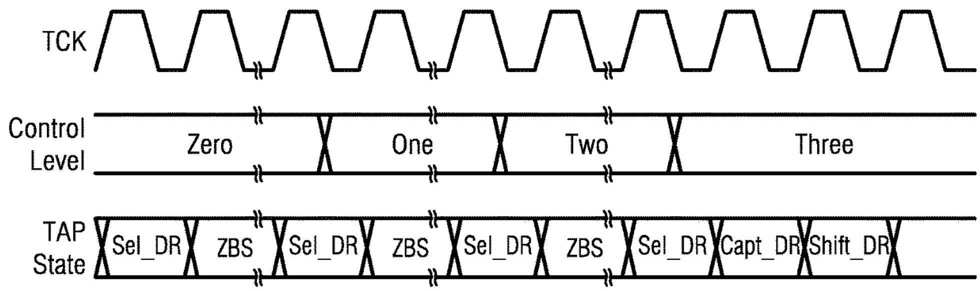
FIGS. 48A, 48B, 49A, and 49B are timing diagrams of ZBS and Command Window Relationships.
Figure 48B:
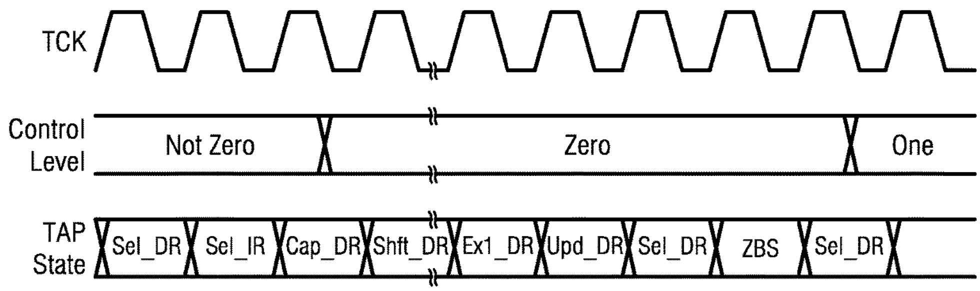
Figure 49A:
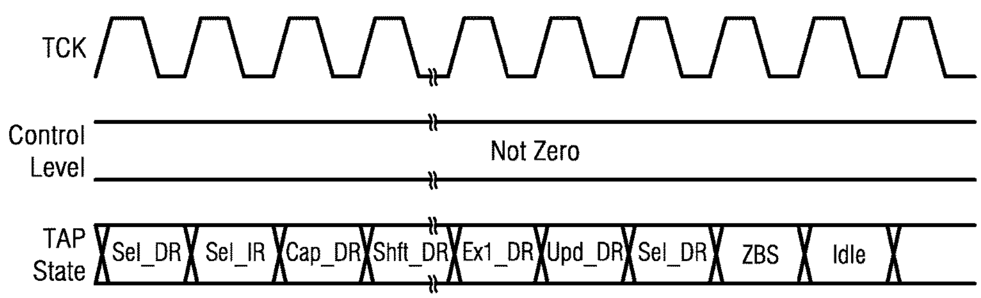
Figure 49B:
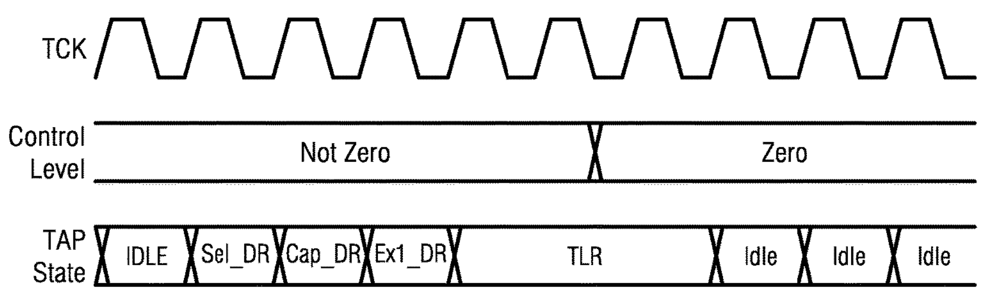
Figure 57:
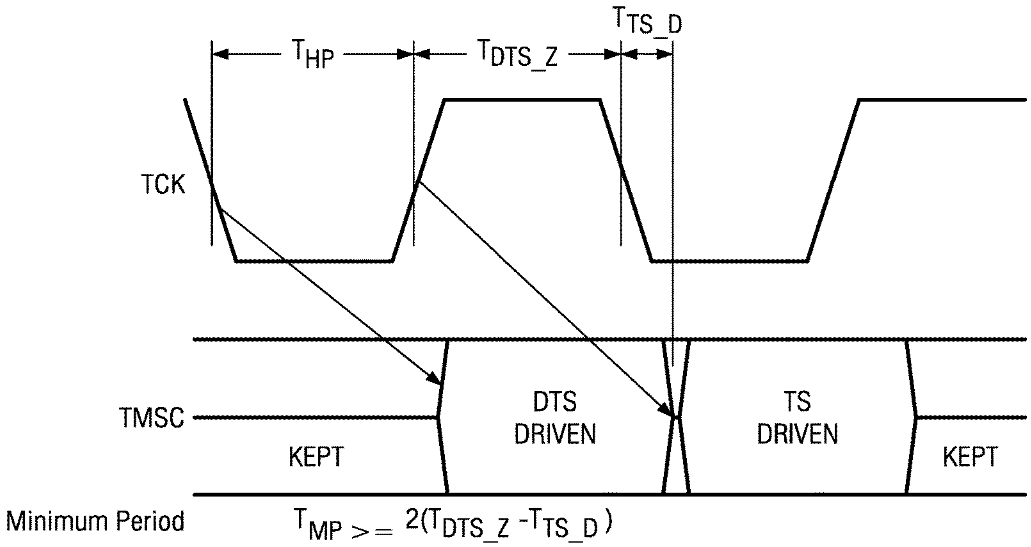
FIG. 57 is a timing diagram of No Drive Overlap when DTS Drives Followed by the TS Driving.
Figure 58:
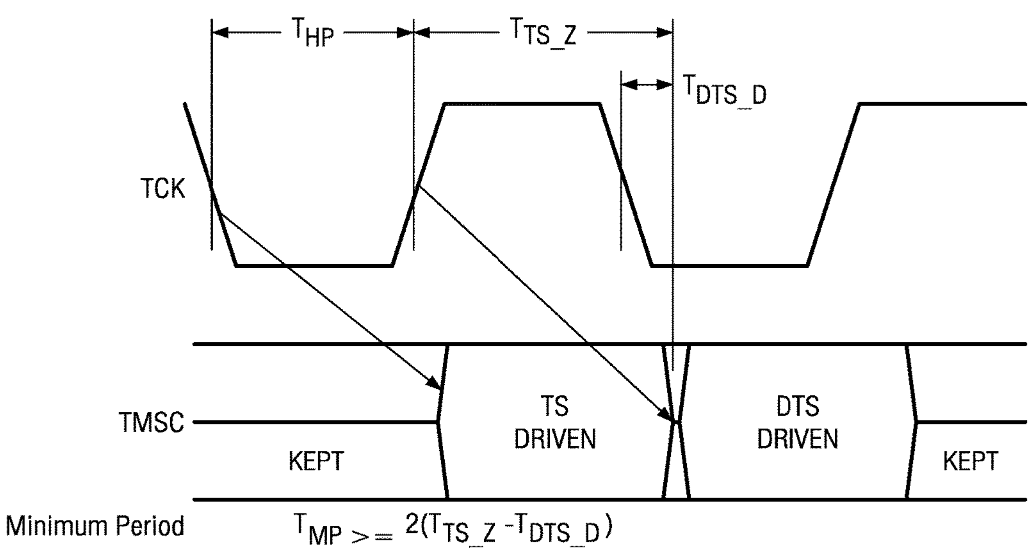
FIG. 58 is a timing diagram of No Drive Overlap when TS Drives Followed by the DTS Driving.
Figure 59:
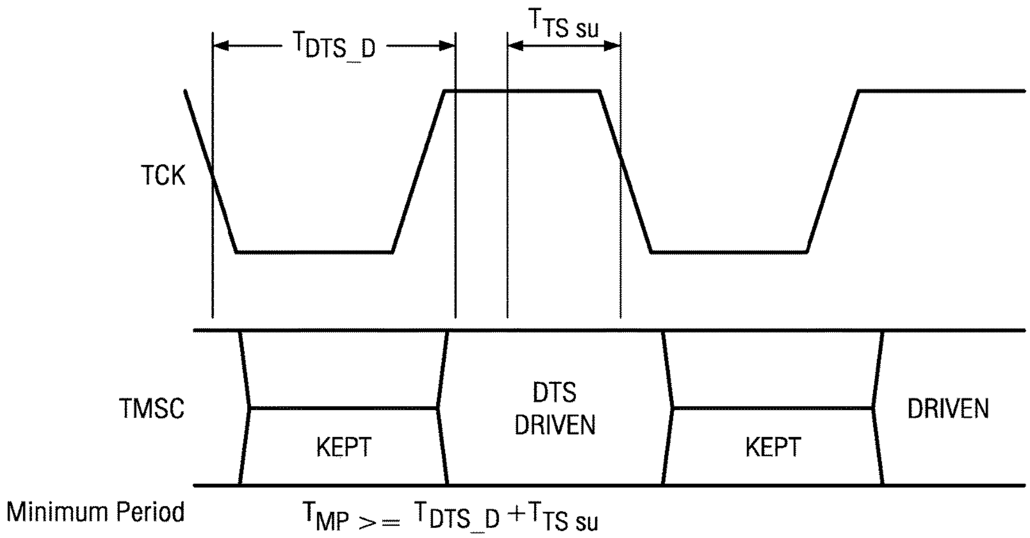
FIG. 59 is a timing diagram of TS Setup Time When DTS Drives.
Figure 60:
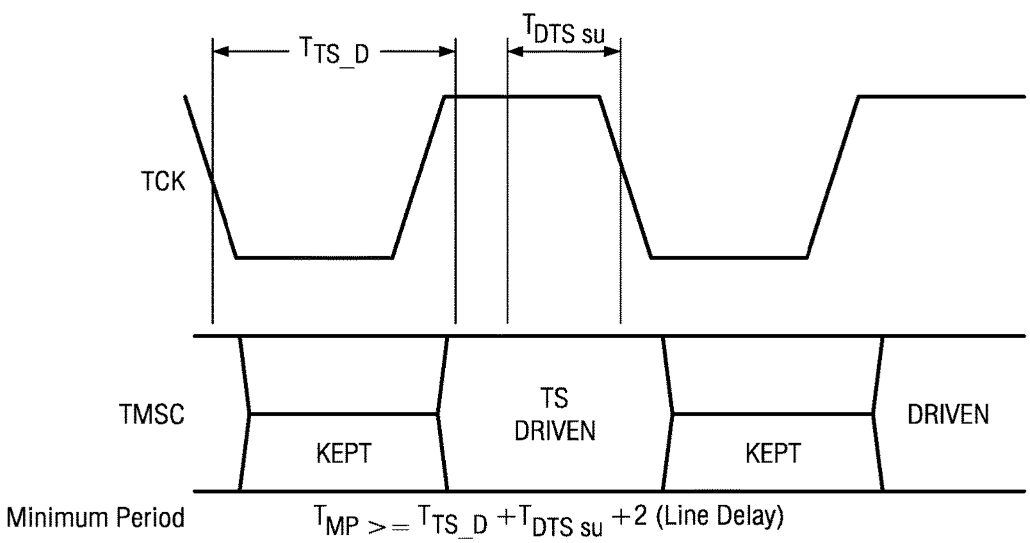
FIG. 60 is a timing diagram of DTS Setup Time when TS Drives.

The Command Sequence (CSEQ) state machine conceptual view is shown in FIG. 45. The state progression of Closed Window (CW)>Potential Window (PW)>Detected Window (DW)>Active Window (AW) enables cJTAG command execution. The sequence can be terminated and the state forced to CW with either the Select_IR or TLR TAP state. The Shift_DR TAP state forces the state to CW when the state is PW. A STR command that is not preceded by a LTR command forces the state to CW when the state is AW. The Update_DR TAP state increments the control level in either the PW or DW state. cJTAG commands are decoded only in the AW state.

The CSEQ state machine is implemented with a Flip-Flop and a control level counter. It uses the state encoding shown in FIG. 46. The most significant bit (MSB) of the state encoding shown in FIG. 47 is derived from the control level counter value. A counter value other than zero represents a one while a counter value of zero represents a zero. The least significant bit (LSB) of the state encoding is represented by the Capture Last Flip-Flop state.

The TAP state sequences detected by the command sequence state machine as a ZBS are shown in FIGS. 6A and 6B. In the case where the Pause_DR state is included in the sequence, a stay in the Pause_DR state of any number of clocks is permissible. Note a command window, once opened, is closed when the Select-IR-Scan or Test-Logic-Reset TAP state is encountered. A command window, once opened, is allowed to remain open unless closed by a software controlled command sequence.

A ZBS may begin in one of three CSEQ state machine states (CW, DW, and AW).

When a ZBS begins in the CW state a command window is opened with the control level set to one (see FIGS. 48A, 48B, 49A, and 49B). When a ZBS begins in the DW state, the command window remains open and the control level is incremented if the control level has not reached its maximum value. When a ZBS begins in the AW state, the control window remains open, the control level remains the same, and the ZBS is interpreted as a cJTAG command.

The command sequence state machine opens and closes command windows, detecting ZBS and determining the control level. This machine operates independent of the other machines, monitoring the TAP state to determine the control level. It awaits a ZBS when no control window is open. It then counts the number of ZBSs prior to a Shift_DR state to determine the control level. It closes the control window when the Select IR or TLR state is encountered, or a certain command sequence occurs within the window. This machine provides control level information to the other three major machines.

The machine notes a closed window, potential window, detection of the window, and activation of the window. cJTAG commands are enabled once the command window is activated. The window is closed when any of the close conditions occurs.

The signaling and electrical characteristics of the TCK pin are the same for the standard and advanced modes. This pin supports a pull-up and is used as the interface clock in both modes. There are two options for sourcing TCK. The TCK terminal may be: Supplied by the DTS to the TS, or Supplied by the TS to the DTS. These options are shown in FIG. 50. A system configuration with DTS-sourced TCK provides a transfer bandwidth as much as 50% larger than a configuration with a TS-sourced TCK. More link optimizations are available for use when the DTS supplies TCK. These configurations are compared in FIG. 51. The DTS treats cases (b) and (c) the same, as it cannot tell the difference between the two cases.

The Test Mode Select Compact (TMSC) pin functions as an input buffer, an output buffer, and a keeper. The TMSC pin is input only in standard mode, with the keeper forced to operate as a pull-up. The pin becomes bi-directional once the interface operating mode is changed to advanced, with the keeper maintaining the value last driven on the pin. Advanced protocols define the TMSC drive configuration on a clock-by-clock basis. The advanced mode uses four TMSC pin drive configurations:

An input—no drive with a keeper configured to maintain the last driven pin value Drive high only—output buffer drives high, multiple sources may drive high, with a keeper Drive low only—output buffer drives low, multiple sources may drive low, with a keeper Drive high or low—output buffer drives high or low, single source may drive, with a keeper These configurations are independent of the I/O voltage level. Drive high only and drive low only support simultaneous data output by multiple devices.

The Test Data In (TDI) and Test Data Out (TDO) pins are optional. They are included for a wide interface and deleted for a narrow interface. When a wide cJTAG interface operates in advanced mode, the TDI and TDO pins may be assigned to other debug functions. Reallocating these pins is important for maximizing the number of pins available for debug instrumentation and is especially important for chips that deploy pin-hungry debug functions such as Trace.

A Test Reset (nTRST) pin may be added to either the narrow or wide interface configurations. Since a TS holds its nTRST pin high with a pull-up, debug and test logic is not reset by this pin when the DTS is not connected to the system.

A boundary compliance enable (BCE) pin may be added to either the narrow or wide interface configurations. This pin provides failsafe operation, as test and debug logic is always held in test reset. Since a TS holds its BCE pin low with a pull-down, all TS TAPs are asynchronously forced to the TLR state when the DTS is not connected to the system. This pin may be viewed as having the functionality equivalent to the nTRST function, but with a low, true default value (on-chip pull-down when there is no connection to the chip). When devices with nTRST and BCE are used in a system, BCE and nTRST should not be directly connected unless they are continuously driven by an output.

Both the BCE and nTRST active states asynchronously initialize the TAP to the TLR state. Their assertion forces the interface operation to standard mode and creates the same state as a POR internally applied to the adapter. These signals have no affect if the interface is powered down.

The TCK and TMS drive characteristics are shown in FIG. 52.

The TS drive of the TMSC pin is shown in FIG. 53. Data is driven during the first half of the bit period (only when TCK is low) and held at the driven value by the keeper during the remainder of the bit period. This arrangement allows the overlap of data transmission and bus turnaround. These signaling characteristics maximize the Link bandwidth. The DTS may block the TS from driving TMSC by holding TCK high.

The DTS drive of the TMSC pin in advanced mode may use one of two drive options: Only when TCK is low (follows the same drive rules as the TS), and For the entire bit period when scheduled to drive the next bit period. Drive restricted to the only when TCK is low option is shown in FIG. 54. Drive using both options is shown in FIG. 55. This provides a means to force the interface standard operating mode by holding TCK high and toggling TMSC to reset the Link. It is permissible for the TS and DTS to drive the TMSC pin, provided they both drive the pin to the same value. This is called for by advanced protocol. For instance, the protocol allows the TMSC pin to be driven to a one (1) by both the TS and DTS when it is part of the MScan format.

The MScan format allows the TMSC pin to be driven by one or more sources. A single data value is transferred from the TS to the DTS using 2-bit periods. The TMSC pin is driven to a one (1) (pre-charged) by the DTS and TS during clock period n. During clock period n+1, the TMSC pin is driven to a zero (0) (discharged) only by those TS sources desiring a data value of zero (0). The DTS and TS sources that desire a data value of one (1) for this clock period do not drive the pin. The combination of the pre-charge, the keeper, and the discharge supports transfer of both ones (1s) and zeroes (0s) and the wire ORing of data from multiple TS sources. This is important for Link ID assignment. Should a single TMSC source be present, this mode can pass data to the DTS just as well as if TMSC was driven both high and low by the TS.

The TCK edge that samples TMSC input to the TS is programmable to either a rising or falling edge. POR sets the data sampling to rising edge. This assures the data is driven when it is sampled, but has the disadvantage of only allowing half a clock to propagate data between the DTS and TS. The sampling edge may be changed via the Link control register while the interface is operated in standard mode before there is a dependence on this setting (rising edge is always used in standard mode). Rising edge sampling improves Link Interface noise immunity while falling edge sampling substantially improves bandwidth. The debug software must comprehend the reduced operating frequency when rising edge sampling is used.

The link timing characteristics always allows the link operating frequency to be lowered to a point when the link becomes functional. The maximum operating frequency is governed by one of four factors:

Timing that provides no drive overlap when DTS drives followed by the TS driving Timing that provides no drive overlap when TS drives followed by the DTS driving Meeting setup and hold time when the DTS supplies data to the TS Meeting setup and hold time when the TS supplies data to the DTS The timing parameters associated with these factors are defined in FIGS. 56-60.

In summary, the maximum TCK period is the larger of the values generated by the following equations when the right half of the equation is positive.

$$T\text{period}>=(TTS\_D+TDTSsu)+2\text{ (Line Delay)};$$

$$T\text{period}>=(TDTS\_D+TTSsu);$$

$$T\text{period}>=2(TDTS\_z-TTS\_D);$$

$$T\text{period}>=2(TTS\_z-TDTS\_D);$$

For instance, if DTSD and TSD are 6 ns, DTSsu and TSsu are 3 ns, and the line delay is 0.5 ns, Tperiod is 10 ns.

The use of the TDI and TDO pins for debug functions other than their JTAG functions is subject to a hardware interlock. This interlock takes effect when the Scan Control register indicates an impending change to the operating mode. The assignment of these pins to functions other than the TDI and TDO functions may take place after these pins are no longer performing their TDI and TDO functions. These pins are reallocated to their TDO and TDI functions before they begin performing their TDI and TDO function.

The change in pin function occurs when a mode change is specified by the scan control register. Since debug software takes control when these events occur, it notifies functions sharing these pins in the proper sequence. It shuts down functions using these pins before notifying cJTAG to change to a standard interface. It starts these functions after advanced mode has been entered.

Figure 61:
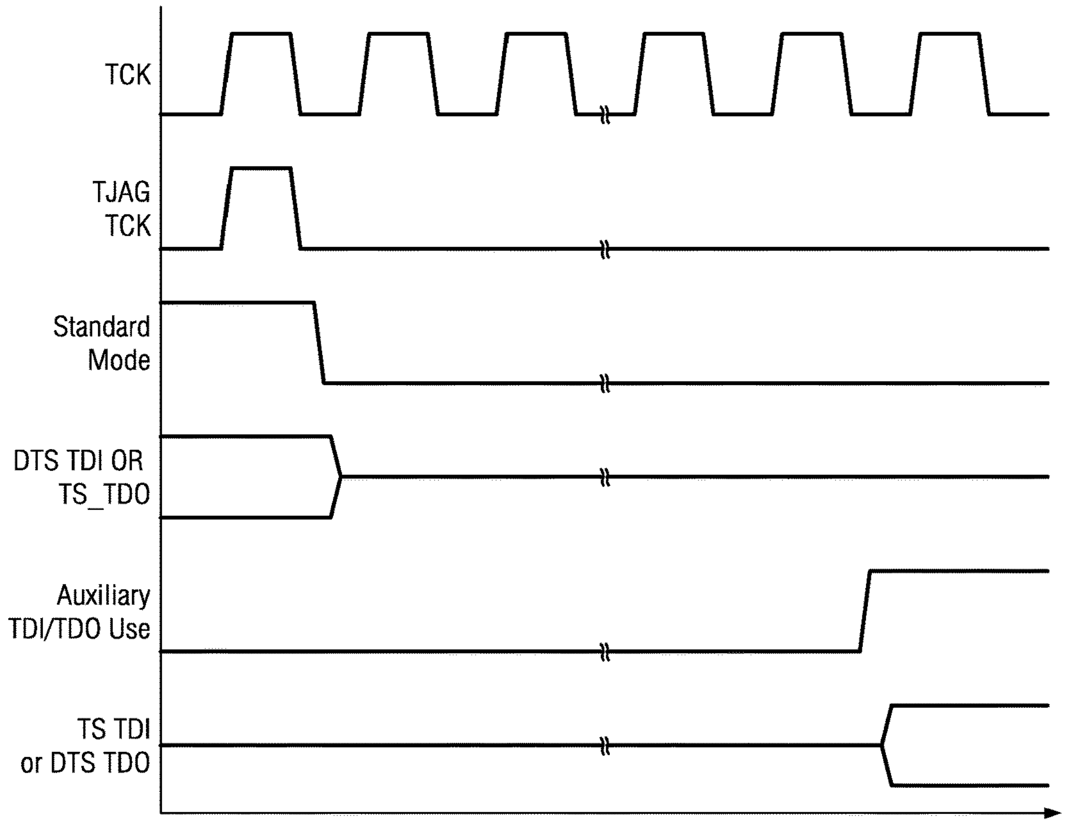
FIG. 61 is a timing diagram of Standard to Advanced Mode Change Implications.
Figure 62:
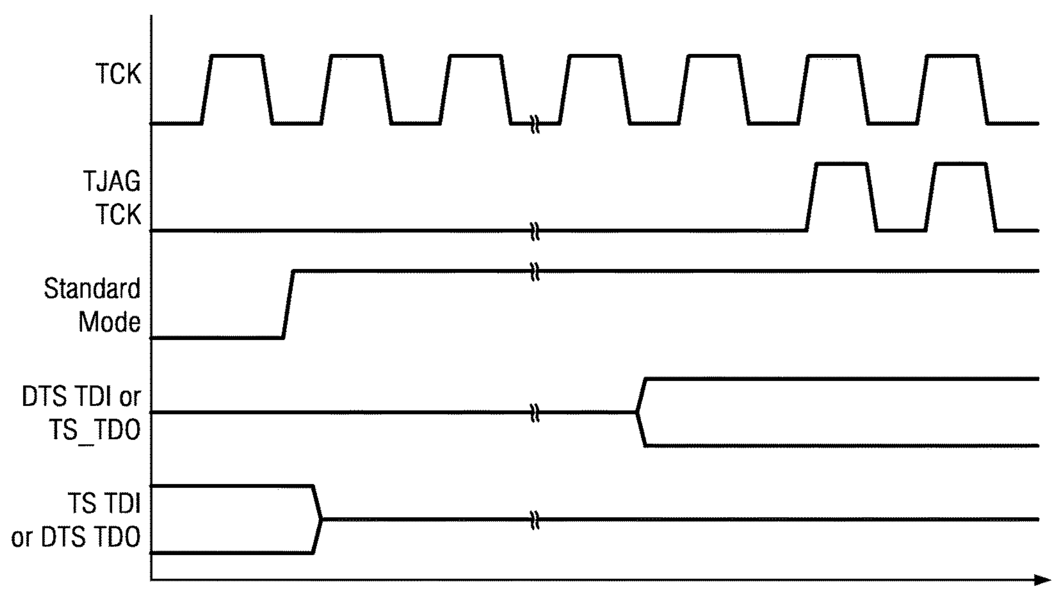
FIG. 62 is a timing diagram of Advanced to Standard Mode Change Implications.

A hardware interlock insures there is never a failure of basic debug communication or a drive conflict between the DTS and TS because of the alternate use of these pins. A failure of debug software to coordinate the secondary use of these pins with switches between standard and advanced modes, results in the failure of the alternate function assigned to the pin, but cannot cause a debug communication failure. These interlocks are shown in FIGS. 61 and 62.

Power Control

The cJTAG architecture supports power down of the majority of the cJTAG interface. Power down is controlled by logic external to the adapter. This logic is called the Power and Reset Controller (PRC) in this document.

Figure 63:
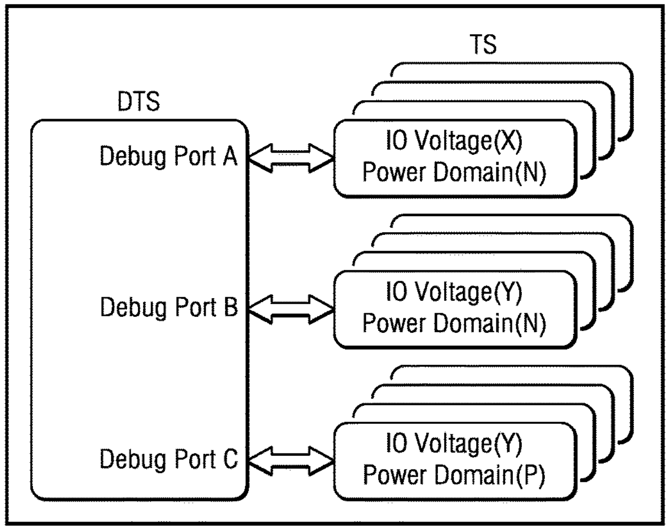
FIG. 63 is a block diagram of Multi-Port DTS.

The increased emphasis on minimizing power consumption is an important consideration for the cJTAG architecture as both board and chip power domains are included. In the extreme, devices' debug and test interfaces (DTI) may even be powered-down. It is expected that cJTAG-enabled devices may be deployed in systems that have some or all of the following power characteristics: Board power domains (all devices on board are not always powered), Devices sharing power domains, Devices in different power domains, and Mixes of power domains may be powered. The cJTAG system allows the debug of systems with these characteristics. Different I/O voltages cannot be connected and devices in different power domains may be turned off independently. Global control of debug actions requires the connection of devices in different power domains and with different I/O voltage levels to separate DTS ports as shown in FIG. 63.

The cJTAG architecture provides facilities to manage multiple ports and perform synchronized operations across these ports. The different DTS/TS configurations and characteristics are supported with four power-down modes. The TCK behavior (free running or gated) or TCK source (DTS or TS) play a role in the DTS selection of a power-down mode.

Four power-down modes are created from two power-down criteria: a test logic reset (TLR) TAP state with standard mode, and absence of a TCK falling edge within a one millisecond period. These four modes are listed below:

Mode 0—No power down allowed,

Mode 1—Allow power down in standard mode when the TLR state is reached and power down is requested, Mode 2—Allow power down standard mode when TCK has remained high for a minimum of 1 millisecond, after reaching the TLR state, and Mode 3—Allow power down in standard or advanced mode when TCK has remained high for a minimum of 1 millisecond in any TAP state.

Figure 64:
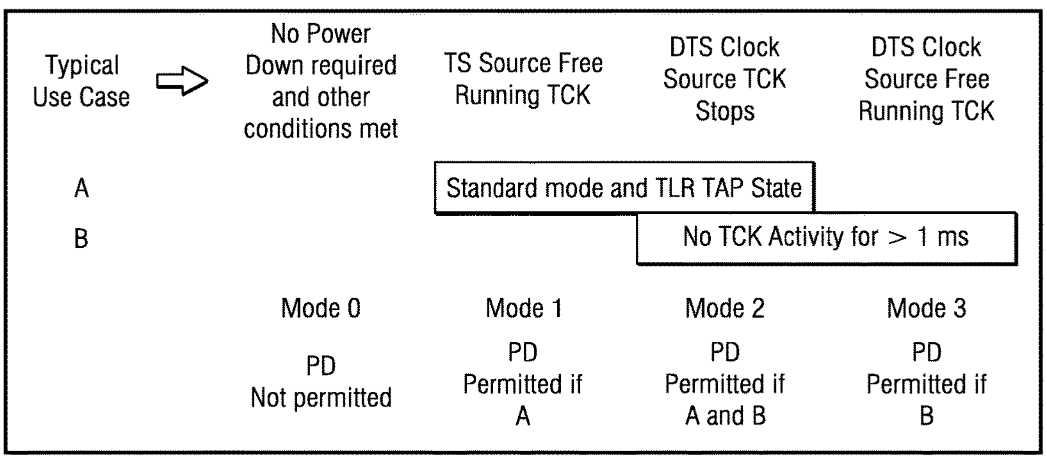
FIG. 64 is a diagram of Power-Down Modes.

A chip may implement one of four combinations of these modes as shown in FIG. 64.

The power-down behavior of the adapter is defined with the cJTAG control register. The implementation is very straightforward, as writes to the control register may only occur when none of the power-down criteria are met. An adapter reset that initializes the control register sets the power down mode to Mode 1. Specifying an unimplemented mode through the control register produces the same behavior as Mode 0.

Powering Up an Un-powered Adapter. A continuous low value on the TMSC pin notifies the PRC of the partial reconfiguration power requirement that the adapter and debug and test interface (DTI) must be powered. When the TMSC pin is asserted low for a minimum of 1 ms, the PRC is required to:

Power the DTI,

Reset the adapter with POR,

Remove the PRC power-down request to the adapter, and

Allow TCK to clock the adapter.

The cJTAG TAP becomes operational after these occur. Initialization of the interface places the TAP in the TLR state. Once the interface is released to operate, the TMSC input, already low, moves the TAP state to the IDLE state where it remains as long as TMSC remains low.

Power-Down Models. The adapter combines two power-down models; the first supporting Modes 0 and 1 and the second supporting Modes 2 and 3. The first, called the "affirmative response" model (AR), assumes TCK is running when a request to power down the adapter is made and possibly when power down occurs. The second, called "non-response" model (NR), assumes TCK is not running when power down occurs. With both of these modules the PRC must receive permission from the adapter before powering down the adapter or the Link Interface.

With the AR model, the PRC requests permission to power down the adapter. The adapter generates a power-down acknowledge when the power-down criterion are met. Before generating the acknowledge, the adapter performs an orderly shutdown of the JTAG interface, signaling the PRC when the shutdown is completed. Since the PRC requests permission to power down and the adapter generates the acknowledge when its response to the request is completes, the process is given the name AR.

When the TAP state reaches TLR and a synchronized power-down request is asserted (in either order), the following occurs:

TMS is set to a one (1) at the JTAG interface and the TMSC pin is ignored

One additional TCK occurs at the JTAG interface

The interface state moves to Power Down pd_ack is asserted

Figure 65:
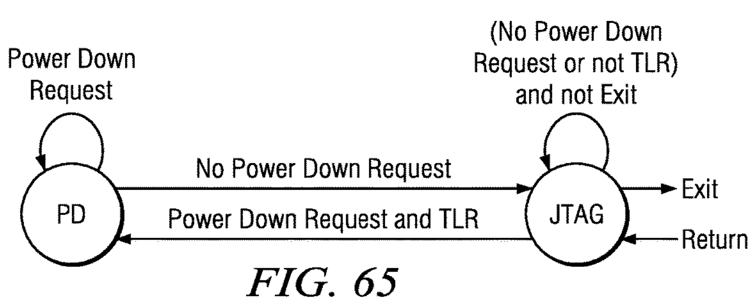
FIG. 65 is a diagram of AR Power-Down Model Operation.
Figure 81:
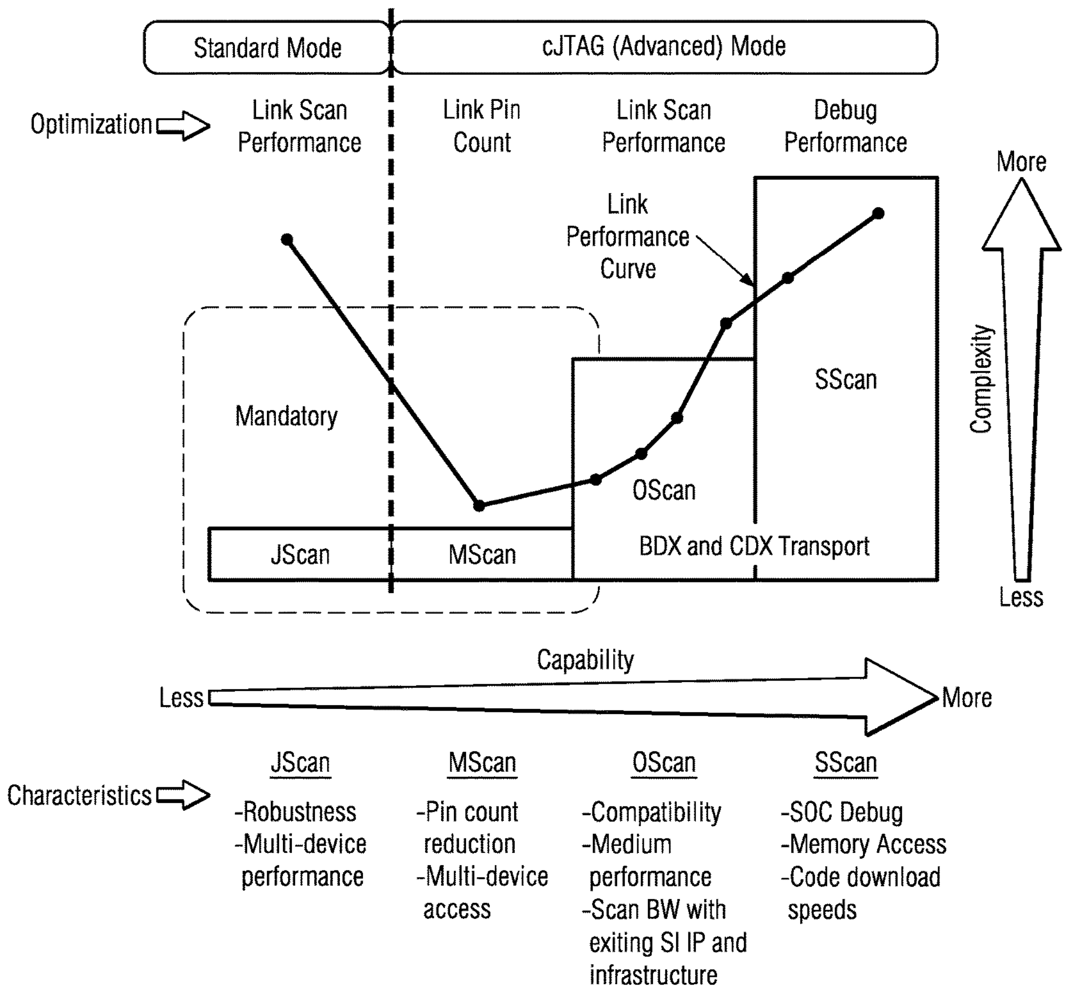
FIG. 81 is a diagram of cJTAG Capabilities.

A pictorial view of the AR model operation is shown in FIG. 65.

With the NR model, the PRC generates an event that may generate a power-down acknowledge (pd_ack). The adapter is responsible for generating a corresponding event to negate pd_ack within a fixed amount of time. This approach handles options 3 and 4, FIG. 66, where TCK is not running, as an adapter clock is required to negate pd_ack. In this model, the PRC sends a signal (time base) to the adapter that toggles with a period that is ½ the TCK inactivity period (>=1 ms) needed to generate pd_ack. The adapter qualifies pd_ack using a delayed version of the time_base XORed with time_base.

The adapter changing the state of time_base may generate a pd_ack. The adapter has from one edge of time-base until almost the next edge of time_base to negate pd_ack. If the time_base signal changes without a corresponding change in the adapter's copy of the signal by the time the PRC is ready to change the state of time_base again. TCK has been inactive for a sufficient period of time to meet the power-down criteria for Modes two and three. The PRC merely samples acknowledge prior to changing the state of time_base, using this value as the adapter's acknowledge when this type of signaling is used.

The Adapter's power control (PRC) interface is shown in FIG. 67. The power-down request (pd_req), power-down acknowledge (pd_ack), and time-base (time_base) signals need little further explanation. The PRC initializes the adapter with the power-on-reset (por) signal during and after power up. It may use por to hold the adapter in its initialized state. The power-down non-responsive (prc_pd_nr) signal informs the PRC whether pd_ack behavior is affirmative or non-responsive. Since the programming of the adapter power-down down mode occurs when power-down criteria are not met, changes in this signal occur when pd_ack is negated. Adapter resets cause the simultaneous assertion of pd_ack and negation of prc_pd_nr.

Examples of AR and NR sequences are shown in FIGS. 31 and 32. In the AR case, the interface operation moves to a special state called Power-Down (PD) coincident with the assertion of pd_ack. The adapter will remain in this state until the interface is powered down or synchronized when pd_req is de-asserted. The Chip Power and Reset Controller (PRC) is free to reset and power down the adapter once pd_ack is asserted. When PRC powers down the DTI, the TMSC buffer remains powered as it is used to request power-up. The TCK buffer may be powered down.

In the NR case, the JTAG interface TAP state may be TLR in the case of Mode 2 or any state in the case of Mode 3. The prc_pd_nr signal is a one (1) when either of these modes is used. The PRC cannot use pd_ack without sampling it just prior to changes in state of time_base.

PRC Responsibilities. The PRC may:

Implement no power-down facilities. In this case, the adapter and cJTAG interface will remain operable while any portion of the chip remains powered;

Implement only Option 1. In this case, the adapter and cJTAG interface:

will tie off the time_base signal to either a one (1) or a zero (0), will implement pd_req and pd_ack, will make the adapter operable when TMSC is held low for the prescribed period, will keep the TMSC input buffer powered, may power down the TCK input buffer, may treat the pd_ack signal as always valid, and may ignore the pd_nr signal.

Implement only Options 2 and 3. In this case, the adapter and cJTAG interface:

will tie off the pd_req signal to a zero (0), will implement time_base and pd_ack signals, will make the adapter operable when TMSC is held low for the prescribed period, will treat the pd_ack signal as valid just before it changes the state of time_base, will keep the TMSC input buffer powered, may power down the TCK input buffer, and may ignore the pd_nr signal.

Implement Options 1, 2, and 3. In this case, the adapter and cJTAG interface:

will tie off the pd_req signal to a zero (0), will implement the pd_req, time_base, and pd_ack signals, will make the adapter operable when TMSC is held low for the prescribed period, will do one of the following:

Ignore the pd_nr signal and treat the pd_ack signal as valid just before it changes the state of time_base, Use the pd_nr signal to define the behavior of the pd_ack signal;

If '1', pd_ack is valid just before it changes the state of time_base, or

If '0', pd_ack is valid any time it is asserted, will keep the TMSC input buffer powered, and may power down the TCK input buffer.

Link Protocols

Three protocols are used to manage cJTAG capabilities: Command sequences, Escape sequences, and Packet sequences. One or more of these protocols is used to deliver cJTAG capability.

Command Sequences. Data register scans are used to broadcast command sequences to the DTS and all TS adapters. The method used requires no knowledge of: Instructions supported by the chip TAPs (JTAG op-codes), DR or IR scan path lengths, Chip identification numbers, or Any other piece of scan topology information. These sequences control adapter operation in either standard or advanced modes using only the TCK and TMSC pins. Sequences are the same for all operating modes, wide and narrow interface configurations, and all scan formats.

Command sequences change the cJTAG operating characteristics by assigning cJTAG-specific functionality to DR Scans performed within command windows. Command windows are cJTAG control levels above the current JTAG instruction register/data register control level. Command windows are opened in an identical manner in either standard or advanced cJTAG modes. This approach makes cJTAG compatible with all JTAG conforming systems in place today.

A cJTAG control level is, in a hierarchal sense, above the instruction and data scans used to manage the TS state. It simultaneously broadcasts the cJTAG commands to the DTS adapter and its TS adapters, requires no knowledge of the connection topology on the DTS side of the TS adapter, requires no knowledge of the scan topology on the system side of the TS adapter, does not affect the TS state, and uses data register scans and inert instructions such as BYPASS.

Command windows (CWs) are opened with a novel use of the JTAG state diagram. Zero-bit, data register scans (ZBS) are used to set the control level. A ZBS is any TAP state sequence that starts with the Capture_DR state, ends with the Update_DR state and does not include the TLR or Shift_DR state. The number of consecutive ZBSs prior to Shift_DR TAP state entry defines a specific control level with the control level beginning at zero (0). Once the Shift_DR TAP state is entered, the control level is locked and additional ZBSs cannot change the control level while the CW is open as shown in FIG. 7. CWs are closed by the TLR and Select_IR TAP states. A CW is also closed by the various cJTAG resets or a command sequence designed to close the CW. The IR should be loaded with an inert instruction prior to setting the control level. This step may be deleted if beginning from a TLR state.

Once the control level is locked, DR Scan activity performs functions associated with the level. The functions at each level may be similar or different as shown in FIG. 8A. The number of control levels supported is up to the implementer but shall not be less than seven.

The first five control levels are allocated to cJTAG functions while all levels above these are private control levels. Unused private levels assign no functionality to DR Scans. Level 1 supports the use of DR Scans for CDX, if the advanced mode is being used and the CDX function has been previously enabled. Control Levels 2 and 3 support cJTAG control register changes. Level 2 permits cJTAG output while the Level 3 does not. In this case, TDO is HI-Zed in standard mode and the TS data is always a one in advanced mode. The function of chip adapters may be customized using private levels. The DTS may use any public or private control level not used by all adapters connected to the Link.

Private control levels may use DR Scans to convey information to the TS and return data to the DTS. It shall not alter the link state sequence being used at level zero (0). An enable bit shall be implemented in a cJTAG control register qualifying the use of a level by any chip function. This allows sharing of levels by many chips and prevents accidental activation of these functions. Private levels may be used in standard mode, advanced mode, both modes, or not used at all.

An inert op-code (e.g., BYPASS or IDCODE, etc.) must be placed in all instruction registers prior to opening a CW to ensure DR Scans within a CW are treated as no operations (NOPs) by the TAPs connected to the adapter JTAG interface. An inert op-code is placed in the instruction register by the TLR state or by an instruction register scan. The TLR case simplifies cJTAG management from startup, as a command window may be opened without an IR Scan. At other times, the DTS software must place an inert op-code in the JTAG instruction register of all TAPs connected to the adapter before it opens a CW.

cJTAG control registers manage all programmable cJTAG attributes. These registers are initialized by POR and subsequently accessed with data register scans in either standard or advanced modes. The Link operating characteristics are changed by writes to these registers once a command window enabling these writes is reached. The cJTAG control registers are changed concurrently in both the DTS and the TS.

A novel way of generating the cJTAG data used is to write cJTAG control registers that support broadcast of commands to multiple cJTAG interfaces, using the length of a data register scan to create data as opposed to actual scan data. A scan counter, zeroed by the Capture_DR state and incremented each Shift_DR state, determines the length of the data register scan. The five LSBs of the scan count are used as data. Since the length of the scan is conveyed solely by the TMS value, the DTS adapter and all TS adapters receive this information simultaneously, making command broadcast independent of the scan topology of the TS.

cJTAG control registers are read or written using the load temporary register (LTR), see FIG. 8B, and store temporary register (STR) commands. These commands use the 5-bits of data in combination with the Update_DR TAP state. Data values of 16 or greater generate a LTR command, while data values less than 16 generate an STR command. The LTR command loads a temporary register with the four LSBs of the count when the Update_DR state is reached. Data values less than 16 generate a STR command when the Update_DR state is reached, loading a cJTAG control register with the TEMP register value or performing another action. In this case, the four LSBs of the count specify the command or action as follows: Count+Update_DR goes to 0xxxx STR_command, 1xxxx LTR command goes to TEMP.

An STR command must be preceded by an LTR command for command execution for the STR command to occur. An STR command not preceded by an LTR command closes the command window with the STR command ignored.

A typical change of a single control register value is shown below:

ZBS(2)

LTR—Shift_DR (length=16+temp data)

STR—Shift_DR (length=command)

STR (ZBS)—closes command window, or close with the TLR or Select_IR TAP state.

The first two ZBSs set the control level. The first Shift_DR state of the LTR locks the control level at two. The LTR command loads the TEMP register. The STR command dispositions the TEMP register. The last STR or an IR_scan closes the command window. A ZBS can be used for the STR command.

The cJTAG commands also provide command sequences to read cJTAG status and other information. Additional commands are reserved for cJTAG expansion, test, and DTS use. Test commands provide a means to implement chip-specific test capabilities. Controller-specific functions such as basic link management (clock source determination, reading pin values, port selection, clock management and the like) totally within the cJTAG architecture may be implemented using DTS commands. Multiple DTS ports, and global commands sent to multiple chips or multiple DTS ports are all comprehended by this control mechanism. More sophisticated functionality, such as the DTS management of the power up and down of multiple TS cJTAG interface(s), is comprehended by this control mechanism.

Escape Sequences

Escape sequences, see FIG. 17, are DTS control information generated using a special relationship between the TCK and TMSC. The DTS may generate escape sequences, if and only if, it sources TCK while the TS detects and applies them.

All escape sequences are generated using the same protocol. The DTS generates an escape sequence by stopping TCK high and then creating a number of TMSC pairs. The number of times the TMSC pin is toggled (in pairs) while TCK is high determines the escape sequence. Zero or one edge is ignored. More than one edge generates one of the escape sequences shown in FIGS. 17 and 68.

The number of edges is n or n+1 because one edge may be generated by a normal TMSC transition while TCK is high. Since a normal TCK edge may or may not be generated for a specific TCK period, or may occur while TCK is low or TCK is high, this edge may or may not be counted. The edges created by the DTS after it has forced TCK will be counted. The adapter accounts for this uncertainty by assuming an even and odd edge count are equivalent.

The End-of-Transfer escape sequence is used to end certain scan, BDX, and CDX transfers. The most efficient transfer encoding uses End-of-Transfer escape sequences to terminate: Shift operations, Scan segments, BDX, or CDX transfers. An End-of-Transfer escape sequence is automatically generated by link activity terminating these cases. This escape sequence is ignored unless the adapter interface is operation in advanced mode and the adapter state expects it.

The Soft-Reset escape sequence is used to place an offline adapter online. This escape sequence is ignored unless the adapter interface is operating in advanced mode and is in a state that expects it. It places devices in the JTAG compliant mode, de-selects all adapters, and closes an open command window without initializing other aspects of its configuration. Soft-Reset escape sequences are accepted: Immediately after a register write, provided the operating mode is advanced, or Anytime, if the cJTAG adapter has been placed offline by enabling an unsupported feature.

The DTS shall generate a soft reset: With a register write to a DTS control register in advanced mode, While the operating mode is advanced, or Expecting an operating mode to change to advanced with JTAG compliant operation following the register write.

A Hard-Reset escape sequence provides a functional equivalent to nTRST or BCE. It asynchronously changes the system state in either the standard or advanced operating modes. This escape sequence is recognized and used if it is detected between any two TCK falling edges or from POR when TCK is always held high. This means it may be generated every bit period independent of the adapter state and whether a Hard Reset occurred during the prior bit period. It is never ignored.

An escape sequence is superimposed on TMSC activity. One or no TMSC edges may be generated by the TMSC value in a bit period bounded by two falling TCK edges by normal TMSC activity before the escape sequence generation begins. An edge generated by normal TMSC activity may occur while TCK is low or after TCK has gone high. This is the reason at least two edges must be detected while TCK is high and either an even number or odd number of edges are treated the same.

An escape sequence is generated when the DTS: Drives TCK low, Drives the TMSC pin with TCK low to the TMSC bit value for this period, Drives TCK high, Drives the TMSC pin to the inverted data value of the initial TMSC data no sooner than the edge would have been generated if it were the DTS value sourced for the next TCK period, Drives the TMSC pin to the initial data value no sooner than the edge would have been generated, if it were the DTS value sourced for the next TCK period, Two previous steps are repeated to create the proper escape type, if necessary, Drive of the TMSC pin is stopped, with the keeper holding the pin value, Leaves the TMSC pin value at this state for the required period (1 TCK period at Max. Freq.), and Restarts normal TCK and TMSC pin activity The end-of-transfer and soft-reset escape sequences interact with the adapter in a synchronous manner. The hard-reset escape sequence interacts with the adapter in an asynchronous manner.

An escape sequence combined with TS output is shown in FIGS. 17 and 69. In this case the: Clock is driven low by the DTS, TS drives the TMSC pin with TCK low, Clock is driven high by the DTS, TS drive of the TMSC pin is stopped, with the keeper holding the pin value, DTS then reads the TMSC pin value, DTS drives the TMSC pin to the inverted data value it just read, DTS drives the TMSC pin to the non-inverted during the following period, Two previous steps are repeated to create the escape type, if necessary, DTS drive of the TMSC pin is stopped, with the keeper holding the pin value, DTS leaves the TMSC pin value at this state for the required period (1 TCK period at max. freq.), and DTS restarts normal TCK and TMSC pin activity.

Note that both the input and output escape sequences provide a one clock period where the last TMSC value is stable so that there are no setup-timing considerations for this operation. An escape sequence, when TCK is being held high, is shown in FIGS. 17 and 70.

The DTS will: Generate pairs of edges beginning from the signal level last driven on the TMSC pin, Return the TMSC pin to the level that was on the pin prior to generation of the escape sequence, Assure the TMSC pin is at the same level for the time equal to one TCK period of the maximum Link operating frequency before generating a TCK falling edge following the escape sequence.

Commands and Registers

Link operation is managed with the commands listed in FIG. 8 and the three control registers listed in FIG. 71. The control facilities are usable in either standard or advanced mode. Certain aspects of Link operation, such as the TCK source, are defined by the target system. The predefined commands manipulate various bits of the predefined registers (LINK_CNTL, SCAN_CNTL, and XPORT_CNTL).

Commands sequences are used to: Configure the Link, Specify the scan format, Specify the transport format, Select and de-select adapters whose IEEE 1149.1 interfaces are active, Select an adapter or BDX transfers, Enabling and disabling BDX and CDX transfers, Assignment of Link IDs, Invalidation of Link IDs, Defining the power attributes of the interface, Defining the data transfer characteristics of the interface, Implement custom chip functions, Implement DTS functions, and Broadcast and Targeted Commands. Most commands are broadcast to all adapters. Examples of this are commands specifying the scan and transport formats. Other commands such as those that select adapters are seen by all adapters but select an adapter of interest.

The LTR command part of the command sequence carries the Link ID of the adapter of interest when a command is intended to apply to a specific adapter. The STR part of the command sequence specifies the command action.

There are three command classes: Assigned, Reserved, and Extended. Assigned commands perform basic cJTAG functions and have fixed functionality. Reserved commands have no operations and may be defined in future cJTAG specifications. Extended commands provide customization of the cJTAG interface. Unimplemented command sequences are no operations.

The extended command provides customization for: Future cJTAG extensions, Adapter specific Test and Debug capability, and DTS capability.

Four extended commands (EXC0, EXC1, EXC2, and EXC3) are available along with sixteen command pages. The four commands apply to the extended command page specified by an extended command page register (LECP command). This provides a total of 64 commands.

Allocating extended commands resource to the DTS makes managing the host and target sides of the interface easy. They appear to share the same register space, with actions occurring precisely at the same time in each interface. This provides a means for a DTS to: Manage multiple ports, and Interrogate the interface characteristics at start-up. The cJTAG commands are further described in FIG. 72.

The formats for the Link Control, Scan Control, and Transport Control Registers are shown in FIGS. 73, 74, and 75. The control registers are write-only although the architecture provides for implementing reads as an unspecified option. These register may be written: When the link is operated in either standard or advanced mode, In the command window using the same command sequences in either interface mode, and In Both TS and DTS. Both the DTS and TS parts of the Bridge contain a set of common registers. These register are: Initialized at the same time, and Loaded at the same time. This provides synchronized DTS and TS operation. Additional registers may be implemented unique to each chip or in the DTS as the reserved register space permits.

In FIG. 73, the M stands for mandatory; the A stands for deleted if multi-drop communication is not supported; the B stands for may be deleted if interface always remains powered; the C stands for may be deleted; and the D stands for may be deleted. In FIG. 75, the M stands for mandatory; the A stands for deleted if no BDX or CDX; the B stands for deleted if no BDX; and the C stands for deleted if no CDX. If both BDX and CDX are not supported, the Transport Control Register is replaced with one bit that is loaded with Logical Or of both enables. This bit, when set, indicates a non-supported but enabled feature and causes the adapter to be placed offline.

The control registers are initialized following the assertion of: POR, BCE or nTRST low, CRES—Hard-Reset escape sequence, CTO—Link Timeout (failure to maintain an interface heartbeat during protocol stalls), and CDIS—Link Disconnect (TMS delivered as a one or two consecutive scan packets with advanced mode and TLR TAP state)

The Link Control register is detailed in FIG. 76. The Scan Control register is detailed in FIG. 77. The Transport Control register is detailed in FIG. 78.

Control Register initialization creates the following attributes: Standard operation with or without firewall, BDX is disabled and not selected, CDX is disabled, Initial configuration selects device based on firewall, Link ID set to 0x0 and valid, Data sampling is set to the TCK falling edge because CC[1:0] is reset to 00 at POR, and Debug interface powers down in TLR TAP state unless TMSC is held low.

Extended (private) registers may be added and referenced via the extended command page (ECP[3:0]). Extended commands are available to manage these registers. The control registers are programmed using the same sequences in standard and advanced modes. An inert instruction such as BYPASS must be placed in the instruction register before opening a scan window.

A command sequence materially affects the system configuration as viewed from the Link interface. A command or command sequence is used to cause a system action. Commands are constructed from a combination of an LTR command followed by an STR command. Single STR commands are not used as this does not provide failsafe hot-connect protection and would consume commands rapidly.

A command sequence is created with a LTR/STR command combination:

- LTR Command—A data register scan of all ones (1s) or other data,
  - n bits in length where n=0x10|(Payload & 0xF),
  - Ending in the Pause_DR TAP state,
  - Subsequent progression through the Update_DR TAP state (a completion sequence),
    - Without progression through the TLR TAP state,
    - Routinely created by the following command,
    - If SOA, the bit is not set,
  - Temp register noted as loaded
- STR Command—A data register scan of all ones (1s) or other data,
  - n bits in length where n=Store command & 0xF,
  - Ending in the Pause_DR TAP state,
  - Subsequent progression through the Update_DR TAP state (a completion sequence), Without progression through the TLR TAP state, Routinely created by the following command or command activation, Action occurs if preceded by LTR command, otherwise the command window is closed, Commands are decoded for control level two or three. An LTR followed by an STR command causes an action. A few common actions are shown below:

Disable Firewall: IR_Scan with Bypass Instruction, ZBS, ZBS, LTR (DR_SCAN (JSCAN0+16) bits), STR (DR_SCAN (SSF command) bits), and IR_Scan (Bypass Instruction).

Change to OScan7 format: IR_Scan (Bypass Instruction), ZBS, ZBS, LTR (DR_SCAN (OSCAN7+16) bits), STR (DR_SCAN (SSF command) bits), and IR_Scan (Bypass Instruction).

More than one action can be generated within a command window as shown in the three action cases shown below:

IR_Scan (Bypass Instruction)
ZBS
ZBS
LTR (DR_SCAN (Temp_data+16) bits)
STR (DR_SCAN (command) bits)
LTR (DR_SCAN (Temp_data+16) bits)
STR (DR_SCAN (command) bits)
LTR (DR_SCAN (Temp_data+16) bits)
LTR (DR_SCAN (command) bits)
IR_Scan (Bypass Instruction)
ZBS within Control Level If the control level is non-zero, a ZBS is interpreted as a Store Control Action (SCA) command. The SCA command is used to: Clear all scan pre-selections (PS[1]=0), Clear the BDX transport selection (BS=0), Load the two-bit Clock Control (CC) field (CC[1:0]), Load the two-bit Power Control (PC) field (PC[1:0]), and Load the two-bit Delay field (DL[1:0]). The SCA command causes the above actions when the appropriate bits are set in the TEMP register.

A Make Scan Selection (MSS) command pre-selects a device for scan. The MSS command sets the PS[1] bit when the: LID field is valid, LID field equals the TEMP value, and TAP Update_DR state occurs. If the above conditions are not met, the PSS bit remains in its current state.

A Make Transport Selection (MTS) command selects a device for a BDX transfer. The MTS command sets BS when the: LID field is valid, LID field equals the TEMP value, and TAP Update_DR state occurs. If the above conditions are not met, the BS bit is cleared.

A Store Link ID (SLID) command assigns a Link ID to a device if the device is isolated, no devices are pre-selected, and the advanced mode is selected.

An Invalidate Link ID (ILID) command invalidates the Link ID if it either matches TEMP or (PSCS[1]=0). It also clears the PS[1] bit and sets PSCS[1:0] to "01".

A Store Transport Format (STF) command moves TEMP [3:0] to TF[3:0].

A Store Scan Format (SSF) command moves TEMP[3:0] to SF[3:0].

A Read Status or Serial Selection (SRS) command performs two different functions depending on the interface operating mode: Standard—Designating the next data register scan as transferring serial pre-selection data, and Advanced—Reading the Node ID and other status data.

A Load Extended Command Page (LECP) command loads the extended command page. The four-bit command page is shown in FIG. 79. The four extended commands may store four 4-bit page specific values.

A Read Extended Command Page (RECP) operates like the SRS command. In advanced interface mode the RECP command causes the device whose Link ID matches TEMP to output the scan path specified by the extended command page. This path is serially scanned out, with the LSB output first.

Extended Commands (EXE#) (EXC0, EXC1, EXC2, and EXC3) are associated with a page and may be defined differently for each page. These commands afford the cJTAG user the opportunity to add customs test or debug functionality to the cJTAG interface.

TS reserved cJTAG commands are to be defined. These commands are treated as NOPs and may not be used by the DTS or TS conforming to this specification revision.

Assert TRST (ECP=0) & (EXC0) & Temp=0bxx01 De-assert if Temp !=0bxx01

Assert FLAT<=(ECP=0) & (EXC0) & Temp=0b10xx De-assert if Temp !=0b10xx

All reset events de-assert these signals.

An example of how test/debug commands could be implemented is shown below. This is merely an example and is not part of the cJTAG specification. The Test Commands require a specific 4-bit value and the extended command code to cause an action.

TRST Assert if (ECP=1) & (EXC0) & Temp=0bxx01 De-assert if Temp !=0bxx

TEST_SEL Assert if (ECP=1) & (EXC0) & Temp=0b10xx De-assert if Temp !=0b10xx

Test Func 2 Assert if (ECP=1) & (EXC1) & Temp=0bxx10 De-assert if Temp !=0bxx10

Test Func 3 Assert if (ECP=1) & (EXC1) & Temp=0b01xx De-assert if Temp !=0b01xx

All reset events de-activate these functions.

Extended Command Pages (ECP[3:0]) provide a means to extend cJTAG functionality in subsequent specification revisions and add custom chip and DTS registers and commands. Some extended command pages are pre-defined and others are reserved as shown in FIG. 79. The extended command page functions are disabled so as to not affect the operation of system TAPs, system test logic, or cJTAG interface after any reset event initializes the control registers. The only exceptions to this are test modes that change the chip operating mode to private operation where pin functions or other capabilities are modified. A POR shall always return chip operation to a state where cJTAG and the system to which it attaches are fully operable to perform each and every function available via the Link.

Link ID (LID[4:0]) is used to: Identify an adapter in a cJTAG Star configuration, Note that a Link ID has not been assigned to an adapter, and Identify an adapter that has been chosen for Link ID assignment. The Link ID encoding is shown in FIG. 80.

Clock Control (CC[1:0]) bits inform the adapter about the clock source (CC[0]) and TCK edge used to sample TMSC (CCM). The DTS determines the TCK source and then informs the adapter of its determination before switching to an advanced mode. The adapter takes actions to use scan formats compatible with a DTS supplied TCK, as the use of a TS supplied TCK prevents the use of escape sequences.

The sampling of the TMSC pin by the DTS and TS in advanced modes is controlled with CC[0]. Sampling may be programmed in the middle or end of the bit period. Sampling in the middle of the bit period assures the TS samples the TMSC pin while it is driven by the DTS for all advanced formats. The DTS and TS sample the TMSC pin while it is driven by the TS for scan formats other than MScan. The kept value of TS output is sampled by both the TS and DTS when the MScan format is used, independent of the CC[0] bit.

Power Control (PC[1:0]) bits determine the power-down criteria of the interface: Allow power down in TLR state, No interface power down, Allow power down in TLR if no TCK for 1 msec, and Loss of TCK power-down if no TCK for 1 msec.

After POR, the chip Power and Reset Controller (PRC) is allowed to power down the interface when the TAP state is TLR. Provided the TMSC input is a one (1). Once the TAP state is something other than TLR, the PRC may not power down the interface with this setting. The DTS may change the power control bits at this point. The three remaining modes provide different behavior suitable for debug, test, and detection no DTS (indicating the DTS/TS connection has been broken).

The JTAG TRST (JTRST) bit provides a means for the DTS to assert nTRST to System TAPs without an nTRST pin Link Interface pin. Setting this bit to a one asserts nTRST to system TAPs (not the adapter TAP).

The Flatten Scan Path (FLAT) bit provides a means for the DTS to place all TAPs within the IC system scan path in a manner where the scan path is operational. This may disturb system operation as it requires all modules to be powered and connected together so as to make all scan paths operational. The DTS will wait for 100 msec before accessing the system scan path to assure proper operation. This bit affects only the system scan path. If the firewall is enabled, the system scan path is not connected to the link even when the Flat bit is set.

The Scan Format (SF[3:0]) specifies four scan formats used with standard operating mode (JScan0-3) and twelve scan formats used with advanced interface operation (OScan0-7 and SScan0-3). The scan format is managed with the SSF command. An adapter is placed offline, i.e., it is disabled, if an unsupported scan format is specified by this field.

The SOA bit is controlled by the SRS command and the scan format. It is used to identify the broadcast of series selection information when the interface operates in standard mode and the output of status or extended command page information, when the interface operates in advanced mode. This bit is active from the point the SRS or RECP command occurs until it is discharged. When this bit is a one (1), it disables the decoding of a command block's filling of the TEMP register, as the DR_Scan following this bit being set conveys special output. Once set, the bit is cleared when the command window is closed or by an occurrence of the Update_DR TAP state.

The Delay (DL[1:0]) bits control the number of delay bits added to scan packets. The delay may be used to provide extra time between scan packets for the host adapter to interact with the IEEE 1149.1 interface.

Preliminary Scan Selection (PS[1:0]). There are two preliminary scan selection bits, star (PS[0]) and series (PS[1]). Each is managed separately, The PS[1] bit is managed with the MSS and SCA commands. The PS[0] bit is managed with the SRS command. Scan selection is double buffered as scan selections are made in a preliminary manner and then applied upon entry into the IDLE TAP state. Double buffering allows the pre-selection of one or more adapters and their selection can be delayed until the IDLE TAP state is reached. This facilitates the implementation of global commands affecting more than one link.

The Scan Selection (SS) bit is loaded upon entry into the TAP IDLE state. It is loaded differently depending on the scan format as follows: JScan0—One (1), JScan1—Zero (0), JScan3—PS[0], and Others—PS[1].

The Preliminary Scan Status bits (PSCS[1:0]) tracks the number of adapters selected for scan in addition to identifying whether Link IDs are assigned. The scan status is first calculated in a preliminary manner PSCS[1:0] just as with preliminary scan selection and then copied to the scan status (SCS[1:0] upon entry into the TAP IDLE state. The preliminary and scan status are encoded as follows: '00'—Link IDs initialized to zero, '01'—Link IDs assigned, no adapters selected for scan, '10'—Link IDs assigned, a single adapter selected for scan, and '11'—Link IDs assigned, more than one adapter selected for scan. A scan selection is defined as an MSS command. Two MSS commands selecting the same device qualifies as two scan selections. Scan status tracks commands rather than actual device selections. When the preliminary scan selection is "00" it remains this value until the ILID command invalidates Link IDs.

The Scan Status bits (SCS[1:0]) are double buffered for the same reasons as scan selection is double buffered. The PSCS field is copied to the SCS field upon entry into the IDLE TAP state with the same rules as those that govern PS[1:0] and SS bit behavior.

Scan Status Initialization. PSCS and SCS values of zero (0) are created by link initialization. Initialization status (SCS="00") identifies the initialized state. This state: Assigns a device a Link ID of zero (0) (valid ID), Provides an operable advanced interface for a single cJTAG enabled device connected to a DTS port (one device), Provides an operable standard interface, and Allows the creation of an operable advanced interface after initialization, if more than one cJTAG enabled device is connected to a DTS port in a star configuration.

This state forces the use of the MScan format in advanced interface mode. It allows standard transfers with system TAPs, provided the Firewall has been removed. It also allows command windows to be created that block TDO drive, providing assistance in determining the connectivity between adapters and the DTS. An ILID command followed by an IDLE Tap state moves preliminary scan status from initialization to no adapters selected (SCS="01"). The ILID command invalidates Link IDs and clears PS[1] (star preselection bit).

When an IDLE state updates the scan selection and scan status following the ILID command: All devices connected to a DTS port are de-selected, Scan status indicates no devices selected, and The scan path used for device isolation is selected.

None, One, and More Than One Status. Assuming Link IDs are assigned, Scan Status tracks the number of devices selected. The number of devices is tracked as none (01), one (10), or more than one (11). An appropriate SCA command sets the status to none. Each qualified MSS command increments this status until it reaches more than one. It stays at more than one, if additional MSS commands occur. Both the system command action (SCA) command and invalidate link ID (ILID) commands set the scan status to none.

Transport Format (TF[3:0]) specifies: whether continuous or burst transport packets are used with BDX or CDX, the direction of the transfer in the case of BDX, and the length of the burst packet when burst packets are used.

The BDX Enable (BE) bit enables BDX transactions if one (1). An adapter is disabled if this bit is set and BDX is not supported by the adapter. The CDX Enable (CE) bit enables CDX transactions if one (1). An adapter is disabled if this bit is set and CDX is not supported by the adapter. The BDX Selection (BS) bit is set or cleared with the MTS command and may be cleared with the SCA command. This bit selects the adapter that participates in a BDX transfer. If the BS bit is set to a one (1), this device participates in the BDX transfer provided the TF[3:0] field has turned BDX on. The bit takes effect immediately and affects the adapter participating in the BDX transfer that follows the register write. If this bit is a zero (0), the device follows transport packet activity but does not participate in a data exchange.

Packets and States

Packet sequences may include the following packet types:

| | |
|---|---|
| Advanced Scan | Manage TAP activity |
| Change | Manage the cJTAG configuration |
| Transport | Move non-scan information between the TS and DTS |

An advanced-scan packet represents the information associated with a single JTAG TAP state. This packet type moves the TDI, TMS, and TDO information associated with TAP states between the TS and DTS. A scan packet is created using a variety of compression techniques ranging from 1 to 6 clocks per bit, to serializing each packet. The content of scan packets is defined by a scan format defined with the control register, TAP state, and in some cases, information embedded in the packet traffic.

A change packet is generated by some writes to the cJTAG control register. This packet type suspends cJTAG activity. Change packets are inserted between scan packets when a register write in standard mode changes the link operating mode to advanced or when a register write occurs and the link operating mode is advanced. The content of change packets allows the extension of the packet length, detection of timeouts, and the ending of the packet with a return to either the SS or AS states.

Transport packets move CDX and BDX information between the DTS and TS. These packets are inserted between scan packets while a CDX or BDX transfer is active. The content of BDX transport packets is defined via the control register as bi-directional every other bit, unidirectional DTS to TS, or unidirectional DTS to TS. The content of CDX transfers is defined by DTS and TS customized protocol and is directed on a clock-by-clock basis during a CDX or BDX transfer by DTS and TS CDX units connected to the respective adapters. The BDX and CDX units that connect to the adapter are not covered by this specification.

The link mode control flow is shown in FIG. 9. At start-up, the interface is assumed to be in an unknown state with the TDI and TDO values being don't cares. The assertion of nTRST, BCE, a Hard-Reset escape sequence, a TMSC value of one (1), or POR forces the link operating mode to standard, depending of the link configuration.

At this point, the DTS and TS TAP states are synchronized. The TCK and TMSC pins may be used to: force interface power, change link operating modes, and specify the initial advanced mode operating characteristics. All of these may be supported only using JTAG TAP state sequences.

Any of the above mentioned resets is sufficient to cause the power down (PD) of the Link interface, if the TMSC input is held high and power down is supported. The initialization of the adapter control registers caused by these resets makes the criteria for power-down standard mode with a TLR TAP state. Since this is the state after one of these resets, the TMSC value determines whether the interface powers down as the DTS causes power up of the interface by holding the TMSC pin low for 1 ms or greater. This not only causes power up of the interface, it moves to the TAP IDLE state once the adapter is powered and reset is released. This assures the power-down criteria are no longer met. Once the adapter is powered, the state moves from PD to SS.

Standard-Scan (SS) State. JTAG scan packets manage the TAP state in the SS state. These packets are merely the TMSC, TDI, and TDO pin values exchanged each TCK. This state remains until the interface is powered down causing a move to the PD state or a control register write changes the operating mode to advanced causing a move to the CC state as the Update_DR state is exited. The interface continues operation in the standard mode with standard scan packets every TCK period otherwise, register writes, other than those changing the operating mode, do not cause state changes.

Configuration-Change (CC) State. Change packets are generated by configuration changes that change operating modes or when a register write occurs in the advanced operating mode. The change packet provides a period where the new configuration takes effect. When this packet completes, the state changes to either AS or SS depending on the operating mode specified by the control register. Since the change packet was caused by an operating mode change to advanced, the exit is to the AS state.

Advanced-Scan (AS) State. JTAG state progression is directed by serialized JTAG information (scan packets) in the AS state. The TAP state may change as often as every TCK but may change less frequently, depending on the serialization characteristics specified by the scan format, one of the control-register fields. The state remains AS, if no control-register writes occur and BDX and CDX transport remains disabled.

Any control-register write in state AS moves the state to CC, when a change packet occurs. If the write specifies supported features, the switch packet completes and the CC state moves to either the AS or SS state. If an unsupported feature is specified, the switch packet is extended until a soft-reset escape sequence occurs or the control register is initialized by a reset condition detectable by the adapter (nTRST, BCE, Hard Reset, POR).

Background Data Transport (BDX) and Custom Data Transport (CDX) States. Once BDX or CDX are enabled, these functions cause state changes to their respective states. These state transfers are related to specific TAP states. BDX transfers use Idle, Pause_DR, or Pause IR states. CDX transfers use Shift_DR states. Scan uses Shift_DR and Shift_DR states when these states are not allocated to CDX transfers.

When a state supporting one of these transfer types is reached, a transfer is request if enabled via the control register and in the case of CDX, other qualifying criterion are met. The qualifying criterion for CDX is control level 1 or inline initiation via SS activity. This request causes the generation of a scan packet with TDO in it. This allows a state change to BDX or CDX, if their supporting TAP state is active. These transfers take place as long as the TAP supports their activation. They deactivate when the supporting TAP state is exited, moving the state to AS.

Scan Formats

Some system components impose unique constraints that reduce scan and debug performance. These constraints are not JTAG-friendly or they require a large amount of execution time or bandwidth. The more severe the constraint, the more system performance drops. Minimizing the impact of these constraints is a key objective of the architecture. Since there can be a number of different constraints, a number of different operating points are provided (shown as the dots on the curve in), each maximizing scan and debug performance to a different set of system constraints. System performance is increased when the link transactions are customized to decrease the link transaction information volume.

Scan formats provide specialized access mechanisms to access memory and system states. A scan format is defined as the bit protocol sent over the TCK/TMS/TDI/TDO lines to effect either; JTAG IEEE 1149.1 compliant operations, the cJTAG enhanced JTAG operations or the operations unique to cJTAG. They overcome scan performance issues created by components that are not JTAG standard, while involving another clock domain in scan transactions. These optimizations target use cases that are common in today's system designs, and take direct aim at raising performance to overcome system constraints.

A typical constraint is the input or output of data in JTAG states other than the two shift states. Another is scan-rate constrained transfers caused by interactions between the functional and scan clock. At the other end of the spectrum there are minimal constraints. For example, some debug or scan functions do not require both input and output data for each clock of a transfer, which allows a scan operation to be broken into segments of input only, output only, or both input and output.

The term "standard mode" used in this specification refers to the IEEE 1149.1 JTAG feature set (JScan0) plus the JTAG extensions provided by JScan1, JScan2 and JScan3. The scalable nature of the IEEE 1149.1 JTAG architecture provides a baseline capability and allows the addition of other cJTAG capabilities. Baseline and other capabilities are additive. In broad terms, the capabilities may be split into five formats:

JScan—legacy JTAG (IEEE 1149.1) scan improvements

MScan—multi-device communication

OScan—optimized scan

SScan—segmented scan

Transport—background data transfers (BDX) and custom data transfers (CDX)

cJTAG supports 17 scan formats. These are referred to as JScan0-3, SScan0-3, OScan0-7, and MScan. The formats use a variety of compression protocols ranging from 1 to 6 clocks-per-bit to serialize each packet.

Figure 82:
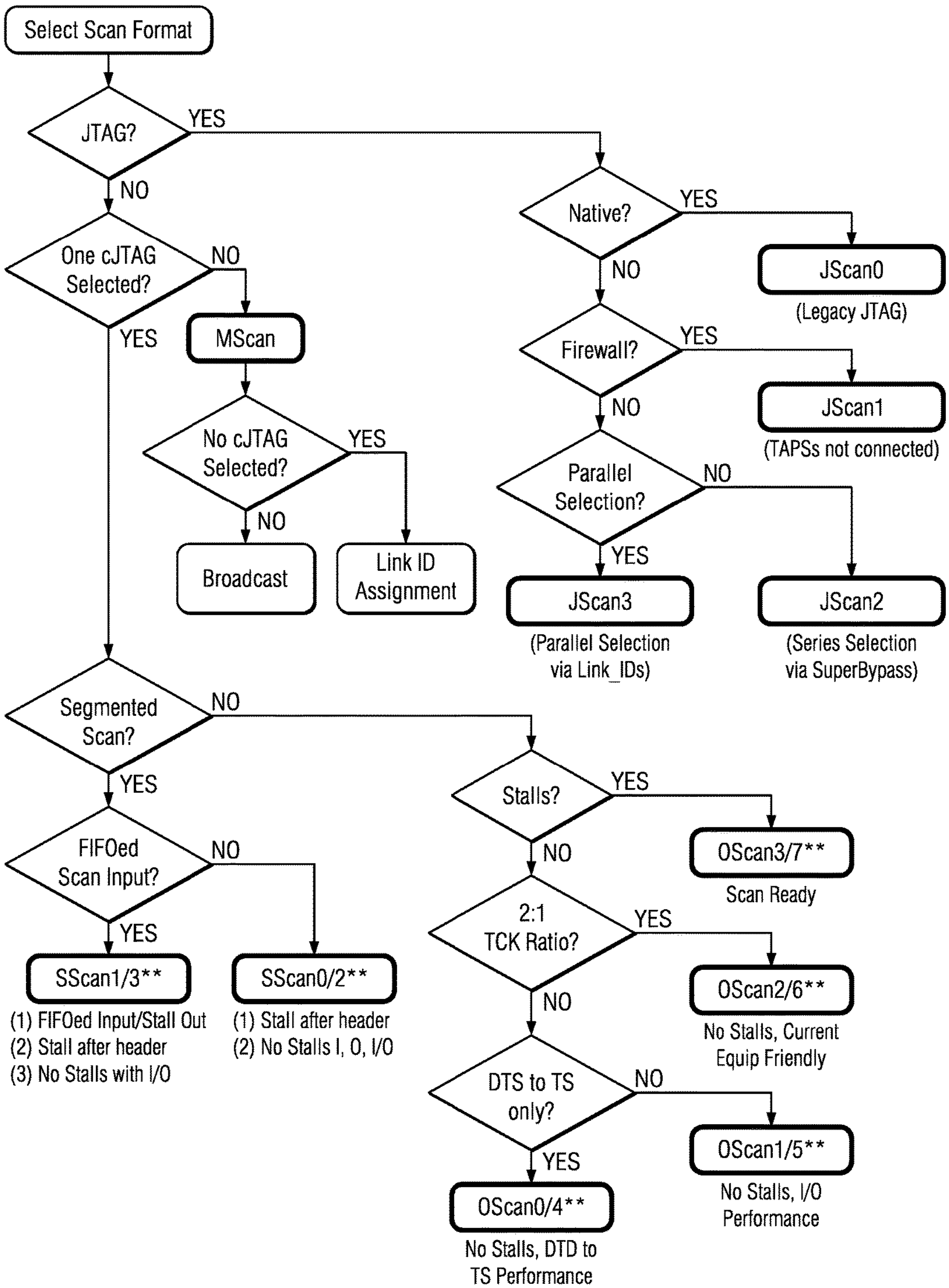
FIG. 82 is a flowchart of Choosing a Format.

A guide to selecting a format is shown FIG. 82. A summary of the scan formats is shown in FIG. 83. Standard formats (JScan formats) are shown in white. Advanced formats (MScan, OScan, and SScan) are shaded gray. The light gray text within a shaded area indicates the format is only used when the DTS sources TCK.

JScan

Legacy JTAG Scan Improvements (JScan), JScan scan formats, are used when a cJTAG enabled device is used with a JTAG scan topology. The JScan capabilities provide: Compliance with IEEE 1149.1, Link robustness, JTAG Series connectivity performance, and JTAG Star connectivity performance. Four scan formats (JScan0-3) provide IEEE 1149.1-compliant behavior or IEEE 1149.1-compatible behavior with additional capability. These formats target the areas shown in FIG. 84.

JTAG performance is improved by adding selection mechanisms that: bypass devices that are of no interest in a Series configuration (series selection), and select only a single device in a Star configuration (parallel selection).

The cJTAG adapter's "built in" parallel selection mechanism makes the JTAG Star scan topology practical, as no glue logic is needed. A firewall may be installed at Power On Reset (POR) or by scan sequences to prevent a change in system operation created by the physical connection or disconnection of powered DTS and TS.

The selection facilities used for advanced modes may be used to assign Link IDs to cJTAG-enabled devices connected in a JTAG Star configuration. Once this is done, JTAG protocols may be used to select and communicate with devices. Since the selection mechanism is built into the device, a glue less JTAG Star configuration results. The devices are addressable with the standard JTAG state sequences. These sequences appear "invisible" to TAPs connected to the adapter in any of these devices. This makes the JTAG star configuration a practical, low-cost, higher-performance alternative to low chip-count series configurations Link operation in the standard mode is best viewed as legacy JTAG operation with robustness and performance extensions. Some extensions may be enabled by POR while all extensions may be enabled and disabled using command sequences.

The adapter operating mode is defined by a four-bit control register segment called the scan format SF[3:0]. See the Scan Control Register Format, FIG. 74. Each of the 16 register values specifies one of the operating modes and additional mode characteristics. The first four values (0-3) specify standard mode and are collectively called JScan formats. JScan formats use JTAG scan protocol in addition to enabling JTAG extensions supported by some formats. The remaining SF [3:0] values specify advanced mode.

JScan formats 0 to 3 are shown in FIG. 85. The 4-pin scan topologies supported by these formats are shown in FIG. 86. Each of these formats is either JTAG-compliant or JTAG-compatible. Each of these scan formats uses a Wide Interface for scan transfers to and from TAPs connected to the JTAG interface. The TCK and TMSC pins are sufficient to create the command sequences that manage the cJTAG mode and other characteristics.

The Star configuration requires all chips to be cJTAG enabled, while the Series configuration does not. Advanced formats may be used with the Star configuration but not with the Series configuration. The parallel-selection mechanism acts like a one-device scan path linker, allowing connection of the wide interface signals in parallel for the Star configuration. Command sequences select the device of interest with other devices remaining offline. In the series configuration, any cJTAG enabled device may be turned into a one-bit scan path using the series selection mechanism.

Compliant Formats. The JScan0 scan format specifies native JTAG operation. It dictates JTAG compliant operation with all extended JTAG capabilities being disabled. This format is one of two possible formats created by control register initialization, the other being JScan1.

Compatible Formats. The JScan1, JScan2, and JScan3 scan formats specify compatible JTAG operation. These formats utilize the following extensions to JTAG capability: Firewall, and Device Selection/SuperBypass. These extensions are managed solely through the TAP state transitions, making their use 100% compatible where a mix of legacy JTAG and cJTAG enabled devices are connected in a series or wide star configuration.

The cJTAG architecture extension called Firewall, see FIG. 41, provides a link robustness feature that provides an option to either enable or disable the firewall with power on reset (POR). An enabled firewall blocks the adapter's JTAG interface TCK. The DTS may enable the firewall with a command sequence to prevent disconnects. Enabling the firewall with POR minimizes the chance that system operation is changed or corrupted by the connection of a DTS and TS in a mix of powered and un-powered configurations. This option virtually assures the random interface activity created by the physical connection of the DTS and TS will not disturb the system state. The firewall may also be enabled or disabled by a command sequence. The sequence needed to write the SF[3:0] control register is sophisticated enough to avoid its accidental occurrence during the making or breaking of the DTS to TS physical connection.

The firewall may easily be removed by standard scan sequences after POR without knowing the system state or scan topology. When POR disables the firewall: A "wide" interface is JTAG compliant, and A "narrow" interface is compliant to protocols but data transfers are not supported. When POR enables the firewall: A "wide" interface is JTAG compatible, and A "narrow" interface is compatible but data transfers are not supported.

Devices with an enabled firewall are entirely compatible with those that do not have an enabled firewall. The firewall merely enables the global bypass provided by the SuperBypass bit, in addition to disabling the advance of the system TAPs connected to the JTAG interface.

The firewall is implemented in a manner that makes mixing firewalled cJTAG, non-firewalled cJTAG, and legacy JTAG devices very practical. The firewall is disabled using a command sequence that is a NOP to legacy JTAG devices. The firewall may be disabled prior to performing any other action such as obtaining the Device ID. When the command sequence disabling the firewall follows the TLR state, all other legacy device states are left intact. The sequence used to disable the firewall is treated as a NOP by legacy JTAG devices or cJTAG devices whose POR interface disables the firewall. Once the firewall is disabled, the TLR state may be reentered without affecting the firewall.

The natural characteristics of JTAG TAP operation make managing the firewall easy. Any event, asynchronously or synchronously causing the TAP TLR state, loads either a BYPASS or IDCODE instruction in the instruction register. A command sequence disabling the firewall may immediately follow this event, with this operation being ignored by non-firewalled TAPs. This makes the firewall deactivation after POR or the TLR state virtually invisible to the system and existing system software, requiring the addition of only a small amount of start-up software. Alternatively, a hardware controlled firewall disabling sequence could be included in the DTS or the DTS adapter. Both firewalled and non-firewalled operations are entirely compatible with legacy JTAG systems.

TAPs connected to this interface are isolated from activity at the cJTAG interface. This protects the system from random events generated by connecting or disconnecting a powered DTS and TS. The cJTAG architecture adds selection and de-selection of adapter devices to legacy JTAG capability. Two types of selection may be used: series or star. Series selection is used with standard mode and JTAG series configurations, while star selection is used with JTAG star configurations where all chips are cJTAG enabled. Star selection is also used with advanced modes. The selection type is specified with the scan format. Both selection types are disabled by control register initialization.

Selection is a two-step process: specify the pre-selections via one or more command sequences and activate these pre-selections upon entry into the IDLE TAP state. The selection mechanism blocks the JTAG interface TCK when the adapter is de-selected. Since all the selections and de-selections occur at a precise point in the TAP state sequence, adapters are disconnected and connected at precisely the same TAP state, all adapters remain synchronized through multiple select and de-select operations.

The adapter itself is not affected by de-selection. The SuperBypass bit is used as both the IR and DR scan path when a device is de-selected.

The JScan2 scan format allows the selection and de-selection of cJTAG devices when connected in a star scan topology. Star selection may only be used when all devices are cJTAG enabled. This mode combines star selection using the advanced mode with standard 4-pin scan transactions. Advanced mode is used to assign Link IDs (addresses) to adapters at start up, while standard mode (JScan2) uses these addresses to choose to communicate with the device of interest. If more than one device is selected, the TDO pin is kept HI-Z to avoid drive conflicts.

Star selection is a two-step process: pre-selection and selection. Pre-selection moves selection information to adapters without using it. It is used to select devices when entry into the IDLE TAP state occurs following delivery of the information provided the JScan2 scan format is specified at this point.

The selection information is conveyed to adapters within a command window using the adapter's Link ID. Since the adapter addresses are established using advanced protocols, all devices connected in the JTAG star scan topology must be cJTAG enabled devices. This can be determined using other advanced capabilities.

Once the select information is delivered to the star selection bit, it is used to select the adapter when all of the following occur: JScan2 scan format or any advanced format, A TLR TAP state has not been encountered since parallel selection information was delivered, cJTAG control registers have not been initialized since parallel selection information delivery, and IDLE TAP state occurs.

The JScan3 scan format allows the selection and de-selection of cJTAG devices when they are connected in a JTAG series scan topology. The series scan path may contain a mix of legacy JTAG and cJTAG devices. Selection operations are NOPs to legacy JTAG devices. Selection information is passed to adapters in cJTAG enabled devices via the SuperBypass bit.

Series selection is a two-step process: pre-selection and selection. Pre-selection moves selection information to adapters without using it. Entry into the Idle TAP state following pre-selection uses this information to select devices.

The selection information is broadcast to adapters within a command window. A special Status or Selection (SRS) command identifies the next DR Scan as containing selection information. This command causes the chip scan path of each cJTAG enabled device on the series scan path to make their chip scan path the one-bit SuperBypass path for the next DR scan. Legacy JTAG devices ignore this command. The DTS follows the SRS command with a DR scan delivering selection information. Each device in the series path presents a one-bit scan path. Legacy device paths are the Bypass bit while cJTAG device paths are the SuperBypass bit. The scan path appears as if it is the BYPASS scan configuration. When this scan occurs, series selection information is loaded into a series-selection bit when the Update_DR TAP state is reached.

A TLR state or any reset initializing the control register between the SRS command and the Update_DR state prevents the loading of the selection information and cancels the identification of the DR Scan as carrying selection information.

A data register scan loads series pre-selection data from the SuperBypass bit into the series pre-selection bit when all of the following occur: JScan3 scan format is present, SRS command occurred during the last Update_DR TAP state, A TLR TAP state has not been encountered since the SRS command, The cJTAG control register has not been initialized since the SRS command, Command window is open at level 2, and Update_DR TAP state occurs.

The SRS command is discharged once the next Update_DR state occurs. The data-register scan conveying the serial select information will not be interpreted as either an LTR or STR command. The TEMP register remains empty following this scan. The SRS command connects the SuperBypass bit between TDI and TDO and enables TDO during Shift_DR scan states, provided TDO output has not been blocked by a command window open at level 3.

Once the select information is delivered to the series selection bit, it is used to select the adapter when all of the following occur: JScan3 scan format, A TLR TAP state has not been encountered since series selection information was delivered, The cJTAG control register has not been initialized since series selection information delivery, and Idle TAP state occurs.

Selection occurs at the point the TAP IDLE state is entered. Connects and disconnects occur when the TAP state is IDLE, assuring the adapters associated with the link remain synchronized. Selection or de-selection caused by either enabling or disabling the firewall also follows these rules.

Selecting a device following disabling the firewall may create a situation where a newly selected TAP has a TAP state of TLR while the adapter TAP state is IDLE. This is easily remedied by assuring the adapter TAP stays in the IDLE state for at least two states when the firewall is disabled. This rule applies to the interface mode existing after the firewall is disabled.

Super Bypass provides a single-bit device bypass for instruction and data scans when the firewall is installed or the adapter is de-selected.

Debug software may use the Super Bypass function (series selection) as a scan path linker, bypassing devices of no interest when accessing a specific device. This can significantly reduce scan transaction overheads with the potential of improving debugger response and download speeds. The Super Bypass concept is shown in FIG. 18.

The Super Bypass scan path is selected when one of the following occurs: In the command window and the a scan format is not JScan0, and A device is de-selected.

MScan

MScan is used for simultaneous communication with multiple adapters and the TAPs connected to them. A DTS may communicate with multiple adapters within the TS, using a single DTS cJTAG port. This occurs when more than one device is selected by DTS software. When one device is selected, a more efficient OScan or SScan format is used. From 1 to 16 TS Link Interfaces connected in parallel may be supported by a single link and addressed by link IDs. This number of adapters supported by the link may be expanded beyond 16 when multiple adapters share a single link ID.

Devices may be assigned IDs to select a device of interest. More than one device may be selected at a time. This is commonly used to broadcast global commands, especially Debug, e.g., global run or halt.

This scan format uses a 6-bit packet to exchange information related to one TAP state. The format of the packet allows the drive of the test mode select control (TMSC) pin by multiple devices. It also provides a means for a selected device within the TS or DTS to stall a transaction. A stall indication is embedded in the packet mentioned above. The TS may extend the transaction indefinitely, returning a stall visible to the DTS and other devices. The TS may generate a stall when it cannot disposition DTS input or provide output to the DTS. This can typically be caused by power-save modes or component-clocking limitations, or on-chip scan buffering considerations. The stall slows the transaction rate so that the DTS and TS TAP states remain synchronized.

The MScan capabilities are summarized in FIG. 87. The MScan format uses MScan packets to exchange TAP state information between the DTS and TS. These packets: Carry the same information for all TAP states, Merge the output of selected adapters, and Have information (front end) and delay (backend) components. The MScan packet type is used to broadcast commands when multiple adapters are selected and when no adapters are selected. The SCS field of the Link Control register identifies these conditions.

An MScan packet contains:

nTDI—Inverted value of Test Data Input: The TDI TAP value associated with TAP state n, TMS—Test Mode Select: The TMS TAP value associated with TAP state n, PC0—Pre-charge zero: TMSC driven to a one (1), RDY—Ready: An indication that identifies whether a frame transfer may proceed, PCI—Pre-charge one: TMSC driven to a one (1), TDO—Test Data Output: The TDO TAP value associated with TAP state n, and DLYn—Delay: Zero to n delay bits, 0, 1, 2 fixed delays, 3 to n bit variable delay.

The MScan packet format is shown in FIG. 20. The first six bits are the front end delay while the delay is the backend 6-n bits. The backend is eliminated when the DL[1:0] field specifies no delay. The nTDI, TMS, and TDO bits represent the bits of the MScan packet at the cJTAG TMSC pin. These bits are transferred between the DTS (through the cJTAG Link) and the TS adapter's JTAG interface connected to the TAPs in the IC. Each "not ready" (nRDY) extends the packet front end by two clocks.

The information component of the MScan packet (front end) precedes the delay component (backend). It contains the data and control information related to a single TAP state. Additional stall information is included to accommodate transaction stalls.

The nTDI and TMS information is sourced by the DTS. The RDY bit provides a means for the DTS or any selected adapter sharing a DTS port to stall the transaction until it is ready to advance its TAP state. The TS sends the TDO information to the DTS with the TDO bit. All TS sources supply a one (1) during the PC0 and PC1 periods independent of whether or not they are selected. These bits are also be sourced as a one (1) by the DTS.

The TDI information supplied by the DTS is inverted. When the TS supplies TCK and the TAP state is one of the TAP shift states, this characteristic provides some failsafe protection as it prevents the TMSC pin from getting into a regenerating state of all zeroes (0s) after a break in the TS and DTS connection.

The RDY and TDO bits are handled in a manner that allows multiple devices to participate in their generation without causing TMSC drive conflicts. The DTS or one or more TS adapters may source these bits. A command level of three blocks the TS output of both of these bits.

RDY and TDO information is transferred over two TCK periods of which the first is the precharged period. During the first clock period, the DTS and all devices drive the pin to a one (1), independent of whether they are selected (pre-charging the pin to a one (1)) using states PC0 and PC1. During the second clock period, an adapter may only drive the TMSC pin to a zero (0) (discharging the pin) if it desires to output a zero (0). If the DTS and TS do not drive the pin during the RDY and TDO bit periods, the bus keeper extends the one driven on the pin the previous clock period by the PC0 and PC1 bits. This drive criteria, combined with the bus keeper (the bus-keeper optionally latches the signal in the last driven state holding it at a valid level with minimal power dissipation), holding a one (1) driven by the previous bit makes these bits the logical AND of the RDY and TDO of all selected adapters.

A RDY value of zero (0) causes the extension of an MScan packet until a RDY value of one (1) is returned. Each clock, where a "not ready" indication is returned (0-stall), extends the packet length by two bits as bits two and three are repeated after reaching bit three. This is summarized in FIG. 88.

A bit sequence with two "not ready" bits returned is nTDI, TMS, PC1, RDY, PC1, RDY, PC1, RDY, PC0, and TDO. Driving the TMSC pin by an adapter during the RDY bit period is permitted only when this adapter is selected.

The TDO value normally provides the TS TDO when an adapter is selected. It is also used to provide device ID information used in assigning Link IDs when no adapters are selected. The TDO bit is sourced by the TS and is associated with the same TAP state as the TDI and TMS value in the same scan packet. If the adapter is selected, the TMSC pin is driven during the TDO bit period if the data value is a zero (0). If any of these conditions are not met, the bit remains HI-Z in this bit period.

Driving the TMSC pin during the TDO bit period is also subject to the following criteria:

- if (status is being read),
  - if (read is from this adapter),
- else if (extended command page information is being read),
  - if (read is from this adapter),
- else if(no adapters are selected),
- else (more than one adapter is selected),
  - if (this adapter is selected), and
  - JTAG output enable indicates the bit would be driven.

During link assignment, chips without assigned Link IDs may also drive this bit.

Packet Separation/Delay. The MScan packet backend is a fixed (0, 1, or 2) or variable delay inserted between consecutive packet front ends. The delay component provides a means to:

- Create TMS and TDI setup time between a DTS adapter and the DTS serializing the JTAG control and data information
- Create TDO hold time between a DTS adapter and the DTS
- Implement port selection There are two delay classes, fixed and variable. Fixed delays provide three delay lengths:

- No delay
- One clock with TMSC remaining the same value as the previous bit period
- Two clocks with TMSC remaining the same as the previous bit period Variable delays provide a minimum delay of three TCK periods and may be extended indefinitely with the appropriate protocol activity.

Fixed delays do nothing except extend the time the last value generated by information component stays on the TMSC pin. Variable delays may also be used for port selection as this delay class has the ability of causing a transaction stall for extended periods, while also providing a means to realign a suspended transaction with an ongoing one when a port is re-selected. Using variable delays for port selection suspends all port activity including BDX transfers.

A fixed delay within a packet is shown in FIG. 15A. This delay class is typically used to customize the electrical characteristics of the DTS, adapter, and TS interface in the case where the DTS TDI/TMS information is not pipelined within the DTS adapter or DTS controller implementation. Up to two bits (DLY0 and DLY1) may be included in the scan packet with a fixed delay. Another MScan packet begins after the delay and the clock from the DTS adapter to the DTS may be adjusted within the delay period. Fixed delays are also applicable to both OScan and SScan formats and their packets. Fixed delays are specified using the DL[1:0] field of the Scan Control register as shown in FIG. 15B.

Figure 90:
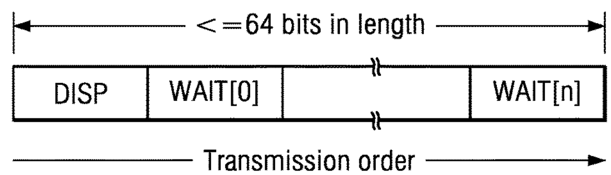
FIG. 90 is a diagram of a Delay Segment.

A variable delay, following the front end of an MScan packet, is shown in FIG. 16A. A variable delay, constructed from an initial delay one clock in duration followed by one or more delay segments 64 or less bits in length, is shown in FIG. 89. A delay segment is shown in FIG. 90. Variable delay is controlled by DL[1:0]=0b11.

A state machine operation representing variable delay operation is shown in FIG. 16. The states in this Figure have the following descriptions:

- DLY—One clock initial delay,
- WAIT—Waits for an exit generated by a TMSC value of zero (0) or a timeout, and
- DISP—Dispatch to next operation.

The use of these states will become more apparent further in this section. A timeout is caused by 64 consecutive one (1) bits on the TMSC pin, while a variable delay is active.

A delay segment terminates in one of three ways: Extension, Completion, and Timeout. Extension initiates a new delay segment. Completion causes the start of the next packet sequence. A Timeout initializes the control registers with their POR initialization value, causing a return to standard operating mode.

Figure 91:
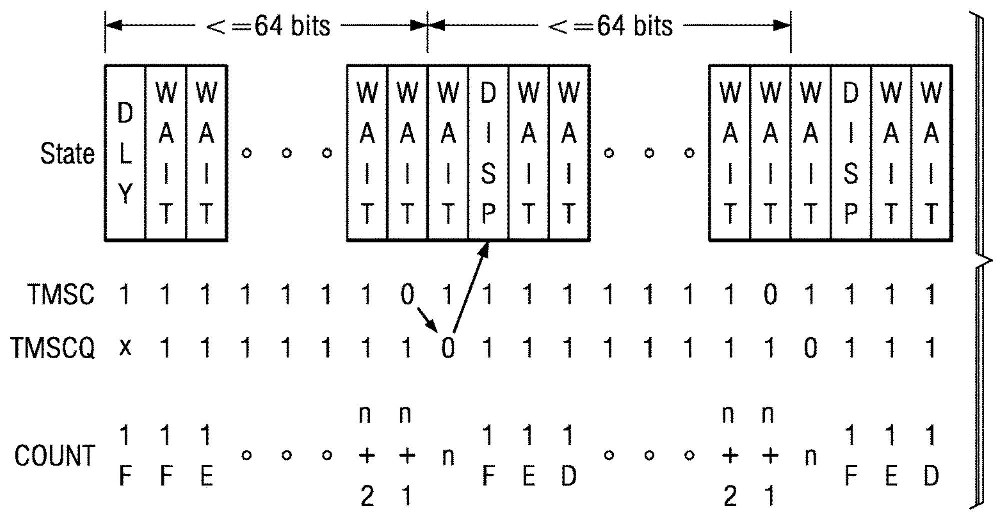
FIG. 91 is a diagram of Variable Delay Extension.

Delay extension allows the creation of delays of up to 64 TCK periods. The DTS extends a variable delay with a zero (0) TMSC value within a 64 clock TCK window. A TMSC value of zero (0) within a window restarts a new window. Any number of ones (1s) less than 63, followed by a single zero (0), extends the delay period and initiates a new delay segment as shown in FIG. 91. A variable delay may be extended any number of times. The continual occurrence of a single one (1) is referred to as a "heart beat" to continue the delay.

Figure 92:
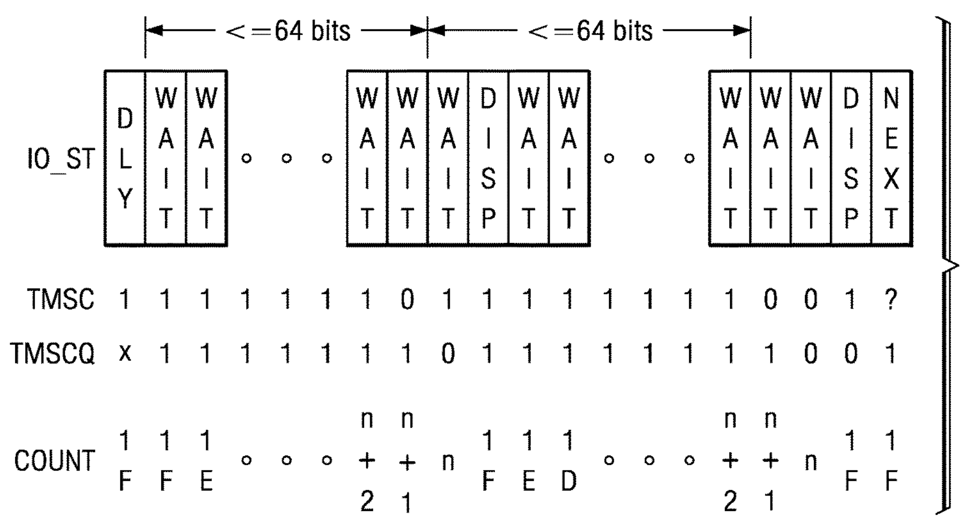
FIG. 92 is a diagram of Variable Delay Completion.

A value of zero (0) on the TMSC pin during clock period m is sampled at the beginning of clock period m+1 directing the state to DISP state during clock period m+2. A one (1) following the zero (0) directs a move from the DISP state to the WAIT state. Two consecutive zeroes (0s) complete a delay segment and the delay, initiating a scan packet. This is shown in FIG. 92. The minimum variable delay is three TCK periods. This requires two TMSC values of zero (0) beginning with the DLY state.

Figure 93:
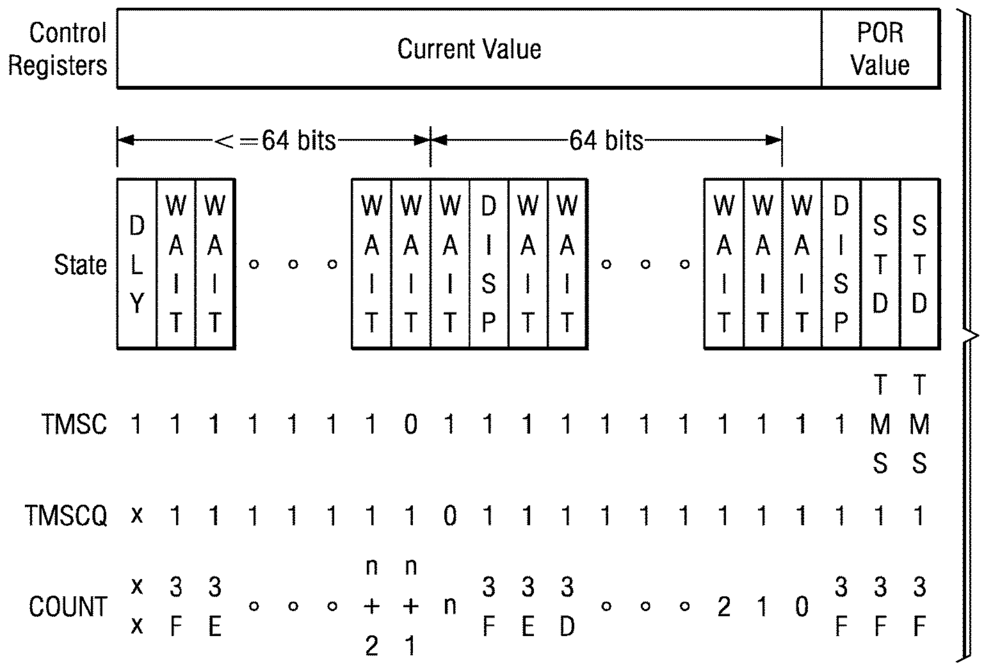
FIG. 93 is a diagram of Variable Delay Timeout.

Sixty-four consecutive ones (1s) cause a timeout and a return to standard mode, provided the adapter has not been placed offline by enabling an unsupported capability. The TMSC values during the DLY, WAIT, and DISP bits are included in this count. A timeout causes initialization of cJTAG registers and progression to the standard operating mode as shown in FIG. 93. Initialization of the Scan Control register specifies standard mode, the DISP state ignores the TMSCQ value and returns the interface to standard mode.

Figure 94:
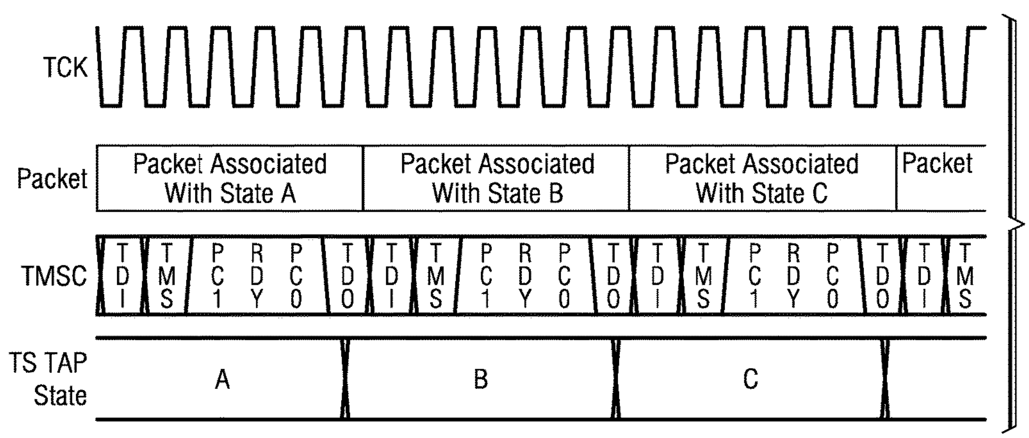
FIG. 94 is a timing diagram of MScan Packet and TS TAP State Association.

The association of an MScan Packet and the TS TAP state is shown in FIG. 94. All Selected TAPs are RDY in this example. Note the TAP state changes on the rising edge of TCK when TDO is being sent to the DTS. The point at which the TS changes the TAP state may be advanced or delayed by one clock. Delays may be inserted after TDO. In the case of a delay of one or two, the TDO value is merely extended by one or two clocks, respectively. Any change in the TAP state does not change the TMSC pin timing.

MScan packet transmissions are subject to being interrupted by a: Register write, or BDX transfer. The interrupt occurs after the first bit of a new packet, with this bit being discarded by the TS. When the interrupt processing is completed, the scan packet associated with the current TAP state is sent by the DTS with the scan transfer continuing from this point. This is shown in FIG. 95.

Oscan

Optimized Scans (OScan) formats emphasize compatibility with existing drivers and hardware. Optimizations take into account the TCK source, the need for scan transaction stalls by matching the state-rates of the Link Interface and DTS, and the need for unidirectional or bi-directional transfers. The OScan formats are shown in FIG. 96.

The four OScan format types are described below:

| | |
|---|---|
| All Purpose | Stalls and TDI/TMS/TDO in each packet |
| Scan_2x | Link clock rate is always 2X the TAP clock rate |
| Scan_1X | Link clock rate is same as TAP clock rate |
| Download | Link clock rate is same as TAP clock rate, transfer to TS only |

Since scan transactions can be optimized further when the DTS sources TCK and the four OScan formats (shown above) are expanded to eight formats to obtain the best performance for both DTS sourced or TS sourced TCK. The formats compatible with a DTS sourced TCK are more efficient as they use special TCK/TMSC relationships to pass control information needed on an infrequent basis. One example of this is when to exit the shift state. The initial configuration assumes the TS is the clock source. The DTS tells the TS adapter that it is the TCK source. Formats on the right are remapped to formats on the left when the DTS specifies a format on the right without informing the TS that DTS is the TCK source.

The all-purpose format performs no optimizations, but supports any transaction with a native or modified JTAG interface. The other formats discard TDI in non-stable JTAG states before passing control information across the link bridge. When the DTS supplies TCK, other formats further increase link efficiency in JTAG shift states by discarding TMS information before passing control information across the bridge. An exit from a JTAG shift state is initiated with a special escape sequence created with TCK/TMSC relationships.

The Scan_2× type is friendly to current DTS equipment, as the link TCK can always be 2× the TAP TCK. For example, a 35 MHz DTS can support a 70 MHz link with this format. The Scan_1× type provides the same capability as the Scan_2× type but with the TAP and link TCK operating at the same frequency. For example, a 70 MHz DTS would support a 70 MHz link. Higher TAP state rates are achievable with this format. The Download type is primarily a debug format. The unidirectional transfer to the TS will achieve the highest frequency with a 70 MHz DTS generating a 70 Mbits/sec download rate.

The eight Optimized Scan (OScan) formats provide a mix of scan and debug performance improvements. They support basic and specialized scan transactions. OScan formats are used when all of the following are true: After Link IDs are assigned, When a single adapter is selected, When an OScan format is specified, and Packet Information.

The OScan formats use packets to exchange control and data information related to each TAP state. An OScan packet contains one or more of the following:

nTDI—Inverted value of Test Data Input: the TDI value associated with TAP state n TMS—Test Mode Select: the TMS value associated with TAP state n RDY—Ready: Control information that identifies whether the scan transfer may proceed TDO—Test Data Output: The TDO value associated with TAP state n DLYn—Delay: Zero to n delay bits, 0, 1, 2 fixed delays, 3 to n bit variable delay The template for all OScan packets is shown in FIG. 11. Packet payloads are created by populating some of the template or the entire template, with different formats creating different payloads.

The inverted values of TDI followed by TMS are sent by the DTS to the TS when the packet includes these bits. One or both of these bits is included in each OScan scan packet.

The RDY bit is sent by the TS to the DTS when the packet includes this bit. It is driven by a selected adapter and not driven otherwise. The adapter may stall scan transactions using this bit. A zero (0) in this bit position extends the packet length one bit, with the RDY bit repeated the following bit period. This is summarized in FIG. 97.

The TDO bit period is sent by the TS to the DTS when the packet includes this bit. It is driven by a selected adapter and not driven otherwise. It is driven with: The data value generated by the adapter, if the adapter is the data source, The data value generated by the adapter's JTAG interface, if this interface is the data source and the JTAG interface indicates the TDO value should be driven, and A "1" data value, if the JTAG interface is the data source and the JTAG interface indicates the TDO is not driven.

The packet separation and delay for OScan formats is identical to that for MSCAN. The delay follows the packet information just as with MScan packets.

The packet payload for any specific TAP state is specified by a combination of the scan format and TAP state. These factors vary the information in OScan packets five different ways:

Stall (S)—Stalls are eliminated when not required
Data Input (I)—TDI is eliminated when not required
Data Output (O)—TDO is eliminated when not required
Control (C)—TMS is eliminated during shift states
Unidirectional(U)—All information is sent to the TS with no information sent to the DTS These are collectively called packet optimizations.

Stall Optimization (S). The RDY bit is deleted when the TS is capable of always responding properly to the DTS transaction rate.

Data Input Optimization (I). The TDI bit is deleted from packets associated with non-shift TAP states as TDI is a "don't care" in these states.

Data Output Optimization (O). The TDO bit is deleted from packets associated with non-shift TAP states as TDO is a "don't care" in these states.

Control Optimization (C). The TMS bit is deleted from packets associated with shift states if the DTS sources TCK. An End-of-Transfer escape sequence, sent with data for the last shift state, replaces the TMS function.

Unidirectional Optimization (U). All TDO information may be deleted from packets if a scan transfer does not require TS output.

There are four OScan transaction types, each supporting a different set of requirements: The key characteristics of each transaction type are summarized in FIG. 98. The all purpose type supports any transaction that uses TDI or TDO in any JTAG state and systems where a component cannot support scan transaction rates at the same rate as the DTS. The Scan_2× and Scan_1× types support any transaction that uses TDI or TDO only in the TAP shift states, with the difference being the minimum Link/TAP clock ratio required for link operation. The Download type supports any transaction that uses only TDI in the TAP shift states.

Transaction types use the optimizations shown in FIGS. 12A and 12B. Two OScan formats support each of the transaction types, the first usable when either the DTS or TS sources TCK, and the second usable when the DTS sources TCK. This provides the best performance for both DTS sourced or TS sourced TCK. Optimizations are generally different for packets used for non-shift and shift TAP states. An all purpose transaction using the OScan7 format is the exception, as the same packet payload is used for both shift and non-shift TAP states.

OScan7 and OScan3 formats are all purpose transactions. This transaction type is compatible with most systems. Either of these formats supports the systems that have scan rate limitations, as both include stalls within each scan packet. OScan7 is the most versatile, exchanging TDI, TMS, and TDO with TAP state along with stall support. OScan3 deletes the TDI information from non-shift TAP states and deletes TMS information from packets associated with shift TAP states. The TMS values are recreated using the End-of-Transfer escape sequence for these packets.

This transaction type may be used for: Boundary scan, Testing, Non-standard use of TAP states (data transferred in non-shift states—OScan7), and Transfers controlling embedded processors.

A typical transfer would consist of:

OScan7

A series of 4-bit packets.

Packet content the same for all TAP states

OScan3

A series of 3-bit packets.

Packet content contains no TMS for shift TAP states, no TDI for non-shift TAP states An End-of-Transfer escape sequence to exit TAP shift states The OScan6 and OScan2 formats are Scan_2× transactions. This transaction type creates a Link-to-TAP clock ratio of 2 to 1 or greater.

This transaction type supports: Transactions that do not have scan-rate limitations, Transactions that do not require TDI in non-shift states, Boundary Scan, Testing, and Transfers controlling embedded processors.

A typical transfer would consist of:

OScan6

A series of 2-bit packets for non-shift states

A series of 3-bit packets for shift states

OScan2

A series of 2-bit packets for all TAP states

An End-of-Transfer escape sequence to exit TAP shift states

The OScan5 and OScan1 formats are Scan 1× transactions. This transaction type creates a Link-to-TAP clock ratio of 1 to 1 or greater. This transaction type supports: Transactions that do not have scan-rate limitations, Transactions that do not require TDI or TDO in non-shift states, Boundary Scan, Testing, and Transfers controlling embedded processors.

A typical transfer would consist of:

OScan5

A series of 1-bit packets for non-shift states

A series of 3-bit packets for shift states

OScan1

A series of 1-bit packets for non-shift states

A series of 2-bit packets for shift states

The OScan4 and OScan0 formats support Download transactions. This transaction type creates a Link-to-TAP clock ratio of 1 to 1 or greater. This transaction type supports:

Transactions that do not have scan-rate limitations, Transactions that do not require TDI or TDO in non-shift states, Boundary Scan, Testing, and Transfers controlling embedded processors.

A typical transfer would consist of:

OScan4

A series of 1-bit packets for non-shift TAP states

A series of 2-bit packets for shift TAP states

OScan0

A series of 1-bit packets all TAP states

Packet optimizations used by each OScan format are summarized in FIG. 99. The OScan optimizations create the packet payloads shown in FIG. 100. Formats other than OScan7 use different optimizations for non-shift and shift states. Delays occur after the last bit of the packet payload shown. The Link-to-Tap clock ratios are shown in FIG. 101.

Figures 101, 102:
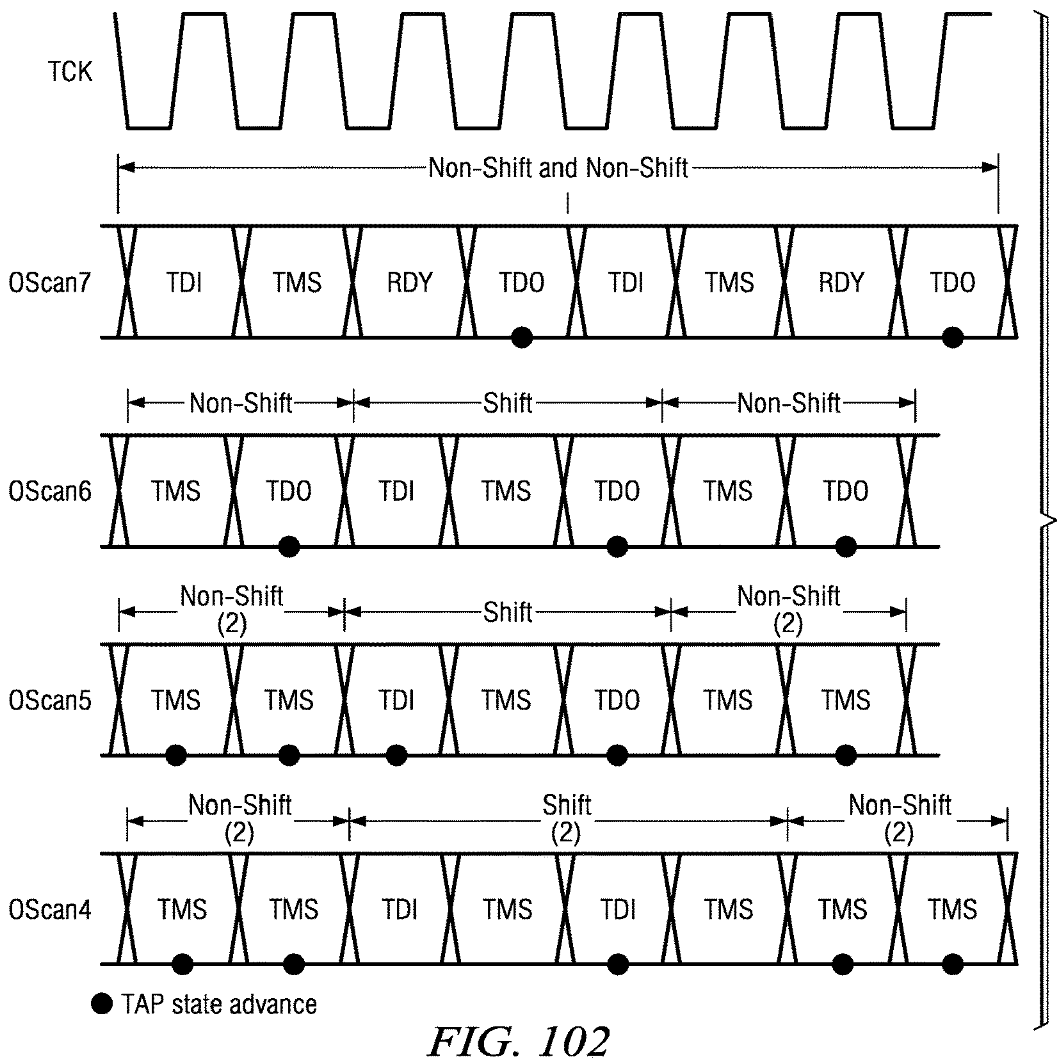
FIG. 101 is a table of OScan Format Link-to-Tap State Minimum Clock Ratios.
FIG. 102 is a timing diagram of OScan4 through OScan7 Packet Payloads and Transitions.
Figure 103:
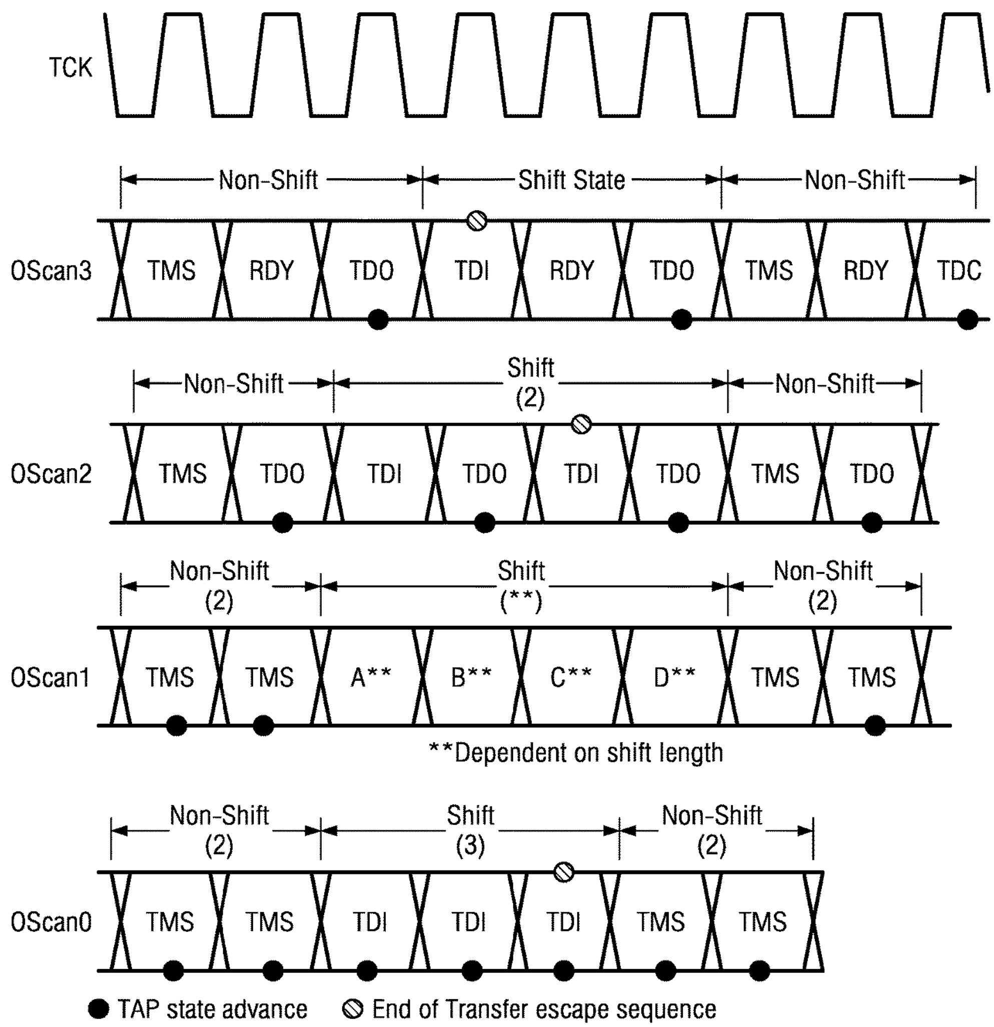
FIG. 103 is a timing diagram of OScan0 through OScan3 Packet Payloads and Transitions.
Figure 104:
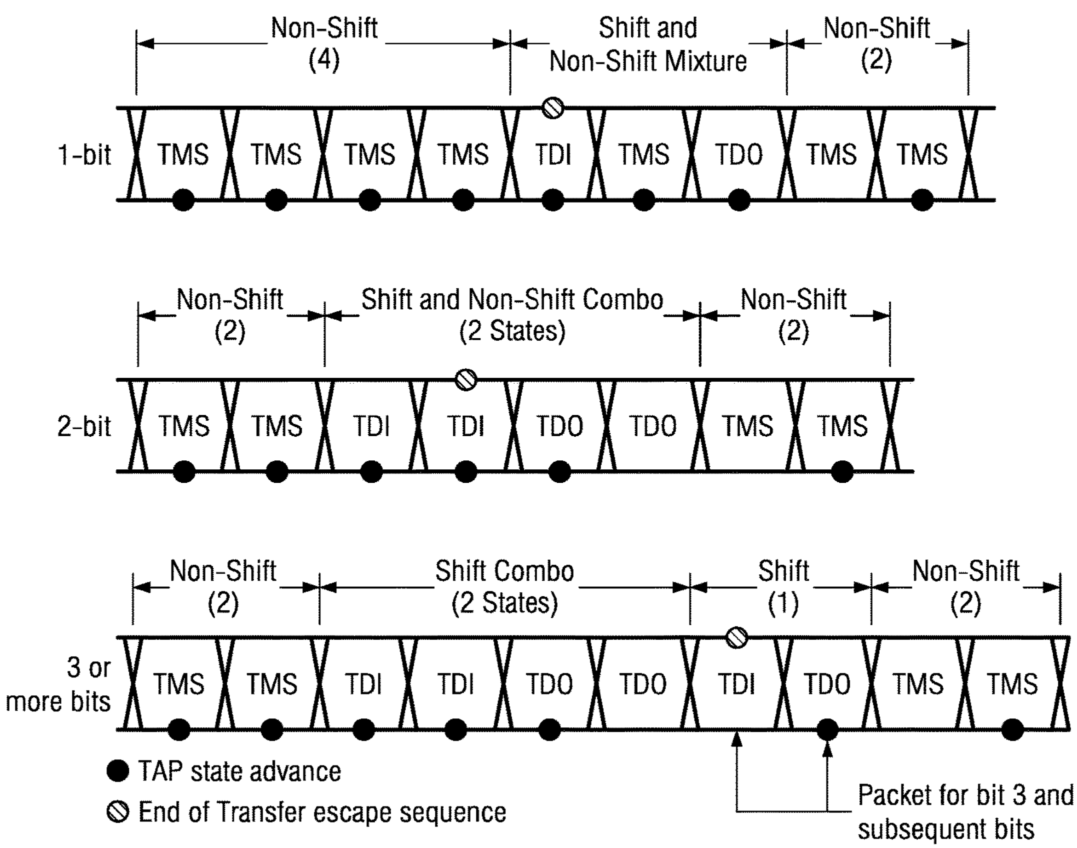
FIG. 104 is a timing diagram of OScan1 Shift Length Dependencies.

The packet transitions between packets used for shift and non-shift states for OScan formats (OScan7-4) are shown in FIG. 102. The operation of the Link changes from pipelined to non-pipelined and vice-versa when a data packet contains a TDO bit and the control packet does not. This effect becomes apparent examining the position of the black dots indicating the point the TAP state changes. OScan7 and OScan6 are always non-pipelined. OScan5 switches from non-pipelined to pipelined operation and then back to pipelined operation. OScan4 is always pipelined. The term "pipelined" refers to the capability of handling TDO that is associated with a specific TAP shift state but arrives with a state subsequent to the state with which it is normally associated The packet transitions between packets used for shift and non-shift states for OScan formats (OScan3-0) are shown in FIG. 103. OScan3 and OScan2 are always non-pipelined. OScan1 switches from non-pipelined to pipelined operation and then back to pipelined operation. OScan0 is always pipelined. The switch between pipelined and non-pipelined operation for the OScan1 format is detailed further in FIG. 104. The TDI bit, where an End-of-Transfer escape sequence occurs to end the shift state, is marked with a gray dot.

Pipelining effects created by the transition from control to data packets and visa versa cause specialized packet payloads to be created when the OScan1 format is used. The transition between pipelined operation in non-shift states and non-pipelined operation in shift states causes shift-length dependent operation for 1, 2, or n states. This is detailed in FIG. 104. Note that the bit sequence for the first two packets associated with TAP shift states are different from the packets associated with subsequent shift states. This is highlighted in FIG. 100.

Transactions using each of the OScan formats are shown in FIGS. 105-112. These transactions span multiple TAP states.

Figure 105:
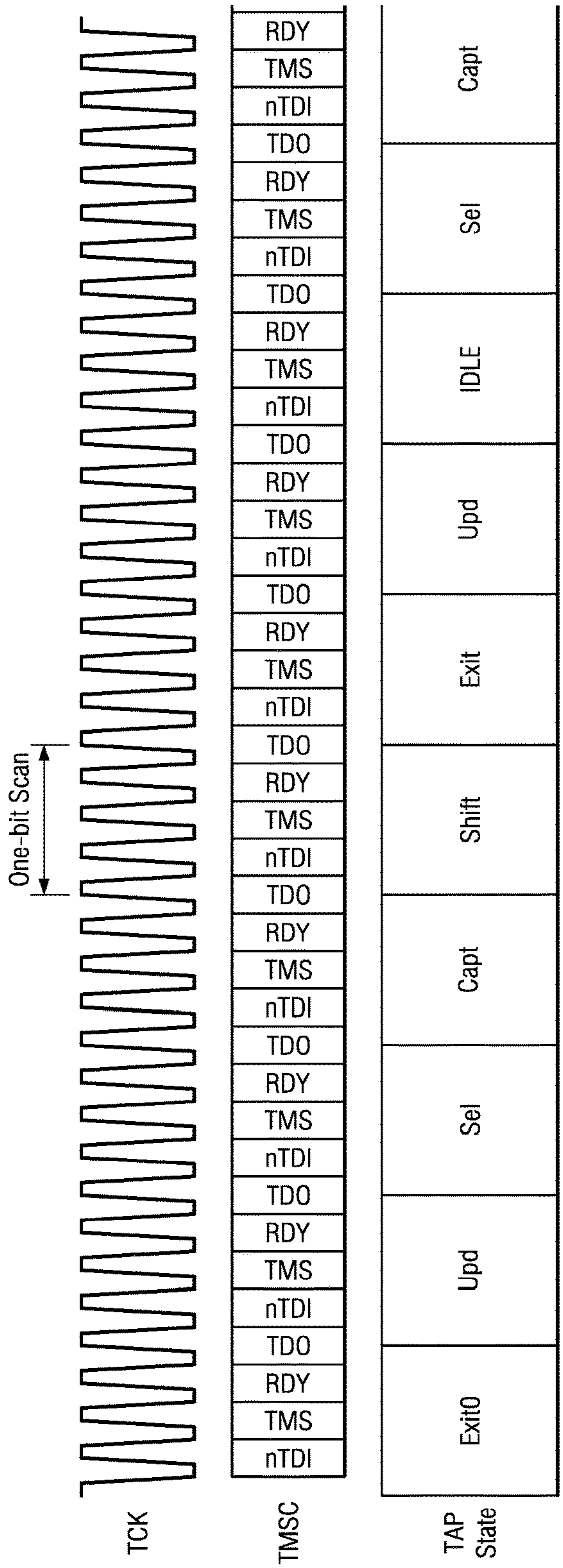
FIG. 105 is a timing diagram of OScan7 Transaction.
Figure 106:
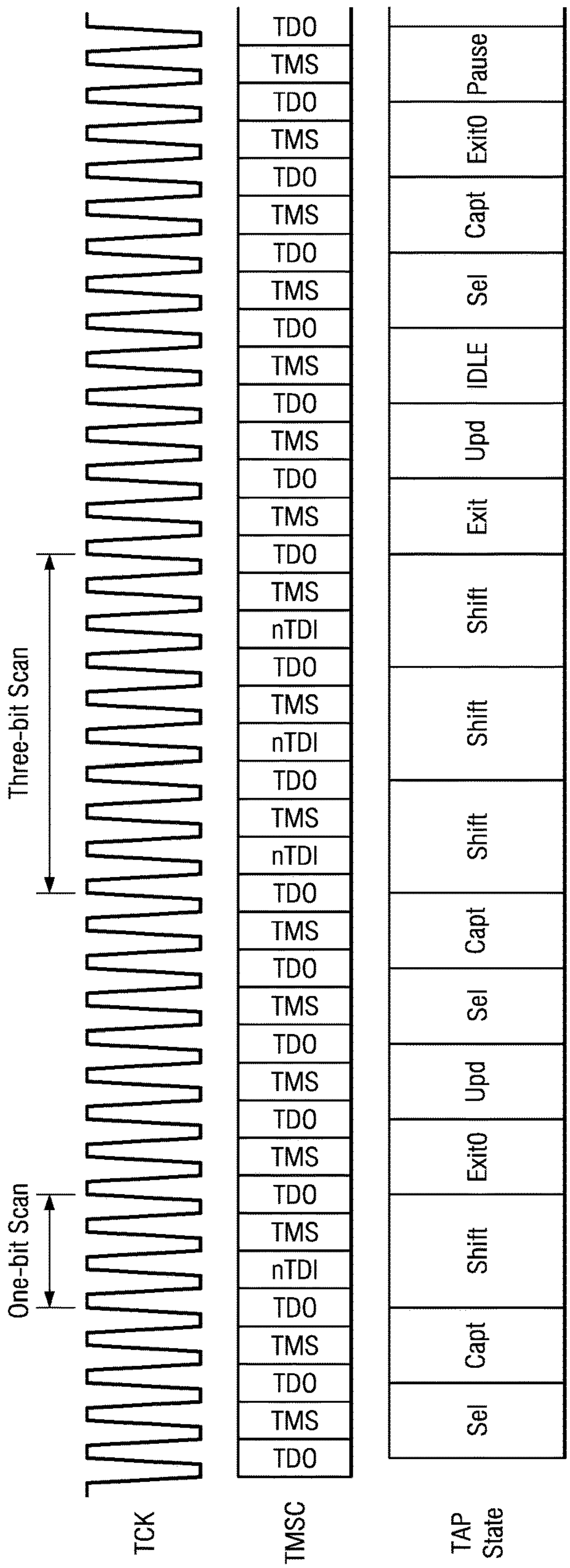
FIG. 106 is a timing diagram of OScan6 Transaction.
Figure 107:
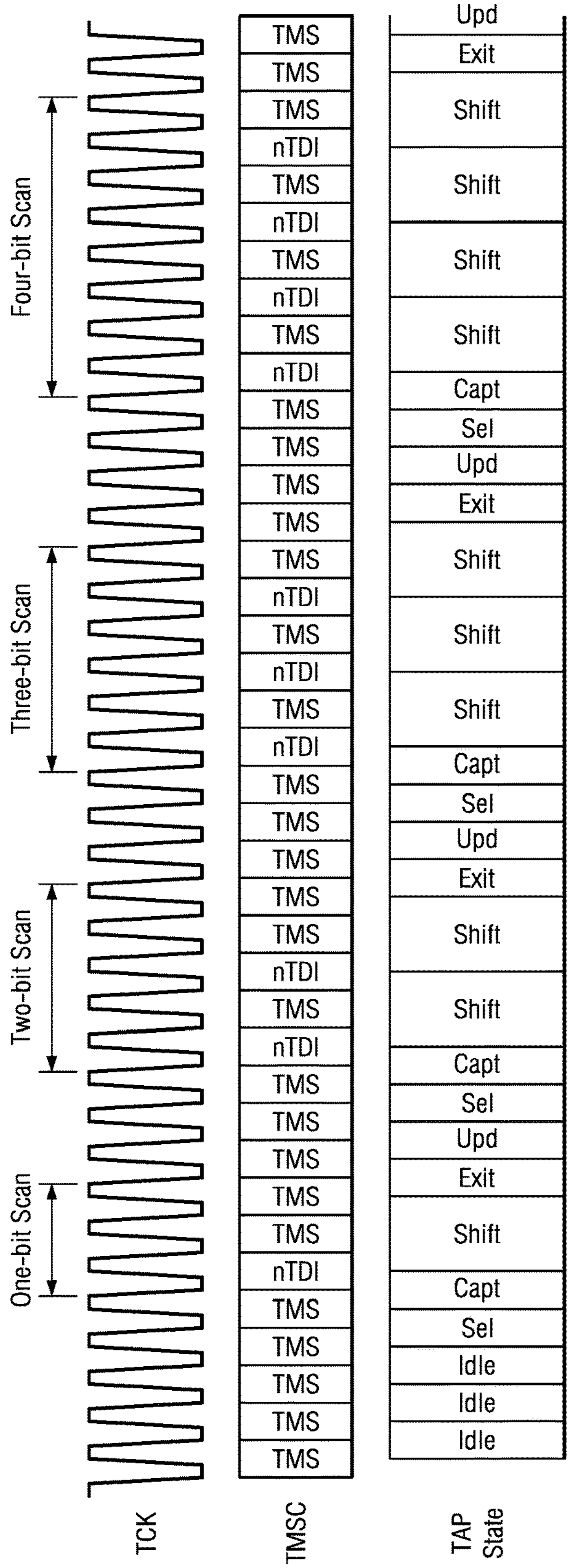
FIG. 107 is a timing diagram of OScan5 Transaction.
Figure 108:
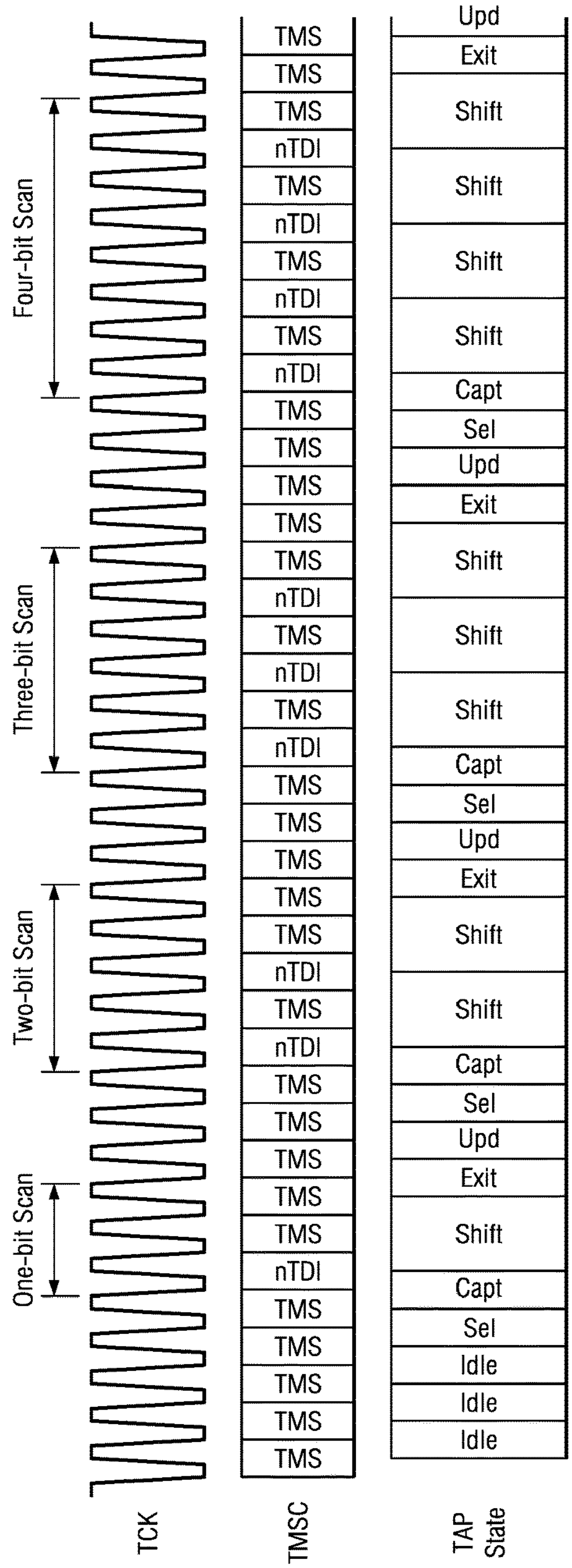
FIG. 108 is a timing diagram of OScan4 Transaction.
Figure 109:
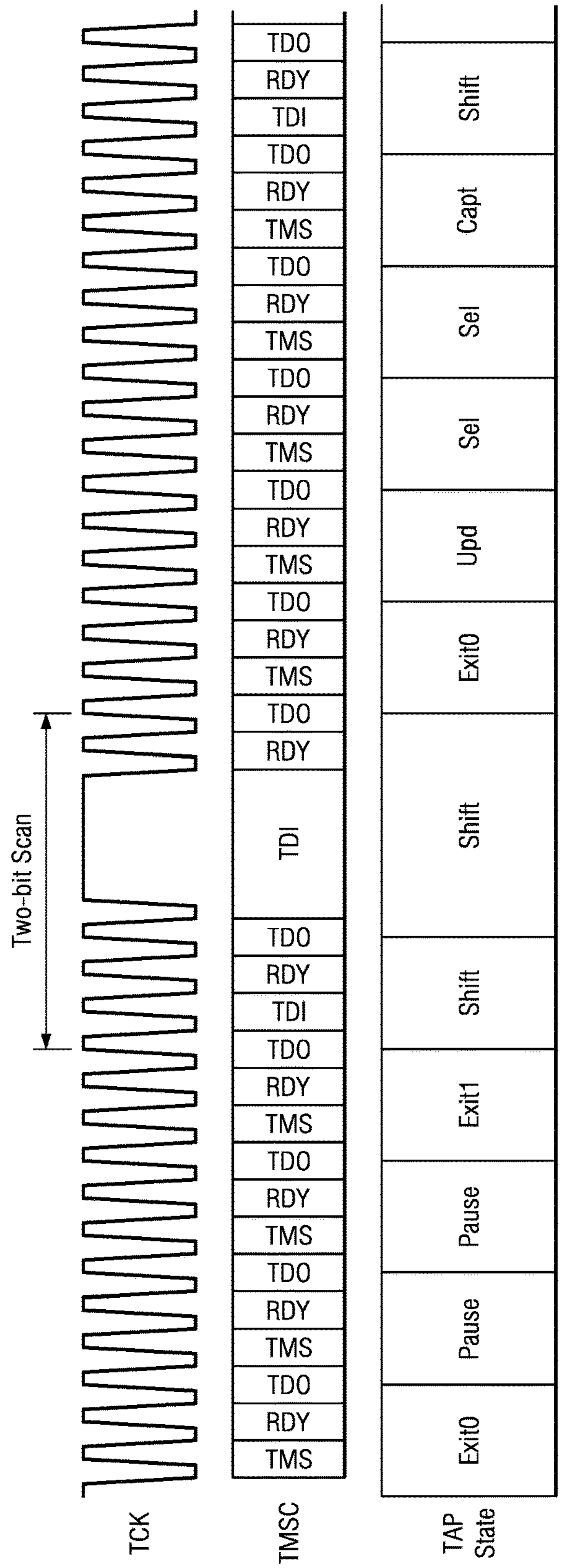
FIG. 109 is a timing diagram of OScan3 Transaction.
Figure 110:
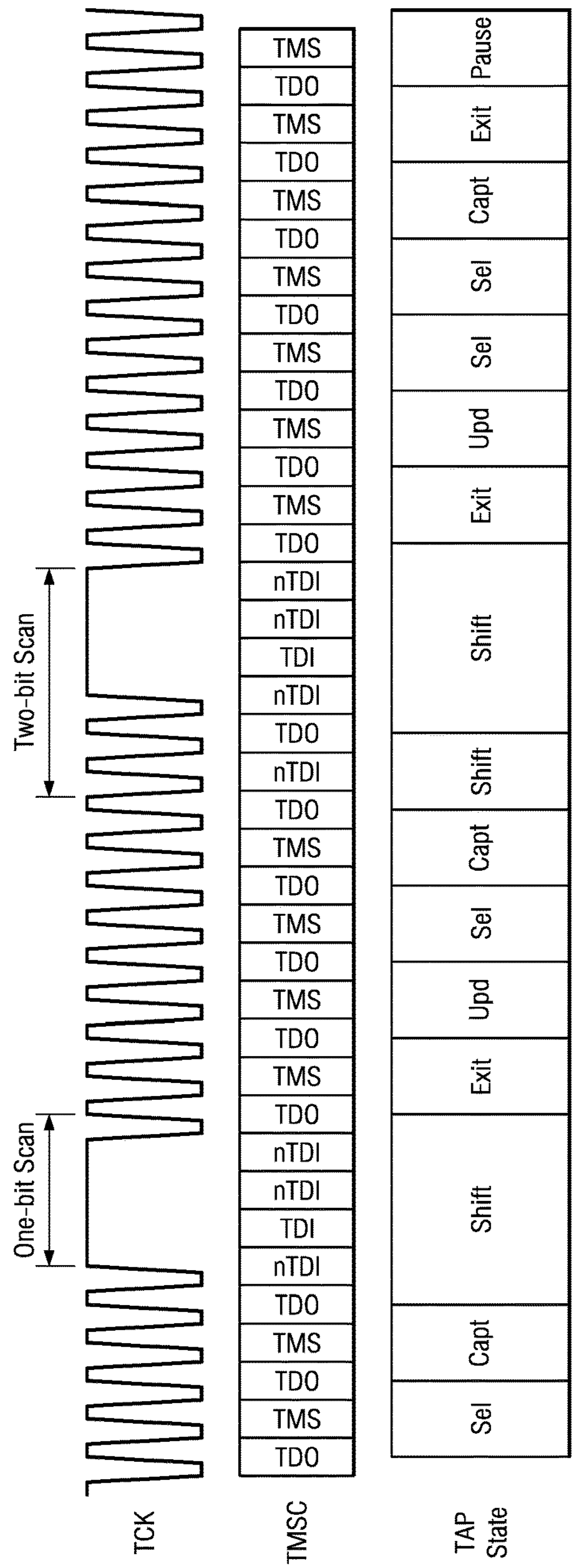
FIG. 110 is a timing diagram of OScan2 Transaction.
Figure 111:
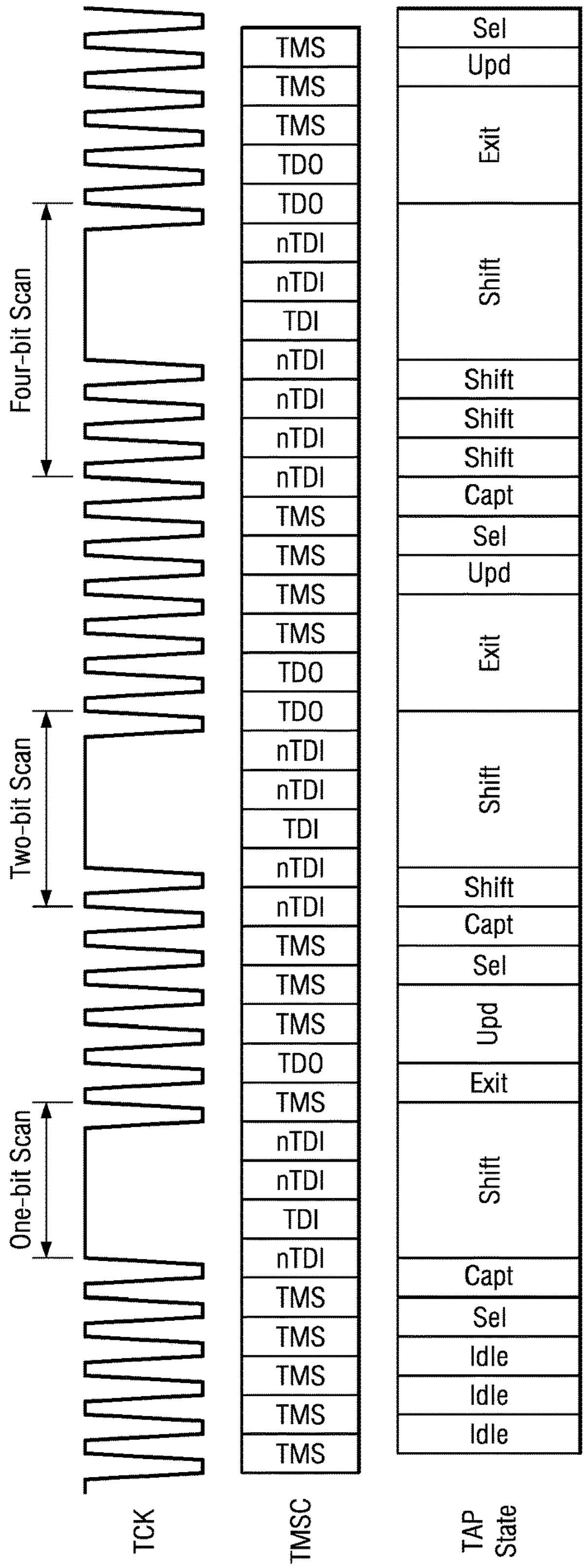
FIG. 111 is a timing diagram of OScan1 Transaction.
Figure 112:
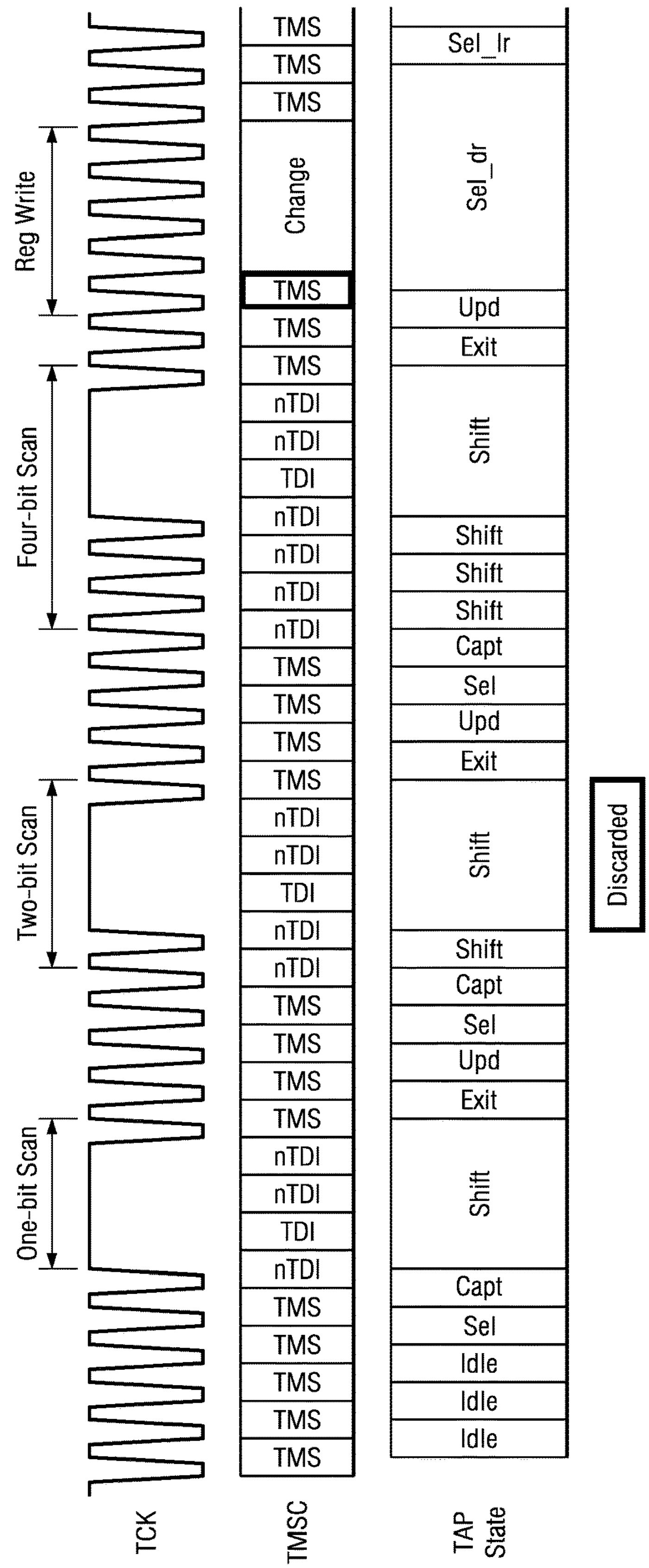
FIG. 112 is a timing diagram of OScan0 Transaction.
Figure 113:
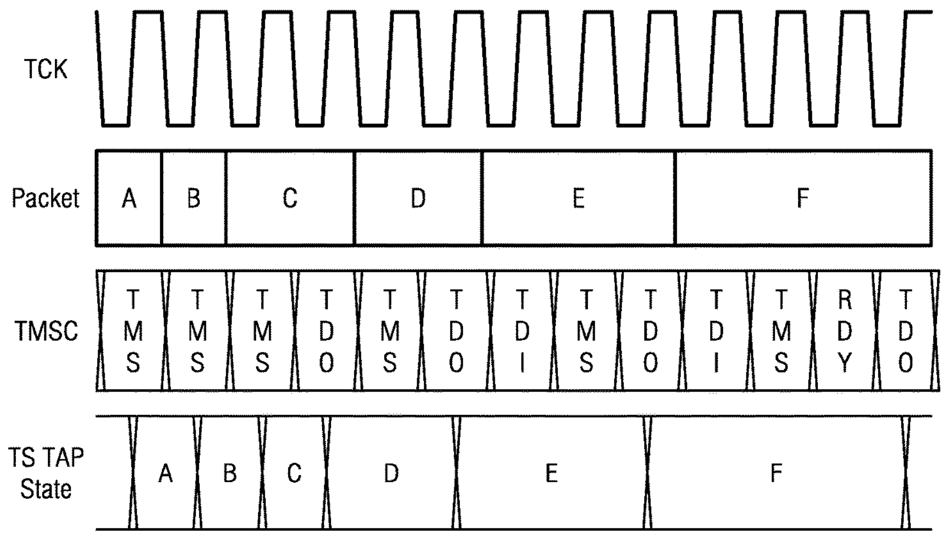
FIG. 113 is a timing diagram of OScan Packet and TS TAP State Association.

FIG. 105—Oscan 7 Transaction
FIG. 106—Oscan 6 Transaction
FIG. 107—Oscan 5 Transaction
FIG. 108—Oscan 4 Transaction
FIG. 109—Oscan 3 Transaction
FIG. 110—Oscan 2 Transaction
FIG. 111—Oscan 1 Transaction
FIG. 112—Oscan 0 Transaction The relationship of an OScan Packet and its associated TS TAP state is shown in FIG. 113. Packets that do not contain a TDO value causes a TAP state change ½ TCK after the packet completes. Packets that contain a TDO value cause a TAP state change midway through the TDO bit (½ TCK before the packet ends).

Figure 114:
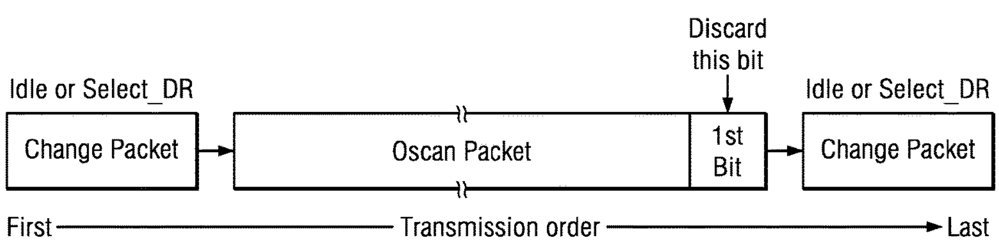
FIG. 114 is a diagram of Interrupt and an OScan Packet Sequence.

The flow of OScan packets is altered by three interrupts: BDX, CDX, and Register write. The interrupt occurs after the first bit of a new packet, with this bit being discarded by the TS. When the interrupt processing is completed, the scan packet associated with the current TAP state is sent by the DTS with the scan transfer continuing from this point. See FIG. 114.

SScan

Segmented Scans (SScan). The serialization of scan transfers includes formats that allow the partitioning of a single scan operation into segments. This provides the opportunity to create specialized formats that are more efficient than OScan formats. These formats are optimized to support application debug and emphasize performance improvements attainable with modified drivers and hardware.

A transfer is treated as one or more following information types: Control only, Input only, Output only, and Input and output.

The DTS software may schedule segment types to gain extra efficiency, as this can limit the transfer of information to only that which is needed by the DTS and TS. For instance, the data portion of a scan may be constructed from a number of the specialized segments. This minimizes the number of clocks needed to complete a scan transfer. Control-only segments are automatically used in states other than TAP shift states. Within the shift states, the DTS defines a shift operation as a number of segments, defining the length and type of each segment. Segment boundaries are created automatically upon entry into and exit from TAP shift states.

Figure 115:
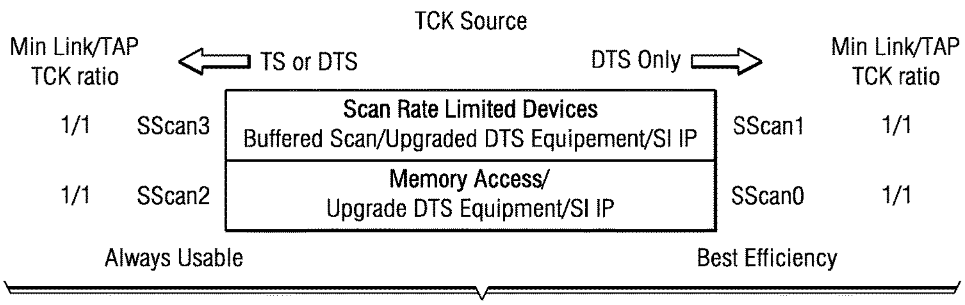
FIG. 115 is a diagram of SScan Capabilities.

In another instance, transfers to and from memory in an embedded system may be designed to incorporate "inlined" stalls when reading and writing data. This eliminates all software polling, and increases scan efficiency in systems where polling may take place with a conventional implementation. Scan transactions can be optimized further when the DTS is the TCK source, when two SScan use cases are expanded to formats to obtain the best performance for both DTS sourced, or when TS sources TCK (see FIG. 115).

Figure 116:
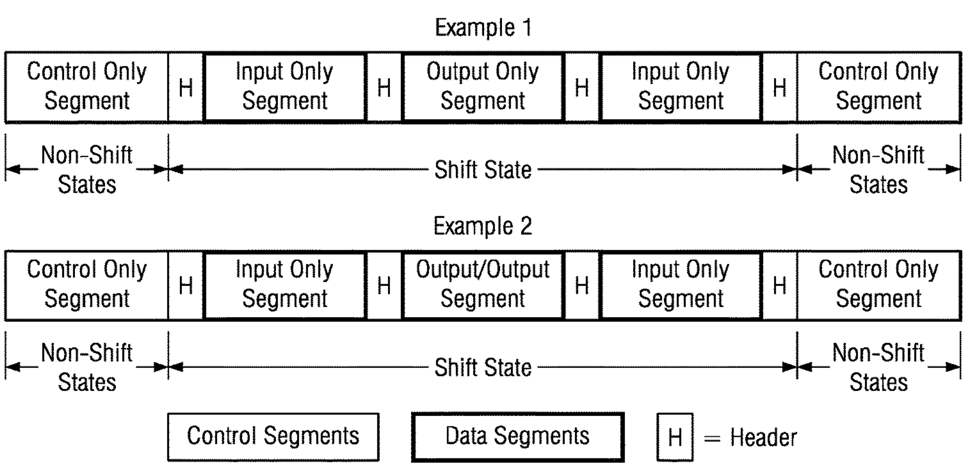
FIG. 116 is a diagram of SScan Transactions

The four Segmented Scan (SScan) formats provide for debug performance improvement by implementing specialized scan transactions that target common debug operations. These formats allow the partitioning of a scan transaction into control and data segments separated by headers. They use a variety of packets to exchange TAP state information between the DTS and TS. They are used when all of the following are true: After Link IDs are assigned, When a single adapter is selected, and When an SScan format is specified. Two examples of an SScan transaction are shown in FIG. 116.

SScan transactions may be used to accelerate: Scan transfers where the scan rate is limited arbitrarily by a component, and Transfers to and from memory, FIFOs, or registers. Performance is maximized when: A scan transaction may be split into different segment types, Segmentation provides efficiencies in excess of the overhead needed for using segments, and The DTS is the clock source.

SScan formats divide scan activity into control and data segments. A segment contains one or more packets, each related to a single TAP state. Segment lengths are determined entirely by the DTS as the protocol does not determine the length of a segment. Control segments are used in TAP states other than TAP shift states while data segments are used in shift TAP states. Entry into a TAP shift state ends a control segment and initiates a data segment. The DTS may, at its discretion, create additional data segments during the shift portion of the scan transaction. A control segment following a data segment causes an exit from the shift state. Control segment content is defined by the scan format.

A header separates adjacent segments when the one of the segments is a data segment. It describes the content of the segment following it as: Input only, Output only, Input and output, and Control.

SScan packets are very similar to OScan packets, but with additional payload types (see FIG. 117). A packet contains one or more of the following:

- nTDI—Inverted value of Test Data Input: the TDI TAP value associated with TAP state n
- TMS—Test Mode Select: the TMS TAP value associated with TAP state n
- END—End of Segment: the last packet of a segment has occurred
- RDY—Ready: An indication that identifies whether a frame transfer may proceed
- TDO—Test Data Output: The TDO TAP value associated with TAP state n
- DLYn—Delay: Zero to n delay bits, 0, 1, 2 fixed delays, 3 to n bit variable delay The template for SScan packets is shown in FIG. 118. These packets may: Be from 1 to 4 bits in length, Carry different information for different TAP states, and Support output only. Including a RDY bit also requires the inclusion of a TDO bit. The delay is eliminated when the DL1[1:0] field specifies no delay. Since a single packet template is used, the underlying hardware merely populates the template for each TAP state. The packet content is defined by a combination of control register setting (scan format), header value, TAP state, and stalls that may extend the packet length. The nTDI, TMS, RDY, and TDO bits have the same characteristics as described in the section on OScan. END bits are inserted in the packet payload to indicate an end of segment when an SScan2 or SScan3 format is used. An END bit of one (1) indicates the last packet of the segment while a zero (0) indicates the packet contains at least one more packet. When an SScan0 or SScan1 format is used, the End-of-Transfer escape sequence is used to indicate an end of segment. The absence of an End-of-Transfer indicates the segment continues for at least one more packet.

Headers separate segments and perform the following functions: Select one of two transaction types available to a SScan format, Define the payload type (I, O, IO), and Allow initiation of a CDX transfer. The transaction type is specified once per Shift_DR state while the payload may be defined once per each data and control segment. A CDX transfer may be initiated following entry into the Shift_DR state.

Two header lengths are used to manage segments: Long (3-bit)—Following a control segment upon entry into a TAP shift state, and Short (2-bit)—Following a data segment. Headers precede data and control segments as shown in FIG. 119. There are no headers between consecutive control segments.

When a two-bit header follows a three-bit header, the newly transmitted HDR(0) and HDR(1) bits are concatenated with the HDR(2) bit sent by the previously transmitted 3-bit header to the 3-bit header. The resulting value is used to define segment characteristics as follows: Header Resulting Header Value goes to CBA 3-bit Header Transmission; goes to CBA Header Value Defining First Segment; goes to XY 2-bit Header Transmission goes to CXY Header Value Defining Second Segment.

The transaction type is specified at the beginning of the shift state along with the payload of the first segment with a long header. Payloads of subsequent data segments are specified, without changing the transaction type, using a short header. This provides the DTS the means to use more than one specialized capability without changing the SScan format. A header does not affect the segment behavior outside the shift states except for causing an exit from the shift state and defining the next segment as a control segment. Control segment characteristics are defined entirely by the SScan format.

The 3-bit header value is decoded as shown in FIG. 120. The HDR(2) bit selects one of two SScan transaction types available to the format while the HDR(1) and HDR(0) bits specify the segment payload (I, O, or IO).

A header value of "011" or "111" is interpreted differently when this header follows a control segment as opposed to the header following a data segment. When either of these values follows a control segment, an input only segment is specified with the initiation of a CDX transfer permitted. When either of these values follows a data segment, the shift state is exited with the next segment a control segment. See FIG. 121 for a list of transaction types.

A CDX transfer may be activated following the first packet of the first segment when: The TAP state is Shift DR, An"×11" header precedes a data segment following a control segment, and CDX has been previously enabled through the control register. When this procedure is used, a CDX operation is initiated in lieu of the first data segment following a control segment and continues until the Shift_DR state is exited as the TAP state is advanced within the CDX transfer.

The packet separation and delay for SScan formats is identical to that discussed in the MScan Section. The packet delay follows the packet information with the same delay options as with MScan packets.

SScan formats raise the scan transaction efficiency by combining three different optimizations in addition to segmentation: Paced (P)—selectively use scan transaction stalls to control segment progression, Buffered (B)—transfers between target TAPs and the adapter JTAG interface may be buffered, and Accelerated (A)—transfer segments with no TS output at TCK rate, others at TS rate.

Paced optimization is used to increase performance for debug operations such as memory reads or writes. It may also be used for other applications. Information needed to perform an operation is packaged as segments designed to perform a fixed amount of work within the TS. Paced optimization provides a means for the TS to stop scan progression at segment boundaries until the TS is ready to proceed. Scan progression may be managed one of two ways, stopping the transaction: At the beginning of segment n during the first packet of segment n, and After segment n during the first packet of segment n+1.

Figures 121, 122:
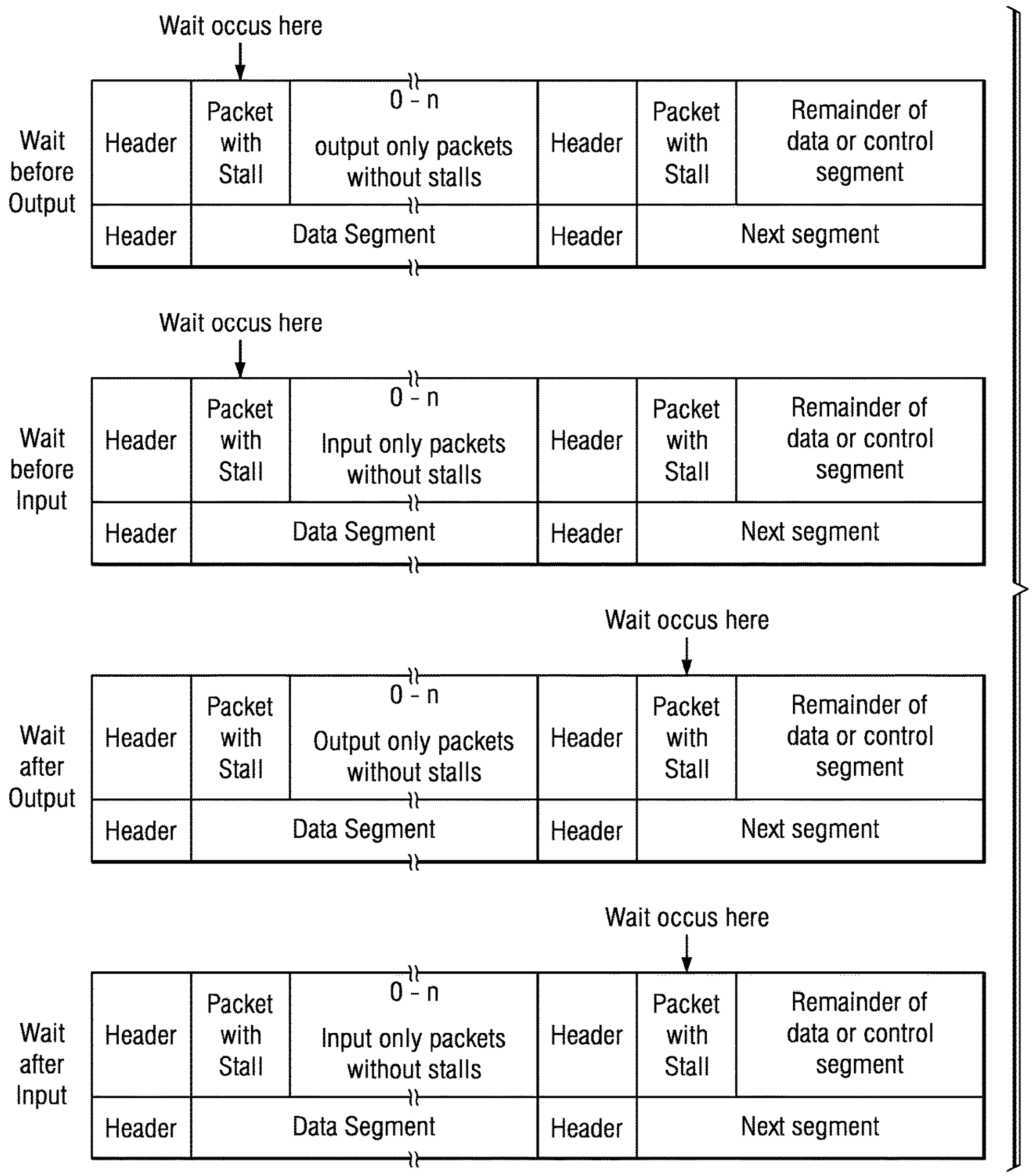
FIG. 121 is a table of Transaction Type.
FIG. 122 is a diagram of Input/Output Pacing.

A stall is included in the first packet of each segment. The TS may delay an incoming transaction until the prior transaction has completed processing before or after accepting input. The TS may delay an outgoing transaction until it has data to supply to the transaction before or after generating output. This approach eliminates software polling of the TS. Scan transactions merely stall until the TS is ready to complete the transaction. The TS may incorporate a timeout as part of these operations, if there is a risk of transactions going "not ready" indefinitely. The payload is merely extended to include timeout status, if needed. Examples of IO pacing are shown in FIG. 122.

Figure 123:
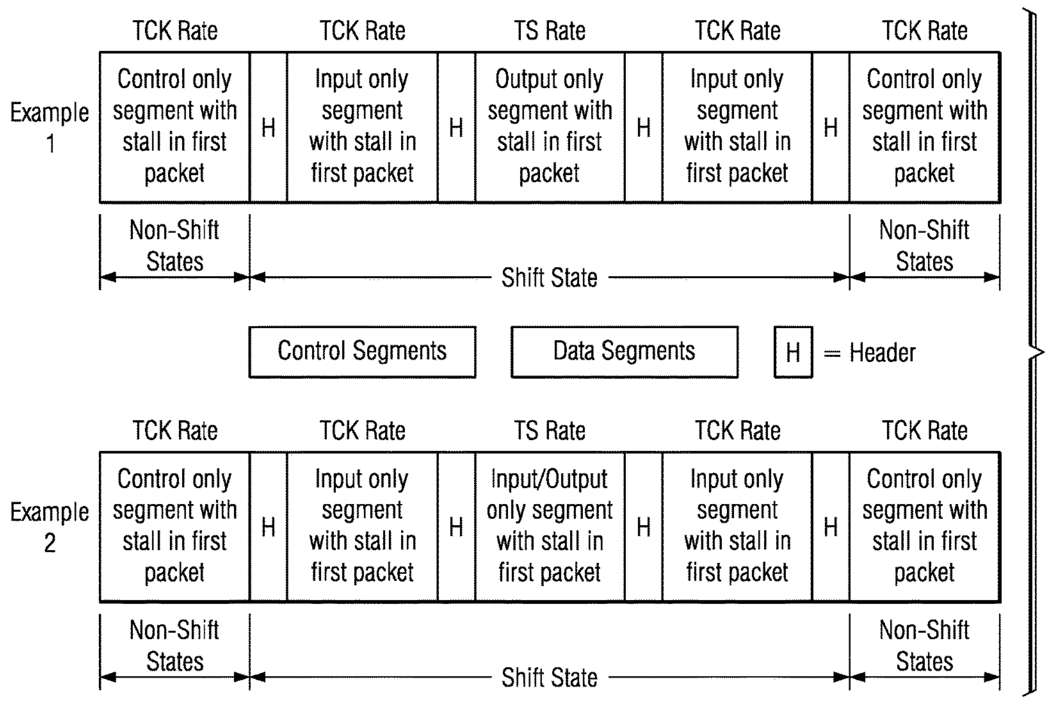
FIG. 123 is a diagram of Buffered Scan Transactions.

Buffered optimization is used in combination with paced optimization. It is used to increase scan performance in cases where scan transfers can buffer input and output. It can also be used with non-buffered transfers. The DTS creates control and data segments that are less than or equal to the size of the scan input buffer. Control-only segments fill the input buffer at the TCK rate. The buffer is emptied at the TS rate. The TS uses the stall in the first packet of the segment to delay the next segment until it has emptied the input buffer. Emptying the buffer occurs at a rate determined by the TS. All control and data segments are treated the same. Two examples of buffered scan transaction are shown in FIG. 123.

Figure 124:
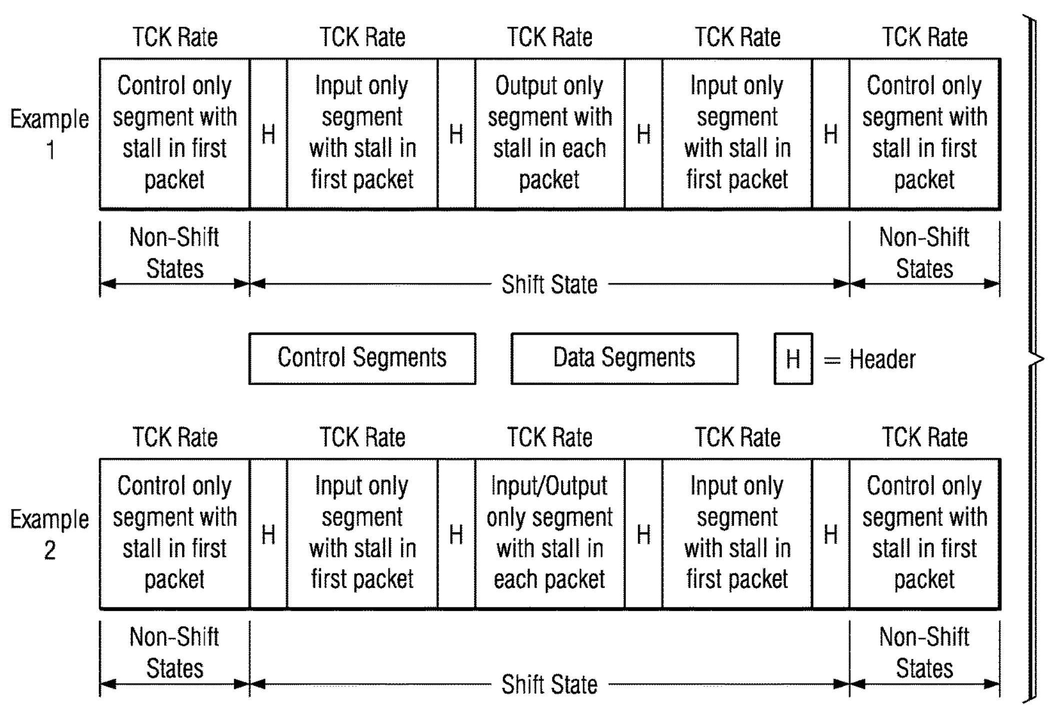
FIG. 124 is a diagram of Accelerated Scan Transactions.

Acceleration optimization is used in combination with segmented, paced, and buffered optimizations. It is used to increase scan performance in cases where the scan rate is limited arbitrarily by a component (such as ARM9 and ARM11 cores). With accelerated optimization, data segments that contain TS output are treated differently than control segments and input only data segments. With these segments, input buffering is bypassed and transactions occur on a bit-by-bit basis. Each packet transferring TS output includes a stall, with the TS using the stall to delay output until it is ready to supply output. Two examples of accelerated scan transactions are shown in FIG. 124.

Figure 33:
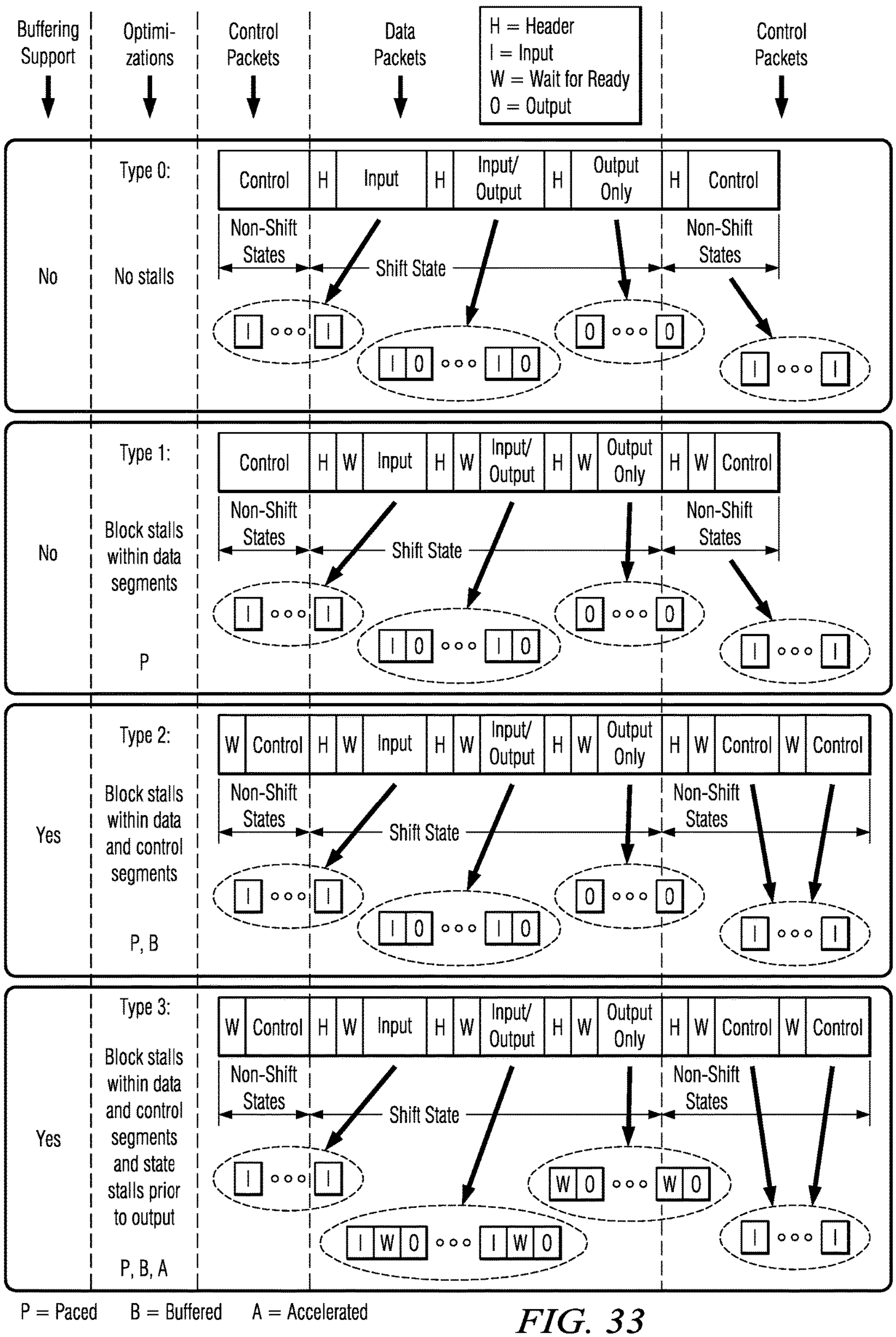
FIG. 33 is a block diagram of a standard IEEE 1149.1 emulator with an external cJTAG Adapter.
Figure 34:
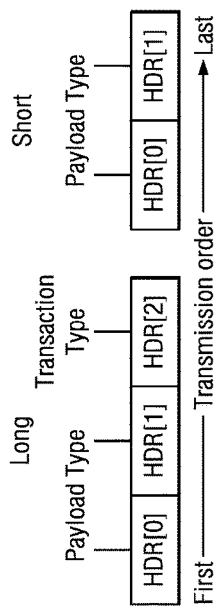
FIG. 34 is a block diagram of a cJTAG capable emulator.
Figure 35:
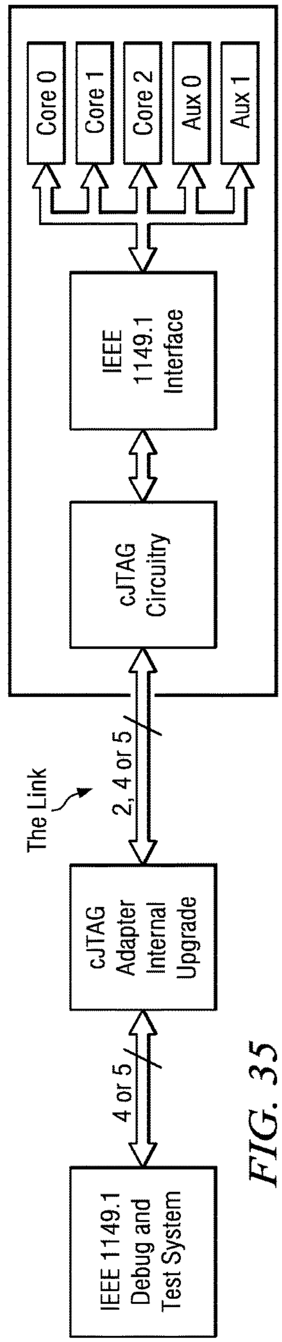
FIG. 35 is a block diagram of a DTS and TS link interface
Figure 36:
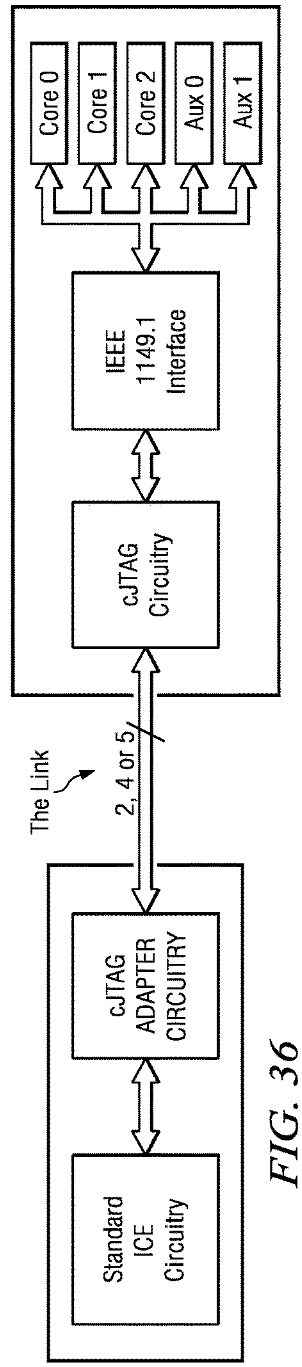
FIG. 36 is a DTS Adapter block diagram.

The SScan optimizations (P, B, and A) are used to create the four transaction types as shown in FIG. 33. Collectively, these transaction types incorporate differing degrees of optimization. Two transactions support input buffering and two do not. The transactions types that do not support buffering provide greater efficiency, as the DTS waits less on TS completion than on any other operation. There are two versions of each of these types, one supporting a TS-supplied TCK and the other supporting a DTS-supplied TCK. The use of specific transaction types requires the supporting hardware outlined in FIG. 125.

Type 0 transactions provide a simple way of reducing the transmission of unneeded scan information. This transaction type may be used where the Link and JTAG interfaces run at the TCK rate. There are no transaction stalls. Headers are the only overhead added to the scan. This transaction type supports: Boundary scan, Unidirectional scans, and Optimized transfers controlling embedded processors. This transaction type provides: TCK transaction rate, A single control segment, DTS definition of data segment size, and Segments of any length. A typical transfer would consist of:

A control segment transferred at the TCK rate
Input only
One or more data segments transferred at the TCK rate:
Input only
Output only
Input/Output
A control segment transferred at the TCK rate
Input only Type 1 transactions provide a simple way of reducing the polling delays typical of interacting to on-chip components interfacing to memory or like structures. This transaction type may be used where the Link and JTAG interfaces run at the TCK rate. This transaction type is a Type 0 transaction with a W (Wait for Ready) added within the first packet of a data segment which may result in a stall. This transaction type supports: Block-oriented component interfaces, and Input and output paced by availability of storage space for input or data for output. This transaction type provides: TCK transaction rate, A single control segment, DTS definition of data-segment size, and Efficient interfacing to components like memory.

A typical transfer would consist of:
A control segment transferred at the TCK rate
Input only
One or more data segments:
Input only
A wait for the TS to acknowledge ready to proceed
An input segment transferred at the TCK rate
Output only
A wait for the TS to acknowledge ready to proceed
An output segment transferred at the TCK rate
Input/Output
A wait for the TS to acknowledge ready to proceed
An input/output segment transferred at the TCK rate
A control segment transferred at the TCK rate
Input only Type 2 transactions provide a simple way of minimizing the amount of hardware expended on a debug interface. This type of transaction is similar to Type 1. Input buffering is used for control and data segments. This transaction type may be used to implement a memory interface where a shift register FIFO is used to send address and data (or similar information) to a buffer at TCK rate, stall while the segment is being processed, and continue with output in a second segment, when the command has created output. The buffer many be filled at TCK rates. This transaction type supports: Block transfer oriented component interfaces, and Input and output paced by availability of storage space for input or data for output. This transaction type provides similar capabilities to Type 1, only using buffered input.

A typical transfer would consist of:
A control segment transferred at the TCK rate
Input only
One or more data segments:
Input only
A wait for the TS to acknowledge ready to proceed
An input segment transferred at the TCK rate
Output only
A wait for the TS to acknowledge ready to proceed
An output segment transferred at the TCK rate
Input/Output
A wait for the TS to acknowledge ready to proceed
An input/output segment transferred at the TCK rate
A control segment transferred at the TCK rate
Input only Type 3 transactions provide a means to accelerate transactions with scan-rate-limited components. Scan input is placed in a buffer at the full TCK rate. It is removed from the buffer and used at a rate determined by the system. If no output is needed, the next segment may proceed when the processing of an input segment completes. When a segment requires output, the transfer waits until each output bit is completed before proceeding to the next packet. This transaction type supports: Scan transactions across clock domains, and Components requiring state stalls to properly produce output. This transaction type provides: All transaction input transferred at full TCK rate, once block ready to proceed is received, Output synchronized to the rate required by the system, and DTS definition of control and data segment size.

A typical transfer would consist of:
A control segment transferred at the TCK rate
A wait for the TS to acknowledge ready to proceed
An input only segment transferred at the TCK rate
One or more data segments:
Input only
A wait for the TS to acknowledge ready to proceed
An input segment transferred at the TCK rate
Output only
A wait for the TS to acknowledge ready to proceed
An output segment transferred at a system defined rate
Input/Output
A wait for the TS to acknowledge ready to proceed
An input/output segment transferred at a system defined rate
A control segment transferred at the TCK rate
A wait for the TS to acknowledge ready to proceed
An input only segment transferred at the TCK rate The SScan formats and the scan types they support are shown in FIG. 126. The AB designation is determined by the HDR(2) bit as shown in FIG. 121. Also, see FIG. 120.

The SScan3 and SScan1 payloads vary based on whether the payload is in the 1st data segment, in the 1st packet of a segment, and the value of HDR(2:0). They are shown in FIG. 127. Delays occur after the last bit of the packet payload shown.

The SScan2 and SScan0 payloads vary based on whether the payload is in the 1st data segment, in the 1st packet of a segment, and the value of HDR(2:0). They are shown in FIG. 128. Delays occur after the last bit of the packet payload shown.

Figure 129:
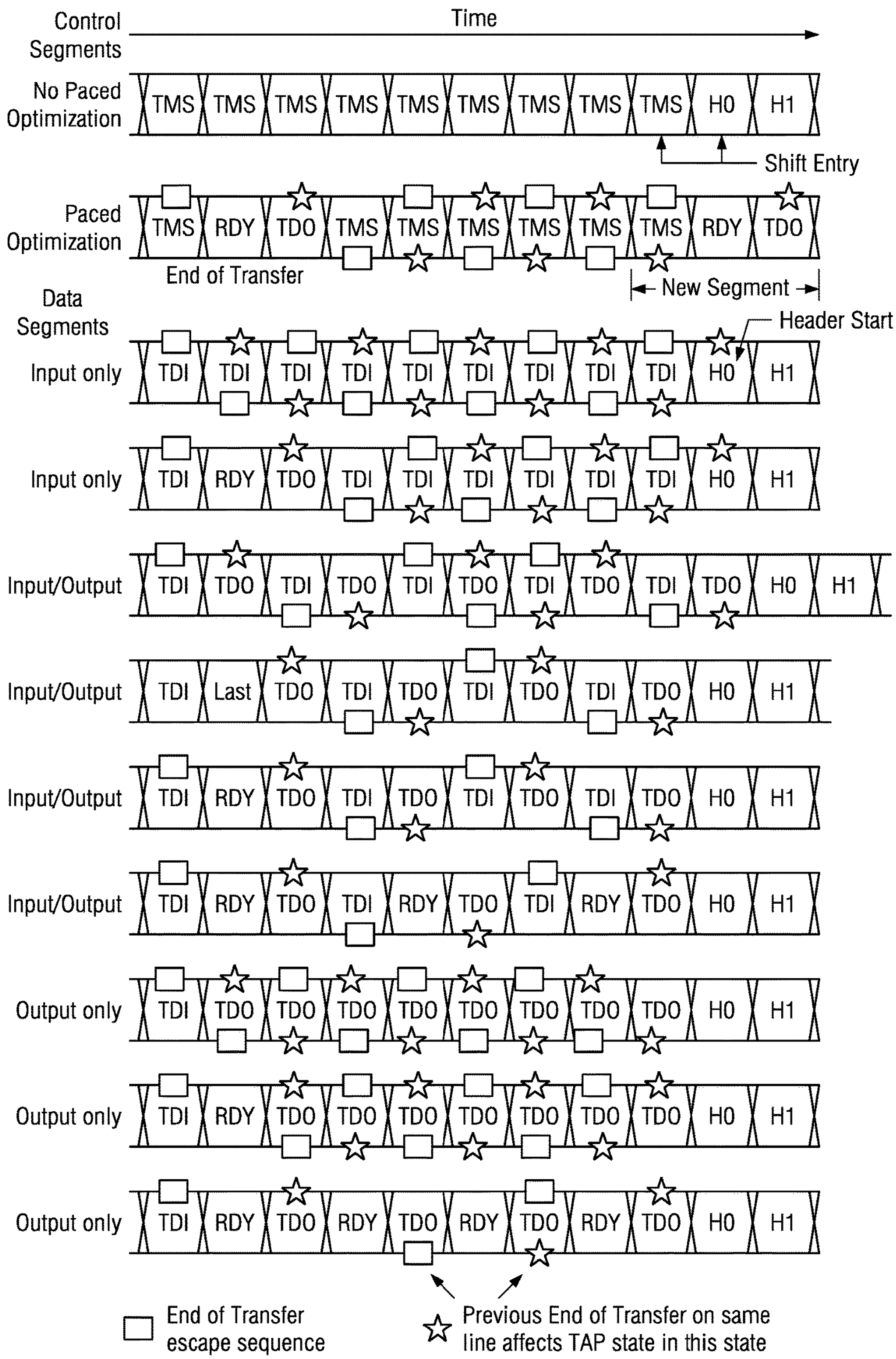
FIG. 129 is a timing diagram of End-of-Transfer Escape Sequence Position and Effect.

Two mechanisms are used to end a data segment: End-of-Transfer escape sequence—SScan0 and SScan 1, and End Bits—SScan2 and SScan3. The use of an End-of-Transfer escape sequence to end a segment is shown in FIG. 129 A rectangle indicates a potential escape position. The star following it on the same line of the waveform indicates the escape will affect the TAP state at this point. The waveforms shown change on the falling edge of TCK. The falling edge of TCK following the escape synchronously presents the escape to adapter logic on the falling edge with it affecting the TAP state at the first point the TAP state may be advanced by the rising edge of TCK.

Figure 130:
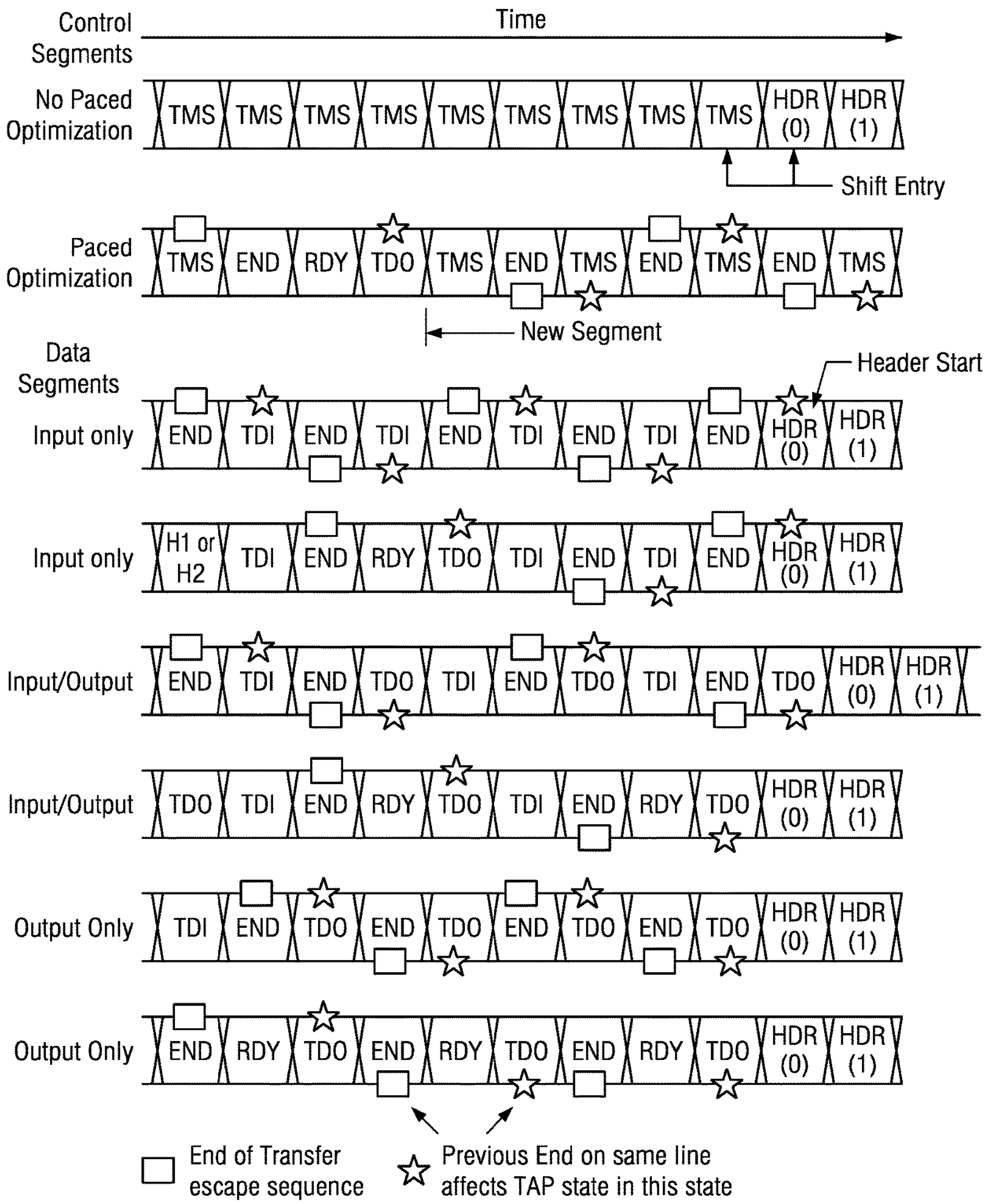
FIG. 130 is a timing diagram of End Bit Position and Effect.

The END bit discussed earlier, is used to end a segment when SScan2 or SScan3 format is used. This bit is inserted after TMS or TDI and before RDY or TDO in the transmission sequence. An END value of one (1) identifies the end of a segment. A zero (0) continues the segment. A rectangle indicates a potential escape position. The star following it on the same line of the waveform indicates the escape will affect the TAP state at this point. See FIG. 130.

The only consideration when using the SScan2 and SScan0 formats is minimizing the transfer time: All control information is placed in a single segment (TMS associated with a non-shift state), and Data information may be partitioned into segments where minimizing the transfer time is the only consideration (TDI and TDO information associated with a shift state). These are two considerations when using SScan3 and SScan1 formats: Minimizing the information transferred, and DTS and TS data rate and volume matching. A combination of the scan format and the SD[2] header bit define the format behavior as shown in FIG. 131.

Figure 132:
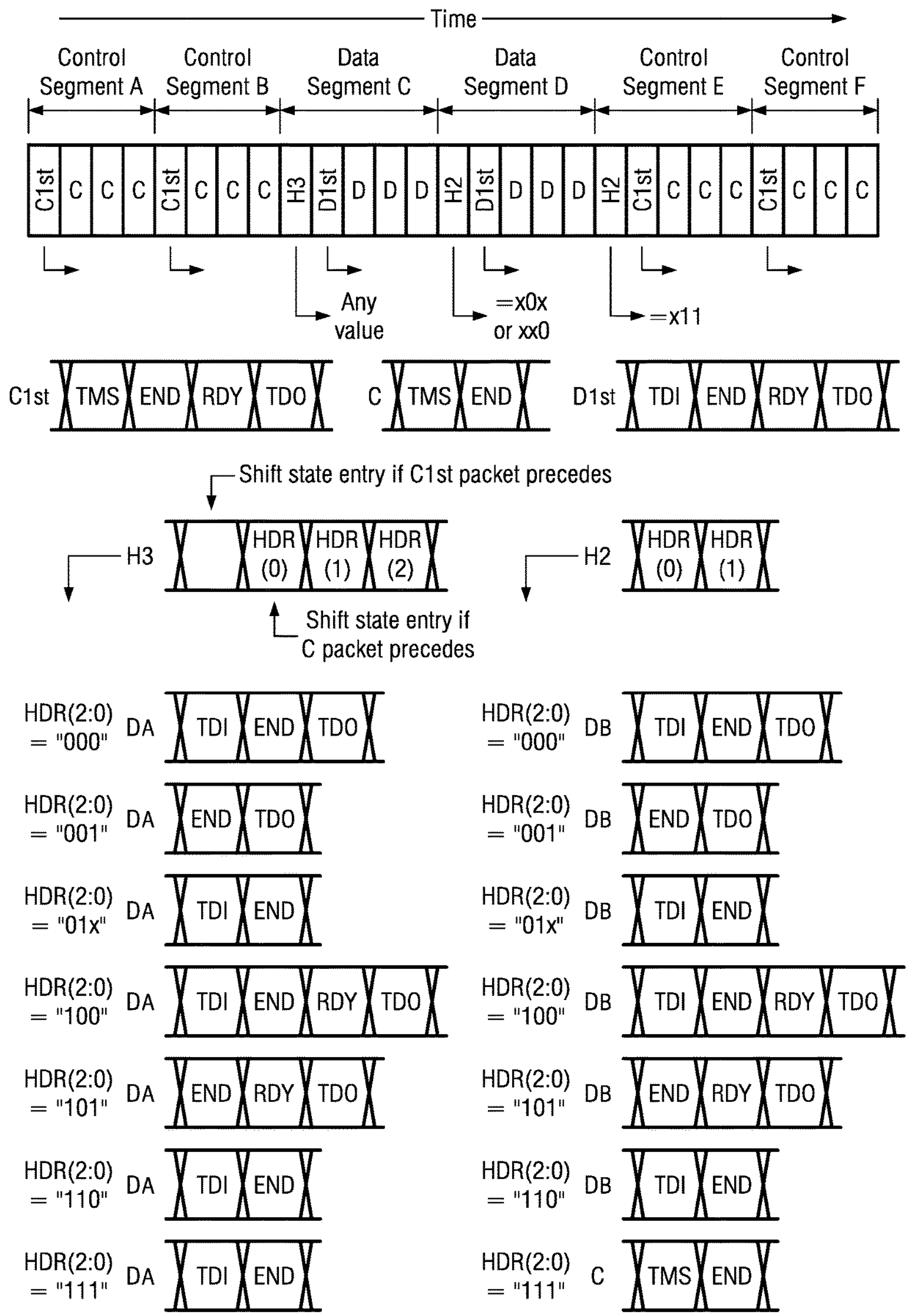
FIG. 132 is a timing diagram of SScan3 Transaction Template.

The SScan3 transaction template is shown in FIG. 132 along with the template options.

Figure 133:
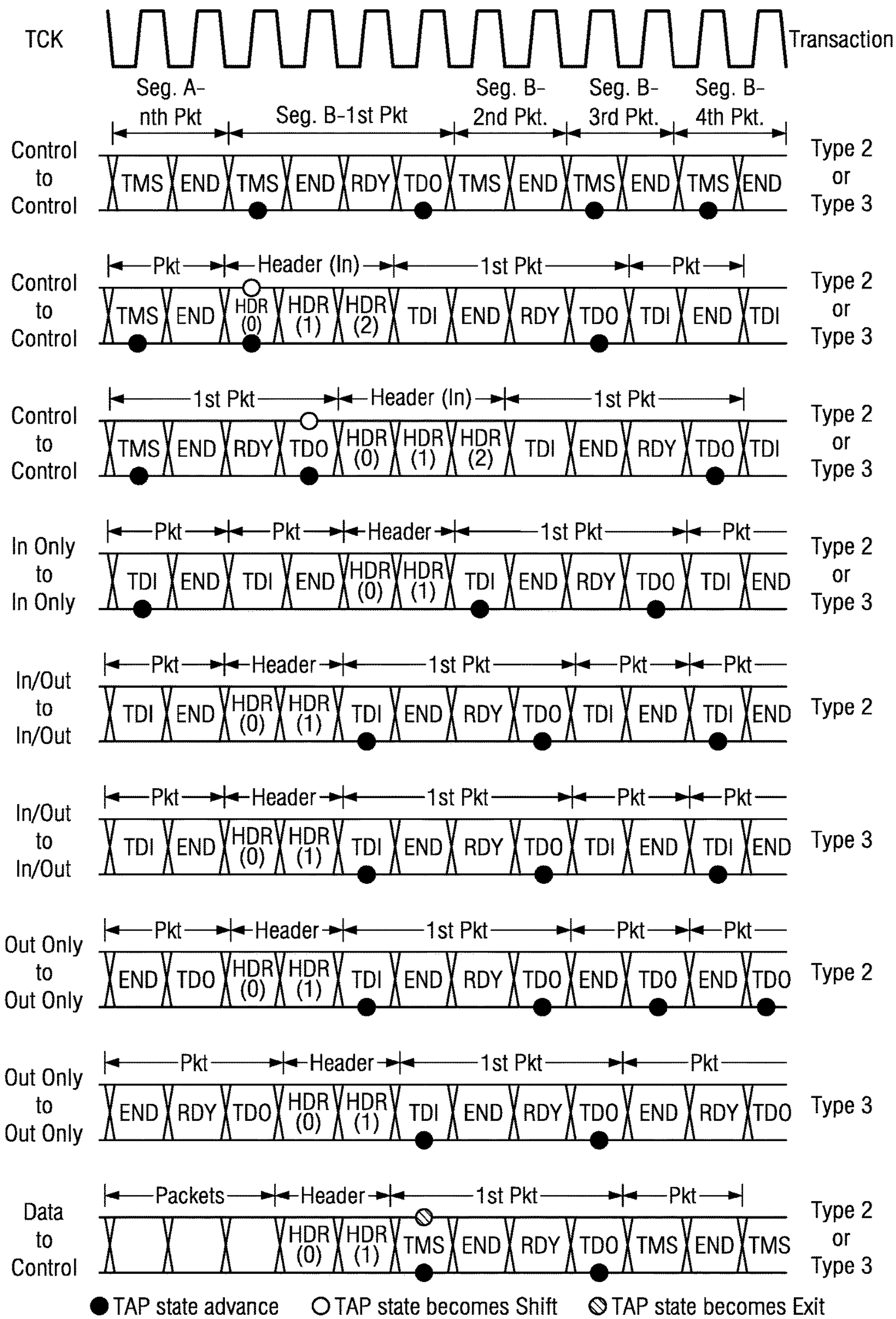
FIG. 133 is a timing diagram of SScan3 Segment Transitions.

The transitions between SScan3 segments are shown in FIG. 133. The black dots denote the point at which the TAP state changes. The open dots denote where the TAP state changes to Shift. The gray dots denote where the TAP state changes to Exit.

Figure 134:
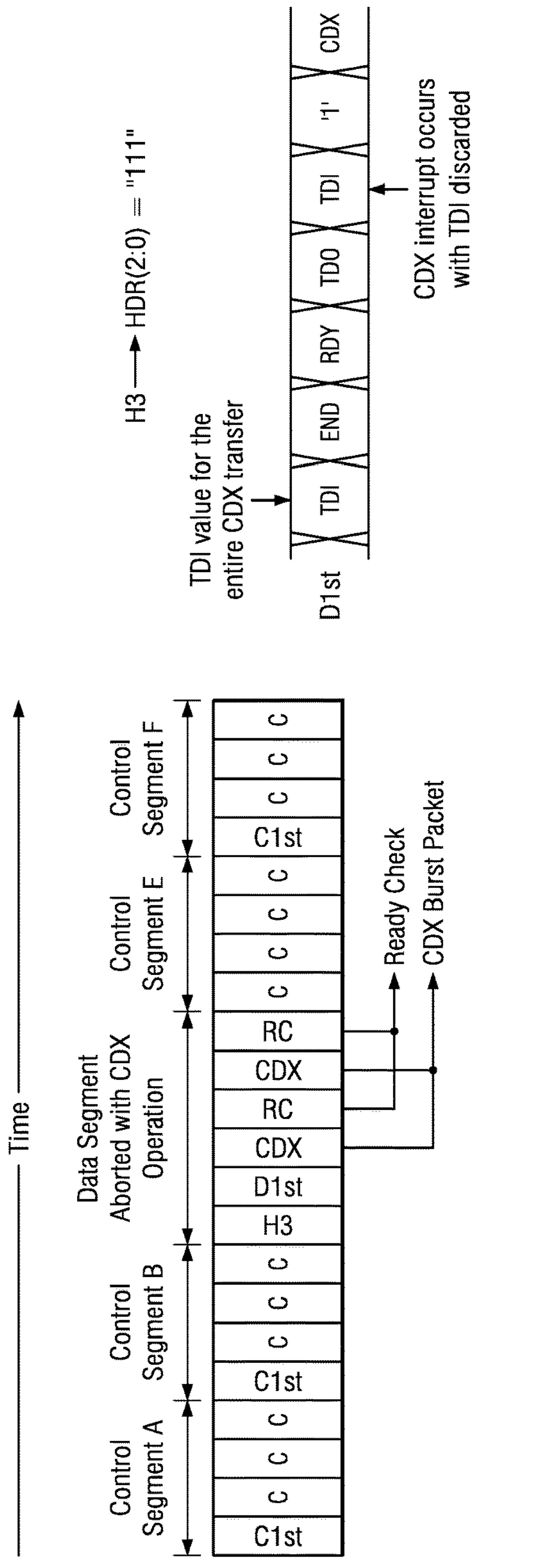
FIG. 134 is timing diagram of SScan3 Format with CDX Activation.

A CDX transfer is permitted if the first header following a control segment is “111”. In this case a CDX transfer begins if it is enabled following the D1st packet of the first data segment. An interrupt is generated at the TDI of the second packet causing termination of the segmented transfer as shown with the TDI value discarded. If CDX is not enabled, the segmented transfer continues as input only. This is shown in FIG. 134. Note that only Burst transfers are supported with this format as continuous transfers are remapped to burst transfers.

Figure 135:
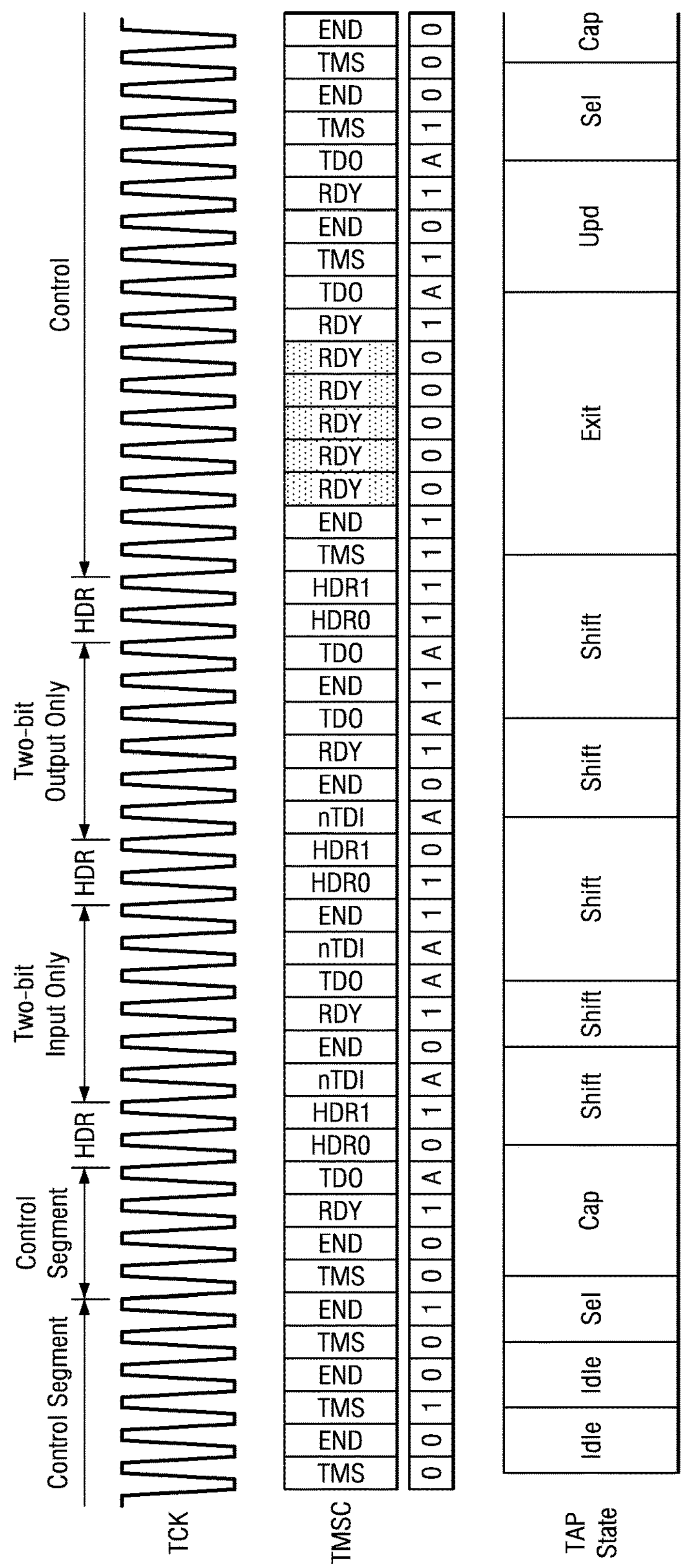
FIG. 135 is a timing diagram of SScan3 Transaction, Type 2, with Segment Stall.

An example of a Type 2 transition is shown in FIG. 135. This example illustrates: a one packet control segment preceding shift state entry, an exit from the shift state, and a stall in the first packet of the control segment following the data segments. The stall states are shown in gray. TMSC values shown as A may be either a one (1) or a zero (0).

Figure 136:
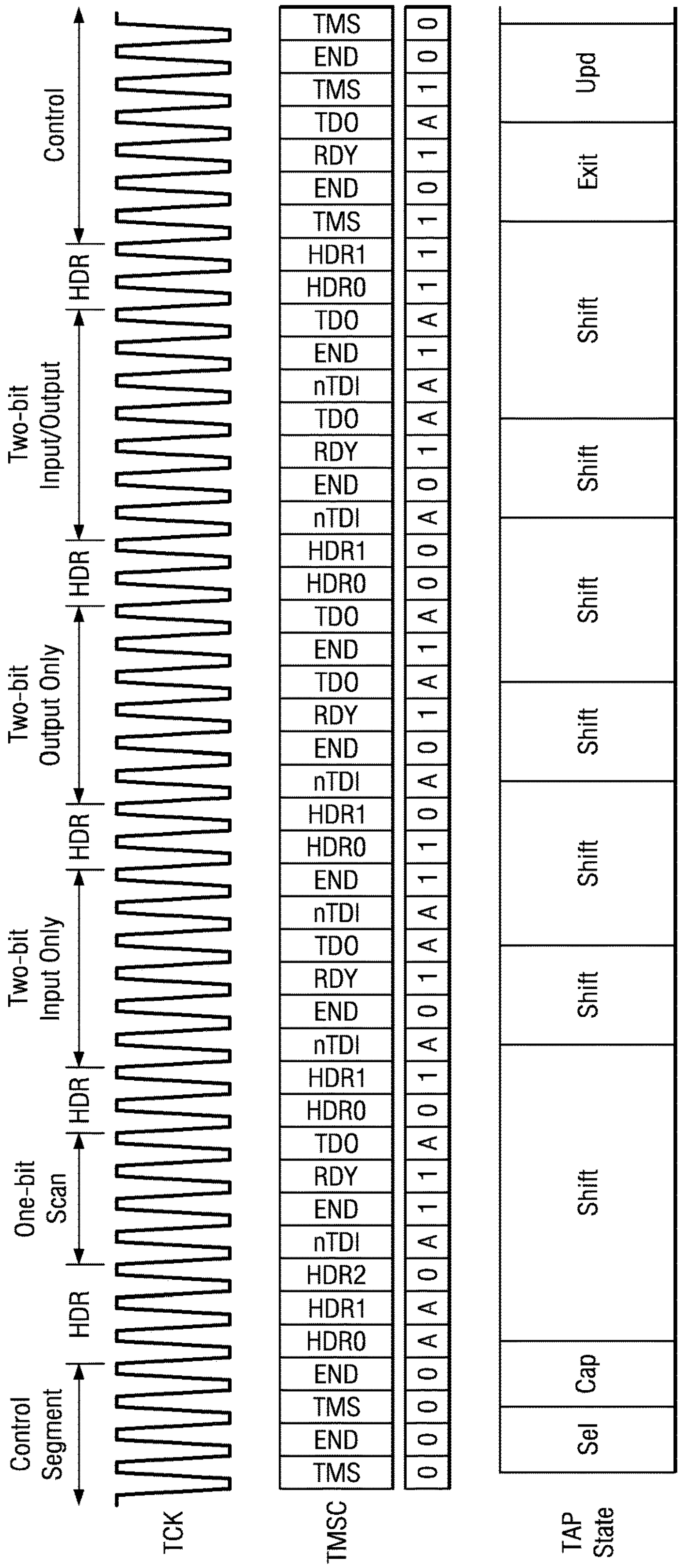
FIG. 136 is a timing diagram of SScan3 Transaction, Type 2, All Data Segments.

An example of a Type 2 transition is shown in FIG. 136. This example illustrates: the initial data segment with one packet), all other data segment types (two packets/segment), and a stall in the first packet of the control segment following the data segments.

Figure 137:
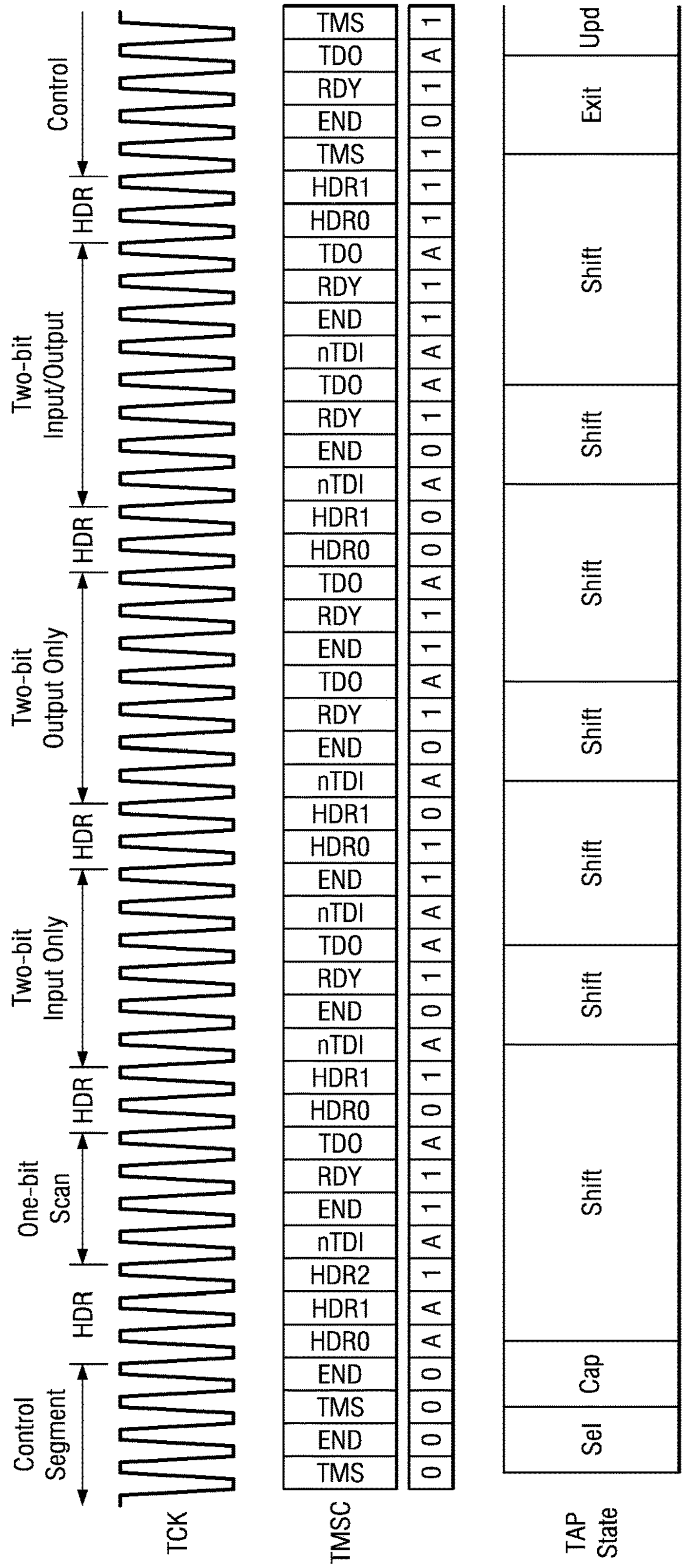
FIG. 137 is a timing diagram of SScan3 Transaction, Type 3, All Data Segments.

An example of a Type 3 transition is shown in FIG. 137. This example illustrates: the initial data segment with one packet, all other data segment types (two packets/segment), a stall in each packet of the output only and input/output segments, and a stall in the first packet of the control segment following the data segments.

Figure 138:
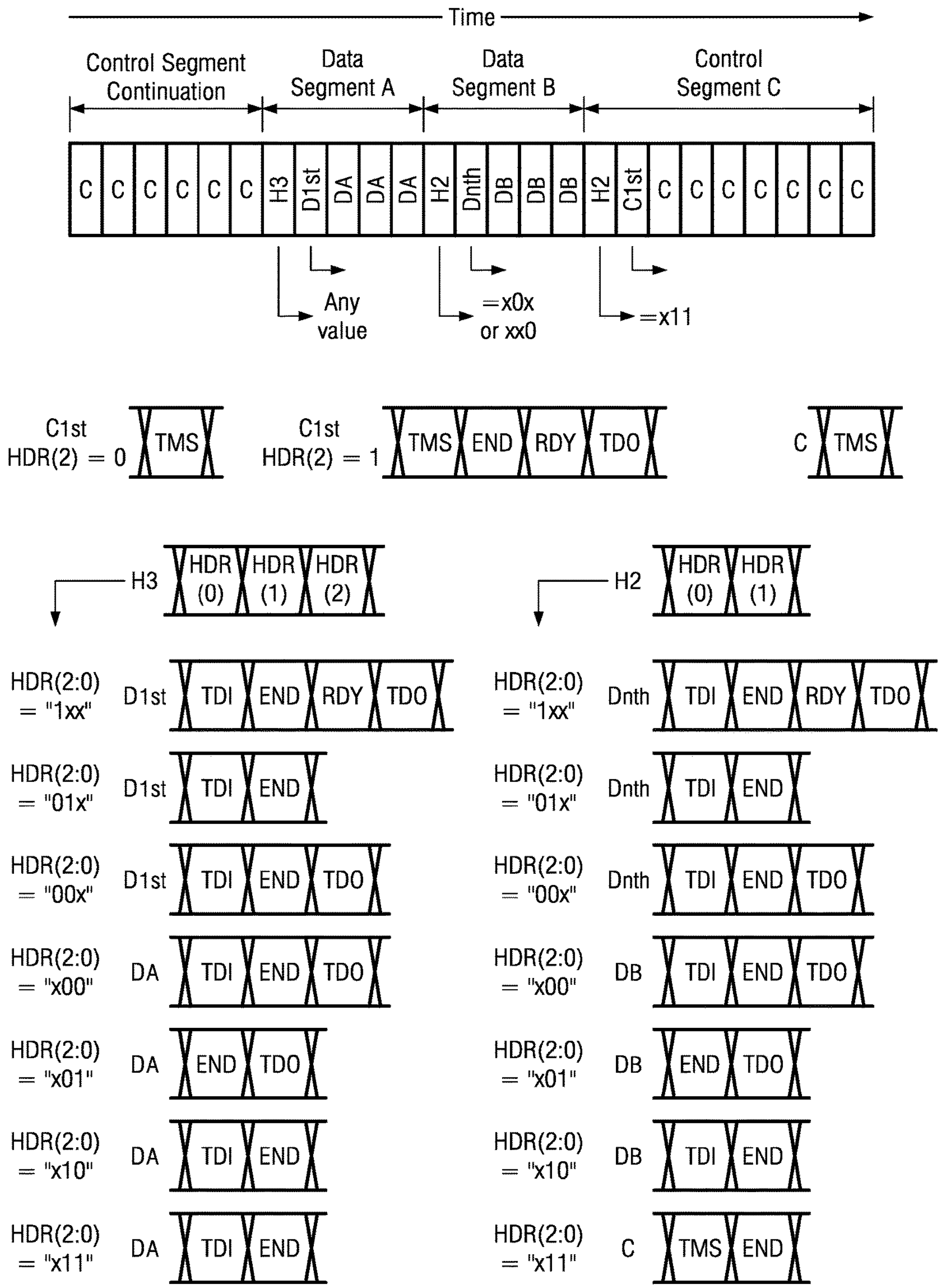
FIG. 138 is a timing diagram of SScan2 Transaction Template.

The SScan2 transaction template is shown in FIG. 138 along with the template options.

Figure 139:
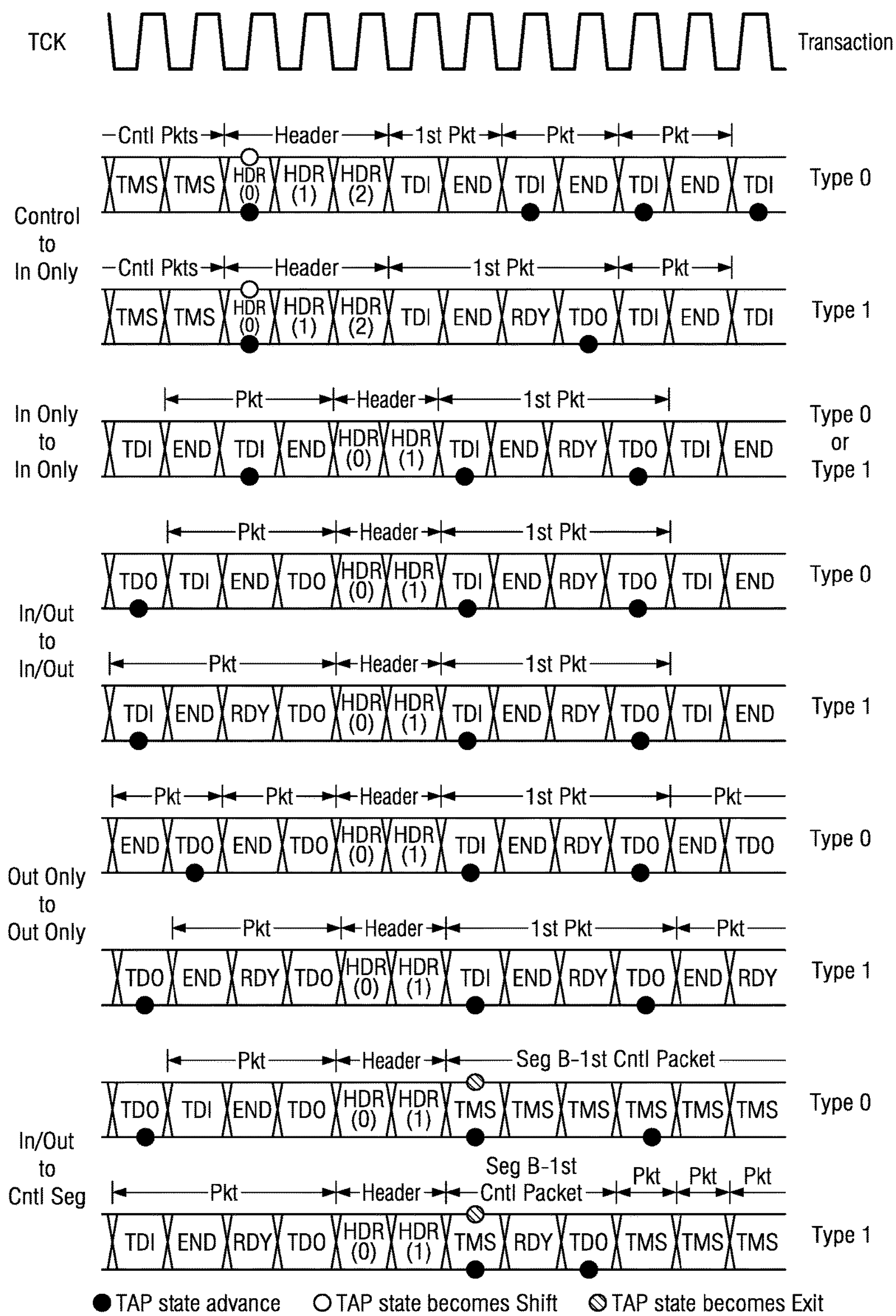
FIG. 139 is a timing diagram of SScan2 Segment Transitions.

The transitions between SScan2 segments are shown in FIG. 139. The black dots denote the point at which the TAP state changes. The open dots denote where the TAP state changes to Shift. The gray dots denote where the TAP state changes to Exit.

Figure 140:
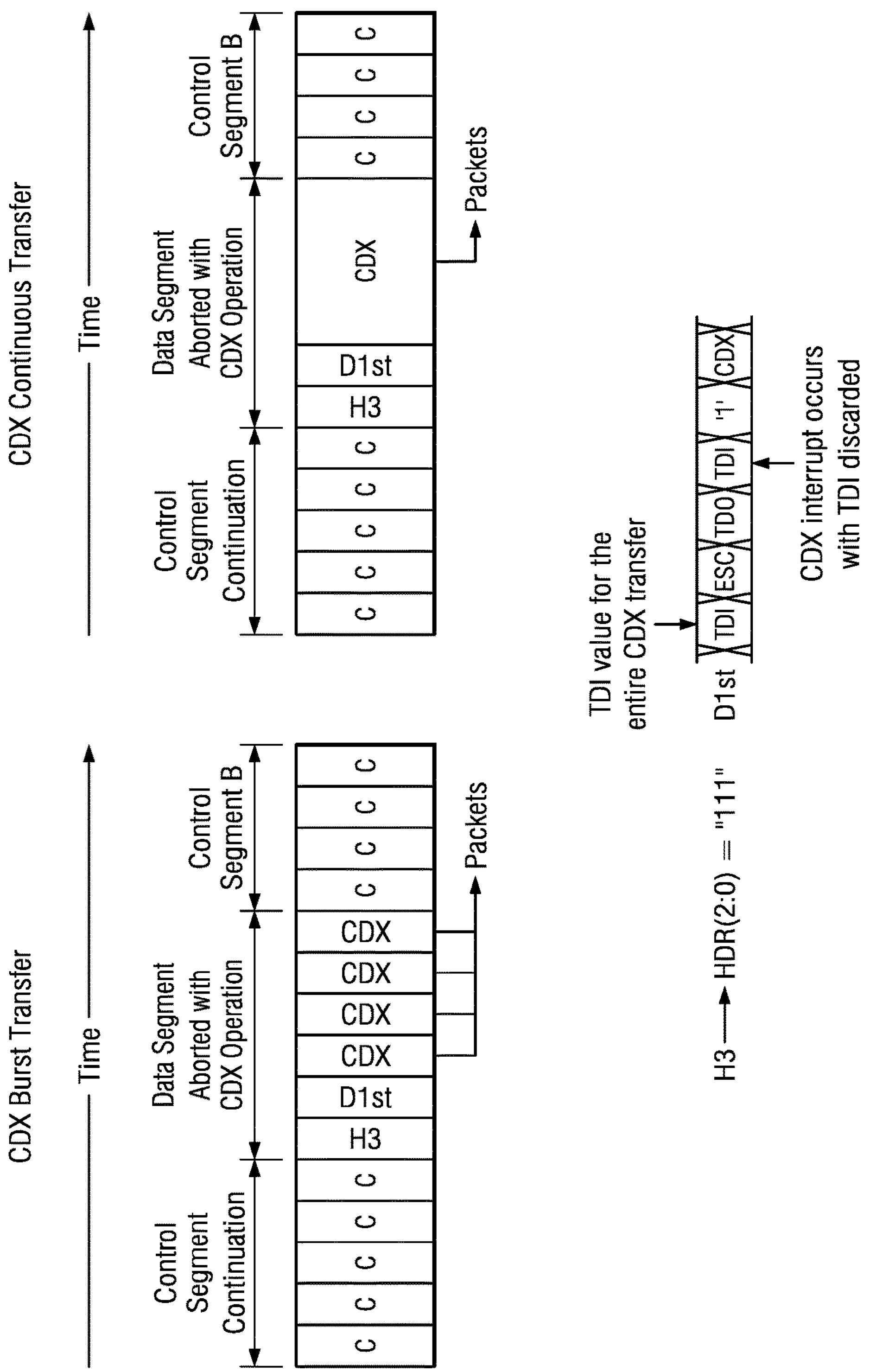
FIG. 140 is a timing diagram of SScan2 Format with CDX Activation.

A CDX transfer is permitted if the first header following a control segment is “111”, just as with SScan3 transactions. This is shown in FIG. 140. Note both Burst and Continuous transfers are supported with this format and there is no checking of ready between burst packets.

Figure 141:
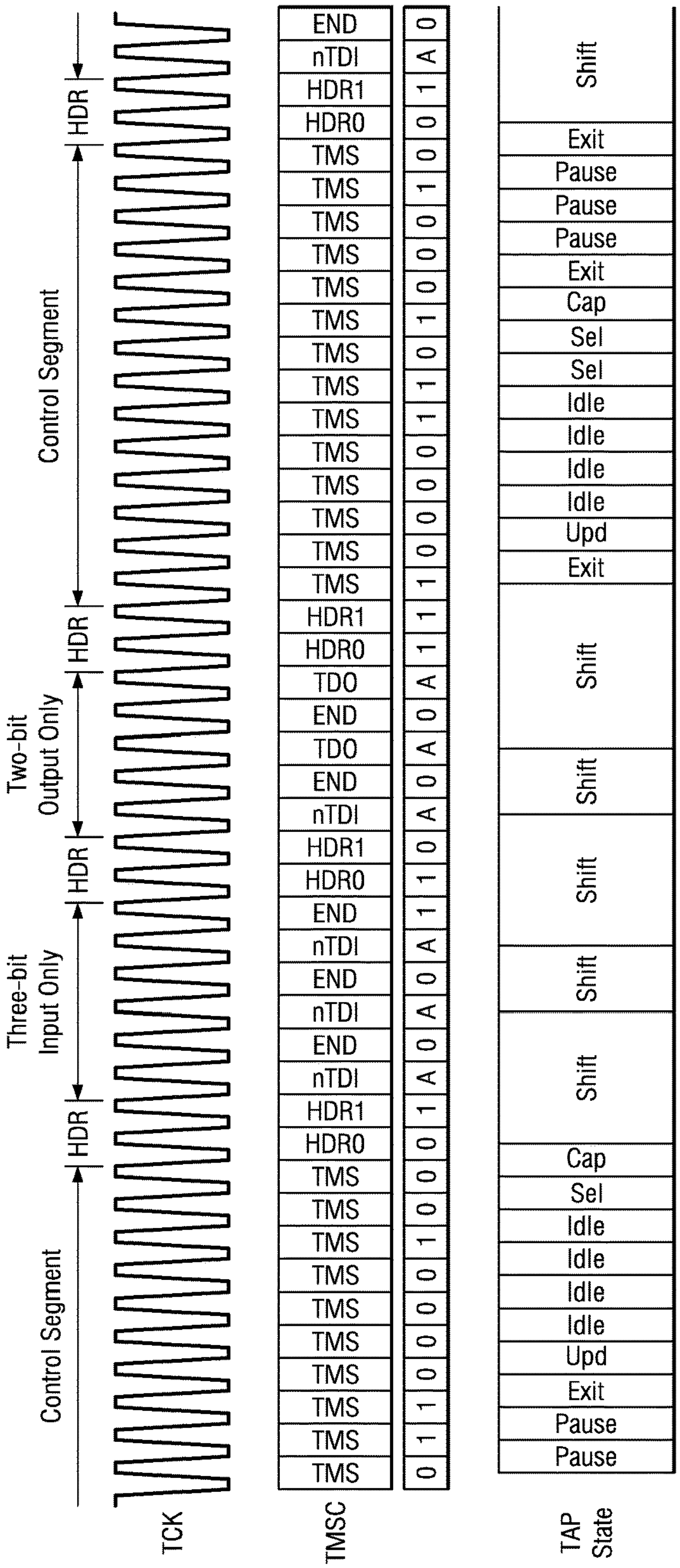
FIG. 141 is a timing diagram of SScan2 Transaction, Type 0 with Shift Entry from Exit State.

An example of a Type 0 transition is shown in FIG. 141. This example illustrates: A single control segment between Data Segments, No RDY bits in control and data segments, and Entry into the shift state from both Capture and Exit. TMSC values shown as A may be either a one (1) or a zero (0).

Figure 142:
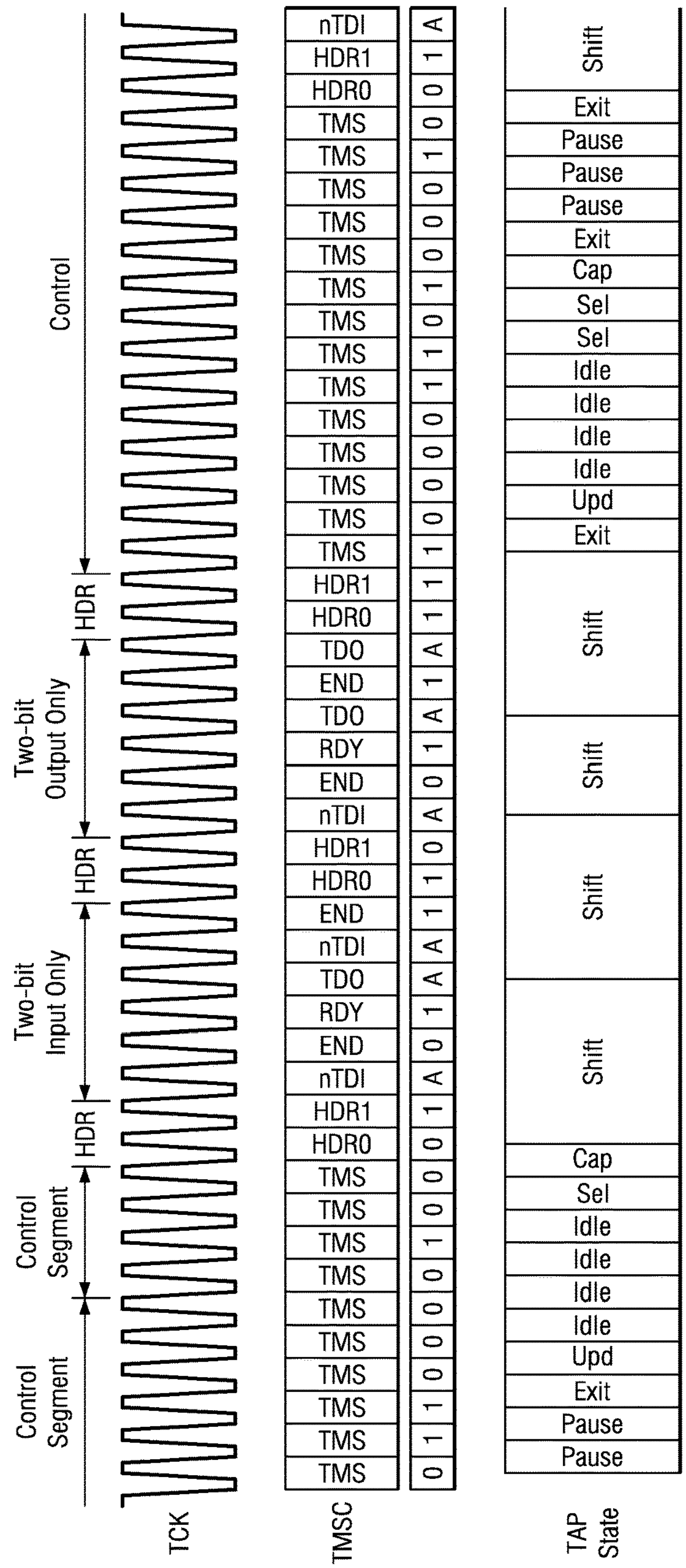
FIG. 142 is a timing diagram of SScan2 Transaction, Type 1 with Shift Entry from Exit State.

An example of a Type 1 transition is shown in FIG. 142. This example illustrates: A single control segment between Data Segments, RDY bits in first packets of data segments, Entry into the shift state from both Capture and Exit, and Shift to Idle to Pause to Shift.

Figure 143:
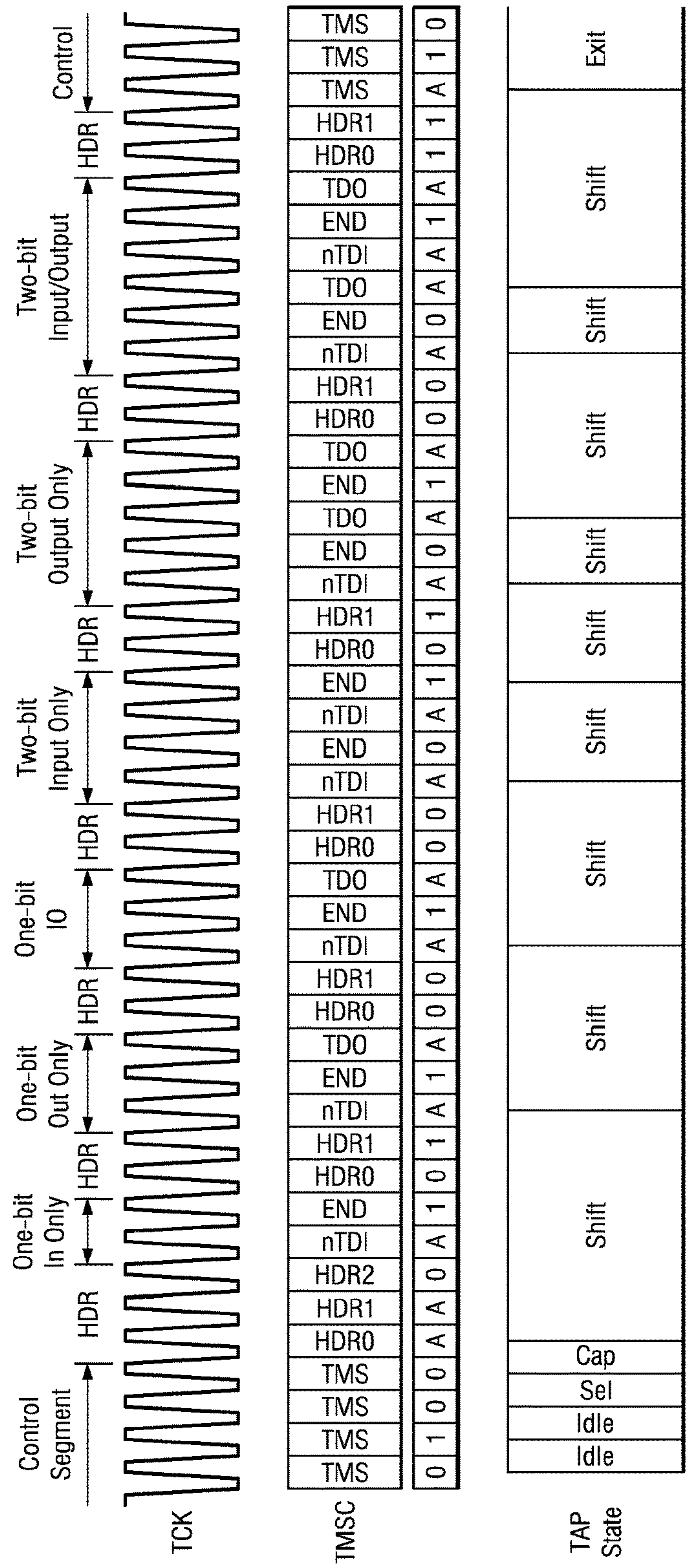
FIG. 143 is a timing diagram of SScan2 Transaction, Type 0, All Data Segments, land 2 Bits.

An example of a Type 0 transition is shown in FIG. 143. This example illustrates: A single control segment between Data Segments, One-bit data segments for all segment types, and Two-bit data segments for all segment types.

Figure 144:
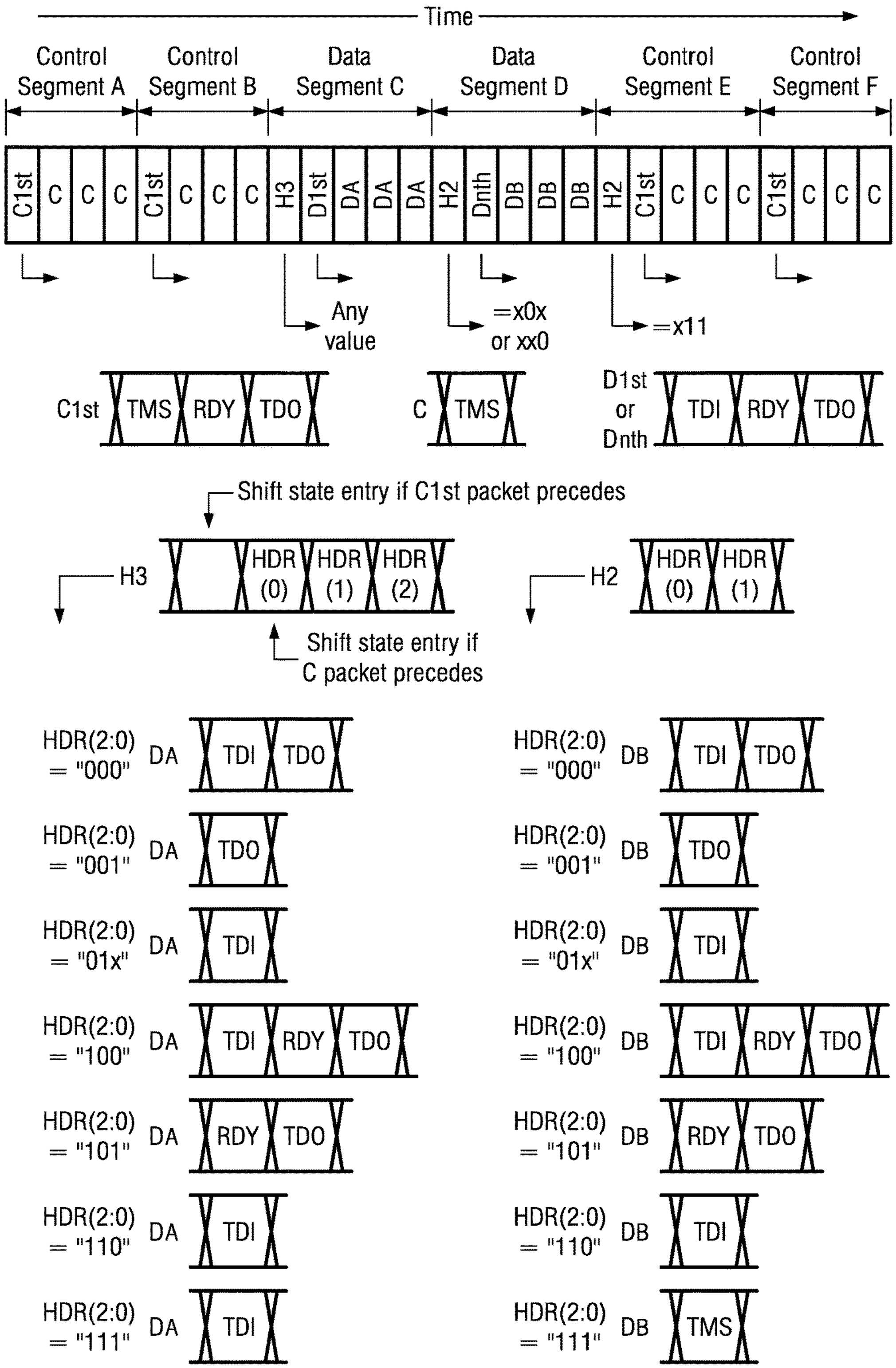
FIG. 144 is a timing diagram of SScan1 Transaction Template.

The SScan1 transaction template is shown in FIG. 144.

Figure 145:
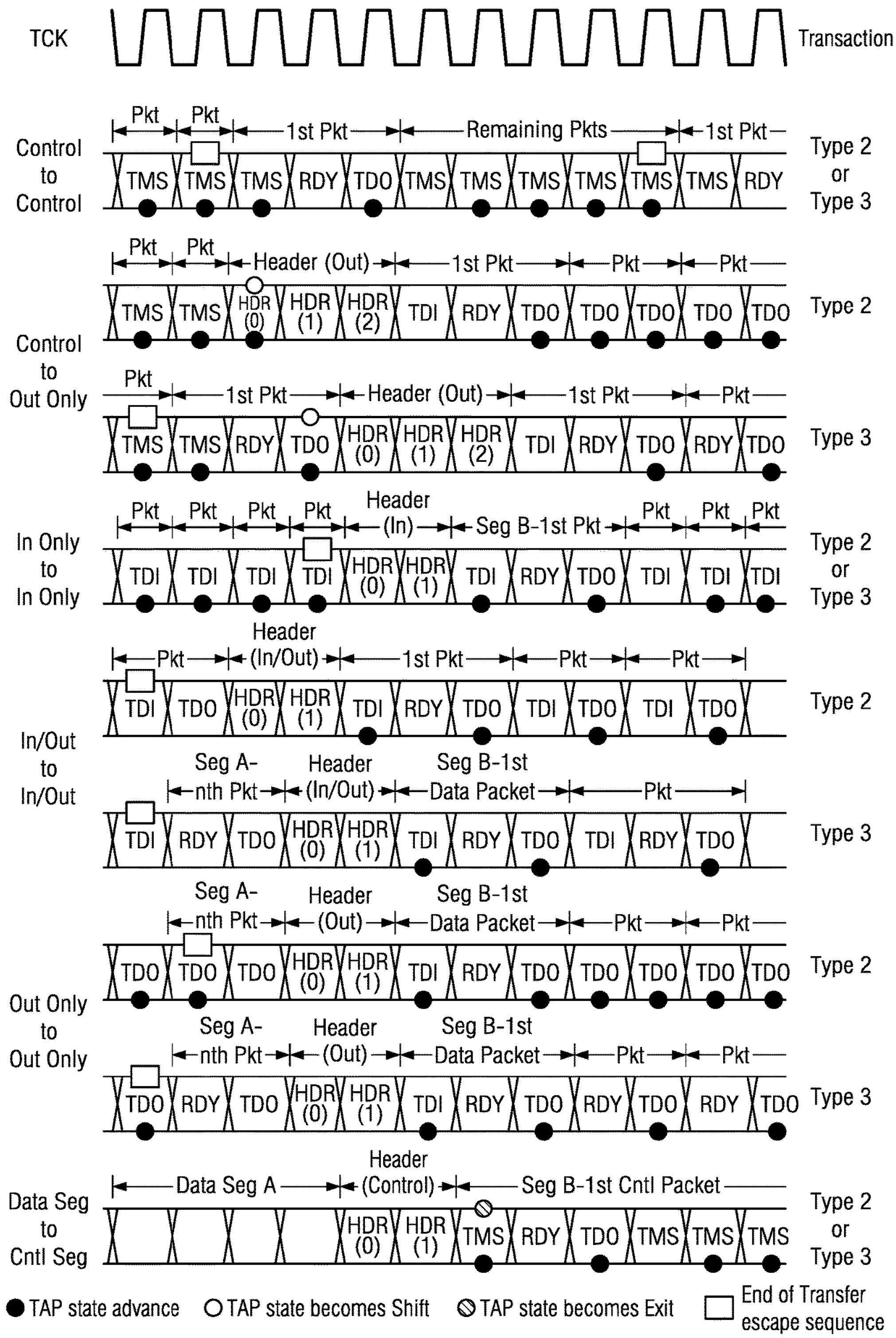
FIG. 145 is a timing diagram of SScan1 Segment Transitions.

The transitions between SScan1 segments are shown in FIG. 145. The black dots denote the point at which the TAP state changes. The open dots denote where the TAP state changes to Shift. The gray dots denote where the TAP state changes to Exit. The gray rectangle denotes an End-of-Transfer escape sequence.

Figure 146:
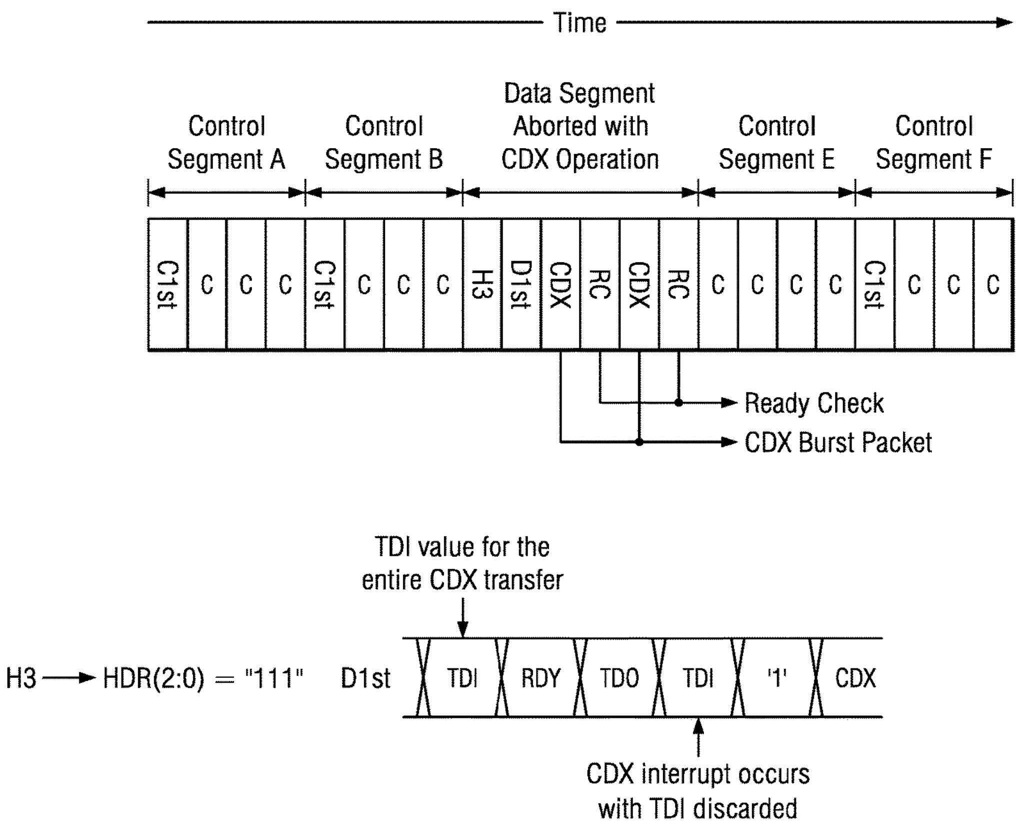
FIG. 146 is a timing diagram of SScan1 Format with CDX Activation.

A SScan 1 Format with CDX activation is permitted if the first header following a control segment is “111”, just as with SScan3 transactions. This is shown in FIG. 146. Note that only Burst transfers are supported with this format as continuous transfers are remapped to burst transfers.

Figure 147:
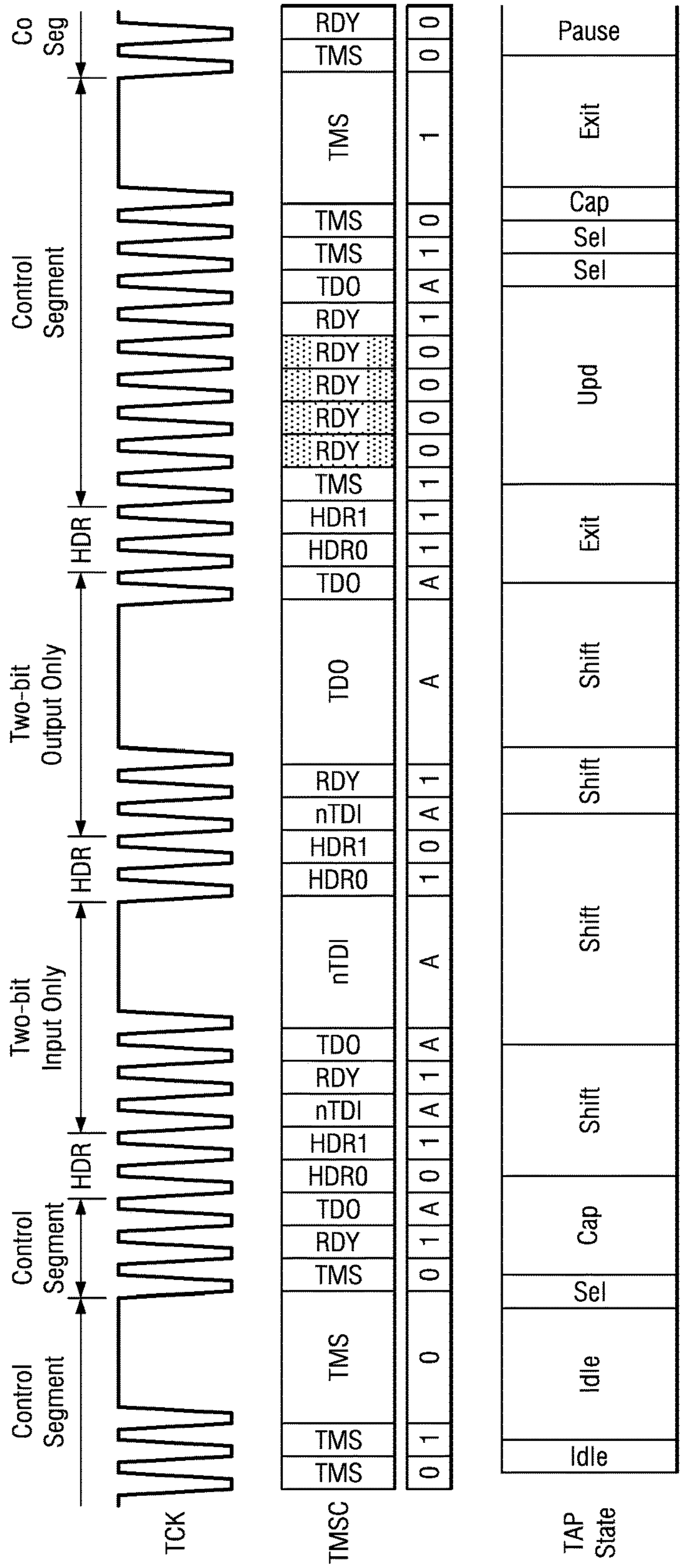
FIG. 147 is a timing diagram of SScan1 Transaction, Type 2, with Segment Stall.

An example of a SScan1 Format, Type 2 transition is shown in FIG. 147. This example illustrates: a one-packet control segment preceding shift state entry, an exit from the shift state, and a stall in the first packet of the control segment following the data segments. The stall states are shown in Gray. TMSC values shown as A may be either a one (1) or a zero (0).

Figure 148:
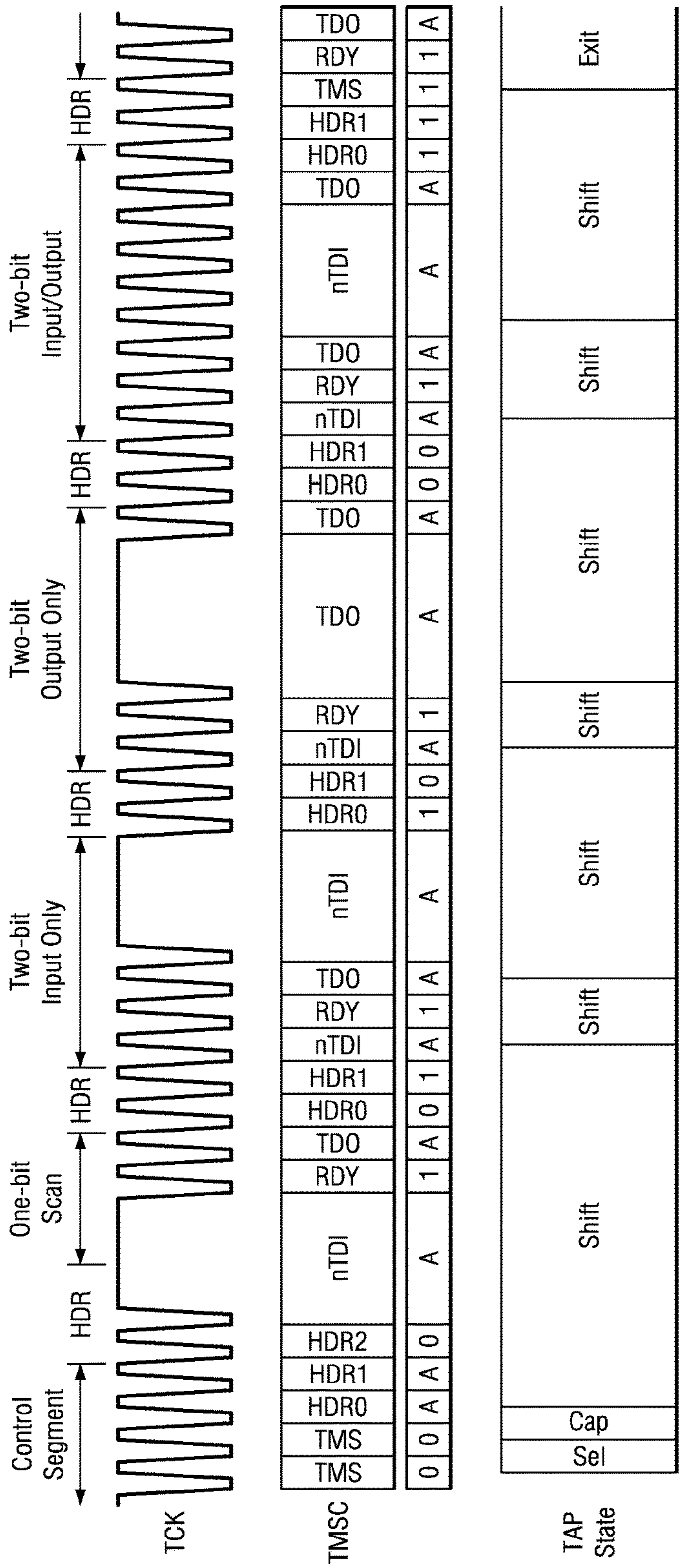
FIG. 148 is a timing diagram of SScan1 Transaction, Type 2, All Data Segments.

An example of a SScan1 format, Type 2, all data segments is shown in FIG. 148. This example illustrates: the initial data segment with one packet, all other data segment types (two packets/segment), and a stall in the first packet of the control segment following the data segments.

Figure 149:
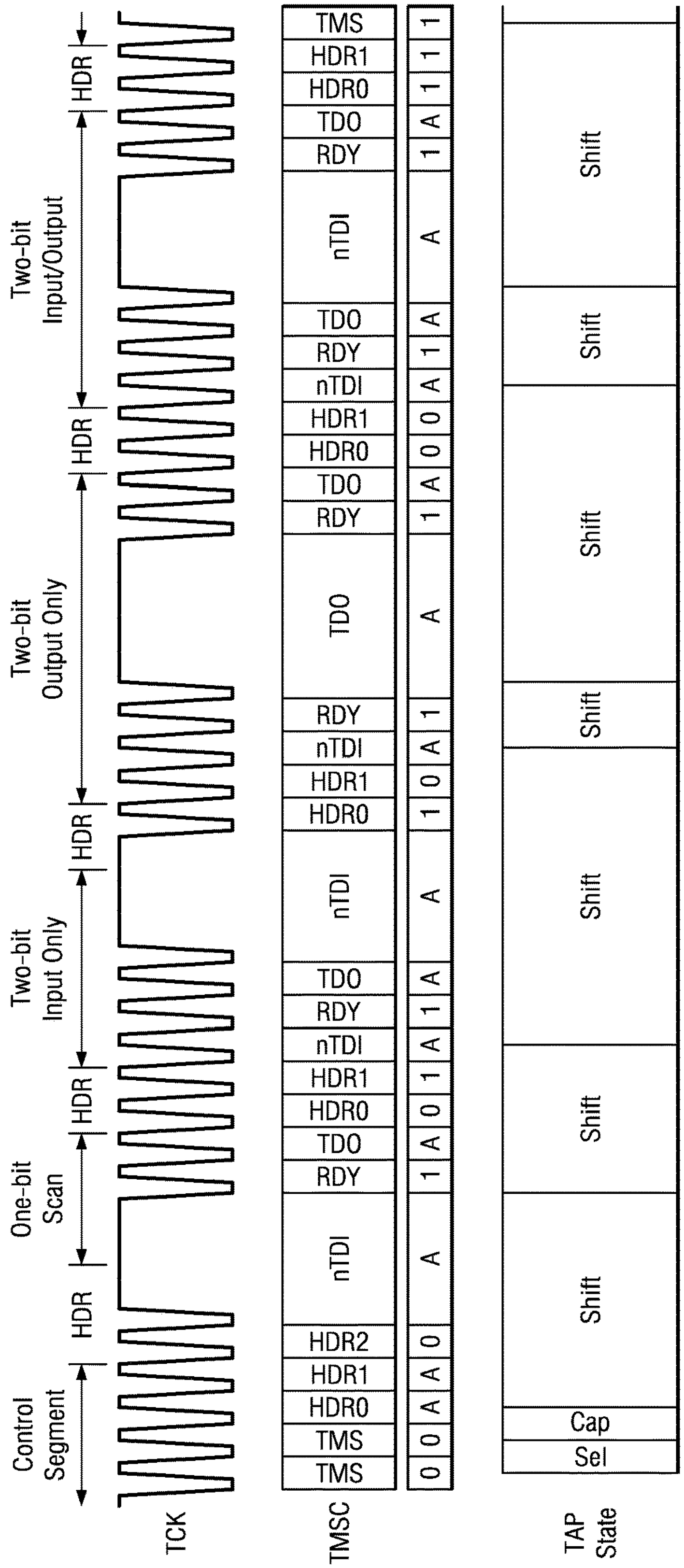
FIG. 149 is a timing diagram of SScan1 Transaction, Type 3, All Data Segments.

An example of a SScan1 Format, Type 3, all data segments is shown in FIG. 149. This example illustrates: the initial data segment with one packet, all other data segment types (two packets/segment), and a stall in the each packet of the output only and input/output segments.

Figure 150:
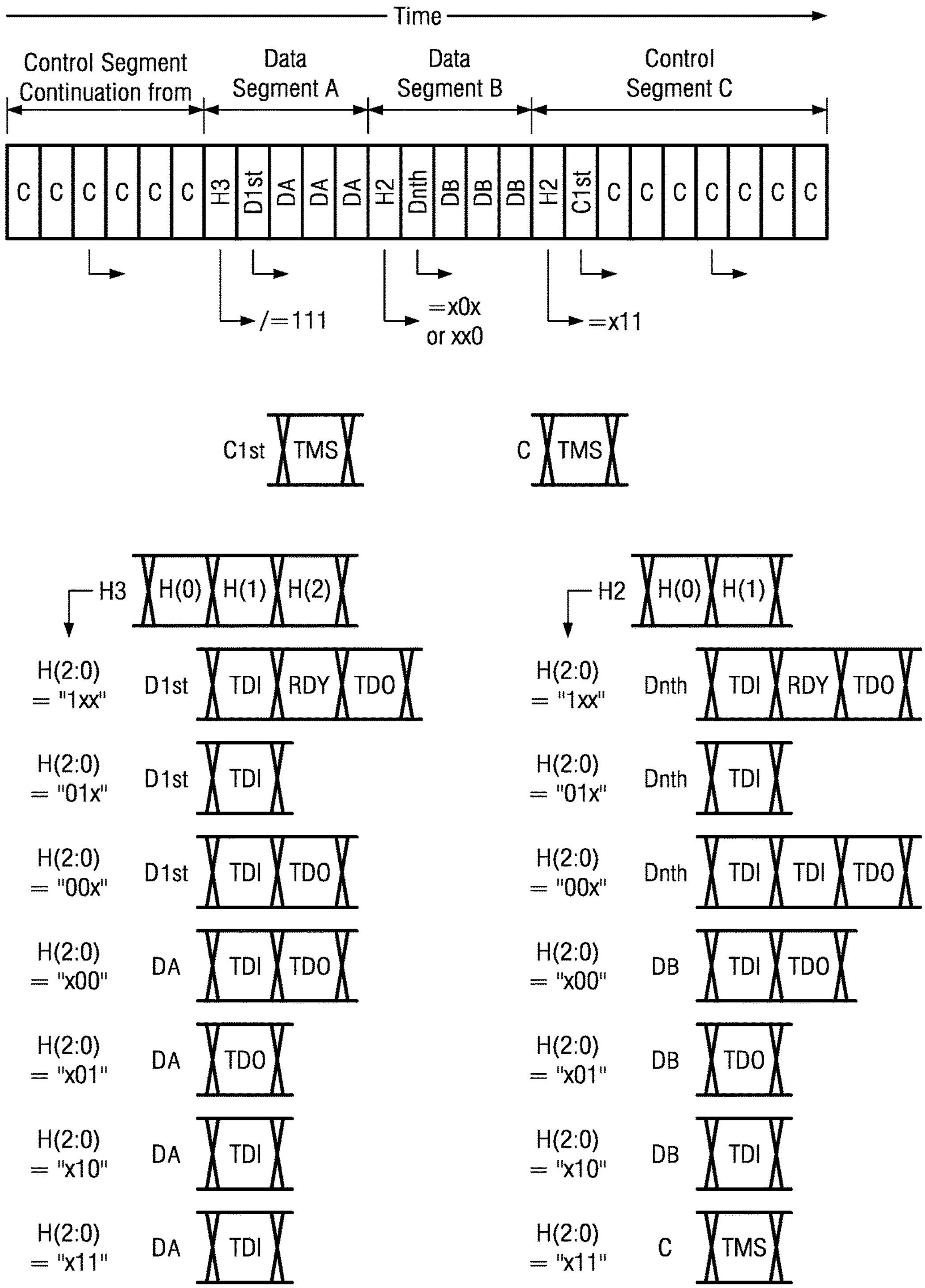
FIG. 150 is a timing diagram of SScan0 Transaction Template.

The SScan0 transaction template is shown in and FIG. 150.

Figure 151:
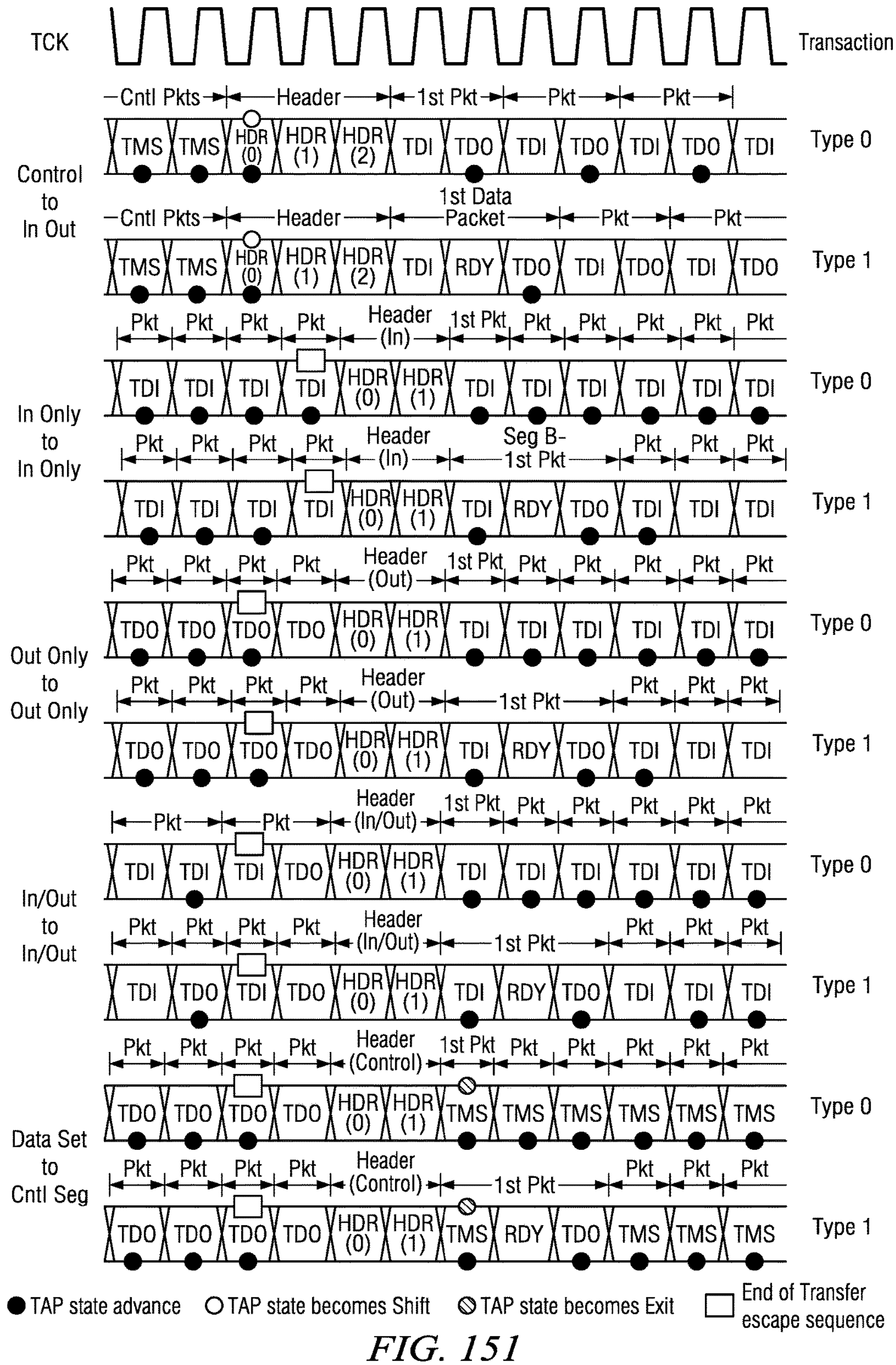
FIG. 151 is a timing diagram of SScan0 Segment Transitions.

The transitions between SScan0 segments are shown in FIG. 151. The black dots denote the point at which the TAP state changes. The open dots denote where the TAP state changes to Shift. The gray dots denote where the TAP state changes to Exit. The gray rectangle denotes an End-of-Transfer escape sequence.

Figure 152:
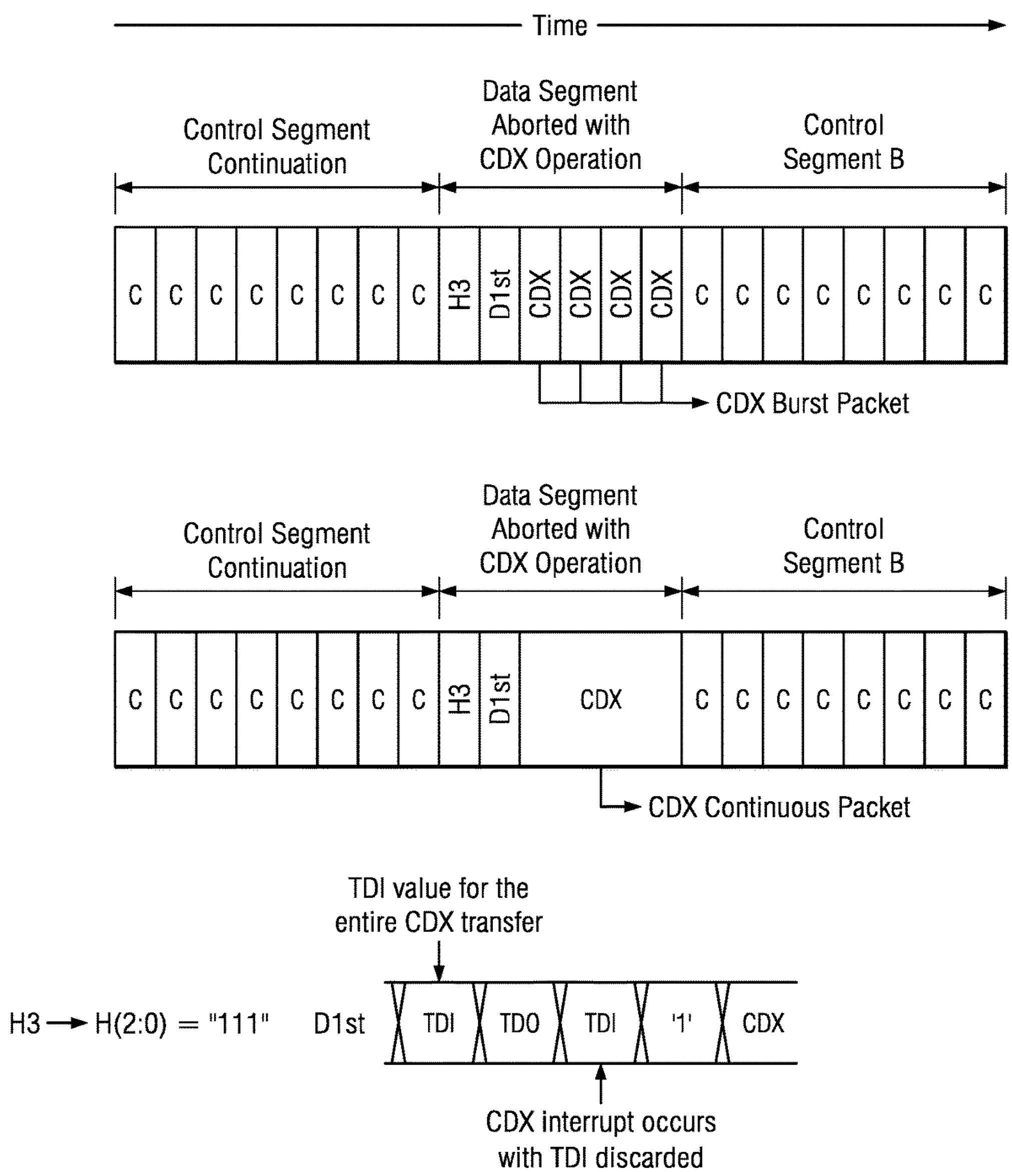
FIG. 152 is a timing diagram of v SScan0 Format with CDX Activation.

A SScan0 Format with CDX activation is permitted if the first header following a control segment is “111”, just as with SScan3 transactions. This is shown in FIG. 152. Note that both Burst and Continuous CDX transfers are supported with this format.

Figure 153:
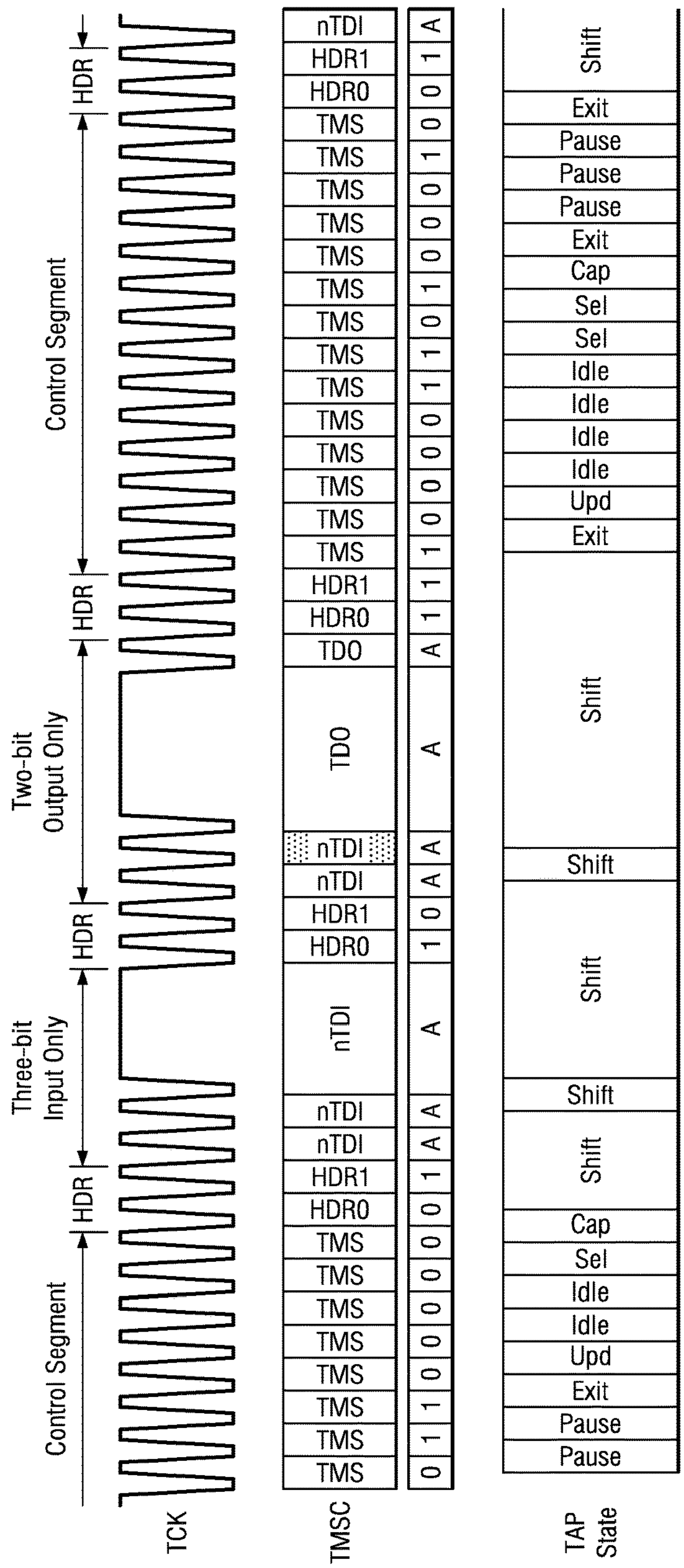
FIG. 153 is a timing diagram of SScan0 Transaction, Type 0 with Shift Entry from Exit State.

An example of a SScan0 transaction, Type 0 with shift entry from Exit State is shown in FIG. 153. This example illustrates: A single control segment between Data Segments, No RDY bits in control and data segments, and Entry into the shift state from both Capture and Exit. TMSC values shown as A may be either a one (1) or a zero (0). Note the gray nTDI value. This packet bit is merely a delay added to let the TAP advance created by the header completion generate the appropriate TDO value for export. This delay is inserted for segments other than the first where the header specifies the segment as output only or input/output when the SScan0 format is used.

Figure 154:
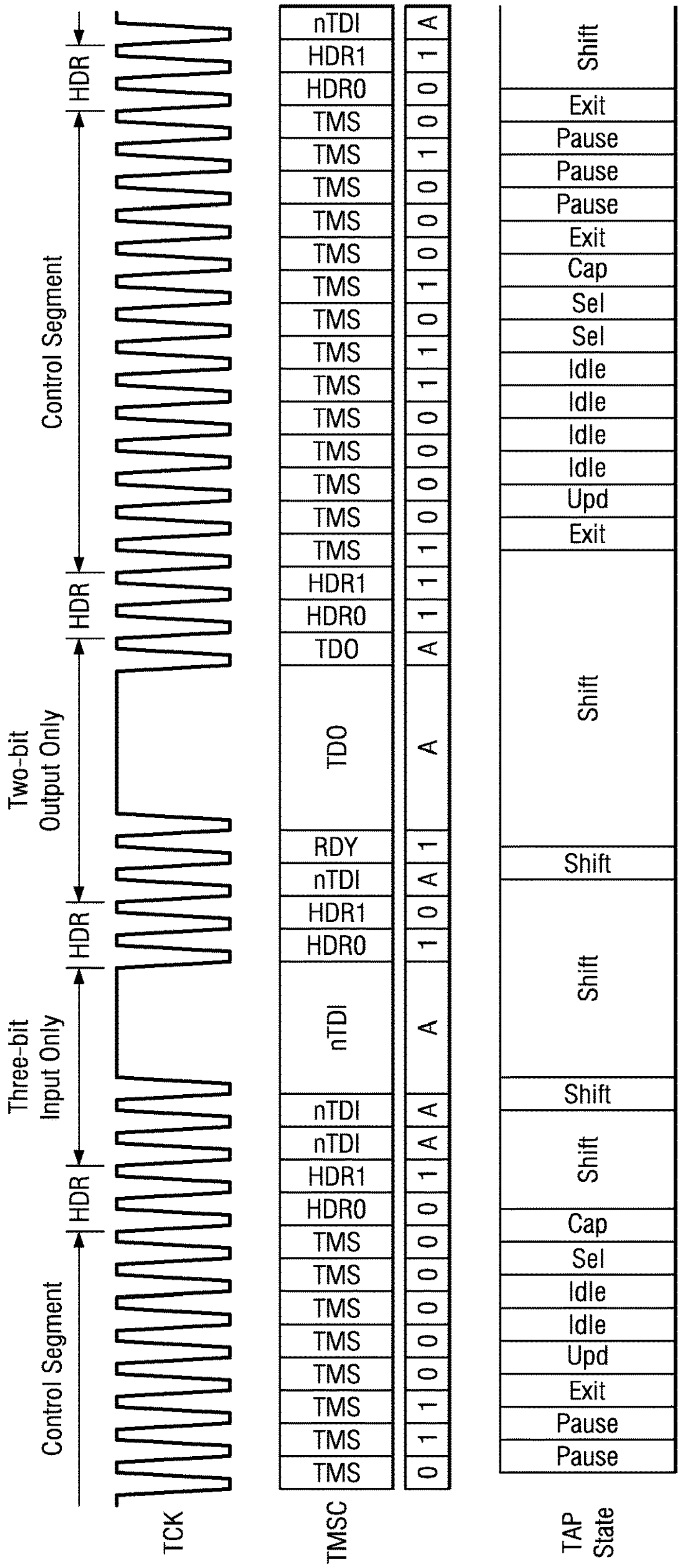
FIG. 154 is a timing diagram of SScan0 Transaction, Type 1 with Shift Entry from Exit State.

An example of a SScan0 transaction, Type 1 with shift entry from Exit State is shown in FIG. 154. This example illustrates: A single control segment between Data Segments, RDY bits in first packets of data segments, Entry into the shift state from both Capture and Exit, and Shift to Idle to Pause to Shift. Note the RDY value in the first packet of the second data segment. Since the RDY bit separates the TAP advance generated during the TDI bit from the TDO output by at least one bit, there is no need to create an artificial delay as was done with the Type 0 version of this transfer. All packets of an output only or Input/output segment have the RDY bit included, eliminating the need for an artificial delay.

Figure 155:
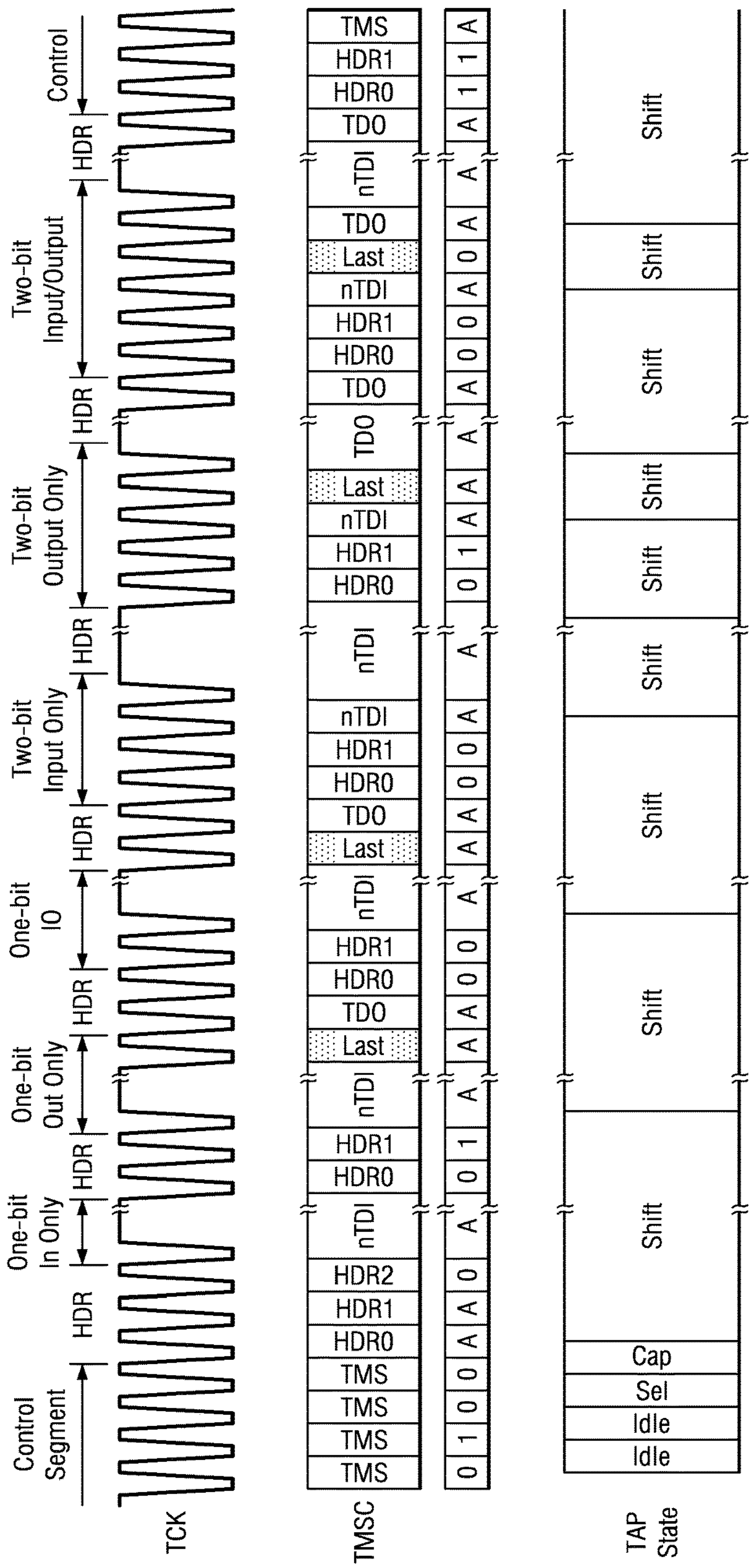
FIG. 155 is a timing diagram of SScan0 Transaction, Type 0, All Data Segments, land 2 Bits.

An example of a SScan0 transaction, Type 0, all data segments, 1 and 2 bits is shown in FIG. 155. This example illustrates: A single control segment between Data Segments, One-bit data segments for all segment types, and Two-bit data segments for all segment types. Note the gray Last value in the output only and input output states providing a delay as discussed earlier.

Figures 156, 157, 158, 159:
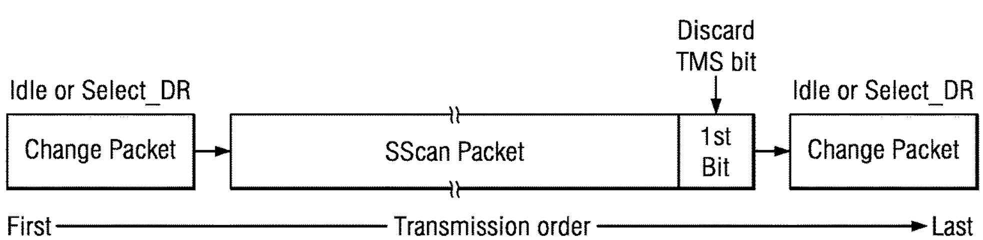
FIG. 156 is a table of SScan Format Minimum Link to TAP State Clock Ratios.
FIG. 157 is a table of Segment Overhead in Clocks for SScan2 and SScan0 Formats.
FIG. 158 is a table of TCK Count per Segment.
FIG. 159 is a diagram of Interrupt and an SScan Packet Sequence.

The minimum Link to TAP clock ratios for SScan formats is shown in FIG. 156.

Headers and ending a segment create segment overhead that can vary from 6 to 8 bits. Debug software determines when it is advantageous to change segment types.

The overhead for each segment type is shown in FIG. 157. The notation within this table is described below: r is the segment "not ready" (stall) count, s is the bit stall count for a single bit, and n is the frame count for a segment. These counts include the overhead of the End-of-Transfer escape sequence to end a segment. The clock count for each segment type is shown in FIG. 158. The notation within this table is the same as for FIG. 157.

The examples below provide some indication of link transaction time. The same sequence is used in all of the following examples. Starting from the IDLE state, a DR_Scan operation is performed with: 32 Input only bits, 3 Output bits in bit mode, 32 Input only bits, and End in the Pause_DR state. This corresponds to two control segments and three data segments. Assuming one stall state per bit, a stall count of one (1) for segments operating in burst mode, and a stall count of zero (0) for segments operating in bit mode, where these values are applicable.

In this example, the SScan0 format is used.

Control segment 3 bits in length (5 clocks)

Data input only segment 32 bits in length (38 clocks)

Data output only segment 3 bits in length (10 clocks)

Data input only segment 32 bits in length (38 clocks)

Control segment 2 bits in length (4 clocks)

With these assumptions, the total is 95 clocks. The OScan1 format clock count for the equivalent operation is 139 (2*67+5), with SScan0 providing roughly a 46% improvement in performance from the 95 count.

In this example, the SScan1 format is used. Assuming one stall state per bit, a stall count of one (1) for segments operating in burst mode, and a stall count of zero (0) for segments operating in bit mode.

Control segment 3 bits in length (5 clocks)

Data input only segment 32 bits in length with burst permission (41 clocks)

Data output only segment 3 bits in length without burst permission (17 clocks)

Data input only segment 32 bits in length with burst permission (41 clocks)

Control segment 2 bits in length (4 clocks)

The control segments are so short they are assumed to incur no permission overhead as only one segment is used. With these assumptions, the total is 108 clocks. The OScan3 format clock count for the equivalent operation is 216 (3*67+15), with SScan1 providing roughly a 100% improvement in performance over the 216 count. Should the bit stall count rise by one then the difference is even more dramatic as the counts change to from 108 to 111 and from 216 to 288 respectively, with SScan1 providing roughly a 160% improvement in performance.

The flow of SScan packets is altered by three interrupts: Register write, BDX, and CDX. The interrupt occurs after the first bit of a new packet, with this bit being discarded by the TS. This bit must be carrying a TDI or TMS value. Output only packets are not interruptible. When the interrupt processing is completed, the scan packet associated with the current TAP state is sent by the DTS with the scan transfer continuing from this point. This is shown in FIG. 159.

Background Data Transfer

An advanced mode capability called background data transport (BDX) provides a means to utilize unused link bandwidth for instrumentation or other purposes. The TAP IDLE, PAUSE_DR, and PAUSE_IR states have characteristics similar to those of the SHIFT_DR and SHIFT_IR TAP states, the exception being there is no transfer of data. These states are regularly used as parking states after discrete scan operations, often remaining in these states for many clocks. The BDX capability harnesses these states to create a data channel. BDX activity is superimposed on these states. Bi-directional and unidirectional transfers (in both directions) are supported. BDX automatically releases the link when scan transactions require its use and acquires the link when scan transactions do not require its use.

Figure 160:
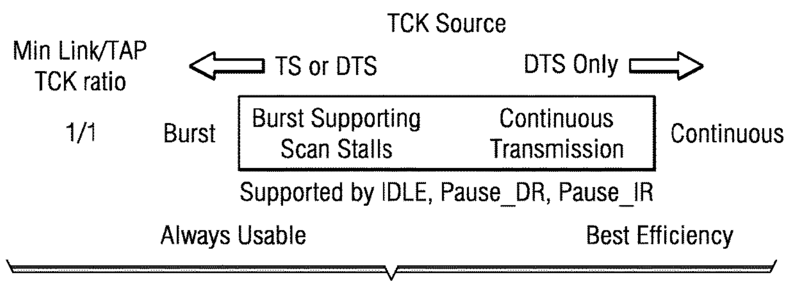
FIG. 160 is a diagram of BDX Capabilities.

BDX is best viewed as a communications link layer, with the communication protocol and the meaning of the data left to the discretion of the DTS and TS. In fact, the DTS and TS may agree to use BDX for different functions, with different protocols, at different points in time. Burst and continuous formats are supported. The burst format is usable when either the TS or DTS sources TCK. The continuous format is usable only with a DTS-sourced TCK. Burst packets add a 2-bit overhead to 8-, 16-, 32-, or 64-bit data. Continuous packets are two bits in length and have no overhead added. A special sequence is used to end the transfer. The TAP state is advanced with each packet after the first. The BDX capabilities are shown in FIG. 160.

Background Data Transfer (BDX) moves non-scan data between the DTS and TS on a bit-by-bit basis as defined by the adapter. This form of data transfer is: Enabled and disabled with a control register write, Uses the format specified by the TF[3:0] of the control register, and Enabled both inside and outside the command window.

The data may be any data type as the adapter BDX operation does not include a protocol. BDX bandwidth may be allocated one of three ways:

Split (Bi-Directional—BI-DI)—The TS and DTS each send 50% of the time

All DTS (DTS to TS—D_2_T)—The DTS sends to the TS 100% of the time

All TS (TS to DTS—T_2_D)—The TS sends to the DTS 100% of the time

Once Link IDs are assigned and the BDX is enabled, a BDX transfer activates when a supporting TAP state is reached (Idle, Pause_DR, or Pause_IR). The transfer substitutes BDX information in lieu of the scan packet normally associated with a TAP state. Remaining in a supporting state for two consecutive stays is required to initiate a BDX transfer. Once a transfer is activated, each packet received when the TAP state supports the BDX transfer advances the TAP state and the TAP state supports BDX. The transfer deactivates when the supporting state is exited.

A selected adapter transfers data while adapters not selected go through the motions of a BDX transfer without actually transferring data. This keeps all adapters sharing a DTS port synchronized. An adapter that does not support BDX is placed offline when BDX is enabled. The number of BDX packets transferred equals the number of: TAP states spent in a supporting state when the last scan packet contained TDO, and TAP states spent in a supporting state minus one when the last scan packet did not contain TDO.

There are two BDX transfer types, burst and continuous. A burst transfer, shown in FIG. 24, is constructed with burst packets. Each packet, other than the first, begins with a header followed by a data payload of 8, 16, 32, or 64 bits. The header contains a ready-to-proceed check and a TMS value used to advance the TAP state. The ready-check function matches that used in scan packets at the time the transfer is initiated (none, OScan/SScan style, or MScan style), with any adapter selected for scan responding to this check. A continuous transfer, shown in FIG. 26, is constructed with continuous packets carrying two-bit data payloads. There are no headers or ready-to-proceed checks with this transfer type, hence the term continuous. An end-of-transfer escape sequence controls the deactivation of a continuous transfer.

The header in a burst packet performs three functions: Checking whether the TS is ready to have its TAP state advanced, Providing a TMS value to control a TAP state advance, and Assuring a transfer terminates, if the DTS and TS physical connection is broken.

The first burst packet of a newly activated transfer skips the header and begins with the burst data. A complete packet is sent following the initial data and subsequent packets if the TAP state supports BDX when tested at the end of the data transmission. The transfer ends, if this test fails, with a scan packet following the last BDX packet. Each burst packet advances to the TAP state, if a subsequent packet follows. A packet supplying a TMS value of one (1) ends the BDX transfer following the data section of the packet. A packet supplying a TMS value of zero (0) continues the BDX transfer. The transfer may end following the first packet, if the TAP state exits the supporting state just as the BDX transfer is activated. This occurs when scan formats are using one-bit scan packets that do not contain TDO.

The ready-check portion of the header ends with the TMSC pin driven to a one (1) by the TS. The DTS must drive the TMSC pin to a zero (0) to notify the TS the packet underway is not the last packet. Should the connection be broken, the TMSC keeper extends the one driven by the TS into the next bit period causing an exit from the supporting TAP state and subsequent end of the BDX transfer.

A continuous transfer is constructed from two-bit data only packets, using an end-of-transfer escape sequence to cause an exit from the supporting TAP state. This escape sequence is generated concurrently with the first data bit of a packet, and causes the packet with the escape sequence to end the transfer after one additional packet is transferred. Each packet advances the TAP state provided the TAP state supports a BDX transfer at the last data bit position of a packet.

The presence or absence of an end-of-transfer escape sequence is used as the TMS value for the TAP state advance. The presence of an end-of-transfer escape sequence generates a TMS value of one (1) while the absence of this sequence generates a TMS value of zero (0). The burst format, with a 64-bit burst length, is used in lieu of the continuous format if the TF[3:0] specifies a continuous format and one of the following is true: The CC[0] bit indicates a TS TCK source, A scan format uses stalls by TAP state (OScan3, OScan7, SScan1, SScan3, or MScan), and A delay is specified with any scan format.

Figure 161:
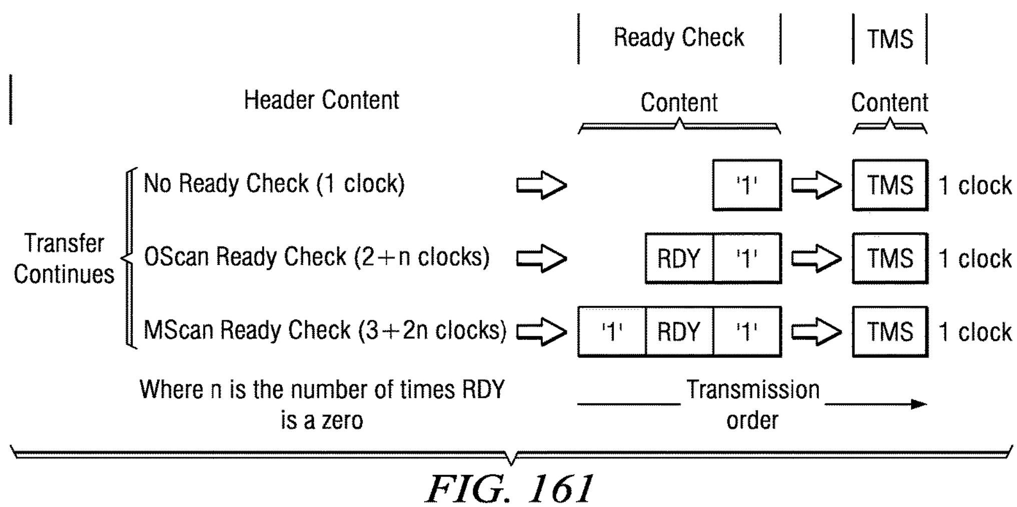
FIG. 161 is a diagram of Header Content.
Figure 162:
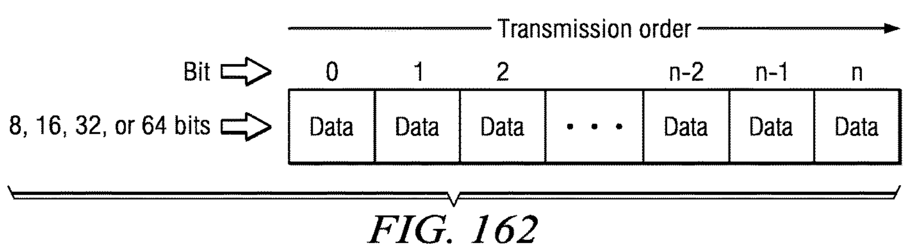
FIG. 162 is a diagram of Data Content.

A burst packet, shown in FIG. 161 contains: HDR—Combination of ready check and TMS value, and DATA—8, 16, 32, or 64 bits of BDX data. The packet begins with a header followed by data. The header combines a ready check followed by a TMS bit. The header and data content are shown in FIG. 161 and FIG. 162 respectively.

A header is included in all packets except the first. It is created with two elements, a TMS bit and a ready check. The TMS bit is presented to the TAP when the TAP state is advanced. When the TMS value is "1", the transfer ends after the data portion of the packet. The transfer continues when the TMS value is zero (0). The continuation of the transfer after the first packet is determined by the TAP state when the data burst completes. This TAP state is developed as BDX is activated.

Any adapter selected for scan may stall a burst packet if it is "not ready" to advance the TAP state when the ready check generates a RDY bit in the packet. The type of ready check used is determined by the number of adapters selected and the scan format. This means the check could take the form of that used by:

An MScan packet (three bits minimum)—used when more than one adapter or no adapter is selected. Any adapter selected may stall the transaction, An OScan packet (two bits minimum)—used when the OScan3, OScan7, SScan1, or SScan3 scan format is specified and a single adapter is selected. The selected adapter may stall the transaction, and No check (1 bit minimum)—used when a scan format specified is a format other than the OScan3, OScan7, SScan1, or SScan3 format is specified and a single adapter is selected. the TMSC pin is driven to a one (1) by the selected adapter.

The transfer type and data payload length is specified by the TF[3:0] field of the transport control register. A TDI value delivered in the first state supporting BDX is used as the TDI value for the entire BDX transfer. If no TDI value is delivered by this state, then a TDI value of zero (0) is used.

Figure 27:
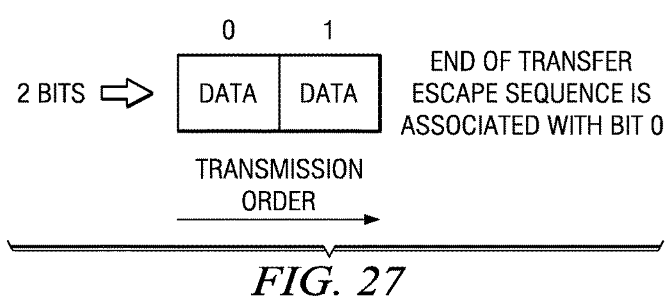
FIG. 27 illustrates an example of a continuous background data transfer message payload format in accordance with at least some preferred embodiments.

A continuous packet is shown in FIG. 27. It is merely a two-bit data value. An end-of-transfer escape sequence may be associated with the first bit of the packet to end a transfer. The CC[0] field and TF[3:0] fields combine to define the transfer characteristics shown in FIG. 163.

A BDX transfer is activated when all of the following are true: A transfer is not active, Link IDs are assigned, BDX is enabled, TAP state is either IDLE, Pause_DR, Pause_IR, and The TMS for the TAP state is a zero (0). A BDX transfer is deactivated when all of the following are true: A transfer is active, The end of a packet is reached, and The TAP state no longer supports BDX. A header separates burst data. A ready check is included in the header, when the scan format that would be used if BDX were enabled calls for a ready check. A ready check, with the same characteristics as that used by the scan format just mentioned, is used.

When BDX is active and an adapter is selected (BS=1), the adapter passes data to and from the BDX unit connected to the adapter's system interface. When BDX is active and an adapter is not selected, it does not pass data to and from the BDX unit connected to the adapter's system interface.

The activation of burst and continuous BDX transfers is the same. The difference in these transfers begins after the completion of the first packet.

Figure 164:
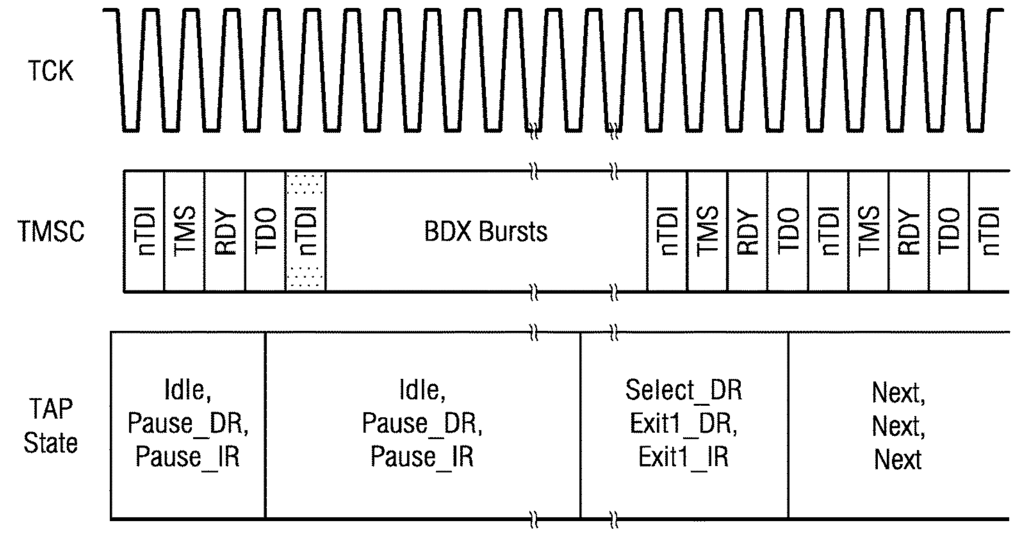
FIG. 164 is a timing diagram of Activating BDX with the MScan Format.
Figure 165:
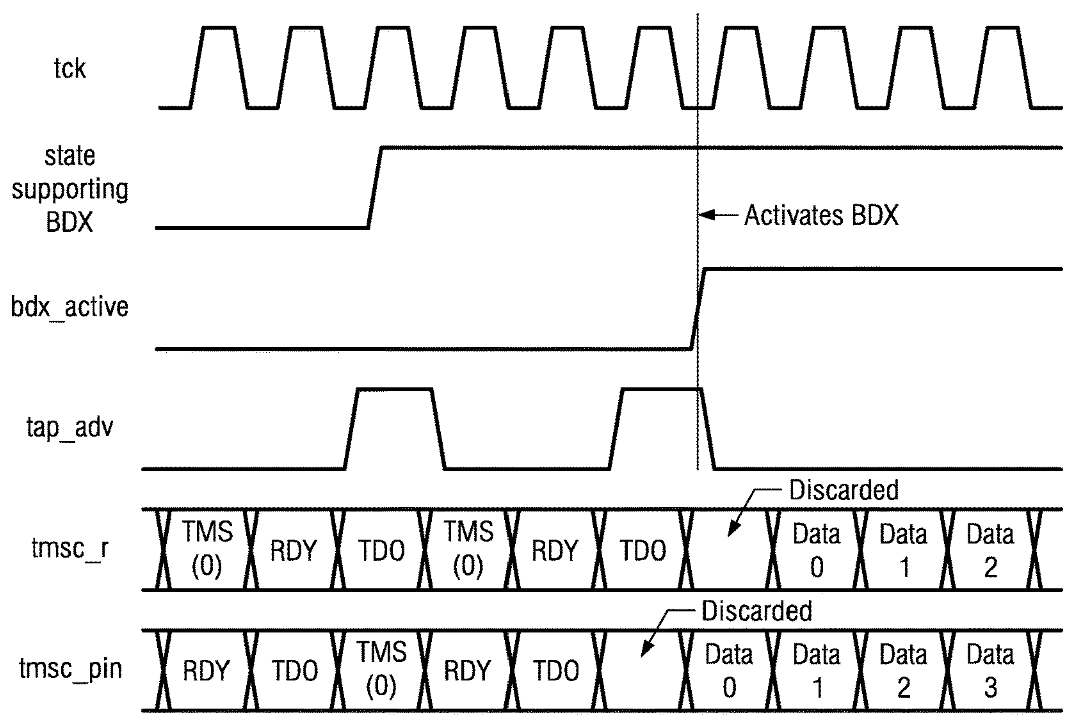
FIG. 165 is a timing diagram of Activating BDX with the OScan7 Format.
Figure 166:
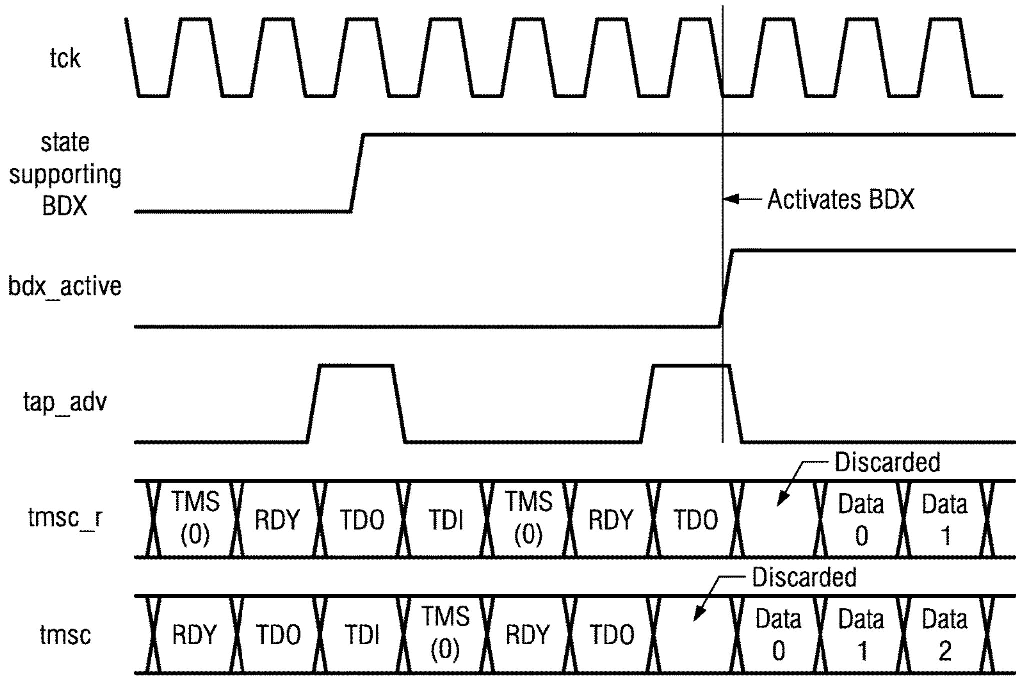
FIG. 166 is a timing diagram of Activating BDX with the OScan3 Format.
Figure 167:
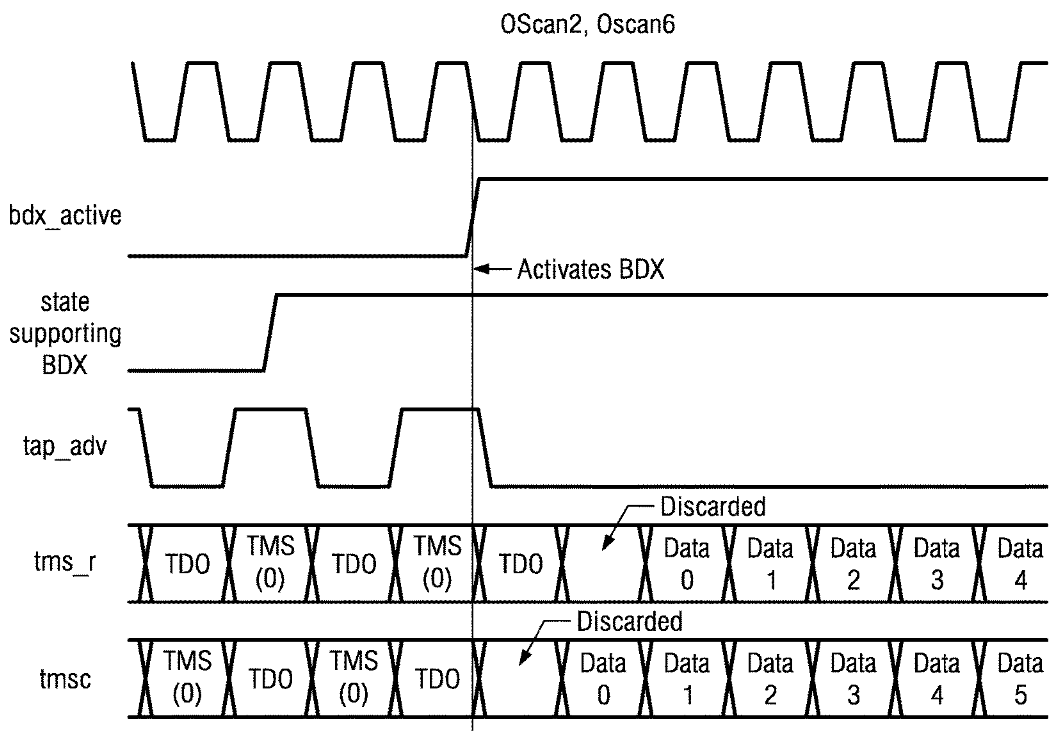
FIG. 167 is a timing diagram of Activating BDX with OScan Formats 2 and 6.
Figure 168:
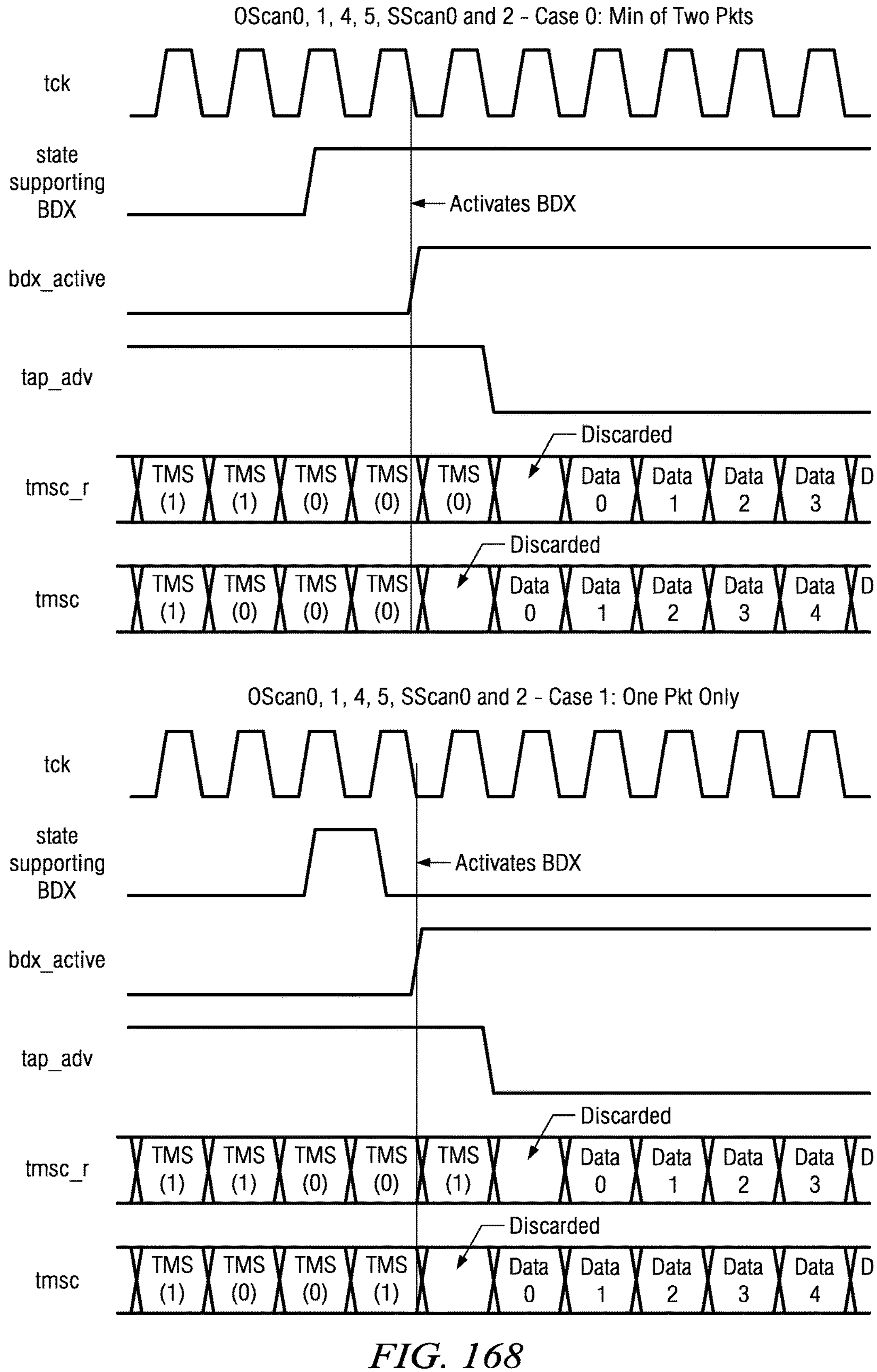
FIG. 168 is a timing diagram of Activating BDX with OScan0, 1, 4, 5 and SScan0 and 2.

The activation of both burst and continuous BDX transfers is shown for respective formats in the following figures:

MScan FIG. 164
OScan7: FIG. 165
OScan6: FIG. 167
OScan5: FIG. 168
OScan4: FIG. 168
OScan3: FIG. 166

Figure 169:
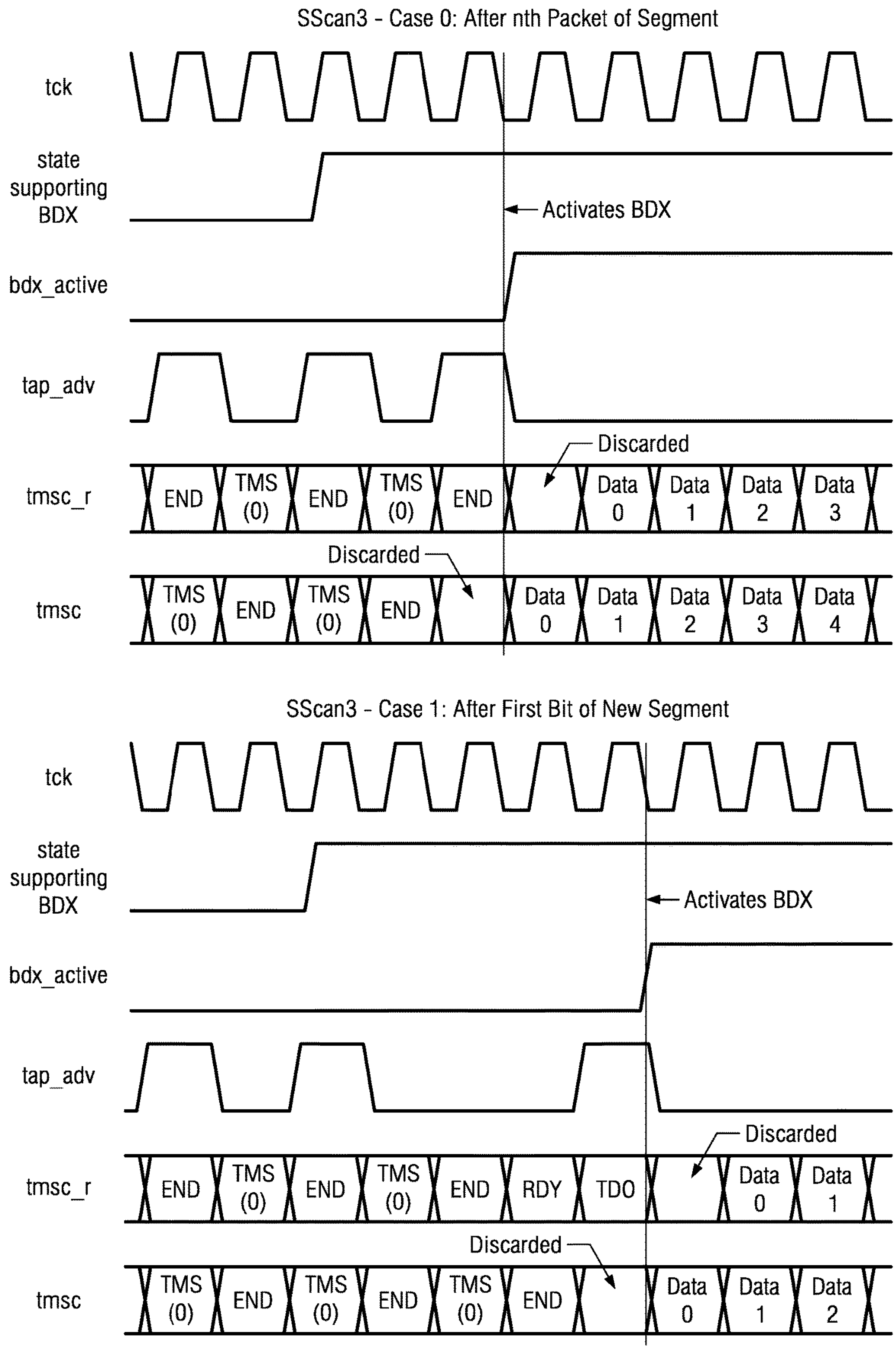
FIG. 169 is a timing diagram of Activating BDX with the SScan3 Format.
Figure 170:
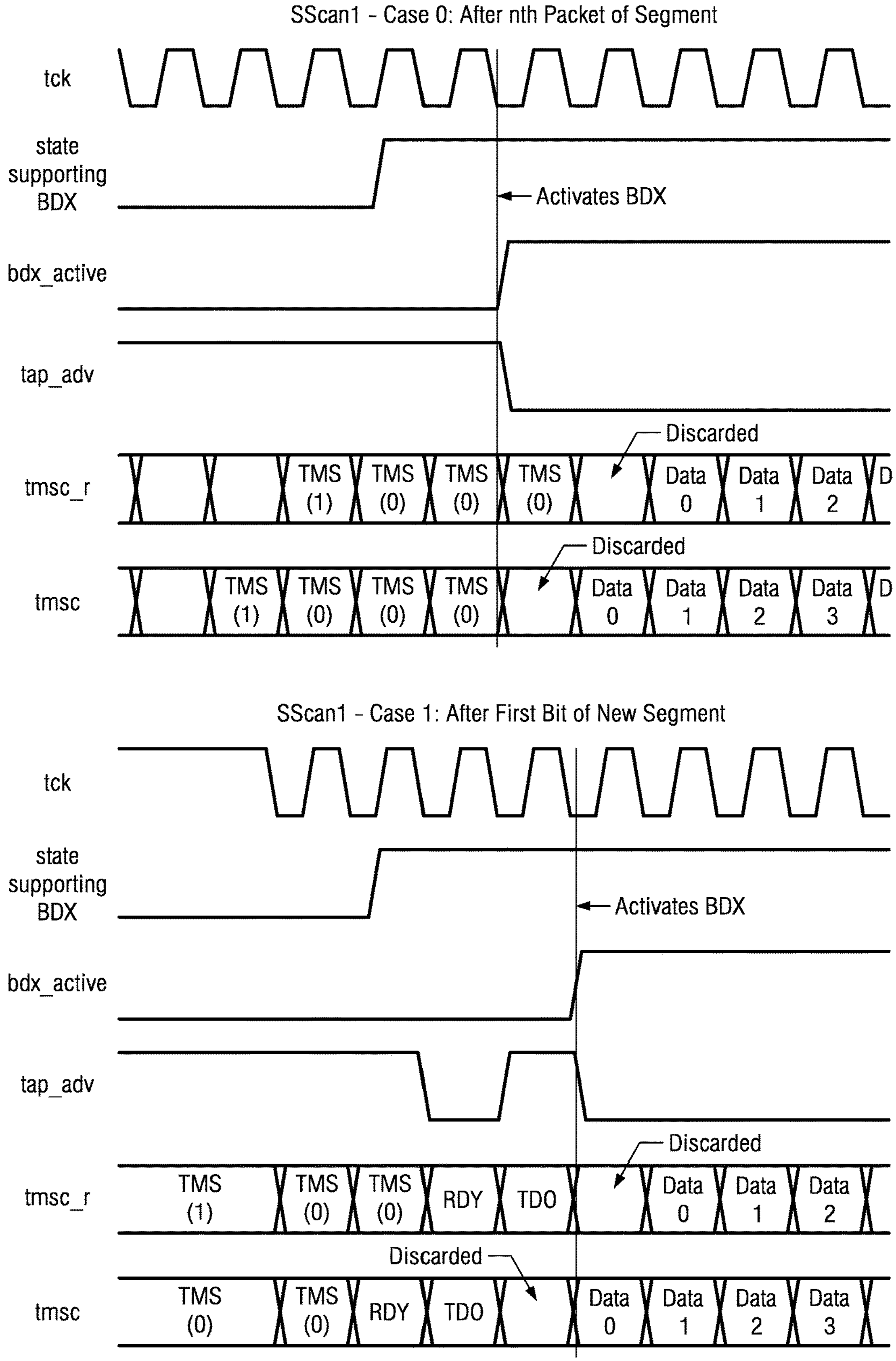
FIG. 170 is a timing diagram of Activating BDX with the SScan1 Format.

OScan2: FIG. 167
OScan1: FIG. 168
OScan0: FIG. 168
SScan3: FIG. 169
SScan2: FIG. 168
SScan1: FIG. 170
SScan0: FIG. 168

The signals in these figures are defined below:

bdx_active: BDX data appears on the TMSC pin in the TCK period tap_advance: permits a TAP state change when high tmsc_r: A registered version of the TMSC pin value, clocked on TCK falling tmsc_pin: TMSC pin value state supporting BDX A TAP state of Idle, Pause_DR or Pause_IR when a one (1)

tck TCK

Figure 171:
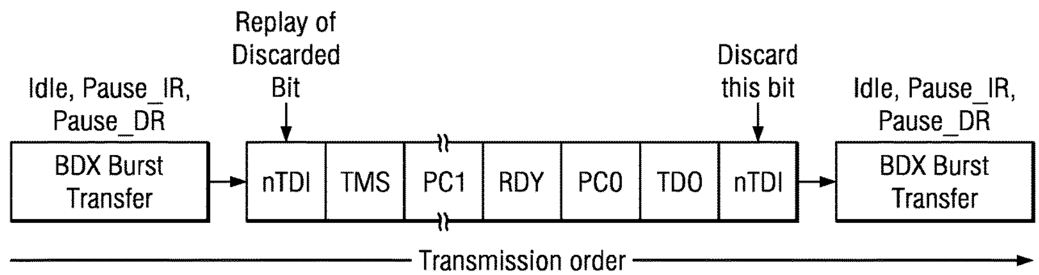
FIG. 171 is a block diagram of BDX Interrupt Interaction with an MScan Packet Sequence.

A BDX interrupt is generated in the Idle, Pause_DR, or Pause_IR TAP state when BDX is properly qualified, and the TAP state will repeat the next state. Note that the pipelined nature of the OScan0, OScan1, OScan4, or OScan5 formats allow the TAP state to progress to a state beyond the supporting state when the interrupt occurs. The packet bit shaded in gray is discarded. The TAP state is advanced during the BDX transfer. Exiting the supporting state causes the resumption of DTS and TS the scan packet exchanges as shown. An MScan transaction with a BDX interrupt is shown in FIG. 171.

Figure 172:
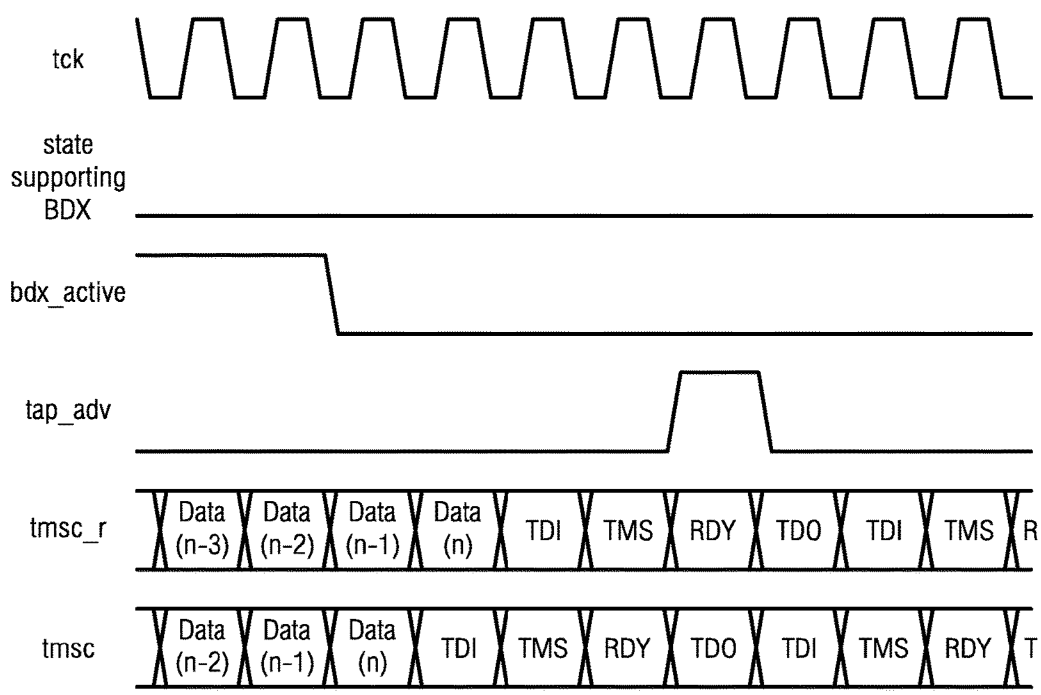
FIG. 172 is a timing diagram of Deactivating BDX with the OScan7 Format.

Deactivation of burst and continuous BDX transfers is the same. A scan packet immediately follows BDX data as shown in FIG. 172. All other scan formats behave the same, with a scan packet immediately following the last data bit. This single Figure is sufficient to represent all BDX deactivations.

Figure 173:
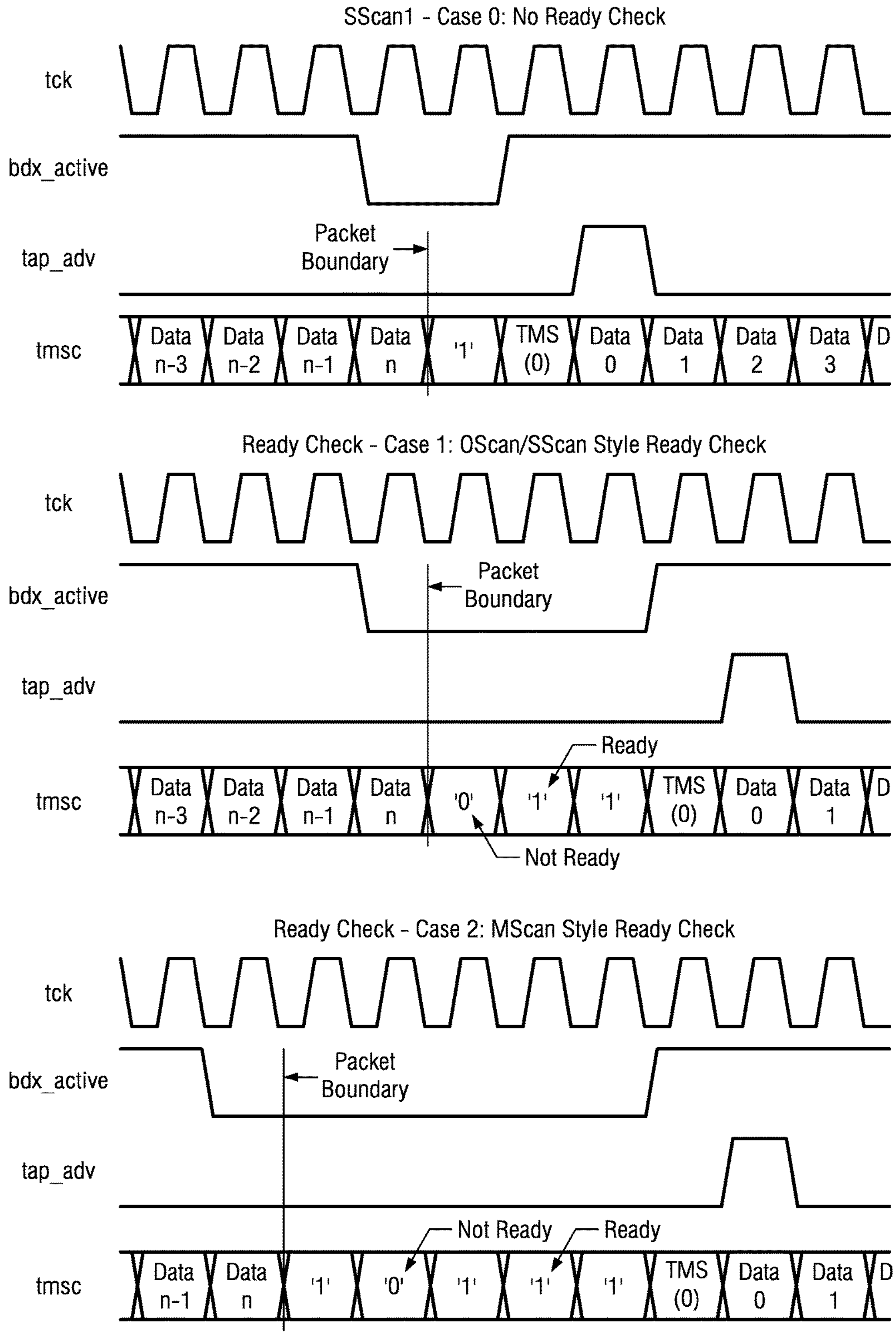
FIG. 173 is a timing diagram of Headers.

The three types of headers are shown in FIG. 173. The OScan/SScan and MScan style ready checks are shown with one stall.

Figure 174:
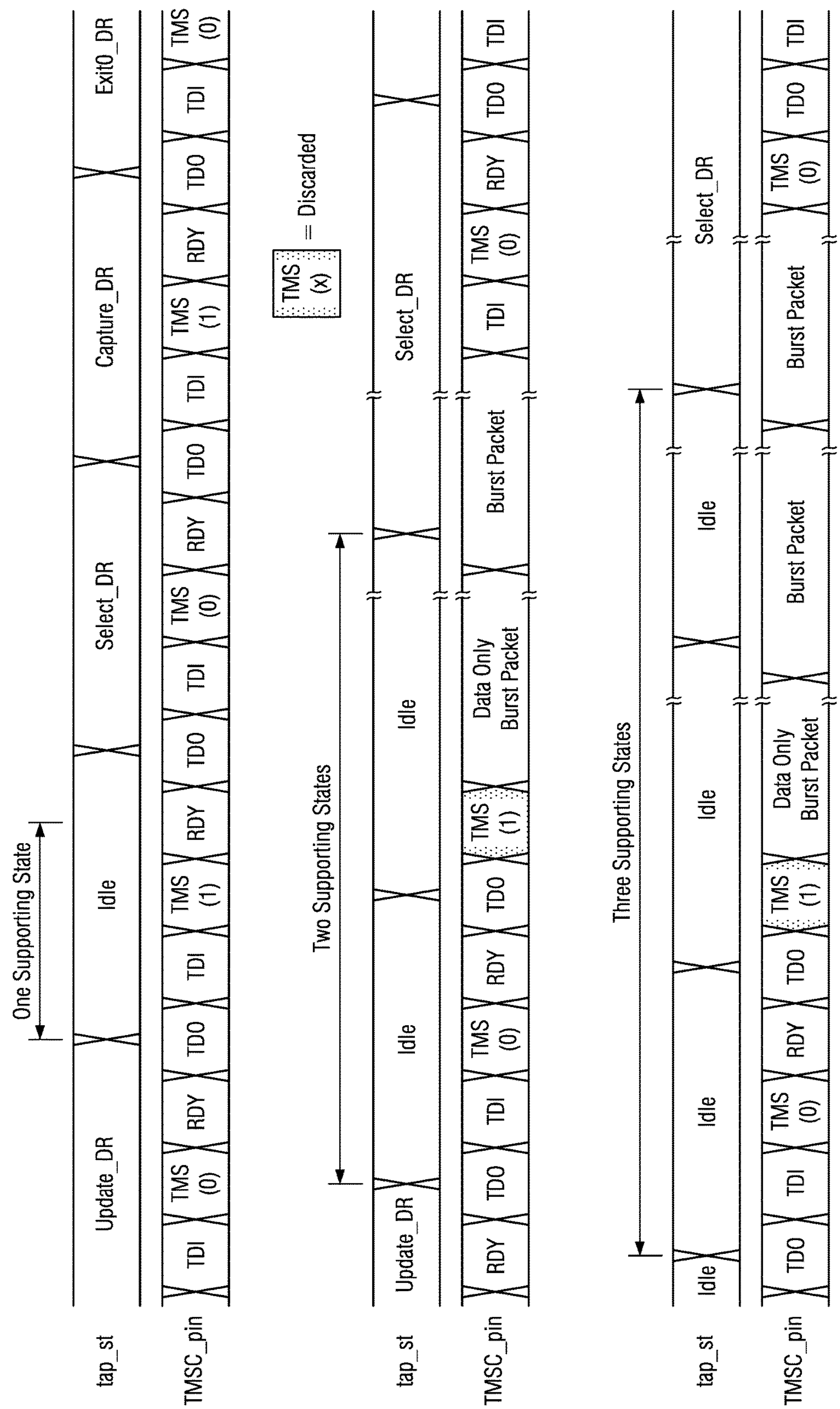
FIG. 174 is a diagram of BDX Burst Transfer with OScan7.
Figure 175:
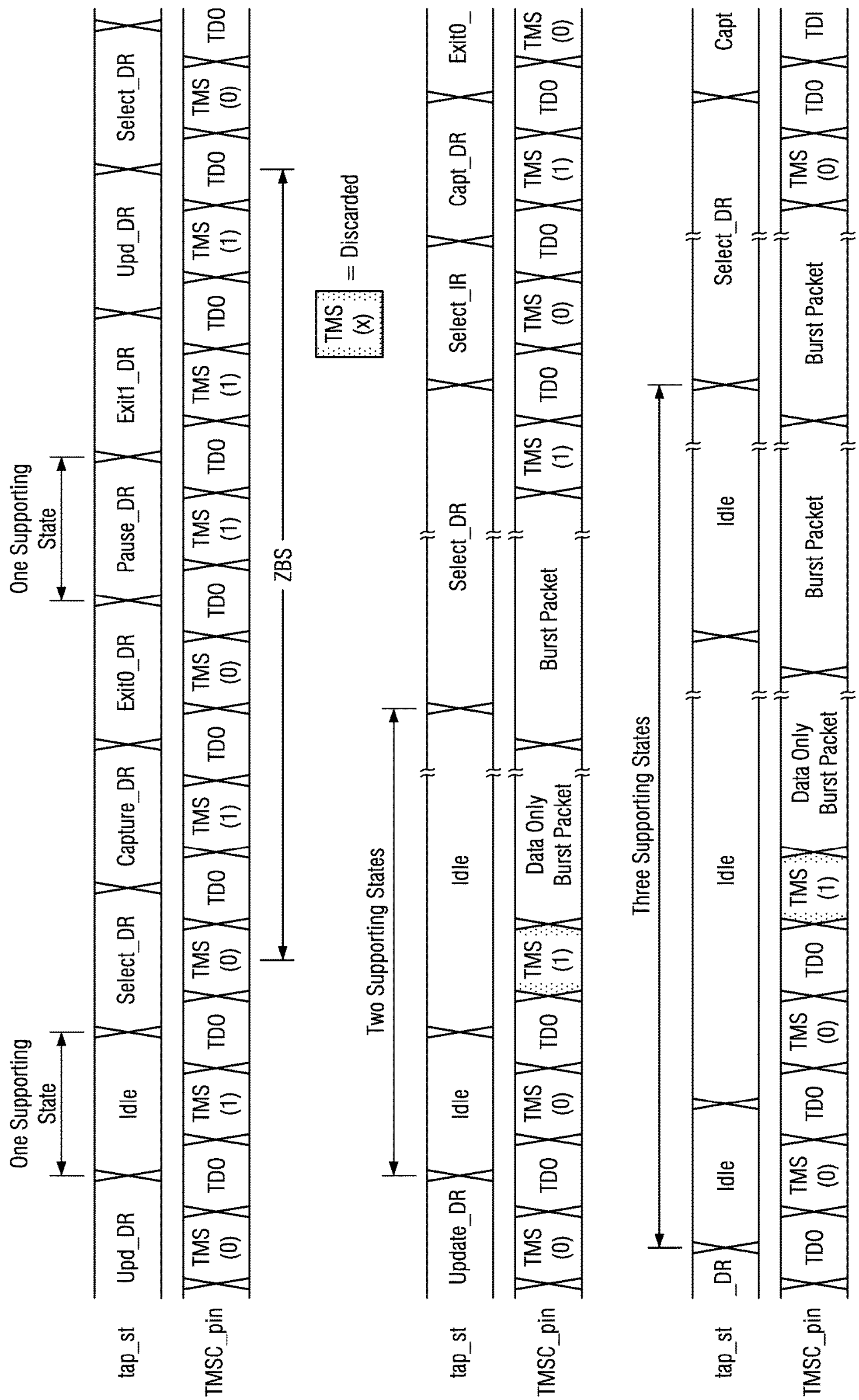
FIG. 175 is a diagram of BDX Burst Transfer with OScan2 or OScan6.
Figure 176:
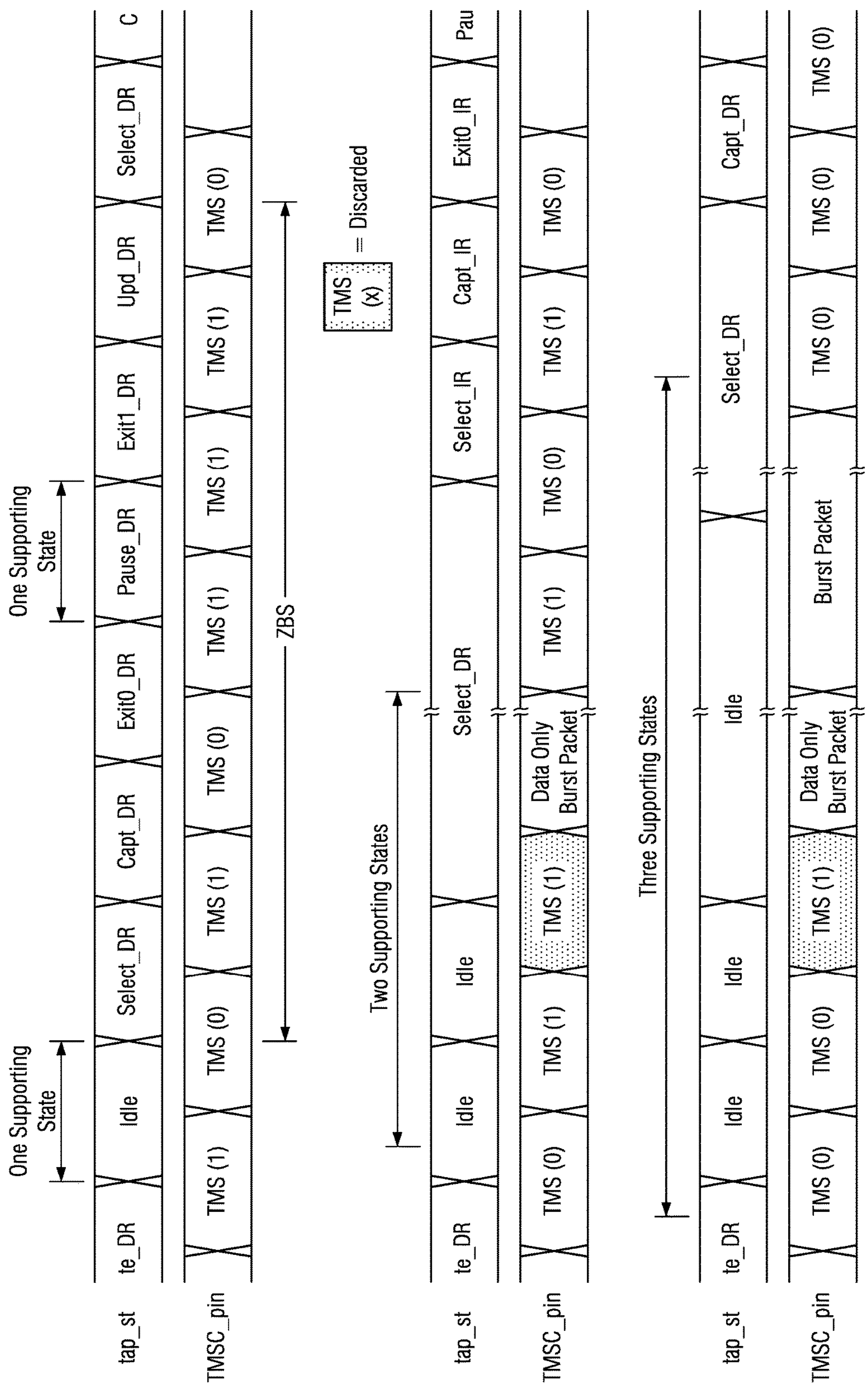
FIG. 176 is a diagram of BDX Burst Transfer with OScan0, 1, 4, 5, SScan0, 1, or 2.
Figure 177:
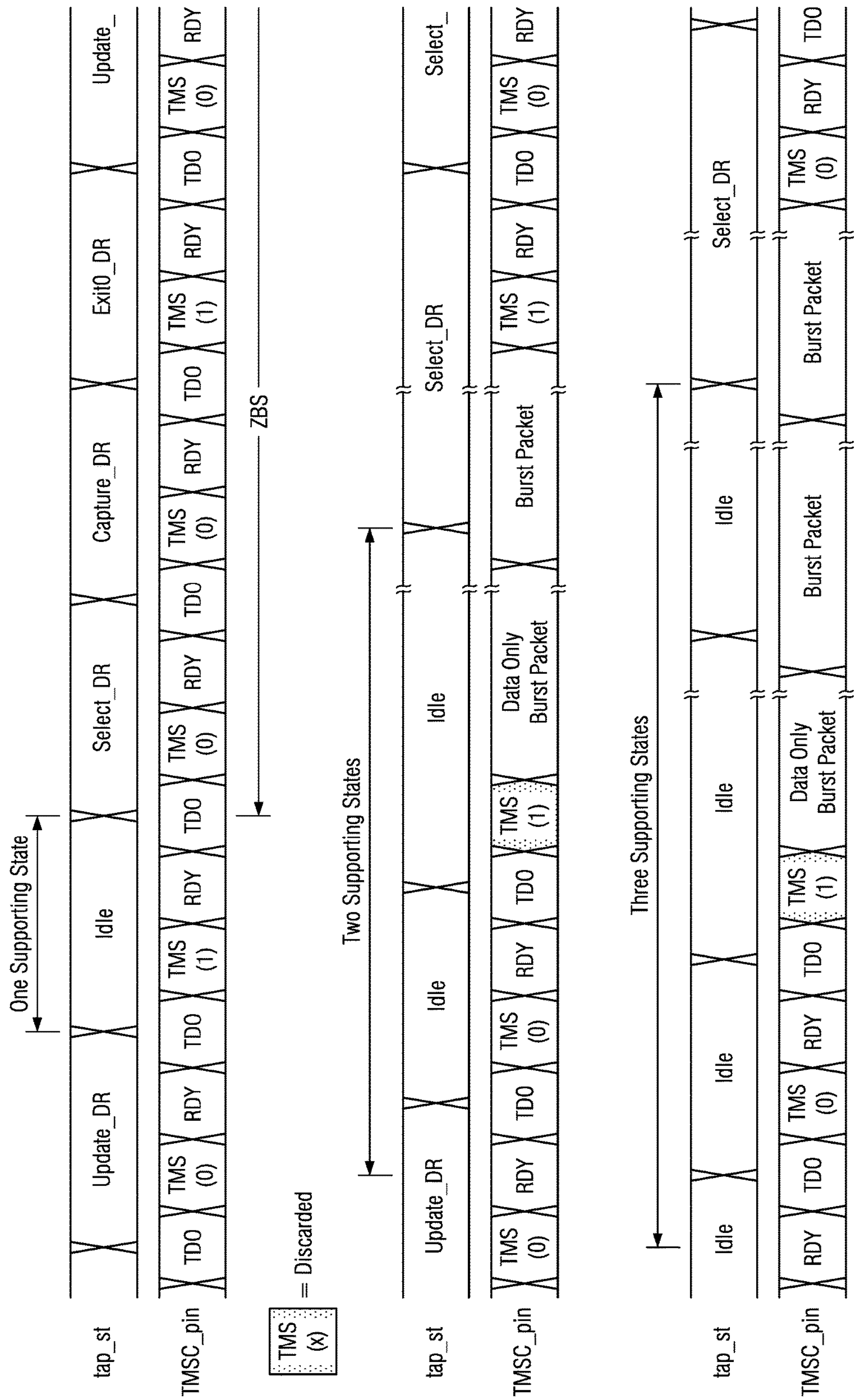
FIG. 177 is a diagram of BDX Burst Transfer with OScan3.
Figure 178:
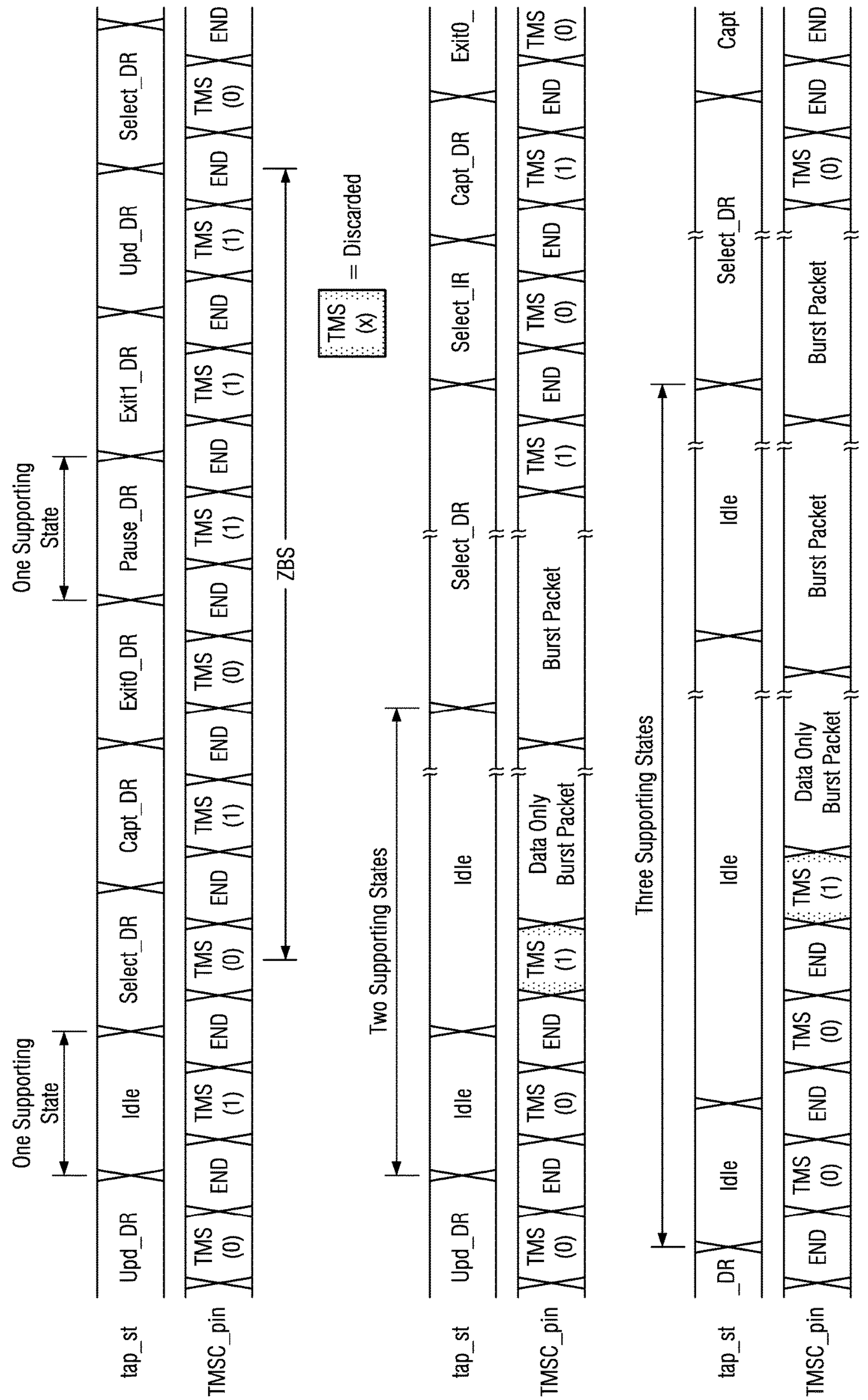
FIG. 178 is a diagram of BDX Burst Transfer with SScan3.

BDX Burst transactions are shown in the following figures:

OScan7: FIG. 174
OScan6: FIG. 175
OScan5: FIG. 176
OScan4: FIG. 176
OScan3: FIG. 177
OScan2: FIG. 175
OScan1: FIG. 176
OScan0: FIG. 176
SScan3: FIG. 178
SScan2: FIG. 176
SScan1: FIG. 176
SScan0: FIG. 176

Figure 179:
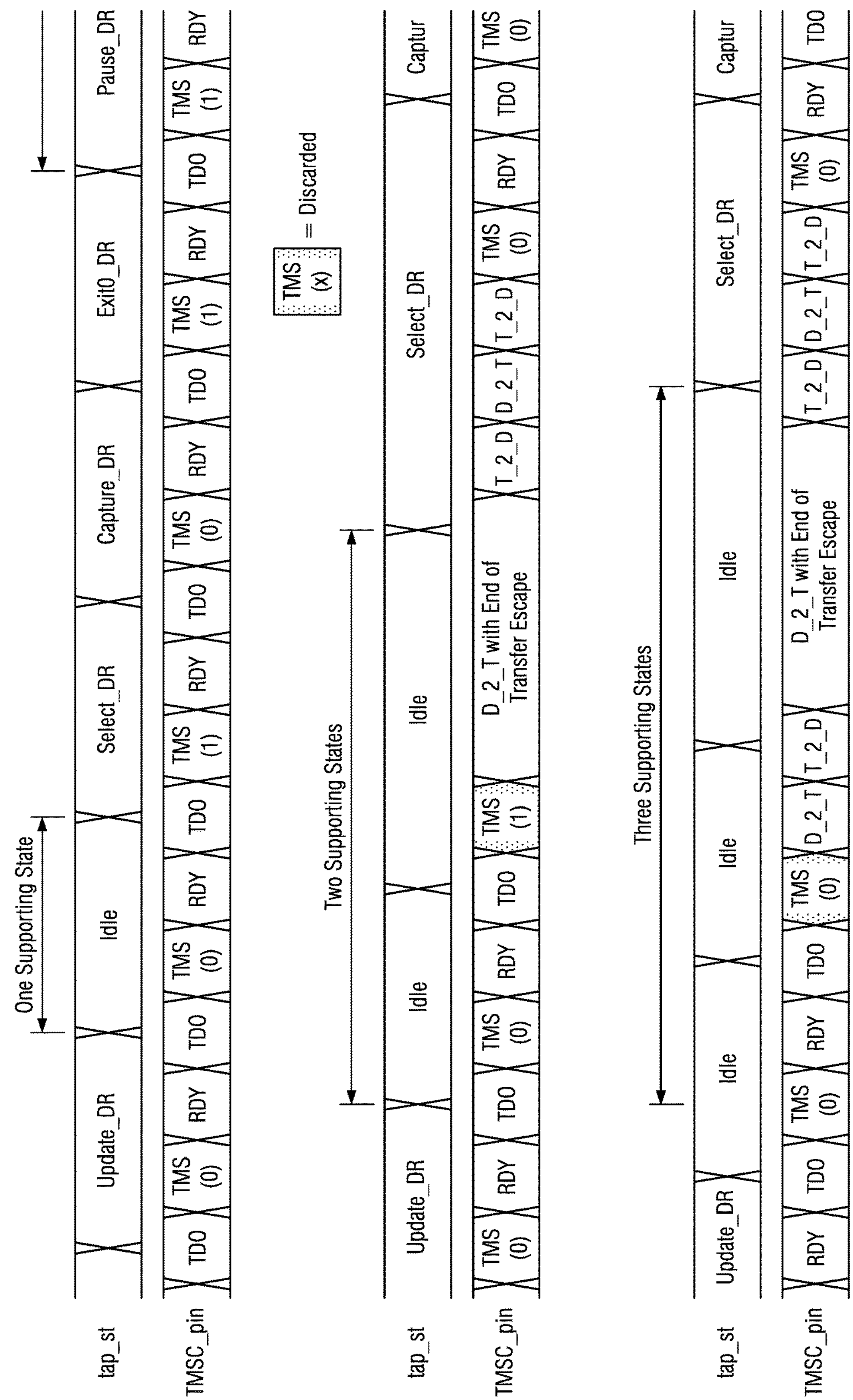
FIG. 179 is a diagram of BDX Continuous Transfer with OScan3.
Figure 180:
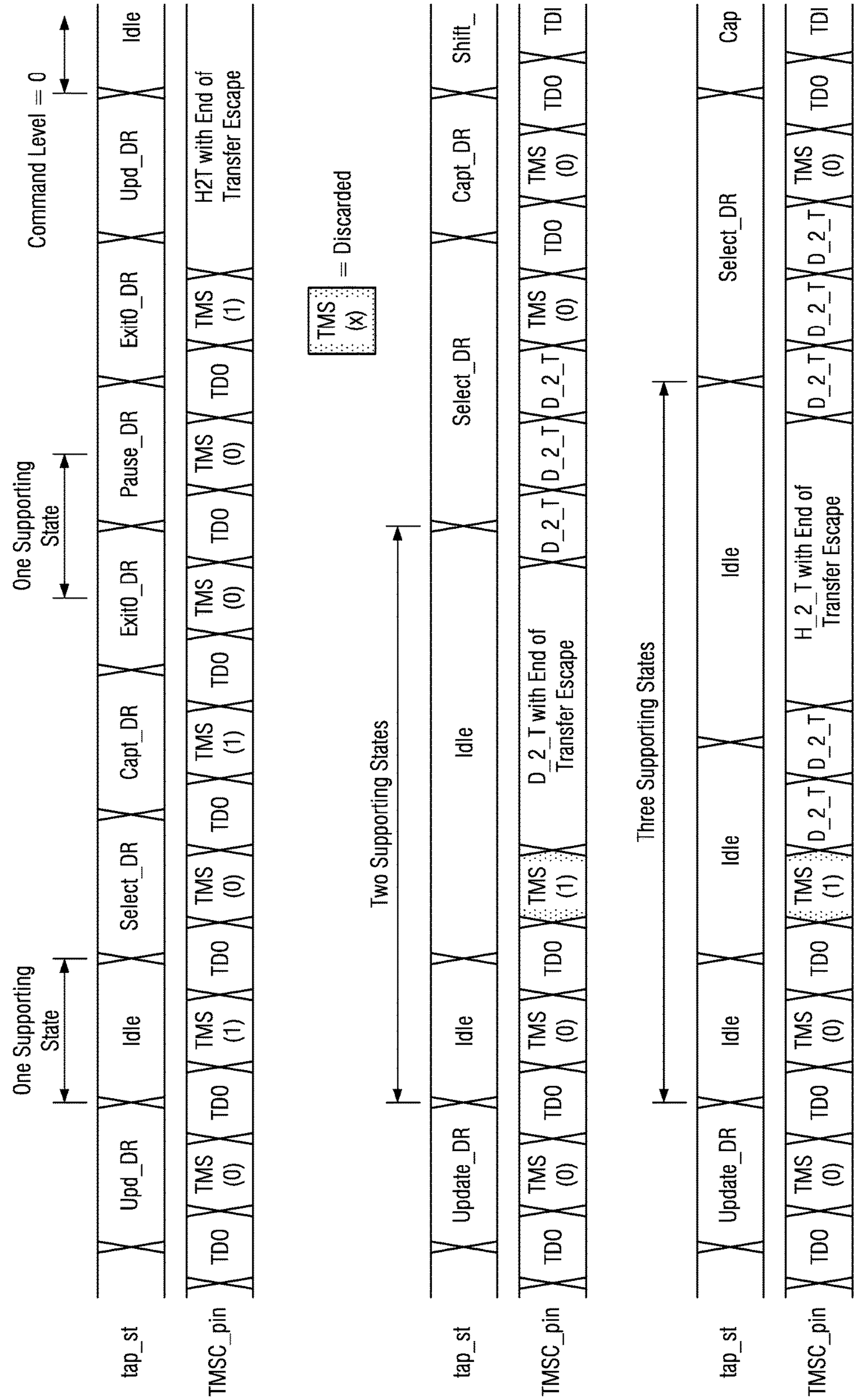
FIG. 180 is a diagram of BDX Continuous Transfer with OScan2.
Figure 181:
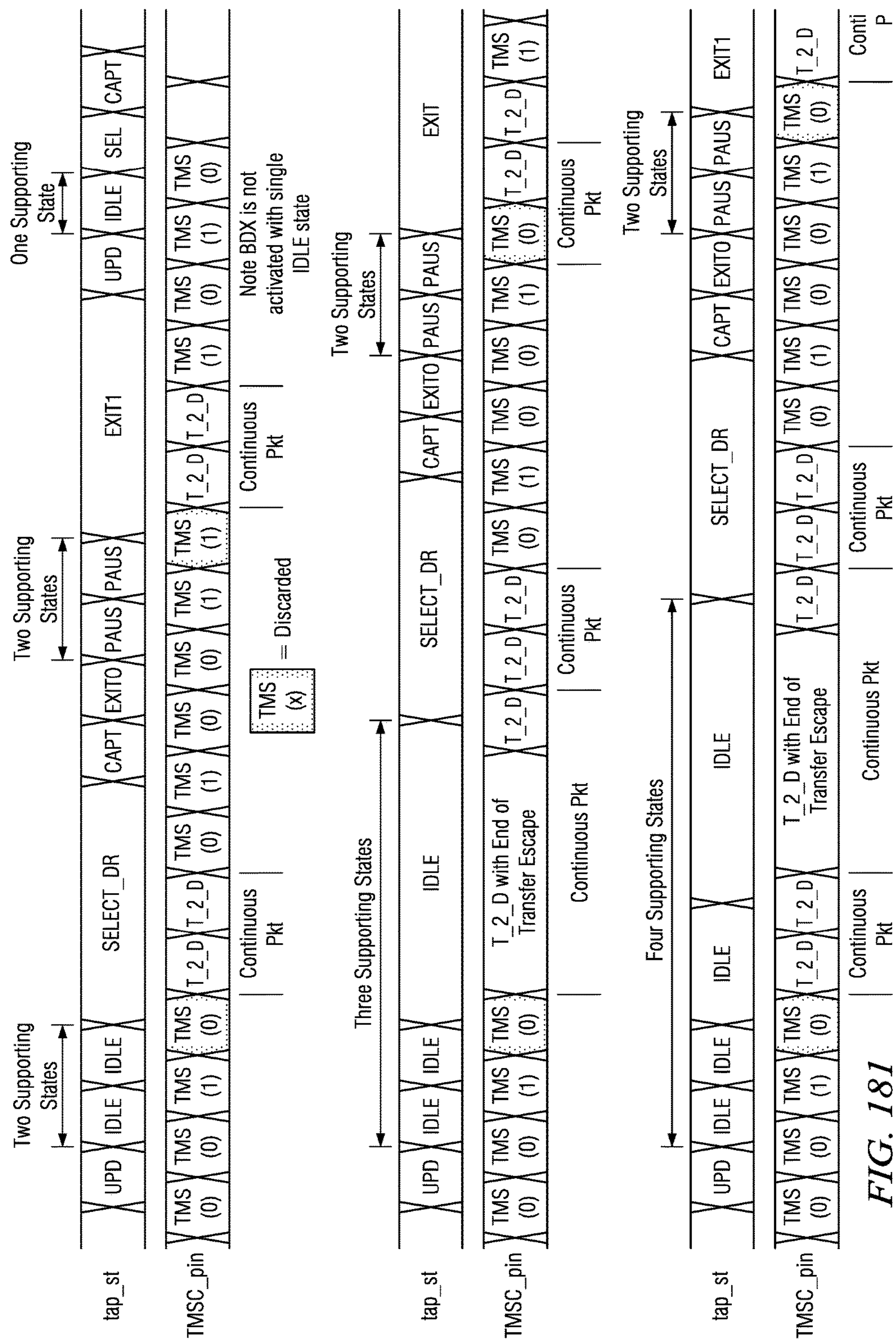
FIG. 181 is a diagram of BDX Continuous Transfer with OScan0, 1, SScan0 or 1.

BDX Continuous transactions are shown in the following figures:

OScan3: FIG. 179
OScan2: FIG. 180
OScan1: FIG. 181
OScan0: FIG. 181
SScan1: FIG. 181
SScan0: FIG. 181

Figure 182:
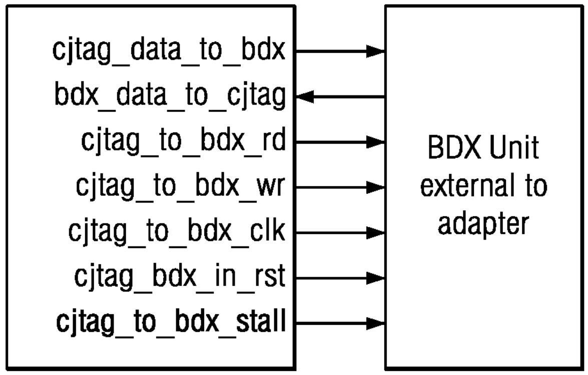
FIG. 182 is a block diagram of BDX Interface.

The BDX Interface, FIG. 182 consists of 7 signals on the adapter's system interface. The BDX protocol assumes the TS BDX unit is always ready to send or receive data. This unit must present data that will be discarded by the DTS BDX unit when it has no real data to send. This is easily accomplished by preceding data of interest with a start bit. A one (1) is presented to the adapter when there is no meaningful data to send. The DTS unit must have a stall signal since the TS cJTAG may be stalling concurrent scan activity and will need to hold off the BDX transfers. The TS cJTAG will respond to the DTS cJTAG control signals and suspend BDX transfers accordingly.

The interface signals are:

cJTAG_data_to_bdx—Serial data output to the bdx unit bdx_data_to_cJTAG—Serial data input from the bdx unit cJTAG_to_bdx_rd—an active high signal indicating the serial data from the bdx unit has been accepted cJTAG_to_bdx_wr—an active high signal indicating the serial data to the bdx unit should be latched cJTAG_to_bdx_clk—a gated clock signal to the bdx unit. All control and data signals are timed relative to this clock signal. The clock signal is enabled whenever BDX is enabled and the TS cJTAG is selected. For a DTS cJTAG, the clock is enabled when BDX is enabled.

cJTAG_bdx_in_rst—when high, this indicates the bdx interface is in reset, the power up default state. This may be re-asserted/asserted at anytime in the TS cJTAG in response to a reset command from the DTS cJTAG. While this signal is high, the rd and wr signals should be ignored.

cJTAG_to_bdx_stall—This signal exists only in the DTS cJTAG. It is used to hold off any further BDX transfers, usually due to a "not ready" condition on the TS cJTAG.

Figure 183:
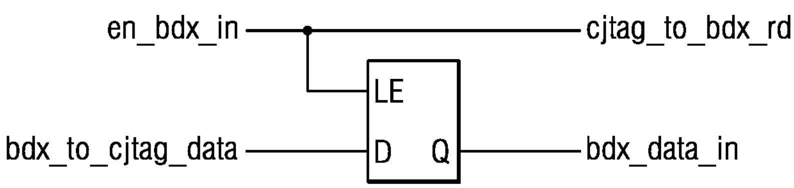
FIG. 183 is a diagram of Conceptual Adapter BDX Input Section.
Figure 184:
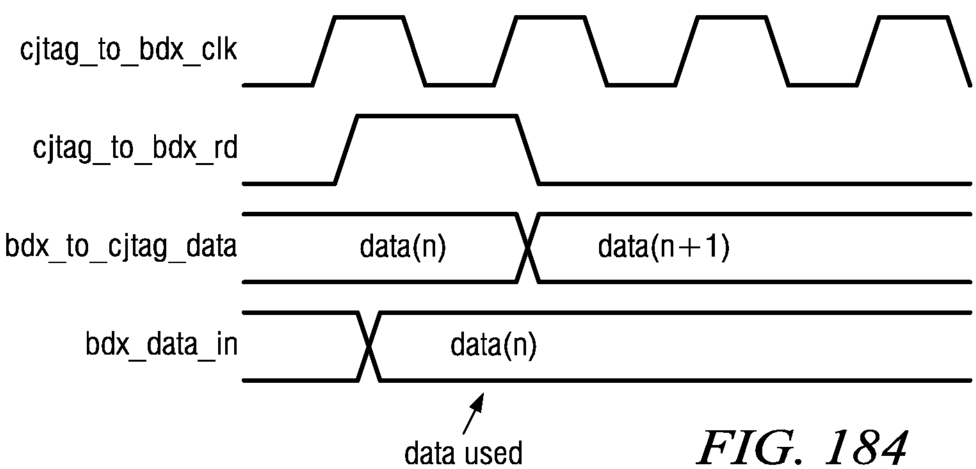
FIG. 184 is a timing diagram of BDX Input Timing.

The BDX Input Section uses transparent latches to capture the input data. The BDX and CDX timing is identical, see FIG. 184, and the BDX unit is shown in FIG. 183.

The BDX unit is assumed to have data ready before the read signal occurs. The input logic enables a transparent latch to capture the data, at the same time as it sends out the read enable signal. This is timed relative to the BDX clock, such that the transparent latch closes before the next rising edge. This ensures that the data from the BDX unit cannot change before the latch closes. Transparent latches are used instead of edge triggered latches because the BDX data will be sent out on the TMSC pin on the next clock cycle. Using an edge triggered flip-flop (FF) would incur one clock of pipeline latency. If this is acceptable, edge triggered FFs may be used.

Figure 185:
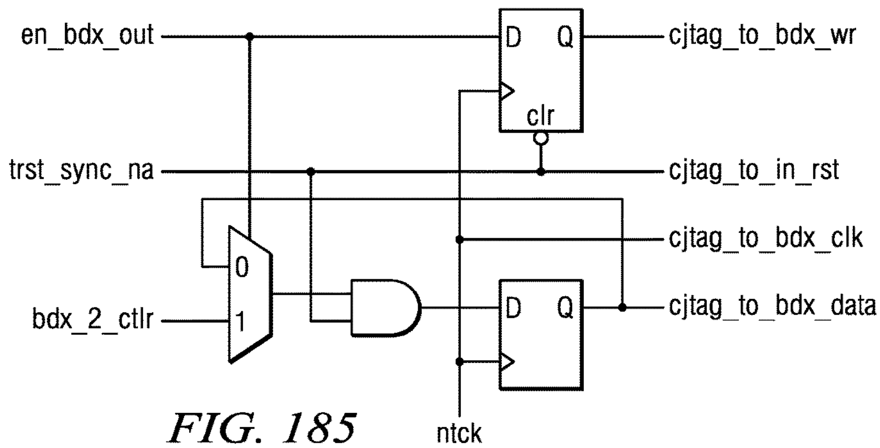
FIG. 185 is a diagram of Conceptual BDX Output Section.
Figure 186:
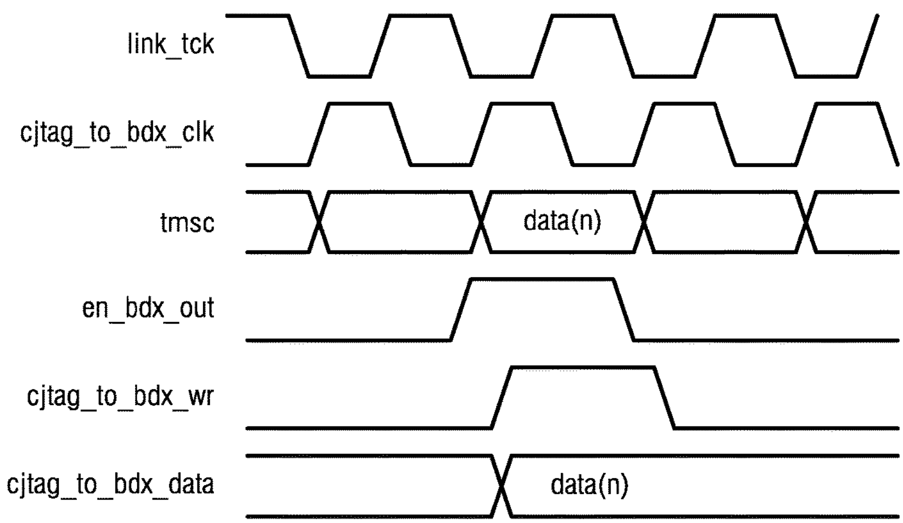
FIG. 186 is a timing diagram of Adapter BDX Output Timing.

The BDX Output Section uses edge triggered latches to output the signals to the respective ports as shown in FIG. 185. BDX data is output relative to its clock. The adapter BDX output timing is shown in FIG. 186.

Custom Data Transfer

An advanced mode capability called custom data transport (CDX) provides a means to use the TAP Shift_DR state to implement a custom link protocol in lieu of a conventional DR Scan. With this capability, the DTS and TS may exchange information with a custom protocol, with the data exchange controlled entirely by the DTS and TS. CDX allows varied debug technologies such as the single-wire debug (SWD) deployed by ARM Limited's CoreSight and TI's HS-RTDX to coexist with the cJTAG infrastructure. The direction of the transfer of each TCK period is defined by the custom protocol. Just as with BDX, the DTS and TS may use CDX for different functions with different protocols at different points in time.

Figure 187:
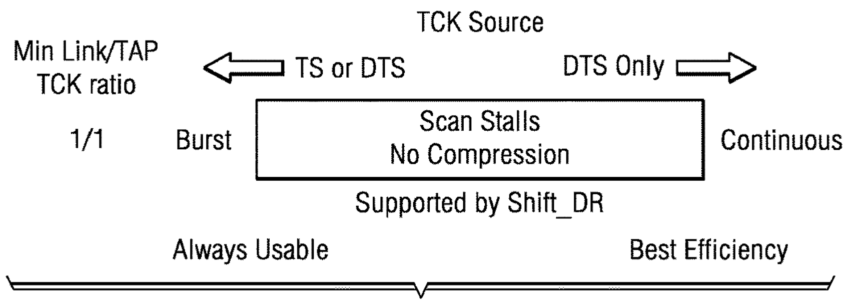
FIG. 187 is a diagram of CDX Capabilities.

The DTS controls the assignment of data register (DR) scans to CDX using one of two methods: "until further notice" where DR scans are allocated/de-allocated to CDX based on specific TAP state sequence or "momentary" directives generated as part of an advanced scan protocol for the duration of the single DR scan associated with the directive. The same formats used for BDX are used with CDX with two differences: a different TAP state supports the transfer, and the CDX unit attached to the adapter controls the direction of the transfer each clock instead of the adapter controlling the direction. This is shown in FIG. 187.

The adapter provides a means to move data between the DTS and TS using a special form of data transfer called Custom Data Transfer (CDX). The data may be any data type as the adapter's CDX operation does not include a protocol. CDX bandwidth is controlled by CDX units connected to the DTS and TS adapters. These adapters control the direction of a CDX transfer on a clock-by-clock basis. This form of data transfer is: Enabled and disabled with a control-register write, Uses the format specified by the TF[3:0] of the control register, Allowed within the command window, if all of the following are true, Control level is one, Interface is operating in the advanced mode, Scan format is Oscan, and Allowed outside the command window, if the scan format is SScan and activated by an SScan header preceding the data packet.

Once Link IDs are assigned and the CDX is enabled, a CDX transfer is activated when: A single adapter is selected for scan, The supporting TAP state is reached (Shift_DR), and One of the following: The control level is one within a command window, and CDX is initiated in-line using SScan facilities. The transfer substitutes CDX information in lieu of the scan packet normally associated with the Shift_DR TAP state. A two-state stay in this state is required to initiate a CDX transfer. Once a transfer is activated, each CDX packet received when the TAP state is a state supporting the CDX transfer advances the TAP state when the TAP state is Shift_DR. The transfer deactivates when the Shift_DR TAP state is exited.

An adapter selected for scan transfers data while adapters not selected go through the motions of a CDX transfer without actually transferring data. This keeps all adapters sharing a DTS port synchronized. An adapter that does not support CDX is placed offline when CDX is enabled. The number of CDX packets transferred equals the number of: TAP states spent in a supporting state when the last scan packet contained TDO, and TAP states spent in a supporting state minus one when the last scan packet did not contain TDO.

CDX transfers closely resemble BDX transfers. Burst and continuous transfers are supported with these transfers having virtually the same characteristics. An additional bit is required to set the TMSC pin to one continuous transfer or a burst data transfer. This slight change from the BDX transfer guarantees a default state of a one on the TMSC pin before the control of the pin is passed to the CDX units. This guarantees the TSMC pin begins at a one (1), should neither the DTS nor the TS CDX units drive the TMSC pin when they are passed control of the pin. Custom protocols should use start bits of zero (0) to initiate control sequences as these cannot be detected, if a CDX transfer is stopped and restarted during a period where neither adapter is driving the TMSC pin. Other aspects of the burst and continuous transfers are the same as BDX.

Figure 188:
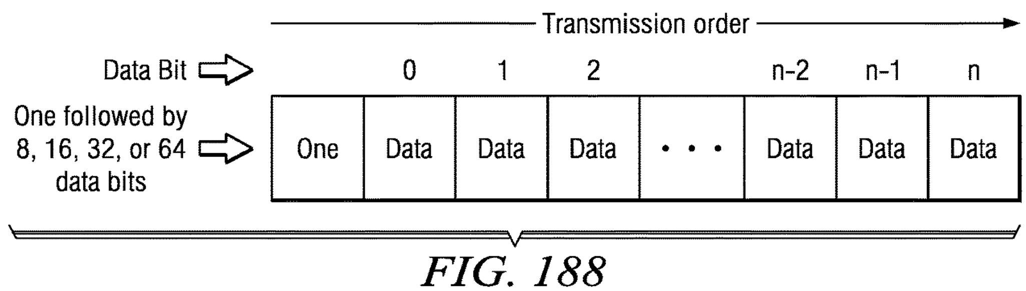
FIG. 188 is a diagram of Data Content.

A burst packet, as shown in FIG. 28, contains: HDR—Combination of ready check and TMS value, and DATA—8, 16, 32, or 64 bits of CDX data preceded by a one (1). The header content is the same as the BDX header content. The Data is preceded by a one (1) as shown in FIG. 188.

Packet content is the same as for BDX with the exception of the slightly different data packet. A TDI value delivered in the first state supporting CDX is used as the TDI value for the entire CDX transfer. If no TDI value is delivered by this state, then a TDI value of zero (0) is used.

A continuous packet is shown in FIG. 27. It is merely a two-bit data value. An end-of-transfer escape sequence may be associated with the first bit of the packet to end a transfer. This ends the transfer after one additional packet is sent. A CDX continuous transfer is shown in FIG. 29. The first continuous packet of a CDX transfer is preceded by a one (1).

A CDX transfer is activated when all of the following are true: A transfer is not active, Link IDs are assigned, CDX is enabled, TAP state is either IDLE, Pause_DR, Pause_IR, and The TMS for the TAP state is a zero (0). A CDX transfer is deactivated when all of the following are true: A transfer is active, The end of a packet is reached, and The TAP state no longer supports CDX. A header separates burst data. A ready check is included in the header when the scan format that would be used if CDX were enabled calls for a ready check. A ready check with the same characteristics as that used by the scan format just mentioned is used.

When CDX is active and an adapter is scan selected (SS=1), the adapter passes data to and from the CDX unit connected to the adapter's system interface. When CDX is active and an adapter is not selected, it does not pass data to and from the CDX unit connected to the adapter's system interface.

Figure 189:
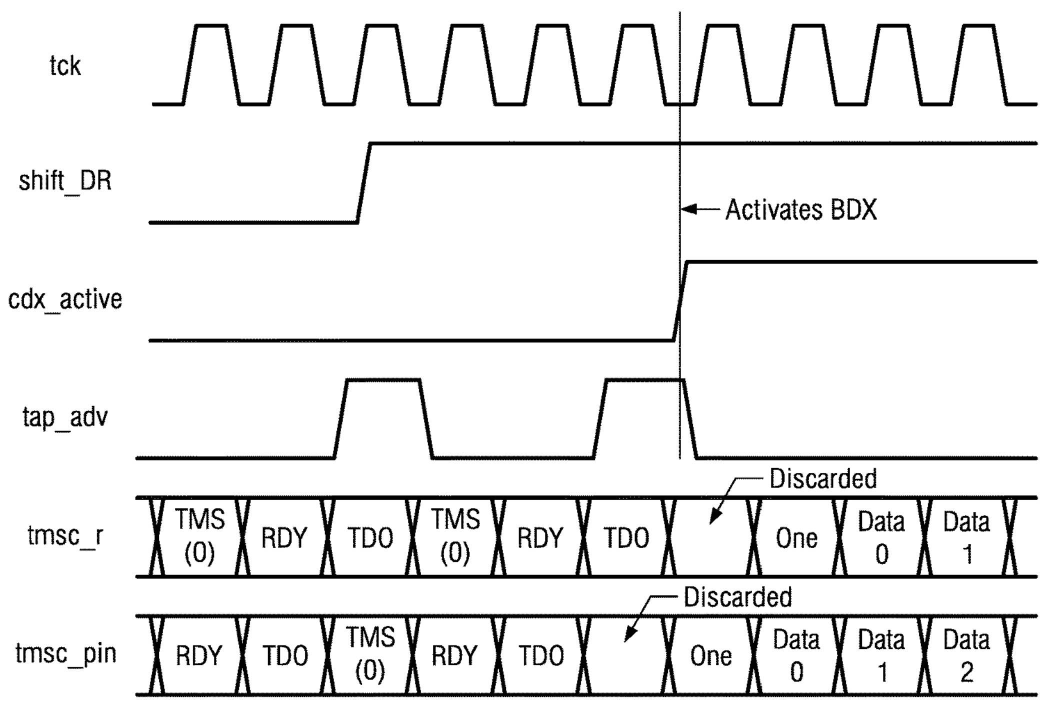
FIG. 189 is a timing diagram of Activating CDX with the OScan7 Format.
Figure 190:
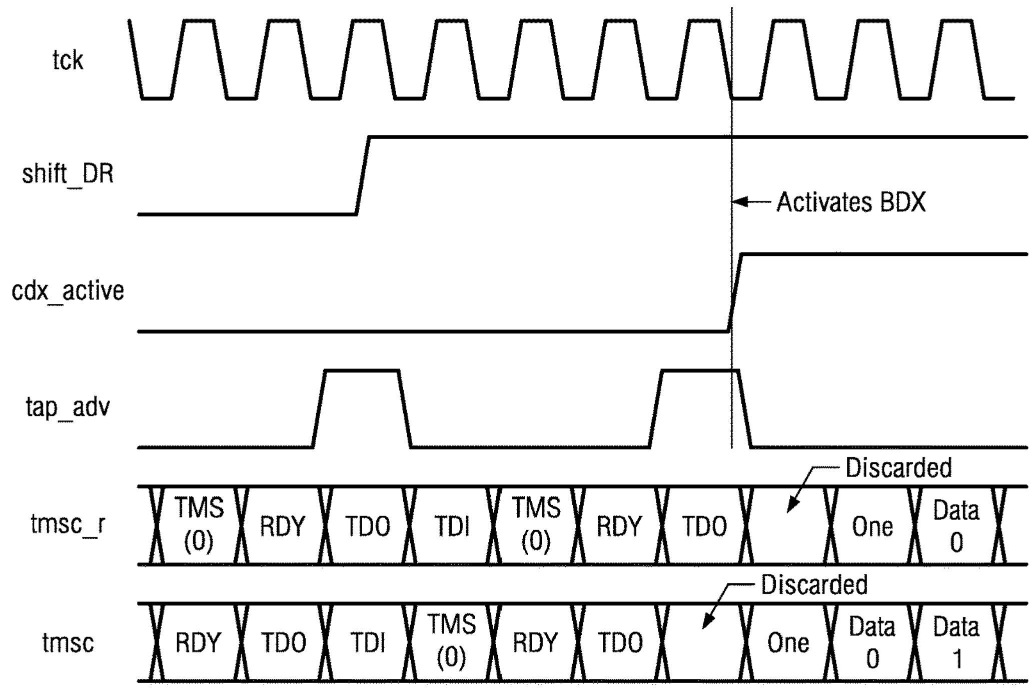
FIG. 190 is a timing diagram of Activating CDX with the OScan3 Format.
Figure 191:
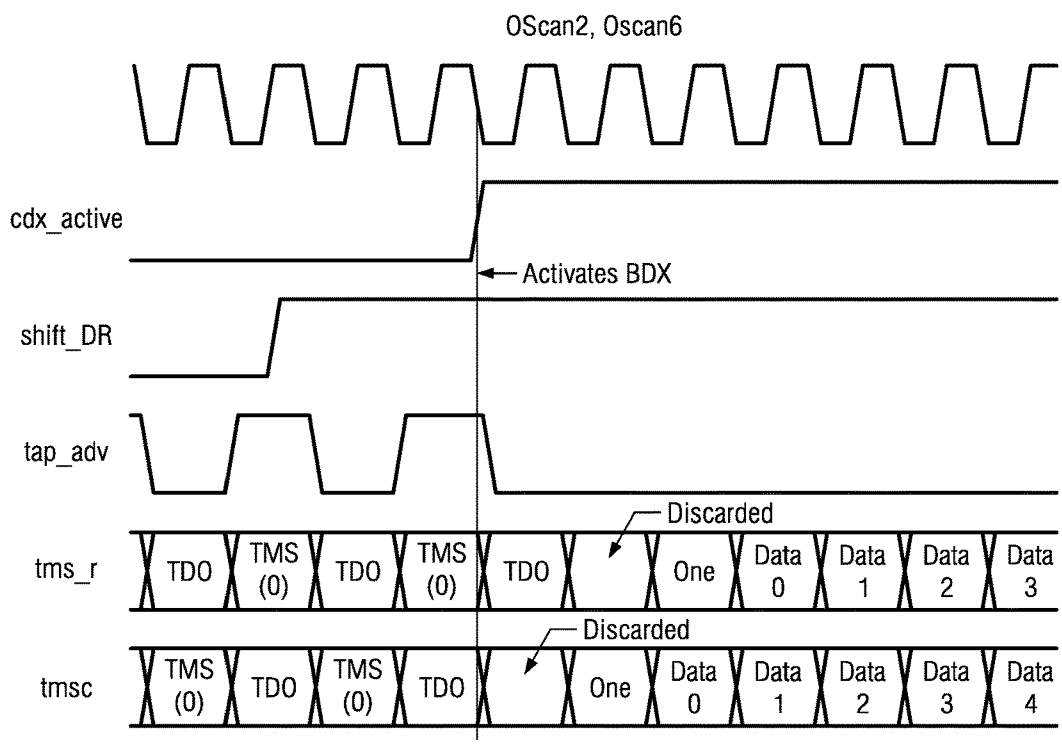
FIG. 191 is a timing diagram of Activating CDX with the OScan Formats 2 and 6.
Figure 192:
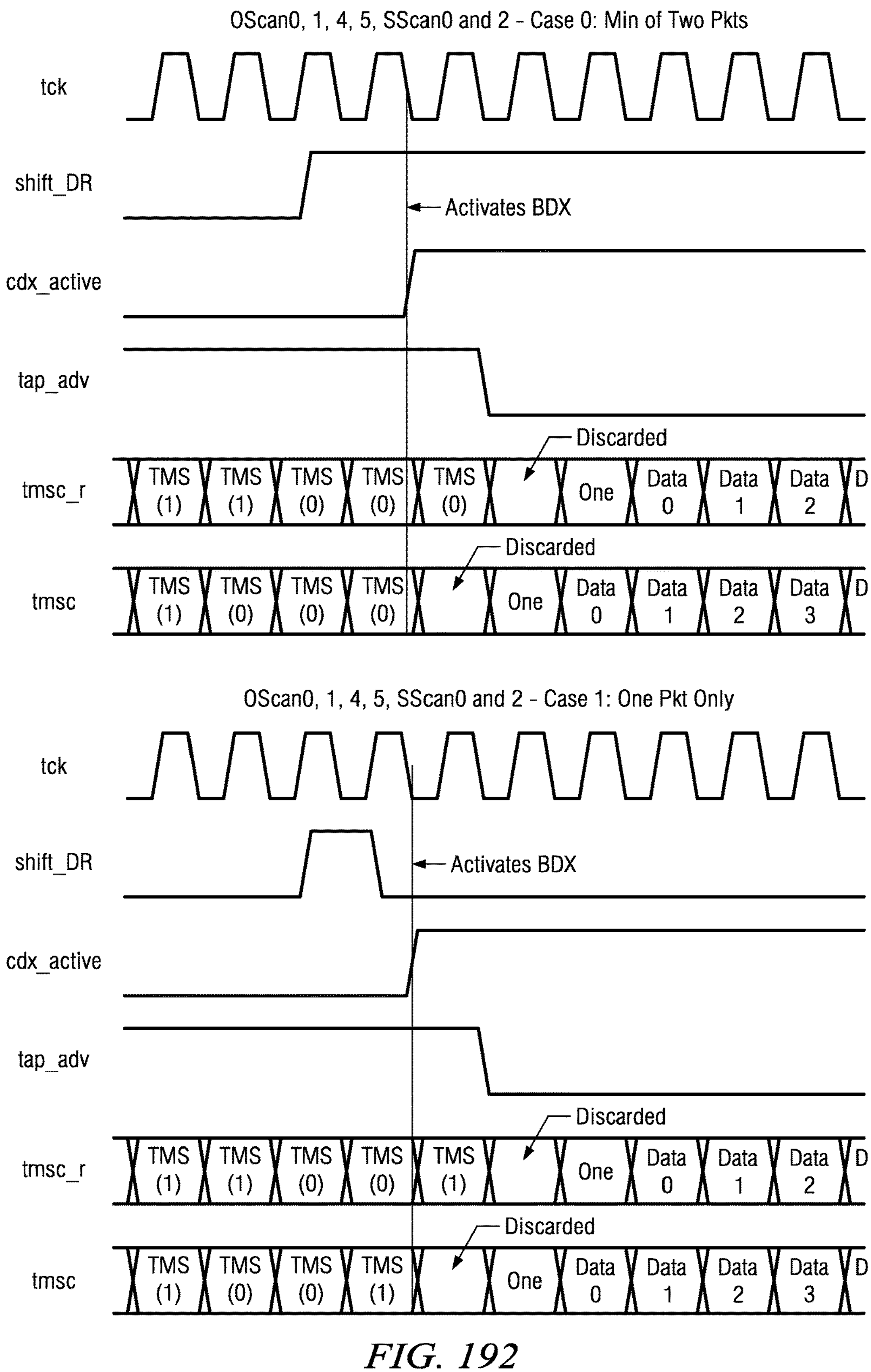
FIG. 192 is a timing diagram of Activating CDX with the OScan0, 1, 4, 5 and SScan0 and 2.
Figure 193:
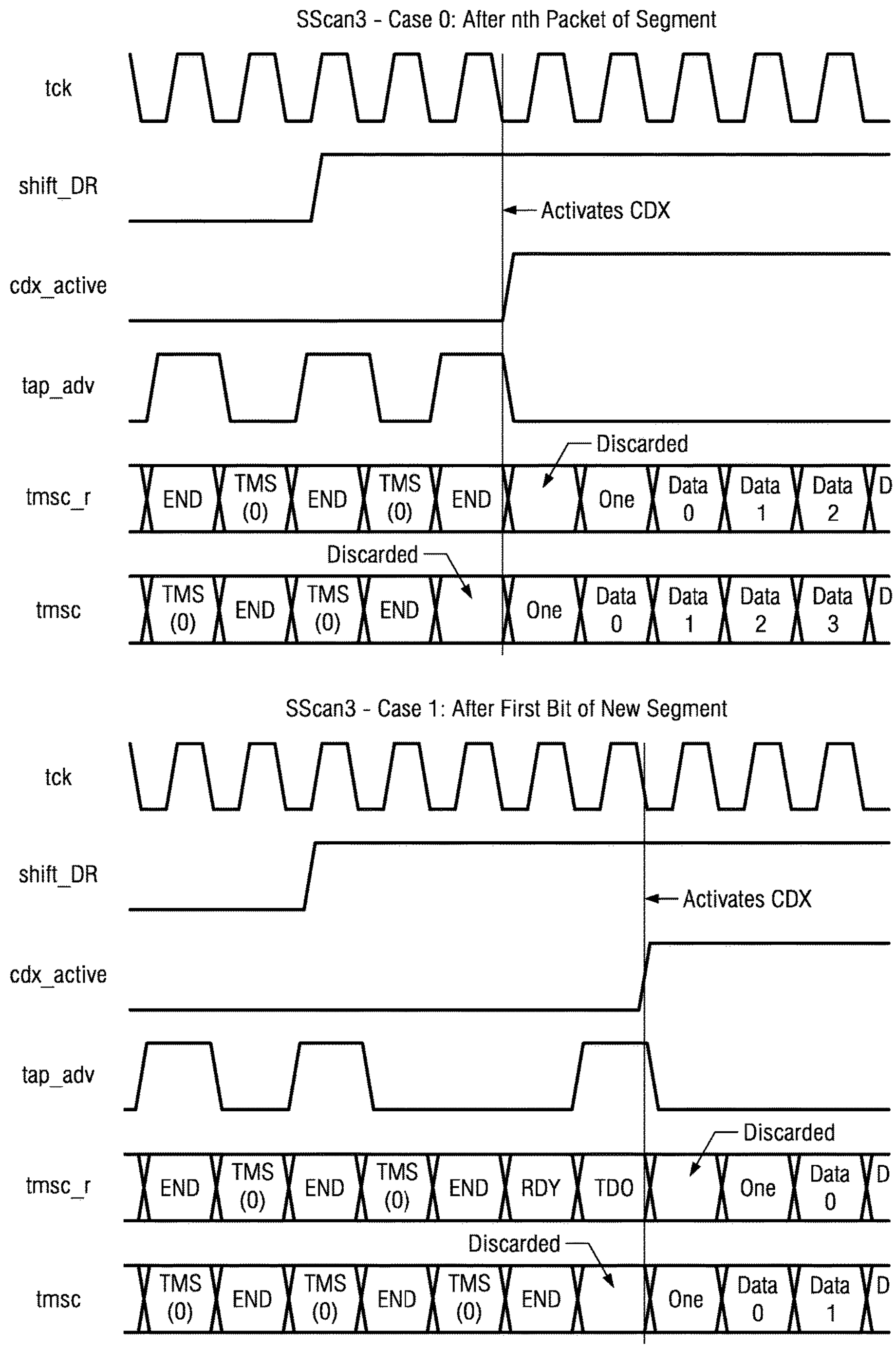
FIG. 193 is a timing diagram of Activating CDX with the SScan3 Format.
Figure 194:
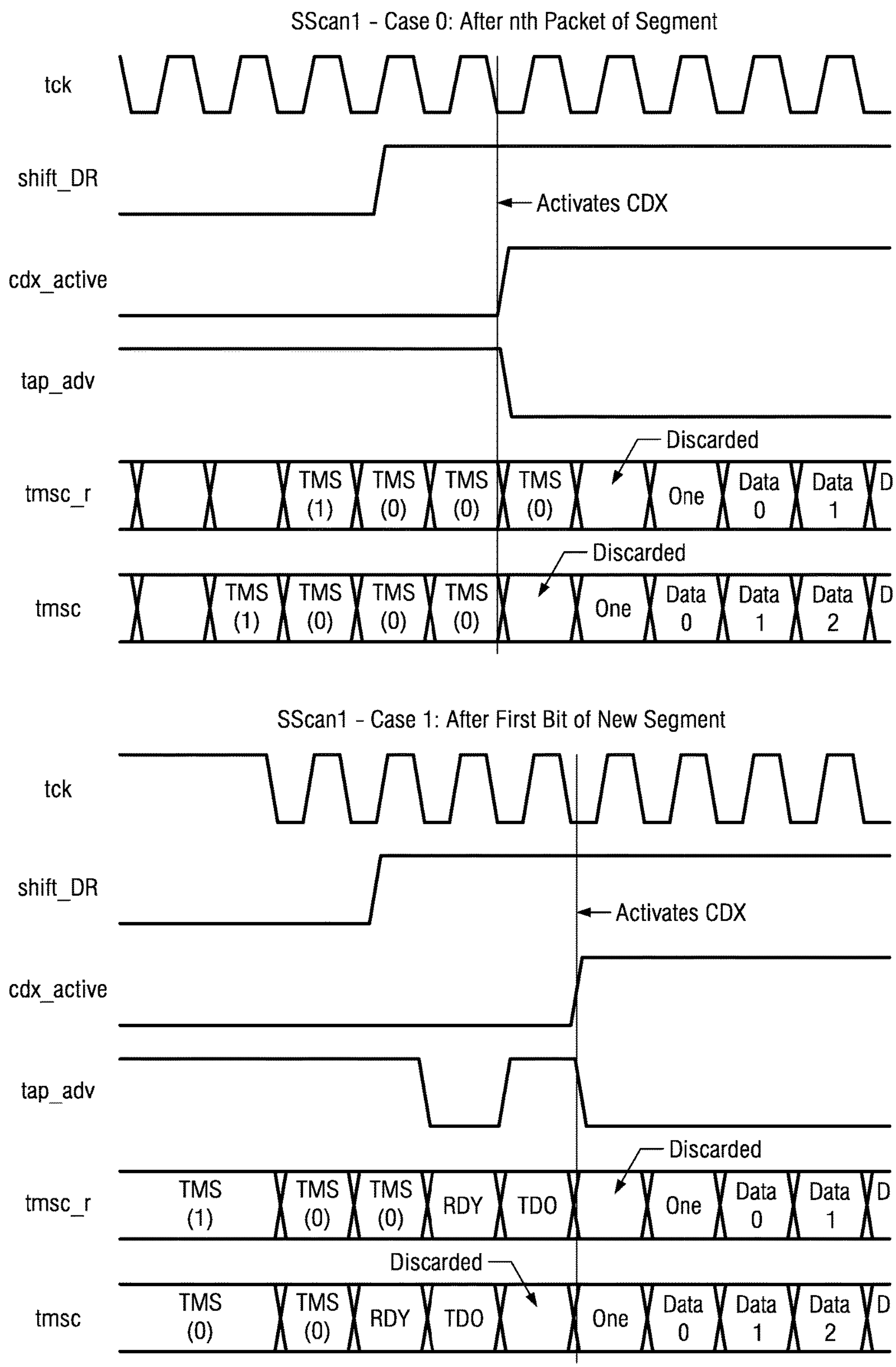
FIG. 194 is a timing diagram of Activating CDX with the SScan1 Format.

The activation of burst and continuous CDX transfers is the same. The difference in these transfers begins after the completion of the first packet. The activation of both burst and continuous CDX transfers is shown in the following figures:

OScan7: FIG. 189
Oscan 6: FIG. 191
OScan5: FIG. 192
OScan4: FIG. 192
OScan3: FIG. 190
OScan2: FIG. 191
OScan1: FIG. 192
OScan0: FIG. 192
SScan3: FIG. 193
SScan2: FIG. 192
SScan1: FIG. 194
SScan0: FIG. 192

The signals in these figures are defined below:

cdx_active: CDX data appears on the TMSC pin
tap_advance: permits a TAP state change when high
tmsc_r: A registered version of the TMSC pin value, clocked on TCK falling
tmsc_pin: TMSC pin value
Shift_DR A TAP state of Shift_DR
tck TCK The deactivation of burst and continuous CDX transfers is the same. A scan packet immediately follows CDX data as shown in FIG. 195. All other scan formats behave the same way, with a scan packet immediately following the last data bit. This single figure is sufficient to represent all CDX deactivations.

Figure 197:
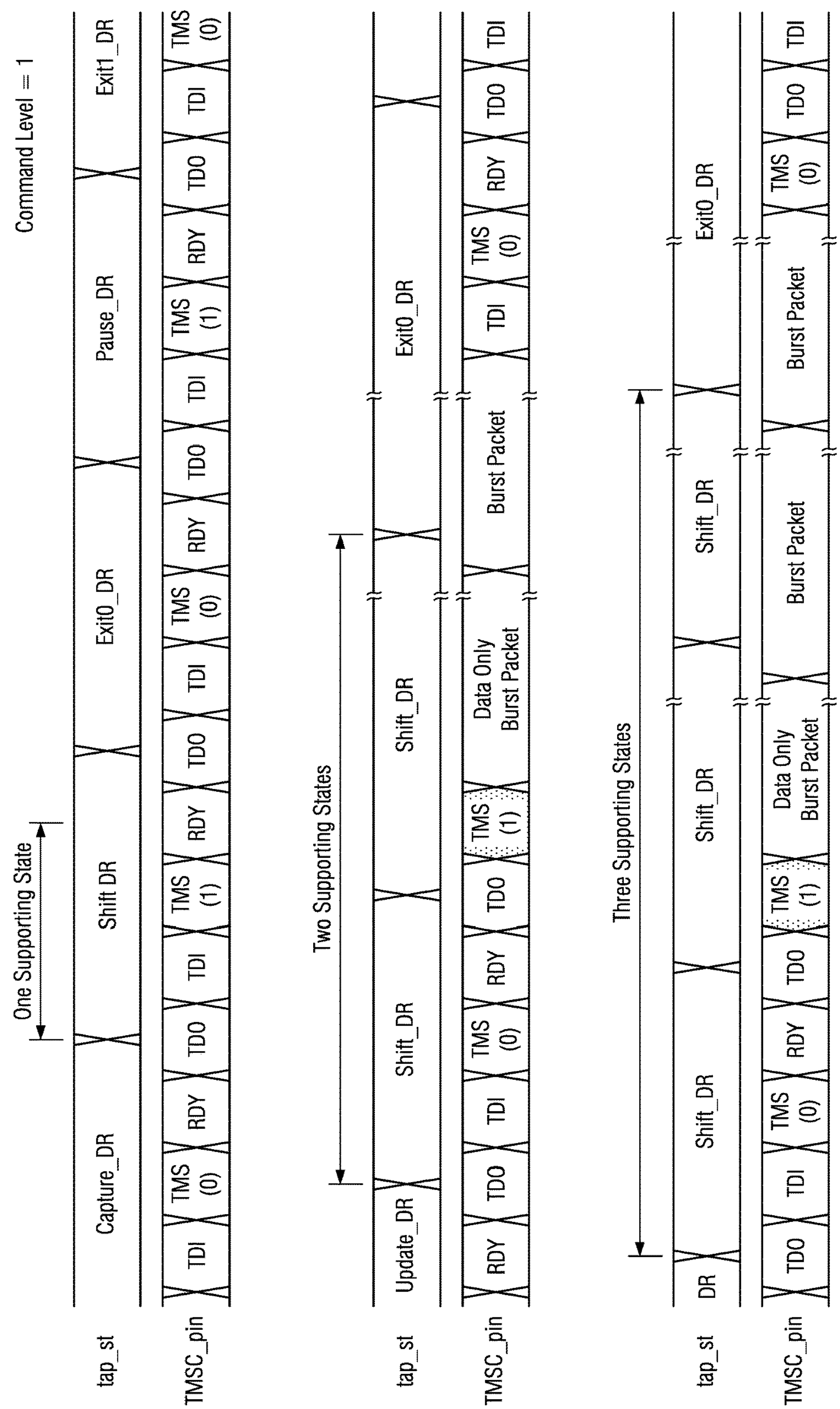
Figure 198:
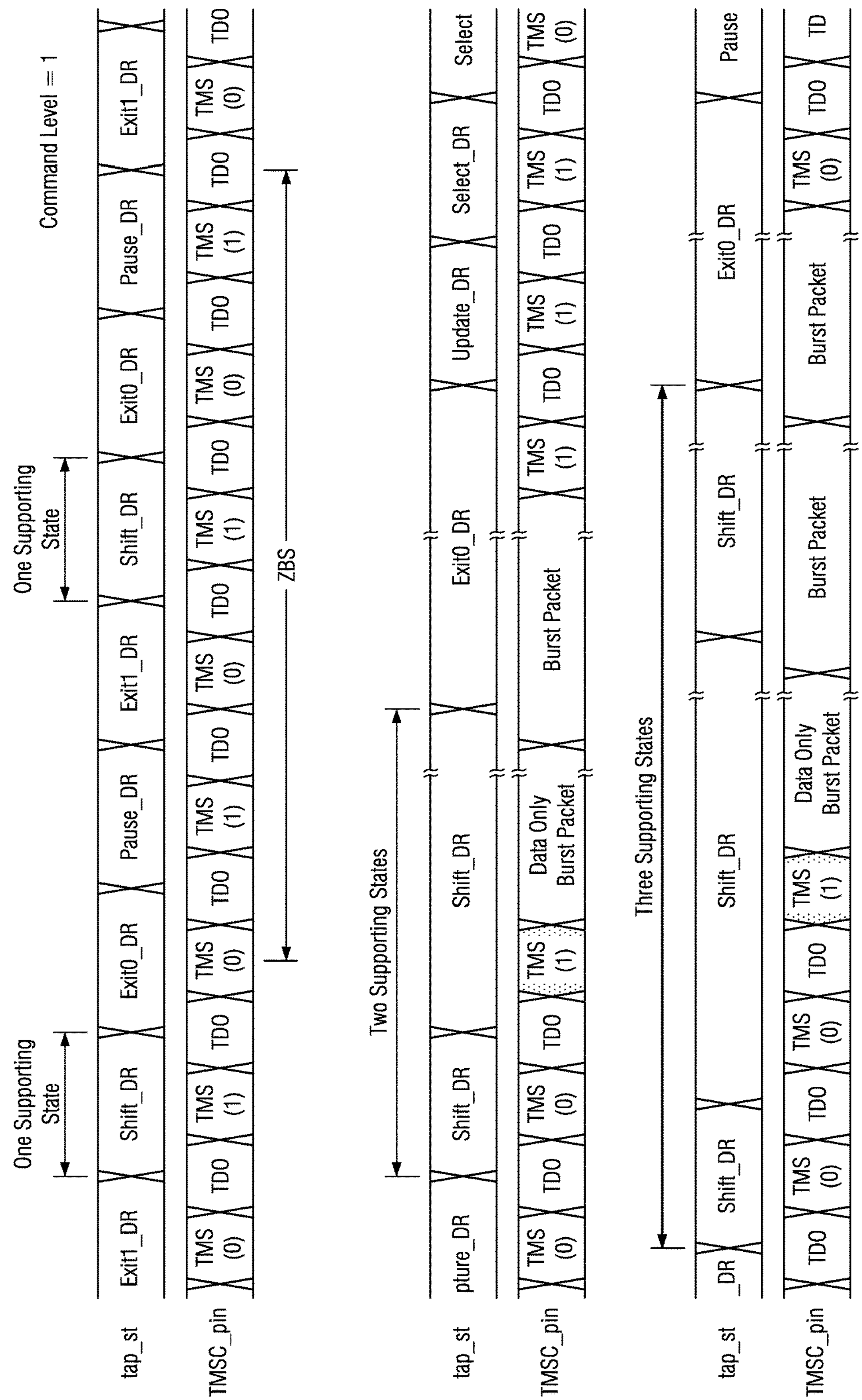
Figure 199:
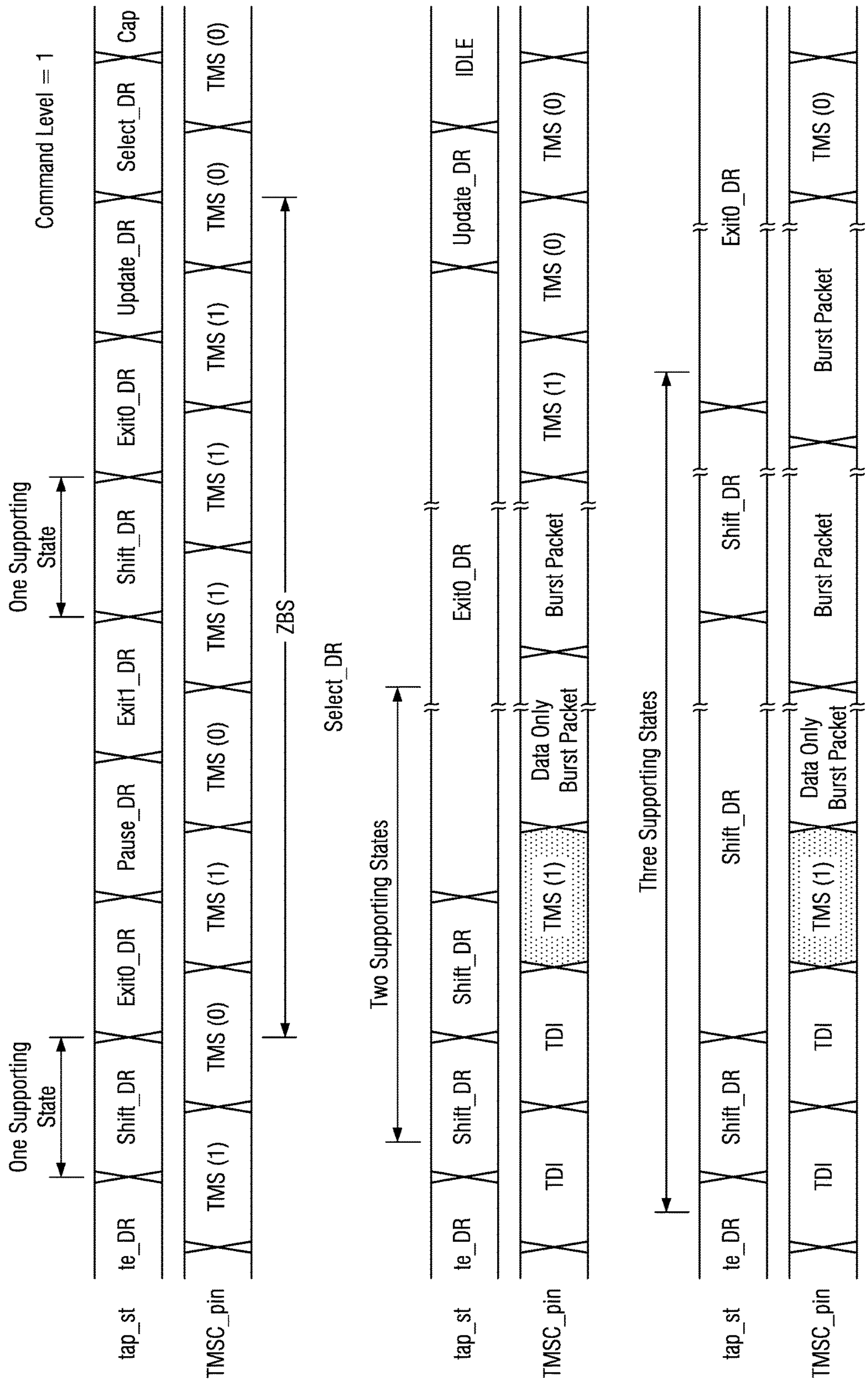
Figure 200:
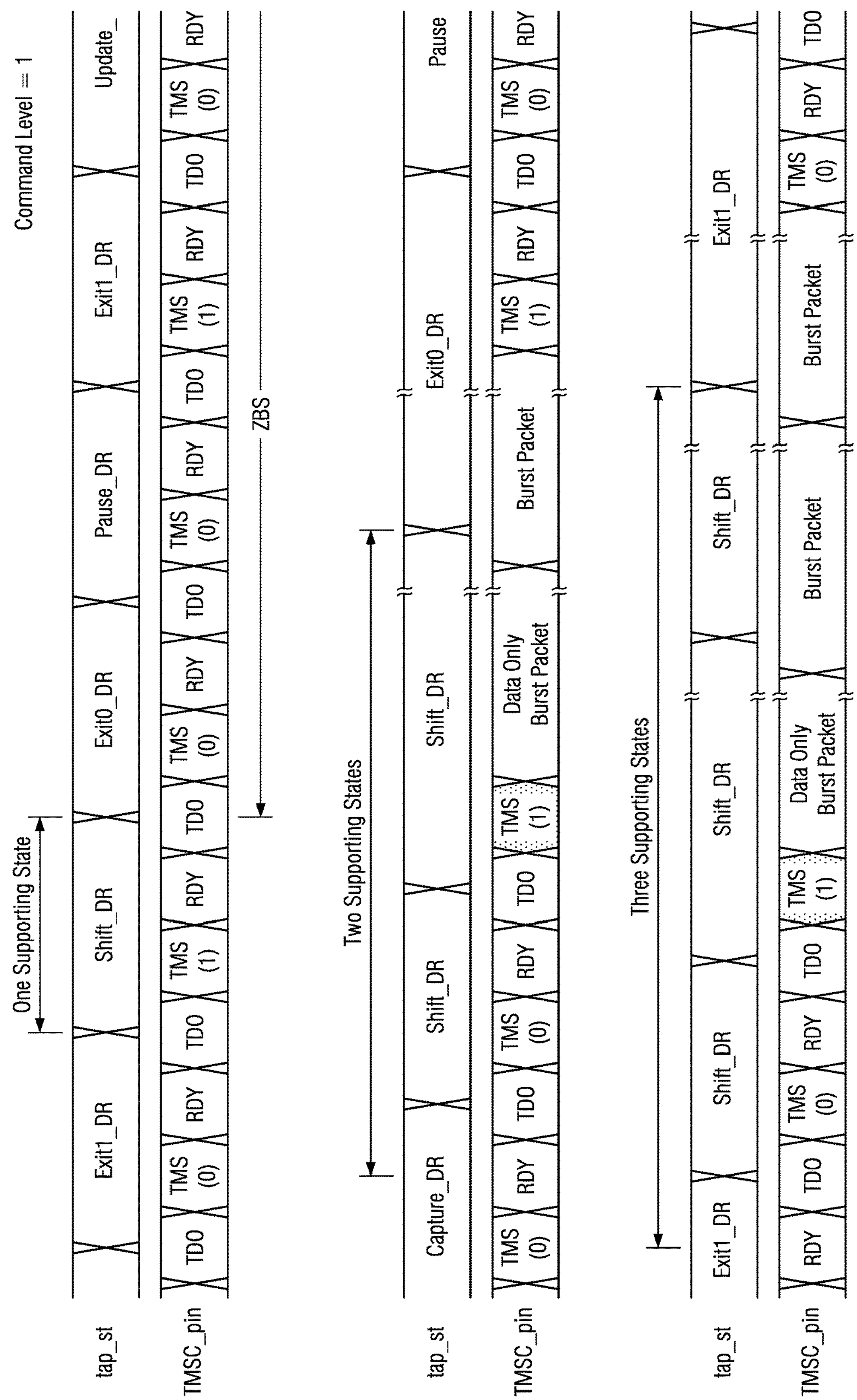
Figure 201:
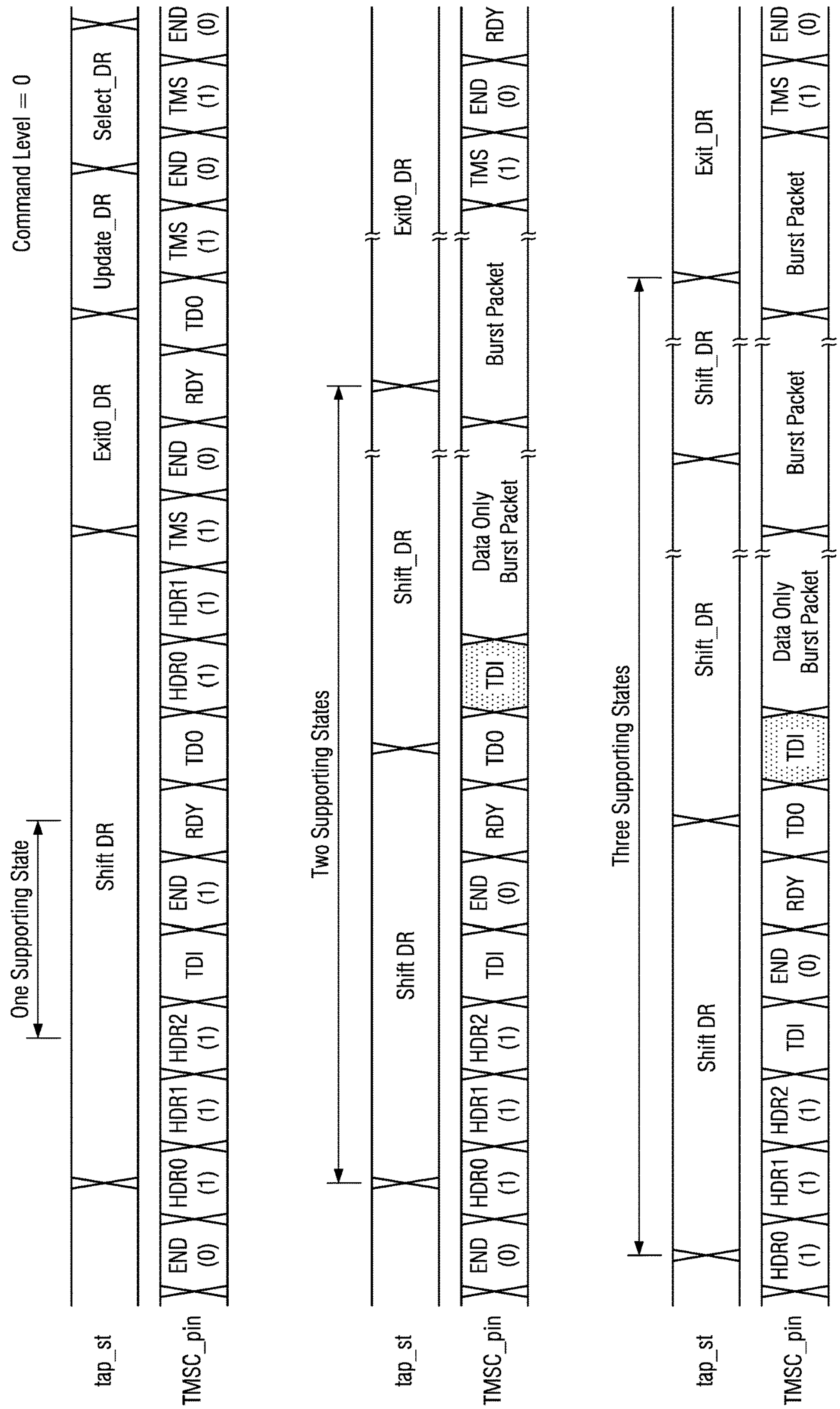
Figure 202:
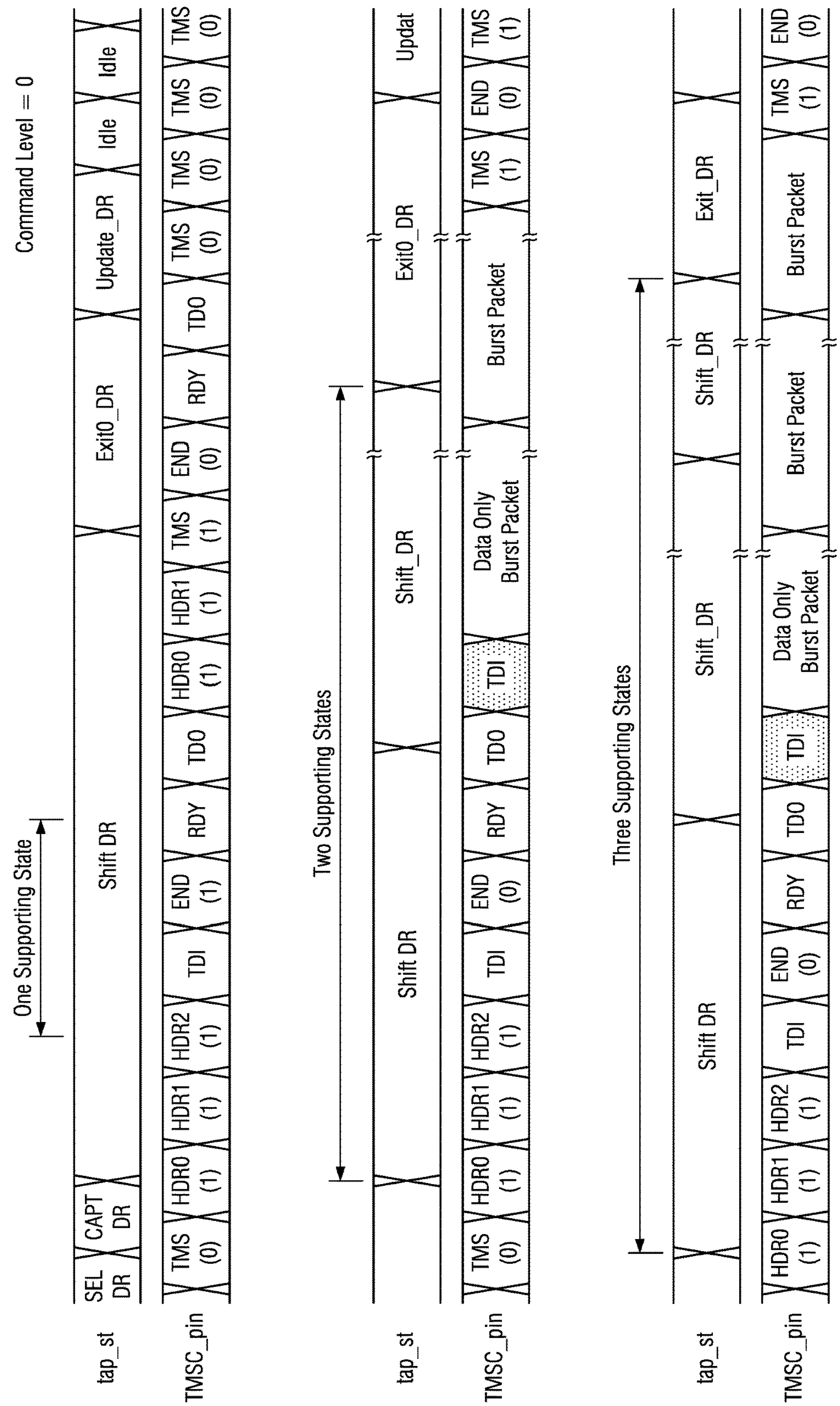

CDX transactions with CDX Burst transactions are shown in the following Figures:

OScan7: FIG. 197
OScan6: FIG. 198
OScan5: FIG. 199
OScan4: FIG. 199
OScan3: FIG. 200
OScan2: FIG. 198
OScan1: FIG. 199
OScan0: FIG. 199
SScan3: FIG. 201
SScan2: FIG. 202

Figure 203:
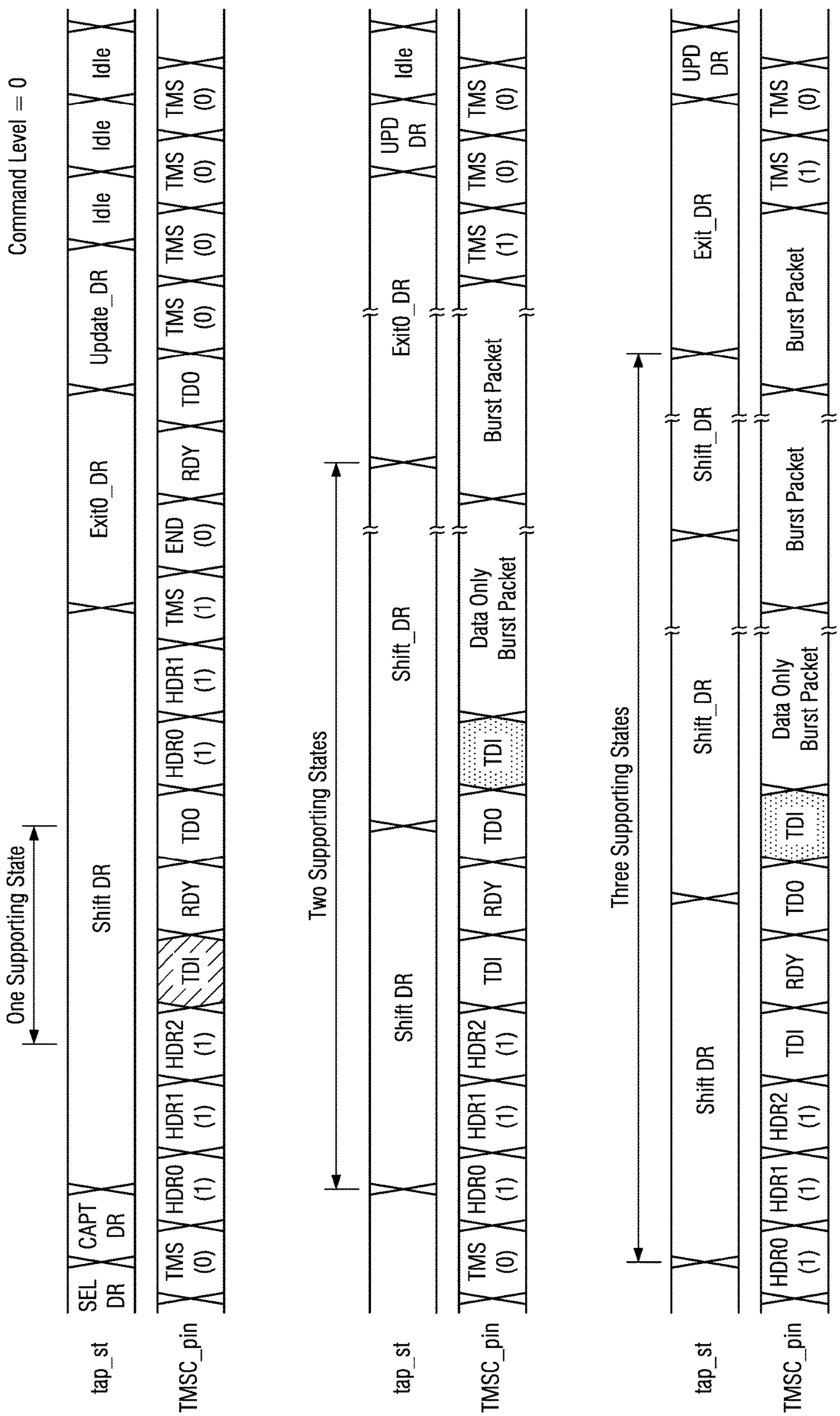

SScan1: FIG. 203

SScan0: FIG. 203

Figure 204:
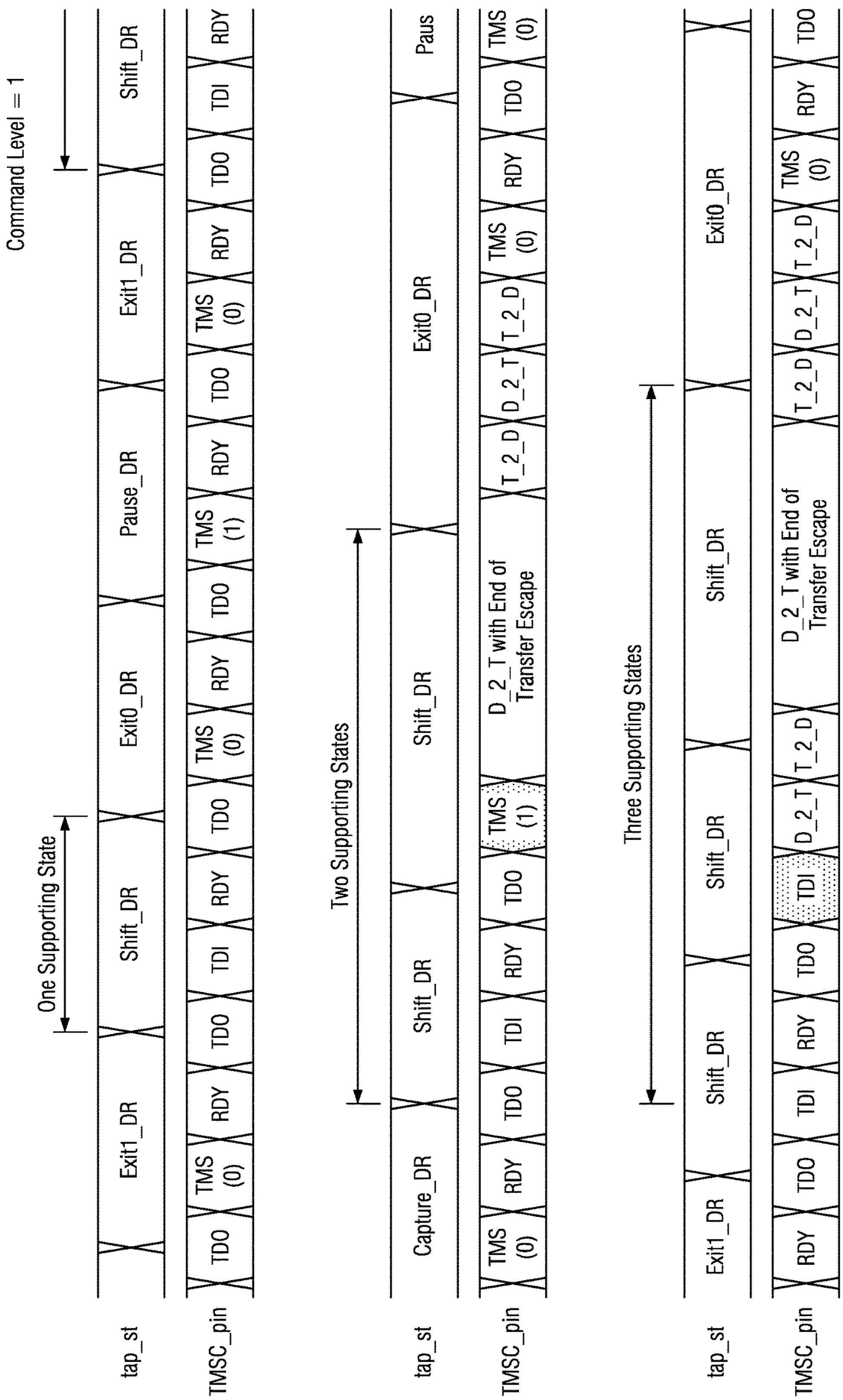

CDX Continuous transactions are shown in the following Figures:

OScan3: FIG. 204

Figure 205:
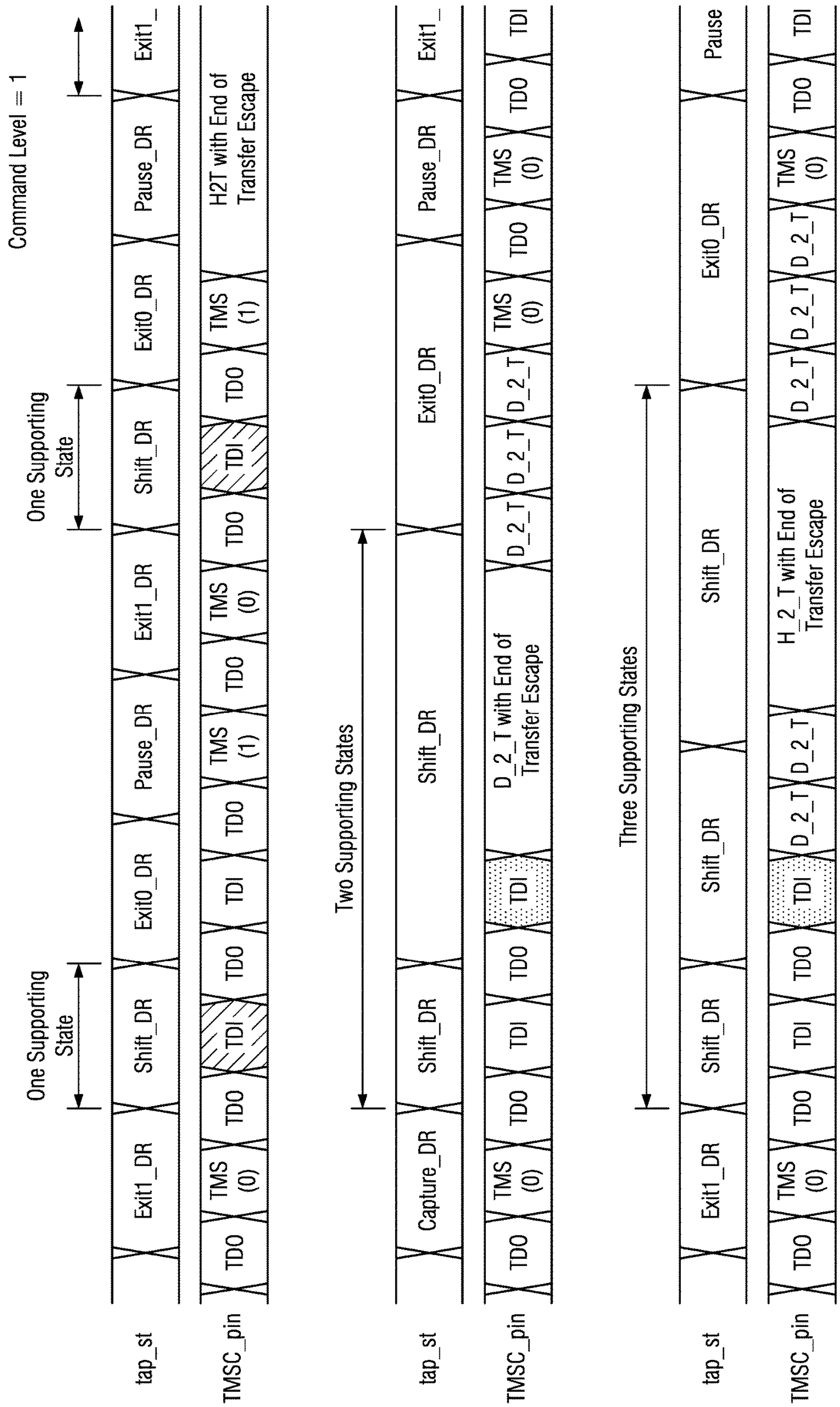

OScan2: FIG. 205

Figure 206:
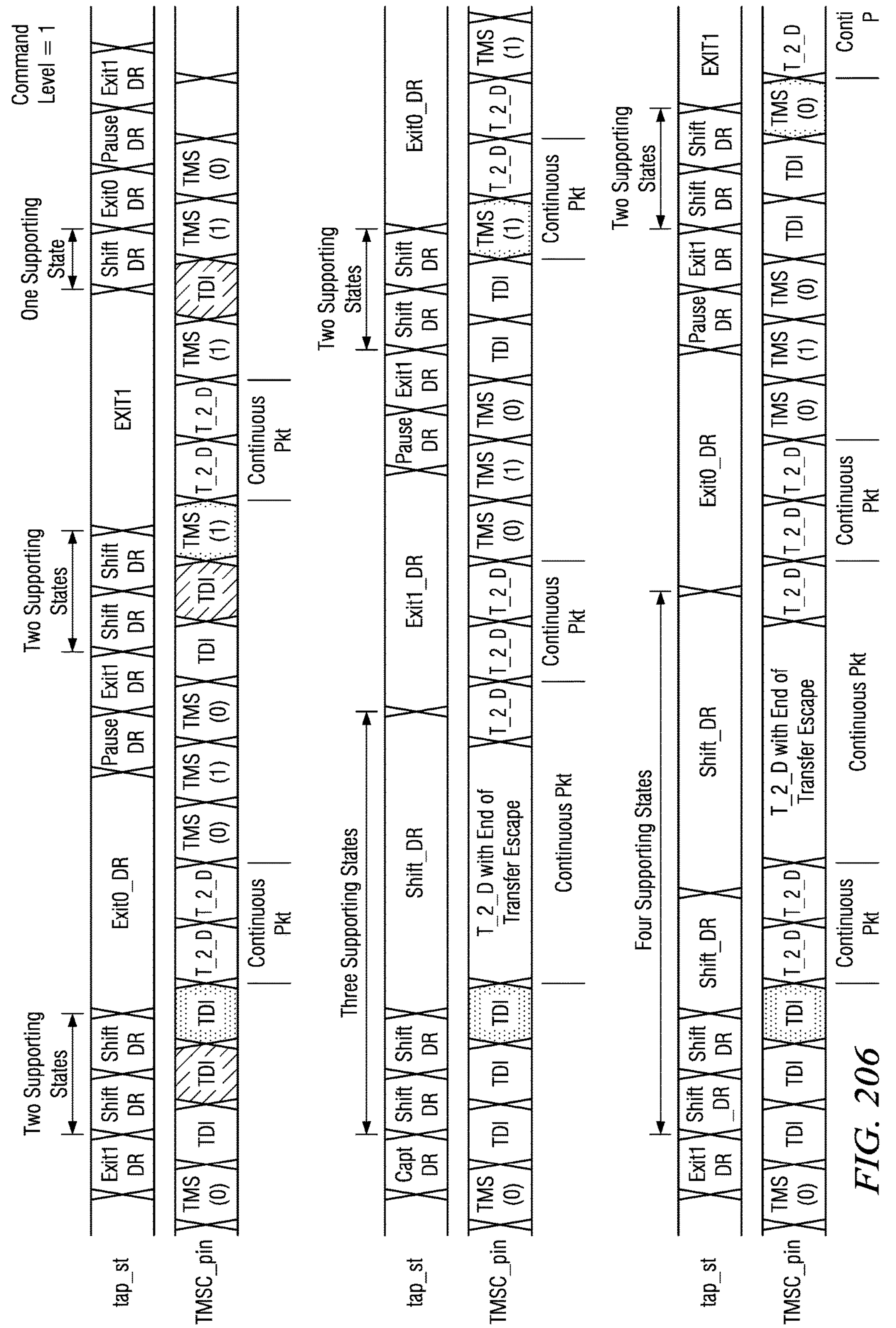

OScan1: FIG. 206

OScan0: FIG. 206

Figure 207:
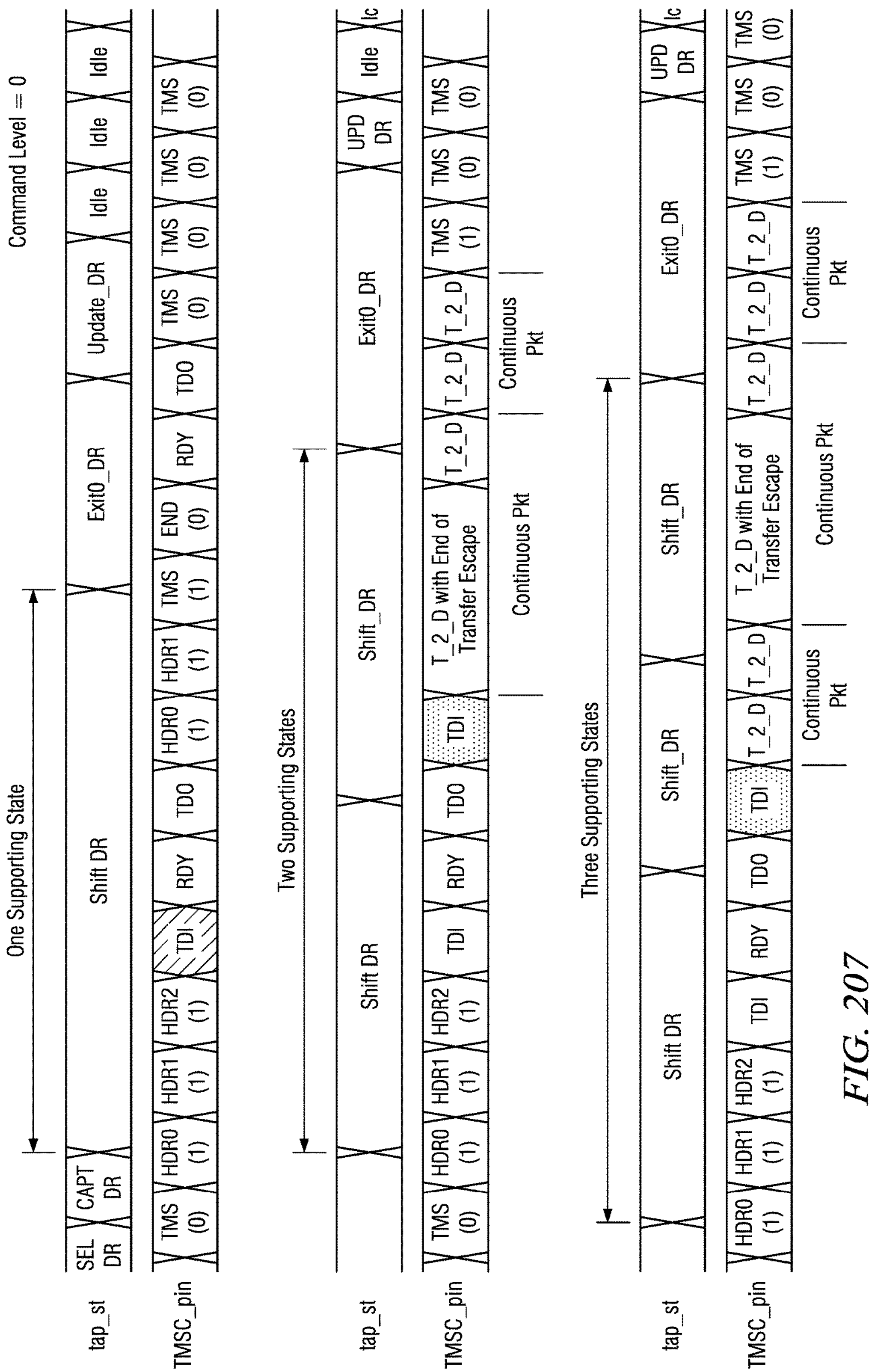

SScan1: FIG. 207

SScan0: FIG. 207

The signals in these Figures are defined below:

| | |
|---|---|
| tmsc__pin: | TMSC pin value |
| tap__st | The TAP state |

FIG. 196 provides a key to notation used in FIG. 197 through FIG. 207.

The CDX Interface consists of 8 signals on the adapter system interface. See FIG. 208. The CDX protocol assumes the TS CDX unit is always ready to send or receive data. The CDX unit differs from the BDX unit as it defines when a Link Interface TCK period allocated to CDX data input or output. The adapter assumes this function for BDX. The DTS unit must have a stall signal since the DTS cJTAG may decide to perform some scan activity and will need to hold off the CDX transfers. The TS cJTAG will respond to the TS cJTAG control signals and suspend CDX transfers accordingly.

The interface signals are:

cJTAG_data_to_cdx—Serial data output to the cdx unit cdx_data_to_cJTAG—Serial data input from the cdx unit cdx_to_cJTAG_data_valid—an active high signal indicating the serial data from the cdx unit is valid.

cJTAG_to_cdx_rd—an active high signal indicating the serial data from the cdx unit has been accepted cJTAG_to_cdx_wr—an active high signal indicating the serial data to the cdx unit should be latched cJTAG_to_cdx_clk—a gated clock signal to the cdx unit. All control and data signals are timed relative to this clock signal. The clock signal is enabled whenever CDX is enabled and the TS cJTAG is selected. For a DTS cJTAG, the clock is enabled when CDX is enabled.

cJTAG_cdx_in_rst—when high, this indicates the cdx interface is in reset. This is the power-up default state. This may be re-asserted/asserted at anytime in the TS cJTAG in response to a reset command from the DTS cJTAG. While this signal is high, the rd and wr signals should be ignored.

cJTAG_to_cdx_stall—This signal exists only in the DTS cJTAG. It is used to hold off any further CDX transfers, usually due to a "not ready" condition on the TS cJTAG.

The CDX Input Section uses transparent latches to capture the input data. See FIG. 209. The CDX unit is assumed to have data ready before the read signal occurs. The input logic enables a transparent latch to capture the data, at the same time as it sends out the read enable signal. This is timed relative to the CDX clock, such that the transparent latch closes before the next rising edge. This ensures that the data from the CDX unit cannot change before the latch closes. The cdx_to_cjtag_data_valid signal tells the adapter when the CDX unit is presenting a bit for output. Transparent latches are used instead of edge triggered Flipflops because the CDX data will be sent out on the TMSC pin on the next clock cycle. Using an edge triggered FF would incur one clock of pipeline latency. If this is acceptable, edge triggered FFs may be used.

The BDX Output Section uses edge triggered latches to output the signals to the respective ports as shown in FIG. 210. BDX data is output relative to its clock. The adapter CDX output timing is shown in FIG. 211.

Register Writes

The cJTAG configuration is changed by command sequences generating control-register writes. Some control-register writes interrupt TMSC pin activity and insert a change packet while others do not. A change packet provides a safe way of coordinating configuration changes when a register write changes the operating mode from standard to advanced or any adapter control register is written while in advanced mode. The behavior of these writes depends on the operating mode before and after the write as shown in FIG. 212. Example 0, shaded in gray, shows that a write, which is generated in standard mode to an adapter control register, does not change the operating mode to the advanced state. This is the only case where writes do not initiate an interrupt and change packet.

The change packet is a special form of the variable delay function. A change packet: Suspends the advance of the TAP state during the packet, Provides a precise mechanism for placing adapters offline and online (see Section 14.4, Offline/Online Management, for more information), Provides the DTS an opportunity to select or de-select ports before proceeding (see Sections 14.4, Offline/Online Management, and 14.5, System Configuration Changes, for more information), and Provides port-to-port synchronization opportunities (see Sections 14.4, Offline/Online Management, and 14.5, System Configuration Changes, for more information).

A register-write interrupt generates a CUPD state with the DLY state being skipped. The stay in the CUPD state is two clocks. The state machine, representing variable delay operation, is used to implement the change packet as shown in FIGS. 16B and 213. The states shaded in gray in this Figure have the following descriptions: CUPD—Update control registers while the interrupt is active, clear the interrupt, stay, if interrupt is active, WAIT—Waits for an exit generated by a TMSC value of zero (0) or a timeout, and DISP—Dispatch to next operation.

The stay in the CUPD state is two states when a register-write interrupt is active, while it is one state when entry is from the DLY state. There is one other difference; the DISP initiates scan packets differently when an interrupt occurs as opposed to a delay being processed.

Change packets contain the following bits:

| | |
|---|---|
| - CUPD(a) | Configuration Update: Register update, clear the register-write interrupt |
| - CUPD(b) | Delay: Provide opportunity to generate two zeros (0s) needed to exit the change packet |
| - WAIT | Wait: All TS devices look for a DTS completion, extension directive, or a timeout |
| - DISP | Dispatch: IEEE entry and exit point, miscellaneous other actions |

The change packet format is shown in FIG. 214. Transmission proceeds from the bit with the lowest number to the bit with the highest number.

An interrupt initiates a two-clock stay in the CUPD state. The TMSC pin may be driven to either a one (1) or a zero (0) by the DTS in the CUPD (a) state or left un-driven. The first state causes a register update, if the operating mode is advanced when this state is reached. The register interrupt initiating the change packet is cleared by CUPD.

The WAIT and DISP bit behavior is the same as described for bits by the same names earlier. When the DTS drives the TMSC pin to a zero (0) during the CUPD (b) and WAIT bit periods, the packet length is four bits with two clocks spent in the CUPD state and one each in the WAIT and DISP states as shown in FIG. 215.

Change packets are initiated when: A store command (STR) occurs and the current scan format is not JScan0, JScan1, JScan2, or JScan3, and A SSF command occurs and the new scan format is not JScan0, JScan1, JScan2, or JScan3. This is summarized in FIG. 216.

Change packets are suspended in the WAIT-bit position when an unsupported feature has been enabled prior to reaching this state. This is called placing the adapter offline. The enabling of such a feature may occur while operating in standard mode or advanced mode. An adapter going offline in advanced mode is shown in FIG. 217. An adapter going offline in standard to advanced mode change is shown in FIG. 218. An adapter that is offline may be brought back online synchronously, if the DTS issues a soft reset precisely as shown in FIG. 219 for an online adapter and in FIG. 220 for an offline adapter. The DTS may use a register-write to a DTS register to create a soft reset with the timing shown in FIG. 219. A soft reset affects both offline and online adapters as shown in FIG. 219 and FIG. 220, respectively.

A soft reset clears the scan format to JScan0 and forces movement from the WAIT state to the DISP state. Since the format is a standard format, the DISP state changes the operating mode to standard. All adapters are synchronized depending on the scan format and TMSC pin operation. Their TAP states must also be synchronized.

TAP state synchronization is accomplished by standardizing the TAP state sequence that occurs when a register write occurs. It is the DTS software's responsibility to assure the TAP state following the TAP update state is consistently maintained when a register write occurs. It is recommended that the Update_DR state be followed by the Select_DR state. This is critical to the ability to issue a soft reset and bring offline any adapters that are online when the link remains functional. In any case, the TAP state must be the TAP state following the Update_DR TAP state when the interrupt is processed, independent of the scan format.

The importance of this synchronization can be seen by comparing the response of both online and offline adapters to the soft reset shown in FIG. 219 and FIG. 220 respectively.

The change packet provides a means for the DTS to write additional control registers implemented within the DTS. These registers may change the operation of a port or ports during the change packet. Ports may be connected or disconnected by using the variable delay facilities or gating clocks on the port during the change packet. This function also relies on the DTS software to maintain a consistent way of writing the adapter control registers.

MScan Register-Write Interrupt. An MScan transaction with a register-write interrupt is shown in FIG. 221.

OScan Register-Write Interrupt. A register-write interrupt is generated in the Update state with the TAP state at either IDLE or Select_DR while the interrupt is processed. The interrupt occurs after the first bit of a new packet, with this bit discarded by the TS. The scan format before and after the interrupt may be different. Register-Write interrupts with OScan transactions are shown in FIG. 222 for OScan7, FIG. 223 for OScan3, FIG. 224 for OScan6 or OScan2, and FIG. 225 for OScan5, OScan4, OScan1 and OScan0. Note that the interrupt is generated coincident with the Update_DR state, when packets do not contain a TDO bit when compared to the interrupt generation coincident with the state following Update when the packets contain a TDO bit.

SScan Register-Write Interrupt. A register-write interrupt is generated in the Update state with the TAP state at either IDLE or Select_DR, while the interrupt is processed. The interrupt occurs after the first bit of a new packet, with this bit discarded by the TS. The scan format before and after the interrupt may be different. Register-Write interrupts with SScan transactions are shown in FIG. 226 for SScan3, new segment, FIG. 227 for SScan3, mid segment, FIG. 228 for SScan2, FIG. 229 for SScan1, new segment, FIG. 230 SScan1, mid segment, and FIG. 231 for SScan0.

Failsafe Attributes

Failsafe attributes are related to the physical connection and disconnection of the TS and DTS. Connecting or disconnecting the TS and DTS should not cause a malfunction in the circuit associated with the TAP. A disconnected adapter should return to its lowest power consumption state. In the case of disconnecting the TS and DTS, it is desirable that the Link interface progresses to a state from which the DTS may gain control of the interface when it is reconnected to the TS, without powering down the TS or otherwise disturbing its operation. These issues become increasingly important when an adapter provides access to application debug facilities.

cJTAG failsafe attributes attempt to create device operation like that created by POR, when the DTS/TS connection is broken. Connection breaks fall into two classes: Supervised, and Unsupervised.

A supervised connection break involves the developer notifying the DTS software of a desire to physically break the DTS/TS connection. This notification allows proper DTS housekeeping of the DTI interface prior to proceeding with the physical disconnect. In this case, the DTS provides the developer permission to proceed with breaking the DTS/TS connection. Little discussion is needed for supervised connection breaks. The debug software places the interface in a safe state before the interface connection is broken. The standard interface release mechanisms are used to create the desired interface state before the connection is broken.

An unsupervised connection break involves a developer physically breaking the DTS/TS connection without notifying the DTS software and receiving permission to proceed. Developers are at risk when they use this disconnect approach. Since it is never clear what DTS/TS interaction is ongoing when the connection is broken, breaking the DTS/TS connection may produce undesired results. Even though the application may fail when an unsupervised break occurs, e.g., software breakpoints are left in memory, the port state must progress to a point where the port may be initialized by the DTS as part of reestablishing a the DTS/TS connection.

The TCK source is an important factor in interface behavior after the connection is broken. There are three cases to consider: TS supplied TCK, DTS supplied TCK, and BCE pin is included in the interface.

When the TS supplies TCK, the operation of the interface continues after the connection is broken. In this case, the desired behavior is: A transition to the TLR TAP state, Link operates in standard mode, and Adapter power down, if power down of the adapter is supported. Alternately, the interface may hang in any of the Stable TAP states provided the TMSC pin remains in an input-only mode. This may occur when the DTS to TS connection is broken during a unidirectional transfer from the DTS to the TS.

When the DTS supplies TCK, the desired behavior is: The adapter state freezes, and The DTS software may reset the Link interface, when a new connection is established using a Hard Reset escape sequence.

A BCE pin included in the interface moves to its asserted state, if the connection is broken. This causes an asynchronous reset of the adapter. Chip power control may power down the adapter after reaching this state.

The break in the DTS/TS connection may occur when any of the following packet types is being transferred: Standard packet, Scan packet, Transport packet, Change packet, and When the interface operates in standard mode, the pull-ups on the TCK and TMS force these signals to a one (1). This causes the TAP state to progress to TLR. If the adapter power control (PC[1:0]) specifies a mode other than no power-down, the PRC may power down the interface as TCK and TMS both reach states that do not request power on.

Scan Packet formats used with a TS supplied TCK contain TMS. This is true for MScan, OScan, and SScan packets. Only scan packets containing TMS may be used. Assuming the TS does not continuously assert "not ready" (if a scan format including RDY is being used), the cJTAG state machines continue their state progression through a scan packet.

When a packet protocol includes TDO, the TDI and TMS values will always be seen as ones at some point because of the combination of: Non-stable TAP states and the TLR TAP state output a one (1) for the TDO value within the packet, Stable TAP states other than the Shift state output a one 1 for the TDO value within the packet, and Inverted TDI data (a Shift state is sure to generate a one (1) at some point as TDO is inverted and presented as TDI and TMS due to the keeper).

The first TDO value of one (1) supplies a TMS value of one (1) in the subsequent scan packet. This makes the process regenerating, with the TAP state progressing to the TLR state. The requirement that TMS toggle from a one (1) to a zero (0) or remain a zero (0) in consecutive packets, generates a Link disconnect when TMSC is not driven by the DTS. A disconnect initializes the link and consequently the cJTAG control registers. Once the control registers are initialized, the interface operating mode changes to standard mode with a TAP state of TLR. Once this state is reached, the keeper changes to a pull-up and the state remains TLR. The PRC may power down the adapter via normal power down handshakes in this state.

In the special case where a scan of the isolation or status scan path is in progress when the connection is broken, TDO will become a one (1) and it is assumed that at some point, due to the nature of these scan paths, cause an exit from the Shift_DR state. This yields the result outlined above.

TDO Not Included in Scan Packet. In the case of an OScan4 packet, the packet content is void of device output, namely TDO. In this case the interface keeper may get stuck at either a one (1) or a zero (0). The case where TMSC is stuck at a one (1) takes the TAP to the TLR state where the detection of a disconnect TMSC sequence (two scan packets generating TMS values of one) resets the link. The case where TMSC is stuck at a zero (0) causes the TAP to move to one of the following states and remain there (Shift_DR, Shift_IR, IDLE, Pause_DR, or Pause_IR). The TMSC pin may arbitrarily be driven to a one (1) in this case, with no drive conflicts when the connection is established anew.

A TS-supplied TCK requires the use of Transport Packet formats that include confirming the DTS is present. The TS drives a one (1) on the TMSC pin in state n. The DTS is required to drive the TMSC pin to a zero (0) to continue the transfer. If the connection is broken during a transport packet, the TS drives the TMSC pin to a one (1) during pin state n. The TMSC pin remains a one (1) during the pin state n+1, where the DTS would normally drive the TMSC pin to a zero (0) to continue the transfer. At the end of the transport packet, the packet terminates as if the DTS had terminated the transfer by driving the TMSC pin to a one (1) in pin state n+1. A scan packet ensues and the scenarios described in the next paragraph follow.

Once the change packet state begins, it either generates a timeout or completes normally. A timeout resets the link. A broken connection, where the keeper holds the TMSC pin at a one (1), generates a timeout. In the case where TMSC is held at a zero (0) by the keeper, the change packet completes normally, with standard or scan packet. In either case, the change packet completes. The scenarios previously described for Standard Packets, and for Scan Packets, follow.

The scenarios above assume the adapter has not been placed offline by a register write enabling a non-supported feature. If the adapter has been placed offline, it will remain offline until a soft reset or reset event occurs.

Drive a One to Initialize the Interface. The DTS needs only drive the TMSC pin continuously as a one (1) to assure the interface with a target supplied TCK initializes.

A Disconnect when the DTS Supplies TCK. The adapter state freezes when the TCK source is removed. This leaves the TS state in an unknown state. The DTS should assume that the TS state is unknown when it determines the DTS is the TCK source. In this case, the DTS uses the Hard-Reset escape sequence to reset the adapter.

A Connection while the TS is Powered. The random events that occur when the DTS and TS are physically connected may corrupt system operation, if not addressed. The cJTAG architecture tackles two pronounced corruption paradigms: Adapter state corruptibility, and System state corruptibility. Two different protection mechanisms defend against these corruption paradigms.

Debug Interface Corruptibility. Inadvertent modification of the cJTAG control registers could corrupt debug interface operation. The sequence of events needed to write a control register is a sophisticated sequence, and is unlikely to be randomly generated. This affords sufficient but not foolproof protection. A control register may be written only if the following sequence occurs: A command window is opened to control level two or three, A LTR command loads the TEMP register, and A STR command dispositions the TEMP register. This sequence must occur in order without the TLR TAP state being generated. In its simplest form, roughly a 32-bit sequence of TMS values must occur to cause a control register write.

System Interface Corruptibility. Hot-connect protection shields the system interface from unwanted stimulation by keeping the TCK to this interface off until the proper command sequence disables the firewall.

TDI and TDO Values for TAP States. The TDI, TDO data values are specified with Failsafe operation in mind. The TDI and TDO values transmitted between the DTS and TS when the interface is operated in advanced mode are chosen to maximize the occurrence of ones (1s) on the TMSC pin. This creates the TMSC values needed to generate a disconnect TMSC sequence.

With OScan7 format, TDO is generated by the TS input in all states. This provides one format where non-standard use of TDI and TDO is supported. For scan formats other than OScan7, the TDO value is generated as follows. The DTS outputs TDI as a zero (0) (nTDI=1 at the TMSC pin) and the TS outputs TDO as a one (1) for the following non-stable TAP states:

Select_DR
Select_IR
Capture_DR
Capture_IR
Exit0_DR
Exit0_IR
Exit1_DR
Exit1_IR
Update_DR
Update_IR The DTS outputs TDI as a zero (0) (nTDI=1 at the TMSC pin) and the TS outputs TDO as a one (1) within scan packets. The DTS outputs TDI as a zero (0) (nTDI=1 at the TMSC pin) and the TS outputs TDO as a one (1) for this state.

Reset Events

Five events reset the Link. These events cause initialization of the cJTAG control registers and force link operation to standard mode: Adapter POR, BCE or nTRST assertion, Hard-reset escape sequence, Link Timeout, Link Disconnect, and Adapter POR.

Adapter POR shall be asserted each time the TS adapter becomes powered. Adapter POR asynchronously sets the interface to standard mode with the TAP state set to the TLR state. It sets the cJTAG registers to their reset values. Alternately, it leaves sufficient residue so as to cause the initialization of these registers the first TCK falling edge after POR is asserted, if TCK is not running at the time POR is asserted.

BCE or nTRST Assertion

The assertion of BCE or nTRST (when implemented) causes the initialization actions as POR.

A Hard-Reset escape sequence has the same effect as the assertion of nTRST or BCE. A synchronous version of this reset is created after TCK falls following its generation. The asynchronous version is logically ANDed with TCK, allowing assertion to occur only when TCK is high. This provides for the TAP to be operational on the TCK rising edge following the detection of the hard-reset escape sequence.

A link timeout is detected when the WAIT IO state machine state is sent to the CUPD state. Since there is no interrupt present when this state is reached, the CUPD state initializes the CREG in this state on the next falling edge of TCK.

Link Disconnect

A link disconnect is detected when the TAP state reaches TLR and scan packets deliver two consecutive TMS values of one (1). The TLR state is maintained without causing a link disconnect by sending TMS value of zero (0) followed by TMS value of one (1) beginning with the first TAP TLR state, When TMS is detected as a one (1) two packets in a row, beginning with the TMS causing the TAP state to reach TLR, a Link disconnect is declared. This generates a reset event.

Three examples are provided in FIG. 232 for TLR followed by IDLE, No Disconnect, OScan6, FIG. 233 for TLR followed by Disconnect, OScan6, and FIG. 234 Immediate Disconnect OScan6 after TLR entry. A view of the reset events and their associated logic is shown in FIG. 235.

Adapter Configurations

There are three considerations for variable adapter configurations: Mandatory functions, Interoperability of adapters with different configurations, and Determining the configuration of a specific adapter.

The mandatory cJTAG functions are: All JScan scan formats, OScan6 and OScan7 formats, and All control register bits marked as mandatory and functions associated with them with the exceptions noted above (e.g., subsets of the scan format capability).

Each function that is optional also has an enable associated with it in one of the cJTAG control registers. The enable must be a one (1) for a function to be used. All optional functions can only be used when the interface is operated in advanced mode. The adapter is placed offline following a register write generating change packet when an optional function is enabled but not supported. This prevents the completion of the interrupt processing, placing the adapter offline.

A soft-reset escape is also generated with a register write to a DTS register. The soft-reset escape sequence masks the offline detection to allow interrupt processing to continue. Since the soft reset also changes the scan format to JScan0, the interrupt completes and the interface operating mode changes to standard where the adapter is back online. It is debug software's responsibility to disable the function that caused the adapter to be placed offline prior to changing the interface operating mode to advanced mode, if the debug software expects the adapter that was formerly offline to remain online. If debug software leaves an unsupported function enabled in any adapter, the adapter will immediately go off line when the register write changing the interface mode to advanced occurs.

Determining the Adapter Configuration. In advanced interface mode, the SRS command causes the device whose Link ID matches TEMP to output cJTAG status. This status provides selection information, adapter revision number, and defines the optional features supported.

This status contains:

Out[0]—Zero (0)
Out [1]—SS bit—Scan selection
Out [3:2]—SCS[1:0]—Scan selection status
Out[7:4]—Revision begins at 0000b
Out[15:08]—Supported features
Additional bits may contain custom information The read status format is shown in FIG. 236. The revision is output beginning with the LSB first. The length of the status may be extended past bit 15 to add private status bits. Should the read be more than 15-bits, a status read begins anew at a byte boundary (e.g., repeats every 15, 24, 32, etc. bits). The output bits read may be selected with the three LSBs of the scan-bit counter used to derive commands. Status is output during Shift_DR TAP states until the next Update_DR state occurs. The data register scan reading the status information will not be interpreted as an LTR or STR command. The TEMP register remains empty following this scan.

Status may be read using the following sequence:

LTR Specify device whose status is to be read
SRS Enable status read, CREG SOA bit is set to one (1)
DR_Scan Data register scan to get status Before exploring Link configurations allowed by the cJTAG architecture, one must first define the DTI interface in its least common denominator form, a "port". A "port" is defined as a combination of TCK, TMSC, and optionally TDI, and TDO signals that provide debug communication with one or more devices. A port connects one or more legacy JTAG or cJTAG enabled devices to a DTS. Ports may share one or more of the port signals with another port. This definition is used throughout is document.

The cJTAG architecture comprehends the idea of multiple ports and operations spanning ports. cJTAG provides a framework for the DTS to select and de-select ports, synchronize operations across ports, or scan through multiple ports at one time or at the same time. A DTS may support one or more ports.

The TS may present the DTS with one or more ports, with each port being a separate link. Ports may be operated separately or, in case of global operations affecting more than one port, in parallel. The cJTAG architecture provides for port selection on the DTS side of the interface as part of the configuration change mechanism (sequence). Other cJTAG behaviors are friendly to both global operations affecting more than one port and operations targeting only one port. This section covers port basics and describes three common port configurations.

Ports shall follow this rule set:

Devices that share a port will have the same system VDD control, e.g., all devices may have their VDD removed or turned on. This will not be done separately.

Devices sharing a port must have the same I/O voltage

Devices that keep their interfaces powered may be used together on a port

A complete power down of any device on a port requires a cold start of the devices connected to the port upon power-up A complete power down is defined as a power down sufficient to make the device incapable of performing debug communication with the DTS or creating an incompatibility with other devices connected to the same port.

Ports are expected to behave as follows:

Ports that have the same clock get a command broadcast to them at the same time

Only selected ports respond to the command broadcast

Only selected devices respond to command broadcast

Debug software manages port and device selection

Port and device selection may be isolated within the debug software hierarchy so as to hide these port/device selection activities from these drivers The cJTAG architecture supports three simple port types, each supporting one or more adapters: Narrow Star (2-pin), Wide Star (4-pin), and Series (4-pin). More sophisticated port types are also supported. These are covered as part of multi-port operation covered in the explanation of JScan.

Series and Wide-Star ports require devices with cJTAG wide interfaces. Narrow-Star ports utilize devices with either narrow or wide-cJTAG interfaces. Star and Series ports are contrasted in FIG. 2A.

A series port allows a mix of cJTAG and JTAG capable devices while star ports require all cJTAG capable devices. These port types are created by connecting adapter pins as shown in FIG. 2B. Adapters are connected without glue logic. Note that each of the port types may be operated as Narrow Star configuration when all devices connected to a port are cJTAG capable, i.e., has a TMSC pin. Packaging technologies, such as stacked chips or dies and multi-chip modules (MCMs), are naturally supported with these ports. A specific device may contain one or more adapters connected in a manner compatible with one of the port types. A port type is supported if the device connectivity meets the requirements outlined in FIG. 237.

BDX and CDX are supported by star configurations when advanced protocols are used. These transactions are between the DTS and a single adapter. Scan transactions are supported in all configurations. Scan transactions are between the DTS and one or more adapters. The flexibility of a wide-adapter interface allows the adapter to be connected in any one of the port configurations listed in FIG. 237. Since a wide interface may be operated as a narrow interface, each of the above link configurations may be operated in a narrow-star configuration with the TDI and TDO pins used for other test or debug functions. This is illustrated in FIG. 238.

The Wide-Star port may be operated as a Narrow Star, with the TDI and TDO connections assigned to other debug functions. See FIG. 2B. The TDO function is disabled when an advanced format is used, assuring this pin may be used by any number of adapters for another debug function. These pins may be used for instrumentation, cross triggering between chips, trace or other functions.

The Series port may be operated as a Narrow-Star port, with the TDI and TDO connections assigned to other debug functions, provided each device in the series configuration is cJTAG enabled. This change in port operation does not offer the same flexibility as a Wide-Star port operated as a Narrow-Star port, but meaningful configurations are available.

An example of a Series and a Wide-Star port operated as a Narrow-Star port is shown in FIG. 2C. The port type may be switched between Narrow Star and the other port type as the DTS software desires. This assumes the DTS supports a single port supporting multiple port types.

The scan path for a port is determined by the port type and the system scan path connected to each adapter. A conceptual view of the adapter scan path is shown in FIG. 239. The TDO pin sources scan data and the TDI pin receives data with JScan scan mode formats, while TMSC sources and receives data with scan formats other than JScan. All data related to the cJTAG control register is derived by the number of clocks spent in the Shift_DR TAP state independent of the scan format. Note that Status and the Isolation scan path are read only. The adapter scan paths are controlled directly by JScan0 and JScan1 scan formats. The adapter scan path is controlled by adapter selection for other scan formats and special actions such as status reads and Link ID assignment.

The affect of JScan formats on the scan path is shown in FIG. 240. The affect of OScan and SScan formats on the scan path is shown in FIG. 241.

The adapter may be connected to a variety of system TAP configurations as shown in FIG. 242. These examples are representative of the system path shown in FIG. 239. Virtually any system scan path topology is supported.

A series port is a replicate of the legacy JTAG series configuration with additional functionality. Legacy JTAG and cJTAG devices with wide interfaces may be mixed in a series configuration shown in FIG. 243. This Figure emphasizes the scan-path configurability afforded scan formats supporting a series port. Each adapter in the series path may be used to reduce the IR and DR scan paths through a device to a single bit (Super Bypass).

The JScan0, JScan1, and JScan3 scan formats support the operation of series ports. These formats may be used with a mix of legacy JTAG and cJTAG devices. The use of the JScan2 scan format is not recommended with a Series port, as the adapter selection mechanism associated with this format and management of TDO is not compatible with a Series port. With a series port, each cJTAG adapter and legacy JTAG device is identified by its position in the Series port scan path. With a series port, each cJTAG adapter may be selected or de-selected by the use of the JScan0 and JScan1 scan format or the use of the series selection mechanism described later in regard to Selecting an Adapter.

A wide star port is similar to a legacy JTAG star configuration, only a built-in selection mechanism is included.

Legacy JTAG and cJTAG devices may not be used in a wide-star configuration as shown in FIG. 243. The TCK, TMSC, TDI, and TDO pins of all adapters associated with the port are connected in parallel. Care must be taken to use the JScan2 scan format with this format as it prevents drive conflicts on TDO when multiple adapters are selected. TDO drive is permitted with this scan format when the SCS field of the Scan Control register is "10" and SS bit of the same register is '1'. This restricts TDO drive to the selected adapter, provided only one adapter is selected. See FIG. 244 for a wide-star port scan path, one adapter selected, and FIG. 245 for a wide-star port scan path, more than one adapter selected.

The JScan0, JScan1, and JScan2 scan formats support the operation of wide-star ports. The JScan3 format cannot be used with this port type as it permits drive conflicts. The series selection mechanism for the JScan3 format is of no value with a Wide Star port as all adapters respond identically.

With a Wide-Star port, each cJTAG adapter is identified by a Link ID assigned to the adapter. Commands are associated with an adapter using the Link ID. Link IDs are assigned as part of Link Start-up. With a Wide Star port, each cJTAG adapter may be selected or de-selected by the use of the JScan0 and JScan1 scan format or the use of the series selection mechanism.

A narrow-star port is similar to a legacy JTAG star configuration, only a built-in selection mechanism is included and all data and control is sent between the DTS and TS over the TMSC pin. Legacy JTAG and cJTAG devices may not be used in a narrow-star configuration as shown in FIG. 243. The TCK and TMSC pins of all adapters associated with the port are connected in parallel. Scan transactions using the JScan formats use a one (1) for data associated with IR scans and a zero (0) for data associated with DR scans. The use of an advanced scan format (OScan or SScan) is required to transfer scan data between system TAPs and the DTS. The star selection mechanism is used exclusively for this port type. See FIG. 246 for a narrow-star port scan path, one adapter selected, and FIG. 247 for a wide-star port scan path, other than one adapter selected.

The JScan0, JScan1, all OScan, and all SScan scan formats support the operation of narrow-star ports. The JScan2 and JScan3 format cannot be used with this port type as these scan formats rely on TDI and TDO for data input and output. The JScan0 and JScan1 scan formats may be used to generate adapter commands but these scan formats may not be used to move scan data between the DTS and system TAPs.

With a Narrow-Star port, each cJTAG adapter is identified by a Link ID assigned to the adapter. Commands are associated with an adapter using the Link ID. Link IDs are assigned as part of Link Start-up. More on Link ID assignment may be found later in Selecting an Adapter. With a Narrow-Star port, each cJTAG adapter may be selected or de-selected by the use of the JScan0 and JScan1 scan format or the use of the series selection mechanism.

Link Start-Up

Link operation has three distinct stages: Initialization, Activation, and Utilization. The DTS software readies the Link for use with initialization and activation stages of operation. These stages are collectively called "Link start-up". Link start-up supports Plug and Play operation of the link. Debug software may use adapter facilities to initialize the Link, determine the port type, and make the link operational. DTS software communicates only with the adapter during the initialization and activation stages. It communicates with components connected to the adapter in the utilization stage. This stage handles items such device identification and determining the TAPs connected to the adapter.

The initialization stage places the port in a known state and determines the port type. The activation stage includes the assignment of Link IDs in the case of star port types and the determination of the precise mix of cJTAG and legacy JTAG devices in the case of a series port type. The utilization stage uses scan, BDX, or CDX transactions to communicate with components connected to the adapter. This section covers the initialization and activation stages of Link operation.

The DTS software must initialize the link when a DTS to TS connection is established. It may also initialize the link at any other time it deems appropriate. When initialization is completed, the DTS knows the port types supported and has established miscellaneous port operating characteristics, such as power-down behavior. Link initialization described in this section assumes a DTS interface with TCK, TMSC, TDI, and TDO. The TDI and TDO pins may be left unconnected. The TDO DTS pin must operate in a manner that forces a one (1) or a zero (0) data a when this pin is left unconnected. The connectivity to each of the three port types is shown in FIG. 2B. The use of this initialization procedure is not required, however. For instance, it is not applicable to a DTS that supports only a Narrow-Star port.

Link initialization is a four step procedure:

TS Adapter TAP state synchronization to DTS

Target System TAP state synchronization to adapter

Miscellaneous setup

Determining the port type

This procedure is independent of the port type or the state of the TS adapters connected to the port.

Adapter TAP State Synchronization. The DTS must assume an unknown adapter interface state when it begins the initialization procedure. The unknown adapter state may be created by POR or be anything else, e.g., the state that remains when the DTS to TS connection is broken. The synchronization step of the initialization procedure synchronizes the DTS and TS adapter states. The adapter Link interface may be in one of the following states at the beginning of the initialization procedure:

TS sourced TCK:
- Advanced mode—interface powered (in a stable state with TMSC low via keeper)
- Standard mode—interface powered (already initialized to JTAG in TLR state)
- Standard mode—interface un-powered (already initialized to JTAG in TLR state)

DTS sourced TCK:
- Advanced mode—interface powered (in an unknown cJTAG state)
- Standard mode—interface powered (in an unknown TAP state)
- Standard mode—interface un-powered (already initialized to JTAG in TLR state)

The DTS determines if the TS is the TCK source and then uses one of the synchronization sequences shown below. The DTS knows little about the port prior to initialization. It does not know whether the port is a series, wide star, or narrow-star type, nor does it care. It also does not know whether the interface is powered or un-powered, nor does it care. The DTS merely assumes the interface may be powered down following one of the synchronization steps outlined below. The sequence is chosen based on the TCK source.

For TS TCK source:

| | |
|---|---|
| - Drive TMSC to a one (1) for at least 16 TCK periods | -- Assure standard mode |
| - Drive TMSC to a zero (0) for at least 1.5 msec | -- Power up the interface |
| - Proceed to the next step | -- TAP state is now Idle |

For DTS TCK source:

| | |
|---|---|
| - Drive TCK to a one (1) | -- Assure no TS TMSC drive |
| - Drive TMSC to a zero (0) for at least 1.5 msec | -- Power up the interface |
| - Generate hard-reset escape sequence | -- TAP state is now Idle |
| - Drive TMSC low | -- Generate TMS = 0 state |
| - Start TCK toggling | -- Adapter initialized |
| - Proceed to the next step | -- TAP state is now Idle |

Both sequences create the TAP state of Idle in a cJTAG adapter or a legacy JTAG interface. Both sequences are compatible with legacy devices, standard and advanced modes in a wide or narrow cJTAG adapter, and with powered and un-powered interface states.

System TAP State Synchronization After adapter synchronization the scan format is either JScan0 or JScan1. With JScan0, the adapter provides legacy JTAG operation and is transparent to Link operation, as long as the scan format remains JScan0. With JScan1 format, the TCK signal supplied to the TAPs connected to the adapter is held at zero (0). The TAPs connected to the adapter may be in the TLR state, while the adapter TAP state is Idle. The TAP state of adapter and system TAP states must be synchronized before scan transactions with the system may proceed. This synchronization step sets the scan format to JScan0 and moves to the TLR TAP state using the sequence shown below:

| | |
|---|---|
| 1) TLR state | -- Create inert instruction |
| 2) Data register scan of zero bits (ZBS) | -- Open command window |
| 3) Data register scan of zero bits (ZBS) | -- Control level two |
| 4) Data register scan of zero bits (ZBS) | -- Inhibit TDO drive with control level three |
| 5) LTR command – scan count = JScan0 | -- No bus conflict while sending commands |
| 6) STR command – scan count = SSF cmd . . . | -- Set scan format to JScan0 |
| 7) TLR state | -- Allow TAP synchronization |

Since this sequence is performed with an inert instruction generated by the TLR state, it is treated as a NOP by legacy JTAG devices. The sequence is the same for all port types.

This sequence synchronizes the system and adapter TAP states as shown in FIG. 248. Note the TCK-to-system TAPs turn on coincident with the Select_IR state in the example shown. The adapter and system TAP states are guaranteed to be the same state (synchronized) when they both reach the TLR TAP state as shown. After the sequence completes, the instruction register of all TAPs connected to all adapters contain an inert instruction.

Miscellaneous Setup. Before any meaningful data transfers are attempted outside the command window, various operating parameters, such as interface power down options, clock edge used for data sampling, communication of the TCK source, and parameters such as delay are specified before specifying an advanced format, must be addressed. This assures the Link-interface electrical behavior will be compatible with the DTS when a switch to advanced mode occurs.

| | |
|---|---|
| 1) TLR state | -- Create inert instruction |
| 2) Data register scan of zero bits (ZBS) | -- Open command window |
| 3) Data register scan of zero bits (ZBS) | -- Control level two |
| 4) Data register scan of zero bits (ZBS) | -- Inhibit TDO drive with control level three |
| 5) LTR command – scan count = 0xC + DL(1:0) | -- Sub command + Delay value |
| 6) STR command – scan count = SCA cmd. | -- Load Delay |
| 7) LTR command – scan count = 0x8 + PC(1:0) | -- Sub command + Power control value |
| 8) STR command – scan count = SCA cmd. | -- Load Power Control |
| 9) LTR command – scan count = 0x4 + CC(1:0) | -- Sub command + Clock Control value |
| 10) STR command – scan count = SCA cmd. | -- Load clock control |
| 11) LTR command – scan count = 0x3 | -- Clear scan and BDX selections |
| 12) STR command – scan count = SCA cmd. | -- Clear star pre-selections |
| 13) STR command – scan count = SCA cmd. | -- Close command window |
| 14) IDLE state | |

After miscellaneous setup, the following interface characteristics are specified:

| | |
|---|---|
| - Delay | - delay between advanced mode packets |
| - Power control | - link power behavior |
| - Clock control | - TCK source specified, advanced mode data rising or falling edge sampling |
| - Transport select | - No adapter selected for BDX |
| - Star pre-selects | - No adapter selected for scan |

Determining the Port Type. Debug Software may automatically ascertain the port type by stimulating the DTS port in a specific manner. Without knowing anything about the configuration, the port type and existence of legacy JTAG devices may be determined beginning from the Idle TAP state created by miscellaneous setup. A separate test is used to determine if each of the port types is supported. These tests assume the Link interface connectivity shown in. It is recommended these tests be run in the following order: Wide Star, Series, and Narrow Star.

Wide Star. The following two-pass test sequence determines whether the port supports Wide-Star operation. In Pass 1, TDO drive is disabled by steps 1 and 2. The firewall is installed in steps 3 and 4, bypassing cJTAG enabled devices and having no affect on legacy devices. The command window is exited with the cJTAG enabled devices bypassed with the Super Bypass bit. Since TDO drive is inhibited before a Shift TAP state is generated, there are no bus conflicts. The command window is exited after disabling the firewall.

With TDO drive enabled after the command window is closed, bus conflicts are avoided in a wide-star configuration. Since the Super Bypass bit is captured as a one (1) and all devices share TDI, the TDO value of all adapters will be the same during shift operations, once the firewall is enabled. The scan chain is filled with all ones (1s) with a long scan. This is done so that a series-port can be distinguished from a Wide-Star port. Once the scan path is filled with ones (1s), a subsequent one-bit DR scan zero occurs and ends in Pause_DR TAP state. If the scan path is merely a one-bit bypass, then the first bit is returned as a one (1). A scan of one bit with a data value of zero (0) is performed again. If data is returned as a zero (0), a one-bit scan path has been detected.

Pass 1:

| | |
|---|---|
| 1) Data register scan of zero bits (ZBS) | -- Open command window |
| 2) Data register scan of zero bits (ZBS) | -- Control level two |
| 3) Data register scan of zero bits (ZBS) | -- Inhibit TDO drive with control level three |
| 4) LTR command – scan count = JScan1 | -- No bus conflict while sending commands |
| 5) STR command – scan count = SSF cmd. | -- Enable firewall to bypass device |
| 6) STR command – scan count = SSF cmd | -- Exit command window |
| 7) Idle state | -- Change adapter selection |
| 8) DR scan of ones (1s), end in Pause_DR | -- Fill chain with all ones (1s), many bits long |
| 9) DR scan of a single zero (0) | -- Export a single bit, expect a one (1) |
| 10) DR scan of a single zero (0) | -- Export a single bit, expect a zero (0) |

In Pass 2, TDO drive is disabled by steps 1, 2, and 3. Two zeroes (0s) are again scanned. This time the scan chain should supply no data, as TDO output is blocked by the command level three. Since the command window is not exited before the scans are performed, TDO remains off. Data is not passed from TDI to TDO as before.

Pass Two:

| | |
|---|---|
| 1) Data register scan of zero bits (ZBS) | -- Open command window |
| 2) Data register scan of zero bits (ZBS) | -- Control level two |
| 3) Data register scan of zero bits (ZBS) | -- Inhibit TDO drive with control level three |
| 4) DR scan to fill data with all ones (1s) | -- Scan in command window, TDO HI-Z |
| 5) DR scan of one bit with a value of zero (0) | -- Scan in command window, TDO HI-Z |
| 6) DR scan of one bit with a value of zero (0) | -- Scan in command window, TDO HI-Z |

The decision as to whether the port operates as wide star is made as follows:

If (no changes in data value)

{A wide-star configuration has not been found}

Else if (data-pass one does not find a one-bit scan path)

{A wide-star configuration has not been found}

Else if (data-pass two finds data can be passed through the path)

{A wide-star configuration has not been found}

Else

{A wide-star configuration has been found}

Series. A two-pass test sequence determines whether the port supports a Series operation. Devices are disabled with the firewall as in the Wide-Star test sequence. A long scan of all ones (1) followed by a long scan of all zeroes (0s), provides the scan-chain length. The process is repeated, this time with the firewall disabled. A second scan-chain length is determined. The two scan-chain lengths are compared to determine if any cJTAG enabled devices are present in the path.

In Pass 1, TDO drive is disabled by steps 1, 2, and 3. The firewall is enabled by steps 4 and 5. An inert instruction is created with the TLR state in step 6. The scan-chain length with an all ones (1s) DR scan followed by an all zeroes (0s) scan in steps 7 and step 8.

Pass 1:

-continued

| | |
|---|---|
| 1) Data register scan of zero bits (ZBS) | -- Open command window |
| 2) Data register scan of zero bits ZBS) | -- Control level two |
| 3) Data register scan of zero bits ZBS) | -- Inhibit TDO drive with control level three |
| 4) LTR command – scan count = OScan1 | -- No bus conflict while sending commands |
| 5) STR command – scan count = SSF cmd. | -- Set Firewall to bypass device |
| 6) STR command – scan count = SSF cmd. | -- Close command window |
| 7) Idle state | -- Change adapter selection |
| 8) DR scan to fill data with all ones (1s) | -- Fill chain with all ones |
| 9) DR scan of zeros (0s) | -- Determine scan chain length for Pass 1 |

In Pass 2, TDO drive is disabled by steps 1, 2, and 3. The firewall is enabled by steps 4 and 5. An inert instruction is created with the TLR state in step 6. Determine the scan-chain length with an all ones (1s) DR scan followed by an all zeroes (0s) scan.

Pass Two:

| | |
|---|---|
| 1) Data register scan of zero bits (ZBS) | -- Open command window |
| 2) Data register scan of zero bits (ZBS) | -- Control level two |
| 3) Data register scan of zero bits (ZBS) | -- Inhibit TDO drive with control level three |
| 4) LTR command – scan count = OScan0 | -- No bus conflict while sending commands |
| 5) STR command – scan count = SSF cmd. | -- Set compliant standard mode |
| 6) STR command – scan count = SSF cmd. | -- Close command window |
| 7) Idle state | -- Change adapter selection |
| 8) DR scan to fill data with all ones (1s) | -- Fill chain with all ones (1s) |
| 9) DR scan of zeros (0s) | -- Determine scan chain length for Pass 2 |

The JTAG Series decision is made as follows:

If (no data)

{A JTAG Serial configuration has not been found;}

Else if ((first length=second_length)

{A JTAG Serial configuration with no cJTAG and all legacy devices has been found;}

Else if (first length*32=second_length)

{A JTAG Serial configuration with cJTAG and no legacy devices has been found;}

Else

{A JTAG Serial configuration with a mix of cJTAG and legacy devices has been found;}

Narrow Star. With an advanced format specified and Link IDs invalidated, an MScan format is used with a one bit scan path in each adapter. A data pattern is circulated through the one-bit scan path to confirm the existence of a Narrow-Star port type.

Pass 1:

| | |
|---|---|
| 1) Data register scan of zero bits (ZBS) | -- Open command window |
| 2) Data register scan of zero bits (ZBS) | -- Control level two |
| 3) Data register scan of zero bits (ZBS) | -- Inhibit TDO drive with control level three |
| 4) LTR command – scan count = 0x2 | -- Specify clear star pre-selections |
| 5) STR command – scan count = SCA cmd | -- Clear star pre-selections |
| 6) Idle state | -- Change adapter selection |
| 7) LTR command – scan count = OScan7 | -- Load OScan7 scan format |
| 8) STR command – scan count = SSF cmd | -- Set Advanced mode |
| 9) STR command – scan count = 32 | -- Close command window |
| 10) DR scan of 0xAAAAAAAA | -- Scan Data of AAAAAAAA, return 0x55555555 |

The Narrow Star decision is made as follows:

If (scan data is returned as 0x55555555)

{A cJTAG port has been found;}

Else

{A cJTAG port has not been found;}

Activation, Choosing a Port Type. Once the DTS software has determined the port types supported, it configures the port to the desired type and sets and adapter scan format compatible with the port type. The series pre-selection bit is set to the selected state when the adapter is reset. Since determination of the port types supported does not change these bits, a series port is available for use with all adapters selected should the DTS software elect to use the port as a Series port.

If a star port type is to be used with more than one adapter, Link IDs must be assigned in order to communicate with a single adapter one at a time. Reset assigns a Link ID of zero and sets the Star selection bit to the selected state. It also sets PSCS and SCS values to "00", recording that Link IDs have not been assigned. The MScan packet type is forced, if scan transfers are attempted when the SCS value is "00", as there is a potential for multiple adapters sourcing TMSC. This allows link operation without Link ID assignment, if one device is connected to the port. If multi-device operation of the port is required, a command sequence is used to invalidate the Link IDs. Link IDs are invalidated, clearing all pre-selections. The TAP Idle state changes the scan selections to de-selected (SS=0). Link ID assignment may then follow.

Link IDs are assigned sequentially to adapters that have invalid Link IDs. During the Link ID assignment process, each device with an invalid Link ID participates in a process similar to musical chairs. This is called device isolation. This process singles out one device for Link ID assignment. Command sequences are used to both isolate a device and assign a Link ID. The isolation process is deterministic. Two successive isolations will isolate the same device. Two successive cold-starts will yield the same ID assignment. Once a device is assigned a Link ID, it disqualifies itself from participating in any further Link ID assignment until its Link ID is invalidated by a command sequence or initialization event.

Although the Link ID is only 4-bits, supporting 16 devices, link ID assignment processes may determine the exact number of adapters connected to the port even if the number is greater than 16. Debug software repeats the Link ID assignment until it decides: No devices are responding to Link ID assignment, All devices have been assigned link IDs, and A maximum of 16 Link IDs is assigned.

If the maximum of 16 Link IDs are assigned, debug software may continue to assign the same ID to each additional device isolated until it finds no more devices. Any cJTAG devices that do not have valid Link IDs cannot be selected and are offline after the assignment of Link IDs. Using this process debug software may determine the number of devices connected to a port but is not capable of selecting adapters that are not assigned Link IDs.

At any point, the debug software may invalidate either individual link IDs or all Link IDs. It may then reinitiate the Link ID assignment process. In the case where multiple devices return the same device ID, the Node ID differentiates these devices and correlates physical devices with Link IDs.

It is possible to skip Link ID assignment, if only one device is connected to a port as devices are initialized with a Link ID of zero (0). This causes the use of MScan packets in advanced mode. Should more than one device be connected to the port, the MScan packets will prevent drive conflicts. Link ID assignment is required to use OScan, SScan, BDX and CDX packets/formats.

After POR or another Link Reset:

Each device is assigned a Link ID of zero (0) (a valid ID)

Scan status indicates initialization (SCS="00"), blocking Link ID assignment

No devices are selected

Force the use of the MScan format for scan transactions when an advanced format is used Disables BDX and CDX transactions until Link IDs are assigned Debug software has two options:

1) Assume there is only one device connected to the port:

Specify the operating mode

Select device ID zero (0)

Begin operation using the MSCAN scan format

2) Assume there may be more than one device connected to the port:

De-select all devices

Invalidate Link IDs

Assign Link IDs

Specify the operating mode

Select the device ID of interest

Begin operation

Option 1 restricts the scan format to MSCAN as this scan format is always forced when SCS[0] is a zero (0) (initialization status or no devices selected). This prevents drive conflicts on TMSC should there be more that one device connected to the port and debug software has selected Option 1. It is recommended that Option 2 be used by debuggers. This assures all devices connected to a port are identified and labeled. Option 1 may be used in a chip validation and verification environment, where one chip is being modeled.

Once Link IDs are Invalidated and Reassigned. Invalidation of all Link IDs, while the scan status indicates initialization (SCS=00"), sets the SCS status to no devices selected (SCS="01"). From this point onward until the next initialization event sets the scan status to initialized (SCS="00"), de-selecting all devices allows Link ID assignment, provided other criterion are met. Only those devices with invalidated Link IDs participate in Link ID assignment. The ILID command provides for invalidating all or one Link ID.

Assignment. Link ID assignment is a series of commands that assigns a Link ID to an adapter. Link ID assignment requires: De-selecting all adapters, Invalidating Link IDs after an initialization event, Isolating an adapter with an no assigned Link ID, and Assignment of a Link ID to the isolated adapter. If Link ID assignment is attempted without invalidating all Link IDs, it is ignored and causes no side effects.

All devices are de-selected using a SCA command sequence, followed by the IDLE state. De-selection is performed by: Opening a command window (two or three zero bit scans), De-selecting all devices, LTR (001x), STR (SCA), and TAP state of IDLE. The LTR/STR portion of this sequence is performed within the command window. The TAP state of Idle may occur while the command window is open or after the command window is closed. If de-selection is part of Link ID assignment, the TAP IDLE state is performed within the command window. This step may be skipped after an initialization event as all devices are de-selected after an initialization event.

Link IDs are invalidated using a LTR command followed by an ILID STR command. This command sequence may be used to invalidate either one or all Link IDs. This command always invalidates the Link ID of the device specified by the LTR command operand (TEMP register). It invalidates all Link IDs, if no devices are pre-selected (PSCS[1]="0"). If debug software desires to invalidate a specific Link ID, it is good practice to pre-select this device with this Link ID and then invalidate its Link ID. Invalidating any Link ID clears all pre-selections and sets pre-scan status to "no devices pre-selected" (PSCS="01").

All Link IDs may be invalidated the first time after power up using the following sequence: Opening a command window (two or three zero bit scans), and Invalidate Link ID: LTR (0000), and STR (ILID). This invalidates all Link IDs as they are all assigned a Link ID of zero (0) after power up.

Link IDs may be invalidated at any time using the following sequence: Opening a command window (two or three zero bit scans), Clear all pre-selections with: LTR (0010b), and STR (SCA), and Invalidate Link ID: LTR (0000b) and STR (ILID).

A specific Link ID may be invalidated using the following sequence: Opening a command window (two or three zero bit scans), Clear all pre-selections with: LTR (0010), and STR (SCA), and Invalidate Link ID: LTR (abcd), and STR (ILID). The Link ID of the device with Link ID abcd is invalidated. If this sequence is used after an initialization event and abcd is 0, all Link IDs are invalidated.

Assigning a single Link ID is a two step process: Specify the Link ID to be assigned with a LTR command, Isolation and assignment of this Link ID with a SLID STR command, and Assign the Link ID to a single device using a data register scan of 67 bits.

The isolation logic outputs the Device and Node ID supplied to the adapter. This isolation value is compared with the value supplied by other adapters. The adapter whose output is never a one (1) while another adapter's output is a zero (0) is isolated for Link ID assignment. A command conveys the Link ID to be assigned with the Link ID accepted only by the isolated adapter. There will be only one adapter isolated if the combination of the Link and Node ID is unique for every adapter. The Node ID provides a means for identifying a device when two devices have the same device ID. This value should be latched by chip POR from pin values and presented to the adapter.

The isolation pattern is output during the Shift DR TAP state, provided no devices are selected. Each device on a port outputs its isolation pattern. Since MScan packets are used when no devices are selected, the isolation patterns of all competing devices are Wire-ANDed at the shared TMSC pin. Each device not only outputs data, it inputs the Wire-ANDed data and compares it to the data it has just output. If a mismatch is detected, the device is disqualified and sent to the sidelines with an "Invalid and Not Isolated" state. It retains in this state until a future contest begins with the next Capture_DR state. As the contest progresses, more and more devices are disqualified. If each device outputs a unique pattern and the contest is long enough to generate a unique pattern from each device, a single device becomes the winner. This device is the winner of the contest, as it is the only device in the "Invalid and Isolated" state.

The isolation pattern is not a conventional scan path with an input and output. It is an output-only value that repeats every 32 bits. It is the data source for TDO when: A command window is open, and No devices are selected (SCS[1:0]=01). The pattern is constructed from concatenating elements common with the JTAG IDCODE (Manufacturer and Part Number). The Manufacturer code is placed in bits 15 through 01 and Part Number in bits 27 through 16 with the 4-bit Node ID in the MSBs and a zero (0) LSB as shown in FIG. 249. A device that does not support a node ID sets the Node ID to all ones. This value is presented to the adapter from the chip through the IDs interface. If multi-drop operation is not supported, the 32-bit isolation pattern is output as 32 zeroes (0s).

Data Register Scan. Debug software isolates a device with a data register scan 67 bits in length, ending in the Pause_DR state. The data register scan has the following attributes:

The Capture_DR state sets the Link ID to "Invalid and Isolated" if the Link ID is "Invalid and Not Isolated"

Each device with "Invalid and Isolated" Link ID outputs one bit from the isolation scan path each Shift_DR state Each device with a valid Link ID or Link ID marked as "Invalid and Not Isolated" generates all ones data output. This is the equivalent of no participation. A device with a valid Link ID or Link ID marked as "Invalid and Not Isolated" can however assert "not ready" if required Each device samples the Wire-ANDed data created at the TMSC pin and compares the sampled data to the data that it supplied to the TMSC pin for each shift state If the comparison is TRUE, the Link ID remains "Invalid and Isolated"

If the comparison is FALSE, the Link ID is it changed to "Invalid and Not Isolated"

Only Link IDs that are "Invalid and Isolated" are affected by the comparison and remain contestants.

This processes continues until all 67 bits are scanned and the Pause_DR state is reached Once the scan of 67 bits has completed and the TAP state is a stable state, the DTS software has input the Wire-ANDed data and may interpret the data returned by the scan as follows:

All ones—No device has been isolated (there have been no players)

Otherwise—A device has been isolated (there have been players)

First 32-bit word (bits 31:00) is the arbitration word (merged isolation patterns of all devices connected to the port and participating)

Second 32-bit word (bits 63:32) is the isolation pattern

If all ones (1s) are returned, there is no Link ID assigned when the Update_DR TAP state is reached. Otherwise, the Link ID in the TEMP register is assigned to the isolated device when the Update_DR TAP state is reached.

The second word (and subsequent words, if scanned) is returned as shown in because the arbitration is complete after the first 32-bits of the scan. Since the isolation pattern is output every 32 bits, the second word is not modified by arbitration and it is returned as the isolation pattern. If the first and second words are returned as non zero and they are the same, debug software may assume the last device has been isolated. If these words are returned as all ones (1), no devices have been isolated. The data provided by the last three bits the beyond 64 are ignored as this bit count creates the SSF command after the arbitration is completed and the IDs read.

Assigning Link IDs 2 through 16. The sequence outlined in Assigning a Single Link ID, may be repeated until a maximum of 16 Link IDs are assigned. Link IDs may be assigned in any numerical order. Isolation proceeds by Manufacturer.

More Than Sixteen Devices Isolated. The DTS may isolate more than sixteen devices, if they exist. Once sixteen devices have been assigned Link IDs, additional devices may be located, if all remaining devices are assigned an ID.

Duplications will exist but this allows the isolation process to continue. If more than 16 devices are isolated, the Link ID assignment may be repeated in its entirety with the debugger taking whatever actions it deems necessary.

TAP State Actions. The Link ID assignment actions taken in various TAP states are summarized in FIG. 250.

Sharing a Single Link ID. The Link ID assignment process described to this point assumes the control level is two, with devices outputting the isolation pattern. A Link ID may be shared, if the control level is three when Link ID assignment occurs.

Sharing a Link ID assumes:

The adapter of interest has an invalid Link ID (possibly all adapters share the same ID)

Link ID assignment occurs using control level three, blocking device output

The isolation pattern of the adapter to be selected has been determined previously, possibly through the link assignment process using a control level of two The DTS is capable of outputting an isolation pattern as though it is an adapter The DTS outputs the isolation pattern of the adapter that is to be assigned a Link ID as the adapter's surrogate.

The Link ID assignment process occurs just as with control level 2. The isolation pattern generated by the DTS is the only value generated. The adapter of interest is isolated as its isolation pattern matches the pattern output by the DTS. Any other adapter with an invalid Link ID does not match the isolation pattern. The Link ID is assigned to the adapter of interest. Although the adapter operation permits this, the key to sharing a single Link ID amongst multiple adapters is a DTS that can output an isolation pattern as an adapter's surrogate Link ID assignment may be performed before or concurrent with other operations performed by commands. Once a device is assigned a Link ID, it may be selected for scan or BDX. All scan selections must be cleared before additional link IDs may be assigned.

Once the Link assignment phase is completed, debug software establishes steady state operation by specifying the scan format (JScan or OScan) and selecting a device for communication and then closes the command window. It may desire to change scan formats to take advantage of certain optimizations targeting fast downloads, depending on the function it wishes to support with the interface. It may change interface formats and scan formats as desired.

Selecting an Adapter

Adapter selection is a two-step process. Adapter selections change when the adapter TAP state moves from either of the Update states to the Idle state. The pre-selection information is developed before the TAP IDLE state is reached using the JScan0 scan format, the JScan1 scan formats, or star or series pre-selection bits managed by commands. The pre-selection information is used to select and de-select adapters when the TAP state reaches Idle. There are four JTAG pre-selection choices:

| | |
|---|---|
| Selected | - forced by JScan0 format |
| Not selected | - forced by JScan1 format |
| Star pre-selection | - managed using the MSS and SCA commands |
| Series pre-selection | - managed using the SRS command |

Selections take effect immediately upon entering the IDLE state. New selections are valid the first IDLE TAP state following their posting and thereafter until the pre-selection information is changed and another IDLE TAP state follows. A selection mechanism is shown in FIG. 251 for a star versus serial scan selection.

Commands such as MSS, SCA, SSF, where the register write is followed by a TAP Idle state, affect the device selection upon entry into the TAP Idle state. The use of either the JScan0 or JScan1 scan formats does not affect the series and star selection bits. It is important to note that all selection changes, including those that are a result of scan format changes, are invoked only when entry into the Idle TAP state occurs.

JScan0 or JScan1 Scan Selection. An SSF command that changes the scan format to either JScan0 or JScan1 causes selection or de-selection of the adapter upon entry into the Idle TAP state following the register write accompanying the SSF command. Enabling the firewall with a format change from JScan0 and JScan1 is shown in FIG. 252. Since the register write is followed with the Idle TAP state, the system TAP state remains Idle once the firewall is enabled.

A format change from JScan1 and JScan0 is shown in FIG. 253. Since the register write is followed with the Idle TAP state, the system TAP state transitions to the Select_DR TAP state synchronous with the adapter TAP state once the firewall is disabled A format change from JScan0 and JScan1 is shown in FIG. 254 with a delayed IDLE state. Since the register write is followed with the Select_DR TAP state, the system TAP state remains Select_DR once the firewall is enabled.

A format change from JScan1 and JScan0 is shown in FIG. 255 with a delayed IDLE state. Since the register write is followed with the Select_DR TAP state, the system TAP state transitions to the Capture_DR TAP state synchronous with the adapter TAP state once the firewall is disabled.

Series pre-selection is managed using the SRS command while the scan format is any JScan format. The SRS command sets the SOA bit in the Scan control register. The SOA bit designates the following DR scan as conveying series selection information via the Super Bypass bit in the adapter. The SOA bit may remain active only if a command window is open. This is shown in FIG. 256 for a series selection change, immediate use.

The series pre-selection bit (PS[0]) is loaded with the value of the Super Bypass bit delivered by a data-register scan upon entry into the Update_DR state. This occurs when the scan format is any JScan format and the SOA bit is true. The following sequence causes the load of PS[0]:

Link is operating in standard mode

Command window is open to level two or level three

SRS command is generated with the Update_DR TAP state

A DR_Scan occurs (delivering series selection information)

Update_DR TAP state

Should the DR_Scan be a ZBS, the PS[0] information is not changed. This bit is set to a one (1) by an adapter reset.

The preliminary scan status (PSCS) is not affected by series pre-selection or scan selection while the scan format is JScan.

The series selection bit is copied to the scan selection bit (SS) when the scan format is JScan3 and the TAP state moves from Update to Idle. The SS bit changes on the falling edge of TCK in the Idle state following either TAP Update state. When an adapter reset occurs, the SS bit is set to one (1) and sets the scan format to JScan1 and a zero (0), if reset sets the scan format to JScan0. Series selection examples are shown in FIG. 256 and FIG. 257 for a series selection change, delayed use.

The star pre-selection bit is set using the MSS command and cleared using the SCA command. It is also cleared by the ILID command. An MSS command sequence of two commands is used to pre-select a device for scan. The first command is an LTR command and conveys the Link ID of the device to be selected. This ID is placed in the TEMP register. A Make-Scan Selection (MSS) STR command follows. Each device connected to the port compares TEMP value to its Link_ID. The scan-selection command preselects the device whose Link ID matches the broadcasted ID by setting the PS[1] bit to a one (1). Pre-selections already set to a one (1) stay at a one (1), allowing the posting of pre-selections of multiple devices (PS[1] bit does not change, if already set). The MSS command causes the pre-scan status (PSCS) to increment, if the status is not "00" or "11" independent of whether the ID matches. If this status is one of these two values, the PSCS remains unchanged.

An SCA command sequence is provided to clear all scan pre-selections. In this case, the LTR command carries a subcommand to clear scan pre-selection (001x). The PS[1] bit is set to zero (0). The SCA command also sets pre-scan status to "no devices selected" (01), if this status is a value other than initialized (00). Clearing scan pre-selections does not affect a pre-scan status value of 00.

An ILID command sequence is provided to set Link IDs to "invalid". Two commands are sent to all devices connected to the port. The first command is an LTR command and conveys the Link ID of the device whose Link ID is to be invalidated. This ID is placed in the TEMP register. An Invalidate Link ID (ILID) STR command follows. Each device connected to the port compares TEMP value to its Link_ID. The scan selection command invalidates the Link ID of the device whose Link_ID matches the broadcasted ID by setting the ID to "Invalid and not isolated". If the PSCS (not SCS) indicates no devices are selected or initialization (PSCS[1]=0, the Link ID is invalidated independent of whether the Link ID provided by the LTR command matches the device Link ID. This command clears star pre-selections (PS[1]=0). It also sets the PSCS to no devices pre-selected (01) independent of whether any the TEMP value match the Link ID or the SCS value.

The star pre-selection bit (PS[1]) is managed with the MSS, SCA, and ILID commands. This bit is set to one (1) by an adapter reset. The relationship of commands and pre-selection bit PS[1] is shown in FIG. 258.

The preliminary scan status (PSCS) is set to "00" by reset and is managed with the MSS, SCA, and ILID commands. This PSCS is set to "00" when an adapter reset occurs. It remains "00" until Link IDs are invalidated using the ILID command. Invalidating Link IDs set the PSCS and SCS to "01", indicating no devices are selected and permitting Link ID assignment. The relationship of commands and preliminary scan status PSCS[1:0] is shown in FIG. 259.

The star selection bit is copied to the scan selection bit (SS) when the scan format is JScan2, any OScan, or any SScan format and the TAP state moves from Update to Idle. The SS bit changes on the falling edge of TCK in the Idle state following either TAP Update state.

Star selection and de-selection examples are shown in the following Figures. These Figures detail selection and deselection as follows:

| | |
|---|---|
| FIG. 260 | - Star pre-selection followed by immediate selection |
| FIG. 261 | - Star pre-selection followed by delayed selection |

-continued

| | |
|---|---|
| FIG. 262 | - Star pre de-selection followed by immediate de-selection |
| FIG. 263 | - Star pre de-selection followed by delayed de-selection |

A single adapter may be selected for BDX transactions. All adapters supporting BDX and not selected for the BDX go through the motions of the transfer but do not actually transfer data. These adapters merely follow the transfer in order to stay synchronized to Link activity. The MTS and SCA commands control BDX selection.

BDX Selection is a one-step process. A Make Transport Selection (MTS) command sequence is used to select a device for BDX. Two commands are sent to all devices connected to the port. The first command is an LTR command and conveys the Link ID of the adapter chosen for selection. This ID is placed in the TEMP register. An MTS command follows. Each adapter connected to the port compares TEMP value to its Link ID. The MTS command selects the device whose Link ID matches the broadcasted ID. The BS bit is set to a one (1) in the adapter with the matching ID and set to a zero (0), if there is no ID match.

An SCA command sequence is provided to clear the BDX selection. In this case, the LTR command carries a subcommand to clear scan pre-selection (00x1). The BS bit is set to zero (0). BDX selection and de-selection examples are shown in the following Figures. These Figures detail selection and de-selection as follows:

| | |
|---|---|
| FIG. 264 | - MTS command followed by TAP Idle state |
| FIG. 265 | - MTS command followed by TAP Select_DR state |
| FIG. 266 | - SCA command followed by TAP IDLE state |
| FIG. 267 | - SCA command followed by TAP Select_DR state |

CDX transactions use the Shift_DR state. An adapter selected for scan is also selected for CDX.

Multi-Adapter Star Operation

This section contains examples of Multi-Adapter operation for MScan, OScan, and SScan formats. Multi-Adapter Operation with the MScan Format. An example of where two of four adapters are selected is shown in FIG. 268. Both devices are ready in this example, causing them to not drive during the RDY bit of the packet. The one (1) driven in the previous bit creates a one (1) in the RDY bit position, if no adapter drives during this bit period. The two selected adapters output different data values for TDO. Adapter A drives a zero (0) as its data value is zero (0). Adapter B does not drive as its data is a one (1). The result is the wire-AND of the two data values and no drive conflict.

Adapters C and D do not participate in the generation of the RDY bit or TDO bit as both of these adapters are de-selected. These adapters do however receive TDI and TMS, using TMS to keep the adapter TAP state synchronized with all other adapters.

Should only one adapter be selected, the MScan format would not be used. The first packet boundary, where only one adapter is selected, causes the use of an OScan or SScan packet. Likewise, the first packet boundary where more than one or no adapter is selected, causes the use of an MScan packet.

Multi-Adapter Operation with OScan Formats. Two examples of multi-adapter operation with an OScan format are shown in the following sections. Example 0-OScan7. An example of multi-adapter operation, where one of four adapters is selected while the OScan7 format is specified, is shown in FIG. 269. The selected adapter is ready in this example, generating only one ready bit within the packet.

Example 1—OScan0

An example of multi-adapter operation, where one of four adapters is selected while OScan0 format is specified, is shown in FIG. 270. This example shows a continuous stream of 1-bit packets, with the packet content changing. Packets associated with non-shift TAP states contain TMS values while those associated with shift TAP states contain TDI values. An End-of-Transfer escape sequence superimposed on the packet delivering the last TDI value of the shift state sequence ends the shift state sequenced. The End-of-Transfer escape sequence generates a TMS value of one (1) to the adapter TAP and TAPs connected to it. The absence of this escape sequence generates a TMS value of zero (0), extending the TAP shift state. This removes the TMS value from all packets containing TDI shift data, dramatically increasing link efficiency. OScan 0-3 packets use this mechanism to exit the TAP shift states, while TMS is transmitted within the packet for OScan 4-7 packets.

Multi-Adapter Operation with SScan Formats. Two examples of multi-adapter operation with an SScan format are shown in the following sections. Example 0—SScan0—Paced Transaction. An example of multi-adapter operation, where one of four adapters is selected while a paced transaction occurs, is specified is shown in FIG. 271. The selected adapter is ready in this example, generating only one ready bit within the packet.

Example 1—SScan0—Non Paced Transaction

An example of multi-adapter operation, where one of four adapters is selected while SScan0 format is specified, is shown in FIG. 272. This example shows an input only transaction.

Compatibility and Configurations

Compatibility with legacy DTS equipment is an important consideration, along with new DTS equipment being compatible with various port configurations. Backwards compatibility with existing DTS equipment is a major consideration of the cJTAG architecture. There are two types of compatibility: Function, and Link Operating Frequency.

Function. Devices designed with a Wide-cJTAG interface provide a JTAG-compliant interface. These devices may be interfaced with legacy DTS equipment.

Link Operating Frequency. The OScan6 and OScan2 formats are specifically provided to allow operation of the Link at 2× the TAP-state rate of the DTS and System TAPs. These formats allow Link frequencies in the range of 100 MHz, while the DTS equipment state rate is one half this clock-rate. This raises Link performance, while allowing DTS operation at traditional JTAG state rates.

Forwards Compatibility. A DTS designed with a Wide-cJTAG interface may be interfaced to existing JTAG devices or devices that have either the Wide or Narrow-cJTAG interface. This is summarized in FIG. 273.

Ports with Mixed Device Interfaces. Series Port—Mixing Legacy/Wide Interfaces. A Series Port with a mix of JTAG and cJTAG enabled devices is shown in FIG. 274. Devices with JTAG and Wide-cJTAG interfaces may be attached to the port. All devices begin operation from POR as JTAG devices. They respond appropriately when stimulated with the JTAG interface. POR sets the operating mode of cJTAG enabled device to standard mode with no additional mode management being required. A wide-cJTAG device operates as a JTAG device in the absence of a command sequence directing it to operate with a Link interface.

Narrow Port—Mixing Narrow/Wide Interfaces. A Narrow-Star Port is shown in FIG. 275. Devices with narrow and wide interfaces may be attached to the port. All devices begin operation from POR with their adapter interfaces operating in standard mode.

Hybrid Port—Mixing Narrow/Wide Interfaces. Devices with wide and narrow interfaces may be connected in a hybrid-port configuration as shown in FIG. 276. The devices with narrow interfaces are de-selected when the devices with wide interfaces are operated with their interfaces in standard mode.

Potential ink configurations are shown in the following sections. Single Narrow Port. Single Device. A link constructed with a single narrow port and a single device is shown in FIG. 277.

A link constructed with a single narrow port and multiple devices attached is shown in FIG. 278. The operating frequency of this port configuration may be reduced because of electrical considerations created by TS device connectivity. Since there is only one TMSC connection to the DTS, only one chip can use the port BDX channel at a time.

Multiple Narrow Ports. Separate Ports—No Shared Signaling. Multiple links, where there is no signal sharing between ports, are shown in FIG. 279. With separate ports, BDX may be used with each device. This configuration allows the power down of a device connected to either port without affecting the operation of the other port.

Separate TCKs, Shared TMSC. Multiple links, where TS devices receive separate TCKs and share TMSC, are shown in FIG. 280. This link configuration provides device selection via clock gating and assumes the DTS is sourcing TCKs. The TCKs may be used to select and de-select the device of interest. This configuration is limited to a single BDX channel used by all devices.

Separate TMSCs, Shared TCK. Multiple links, where TS devices receive shared TCKs and a separate TMSC, also provides selection capabilities and are shown in FIG. 281. Ports are merely stalled during a configuration change and remain stalled until a subsequent configuration change removes the stall condition. The DTS is responsible for providing a "heart beat" when a device is de-selected using TMSC.

Mixed-Port Types with Shared Signaling. Series/Narrow Ports with Shared TCK. Devices may be connected as shown in FIG. 282 and FIG. 283. Both configurations create two ports that share TCK and have separate TMSCs.

Series/Narrow Ports with Separate TCKs. Devices may be connected as shown in FIG. 284 and FIG. 285. Both configurations create two ports that share TMSC and have separate TCKs. FIG. 286 shows Series and Narrow Ports with Separate TMSCs.

Scalability. JScan, MScan, OScan6, and OScan7 functions are mandatory. Other scan formats are optional. BDX and CDX are also optional. Devices with minimal requirements may capitalize on the pin-count reduction offered by cJTAG while implementing only mandatory capabilities.

Since the cJTAG architecture is scalable, the features of cJTAG adapters may vary while remaining interoperable. If an optional feature is enabled, the TS adapter, using built-in firmware, checks whether or not the feature is supported. If the feature is unsupported, the device places itself in an offline state. It remains in this state until the DTS initiates a soft reset or until a hard reset occurs. A soft reset is unique in that it brings offline adapters online in standard mode with JTAG-compatible operation, without changing other aspects of the cJTAG adapter configuration. A hard reset initializes the entire cJTAG interface, including asynchronously setting the TAP state to TLR. The TS does not go offline because this feature is not enabled. The references above to hard and soft reset only refer to the hard and soft reset of the target cJTAG adapter rather any hard and soft resets associated with the processor.

Robustness and Usability

A number of robustness and usability features are included in the cJTAG architecture. They are listed in FIG. 287. With emphasis on minimizing power consumption in today's handheld applications, every cJTAG adapter becomes a candidate for power savings. Since the Link interface performs no useful function when a DTS is not connected to an adapter, the adapter and its interface may be powered down.

While operating as a JTAG interface in the standard mode, the architecture provides a means, via the interface, to fully specify the interface behavior for all advanced mode features before the interface operating mode is changed to the advanced mode. This provides a very flexible and deterministic interface.

The interface provides programmable rising edge or falling edge sampling of the TMSC value. Sampling the TMSC pin on the rising edge of TCK for use on the falling edge assures this input is sampled while it is driven by the DTS when it is an input. This may be beneficial in applications where there is high electrical noise but it has the negative effect of reducing the maximum link operating frequency. Alternately, falling edge sampling provides a higher link operating frequency as information has a whole TCK period to propagate between the DTS and TS or visa versa.

Certain scan and BDX/CDX optimizations are not allowed when the TS supplies TCK. Should the debug software erroneously request the use of these optimizations, the adapter remaps the directive to use an operating mode that delivers the capability using a format that is TS TCK source friendly. This action averts system "hangs" during cJTAG driver development.

Advanced protocols are designed to allow the detection of a connection break between the DTS and TS and when the TS supplies TCK. In this case, the interface operating mode reverts to standard mode and the TLR TAP state is generated. The interface is allowed to power down from this point. Advanced protocols that allow the DTS to source TCK provide for resetting the link with the TCK and TMSC pins and also provide power management modes that allow a power and reset controller, part of the SOC, to reset and power down the link, if link activity ceases.

The above disclosure is meant to be illustrative of the principles and various embodiments of the present invention. Numerous variations and modifications will become apparent to those skilled in the art. It is intended that the disclosure, including the claims, be interpreted to embrace all such variations and modifications.

I claim:

1. Adapter circuitry comprising:

(a) a link interface for carrying a link clock input signal, a link mode input and output signal, a link data in signal, and a link data out signal, (b) a system interface for carrying:

i. a system clock out signal coupled to the link clock input signal;

ii. a system mode select out signal coupled to the link mode input and output signal;

iii. a system data in output signal coupled to the link data in signal; and iv. a system data out input signal coupled to the link data out signal; and v. additional system data and control signals coupled to the link interface signals; and (c) core circuitry coupled to the link interface and to the system interface, the core circuitry including a command sequence state machine coupled to the link clock input signal and the link mode input and output signal, the command sequence state machine having states of Closed Window, Potential Window, Detected Window, and Active Window and moving through the states in response to test access port states of Capture-DR, Shift-DR, Update-DR, and Select-IR.

2. The adapter circuitry of claim 1 in which the core circuitry includes a TCK_B input coupled to the link clock input signal, a TMSC_IN input coupled to the link mode input and output signal, and a TMSC_OUT output coupled to the link mode input signal.

3. The adapter circuitry of claim 1 in which the core circuitry includes a TCK_A output, a TMS_A output, a TDI_A output, and a JTAG control output, and including a multiplexer having:

a first set of inputs coupled to the link clock input signal, the link mode input and output signal, and the link data in signal;

a second set of inputs coupled to the TCK_A output, the TMS_A output, and the TDI_A output;

a set of outputs connected to the system clock out signal, the system mode select out signal, and the system data in out signal; and a control input connected to the JTAG control output.

4. The adapter circuitry of claim 1 in which the core circuitry includes a TMSC_IN input, a TMSC_OUT output, and a TMSC_OE output enable output, and including:

an input buffer having an input connected to the link mode input and output signal and an output connected to the TMSC_IN input; and an output buffer having an input connected to the TMSC_OUT output, an output connected to the link mode input and output signal, and a control input connected to the TMSC_OE output enable output.

5. The adapter circuitry of claim 1 in which the additional system data and control signals include a system Test Logic Reset out signal.

6. The adapter circuitry of claim 1 in which the additional system data and control signals include a system Background Data Transfer out signal.

7. The adapter circuitry of claim 1 in which the additional system data and control signals include a system Custom Data Transfer out signal.

8. The adapter circuitry of claim 1 in which the additional system data and control signals include a system Power Interface out signal.

9. The adapter circuitry of claim 1 in which the additional system data and control signals include a system Test Interface out signal.

10. The adapter circuitry of claim 1 in which the additional system data and control signals include a system Ready Interface out signal.

11. The adapter circuitry of claim 1 in which the additional system data and control signals include a system ID Interface out signal.

12. The adapter circuitry of claim 1 in which the additional system data and control signals include a four bit system TAP State Value out signal.

13. The adapter circuitry of claim 1 in which the command sequence state machine responds to zero bit scans in the form of a TAP Capture-DR state, then a TAP Update-DR state without a Shift-DR state.

14. The adapter circuitry of claim 13 in which when a zero bit scan begins in the Closed Window state a command window is opened with the control level set to one.

15. The adapter circuitry of claim 14 in which when a zero bit scan begins in the Detected Window state, the command window remains open and the control level is incremented if the control level has not reached its maximum value.

16. The adapter circuitry of claim 15 in which when a zero bit scan begins in the Active Window state, the control window remains open, the control level remains the same, and the zero bit scan is interpreted as a cJTAG command.

* * * * *